US012488307B2

(12) United States Patent
Cella et al.

(10) Patent No.: US 12,488,307 B2
(45) **Date of Patent: *Dec. 2, 2025**

(54) CONTROL TOWER AND ENTERPRISE MANAGEMENT PLATFORM WITH ROBOTIC PROCESS AUTOMATION SYSTEMS MANAGING PRODUCT OUTCOMES AND ACTIVTIES

(71) Applicant: STRONG FORCE VCN PORTFOLIO 2019, LLC, Fort Lauderdale, FL (US)

(72) Inventors: Charles Howard Cella, Pembroke, MA (US); Richard Spitz, Fort Lauderdale, FL (US); Teymour S. El-Tahry, Birmingham, MI (US)

(73) Assignee: STRONG FORCE VCN PORTFOLIO 2019, LLC, Fort Lauderdale, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/461,173

(22) Filed: Aug. 30, 2021

(65) Prior Publication Data

US 2022/0035342 A1 Feb. 3, 2022

Related U.S. Application Data

(63) Continuation of application No. PCT/US2020/059227, filed on Nov. 5, 2020.

(Continued)

(51) Int. Cl.

*G06Q 10/0637* (2023.01)
*B25J 9/16* (2006.01)

(Continued)

(52) U.S. Cl.

CPC .......... *G06Q 10/0833* (2013.01); *B25J 9/163* (2013.01); *G05B 13/0265* (2013.01);

(Continued)

(58) Field of Classification Search

CPC .................................................. G06Q 10/087

See application file for complete search history.

(56) References Cited

U.S. PATENT DOCUMENTS

| | | | |
|---|---|---|---|
| 7,519,972 | B2 | 4/2009 | Carr et al. |
| 8,275,583 | B2 | 9/2012 | Devarajan et al. |

(Continued)

FOREIGN PATENT DOCUMENTS

| | | | |
|---|---|---|---|
| EP | 3709252 | A1 | 9/2020 |
| EP | 3982260 | A1 | 4/2022 |

(Continued)

OTHER PUBLICATIONS

U.S. Appl. No. 62/931,193, filed Nov. 5, 2019, Charles Howard Cella.

(Continued)

*Primary Examiner* — Dylan C White

(74) *Attorney, Agent, or Firm* — RMCK Law Group, PLC

(57) ABSTRACT

A value chain system that provides recommendations for designing a logistics system generally includes a machine learning system that trains machine-learned models that output logistics design recommendations based on training data sets that each respectively defines one or more features of a respective logistic system and an outcome relating to the respective logistics system; an artificial intelligence system that receives a request for a logistics system design recommendation and determines the logistics system design recommendation based on one or more of the machine-learned models and the request; and a digital twin system that (Continued)

generates an environment digital twin of a logistics environment that incorporates the logistics system design recommendation, and one or more physical asset digital twins of physical assets. The digital twin system executes a simulation based on the logistics environment digital twin, the one or more physical asset digital twins.

31 Claims, 82 Drawing Sheets

Related U.S. Application Data

(60) Provisional application No. 63/087,292, filed on Oct. 4, 2020, provisional application No. 63/069,533, filed on Aug. 24, 2020, provisional application No. 63/054,606, filed on Jul. 21, 2020, provisional application No. 63/016,976, filed on Apr. 28, 2020, provisional application No. 62/969,153, filed on Feb. 3, 2020, provisional application No. 62/931,193, filed on Nov. 5, 2019.

(51) Int. Cl.

| | |
|---|---|
| ***G05B 13/02*** | (2006.01) |
| ***G05B 19/4155*** | (2006.01) |
| ***G06F 16/23*** | (2019.01) |
| ***G06F 16/27*** | (2019.01) |
| ***G06F 16/28*** | (2019.01) |
| ***G06F 18/21*** | (2023.01) |
| ***G06F 18/214*** | (2023.01) |
| ***G06F 30/27*** | (2020.01) |
| ***G06N 3/04*** | (2023.01) |
| ***G06N 3/08*** | (2023.01) |
| ***G06N 20/00*** | (2019.01) |
| ***G06Q 10/0631*** | (2023.01) |
| ***G06Q 10/0633*** | (2023.01) |
| ***G06Q 10/0635*** | (2023.01) |
| ***G06Q 10/067*** | (2023.01) |
| ***G06Q 10/08*** | (2023.01) |
| ***G06Q 10/083*** | (2024.01) |
| ***G06Q 10/0833*** | (2023.01) |
| ***G06Q 10/0835*** | (2023.01) |
| ***G06Q 10/087*** | (2023.01) |
| ***G06Q 10/10*** | (2023.01) |
| ***G06Q 30/018*** | (2023.01) |
| ***G06Q 30/0201*** | (2023.01) |
| ***G06Q 30/0202*** | (2023.01) |
| ***G06Q 30/0601*** | (2023.01) |
| ***G06Q 50/26*** | (2024.01) |
| ***H04L 67/1097*** | (2022.01) |
| ***H04L 67/12*** | (2022.01) |
| *B64U 101/64* | (2023.01) |
| *G16Y 10/40* | (2020.01) |
| *G16Y 10/45* | (2020.01) |
| *G16Y 10/75* | (2020.01) |
| *G16Y 40/10* | (2020.01) |
| *H04W 84/04* | (2009.01) |

(52) U.S. Cl.

CPC ..... *G05B 19/4155* (2013.01); *G06F 16/2315* (2019.01); *G06F 16/27* (2019.01); *G06F 16/284* (2019.01); *G06F 18/214* (2023.01); *G06F 18/2178* (2023.01); *G06F 30/27* (2020.01); *G06N 3/04* (2013.01); *G06N 3/08* (2013.01); *G06N 20/00* (2019.01); *G06Q 10/06313* (2013.01); *G06Q 10/06315* (2013.01); *G06Q 10/0633* (2013.01); *G06Q 10/0635* (2013.01); *G06Q 10/06375* (2013.01); *G06Q 10/067* (2013.01); *G06Q 10/08* (2013.01); *G06Q 10/083* (2013.01); *G06Q 10/0835* (2013.01); *G06Q 10/0838* (2013.01); *G06Q 10/087* (2013.01); *G06Q 10/103* (2013.01); *G06Q 30/018* (2013.01); *G06Q 30/0201* (2013.01); *G06Q 30/0202* (2013.01); *G06Q 30/0206* (2013.01); *G06Q 30/0631* (2013.01); *G06Q 50/26* (2013.01); *H04L 67/1097* (2013.01); *H04L 67/12* (2013.01); *B64U 2101/64* (2023.01); *G05B 2219/40408* (2013.01); *G06Q 2220/00* (2013.01); *G06Q 2220/10* (2013.01); *G16Y 10/40* (2020.01); *G16Y 10/45* (2020.01); *G16Y 10/75* (2020.01); *G16Y 40/10* (2020.01); *H04W 84/042* (2013.01)

(56) References Cited

U.S. PATENT DOCUMENTS

| | | | | |
|---|---|---|---|---|
| 8,352,300 | B2 | 1/2013 | Notani et al. | |
| 8,744,937 | B2 | 6/2014 | Seubert et al. | |
| 9,047,578 | B2 * | 6/2015 | Dvorak | G06Q 10/00 |
| 9,946,619 | B1 | 4/2018 | McClintock et al. | |
| 9,977,425 | B1 | 5/2018 | McCann et al. | |
| 10,127,523 | B2 | 11/2018 | Siegel et al. | |
| 10,257,496 | B2 | 4/2019 | Peeters et al. | |
| 10,262,283 | B2 | 4/2019 | Leidner et al. | |
| 10,310,760 | B1 | 6/2019 | Dreier et al. | |
| 10,318,904 | B2 | 6/2019 | Johnson et al. | |
| 10,417,249 | B1 | 9/2019 | Sadler et al. | |
| 10,475,040 | B2 * | 11/2019 | Singh | G06Q 30/00 |
| 10,511,651 | B2 * | 12/2019 | Sahu | H04L 67/02 |
| 10,628,537 | B2 | 4/2020 | Van der Velden | |
| 10,726,045 | B2 | 7/2020 | Sturtivant | |
| 10,846,651 | B2 | 11/2020 | Williams et al. | |
| 10,867,328 | B2 | 12/2020 | Rattner et al. | |
| 10,877,470 | B2 | 12/2020 | Burd et al. | |
| 10,883,759 | B2 | 1/2021 | Beham et al. | |
| 10,885,135 | B1 | 1/2021 | O'Brien et al. | |
| 10,943,206 | B2 * | 3/2021 | Maijala | G06K 19/0723 |
| 11,017,347 | B1 | 5/2021 | Choudhury et al. | |
| 11,042,458 | B2 | 6/2021 | Goyal et al. | |
| 11,044,171 | B2 | 6/2021 | Gopireddy | |
| 11,046,562 | B2 | 6/2021 | High et al. | |
| 11,067,501 | B2 | 7/2021 | Nguyen et al. | |
| 11,157,339 | B1 | 10/2021 | Dines | |
| 11,194,938 | B2 | 12/2021 | Kincart et al. | |
| 11,200,581 | B2 | 12/2021 | Williams et al. | |
| 11,243,803 | B2 | 2/2022 | Anand et al. | |
| 11,244,233 | B2 | 2/2022 | Sturtivant et al. | |
| 11,250,367 | B2 | 2/2022 | Santhanam et al. | |
| 11,282,022 | B2 | 3/2022 | Devarakonda et al. | |
| 11,334,587 | B1 | 5/2022 | Sadler et al. | |
| 11,352,874 | B2 | 6/2022 | Wise et al. | |
| 11,369,088 | B2 | 6/2022 | Ghosh | |
| 11,388,325 | B2 | 7/2022 | Bohling et al. | |
| 11,418,381 | B2 | 8/2022 | Roy et al. | |
| 11,480,952 | B2 | 10/2022 | Hande et al. | |
| 11,513,496 | B2 | 11/2022 | Kadam et al. | |
| 11,550,299 | B2 | 1/2023 | Cella et al. | |
| 11,613,008 | B2 | 3/2023 | Han et al. | |
| 11,619,916 | B2 | 4/2023 | Marzorati et al. | |
| 11,733,229 | B2 | 8/2023 | Bohling et al. | |
| 11,770,296 | B2 | 9/2023 | Nolan et al. | |
| 11,836,473 | B2 | 12/2023 | Franchitti et al. | |
| 11,880,888 | B1 | 1/2024 | Gold et al. | |
| 11,902,094 | B1 | 2/2024 | Puri et al. | |
| 12,093,888 | B2 | 9/2024 | Enderby et al. | |
| 12,277,524 | B2 | 4/2025 | Cella et al. | |
| 12,320,914 | B2 | 6/2025 | Elias et al. | |
| 2002/0013721 | A1 | 1/2002 | Dabbiere et al. | |
| 2002/0022983 | A1 | 2/2002 | Barton | |
| 2002/0035483 | A1 | 3/2002 | Patel | |

(56) References Cited

U.S. PATENT DOCUMENTS

2002/0054094 A1 5/2002 Matsuda
2002/0111819 A1 8/2002 Li et al.
2002/0138316 A1 9/2002 Katz et al.
2002/0143669 A1 10/2002 Scheer
2002/0156904 A1 10/2002 Gullotta et al.
2002/0165747 A1 11/2002 Shriver et al.
2002/0172201 A1 11/2002 Ido et al.
2002/0188486 A1 12/2002 Gil et al.
2003/0163292 A1 8/2003 Eckenwiler et al.
2004/0044537 A1 3/2004 Aberle et al.
2004/0081357 A1 4/2004 Oldcorn et al.
2004/0088329 A1 5/2004 Lundblad et al.
2004/0153359 A1 8/2004 Ho et al.
2004/0186713 A1 9/2004 Gomas et al.
2005/0021498 A1 1/2005 Boreham et al.
2005/0055181 A1 3/2005 Verdura et al.
2005/0240592 A1 10/2005 Mamou et al.
2006/0020948 A1 1/2006 Carr et al.
2006/0163338 A1 7/2006 Allen et al.
2006/0242154 A1 10/2006 Rawat et al.
2006/0265259 A1 11/2006 Diana et al.
2007/0043611 A1 2/2007 Newman et al.
2007/0083554 A1 4/2007 Crume
2007/0203810 A1 8/2007 Grichnik
2008/0133589 A1 6/2008 Nickerson et al.
2008/0133960 A1 6/2008 Wong et al.
2008/0247478 A1 10/2008 Lee et al.
2008/0300952 A1 12/2008 Couper
2009/0112678 A1 4/2009 Luzardo
2009/0141964 A1 6/2009 Magara
2009/0299790 A1 12/2009 Devarajan et al.
2010/0256790 A1 10/2010 Teran-Matus et al.
2010/0329464 A1 12/2010 Kerschbaum
2011/0033124 A1 2/2011 Kuno
2011/0071871 A1 3/2011 Wong et al.
2011/0184962 A1 7/2011 Palmer et al.
2011/0191199 A1 8/2011 Barua et al.
2011/0264485 A1 10/2011 Notani et al.
2013/0151229 A1 6/2013 Braman et al.
2013/0211870 A1 8/2013 Lawson et al.
2013/0247519 A1 9/2013 Clark et al.
2013/0290220 A1 10/2013 Tschanz et al.
2014/0019471 A1 1/2014 Linton et al.
2014/0032357 A1 1/2014 Adams et al.
2014/0074668 A1 3/2014 Gomez
2014/0085307 A1 3/2014 Lei et al.
2014/0188752 A1 7/2014 White et al.
2014/0222610 A1 8/2014 Mikurak
2014/0278728 A1 9/2014 Hollenbach et al.
2014/0310048 A1 10/2014 Murray et al.
2015/0006427 A1 1/2015 Notani et al.
2015/0074014 A1 3/2015 Radkowski et al.
2015/0120373 A1 4/2015 Bajaj et al.
2015/0135043 A1 5/2015 Apps et al.
2015/0314960 A1 11/2015 Yap
2016/0041321 A1* 2/2016 Mochizuki .............. C09B 56/08
359/487.02
2016/0042321 A1 2/2016 Held
2016/0048938 A1 2/2016 Jones et al.
2016/0055503 A1 2/2016 Chan
2016/0124742 A1 5/2016 Rangasamy et al.
2016/0239808 A1 8/2016 Ryu et al.
2016/0259865 A1 9/2016 Neerukonda et al.
2016/0344537 A1 11/2016 Osagawa
2017/0001308 A1 1/2017 Bataller et al.
2017/0006135 A1 1/2017 Siebel et al.
2017/0060574 A1 3/2017 Malladi et al.
2017/0262764 A1 9/2017 Karuppasamy
2017/0286572 A1 10/2017 Hershey et al.
2017/0323240 A1 11/2017 Johnson et al.
2017/0323274 A1 11/2017 Johnson et al.
2017/0323403 A1 11/2017 Johnson et al.
2017/0344933 A1 11/2017 Grichnik et al.
2017/0364847 A1 12/2017 Kamath et al.
2018/0018620 A1 1/2018 Göllü
2018/0022493 A1 1/2018 Lamb et al.
2018/0136633 A1 5/2018 Small et al.
2018/0158020 A1 6/2018 Khasis
2018/0189731 A1 7/2018 Nossam
2018/0210427 A1 7/2018 Cella et al.
2018/0210436 A1 7/2018 Burd et al.
2018/0211202 A1 7/2018 Ynion, Jr.
2018/0238575 A1 8/2018 Park et al.
2018/0284737 A1 10/2018 Cella et al.
2018/0284741 A1 10/2018 Cella et al.
2018/0284743 A1 10/2018 Cella et al.
2018/0293685 A1 10/2018 Hoffmann et al.
2018/0329399 A1 11/2018 Neelakandan et al.
2018/0336286 A1 11/2018 Shah
2018/0356800 A1 12/2018 Chao et al.
2018/0357714 A1 12/2018 So et al.
2018/0364654 A1 12/2018 Locke et al.
2018/0365686 A1 12/2018 Kondo
2019/0005195 A1 1/2019 Peterson et al.
2019/0026634 A1 1/2019 Homeyer et al.
2019/0057327 A1 2/2019 Arguello et al.
2019/0066035 A1 2/2019 Hance et al.
2019/0066238 A1 2/2019 Notani et al.
2019/0087598 A1 3/2019 Adkins et al.
2019/0121350 A1 4/2019 Cella et al.
2019/0138333 A1 5/2019 Deutsch et al.
2019/0155225 A1 5/2019 Kothandaraman et al.
2019/0155271 A1 5/2019 Matthews et al.
2019/0156166 A1 5/2019 Karthikeyan et al.
2019/0228312 A1 7/2019 Andoni et al.
2019/0236489 A1 8/2019 Koudal et al.
2019/0243547 A1 8/2019 Duggal et al.
2019/0266287 A1 8/2019 Chen et al.
2019/0266563 A1 8/2019 Jacobson et al.
2019/0286736 A1 9/2019 Sturtivant
2019/0287079 A1 9/2019 Shiraishi et al.
2019/0289826 A1 9/2019 Tippery et al.
2019/0317935 A1 10/2019 Berti et al.
2019/0332508 A1 10/2019 Goyal et al.
2019/0354374 A1 11/2019 Cella
2019/0392220 A1 12/2019 Maan et al.
2020/0050494 A1 2/2020 Bartfai-Walcott et al.
2020/0065759 A1 2/2020 McNamara et al.
2020/0074329 A1 3/2020 Sturtivant et al.
2020/0074565 A1 3/2020 Dotter
2020/0087047 A1 3/2020 Stancik et al.
2020/0097493 A1 3/2020 Gawrys et al.
2020/0134716 A1 4/2020 Lahrichi et al.
2020/0137420 A1 4/2020 Natanzon et al.
2020/0143528 A1 5/2020 Kulkarni et al.
2020/0160460 A1 5/2020 Fricke et al.
2020/0182538 A1 6/2020 Beham et al.
2020/0183717 A1 6/2020 Deutsch et al.
2020/0191580 A1 6/2020 Christensen et al.
2020/0210850 A1 7/2020 Nuthi et al.
2020/0210894 A1 7/2020 Mimura et al.
2020/0223061 A1 7/2020 Han et al.
2020/0250170 A1 8/2020 Doehrn et al.
2020/0258031 A1 8/2020 Makhija et al.
2020/0259896 A1 8/2020 Sachs et al.
2020/0265329 A1 8/2020 Thomsen et al.
2020/0265535 A1 8/2020 Okada et al.
2020/0279200 A1 9/2020 Makhija et al.
2020/0285977 A1 9/2020 Brebner
2020/0310397 A1 10/2020 Hande et al.
2020/0320597 A1 10/2020 Lamb et al.
2020/0348662 A1 11/2020 Cella et al.
2020/0364387 A1 11/2020 Roemerman et al.
2020/0394618 A1 12/2020 Davis et al.
2021/0027360 A1 1/2021 Shmueli
2021/0065118 A1 3/2021 Notani et al.
2021/0089860 A1 3/2021 Heere et al.
2021/0096827 A1 4/2021 Stump et al.
2021/0096975 A1 4/2021 DeLuca et al.
2021/0109503 A1 4/2021 Singh et al.
2021/0110075 A1 4/2021 Dalloro et al.
2021/0117594 A1 4/2021 Lehner
2021/0117909 A1 4/2021 Paulson et al.
2021/0117916 A1 4/2021 Paulson et al.

(56) References Cited

U.S. PATENT DOCUMENTS

| | | | |
|---|---|---|---|
| 2021/0133670 A1 | 5/2021 | Cella et al. | |
| 2021/0142342 A1 | 5/2021 | Cheng | |
| 2021/0158174 A1 | 5/2021 | DeLuca et al. | |
| 2021/0158259 A1 | 5/2021 | Evans et al. | |
| 2021/0182996 A1 | 6/2021 | Cella et al. | |
| 2021/0191365 A1 | 6/2021 | Kadam et al. | |
| 2021/0192388 A1 | 6/2021 | Cunningham et al. | |
| 2021/0232990 A1 | 7/2021 | Maunz et al. | |
| 2021/0248283 A1 | 8/2021 | Kincart et al. | |
| 2021/0248289 A1 | 8/2021 | Fasano | |
| 2021/0263945 A1 | 8/2021 | Siebel et al. | |
| 2021/0272394 A1 | 9/2021 | Cella | |
| 2021/0287459 A1 | 9/2021 | Cella et al. | |
| 2021/0306416 A1 | 9/2021 | Mukhopadhyay et al. | |
| 2021/0356575 A1 | 11/2021 | Elias et al. | |
| 2021/0356576 A1 | 11/2021 | Elias et al. | |
| 2021/0357850 A1 | 11/2021 | Cella et al. | |
| 2021/0365614 A1 | 11/2021 | Sun et al. | |
| 2021/0365937 A1 | 11/2021 | Narendra et al. | |
| 2021/0405173 A1 | 12/2021 | Elias et al. | |
| 2022/0036276 A1* | 2/2022 | Cella | G06Q 10/0633 |
| 2022/0036302 A1 | 2/2022 | Cella et al. | |
| 2022/0051109 A1 | 2/2022 | Rogers | |
| 2022/0051171 A1 | 2/2022 | Cella et al. | |
| 2022/0067626 A1 | 3/2022 | Unnikrishnan et al. | |
| 2022/0075515 A1 | 3/2022 | Floren et al. | |
| 2022/0083976 A1 | 3/2022 | Rakshit et al. | |
| 2022/0087228 A1 | 3/2022 | Ghosh | |
| 2022/0138366 A1 | 5/2022 | Babur et al. | |
| 2022/0164745 A1 | 5/2022 | Dibble et al. | |
| 2022/0180026 A1 | 6/2022 | Barat et al. | |
| 2022/0187847 A1 | 6/2022 | Cella et al. | |
| 2022/0188753 A1 | 6/2022 | Dudas et al. | |
| 2022/0237532 A1 | 7/2022 | Phadke | |
| 2022/0245538 A1 | 8/2022 | Davis et al. | |
| 2022/0253321 A1 | 8/2022 | Iida et al. | |
| 2022/0305735 A1 | 9/2022 | Cella et al. | |
| 2022/0309436 A1 | 9/2022 | Evans et al. | |
| 2022/0326990 A1* | 10/2022 | Cassioli | G06F 9/4881 |
| 2022/0327684 A1 | 10/2022 | Cao et al. | |
| 2022/0334725 A1 | 10/2022 | Mertes et al. | |
| 2022/0335354 A1 | 10/2022 | Morales et al. | |
| 2022/0414570 A1 | 12/2022 | Chapados | |
| 2023/0031855 A1 | 2/2023 | Busbee et al. | |
| 2023/0101183 A1 | 3/2023 | Cella et al. | |
| 2023/0118644 A1 | 4/2023 | Arguello et al. | |
| 2023/0325720 A1 | 10/2023 | Cella et al. | |
| 2023/0359964 A1 | 11/2023 | Boghani | |
| 2024/0037483 A1 | 2/2024 | Singh et al. | |
| 2024/0118702 A1 | 4/2024 | Cella et al. | |
| 2025/0195764 A1 | 6/2025 | Corbett et al. | |
| 2025/0202575 A1 | 6/2025 | Wang et al. | |

FOREIGN PATENT DOCUMENTS

| | | | |
|---|---|---|---|
| GB | 2576375 A | 2/2020 | |
| WO | 2017035536 A1 | 3/2017 | |
| WO | 2018234741 A1 | 12/2018 | |
| WO | 2019094729 A1 | 5/2019 | |
| WO | 2019103775 A1 | 5/2019 | |
| WO | 2020060636 A1 | 3/2020 | |
| WO | 2020110036 A1 | 6/2020 | |
| WO | 2021001845 A1 | 1/2021 | |
| WO | 2021008782 A1 | 1/2021 | |
| WO | WO-2021053224 A1 * | 3/2021 | G06F 9/4843 |

OTHER PUBLICATIONS

Al-Atrash, S.A., "The Impact of Supply Chain Control Tower on Competitive Advantages of Jordanian Pharmaceutical Manufacturing Industry," Middle East University, Jul. 2018, 116 pages.

Automation Anywhere Enterprise—Development Client—User Guide, Jun. 28, 2017, 603 pages.

Banerjee, D., "Oracle Supply Chain Management APIs and Open Interfaces Guide, Release 12," Oracle, Sep. 2007, 1000 pages.

Barat, S. et al., "An Actor Based Simulation Driven Digital Twin for Analyzing Complex Business Systems," Proceedings of the 2019 WInter Simulation Conference (WSC), Dec. 2019, pp. 157-168.

Bhattacharya, A. et al., "An intermodal freight transport system for optimal supply chain logistics," Transportation Research Part C: Emerging Technologies, vol. 38, Jan. 2014, pp. 73-84, https://www.sciencedirect.com/science/article/pii/S0968090X13002271.

Bhosle, G. et al., "Global Supply Chain Control Towers—Achieving End-To-End Suppy Chain Visibility," Capgemini Consulting, 2011, 16 pages.

BlueYonder, "The Digital Control Tower Imperative," 2020, 6 pages.

Deloitte, The Supply Chain Control Tower—Fixing age-old issues with modern tools and techniques, 2019, 7 pages.

Deloitte, Inc., "The Path Forward: Operationalizing RPA to Automate the Digital Supply Network," 2018, 12 pages.

Digital Twin, Wikipedia, Archives Org, Nov. 3, 2019, https://web.archive.org/web/20191103095618/https://en.wikipedia.org/wiki/Digital-twin, 4 pages.

Eich, M. et al., "A Robot Application for Marine Vessel Inspection," Journal of Field Robotics, vol. 31, No. 2, 2014, pp. 319-341.

Fleet Owner, "Digital twins could considerably improve logistics ops," Jun. 27, 2019, https://www.fleetowner.com/technology/article/21703975/digital-twins-could-considerably-improve-logistics-ops, 2 pages.

Freeman, O., "How RPA is Revolutionising Supply Chain Networks," Supply Chain Digital, Jan. 2021, 11 pages.

Gesing, B. et al., "Digital Twins in Logistics," DHL Trend Research, Jun. 2019, 39 pages.

Hartley, J. et al., "Tortoise, no the hare: Digital transformation of supply chain business processes," Business Horizons, vol. 62, 2019, pp. 707-715.

Jda.Luminate, JDA Software Group, Inc., 2018, 4 pages.

Khadar, S.A., "Supply Chain Control Tower—Design & Deployment Concept," Linkedin, Oct. 23, 2018, 11 pages.

König, M. et al., "Integrating Robotic Process Automation into Business Process Management," ResearchGate, Sep. 2020, 16 pages.

Knolmayer, G. et al., "Supply Chain Management Based on SAP Systems—Architecture and Planning Processes," Springer, 2009, 214 pages.

Knolmayer, G. et al., "Supply Chain Management Based on SAP Systems—Order Management in Manufacturing Companies," Springer, 2002, 255 pages.

Lind, M. et al., "Digital Twins for the Maritime Sector," Oct. 14, 2020 Online, https://web.archive.org/web/20201015032250/https://www.maritime-executive.com/editorials/digital-twins-for-the-maritime-sector, 7 pages.

Lippincott, S., "Control Tower Technology Value Matrix 2018," Nucleus Research, Nov. 2018, pp. 1-11.

Markin, S. et al., "SAP Integrated Business Planning: Functionality and Implementation," Chapter 14—SAP Supply Chain Tower, Third Edition, SAP Press, 2021, 27 pages.

Miroglio, D., "Control Towers for the Pharmaceutical Supply Chains," Altran, 2013, 14 pages.

Mungla, B.O., "Robotic process automation for inventory control and management: a case of Freight Forwarders Solutions," Strathmore University Dissertation, Jun. 2019, 110 pages.

Oracle Planning Central Cloud—Data Sheet, 2019, 4 pages.

Pang, Z. et al., "Value-centric design of the internet-of-things solution for food supply chain: Value creation, sensor portfolio and information fusion," Inf Syst Front, 2015, vol. 17, pp. 289-319.

PCT International Search Report and Written Opinion mailed Apr. 19, 2021 for PCT International Application No. PCT/US2020/059227, 35 pages.

PCT International Search Report and Written Opinion mailed Mar. 11, 2021 for International Application No. PCT/US2020/059224, 11 pages.

Rejeb, A. et al., "Leveraging the Internet of Things and Blockchain Technlogy in Supply Chain Management," Future Internet, vol. 11, No. 161, Jul. 20, 2019, pp. 1-22.

(56) References Cited

OTHER PUBLICATIONS

Tao, F. et al., "Digital twin-driven product design, manufacturing and service with big data," Int. J. Adv. Manuf. Technol., vol. 94, 2018, pp. 3563-3576.
Trzuskawaska-Grzesinsaka, A., "Control Towers in Supply Chain Management—Past and Future," Journal of Economics and Management, vol. 27(1), 2017, pp. 114-133.
Benbarrad, T. et al., Intelligent Machine Vision Model for Defective Product Inspection Based on Machine Learning, Journal of Sensor and Actuator Networks, vol. 10, No. 7, Jan. 2021, 19 pages.
Bix, L. et al., "Packaging Design and Development—Chapter Packaging Design and Development," Jan. 2009, pp. 860-866.
Columbus, L., "How Machine Learning Improves Manufacturing Inspections, Product Quality & Supply Chain Visibility," Forbes, Jan. 2019, 6 pages.
Consumer Packaged Goods & Retail—Perfect Packaging, Dassalt Systems, Nov. 2012, 2 pages.
Deka, P. et al., "Quality Inspection In Manufacturing Using Deep Learning Based Computer Vision," Towards Data Science, Dec. 2018, 26 pages.
Extended European Search Report dated Nov. 7, 2023 for EP Application No. 20884943.0, 16 pages.
Huang, S. et al., "Automated Visual Inspection in the Semiconductor Industry: A Survey," Computers in Industry, vol. 66, 2015, pp. 1-10.
Kim, B. et al., "Interpretability Beyond Feature Attribution: Quantitative Testing with Concept Activation Vectors (TCAV)," Proceeding of the 35th International Conference on Machine Learning, 2018, 10 pages.
Knoll, D. et al., "An automated packaging planning approach using machine learning," ScienceDirect, Procedia CIRP vol. 81, 2019, pp. 576-581.
Lo, C.K. et al., "A review of digital twin in product design and development," Advanced Engineering Informatics, vol. 48, 2021, 15 pages.
Mandolla, C. et al., "Building a Digital Twin for Additive Manufacturing Through the Exploitation of Blockchain: A Case Analysis of the Aircraft Industry," Computer in Industry, vol. 109, 2019, pp. 134-152.
Narayanaswami, C. et al., "Blockchain Anchored Supply Chain Automation," IBM J. Res. & Dev., vol. 63, Mar./May 2019, pp. 7:1-7:11.
Rai, R. et al., "Machine Learning in Manufacturing and Industry 4.0 Applications," International Journal of Production Research, vol. 59, No. 16, 2021, pp. 4773-4778.
Ravikumar, S. et al., "Machine Learning Approach for Automated Visual Inspection of Machine Components," Expert Systems with Applications, vol. 38, 2011, pp. 3260-3266.
Saberi, S. et al., "Blockchain technology and its relationships to sustainable supply chain management," International Journal of Production Research, Oct. 2018, https://doi.org/10.1080/00207543.2018.1533261, 20 pages.
Szporer, R., "What the Digital Twins Revolution Means for Packaging," GlobalVision, Jun. 2017, 6 pages.
TCAV: Relative Concept Importance Testing with Linear Concept Activation Vectors, ICLR 2018, 21 pages.
Wagner, C. et al., "The role of the Industry 4.0 Asset Administration Shell and the Digital Twin during the life cycle of a plant," 22nd IEEE International Conference on Emerging Technologies and Factory Automation (ETFA), 2017, 8 pages.
What's in it for you?—UPS Package Design and Testing Lab, United Parcel Service, 2009, 14 pages.
Wheeler, M., "A virtual twin experience set to save time, money and environment," Food & Beverage Industry News, Sep. 2020, 6 pages.
Yang, G. et al., "A Machine Learning Approach to Shipping Box Design," AISC, 2019, pp. 402-407.
Zohni, O., "Webinar—Real World Simulation to Evaluate the Consumer Product Packaging," Dassalt Systems, Nov. 2020, pp. 5 pages.
SG Search Report and Written Opinion dated Nov. 18, 2024 for Singapore Application No. 11202204678U, 6 pages.
Thorsén, A., "Packaging Design For E-Commerce," Lulea University of Technology, 2018, 115 pages.
U.S. Appl. No. 17/112,340, filed Dec. 4, 2020.
U.S. Appl. No. 17/112,372, filed Dec. 4, 2020.
U.S. Appl. No. 17/112,459, filed Dec. 4, 2020.
U.S. Appl. No. 17/112,503, filed Dec. 4, 2020.
U.S. Appl. No. 17/333,193, filed May 28, 2021.
U.S. Appl. No. 17/333,275, filed May 28, 2021.
U.S. Appl. No. 17/333,403, filed May 28, 2021.
U.S. Appl. No. 17/460,995, filed Aug. 30, 2021.
U.S. Appl. No. 17/461,037, filed Aug. 30, 2021.
U.S. Appl. No. 17/461,074, filed Aug. 30, 2021.
U.S. Appl. No. 17/461,109, filed Aug. 30, 2021.
U.S. Appl. No. 17/461,141, filed Aug. 30, 2021.
U.S. Appl. No. 17/461,213, filed Aug. 30, 2021.
U.S. Appl. No. 17/461,260, filed Aug. 30, 2021.
U.S. Appl. No. 17/461,311, filed Aug. 30, 2021.
U.S. Appl. No. 17/461,351, filed Aug. 30, 2021.
U.S. Appl. No. 17/461,387, filed Aug. 30, 2021.
U.S. Appl. No. 17/461,425, filed Aug. 30, 2021.
Kuehn, W., "Digital Twins For Decision Making In Complex Production And Logistics Enterprises," Int. J. of Design & Nature and Ecodynamics, vol. 13, No. 3, 2018, pp. 260-271.
Maxfield, M., "Simplify with Smartsheet—Prioritize your best ideas and launch world," Affordable, Easy-to-Use AI Camera for Maker Projects—EEWeb, Jul. 2019, 8 pages.
Barni, A et al., "Exploiting the Digital Twin in the Assessment and Optimization of Sustainability Performances," 2018 International Conference on Intelligent Systems (IS), pp. 706-713.

* cited by examiner

CONTROL TOWER AND ENTERPRISE MANAGEMENT PLATFORM WITH ROBOTIC PROCESS AUTOMATION SYSTEMS MANAGING PRODUCT OUTCOMES AND ACTIVITIES

CROSS-REFERENCE TO RELATED APPLICATIONS

This application is a bypass continuation of International Application No. PCT/US2020/059227, filed Nov. 5, 2020, which claims the benefit of priority to the following U.S. Provisional Patent Applications: Ser. No. 62/931,193, filed Nov. 5, 2019, entitled "METHODS AND SYSTEMS OF VALUE CHAIN NETWORK MANAGEMENT PLATFORM;" Ser. No. 62/969,153 filed Feb. 3, 2020, entitled "METHODS AND SYSTEMS OF VALUE CHAIN NETWORK MANAGEMENT PLATFORM;" Ser. No. 63/016,976 filed Apr. 28, 2020, entitled "DIGITAL TWIN SYSTEMS AND METHODS FOR FACILITATING VALUE CHAIN NETWORKS AND LOGISTICS;" Ser. No. 63/054,606 filed Jul. 21, 2020, entitled "DIGITAL TWIN SYSTEMS AND METHODS FOR FACILITATING VALUE CHAIN NETWORKS AND LOGISTICS;" Ser. No. 63/069,533, filed Aug. 24, 2020, entitled "INFORMATION TECHNOLOGY SYSTEMS AND METHODS FOR VALUE CHAIN ARTIFICIAL INTELLIGENCE LEVERAGING DIGITAL TWINS;" and Ser. No. 63/087,292, filed Oct. 4, 2020, entitled "EXECUTIVE CONTROL TOWER AND ENTERPRISE MANAGEMENT PLATFORM FOR VALUE CHAIN NETWORK." Each of the above applications is hereby incorporated by reference in its entirety as if fully set forth herein.

FIELD

The present disclosure relates to information technology methods and systems for management of value chain network entities, including supply chain and demand management entities. The present disclosure also relates to the field of enterprise management platforms, more particularly involving data management, artificial intelligence, network connectivity and digital twins

BACKGROUND

Historically, many of the various categories of goods purchased and used by household consumers, by businesses and by other customers were been supplied mainly through a relatively linear fashion, in which manufacturers and other suppliers of finished goods, components, and other items handed off items to shipping companies, freight forwarders and the like, who delivered them to warehouses for temporary storage, to retailers, where customers purchased them, or directly to customer locations. Manufacturers and retailers undertook various sales and marketing activities to encourage and meet demand by customers, including designing products, positioning them on shelves and in advertising, setting prices, and the like.

Orders for products were fulfilled by manufacturers through a supply chain, such as depicted in FIG. 1, where suppliers 122 in various supply environments 160, operating production facilities 134 or acting as resellers or distributors for others, made a product 130 available at a point of origin 102 in response to an order. The product 130 was passed through the supply chain, being conveyed and stored via various hauling facilities 138 and distribution facilities 134, such as warehouses 132, fulfillment centers 112 and delivery systems 114, such as trucks and other vehicles, trains, and the like. In many cases, maritime facilities and infrastructure, such as ships, barges, docks and ports provided transport over waterways between the points of origin 102 and one or more destinations 104.

Organizations have access to an almost unlimited amount of data. With the advent of smart connected devices, wearable technologies, the Internet of Things (IoT), and the like, the amount of data available to an organization that is planning, overseeing, managing and operating a value chain network has increased dramatically and will likely to continue to do so. For example, in a manufacturing facility, warehouse, campus, or other operating environment, there may be hundreds to thousands of IoT sensors that provide metrics such as vibration data that measure the vibration signatures of important machinery, temperatures throughout the facility, motion sensors that can track throughput, asset tracking sensors and beacons to locate items, cameras and optical sensors, chemical and biological sensors, and many others. Additionally, as wearable technologies become more prevalent, wearables may provide insight into the movement, health indicators, physiological states, activity states, movements, and other characteristics of workers. Furthermore, as organizations implement CRM systems, ERP systems, operations systems, information technology systems, advanced analytics and other systems that leverage information and information technology, organizations have access to an increasingly wide array of other large data sets, such as marketing data, sales data, operational data, information technology data, performance data, customer data, financial data, market data, pricing data, supply chain data, and the like, including data sets generated by or for the organization and third-party data sets.

The presence of more data and data of new types offers many opportunities for organizations to achieve competitive advantages; however, it also presents problems, such as of complexity and volume, such that users can be overwhelmed, missing opportunities for insight. A need exists for methods and systems that allow enterprises not only to obtain data, but to convert the data into insights and to translate the insights into well-informed decisions and timely execution of efficient operations.

SUMMARY

According to some embodiments of the present disclosure, methods and systems are provided herein for an information technology system that may include a cloud-based management platform with a micro-services architecture; a set of interfaces, network connectivity facilities, adaptive intelligence facilities, data storage facilities, and monitoring facilities; and a set of applications for enabling an enterprise to manage a set of value chain network entities from a point of origin to a point of customer use.

In embodiments, provided herein are methods, systems, components and other elements for an information technology system that may include a cloud-based management platform with a micro-services architecture, the platform having a set of interfaces for accessing and configuring features of the platform; a set of network connectivity facilities for enabling a set of value chain network entities to connect to the platform; a set of adaptive intelligence facilities for automating a set of capabilities of the platform; a set of data storage facilities for storing data collected and handled by the platform; and a set of monitoring facilities for monitoring the value chain network entities; wherein the platform hosts a set of applications for enabling an enterprise to manage a set of value chain network entities from a point of origin of a product of the enterprise to a point of customer use.

In embodiments, an information technology system, includes a cloud-based management platform with a micro-services architecture, the platform having a set of interfaces that are configured to access and configure features of the platform; a set of network connectivity facilities that are configured to direct a set of value chain network entities to connect to the features of the platform; a set of adaptive intelligence facilities that are configured to automate a set of capabilities of the platform related to at least one of the value chain network entities and the features of the platform; a set of data storage facilities that are configured to store data collected and handled by the platform, wherein the data is related to at least one of the value chain network entities and the features of the platform; and a set of monitoring facilities that are configured to monitor the value chain network entities; wherein the platform is configured to host a set of applications for directing an enterprise to manage the value chain network entities from a point of origin of a product of the enterprise to a point of customer use.

In embodiments. the set of interfaces includes at least one of a demand management interface and a supply chain management interface. In embodiments, the set of network connectivity facilities includes a 5G network system deployed in a supply chain infrastructure facility operated by the enterprise. In embodiments, the set of network connectivity facilities includes an Internet of Things system deployed in a supply chain infrastructure facility operated by the enterprise. In embodiments, the set of network connectivity facilities includes a cognitive networking system deployed in a supply chain infrastructure facility operated by the enterprise. In embodiments, the set of network connectivity facilities includes a peer-to-peer network system deployed in a supply chain infrastructure facility operated by the enterprise. In embodiments, the set of adaptive intelligence facilities includes an edge intelligence system deployed in a supply chain infrastructure facility operated by the enterprise. In embodiments, the set of adaptive intelligence facilities includes a robotic process automation system. In embodiments, the set of adaptive intelligence facilities includes a self-configuring data collection system deployed in a supply chain infrastructure facility operated by the enterprise. In embodiments, the set of adaptive intelligence facilities includes a digital twin system representing attributes of at least one value chain network entity of the value chain network entities controlled by the enterprise. In embodiments, the set of adaptive intelligence includes a smart contract system that is configured to automate a set of interactions among the value chain network entities.

In embodiments, the set of data storage facilities uses a distributed data architecture. In embodiments, the set of data storage facilities uses a blockchain. In embodiments, the set of data storage facilities uses a distributed ledger. In embodiments, the set of data storage facilities uses a graph database representing a set of hierarchical relationships of the value chain network entities. In embodiments, the set of monitoring facilities includes an Internet of Things monitoring system. In embodiments, the set of monitoring facilities includes a sensor system deployed in an infrastructure facility operated by the enterprise. In embodiments, the set of applications includes a set of applications of at least two types from among a set of supply chain management applications, demand management applications, intelligent product applications, and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the platform manages a set of demand factors, a set of supply factors, and a set of supply chain infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors.

In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system, includes a cloud-based management platform with a microservices architecture, the platform having a set of interfaces that are configured to access and configure features of the platform, a set of network connectivity facilities that are configured to direct a set of value chain network entities to connect to the features of the platform, a set of adaptive intelligence facilities that are configured to automate a set of capabilities of the platform related to at least one of the value chain network entities and the features of the platform, a set of data storage facilities that are configured to store data collected and handled by the platform, and a set of monitoring facilities that are configured to monitor the value chain network entities, wherein the interfaces, the network connectivity facilities, the adaptive intelligence facilities, the data storage facilities, and the monitoring facilities are coordinated for monitoring and management of the value chain network entities; a set of applications that are configured to direct an enterprise to manage the value chain network entities of the platform from a point of origin to a point of customer use; and a unified set of robotic process automation systems that provide coordinated automation among at least two types of applications from among a set of demand management applications, a set of supply chain applications, a set of intelligent product applications, and a set of enterprise resource management applications for a category of goods with respect to the value chain network entities of the platform.

In embodiments, the unified set of robotic process automation systems automate a process selected from the group consisting of selection of a quantity of product for an order, selection of a carrier for a shipment, selection of a vendor for a component, selection of a vendor for a finished goods order, selection of a variation of a product for marketing, selection of an assortment of goods for a shelf, determination of a price for a finished good, configuration of a service offer related to a product, configuration of product bundle, configuration of a product kit, configuration of a product package, configuration of a product display, configuration of a product image, configuration of a product description, configuration of a website navigation path related to a product, determination of an inventory level for a product, selection of a logistics type, configuration of a schedule for product delivery, configuration of a logistics schedule, configuration of a set of inputs for machine learning, preparation of product documentation, preparation of disclosures about a product, configuration of a product for a set of local requirements, configuration of a set of products for compatibility, configuration of a request for proposals, ordering of equipment for a warehouse, ordering of equipment for a fulfillment center, classification of a product defect in an image, inspection of a product in an image, inspection of product quality data from a set of sensors, inspection of data from a set of onboard diagnostics on a. product, inspection of diagnostic data from an Internet of Things system, review of sensor data from environmental sensors in a set of supply chain environments, selection of inputs for a digital twin, selection of outputs from a digital twin, selection of visual elements for presentation in a digital twin, diagnosis of sources of delay in a supply chain, diagnosis of sources of scarcity in a supply chain, diagnosis of sources of congestion in a supply chain, diagnosis of sources of cost overruns in a supply chain, diagnosis of sources of product defects in a supply chain, and prediction of maintenance requirements in supply chain infrastructure.

In embodiments, one of the processes automated by the robotic process automation system involves selection of a quantity of product for an order. In embodiments, one of the processes automated by the robotic process automation system involves selection of a carrier for a shipment. In embodiments, wherein one of the processes automated by the robotic process automation system involves selection of a vendor for a component. In embodiments, wherein one of the processes automated by the robotic process automation system involves selection of a vendor for a finished goods order. In embodiments, wherein one of the processes automated by the robotic process automation system involves selection of a variation of a product for marketing. In embodiments, wherein one of the processes automated by the robotic process automation system involves selection of an assortment of goods for a shelf. In embodiments, wherein one of the processes automated by the robotic process automation system involves determination of a price for a finished good.

In embodiments, one of the processes automated by the robotic process automation system involves configuration of a service offer related to a product. In embodiments, wherein one of the processes automated by the robotic process automation system involves configuration of a product bundle. In embodiments, wherein one of the processes automated by the robotic process automation system involves configuration of a product kit. In embodiments, wherein one of the processes automated by the robotic process automation system involves configuration of a product package. In embodiments, wherein one of the processes automated by the robotic process automation system involves configuration of a product display. In embodiments, wherein one of the processes automated by the robotic process automation system involves configuration of a product image. In embodiments, wherein one of the processes automated by the robotic process automation system involves configuration of a product description. In embodiments, wherein one of the processes automated by the robotic process automation system involves configuration of a website navigation path related to a product.

In embodiments, one of the processes automated by the robotic process automation system involves determination of an inventory level for a product. In embodiments, wherein one of the processes automated by the robotic process automation system involves selection of a logistics type. In embodiments, wherein one of the processes automated by the robotic process automation system involves configuration of a schedule for product delivery. In embodiments, one of the processes automated by the robotic process automation system involves configuration of a logistics schedule. In embodiments, one of the processes automated by the robotic process automation system involves configuration of a set of inputs for machine learning. In embodiments, one of the processes automated by the robotic process automation system involves preparation of product documentation. In embodiments, one of the processes automated by the robotic process automation system involves preparation of disclosures about a product. In embodiments, one of the processes automated by the robotic process automation system involves configuration of a product for a set of local requirements. In embodiments, one of the processes automated by the robotic process automation system involves configuration of a set of products for compatibility. In embodiments, one of the processes automated by the robotic process automation system involves configuration of a request for proposals. In embodiments, one of the processes automated by the robotic process automation system involves ordering of equipment for a warehouse. In embodiments, one of the processes automated by the robotic process automation system involves ordering of equipment for a fulfillment center. In embodiments, one of the processes automated by the robotic process automation system involves classification of a product defect in an image. In embodiments, one of the processes automated by the robotic process automation system involves inspection of a product in an image. In embodiments, one of the processes automated by the robotic process automation system involves inspection of product quality data from a set of sensors. In embodiments, one of the processes automated by the robotic process automation system involves inspection of data from a set of onboard diagnostics on a. product.

In embodiments, one of the processes automated by the robotic process automation system involves inspection of diagnostic data from an Internet of Things system. In embodiments, one of the processes automated by the robotic process automation system involves review of sensor data from environmental sensors in a set of supply chain environments. In embodiments, one of the processes automated by the robotic process automation system involves selection of inputs for a digital twin. In embodiments, one of the processes automated by the robotic process automation system involves selection of outputs from a digital twin. In embodiments, one of the processes automated by the robotic process automation system involves selection of visual elements for presentation in a digital twin. In embodiments, one of the processes automated by the robotic process automation system involves diagnosis of sources of delay in a supply chain. In embodiments, one of the processes automated by the robotic process automation system involves diagnosis of sources of scarcity in a supply chain. In embodiments, one of the processes automated by the robotic process automation system involves diagnosis of sources of congestion in a supply chain. In embodiments, one of the processes automated by the robotic process automation system involves diagnosis of sources of cost overruns in a supply chain. In embodiments, one of the processes automated by the robotic process automation system involves diagnosis of sources of product defects in a supply chain. In embodiments, one of the processes automated by the robotic process automation system involves prediction of maintenance requirements in supply chain infrastructure.

In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, the set of interfaces includes at least one of a demand management interface and a supply chain management interface. In embodiments, the set of network connectivity facilities includes a 5G network system deployed in a supply chain infrastructure facility operated by the enterprise. In embodiments, the set of network connectivity facilities includes an Internet of Things system deployed in a supply chain infrastructure facility operated by the enterprise. In embodiments, the set of network connectivity facilities includes a cognitive networking system deployed in a supply chain infrastructure facility operated by the enterprise. In embodiments, the set of network connectivity facilities includes a peer-to-peer network system deployed in a supply chain infrastructure facility operated by the enterprise. In embodiments, the set of adaptive intelligence facilities includes an edge intelligence system deployed in a supply chain infrastructure facility operated by the enterprise. In embodiments, the set of adaptive intelligence facilities includes a robotic process automation system. In embodiments, the set of adaptive intelligence facilities includes a self-configuring data collection system deployed in a supply chain infrastructure facility operated by the enterprise. In embodiments, the set of adaptive intelligence facilities includes a digital twin system representing attributes of value chain network entity controlled by the enterprise. In embodiments, the set of adaptive intelligence facilities includes a smart contract system that is configured to automate a set of interactions among a set of value chain network entities.

In embodiments, the set of data storage facilities uses a distributed data architecture. In embodiments, the set of data storage facilities uses a blockchain. In embodiments, the set of data storage facilities uses a distributed ledger. In embodiments, the set of data storage facilities uses graph database representing a set of hierarchical relationships of the value chain network entities. In embodiments, the set of monitoring facilities includes an Internet of Things monitoring system. In embodiments, the set of monitoring facilities includes a sensor system deployed in an infrastructure facility operated by an enterprise. In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, wherein the platform manages a set of demand factors, a set of supply factors, and a set of supply chain infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors.

In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system, includes a cloud-based management platform with a micro-services architecture, the platform having a set of interfaces that are configured to access and configure features of the platform, a set of network connectivity facilities that are configured to direct a set of value chain network entities to connect to the features of the platform, a set of adaptive intelligence facilities that are configured to automate a set of capabilities of the platform related to at least one of the value chain network entities and the features of the platform, a set of data storage facilities that are configured to store data collected and handled by the platform, and a set of monitoring facilities that are configured to monitor the value chain network entities, wherein the interfaces, the network connectivity facilities, the adaptive intelligence facilities, the data storage facilities, and the monitoring facilities are coordinated for monitoring and management of the value chain network entities; a set of applications that are configured to direct an enterprise to manage the value chain network entities of the platform from a point of origin to a point of customer use; and a set of microservices layers including an application layer supporting at least one supply chain application and at least one demand management application, wherein the microservices layers include a data collection layer that collects information from a set of Internet of Things resources that collect information with respect to supply chain entities and demand management entities related to the value chain network entities of the platform.

In embodiments, the set of Internet of Things resources that collect information with respect to supply chain entities and demand management entities collects information from entities selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the set of Internet of Things resources is selected from the group consisting of camera systems, lighting systems, motion sensing systems, weighing systems, inspection systems, machine vision systems, environmental sensor systems, onboard sensor systems, onboard diagnostic systems, environmental control systems, sensor-enabled network switching and routing systems, RF sensing systems, magnetic sensing systems, pressure monitoring systems, vibration monitoring systems, temperature monitoring systems, heat flow monitoring systems, biological measurement systems, chemical measurement systems, ultrasonic monitoring systems, radiography systems, LIDAR-based monitoring systems, access control systems, penetrating wave sensing systems, SONAR-based monitoring systems, radar-based monitoring systems, computed tomography systems, magnetic resonance imaging systems, and network monitoring systems.

In embodiments, the set of Internet of Things resources includes a set of camera systems. In embodiments, the set of Internet of Things resources includes a set of lighting systems. In embodiments, the set of Internet of Things resources includes a set of machine vision systems. In embodiments, the set of Internet of Things resources includes a set of motion sensing systems.

In embodiments, the set of Internet of Things resources includes a set of weighing systems. In embodiments, the set of Internet of Things resources includes a set of inspection systems. In embodiments, the set of Internet of Things resources includes a set of environmental sensor systems. In embodiments, the set of Internet of Things resources includes a set of onboard sensor systems. In embodiments, the set of Internet of Things resources includes a set of onboard diagnostic systems. In embodiments, the set of Internet of Things resources includes a set of environmental control systems. In embodiments, the set of Internet of Things resources includes a set of sensor-enabled network switching and routing systems. In embodiments, the set of Internet of Things resources includes a set of RF sensing systems.

In embodiments, the set of Internet of Things resources includes a set of magnetic sensing systems. In embodiments, the set of Internet of Things resources includes a set of pressure monitoring systems. In embodiments, the set of Internet of Things resources includes a set of vibration monitoring systems. In embodiments, the set of Internet of Things resources includes a set of temperature monitoring systems. In embodiments, the set of Internet of Things resources includes a set of heat flow monitoring systems. In embodiments, the set of Internet of Things resources includes a set of biological measurement systems. In embodiments, the set of Internet of Things resources includes a set of chemical measurement systems. In embodiments, the set of Internet of Things resources includes a set of ultrasonic monitoring systems. In embodiments, the set of Internet of Things resources includes a set of radiography systems. In embodiments, the set of Internet of Things resources includes a set of LIDAR-based monitoring systems. In embodiments, the set of Internet of Things resources includes a set of access control systems. In embodiments, the set of Internet of Things resources includes a set of penetrating wave sensing systems. In embodiments, the set of Internet of Things resources includes a set of SONAR-based monitoring systems. In embodiments, the set of Internet of Things resources includes a set of radar-based monitoring systems. In embodiments, the set of Internet of Things resources includes a set of computed tomography systems. In embodiments, the set of Internet of Things resources includes a set of magnetic resonance imaging systems. In embodiments, the set of Internet of Things resources includes a set of network monitoring systems. In embodiments, the set of interfaces includes at least one of a demand management interface and a supply chain management interface.

In embodiments, the set of applications is at least one of demand management applications, supply chain applications, intelligent product applications, and enterprise resource management applications that are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, the set of network connectivity facilities includes a 5G network system deployed in a supply chain infrastructure facility operated by the enterprise. In embodiments, the set of network connectivity facilities includes an Internet of Things system deployed in a supply chain infrastructure facility operated by the enterprise. In embodiments, the set of network connectivity facilities includes a cognitive networking system deployed in a supply chain infrastructure facility operated by the enterprise. In embodiments, wherein the set of network connectivity facilities includes a peer-to-peer network system deployed in a supply chain infrastructure facility operated by the enterprise. In embodiments, the set of adaptive intelligence facilities includes an edge intelligence system deployed in a supply chain infrastructure facility operated by the enterprise. In embodiments, the set of adaptive intelligence facilities includes a robotic process automation system. In embodiments, the set of adaptive intelligence includes a self-configuring data collection system deployed in a supply chain infrastructure facility operated by the enterprise. In embodiments, the set of adaptive intelligence facilities includes a digital twin system representing attributes of value chain network entity controlled by the enterprise. In embodiments, the set of adaptive intelligence facilities includes a smart contract system that is configured to automate a set of interactions among a set of value chain network entities. In embodiments, the set of data storage facilities uses a distributed data architecture. In embodiments, the set of data storage facilities uses a blockchain. In embodiments, the set of data storage facilities uses a distributed ledger. In embodiments, the set of data storage facilities uses a graph database representing a set of hierarchical relationships of value chain network entities. In embodiments, the set of monitoring includes an Internet of Things monitoring system. In embodiments, the set of monitoring facilities includes a sensor system deployed in an infrastructure facility operated by an enterprise. In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors.

In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system, includes a cloud-based management platform with a microservices architecture, the platform having a set of interfaces that are configured to access and configure features of the platform, a set of network connectivity facilities that are configured to direct a set of value chain network entities to connect to the features of the platform, a set of adaptive intelligence facilities that are configured to automate a set of capabilities of the platform related to at least one of the value chain network entities and the features of the platform, a set of data storage facilities that are configured to store data collected and handled by the platform, and a set of monitoring facilities that are configured to monitor the value chain network entities, wherein the interfaces, the network connectivity facilities, the adaptive intelligence facilities, the data storage facilities, and the monitoring facilities are coordinated for monitoring and management of the value chain network entities; a set of applications that are configured to direct an enterprise to manage the value chain network entities of the platform from a point of origin to a point of customer use; and a set of microservices layers including an application layer supporting at least one supply chain application and at least one demand management application, wherein the microservices layers include a robotic process automation layer that uses information collected by a data collection layer and a set of outcomes and activities involving the applications of the application layer to automate a set of actions for at least a subset of the applications with respect to the value chain network entities of the platform.

In embodiments, the robotic process automation layer automates a process selected from the group consisting of selection of a quantity of product for an order, selection of a carrier for a shipment, selection of a vendor for a component, selection of a vendor for a finished goods order, selection of a variation of a product for marketing, selection of an assortment of goods for a shelf, determination of a price for a finished good, configuration of a service offer related to a product, configuration of product bundle, configuration of a product kit, configuration of a product package, configuration of a product display, configuration of a product image, configuration of a product description, configuration of a website navigation path related to a product, determination of an inventory level for a product, selection of a logistics type, configuration of a schedule for product delivery, configuration of a logistics schedule, configuration of a set of inputs for machine learning, preparation of product documentation, preparation of disclosures about a product, configuration of a product for a set of local requirements, configuration of a set of products for compatibility, configuration of a request for proposals, ordering of equipment for a warehouse, ordering of equipment for a fulfillment center, classification of a product defect in an image, inspection of a product in an image, inspection of product quality data from a set of sensors, inspection of data from a set of onboard diagnostics on a. product, inspection of diagnostic data from an Internet of Things system, review of sensor data from environmental sensors in a set of supply chain environments, selection of inputs for a digital twin, selection of outputs from a digital twin, selection of visual elements for presentation in a digital twin, diagnosis of sources of delay in a supply chain, diagnosis of sources of scarcity in a supply chain, diagnosis of sources of congestion in a supply chain, diagnosis of sources of cost overruns in a supply chain, diagnosis of sources of product defects in a supply chain, and prediction of maintenance requirements in supply chain infrastructure.

In embodiments, one of the actions automated by the robotic process automation layer involves selection of a quantity of product for an order. In embodiments, one of the actions automated by the robotic process automation layer involves selection of a carrier for a shipment. In embodiments, one of the actions automated by the robotic process automation layer involves selection of a vendor for a component. In embodiments, one of the actions automated by the robotic process automation layer involves selection of a vendor for a finished goods order. In embodiments, one of the actions automated by the robotic process automation layer involves selection of a variation of a product for marketing. In embodiments, one of the actions automated by the robotic process automation layer involves selection of an assortment of goods for a shelf. In embodiments, one of the actions automated by the robotic process automation layer involves determination of a price for a finished good. In embodiments, one of the actions automated by the robotic process automation layer involves configuration of a service offer related to a product. In embodiments, one of the actions automated by the robotic process automation layer involves configuration of product bundle. In embodiments, one of the actions automated by the robotic process automation layer involves configuration of a product kit. In embodiments, one of the actions automated by the robotic process automation layer involves configuration of a product package. In embodiments, one of the actions automated by the robotic process automation layer involves configuration of a product display. In embodiments, one of the actions automated by the robotic process automation layer involves configuration of a product image. In embodiments, one of the actions automated by the robotic process automation layer involves configuration of a product description. In embodiments, one of the actions automated by the robotic process automation layer involves configuration of a website navigation path related to a product. In embodiments, one of the actions automated by the robotic process automation layer involves determination of an inventory level for a product. In embodiments, one of the actions automated by the robotic process automation layer involves selection of a logistics type. In embodiments, one of the actions automated by the robotic process automation layer involves configuration of a schedule for product delivery. In embodiments, one of the actions automated by the robotic process automation layer involves configuration of a logistics schedule. In embodiments, one of the actions automated by the robotic process automation layer involves configuration of a set of inputs for machine learning. In embodiments, one of the actions automated by the robotic process automation layer involves preparation of product documentation. In embodiments, one of the actions automated by the robotic process automation layer involves preparation of disclosures about a product. In embodiments, one of the actions automated by the robotic process automation layer involves configuration of a product for a set of local requirements. In embodiments, one of the actions automated by the robotic process automation layer involves configuration of a set of products for compatibility. In embodiments, one of the actions automated by the robotic process automation layer involves configuration of a request for proposals. In embodiments, one of the actions automated by the robotic process automation layer involves ordering of equipment for a warehouse. In embodiments, one of the actions automated by the robotic process automation layer involves ordering of equipment for a fulfillment center. In embodiments, one of the actions automated by the robotic process automation layer involves classification of a product defect in an image. In embodiments, one of the actions automated by the robotic process automation layer involves inspection of a product in an image. In embodiments, one of the actions automated by the robotic process automation layer involves inspection of product quality data from a set of sensors. In embodiments, one of the actions automated by the robotic process automation layer involves inspection of data from a set of onboard diagnostics on a. product. In embodiments, one of the actions automated by the robotic process automation layer involves inspection of diagnostic data from an Internet of Things system. In embodiments, one of the actions automated by the robotic process automation layer involves review of sensor data from environmental sensors in a set of supply chain environments. In embodiments, one of the actions automated by the robotic process automation layer involves selection of inputs for a digital twin. In embodiments, one of the actions automated by the robotic process automation layer involves selection of outputs from a digital twin. In embodiments, one of the actions automated by the robotic process automation layer involves selection of visual elements for presentation in a digital twin. In embodiments, one of the actions automated by the robotic process automation layer involves diagnosis of sources of delay in a supply chain. In embodiments, one of the actions automated by the robotic process automation layer involves diagnosis of sources of scarcity in a supply chain. In embodiments, one of the actions automated by the robotic process automation layer involves diagnosis of sources of congestion in a supply chain. In embodiments, one of the actions automated by the robotic process automation layer involves diagnosis of sources of cost overruns in a supply chain. In embodiments, one of the actions automated by the robotic process automation layer involves diagnosis of sources of product defects in a supply chain. In embodiments, one of the actions automated by the robotic process automation layer involves prediction of maintenance requirements in supply chain infrastructure.

In embodiments, the set of interfaces includes at least one of a demand management interface and a supply chain management interface.

In embodiments, the set of applications is at least one of demand management applications, supply chain applications, intelligent product applications, and enterprise resource management applications that are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, the set of network connectivity facilities includes a 5G network system deployed in a supply chain infrastructure facility operated by the enterprise. In embodiments, the set of network connectivity facilities includes an Internet of Things system deployed in a supply chain infrastructure facility operated by the enterprise. In embodiments, the set of network connectivity facilities includes a cognitive networking system deployed in a supply chain infrastructure facility operated by the enterprise. In embodiments, the set of network connectivity facilities includes a peer-to-peer network system deployed in a supply chain infrastructure facility operated by the enterprise. In embodiments, the set of adaptive intelligence facilities includes an edge intelligence system deployed in a supply chain infrastructure facility operated by the enterprise. In embodiments, the set of adaptive intelligence facilities includes a robotic process automation system. In embodiments, the set of adaptive intelligence facilities includes a self-configuring data collection system deployed in a supply chain infrastructure facility operated by the enterprise. In embodiments, the set of adaptive intelligence facilities includes a digital twin system representing attributes of value chain network entity controlled by the enterprise. In embodiments, the set of adaptive intelligence facilities includes a smart contract system for automating a set of interactions among a set of value chain network entities. In embodiments, the set of data storage facilities uses a distributed data architecture. In embodiments, the set of data storage facilities uses a blockchain. In embodiments, the set of data storage facilities uses a distributed ledger. In embodiments, the set of data storage facilities uses a graph database representing a set of hierarchical relationships of value chain network entities. In embodiments, the set of monitoring facilities includes an Internet of Things monitoring system. In embodiments, the set of monitoring facilities includes a sensor system deployed in an infrastructure facility operated by an enterprise.

In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors, and a set of supply chain infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors.

In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system, includes a cloud-based management platform with a micro-services architecture, the platform having a set of interfaces that are configured to access and configure features of the platform, a set of network connectivity facilities that are configured to direct a set of value chain network entities to connect to the features of the platform, a set of adaptive intelligence facilities that are configured to automate a set of capabilities of the platform related to at least one of the value chain network entities and the features of the platform, a set of data storage facilities that are configured to store data collected and handled by the platform, and a set of monitoring facilities that are configured to monitor the value chain network entities, wherein the interfaces, the network connectivity facilities, the adaptive intelligence facilities, the data storage facilities, and the monitoring facilities are coordinated for monitoring and management of the value chain network entities; a set of applications that are configured to direct an enterprise to manage the value chain network entities of the platform from a point of origin to a point of customer use; and a machine learning/artificial intelligence system configured to generate recommendations for placing at least one of an additional sensor and a camera on and/or in proximity to a value chain network entity of the value chain network entities, and wherein data from the at least one of the additional sensor and the camera feeds into a digital twin that represents the value chain network entities.

In embodiments, the set of interfaces includes at least one of a demand management interface and a supply chain management interface. In embodiments, the set of applications is at least one of demand management applications, supply chain applications, intelligent product applications, and enterprise resource management applications that are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, the set of network connectivity facilities includes a 5G network system deployed in a supply chain infrastructure facility operated by the enterprise. In embodiments, the set of network connectivity facilities includes an Internet of Things system deployed in a supply chain infrastructure facility operated by the enterprise. In embodiments, the set of network connectivity facilities includes a cognitive networking system deployed in a supply chain infrastructure facility operated by the enterprise. In embodiments, the set of network connectivity facilities includes a peer-to-peer network system deployed in a supply chain infrastructure facility operated by the enterprise. In embodiments, the set of adaptive intelligence facilities includes an edge intelligence system deployed in a supply chain infrastructure facility operated by the enterprise. In embodiments, the set of adaptive intelligence facilities includes a robotic process automation system. In embodiments, the set of adaptive intelligence facilities includes a self-configuring data collection system deployed in a supply chain infrastructure facility operated by the enterprise. In embodiments, the set of adaptive intelligence facilities includes a digital twin system representing attributes of value chain network entity controlled by the enterprise. In embodiments, the set of adaptive intelligence facilities includes a smart contract system for automating a set of interactions among a set of value chain network entities. In embodiments, the set of data storage facilities uses a distributed data architecture. In embodiments, the set of data storage facilities uses a blockchain. In embodiments, the set of data storage facilities uses a distributed ledger. In embodiments, the set of data storage facilities uses a graph database representing a set of hierarchical relationships of value chain network entities. In embodiments, the set of monitoring facilities includes an Internet of Things monitoring system. In embodiments, the set of monitoring facilities includes a sensor system deployed in an infrastructure facility operated by an enterprise. In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors, and a set of supply chain infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors.

In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, a value chain system that provides container fleet management decisions includes a machine learning system that trains a machine-learned model that outputs a container fleet management decision given a respective set of input features relating to a specific shipping event, wherein the machine learning system trains the machine-learned model based on training data sets that define features of previous shipping events and outcomes of the shipping events; an artificial intelligence system that receives a request for container fleet management and determines a container fleet management decision based on the machine-learned model and the request; and a digital twin system that generates an environment digital twin of an environment of a container fleet and one or more container digital twins of respective containers in the container fleet, wherein the digital twin system executes a container fleet simulation based on the environment digital twin and the one or more container digital twins, issues a container fleet management request from the artificial intelligence system based on a state of the container fleet simulation; and adjusts the state of the container fleet simulation based on the container fleet management decision output by the artificial intelligence system in response to the container fleet management request.

In embodiments, the digital twin system outputs a simulation outcome to the machine-learning system, and the machine learning system reinforces the machine-learned model used to determine the container fleet management decision based on the simulation outcome. In embodiments, the artificial intelligence system receives the container fleet management request from the digital twin system and determines the container fleet management decision based on simulation features defined in the container fleet management request, wherein the simulation features are indicative of the state of the container fleet simulation. In embodiments, the request for container fleet management includes one or more properties of a simulated shipping event. In embodiments, the artificial intelligence system determines the container fleet management decision based on the one or more properties of the simulated shipping event and the machine-learned model. In embodiments, the one or more properties include a type of good being shipped. In embodiments, the one or more properties include a source and a destination of a container. In embodiments, the digital twin system provides outcome data to the machine-learning system, wherein the outcome data defines a simulation outcome resulting from the container fleet management decision.

In embodiments, a value chain system that provides recommendations for designing a logistics system includes a machine learning system that trains a machine-learned model that outputs a logistics design recommendation given a respective set of input features relating to a specific respective logistics system, wherein the machine learning system trains the machine-learned model based on training data sets that define features of logistics systems and outcomes of the logistics systems; an artificial intelligence system that receives a request for logistics system design and determines a logistics system design recommendation based on the machine-learned model and the request; and a digital twin system that generates an environment digital twin of a logistics environment that incorporates the logistics system design recommendation and one or more physical asset digital twins of physical assets, wherein the digital twin system: executes a logistics simulation based on the logistics environment digital twin and the one or more physical asset digital twins, issues a logistics system design request from the artificial intelligence system based on a state of the logistics simulation; and adjusts the state of the logistics simulation based on the logistics system design recommendation output by the artificial intelligence system in response to the logistics system design request.

In embodiments, the digital twin system outputs a graphical representation of the environment digital twin to a display, whereby a user views the simulation via the display. In embodiments, the digital twin system outputs a simulation outcome of the simulation to the machine learning system, and the machine learning system reinforces the machine-learned model used to determine the logistics system design recommendation based on the simulation outcome. In embodiments, the artificial intelligence system receives the request from a logistics design system that designs logistics systems, wherein the request includes one or more logistics factors corresponding to a proposed logistics solution of an organization. In embodiments, the logistics factors include one or more of: a type of product corresponding to the proposed logistics solution, one or more features of the type of product, a location of a manufacturing site, a location of a distribution facility, a location of a warehouse, a location of a customer base, proposed expansion areas of the organization, and supply chain features. In embodiments, the logistics design system provides outcome data relating to the logistics system design recommendation to the machine learning system, and the machine learning system reinforces the machine-learned model that are used to determine the logistics system design recommendation based on the outcome data. In embodiments, the artificial intelligence system determines the logistics system design recommendation to minimize delay times. In embodiments, the artificial intelligence system determines the logistics system design recommendation to comply with regulatory requirements.

In embodiments, a value chain system that designs packaging includes a machine learning system that trains a machine-learned model that outputs a packaging design recommendation given a respective set of input features relating to a specific respective packaging design, wherein the machine learning system trains the machine-learned model based on training data sets that define features of packaging designs and outcomes of the packaging designs; an artificial intelligence system that receives a request for packaging design and determines a packaging design recommendation based on the machine-learned model and the request; and a digital twin system that generates a package digital twin of a package that incorporates the packaging design recommendation, wherein the digital twin system: executes a packaging simulation based on the package digital twin; issues a packaging design request from the artificial intelligence system based on a state of the logistics simulation; and adjusts the state of the logistics simulation based on the packaging design recommendation output by the artificial intelligence system in response to the packaging design request.

In embodiments, the digital twin system outputs a graphical representation of the package digital twin to a display, whereby a user views the simulation via the display. In embodiments, the digital twin system outputs a graphical representation of the package digital twin in a graphical user interface, whereby a user edits the packaging design via the graphical user interface. In embodiments, the digital twin system outputs a simulation outcome of the simulation to the machine learning system, and the machine learning system reinforces the machine-learned model used to determine the packaging design recommendation based on the simulation outcome. In embodiments, the artificial intelligence system receives the request from a packaging design system that designs packaging for physical objects, wherein the request includes one or more packaging factors corresponding to a proposed packaging design for the physical objects. In embodiments, the packaging factors include one or more of: a type of the physical objects, dimensions of the physical objects, masses of the physical objects, and shipping methods of the physical objects. In embodiments, the packaging design system provides outcome data relating to the packaging design recommendation to the machine learning system, and the machine learning system reinforces the machine-learned model that are used to determine the packaging design recommendation based on the outcome data. In embodiments, the artificial intelligence system determines the packaging design recommendation to minimize damage. In embodiments, the artificial intelligence system determines the packaging design recommendation to minimize costs. In embodiments, the artificial intelligence system determines the packaging design recommendation to mitigate environmental impact.

In embodiments, an information technology system for leveraging digital twins in a value chain having a plurality of value chain entities, the information technology system includes a plurality of sensors positioned at least one of in, on, and near a set of value chain entities of the value chain entities and configured to collect sensor data related to the set of value chain entities, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model such that the sensor data is used as training data for the machine learning model, and the machine learning model is configured to transform the sensor data into simulation data; and a digital twin system configured to create a digital replica of the set of value chain entities based on the simulation data, wherein the digital replica of the value chain entities is configured to be used to provide a substantially real-time representation of the value chain entities and provide a simulation of a possible future state of the value chain entities via the simulation data.

In embodiments, the machine learning model is configured to learn which types of sensor data are relevant to dynamics of each value chain entity of the value chain entities and simulation thereof. In embodiments, the machine learning model is configured to make suggestions to a user of the information technology system via an interface regarding potential changes to the plurality of sensors that would improve simulation of the value chain entities via the digital twin system. In embodiments, the machine learning model is configured to prioritize collection and transmission of sensor data that are relevant to dynamics of the value chain entities and simulation thereof.

In embodiments, a value chain network management platform, includes a machine learning system that trains one or more machine-learned models to output one or more e-commerce recommendations to a value chain network customer via an interface using training data that includes product features and outcomes; and an artificial intelligence system that receives a request for e-commerce from an e-commerce system, wherein the artificial intelligence is configured to determine and generate an e-commerce recommendation based on the one or more machine-learned models and the request, and the artificial intelligence is configured to leverage one or more product digital twins and one or more customer digital twins to execute a simulation based on the one or more customer digital twins, the one or more product digital twins, and the e-commerce recommendation.

In embodiments, the machine learning system integrates with a model interpretability system, and wherein the model interpretability system is configured to implement Testing with Concept Activation Vectors (TCAV) functionality, whereby the model interpretability facilitates learning of human-interpretable concepts by the machine-learned model. In embodiments, the one or more machine-learned models are at least one of trained and retrained using simulation data from one or more simulations involving one or more customer profile digital twins.

In embodiments, a value chain network management platform includes a machine learning system that trains one or more machine-learned models to output one or more risk management decisions using training data that includes component features and outcomes; and an artificial intelligence system that receives a request for risk management from a risk management system, wherein the artificial intelligence system is configured to determine and generate a risk management decision based on the one or more machine-learned models and the request, and the artificial intelligence system is configured to leverage one or more component digital twins and one or more environment digital twins to execute a simulation based on the one or more component digital twins, the one or more environment digital twins, and the risk management decision.

In embodiments, the risk management decision relates to a condition of a component. In embodiments, the one or more machine-learned models are at least one of trained and retrained using simulation data from one or more simulations involving one or more components.

In embodiments, an information technology system includes a value chain network management platform having an asset management application associated with maritime assets, wherein the platform comprises a data handling layer including data sources containing information used to populate a training set based on a set of maritime activities of one or more of the maritime assets and at least one of design outcomes, parameters, and data associated with the one or more of the maritime assets; an artificial intelligence system that is configured to learn on the training set collected from the data sources, wherein the artificial intelligence system is configured to simulate one or more attributes of the one or more of the maritime assets, and the artificial intelligence system is configured to generate one or more sets of recommendations for a change in the one or more attributes based on the training set collected from the data sources; a digital twin system that is configured to provide for visualization of a digital twin of the one or more of the maritime assets including detail generated by the artificial intelligence system of the one or more attributes in combination with the one or more generated sets of recommendations.

In embodiments, the maritime assets include one or more container ships, and wherein the digital twin system further provides for visualization of the digital twin of the one or more container ships including the one or more attributes in combination with one or more of the sets of recommendations associated with the container ships. In embodiments, the maritime assets include one or more barges, and wherein the digital twin system further provides for visualization of the digital twin of one or more of the barges including the one or more attributes in combination with one or more of the sets of recommendations associated with the barges. In embodiments, the maritime assets include one or more components of a port infrastructure installed on or adjacent to land, and wherein the digital twin system further provides for visualization of the digital twin of one or more of the components of port infrastructure including the one or more attributes in combination with one or more of the sets of recommendations associated with the components of port infrastructure. In embodiments, the maritime assets also include a container ship moored to a component of the port infrastructure. In embodiments, the maritime assets include one or more moored navigation units deployed on water. In embodiments, the maritime assets include one or more ships each connected to a barge. In embodiments, the maritime assets are associated with a real-world maritime port, and wherein the digital twin system further provides for visualization of the digital twin of one or more of the components of the real-world maritime port including the one or more attributes in combination with one or more of the sets of recommendations associated with the components of the real-world maritime port. In embodiments, the maritime assets are associated with a real-world shipyard, and wherein the digital twin system further provides for visualization of the digital twin of one or more of the components of the real-world shipyard including the one or more attributes in combination with one or more of the sets of recommendations associated with the components of the real-world shipyard.

In embodiments, the digital twin of one or more of the maritime assets is a floating asset twin associated with a ship. In embodiments, the floating asset twin is configured to provide for visualization of a navigation course of the ship relative to a planned course of the ship and one or more of the sets of recommendations from the artificial intelligence system for a change in the navigation course of the ship. In embodiments, the floating asset twin is configured to provide for visualization of an engine performance of the ship and one or more of the sets of recommendations from the artificial intelligence system for a change in the engine performance of the ship. In embodiments, the visualization of the engine performance includes an emissions profile of the ship. In embodiments, the floating asset twin is configured to provide for visualization of a hull integrity of the ship and one or more of the sets of recommendations from the artificial intelligence system for a change in maintenance of the hull of the ship. In embodiments, the floating asset twin is configured to provide for visualization of in-situ hydrodynamic changes to a portion of a hull disposed below a water line of the ship and one or more of the sets of recommendations from the artificial intelligence system for a change in a hydrodynamic surface to change performance of the ship. In embodiments, the floating asset twin is configured to determine a schedule for the change to the hydrodynamic surface of the hull disposed below the waterline of the ship to improve fuel efficiency based on known routes of travel and weather patterns.

In embodiments, the floating asset twin is configured to provide visualizations of in-situ aerodynamic changes to a portion of a hull disposed above a water line of the ship and one or more of the sets of recommendations from the artificial intelligence system for a change in an aerodynamic surface to change performance of the ship. In embodiments, the floating asset twin is configured to determine a schedule for the change to the aerodynamic surface disposed above the waterline of the ship to improve fuel efficiency using known routes of travel and historical weather patterns. In embodiments, the floating asset twin is configured to provide visualizations of extendable buoyant members from a hull of the ship to improve stability during certain maneuvers of the ship and one or more of the sets of recommendations from the artificial intelligence system for a change in the extendable buoyant members to change performance of the ship. In embodiments, the floating asset twin is configured to provide visualizations of a plurality of inspection points on the ship and maintenance histories associated with those inspection points. In embodiments, the floating asset twin is further configured to provide one or more of the sets of recommendations from the artificial intelligence system for a change in maintenance of the plurality of inspection points. In embodiments, the floating asset twin is further configured to provide for visualizations of the plurality of inspection points on the ship affected by travel within a geofenced area and maintenance histories associated with those inspection points. In embodiments, the floating asset twin is further configured to provide details of a ledger of activity associated with the visualization of the plurality of inspection points on the ship affected by travel within a geofenced area and maintenance histories associated with those inspection points. In embodiments, the floating asset twin is configured to provide for visualization for a first user of one of a navigation course of the ship and an engine performance of the ship within a first geofenced area and for visualization for a second user of one of the navigation course of the ship and the engine performance of the ship within a second different geofenced area and where transit between the first and second geofenced areas motivates a handoff of the floating asset twin of the ship between the first user and the second user.

In embodiments, the digital twin is configured to at least partially represent one or more of the maritime assets associated with an event investigation and to at least partially detail a timeline of the event investigation and the associated maritime assets. In embodiments, the digital twin is further configured to provide one or more of the sets of recommendations from the artificial intelligence system for a change of one of the attributes of the associated maritime assets based on the event investigation and the timeline. In embodiments, the digital twin is configured to at least partially represent one or more of the maritime assets associated with a legal proceeding and to at least partially detail at least a portion of a timeline pertinent to the legal proceeding and the associated maritime assets. In embodiments, the digital twin is further configured to provide one or more of the sets of recommendations from the artificial intelligence system for a change of one of the attributes of the associated maritime assets based on the legal proceeding and the timeline. In embodiments, the digital twin is configured to at least partially represent one or more of the maritime assets associated with at least one of a casualty forecast and a casualty report, and to at least partially detail at least a portion of a timeline pertinent to the at least one of the casualty forecast, the casualty report, and the associated maritime assets. In embodiments, the digital twin is further configured to provide one or more of the sets of recommendations from the artificial intelligence system for a change of one of the attributes of the associated maritime assets to reduce exposure relative to a set of previous casualty forecasts based on at least one of the casualty forecast and the casualty report, and the timeline. In embodiments, the maritime assets include a port infrastructure facility, wherein the data collected by a value chain network management platform facilitates identifying theft at or misuse of the port infrastructure facility by correlating data between a set of data collectors for one or more physical items in the port infrastructure facility and the digital twin detailing the one or more physical items of the port infrastructure facility for the at least one of the port infrastructure facility and a set of operators. In embodiments, the digital twin details the one or more physical items of the port infrastructure facility for at least one operator that includes a view of expected states of at least a portion of the one or more physical items. In embodiments, the maritime assets include a shipyard, wherein the data collected by a value chain network management platform facilitates identifying theft at or misuse of one or more physical items in the shipyard by correlating data between a set of data collectors for the one or more physical items and the digital twin detailing the one or more physical items of the shipyard for the at least one of the shipyard and a set of operators. In embodiments, the digital twin details the one or more physical items of the shipyard for at least one operator that includes a view of expected states of at least a portion of the one or more physical items. In embodiments, the artificial intelligence system determines a set of geofence parameters, and wherein the digital twin provides further visualization of at least one geofence that integrates representation of a set of the maritime assets with a representation of a maritime environment adjacent to the geofence. In embodiments, the digital twin is further configured to provide one or more of the sets of recommendations from the artificial intelligence system for a change of one of the attributes of the set of maritime assets based on the visualization of the at least one geofence. In embodiments, the maritime assets are ships capable of carrying cargo, wherein the artificial intelligence system determines a set of geofence parameters, and wherein the digital twin provides further visualization of at least one geofence that integrates representation of the ships capable of carrying cargo with a representation of a maritime environment. In embodiments, the digital twin is further configured to provide one or more of the sets of recommendations from the artificial intelligence system for a change of one of the attributes of the ships capable of carrying cargo based on the visualization of the at least one geofence.

In embodiments, an information technology system having a management platform includes a user interface that provides a set of adaptive intelligence systems that provide coordinated artificial intelligence for a set of demand management applications and a set of supply chain applications for a category of goods by determining relationships among demand management and supply chain applications based on inputs used by the applications and results produced by the applications; and a set of artificial intelligence systems as part of the set of adaptive intelligence systems that provide coordinated intelligence for the set of demand management applications and the set of supply chain applications for the category of goods by determining a temporal prioritization of demand management application outputs that impact control of supply chain applications so as to meet a temporal demand for at least one of the goods in the category of goods.

In embodiments, the adaptive intelligence system facilitates coordinated artificial intelligence for the set of demand management applications or the set of supply chain applications, or both for a category of goods by processing data that is available in any of a plurality of data sources including processes, bill of materials, weather, traffic, design specification, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System. In embodiments, the set of adaptive intelligence systems provide user access to coordinated artificial intelligence capabilities for use with the sets of applications. In embodiments, the user interface presents a set of coordinated artificial intelligence capabilities responsive to the category of goods. In embodiments, the user interface facilitates configuring the set of adaptive intelligence systems with at least one artificial intelligence system. In embodiments, the at least one artificial intelligence system is a hybrid artificial intelligence system. In embodiments, the at least one artificial intelligence system comprises a hybrid neural network. In embodiments, the set of adaptive intelligence systems that provide coordinated artificial intelligence operates on or responsive to data collected by or produced by other systems of an adaptive intelligence systems layer. In embodiments, the set of adaptive intelligence systems that provide coordinated artificial intelligence provides coordinated intelligence for a specific operator and/or enterprise that participates in the supply chain for the category of goods. In embodiments, the set of adaptive intelligence systems that provide coordinated artificial intelligence employs a neural network that processes at least one of demand management application outputs and supply chain application outputs to provide the coordinated intelligence.

In embodiments, the set of adaptive intelligence systems that provide coordinated artificial intelligence is configured through the user interface for at least two demand management applications selected from the list consisting of a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service In embodiments, the set of adaptive intelligence systems that provide coordinated artificial intelligence is configured through the user interface for at least two supply chain applications selected from the list consisting of a goods timing management application, a goods quantity management application, a logistics management application, a shipping application, a delivery application, an order for goods management application, and an order for components management application. In embodiments, the set of adaptive intelligence systems provides a set of capabilities that facilitate development and deployment of intelligence for at least one function selected from a list of functions consisting of supply chain application automation, demand management application automation, machine learning, artificial intelligence, intelligent transactions, intelligent operations, remote control, analytics, monitoring, reporting, state management, event management, and process management. In embodiments, an artificial intelligence system of the adaptive intelligence systems layer operates on or responsive to data collected by or produced by other systems of the adaptive intelligence systems layer. In embodiments, a set of artificial intelligence systems may provide coordinated intelligence for a specific operator and/or enterprise that participates in the supply chain for the category of goods. In embodiments, the coordinated intelligence includes a portion of a set of artificial intelligence systems that employs a neural network that processes at least one of demand management application outputs and supply chain application outputs to provide the coordinated intelligence.

In embodiments, the demand management applications include at least two of a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service.

In embodiments, the supply chain applications include at least two of a goods timing management application, a goods quantity management application, a logistics management application, a shipping application, a delivery application, an order for goods management application, and an order for components management application.

In embodiments, an artificial intelligence system facilitates coordinated intelligence for the sets of applications by processing data that is available in any of a plurality of data sources including processes, bill of materials, weather, traffic, design specification, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System.

In embodiments, the set of adaptive intelligence systems are configured in a topology that facilitates shared adaptation capabilities among at least two adaptive intelligence systems in the set of adaptive intelligence systems. In embodiments, the set of adaptive intelligence systems employ artificial intelligence to provision available network resources for both the set of demand management applications and for the set of supply chain applications. In embodiments, the set of demand management applications comprises a demand planning application. In embodiments, the set of adaptive intelligence systems employ artificial intelligence to improve at least one of the list of outputs consisting of a process output, an application output, a process outcome and an application outcome.

One path to distilling information is digital twin technology, which can present large amounts of data in a digestible format that represents salient characteristics of an item, often updated in real time or near real time as the twin is updated to reflect the current state based on a pipeline of data about a represented item. While this is helpful, current digital twin technology has its limitations due to the fact that different roles within an organization may require different information to draw their insights. For example, a CEO of an industrial facility makes decisions based on a "10,000 foot view" of the company. The CEO may review profit and loss (P&L) data, industry trends, and employee trends (e.g., employee satisfaction or employee retention rates) to make overall decisions on behalf of the organization but does not necessarily need to see the granular data points to make decisions. In contrast, a different user, such as a CFO, may require more granular information, such as sales figures by region, marketing costs, maintenance costs, depreciation information, human capital costs, and costs of third-party vendors to draw her conclusions, but may not be as concerned with employee or industry trends. Similarly, a CTO may have no need for P&L data but may require an in-depth visualization of the processes within different manufacturing facilities to gain a better understanding of opportunities to improve process outcomes or to diagnose issues within processes, equipment or systems. Thus, a need exists for digital twins and other interfaces that are configured for particular roles.

As a further challenge, a given role may have varying needs based on context. For example, while the CEO might focus on higher-level data for many activities, such as strategic decision making or board communications, the same CEO may find more granular, micro-scale data useful for other activities, such as when an issue is escalated from a subdivision of the organization for input. Thus, a need exists for context-adaptive digital twins for each role, including ones that provide relevant displays and information of the right type at the right time for various situations and activities undertaken by the role.

More generally, ubiquitous connectivity and the proliferation of larger and larger data sets offers enterprise leaders opportunities for an unprecedented degree of awareness and control over enterprise assets and activities. A need and opportunity exist for an enterprise control tower by which executive leaders can, through various interfaces, including executive digital twins, dashboards, and similar systems, obtain timely information that is curated to invoke relevant awareness, support effective decisions and enable operational control.

According to some embodiments of the present disclosure, an enterprise management platform is disclosed. In some embodiments, the enterprise management platform integrates a set of executive digital twins that take data from an intelligent data and networking pipeline to provide role-specific features, including AI-enabled expert agent features and enhanced collaboration features, and salient views of the entities and workflows of an enterprise, thereby enabling executives to monitor and control entities and workflows to an unprecedented degree at appropriate levels of granularity and using familiar taxonomies and decision-making frameworks.

Further provided herein are methods and systems for enterprise control towers by which executive leaders can, through various interfaces, including executive digital twins, dashboards, and similar systems, obtain timely information (often in real-time or near real-time) that is curated to invoke relevant awareness, support effective decisions and enable operational control. The present disclosure further relates to an executive control tower and enterprise management platform that is configured to provide and use a converged technology stack that includes intelligent sensing and data collection, curation and handling of data through various stages of a distributed storage, networking and connectivity pipeline (from a set of local operational environments through information technology networks to various distributed on-premises and cloud computing environments), and deployment of various application-specific and general artificial intelligence capabilities in order to enable executive control towers, including role-specific executive digital twins, that are used by executives in management of the value chain network operations of an enterprise.

In embodiments of the present disclosure, a method is provided for configuring role-based digital twins, comprising: receiving, by a processing system having one or more processors, an organizational definition of an enterprise, wherein the organizational definition defines a set of roles within the enterprise; generating, by the processing system, an organizational digital twin of the enterprise based on the organizational definition, wherein the organizational digital twin is a digital representation of an organizational structure of the enterprise; determining, by the processing system, a set of relationships between different roles within the set of roles based on the organizational definition; determining, by the processing system, a set of settings for a role from the set of roles based on the determined set of relationships; linking an identity of a respective individual to the role; determining, by the processing system, a configuration of a presentation layer of a role-based digital twin corresponding to the role based on the settings of the role that is linked to the identity, wherein the configuration of the presentation layer defines a set of states that is depicted in the role-based digital twin associated with the role; determining, by the processing system, a set of data sources that provide data corresponding to the set of states, wherein each data source provides one or more respective types of data; and configuring one or more data structures that is received from the one or more data sources, wherein the one or more data structures are configured to provide data used to populate one or more of the set of states in the role-based digital twin.

In embodiments, an organizational definition may further identify a set of physical assets of the enterprise.

In embodiments, determining a set of relationships may include parsing the organizational definition to identify a reporting structure and one or more business units of the enterprise.

In embodiments, a set of relationships may be inferred from a reporting structure and a business unit.

In embodiments, a set of identities may be linked to a set of roles, wherein each identity corresponds to a respective role from the set of roles.

In embodiments, a role-based digital twin may integrate with an enterprise resource planning system that operates on the organizational digital twin that represents a set of roles in the enterprise, such that changes in an enterprise resource planning system are automatically reflected in the organizational digital twin.

In embodiments, an organizational structure may include hierarchical components, which may be embodied in a graph data structure.

In embodiments, a set of settings for the set of roles may include role-based permission settings.

In embodiments, a role-based permission setting may be based on hierarchical components defined in the organizational definition.

In embodiments, a set of settings for a set of roles may include role-based preference settings.

In embodiments, a role-based preference setting may be configured based on a set of role-specific templates.

In embodiments, a set of templates may include at least one of a CEO template, a COO template, a CFO template, a counsel template, a board member template, a CTO template, a chief marketing officer template, an information technology manager template, a chief information officer template, a chief data officer template, an investor template, a customer template, a vendor template, a supplier template, an engineering manager template, a project manager template, an operations manager template, a sales manager template, a salesperson template, a service manager template, a maintenance operator template, and a business development template.

In embodiments, a set of settings for the set of roles may include role-based taxonomy settings.

In embodiments, a taxonomy setting may identify a taxonomy that is used to characterize data that is presented in a role-based digital twin, such that the data is presented in a taxonomy that is linked to the role corresponding to the role-based digital twin.

In embodiments, a set of taxonomies includes at least one of a CEO taxonomy, a COO taxonomy, a CFO taxonomy, a counsel taxonomy, a board member taxonomy, a CTO taxonomy, a chief marketing officer taxonomy, an information technology manager taxonomy, a chief information officer taxonomy, a chief data officer taxonomy, an investor taxonomy, a customer taxonomy, a vendor taxonomy, a supplier taxonomy, an engineering manager taxonomy, a project manager taxonomy, an operations manager taxonomy, a sales manager taxonomy, a salesperson taxonomy, a service manager taxonomy, a maintenance operator taxonomy, and a business development taxonomy.

In embodiments, at least one role of the set of roles may be selected from among a CEO role, a COO role, a CFO role, a counsel role, a board member role, a CTO role, an information technology manager role, a chief information officer role, a chief data officer role, a human resources manager role, an investor role, an engineering manager role, an accountant role, an auditor role, a resource planning role, a public relations manager role, a project manager role, an operations manager role, a research and development role, an engineer role, including but not limited to mechanical engineer, electrical engineer, semiconductor engineer, chemical engineer, computer science engineer, data science engineer, network engineer, or some other type of engineer, and a business development role.

In embodiments, at least one role may be selected from among a factory manager role, a factory operations role, a factory worker role, a power plant manager role, a power plant operations role, a power plant worker role, an equipment service role, and an equipment maintenance operator role.

In embodiments, at least one role may be selected from among a market maker role, a market analyst role, an exchange manager role, a broker-dealer role, a trading role, a reconciliation role, a contract counterparty role, an exchange rate setting role, a market orchestration role, a market configuration role, and a contract configuration role.

In embodiments, at least one role may be selected from among a chief marketing officer role, a product development role, a supply chain manager role, a product design role, a marketing analyst role, a product manager role, a competitive analyst role, a customer service representative role, a procurement operator, an inbound logistics operator, an outbound logistics operator, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments of the present disclosure, a method is provided for training an expert agent, comprising; receiving digital twin data from a set of data sources, the digital twin data including: sensor data that is received from a set of sensors that monitor a set of monitored physical entities associated with the enterprise, the sensor data transported by a set of network entities; enterprise data streams generated by a set of enterprise assets, wherein the enterprise assets include at least one of physical entities associated with the enterprise and digital entities associated with the enterprise; structuring the digital twin data into a set of digital twin data structures that are configured to serve a plurality of different role-based digital twins; receiving a request for a role-based digital twin from a client application, wherein the role-based digital twin is configured with respect to a defined role within the enterprise; determining a subset of the structured digital twin data to corresponds to a set of states that are depicted in the role-based digital twin; providing the subset of the structured digital twin data to the client application; receiving expert agent training data sets from the client application, each expert agent training data set indicating a respective action taken by a user using the client application and one or more features that correspond to the respective action; and training an expert agent on behalf of the user based on the expert agent training data sets, wherein the expert agent is configured to determine actions to be performed on behalf of the user, wherein the determined actions are either recommended to the user or automatically performed on behalf of the user.

In embodiments, a defined role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, a defined role may be selected from among a factory manager role, a factory operations role, a factory worker role, a power plant manager role, a power plant operations role, a power plant worker role, an equipment service role, and an equipment maintenance operator role.

In embodiments, a defined role may be selected from among a market maker role, an exchange manager role, a broker-dealer role, a trading role, a reconciliation role, a contract counterparty role, an exchange rate setting role, a market orchestration role, a market configuration role, and a contract configuration role.

In embodiments, a defined role may be selected from among a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments, an expert agent training data may include interactions training data that indicates a set of interactions with a set of experts by the user during performance of the role.

In embodiments, a set of interactions used to train the expert agent may include interactions of the user with the physical entities, interactions of the user with the role-based digital twin, interactions of the user with the sensor data as depicted in the role-based digital twin, interactions of the experts with the data streams generated by the physical entities, interactions of the experts with one or more computational entities, interactions of the user with one or more network entities, or some other type of interaction.

In embodiments, an expert agent may be trained to determine an action selected from the group comprising: selection of a tool, selection of a task, selection of a dimension, setting of a parameter, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource.

In embodiments, an executive may be trained on a training set of outcomes resulting from the actions taken by the executive.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an expert agent may be trained to perform an action selected from among determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware.

In embodiments, an expert agent is at least one of trained and configured via feedback from at least one expert in the defined role regarding a set of outputs of expert agent.

In embodiments, a set of outputs of the expert agent upon which the expert provides feedback may include at least one of a recommendation, a classification, a prediction, a control instruction, an input selection, a protocol selection, a communication, an alert, a target selection for a communication, a data storage selection, a computational selection, a configuration, an event detection, and a forecast.

In embodiments, feedback of the at least one expert may be solicited to train the expert agent to replicate the expertise of the expert in the role.

In embodiments, a feedback of the at least one expert may be used to modify the set of inputs to the expert agent and/or used to identify and characterize at least one error by the expert agent.

In embodiments, a report on a set of errors may be provided to a user of the expert agent to enable reconfiguring of the expert agent based on the feedback from the expert.

In embodiments, reconfiguring the artificial intelligence system may include at least one of removing an input that is the source of the error, reconfiguring a set of nodes of the artificial intelligence system, reconfiguring a set of weights of the artificial intelligence system, reconfiguring a set of outputs of the artificial intelligence system, reconfiguring a processing flow within the artificial intelligence system, and augmenting the set of inputs to the artificial intelligence system.

In embodiments, an expert agent may be trained learn upon a training set of outcomes and to provide at least one of training and guidance to an individual who is responsible for performing the defined role.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments of the present disclosure, a method is provided taking an information technology architecture that supports a digital twin of a set of physical and digital entities, the architecture including: a set of sensors that provide sensor data about the set of physical entities; a set of data streams generated by at least a subset of the set of physical and digital entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; and integrating an artificial intelligence system with the information technology architecture, wherein the artificial intelligence system is configured to operate as a double of an expert worker for a defined role of the enterprise.

In embodiments, an artificial intelligence system may be trained upon a training set of data that includes a set of interactions by a specific expert worker during performance of the defined role.

In embodiments, a set of interactions may be used to train the artificial intelligence system may include interactions of the expert with the physical entities, wherein the set of interactions used to train the artificial intelligence system includes interactions of the expert with the digital twin.

In embodiments, a set of interactions used to train the artificial intelligence system may include interactions of the expert with the sensor data, wherein the set of interactions used to train the artificial intelligence system includes interactions of the expert with the data streams generated by the physical entities.

In embodiments, a set of interactions used to train the artificial intelligence system may include interactions of the expert with the computational entities, wherein the set of interactions used to train the artificial intelligence system may include interactions of the expert with the network entities.

In embodiments, a set of interactions may be parsed to identify a chain of reasoning of the expert worker upon a set of information and the chain of reasoning is embodied in the configuration of the artificial intelligence system.

In embodiments, an artificial intelligence system may be trained based on the set interactions to determine an action selected from: selection of a tool, selection of a task, selection of a dimension, setting of a parameter, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource.

In embodiments, a chain of reasoning may be parsed to identify a type of reasoning of the expert worker and the type of reasoning is used as a basis for configuration of the artificial intelligence system.

In embodiments, a chain of reasoning may be a deductive chain of reasoning from a set of data.

In embodiments, a chain of reasoning may be an inductive chain of reasoning, a classification chain of reasoning, a predictive chain of reasoning, an iterative chain of reasoning, a trial-and-error chain of reasoning, a Bayesian chain of reasoning, a scientific method chain of reasoning, or some other reasoning method or system.

In embodiments, an artificial intelligence system may be trained on a training set to perform an action selected from among determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware.

In embodiments, a training set of interactions may be parsed to identify a type of processing of the expert worker upon a set of information and the type of processing is embodied in the configuration of the artificial intelligence system.

In embodiments, a type of processing may use visual processing of the expert worker and the artificial intelligence system is configured to operate on image or video information.

In embodiments, a type of processing may use audio processing of the expert worker and the artificial intelligence system may be configured to operate on audio information.

In embodiments, a type of processing may use touch processing of the expert worker and the artificial intelligence system may be configured to operate on physical sensor information.

In embodiments, a type of processing may use olfactory processing of the expert worker and the artificial intelligence system may be configured to operate on chemical sensing information.

In embodiments, a type of processing may use textual information processing of the expert worker and the artificial intelligence system may be configured to operate on text information.

In embodiments, a type of processing may use motion processing of the expert worker and the artificial intelligence system may be configured to operate on motion information.

In embodiments, a type of processing may use taste processing of the expert worker and the artificial intelligence system may be configured to operate on chemical information.

In embodiments, a type of processing may use mathematical processing of the expert worker and the artificial intelligence system may be configured to operate mathematically on available data.

In embodiments, a type of processing may use executive manager processing of the expert worker and the artificial intelligence system may be configured to provide executive decision support.

In embodiments, a type of processing may use creative processing of the expert worker and the artificial intelligence system may be configured to provide a set of alternative options.

In embodiments, a type of processing may use analytic processing of the expert worker to select among a set of available choices and the artificial intelligence system may be configured to provide a recommendation among a set of choices.

In embodiments, an artificial intelligence system may be trained on a training set of outcomes.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be at least one of trained and configured via feedback from the specific expert worker regarding a set of outputs of the artificial intelligence system.

In embodiments, a set of outputs of the artificial intelligence system upon which the expert provides feedback may include at least one of a recommendation, a classification, a prediction, a control instruction, an input selection, a protocol selection, a communication, an alert, a target selection for a communication, a data storage selection, a computational selection, a configuration, an event detection, and a forecast.

In embodiments, a feedback of the expert may be solicited to train the artificial intelligence system to replicate the expertise of the expert in the role, used to modify the set of inputs to the artificial intelligence system, and or used to identify and characterize at least one error by the artificial intelligence system.

In embodiments, a report on a set of errors may be provided to a manager associated with the artificial intelligence system to enable reconfiguring of the artificial intelligence system based on the feedback from the expert.

In embodiments, reconfiguring the artificial intelligence system may include at least one of removing an input that is the source of the error, reconfiguring a set of nodes of the artificial intelligence system, reconfiguring a set of weights of the artificial intelligence system, reconfiguring a set of outputs of the artificial intelligence system, reconfiguring a processing flow within the artificial intelligence system, and augmenting the set of inputs to the artificial intelligence system.

In embodiments, an artificial intelligence system may be configured to provide at least one of training and guidance to another worker to enable the other worker to perform the defined role.

In embodiments, an artificial intelligence system may learn on a training set of outcomes to enhance the training and guidance.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be configured to provide at least one of training and guidance to another worker to enable the other worker to perform the defined role.

In embodiments, an artificial intelligence system may learn on a training set of outcomes to enhance the training and guidance.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be configured to provide at least one of training and guidance to the expert worker to enable the expert worker to perform the defined role.

In embodiments, an artificial intelligence system may learn on a training set of outcomes to enhance the training and guidance.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, outcomes may be compared between a set of actions of the expert worker and a set of outputs of the artificial intelligence system.

In embodiments, a comparison may be used to train the expert worker.

In embodiments, a comparison may be used to improve the artificial intelligence system.

In embodiments, a defined role of the expert worker may be selected from among a CEO role, a COO role, a CFO role, a counsel role, a board member role, a CTO role, a chief marketing officer role, an information technology manager role, a chief information officer role, a chief data officer role, an investor role, a customer role, a vendor role, a supplier role, an engineering manager role, a project manager role, an operations manager role, a sales manager role, a salesperson role, a service manager role, a maintenance operator role, and a business development role.

In embodiments, computational entities and the network entities may be integrated as a converged computational and network entity.

In embodiments of the present disclosure, a method is provided for maintaining an information technology architecture that supports a digital twin of a set of physical entities, the architecture including: a set of sensors that provide sensor data about the set of physical entities; a set of data streams generated by at least a subset of the set of physical entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; and integrating an artificial intelligence system with the information technology architecture, wherein the artificial intelligence system is configured to operate as a double of an expert worker for a defined role of the enterprise and wherein an electronic account associated with the expert worker is awarded with a benefit for training the artificial intelligence system.

In embodiments, a benefit may be a reward based on the outcomes of the use of the artificial intelligence system, a reward based on the productivity of the artificial intelligence system and/or a reward based on a measure of the expertise of the artificial intelligence system.

In embodiments, a benefit may be a share of revenue or profit generated by the work of the artificial intelligence system and/or a reward that is tracked via a distributed ledger on a blockchain that captures information associated with a set of actions and events involving the artificial intelligence system.

In embodiments, a reward may be administered via a smart contract operating on the blockchain.

In embodiments, an artificial intelligence system may be trained upon a training set of data that includes a set of interactions by a specific expert worker during performance of the defined role.

In embodiments, a set of interactions may be used to train the artificial intelligence system includes interactions of the expert with the physical entities, used to train the artificial intelligence system includes interactions of the expert with the digital twin and/or used to train the artificial intelligence system includes interactions of the expert with the sensor data.

In embodiments, a set of interactions used to train the artificial intelligence system may include interactions of the expert with the data streams generated by the physical entities, interactions of the expert with the computational entities, and/or interactions of the expert with the network entities.

In embodiments, an artificial intelligence system may be trained based on the interactions to determine an action selected from: selection of a tool, selection of a task, selection of a dimension, setting of a parameter, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource.

In embodiments, a training set of interactions may be parsed to identify a chain of reasoning of the expert worker upon a set of information and the chain of reasoning is embodied in the configuration of the artificial intelligence system.

In embodiments, a chain of reasoning may be parsed to identify a type of reasoning of the expert worker and the type of reasoning is used as a basis for configuration of the artificial intelligence system.

In embodiments, a chain of reasoning may be a deductive chain of reasoning from a set of data.

In embodiments, an artificial intelligence system may be trained to perform an action selected from: determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware.

In embodiments of the present disclosure, a method is provided for taking an information technology architecture that supports a digital twin of a set of physical entities, the architecture including: a set of sensors that provide sensor data about the set of physical entities; a set of data streams generated by at least a subset of the set of physical entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; and integrating an artificial intelligence system with the information technology architecture, wherein the artificial intelligence system is configured to operate as a double of a defined workforce involving a defined set of roles of the enterprise.

In embodiments, an artificial intelligence system may be trained upon a training set of data that includes a set of interactions by members of the defined workforce during performance of the defined set of roles.

In embodiments, a set of interactions used to train the artificial intelligence system may include interactions of the workforce with the physical entities, interactions of the workforce with the digital twin, interactions of the workforce with the sensor data, interactions of the workforce with the data streams generated by the physical entities, interactions of the workforce with the computational entities, and/or interactions of the workforce with the network entities.

In embodiments, a training set of interactions may be parsed to identify a chain of operations of the workforce upon a set of information and the chain of reasoning may be embodied in the configuration of the artificial intelligence system.

In embodiments, a training set of interactions may be parsed to identify a type of processing of the workforce upon a set of information and the type of processing may be embodied in the configuration of the artificial intelligence system.

In embodiments, an artificial intelligence system may be trained based on the interactions to determine an action selected from: selection of a tool, selection of a task, selection of a dimension, setting of a parameter, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource.

In embodiments, an artificial intelligence system may be trained on a training set of outcomes.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be at least one of trained and configured via feedback from members of the workforce regarding a set of outputs of the artificial intelligence system.

In embodiments, a set of outputs of the artificial intelligence system upon which the workforce members provide feedback may include at least one of a recommendation, a classification, a prediction, a control instruction, an input selection, a protocol selection, a communication, an alert, a target selection for a communication, a data storage selection, a computational selection, a configuration, an event detection, and a forecast.

In embodiments, a feedback of the workforce members may be solicited to train the artificial intelligence system to replicate the operation of the workforce in the defined set of roles.

In embodiments, a feedback of the workforce members may be used to modify the set of inputs to the artificial intelligence system.

In embodiments, a feedback of the workforce members may be used to identify and characterize at least one error by the artificial intelligence system.

In embodiments, a report on a set of errors may be provided to a manager of the artificial intelligence system to enable reconfiguring of the artificial intelligence system based on the feedback.

In embodiments, reconfiguring the artificial intelligence system may include at least one of removing an input that is the source of the error, reconfiguring a set of nodes of the artificial intelligence system, reconfiguring a set of weights of the artificial intelligence system, reconfiguring a set of outputs of the artificial intelligence system, reconfiguring a processing flow within the artificial intelligence system, and augmenting the set of inputs to the artificial intelligence system.

In embodiments, an artificial intelligence system may be configured to provide at least one of training and guidance to enable the other worker to perform a role within the defined set of roles of the workforce.

In embodiments, an artificial intelligence system may learn on a training set of outcomes to enhance the training and guidance.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be trained to perform an action selected from among determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware.

In embodiments, an artificial intelligence system may be configured to provide at least one of training and guidance to the workforce to enable the workforce to perform the defined role.

In embodiments, an artificial intelligence system may learn on a training set of outcomes to enhance the training and guidance.

In embodiments, a training set of outcomes may include. data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome In embodiments, outcomes may be compared between a set of actions of the workforce and a set of outputs of the artificial intelligence system, wherein the comparison is used to train the workforce and/or is used to improve the artificial intelligence system.

In embodiments, at least one role within the set of roles of the workforce may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, a workforce may be a factory operations workforce, a plant operations workforce, a resource extraction operations workforce, a network operations workforce responsible for operating a network for an industrial production environment, a supply chain management workforce, a demand planning workforce, a logistics planning workforce, a vendor management workforce, or some other kind of workforce.

In embodiments, a workforce may be a brokering workforce for a marketplace, a trading workforce for a marketplace, a trade reconciliation workforce for a marketplace, a transactional execution workforce for a marketplace, or some other kind of workforce.

In embodiments, computational entities and the network entities may be integrated as a converged computational and network entity.

In embodiments of the present disclosure, a method is provided for configuring a digital twin of a workforce, comprising: representing an enterprise organizational structure in a digital twin of an enterprise; parsing the structure to infer relationships among a set of roles within the organizational structure, the relationships and the roles defining a workforce of the enterprise; and configuring the presentation layer of a digital twin to represent the enterprise as a set of workforces having a set of attributes and relationships.

In embodiments, a digital twin may integrate with an enterprise resource planning system that operates on a data structure representing a set of roles in the enterprise, such that changes in the enterprise resource planning system are automatically reflected in the digital twin.

In embodiments, an organizational structure may include hierarchical components.

In embodiments, hierarchical components may be embodied in a graph data structure.

In embodiments, a workforce may be a factory operations workforce, a plant operations workforce, a resource extraction operations workforce, or some other type of workforce.

In embodiments, a workforce may be a network operations workforce responsible for operating a network for an industrial production environment, wherein the workforce is a supply chain management workforce, a demand planning workforce, a logistics planning workforce, a vendor management workforce, a brokering workforce for a marketplace, a trading workforce for a marketplace, a trade reconciliation workforce for a marketplace, a transactional execution workforce for a marketplace, or some other type of workforce.

In embodiments, at least one workforce role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, at least one workforce role may be selected from among a factory manager role, a factory operations role, a factory worker role, a power plant manager role, a power plant operations role, a power plant worker role, an equipment service role, and an equipment maintenance operator role.

In embodiments, at least one workforce role may be selected from among a market maker role, an exchange manager role, a broker-dealer role, a trading role, a reconciliation role, a contract counterparty role, an exchange rate setting role, a market orchestration role, a market configuration role, and a contract configuration role.

In embodiments, at least one workforce role may be selected from among a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments, a digital twin may represent a recommendation for training for the workforce, a recommendation for augmentation of the workforce, a recommendation for configuration of a set of operations involving the workforce, a recommendation for configuration of the workforce, or some other kind of recommendation.

In embodiments of the present disclosure, a method is provided for providing a digital twin of a workforce, comprising: maintaining an information technology architecture that supports a digital twin of a set of physical and digital entities, the architecture including: a set of sensors that provide sensor data about the set of physical entities; a set of data streams generated by at least a subset of the set of physical and digital entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; representing an enterprise organizational structure in a digital twin of an enterprise; parsing the structure to infer relationships among a set of roles within the organizational structure, the relationships and the roles defining a workforce of the enterprise; integrating an artificial intelligence system with the information technology architecture, wherein the artificial intelligence system is configured to operate as a double of a set of workers for a set of defined roles of the enterprise and configuring the presentation layer of a digital twin to represent the enterprise as a set of workforces having a set of attributes and relationships, wherein the attributes and relationships include human worker attributes and relationships and artificial intelligence double attributes and relationships.

In embodiments, a digital twin may integrate with an enterprise resource planning system that operates on a data structure representing a set of roles in the enterprise, such that changes in the enterprise resource planning system are automatically reflected in the digital twin.

In embodiments, an organizational structure may include hierarchical components.

In embodiments, hierarchical components may be embodied in a graph data structure.

In embodiments, a workforce may be a factory operations workforce, a plant operations workforce, a resource extraction operations workforce, a network operations workforce responsible for operating a network for an industrial production environment, a supply chain management workforce, a demand planning workforce, a logistics planning workforce, a vendor management workforce, a brokering workforce, a trading workforce, a trade reconciliation workforce, a transactional execution workforce, or some other type of workforce.

In embodiments, at least one workforce role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, at least one workforce role may be selected from among a factory manager role, a factory operations role, a factory worker role, a power plant manager role, a power plant operations role, a power plant worker role, an equipment service role, and an equipment maintenance operator role.

In embodiments, at least one workforce role may be selected from among a market maker role, an exchange manager role, a broker-dealer role, a trading role, a reconciliation role, a contract counterparty role, an exchange rate setting role, a market orchestration role, a market configuration role, and a contract configuration role.

In embodiments, at least one workforce role may be selected from among a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments, a digital twin may represent a recommendation for training for the workforce, a recommendation for augmentation of the workforce, a recommendation for configuration of a set of operations involving the workforce, a recommendation for configuration of the workforce, a set of capacities and competencies of a set of workers and a set of doubles, and/or a set of mixed workgroups of human workers and artificial intelligence doubles.

In embodiments of the present disclosure, a method is provided for serving digital twins comprising: receiving, by a processing system of a digital twin system, a request for a digital twin from a user device of a user associated with an enterprise, the enterprise deploying a sensor system to monitor one or more facilities of the enterprise; determining, by the processing system, a workforce role of the user with respect to the enterprise; generating, by the processing system, a role-based digital twin corresponding to the workforce role of the user based on a perspective view corresponding to the workforce role of the user, wherein the role-based digital twin depicts one or more states and/or entities that are related to the enterprise; providing, by the processing system, the role-based digital twin to the user device, wherein providing the role-based digital twin: identifying, by the processing system, a set of data types that are used to populate the at least one of the states and/or entities of the role-based digital twin, wherein the set of data types include one or more sensor data feeds that are received from the sensor system deployed by the enterprise; and connecting, by the processing system, the one or more sensor data streams to the role-based digital twin.

In embodiments, generating a role-based digital twin may include determining the perspective view corresponding to the workforce role of the user based on the workforce role of the user and a set of data types that are relevant to the workforce role of the user.

In embodiments, determining the perspective view corresponding to the workforce role of the user may include determining an appropriate granularity level for each of the data types.

In embodiments, an appropriate granularity level for at least one of the data types may be defined in a default configuration corresponding to the workforce role.

In embodiments, an appropriate granularity level for at least one of the data types may be determined based on previous interactions of the user with the role-based digital twin.

In embodiments, a sensor system may include an edge device that receives sensor data from a set of sensors within the sensor system and generates the sensor data stream that is provided to the digital twin system via a network.

In embodiments, an edge device may receive sensor data from the set of sensors and selectively compresses the sensor data based on values indicated in the sensor data to obtain the sensor data stream.

In embodiments, connecting the one or more sensor streams may include: receiving the sensor data stream from the edge device; and routing the sensor data stream to the user device that is presenting the role-based digital twin to the user.

In embodiments, connecting the one or more sensor streams may include: receiving the sensor data stream from the edge device; analyzing the sensor data stream to identify one or more fault conditions corresponding to an object being monitored by the sensor system; and routing an indicator of the fault condition to the user device that is presenting the role-based digital twin to the user.

In embodiments, connecting the one or more sensor streams may include: receiving the sensor data stream from the edge device; analyzing the sensor data stream to identify a recommendation corresponding to the workforce role of the user; and routing an indicator of the recommendation to the user device that is presenting the role-based digital twin to the user.

In embodiments, connecting the one or more sensor streams may include: receiving the sensor data stream from the edge device; analyzing the sensor data stream to identify a recommendation corresponding to the workforce role of the user; and routing an indicator of the recommendation to the user device that is presenting the role-based digital twin to the user.

In embodiments, a workforce may be a factory operations workforce, a plant operations workforce, a resource extraction operations workforce, a network operations workforce responsible for operating a network for an industrial production environment, a supply chain management workforce, a demand planning workforce, a logistics planning workforce, a vendor management workforce, or some other type of workforce.

In embodiments, at least one workforce role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, at least one workforce role may be selected from among a factory manager role, a factory operations role, a factory worker role, a power plant manager role, a power plant operations role, a power plant worker role, an equipment service role, and an equipment maintenance operator role.

In embodiments, at least one workforce role may be selected from among a market maker role, an exchange manager role, a broker-dealer role, a trading role, a reconciliation role, a contract counterparty role, an exchange rate setting role, a market orchestration role, a market configuration role, and a contract configuration role.

In embodiments, at least one workforce role may be selected from among a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments of the present disclosure, a method is provided for providing a digital twin of a workforce, comprising: maintaining an information technology architecture that supports a digital twin of a set of physical and digital entities, the architecture including: a set of sensors that provide sensor data about the set of physical entities; a set of data streams generated by at least a subset of the set of physical and digital entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; representing an enterprise organizational structure in a digital twin of an enterprise; parsing the structure to infer relationships among a set of roles within the organizational structure, the relationships and the roles defining a workforce of the enterprise; determining a set of parameters with which the digital twin is configured based on the inferred set of relationships; and configuring the presentation layer of a digital twin based on the set of parameters.

A more complete understanding of the disclosure will be appreciated from the description and accompanying drawings and the claims, which follow. All documents referenced herein are hereby incorporated by reference.

BRIEF DESCRIPTION OF THE DRAWINGS

The accompanying drawings, which are included to provide a better understanding of the disclosure, illustrate embodiments of the disclosure and together with the description serve to explain the many aspects of the disclosure. In the drawings.

DETAILED DESCRIPTION

Figure 1:
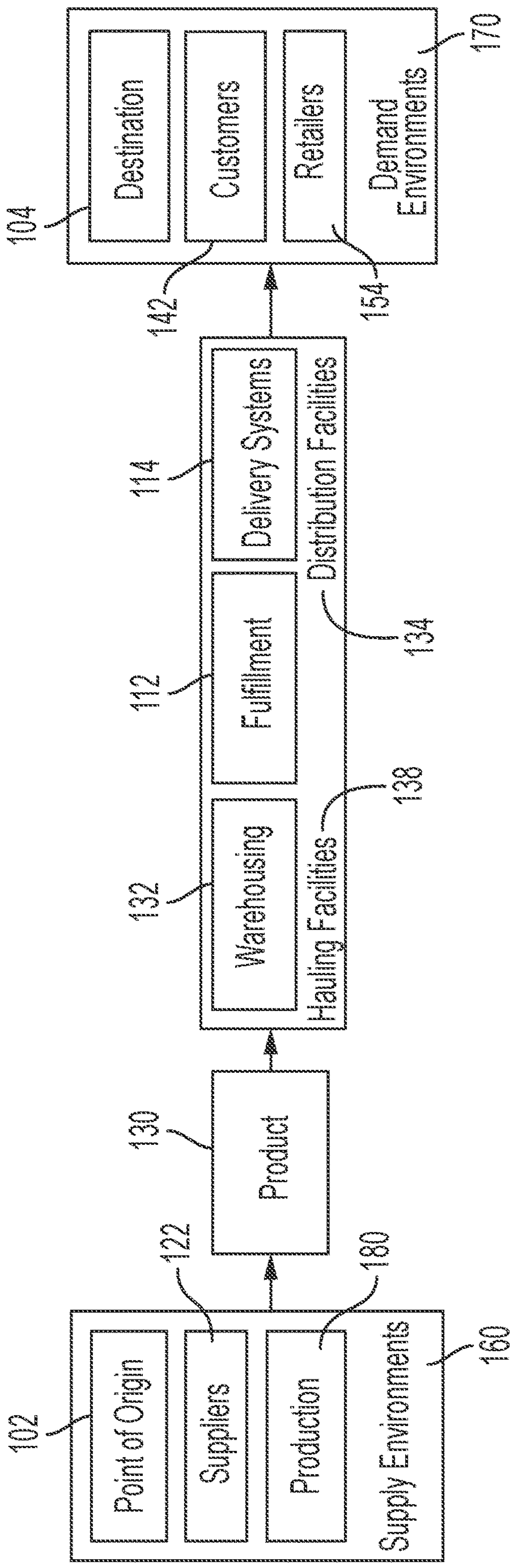
FIG. 1 is a block diagram showing prior art relationships of various entities and facilities in a supply chain.

Over time, companies have increasingly used technology solutions to improve outcomes related to a traditional supply chain like the one depicted in FIG. 1, such as software systems for predicting and managing customer demand, RFID and asset tracking systems for tracking goods as they move through the supply chain, navigation and routing systems to improve the efficiency of route selection, and the like. However, some large trends have placed manufacturers, retailers and other businesses under increasing pressure to improve supply chain performance. First, online and ecommerce operators, in particular Amazon™ have become the largest retail channels for many categories of goods and have introduced distribution and fulfillment centers 112 throughout some geographies like the United States that house hundreds of thousands, and sometimes more, product categories (SKUs), so that customers can receive items the day after they are ordered, and in some cases on the same day (and in some cases delivered to the door by a drone, robot, and/or autonomous vehicle. For retailers that do not have extensive geographic distribution of fulfillment centers or warehouses, customer expectations for speed of delivery place increased pressure on supply chain efficiency and optimization. Accordingly, a need still exists for improved supply chain methods and systems.

Second, agile manufacturing capabilities (such as using 3D printing and robotic assembly techniques, among others), customer profiling technologies, and online ratings and reviews have led to increased customer expectations for customization and personalization of products. Accordingly, in order to compete, manufacturers and retailers need improved methods and systems for understanding, predicting, and satisfying customer demand.

Historically, supply chain management and demand planning and management have been largely separate activities, unified primarily when demand is converted to an order, which is passed to the supply side for fulfillment in a supply chain. As expectations for speed and personalization increase, a need exists for methods and systems that can provide unified orchestration of supply and demand.

In parallel with these other large trends has been the emergence of the Internet of Things, in which some categories of products, particularly smart home products like thermostats, lighting systems, and speakers, are increasingly enabled with onboard network connectivity and processing capability, often including a voice controlled intelligent agent like Alexa™ or Siri™ that allows device control and triggering of certain application features, such as playing music, or even ordering a product. In some cases, smart products 650 even initiate orders, such as printers that order refill cartridges. Intelligent products 650 are in some cases involved in a coordinated system, such as where an Amazon™ Echo™ product controls a television, or where a sensor-enabled thermostat or security camera connects to a mobile device, but most intelligent products are still involved in sets of largely isolated, application-specific interactions. As artificial intelligence capabilities increase, and as more and more computing and networking power is moved to network-enabled edge devices and systems that reside in supply environments 670, in demand environments 672, and in all of the locations, systems, and facilities that populate the path of a product 650 from the loading dock of a manufacturer to the point of destination 612 of a customer 662 or retailers 664, a need and opportunity exists for dramatically improved intelligence, control, and automation of all of the factors involved in demand and supply.

Value Chain Networks

Figure 2:
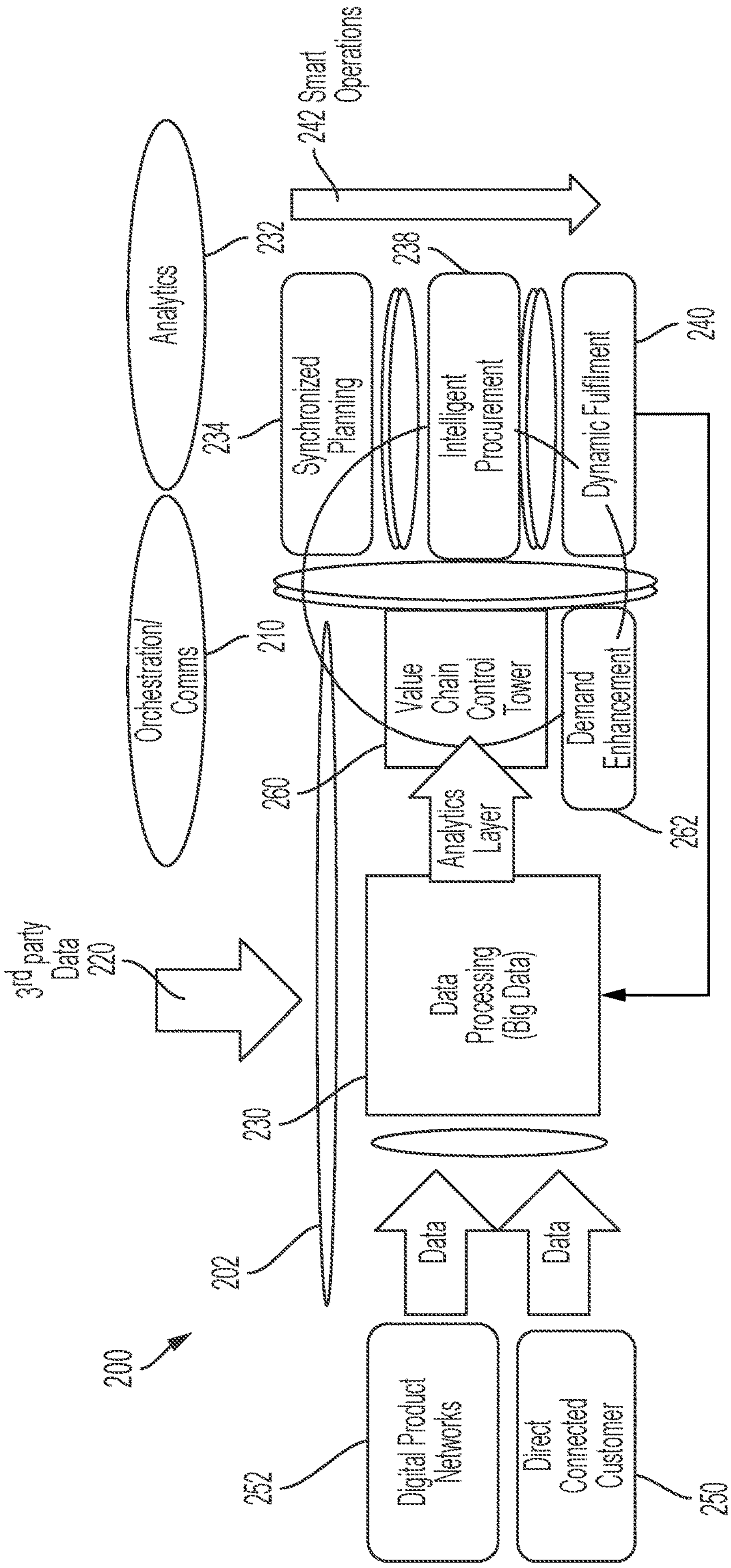
FIG. 2 is a block diagram showing components and interrelationships of systems and processes of a value chain network in accordance with the present disclosure.

Referring to FIG. 2, a block diagram is presented at 200 showing components and interrelationships of systems and processes of a value chain network. In example embodiments, "value chain network," as used herein, refers to elements and interconnections of historically segregated demand management systems and processes and supply chain management systems and processes, enabled by the development and convergence of numerous diverse technologies. In example embodiments a value chain control tower 260 (e.g., referred to herein in some cases as a "value chain network management platform", a "VCNP", or simply as "the system", or "the platform") may be connected to, in communication with, or otherwise operatively coupled with data processing facilities including, but not limited to, big data centers (e.g., big data processing 230) and related processing functionalities that receive data flow, data pools, data streams and/or other data configurations and transmission modalities received from, for example, digital product networks 252, directly from customers (e.g., direct connected customer 250), or some other third party 220. Communications related to market orchestration activities and communications 210, analytics 232, or some other type of input may also be utilized by the value chain control tower for demand enhancement 262, synchronized planning 234, intelligent procurement 238, dynamic fulfillment 240 or some other smart operation informed by coordinated and adaptive intelligence, as described herein.

Figure 3:
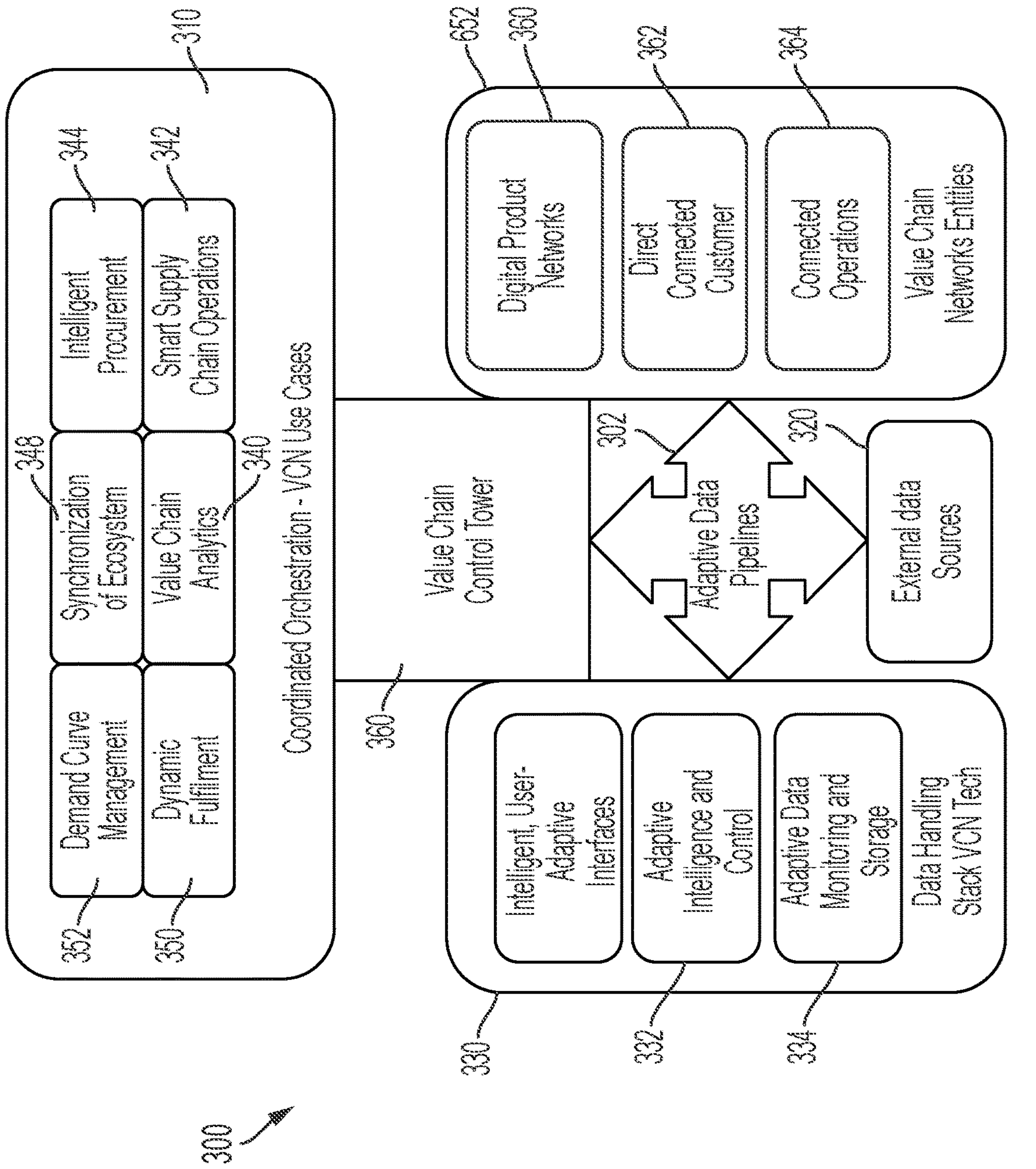
FIG. 3 is another block diagram showing components and interrelationships of systems and processes of a value chain network in accordance with the present disclosure.

Referring to FIG. 3, another block diagram is presented showing components and interrelationships of systems and processes of a value chain network and related uses cases, data handling, and associated entities. In example embodiments, the value chain control tower 360 may coordinate market orchestration activities 310 including, but not limited to, demand curve management 352, synchronization of an ecosystem 348, intelligent procurement 344, dynamic fulfillment 350, value chain analytics 340, and/or smart supply chain operations 342. In example embodiments, the value chain control tower 360 may be connected to, in communication with, or otherwise operatively coupled with adaptive data pipelines 302 and processing facilities that may be further connected to, in communication with, or otherwise operationally coupled with external data sources 320 and a data handling stack 330 (e.g., value chain network technology) that may include intelligent, user-adaptive interfaces, adaptive intelligence and control 332, and/or adaptive data monitoring and storage 334, as described herein. The value chain control tower 302 may also be further connected to, in communication with, or otherwise operatively coupled with additional value chain entities including, but not limited to, digital product networks 360, customers (e.g., directed connected customers 362), and/or other connected operations 364 and entities of a value chain network.

Digital Product Networks ("DPN")

Figure 4:
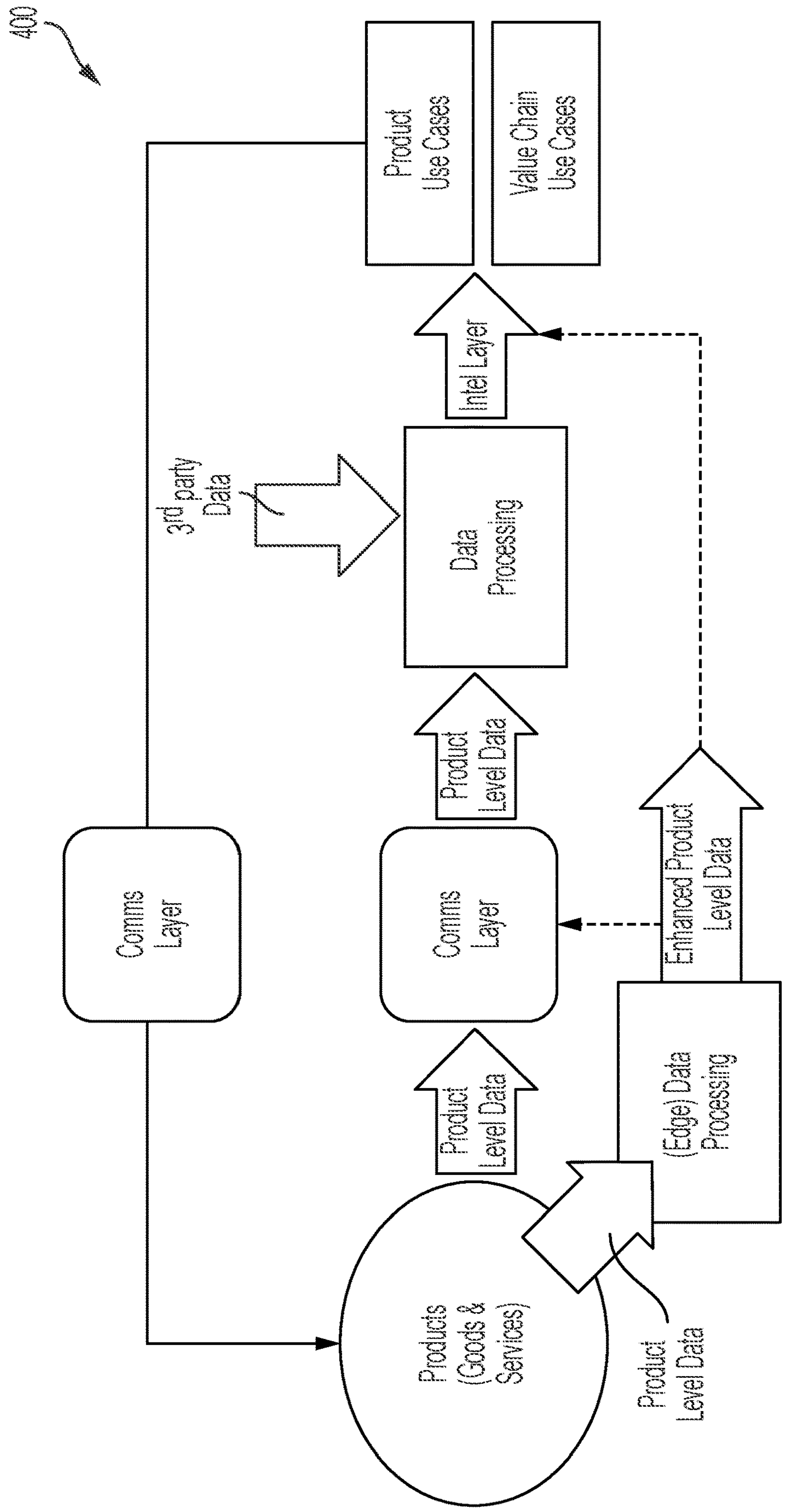
FIG. 4 is a block diagram showing components and interrelationships of systems and processes of a digital products network of FIGS. 2 and 3 in accordance with the present disclosure.

Referring to FIG. 4, a block diagram is presented showing components and interrelationships of systems and processes of the digital products networks at 400. In example embodiments, products (including goods and services) may create and transmit data, such as product level data, to a communication layer within the value chain network technology stack and/or to an edge data processing facility. This data may produce enhanced product level data and may be combined with third party data for further processing, modeling or other adaptive or coordinated intelligence activity, as described herein. This may include, but is not limited to, producing and/or simulating product and value chain use cases, the data for which may be utilized by products, product development processes, product design, and the like.

Stack View Examples

Figure 5:
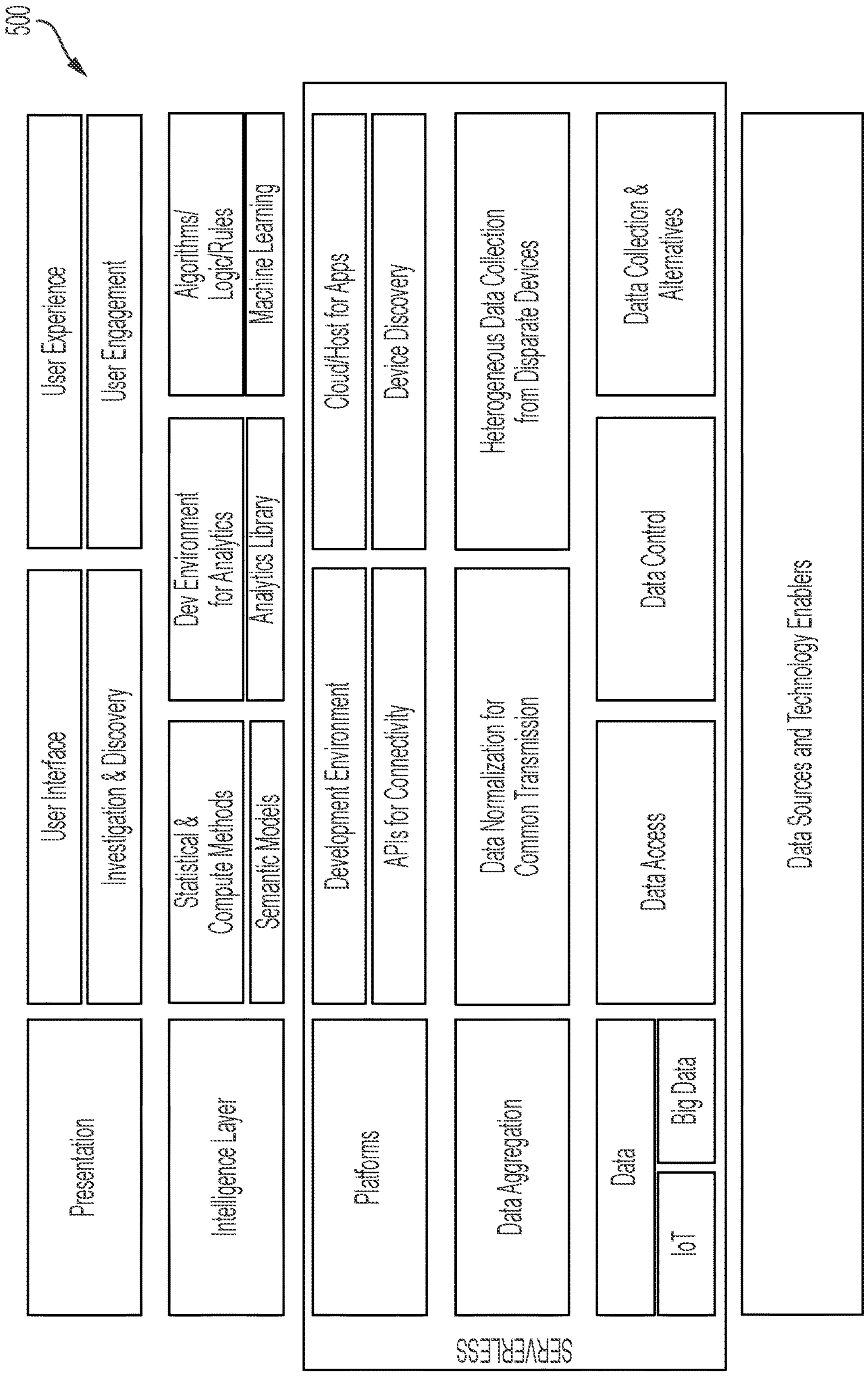
FIG. 5 is a block diagram showing components and interrelationships of systems and processes of a value chain network technology stack in accordance with the present disclosure.

Referring to FIG. 5, a block diagram is presented at 500 showing components and interrelationships of systems and processes of a value chain network technology stack, which may include, but is not limited to a presentation layer, an intelligence layer, and serverless functionalities such as platforms (e.g., development and hosting platforms), data facilities (e.g., relating to data with IoT and Big Data), and data aggregation facilities. In example embodiments, the presentation layer may include, but is not limited to, a user interface, and modules for investigation and discovery and tracking users' experience and engagements. In example embodiments, the intelligence layer may include, but is not limited to, a statistical and computation methods, semantic models, an analytics library, a development environment for analytics, algorithms, logic and rules, and machine learning. In example embodiments, the platforms or the value chain network technology stack may include a development environment, APIs for connectivity, cloud and/or hosting applications, and device discovery. In example embodiments, the data aggregation facilities or layer may include, but is not limited to, modules for data normalization for common transmission and heterogeneous data collection from disparate devices. In example embodiments, the data facilities or layer may include, but is not limited to, IoT and big data access, control, and collection and alternatives. In example embodiments, the value chain network technology stack may be further associated with additional data sources and/or technology enablers.

Value Chain Orchestration from a Command Platform

Figure 6:
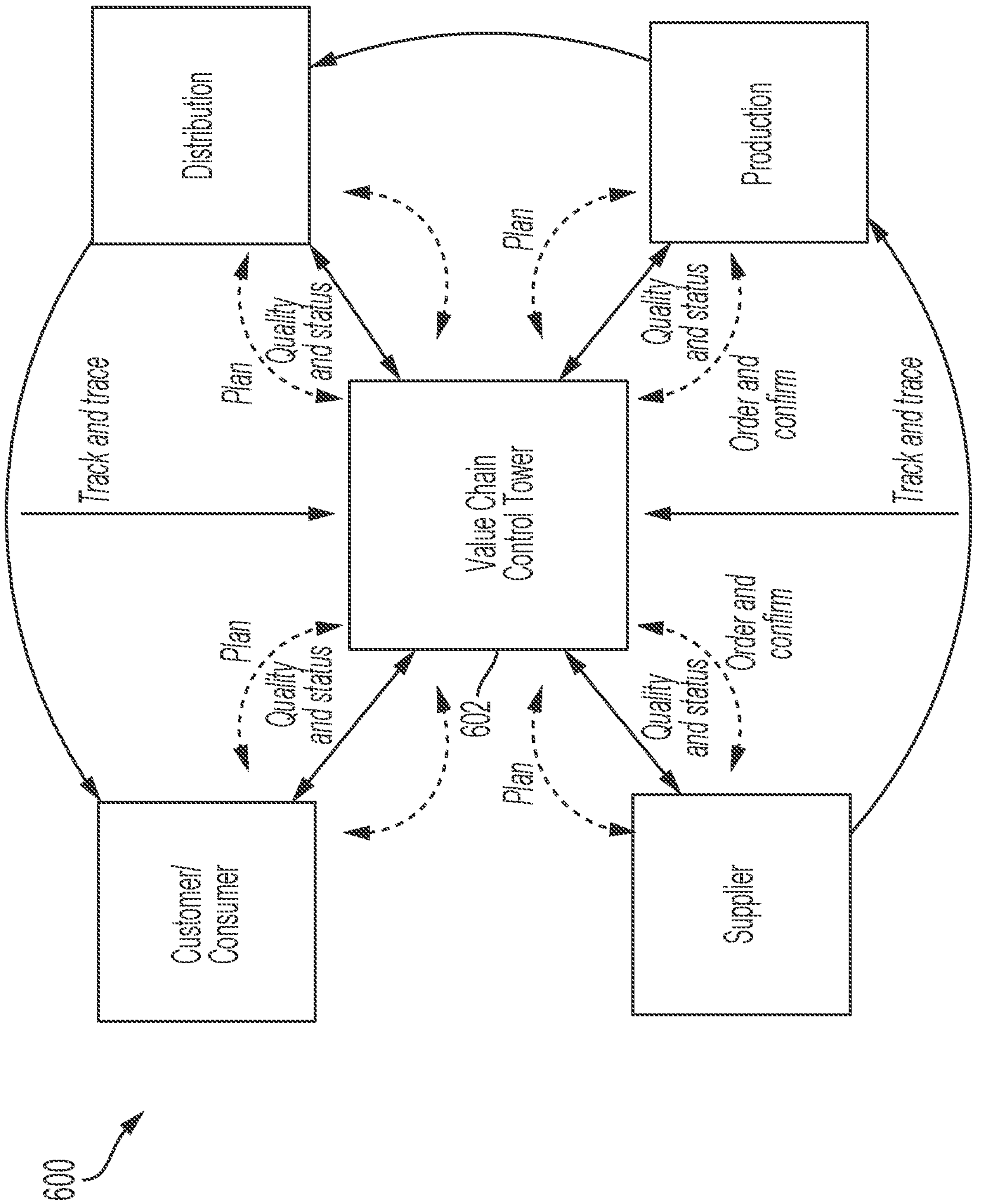
FIG. 6 is a block diagram showing a platform and relationships for orchestrating controls of various entities in a value chain network in accordance with the present disclosure.

FIG. 6 illustrates a connected value chain network 668 in which a value chain network management platform 604 (referred to herein in some cases as a "value chain control tower," the "VCNP," or simply as "the system," or "the platform") orchestrates a variety of factors involved in planning, monitoring, controlling, and optimizing various entities and activities involved in the value chain network 668, such as supply and production factors, demand factors, logistics and distribution factors, and the like. By virtue of a unified platform 604 for monitoring and managing supply factors and demand factors as well as status information (e.g., quality and status, plan, order and confirm, and/or track and trace) can be shared about and between various entities (e.g., including customers/consumers, suppliers, distribution such as distributors, suppliers, and production such as producers or production facilities) as demand factors are understood and accounted for, as orders are generated and fulfilled, and as products are created and moved through a supply chain. The value chain network 668 may include not only an intelligent product 650, but all of the equipment, infrastructure, personnel and other entities involved in planning and satisfying demand for it.

Value Chain Network and Value Chain Network Management Platform

Figure 7:
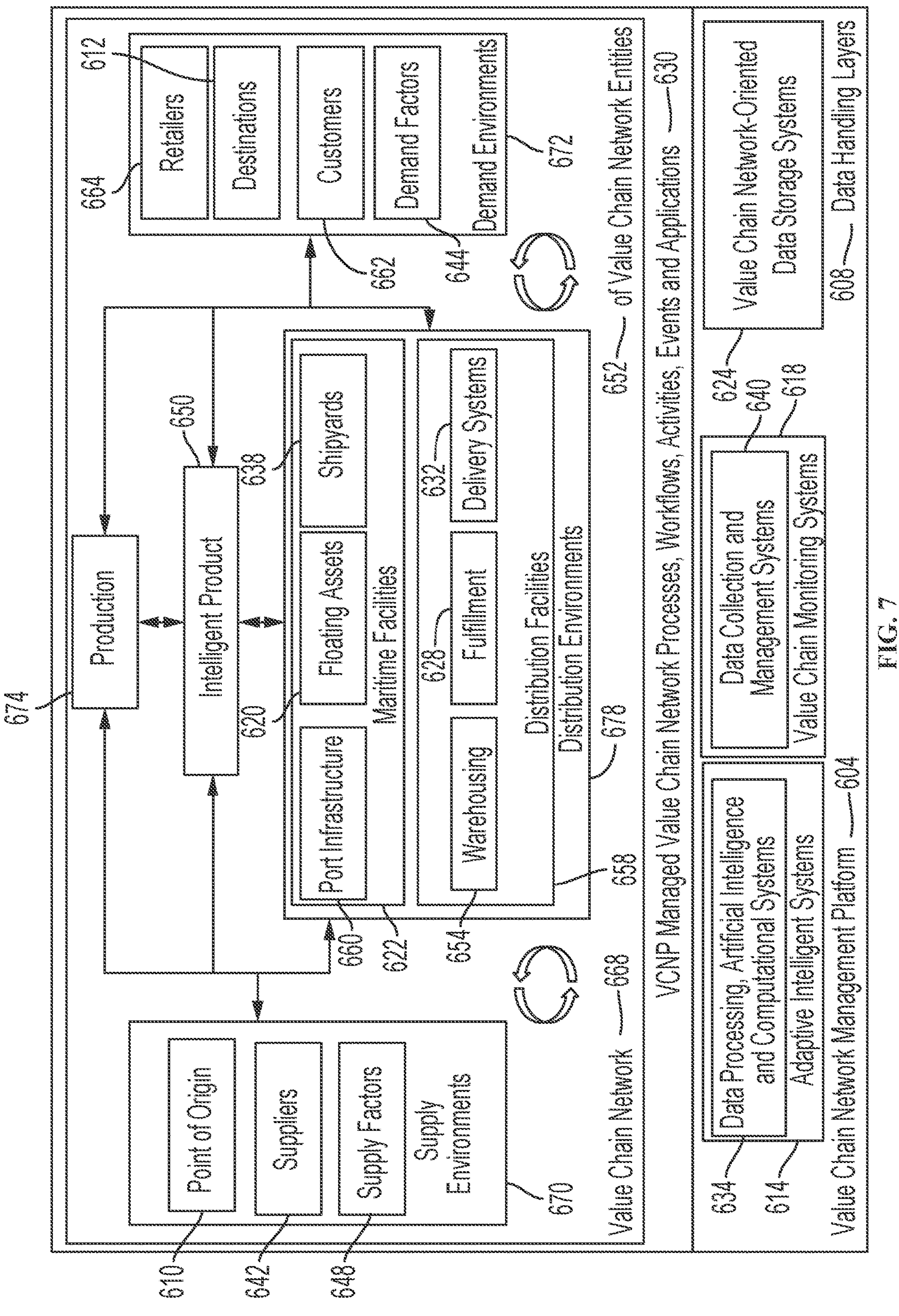
FIG. 7 is a block diagram showing components and relationships in embodiments of a value chain network management platform in accordance with the present disclosure.

Referring to FIG. 7, the value chain network 668 managed by a value chain management platform 604 may include a set of value chain network entities 652, such as, without limitation: a product 650, which may be an intelligent product 650; a set of production facilities 674 involved in producing finished goods, components, systems, sub-systems, materials used in goods, or the like; various entities, activities and other supply factors 648 involved in supply environments 670, such as suppliers 642, points of origin 610, and the like; various entities, activities and other demand factors 644 involved in demand environments 672, such as customers 662 (including consumers, businesses, and intermediate customers such as value added resellers and distributors), retailers 664 (including online retailers, mobile retailers, conventional bricks and mortar retailers, pop-up shops and the like) and the like located and/or operating at various destinations 612; various distribution environments 678 and distribution facilities 658, such as warehousing facilities 654, fulfillment facilities 628, and delivery systems 632, and the like, as well as maritime facilities 622, such as port infrastructure facilities 660, floating assets 620, and shipyards 638, among others. In embodiments, the value chain network management platform 604 monitors, controls, and otherwise enables management (and in some cases autonomous or semi-autonomous behavior) of a wide range of value chain network 668 processes, workflows, activities, events and applications 630 (collectively referred to in some cases simply as "applications 630").

Referring still to FIG. 7, a high-level schematic of the value chain network management platform 604 is illustrated. The value chain network management platform 604 may include a set of systems, applications, processes, modules, services, layers, devices, components, machines, products, sub-systems, interfaces, connections, and other elements working in coordination to enable intelligent management of a set of value chain entities 652 that may occur, operate, transact or the like within, or own, operate, support or enable, one or more value chain network processes, workflows, activities, events and/or applications 630 or that may otherwise be part of, integrated with, linked to, or operated on by the VCNP 604 in connection with a product 650 (which may be any category of product, such as a finished good, software product, hardware product, component product, material, item of equipment, item of consumer packaged goods, consumer product, food product, beverage product, home product, business supply product, consumable product, pharmaceutical product, medical device product, technology product, entertainment product, or any other type of product and/or set of related services, and which may, in embodiments, encompass an intelligent product 650 that is enabled with a set of capabilities such as, without limitation data processing, networking, sensing, autonomous operation, intelligent agent, natural language processing, speech recognition, voice recognition, touch interfaces, remote control, self-organization, self-healing, process automation, computation, artificial intelligence, analog or digital sensors, cameras, sound processing systems, data storage, data integration, and/or various Internet of Things capabilities, among others.

In embodiments, the management platform 604 may include a set of data handling layers 624 each of which is configured to provide a set of capabilities that facilitate development and deployment of intelligence, such as for facilitating automation, machine learning, applications of artificial intelligence, intelligent transactions, state management, event management, process management, and many others, for a wide variety of value chain network applications and end uses. In embodiments, the data handling layers 624 are configured in a topology that facilitates shared data collection and distribution across multiple applications and uses within the platform 604 by a value chain monitoring systems layer 614. The value chain monitoring systems layer 614 may include, integrate with, and/or cooperate with various data collection and management systems 640, referred to for convenience in some cases as data collection systems 640, for collecting and organizing data collected from or about value chain entities 652, as well as data collected from or about the various data layers 624 or services or components thereof. In embodiments, the data handling layers 624 are configured in a topology that facilitates shared or common data storage across multiple applications and uses of the platform 604 by a value chain network-oriented data storage systems layer 624, referred to herein for convenience in some cases simply as a data storage layer 624 or storage layer 624. As shown in FIG. 7, the data handling layers 624 may also include an adaptive intelligent systems layer 614. The adaptive intelligence systems layer 614 may include a set of data processing, artificial intelligence and computational systems 634 that are described in more detail elsewhere throughout this disclosure. The data processing, artificial intelligence and computational systems 634 may relate to artificial intelligence (e.g., expert systems, artificial intelligence, neural, supervised, machine learning, deep learning, model-based systems, and the like). Specifically, the data processing, artificial intelligence and computational systems 634 may relate to various examples, in some embodiments, such as use of a recurrent network as adaptive intelligence system operating on a blockchain of transactions in a supply chain to determine a pattern, use with biological systems, opportunity mining (e.g., where artificial intelligence system may be used to monitor for new data sources as opportunities for automatically deploying intelligence), robotic process automation (e.g., automation of intelligent agents for various workflows), edge and network intelligence (e.g., implicated on monitoring systems such as adaptively using available RF spectrum, adaptively using available fixed network spectrum, adaptively storing data based on available storage conditions, adaptively sensing based on a kind of contextual sensing), and the like.

In embodiments, the data handling layers 624 may be depicted in vertical stacks or ribbons in the figures and may represent many functionalities available to the platform 604 including storage, monitoring, and processing applications and resources and combinations thereof. In embodiments, the set of capabilities of the data handling layers 624 may include a shared microservices architecture. By way of these examples, the set of capabilities may be deployed to provide multiple distinct services or applications, which can be configured as one or more services, workflows, or combinations thereof. In some examples, the set of capabilities may be deployed within or be resident to certain applications or processes. In some examples, the set of capabilities can include one or more activities marshaled for the benefit of the platform. In some examples, the set of capabilities may include one or more events organized for the benefit of the platform. In embodiments, one of the sets of capabilities of the platform may be deployed within at least a portion of a common architecture such as common architecture that supports a common data schema. In embodiments, one of the sets of capabilities of the platform may be deployed within at least a portion of a common architecture that can support a common storage. In embodiments, one of the sets of capabilities of the platform may be deployed within at least a portion of a common architecture that can support common monitoring systems. In embodiments, one or more sets of capabilities of the platform may be deployed within at least a portion of a common architecture that can support one or more common processing frameworks. In embodiments, the set of capabilities of the data handling layers 624 can include examples where the storage functionality supports scalable processing capabilities, scalable monitoring systems, digital twin systems, payments interface systems, and the like. By way of these examples, one or more software development kits can be provided by the platform along with deployment interfaces to facilitate connections and use of the capabilities of the data handling layers 624. In further examples, adaptive intelligence systems may analyze, learn, configure, and reconfigure one or more of the capabilities of the data handling layers 624. In embodiments, the platform 604 may, for example, include a common data storage schema serving a shipyard entity related service and a warehousing entity service. There are many other applicable examples and combinations applicable to the foregoing example including the many value chain entities disclosed herein. By way of these examples, the platform 604 may be shown to create connectivity (e.g., supply of capabilities and information) across many value chain entities. In many examples, there are pairings (doubles, triples, quadruplets, etc.) of similar kinds of value chain entities using one or more smaller sets of capabilities of the data handling layers 624 to deploy (interact with, rely on, etc.) a common data schema, a common architecture, a common interface, and the like. While services and capabilities can be provided to single value chain entities, the platform can be shown to provide myriad benefits to value chains and consumers by supporting connectivity across value chain entities and applications used by the entities.

Value Chain Network Entities Managed by the Platform

Figure 8:
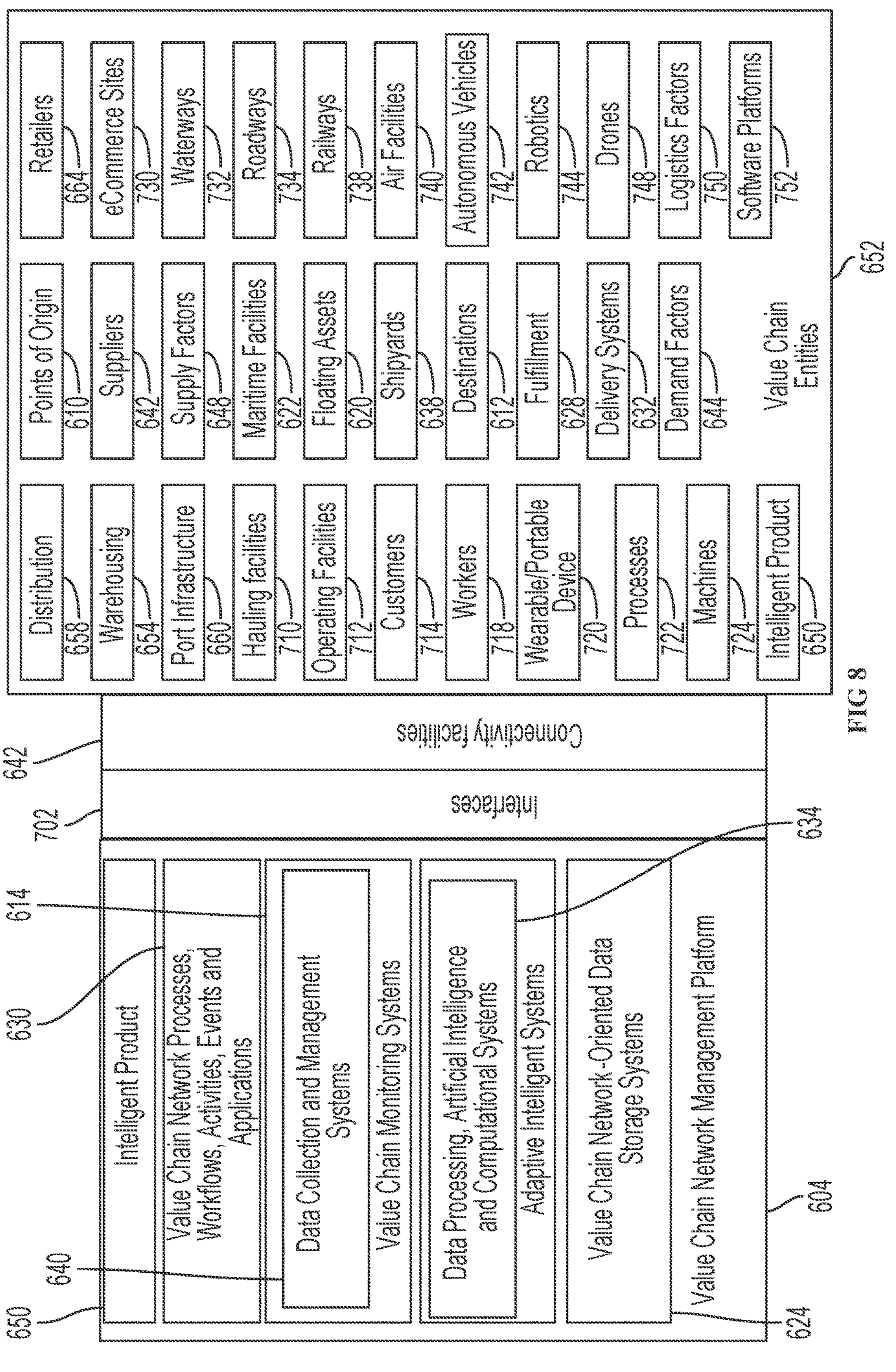
FIG. 8 is a block diagram showing components and relationships of value chain entities managed by embodiments of a value chain network management platform in accordance with the present disclosure.

Referring to FIG. 8, the value chain network management platform 604 is illustrated in connection with a set of value chain entities 652 that may be subject to management by the platform 604, may integrate with or into the platform 604, and/or may supply inputs to and/or take outputs from the platform 604, such as ones involved in or for a wide range of value chain activities (such as supply chain activities, logistics activities, demand management and planning activities, delivery activities, shipping activities, warehousing activities, distribution and fulfillment activities, inventory aggregation, storage and management activities, marketing activities, and many others, as involved in various value chain network processes, workflows, activities, events and applications 630 (collectively "applications 630" or simply "activities")). Connections with the value chain entities 652 may be facilitated by a set of connectivity facilities 642 and interfaces 702, including a wide range of components and systems described throughout this disclosure and in greater detail below. This may include connectivity and interface capabilities for individual services of the platform, for the data handling layers, for the platform as a whole, and/or among value chain entities 652, among others.

These value chain entities 652 may include any of the wide variety of assets, systems, devices, machines, components, equipment, facilities, individuals or other entities mentioned throughout this disclosure or in the documents incorporated herein by reference, such as, without limitation: machines 724 and their components (e.g., delivery vehicles, forklifts, conveyors, loading machines, cranes, lifts, haulers, trucks, loading machines, unloading machines, packing machines, picking machines, and many others, including robotic systems, e.g., physical robots, collaborative robots (e.g., "cobots"), drones, autonomous vehicles, software bots and many others); products 650 (which may be any category of products, such as a finished goods, software products, hardware products, component products, material, items of equipment, items of consumer packaged goods, consumer products, food products, beverage products, home products, business supply products, consumable products, pharmaceutical products, medical device products, technology products, entertainment products, or any other type of products and/or set of related services); value chain processes 722 (such as shipping processes, hauling processes, maritime processes, inspection processes, hauling processes, loading/unloading processes, packing/unpacking processes, configuration processes, assembly processes, installation processes, quality control processes, environmental control processes (e.g., temperature control, humidity control, pressure control, vibration control, and others), border control processes, port-related processes, software processes (including applications, programs, services, and others), packing and loading processes, financial processes (e.g., insurance processes, reporting processes, transactional processes, and many others), testing and diagnostic processes, security processes, safety processes, reporting processes, asset tracking processes, and many others); wearable and portable devices 720 (such as mobile phones, tablets, dedicated portable devices for value chain applications and processes, data collectors (including mobile data collectors), sensor-based devices, watches, glasses, hearables, head-worn devices, clothing-integrated devices, arm bands, bracelets, neck-worn devices, AR/VR devices, headphones, and many others); workers 718 (such as delivery workers, shipping workers, barge workers, port workers, dock workers, train workers, ship workers, distribution of fulfillment center workers, warehouse workers, vehicle drivers, business managers, engineers, floor managers, demand managers, marketing managers, inventory managers, supply chain managers, cargo handling workers, inspectors, delivery personnel, environmental control managers, financial asset managers, process supervisors and workers (for any of the processes mentioned herein), security personnel, safety personnel and many others); suppliers 642 (such as suppliers of goods and related services of all types, component suppliers, ingredient suppliers, materials suppliers, manufacturers, and many others); customers 662 (including consumers, licensees, businesses, enterprises, value added and other resellers, retailers, end users, distributors, and others who may purchase, license, or otherwise use a category of goods and/or related services); a wide range of operating facilities 712 (such as loading and unloading docks, storage and warehousing facilities 654, vaults, distribution facilities 658 and fulfillment centers 628, air travel facilities 740 (including aircraft, airports, hangars, runways, refueling depots, and the like), maritime facilities 622 (such as port infrastructure facilities 622 (such as docks, yards, cranes, roll-on/roll-off facilities, ramps, containers, container handling systems, waterways 732, locks, and many others), shipyard facilities 638, floating assets 620 (such as ships, barges, boats and others), facilities and other items at points of origin 610 and/or points of destination 628, hauling facilities 710 (such as container ships, barges, and other floating assets 620, as well as land-based vehicles and other delivery systems 632 used for conveying goods, such as trucks, trains, and the like); items or elements factoring in demand (i.e., demand factors 644) (including market factors, events, and many others); items or elements factoring in supply (i.e., supply factors 648)(including market factors, weather, availability of components and materials, and many others); logistics factors 750 (such as availability of travel routes, weather, fuel prices, regulatory factors, availability of space (such as on a vehicle, in a container, in a package, in a warehouse, in a fulfillment center, on a shelf, or the like), and many others); retailers 664 (including online retailers 730 and others such as in the form of eCommerce sites 730); pathways for conveyance (such as waterways 732, roadways 734, air travel routes, railways 738 and the like); robotic systems 744 (including mobile robots, cobots, robotic systems for assisting human workers, robotic delivery systems, and others); drones 748 (including for package delivery, site mapping, monitoring or inspection, and the like); autonomous vehicles 742 (such as for package delivery); software platforms 752 (such as enterprise resource planning platforms, customer relationship management platforms, sales and marketing platforms, asset management platforms, Internet of Things platforms, supply chain management platforms, platform as a service platforms, infrastructure as a service platforms, software-based data storage platforms, analytic platforms, artificial intelligence platforms, and others); and many others. In some example embodiments, the product 650 may be encompassed as an intelligent product 650 or the VCNP 604 may include the intelligent product 650. The intelligent product 650 may be enabled with a set of capabilities such as, without limitation data processing, networking, sensing, autonomous operation, intelligent agent, natural language processing, speech recognition, voice recognition, touch interfaces, remote control, self-organization, self-healing, process automation, computation, artificial intelligence, analog or digital sensors, cameras, sound processing systems, data storage, data integration, and/or various Internet of Things capabilities, among others. The intelligent product 650 may include a form of information technology. The intelligent product 650 may have a processor, computer random access memory, and a communication module. The intelligent product 650 may be a passive intelligent product that is similar to a RFID type of data structure where the intelligent product may be pinged or read. The product 650 may be considered a value chain network entity (e.g., under control of platform) and may be rendered intelligent by surrounding infrastructure and adding an RFID such that data may be read from the intelligent product 650. The intelligent product 650 may fit in a value chain network in a connected way such that connectivity was built around the intelligent product 650 through a sensor, an IoT device, a tag, or another component.

In embodiments, the monitoring systems layer 614 may monitor any or all of the value chain entities 652 in a value chain network 668, may exchange data with the value chain entities 652, may provide control instructions to or take instructions from any of the value chain entities 652, or the like, such as through the various capabilities of the data handling layers 624 described throughout this disclosure.

Network Characteristics of the Value Chain Network Entities

Figure 9:
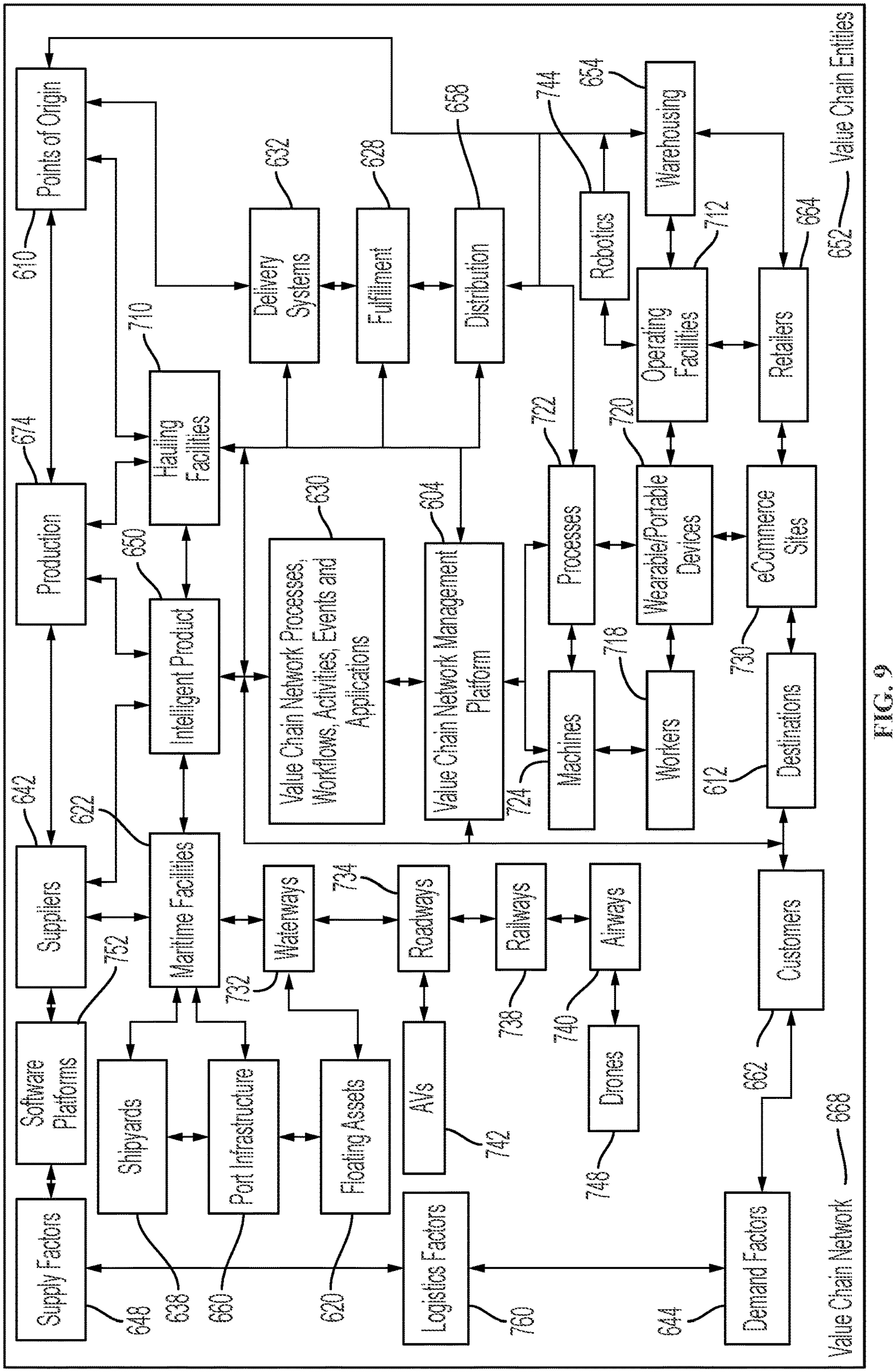
FIG. 9 is a block diagram showing network relationships of entities in a value chain network in accordance with the present disclosure.

Referring to FIG. 9, orchestration of a set of deeply interconnected value chain network entities 652 in a value chain network 668 by the value chain network management platform 604 is illustrated. Each of the value chain network entities 652 may have a connection to the VCNP 604, to a set of other value chain network entities 652 (which may be a local network connection, a peer-to-peer connection, a mobile network connection, a connection via a cloud, or other connection), and/or through the VCNP 604 to other value chain network entities 652. The value chain network management platform 604 may manage the connections, configure or provision resources to enable connectivity, and/or manage applications 630 that take advantage of the connections, such as by using information from one set of entities 652 to inform applications 630 involving another set of entities 652, by coordinating activities of a set of entities 652, by providing input to an artificial intelligence system of the VCNP 604 or of or about a set of entities 652, by interacting with edge computation systems deployed on or in entities 652 and their environments, and the like.

The entities 652 may be external such that the VCNP 604 may interact with these entities 652. When the VCNP 604 functions as the control tower to establish monitoring (e.g., establish monitoring such as common monitoring across several entities 652). In one unified platform, there may be an interface where a user may view various items such as user's destinations, ports, air and rail assets, as well as orders, etc. Then, the next step may be to establish a common data schema that enables services that work on or in any one of these applications. This may involve taking any of the data that is flowing through or about any of these entities 652 and pull the data into a framework where other applications across supply and demand may interact with the entities 652. This may be a shared data pipeline coming from an IoT system and other external data sources, feeding into the monitoring layer, being stored in a common data schema in the storage layer, and then various intelligence may be trained to identify implications across these entities 652. In an example embodiment, a supplier may be bankrupt, or a determination is made that the supplier is bankrupt, and then the VCNP 604 may automatically trigger a substitute smart contract to be sent to a secondary supplier with altered terms. There may be management of different aspects of the supply chain. For example, changing pricing instantly and automatically on the demand side in response to one more supplier's being identified as bankrupt (e.g., from bankruptcy announcement). Other similar examples may be used based on what occurs in that automation layer which may be enabled by the VCNP 604. Then, at the interface layer of this VCNP 604, a digital twin may be used by user to view all these entities 652 that are not typically shown together and monitor what is going on with each of these entities 652 including identification of problem states. For example, after viewing three quarters of bad financial reports on a supplier, a report may be flagged to watch it closely for potential future bankruptcy, etc.

For example, an IoT system deployed in a fulfillment center 628 may coordinate with an intelligent product 650 that takes customer feedback about the product 650, and an application 630 for the fulfillment center 628 may, upon receiving customer feedback via a connection path to the intelligent product 650 about a problem with the product 650, initiate a workflow to perform corrective actions on similar products 650 before the products 650 are sent out from the fulfillment center 628. Similarly, a port infrastructure facility 660, such as a yard for holding shipping containers, may inform a fleet of floating assets 620 via connections to the floating assets 620 (such as ships, barges, or the like) that the port is near capacity, thereby kicking off a negotiation process (which may include an automated negotiation based on a set of rules and governed by a smart contract) for the remaining capacity and enabling some assets 620 to be redirected to alternative ports or holding facilities. These and many other connections among value chain network entities 652, whether one-to-one connections, one-to-many connections, many-to-many connections, or connections among defined groups of entities 652 (such as ones controlled by the same owner or operator), are encompassed herein as applications 630 managed by the VCNP 604.

Value Chain Network Activities and Applications Managed by the Platform

Figure 10:
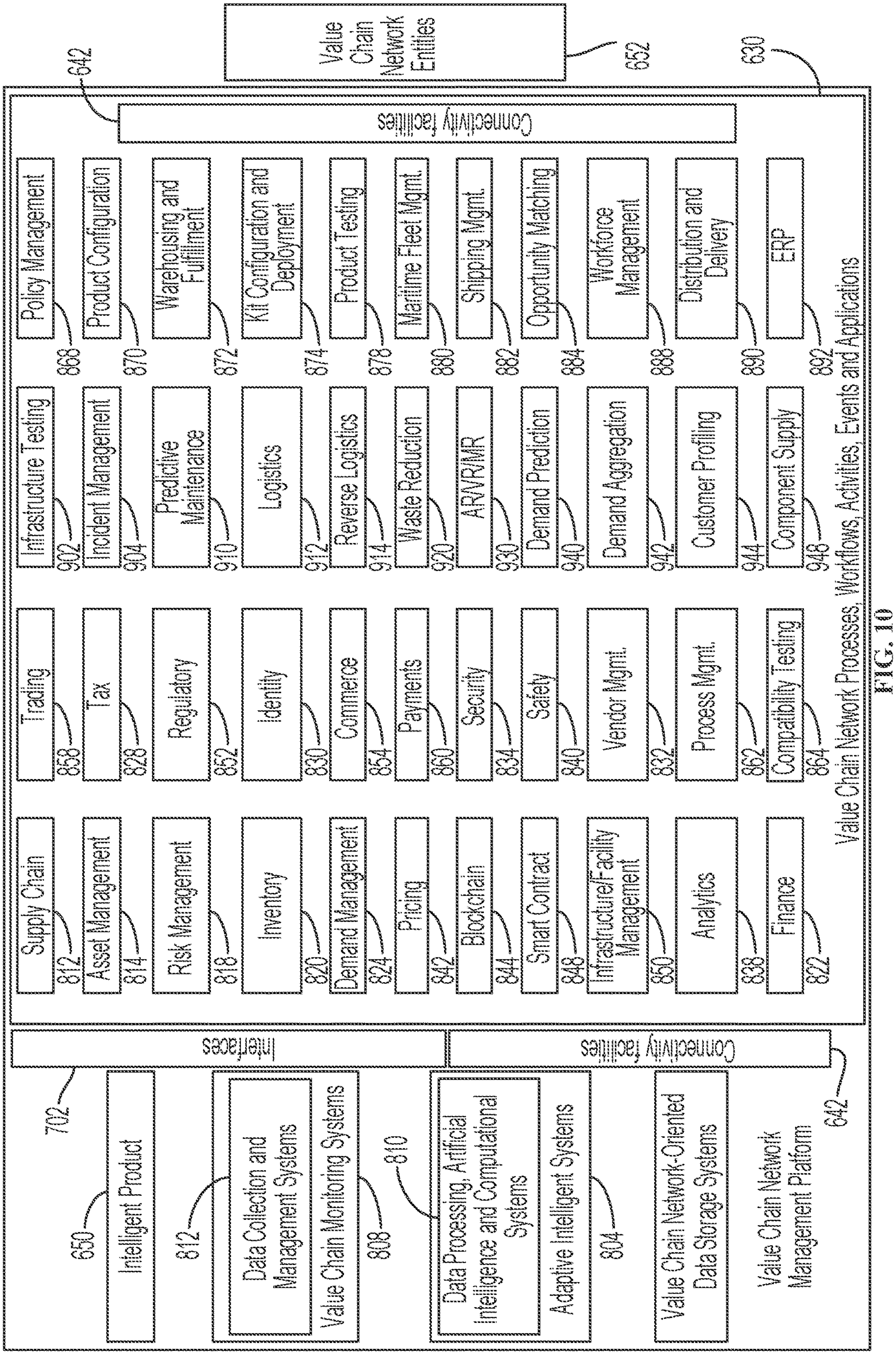
FIG. 10 is a block diagram showing a set of applications supported by unified data handling layers in a value chain network management platform in accordance with the present disclosure.

Referring to FIG. 10, the set of applications 630 provided on the VCNP 604, integrated with the VCNP 604 and/or managed by or for the VCNP 604 and/or involving a set of value chain network entities 652 may include, without limitation, one or more of any of a wide range of types of applications, such as: a supply chain management application 812 (such as, without limitation, for management of timing, quantities, logistics, shipping, delivery, and other details of orders for goods, components, and other items); an asset management application 814 (such as, without limitation, for managing value chain assets, such as floating assets (such as ships, boats, barges, and floating platforms), real property (such as used for location of warehouses, ports, shipyards, distribution centers and other buildings), equipment, machines and fixtures (such as used for handling containers, cargo, packages, goods, and other items), vehicles (such as forklifts, delivery trucks, autonomous vehicles, and other systems used to move items), human resources (such as workers), software, information technology resources, data processing resources, data storage resources, power generation and/or storage resources, computational resources and other assets); a finance application 822 (such as, without limitation, for handling finance matters relating to value chain entities and assets, such as involving payments, security, collateral, bonds, customs, duties, imposts, taxes and others); a risk management application 818 (such as, without limitation, for managing risk or liability with respect to a shipment, goods, a product, an asset, a person, a floating asset, a vehicle, an item of equipment, a component, an information technology system, a security system, a security event, a cybersecurity system, an item of property, a health condition, mortality, fire, flood, weather, disability, negligence, business interruption, injury, damage to property, damage to a business, breach of a contract, and others); a demand management application 824 (such as, without limitation, an application for analyzing, planning, or promoting interest by customers of a category of goods that can be supplied by or with facilities of a value chain product or service, such as a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service, and others, including ones that use or are enabled by one or more features of an intelligent product 650 or that are executed using intelligence capabilities on an intelligent product 650); a trading application 858 (such as, without limitation, a buying application, a selling application, a bidding application, an auction application, a reverse auction application, a bid/ask matching application, an analytic application for analyzing value chain performance, yield, return on investment, or other metrics, or others); a tax application 850 (such as, without limitation, for managing, calculating, reporting, optimizing, or otherwise handling data, events, workflows, or other factors relating to a tax, a tariff, an impost, a levy, a tariff, a duty, a credit, a fee or other government-imposed charge, such as, without limitation, customs duties, value added tax, sales tax, income tax, property tax, municipal fees, pollution tax, renewal energy credit, pollution abatement credit, import duties, export duties, and others); an identity management application 830 (such as for managing one or more identities of entities 652 involved in a value chain, such as, without limitation, one or more of an identity verification application, a biometric identify validation application, a pattern-based identity verification application, a location-based identity verification application, a user behavior-based application, a fraud detection application, a network address-based fraud detection application, a black list application, a white list application, a content inspection-based fraud detection application, or other fraud detection application; an inventory management application 820 (such as, without limitation, for managing inventory in a fulfillment center, distribution center, warehouse, storage facility, store, port, ship or other floating asset, or other location); a security application, solution or service 834 (referred to herein as a security application, such as, without limitation, any of the identity management applications 830 noted above, as well as a physical security system (such as for an access control system (such as using biometric access controls, fingerprinting, retinal scanning, passwords, and other access controls), a safe, a vault, a cage, a safe room, a secure storage facility, or the like), a monitoring system (such as using cameras, motion sensors, infrared sensors and other sensors), a perimeter security system, a floating security system for a floating asset, a cyber security system (such as for virus detection and remediation, intrusion detection and remediation, spam detection and remediation, phishing detection and remediation, social engineering detection and remediation, cyber-attack detection and remediation, packet inspection, traffic inspection, DNS attack remediation and detection, and others) or other security application); a safety application 840 (such as, without limitation, for improving safety of workers, for reducing the likelihood of damage to property, for reducing accident risk, for reducing the likelihood of damage to goods (such as cargo), for risk management with respected to insured items, collateral for loans, or the like, including any application for detecting, characterizing or predicting the likelihood and/or scope of an accident or other damaging event, including safety management based on any of the data sources, events or entities noted throughout this disclosure or the documents incorporated herein by reference); a blockchain application 844 (such as, without limitation, a distributed ledger capturing a series of transactions, such as debits or credits, purchases or sales, exchanges of in kind consideration, smart contract events, or the like, or other blockchain-based application); a facility management application 850 (such as, without limitation, for managing infrastructure, buildings, systems, real property, personal property, and other property involved in supporting a value chain, such as a shipyard, a port, a distribution center, a warehouse, a dock, a store, a fulfillment center, a storage facility, or others, as well as for design, management or control of systems and facilities in or around a property, such as an information technology system, a robotic/autonomous vehicle system, a packaging system, a packing system, a picking system, an inventory tracking system, an inspection system, a routing system for mobile robots, a workflow system for human assets, or the like); a regulatory application 852 (such as, without limitation, an application for regulating any of the applications, services, transactions, activities, workflows, events, entities, or other items noted herein and in the documents incorporated by reference herein, such as regulation of permitted routes, permitted cargo and goods, permitted parties to transactions, required disclosures, privacy, pricing, marketing, offering of goods and services, use of data (including data privacy regulations, regulations relating to storage of data and others), banking, marketing, sales, financial planning, and many others); a commerce application, solution or service 854 (such as, without limitation an e-commerce site marketplace, an online site, an auction site or marketplace, a physical goods marketplace, an advertising marketplace, a reverse-auction marketplace, an advertising network, or other marketplace); a vendor management application 832 (such as, without limitation, an application for managing a set of vendors or prospective vendors and/or for managing procurement of a set of goods, components or materials that may be supplied in a value chain, such as involving features such as vendor qualification, vendor rating, requests for proposal, requests for information, bonds or other assurances of performance, contract management, and others); an analytics application 838 (such as, without limitation, an analytic application with respect to any of the data types, applications, events, workflows, or entities mentioned throughout this disclosure or the documents incorporated by reference herein, such as a big data application, a user behavior application, a prediction application, a classification application, a dashboard, a pattern recognition application, an econometric application, a financial yield application, a return on investment application, a scenario planning application, a decision support application, a demand prediction application, a demand planning application, a route planning application, a weather prediction application, and many others); a pricing application 842 (such as, without limitation, for pricing of goods, services (including any mentioned throughout this disclosure and the documents incorporated by reference herein; and a smart contract application, solution, or service (referred to collectively herein as a smart contract application 848, such as, without limitation, any of the smart contract types referred to in this disclosure or in the documents incorporated herein by reference, such as a smart contract for sale of goods, a smart contract for an order for goods, a smart contract for a shipping resource, a smart contract for a worker, a smart contract for delivery of goods, a smart contract for installation of goods, a smart contract using a token or cryptocurrency for consideration, a smart contract that vests a right, an option, a future, or an interest based on a future condition, a smart contract for a security, commodity, future, option, derivative, or the like, a smart contract for current or future resources, a smart contract that is configured to account for or accommodate a tax, regulatory or compliance parameter, a smart contract that is configured to execute an arbitrage transaction, or many others). Thus, the value chain management platform 604 may host an enable interaction among a wide range of disparate applications 630 (such term including the above-referenced and other value chain applications, services, solutions, and the like), such that by virtue of shared microservices, shared data infrastructure, and shared intelligence, any pair or larger combination or permutation of such services may be improved relative to an isolated application of the same type.

Referring still to FIG. 10, the set of applications 630 provided on the VCNP 604, integrated with the VCNP 604 and/or managed by or for the VCNP 604 and/or involving a set of value chain network entities 652 may further include, without limitation: a payments application 860 (such as for calculating payments (including based on situational factors such as applicable taxes, duties and the like for the geography of an entity 652), transferring funds, resolving payments to parties, and the like, for any of the applications 630 noted herein); a process management application 862 (such as for managing any of the processes or workflows described throughout this disclosure, including supply processes, demand processes, logistics processes, delivery processes, fulfillment processes, distribution processes, ordering processes, navigation processes, and many others); a compatibility testing application 864, such as for assessing compatibility among value chain network entities 652 or activities involved in any of the processes, workflows, activities, or other applications 630 described herein (such as for determining compatibility of a container or package with a product 650, the compatibility of a product 650 with a set of customer requirements, the compatibility of a product 650 with another product 650 (such as where one is a refill, resupply, replacement part, or the like for the other), the compatibility of a infrastructure and equipment entities 652 (such as between a container ship or barge and a port or waterway, between a container and a storage facility, between a truck and a roadway, between a drone or robot and a package, between a drone, AV or robot and a delivery destination, and many others); an infrastructure testing application 802 (such as for testing the capabilities of infrastructure elements to support a product 650 or an application 630 (such as, without limitation, storage capabilities, lifting capabilities, moving capabilities, storage capacity, network capabilities, environmental control capabilities, software capabilities, security capabilities, and many others)); and/or an incident management application 910 (such as for managing events, accidents, and other incidents that may occur in one or more environments involving value chain network entities 652, such as, without limitation, vehicle accidents, worker injuries, shutdown incidents, property damage incidents, product damage incidents, product liability incidents, regulatory non-compliance incidents, health and/or safety incidents, traffic congestion and/or delay incidents (including network traffic, data traffic, vehicle traffic, maritime traffic, human worker traffic, and others, as well as combinations among them), product failure incidents, system failure incidents, system performance incidents, fraud incidents, misuse incidents, unauthorized use incidents, and many others).

Referring still to FIG. 10, the set of applications 630 provided on the VCNP 604, integrated with the VCNP 604 and/or managed by or for the VCNP 604 and/or involving a set of value chain network entities 652 may further include, without limitation: a predictive maintenance application 910 (such as for anticipating, predicting, and undertaking actions to manage faults, failures, shutdowns, damage, required maintenance, required repairs, required service, required support, or the like for a set of value chain network entities 652, such as products 650, equipment, infrastructure, buildings, vehicles, and others); a logistics application 912 (such as for managing logistics for pickups, deliveries, transfer of goods onto hauling facilities, loading, unloading, packing, picking, shipping, driving, and other activities involving in the scheduling and management of the movement of products 650 and other items between points of origin and points of destination through various intermediate locations; a reverse logistic application 914 (such as for handling logistics for returned products 650, waste products, damaged goods, or other items that can be transferred on a return logistics path); a waste reduction application 920 (such as for reducing packaging waste, solid waste, waste of energy, liquid waste, pollution, contaminants, waste of computing resources, waste of human resources, or other waste involving a value chain network entity 652 or activity); an augmented reality, mixed reality and/or virtual reality application 930 (such as for visualizing one or more value chain network entities 652 or activities involved in one or more of the applications 630, such as, without limitation, movement of a product 650, the interior of a facility, the status or condition of an item of goods, one or more environmental conditions, a weather condition, a packing configuration for a container or a set of containers, or many others); a demand prediction application 940 (such as for predicting demand for a product 650, a category of products, a potential product, and/or a factor involved in demand, such as a market factor, a wealth factor, a demographic factor, a weather factor, an economic factor, or the like); a demand aggregation application 942 (such as for aggregating information, orders and/or commitments (optionally embodied in one or more contracts, which may be smart contracts) for one or more products 650, categories, or the like, including current demand for existing products and future demand for products that are not yet available); a customer profiling application 944 (such as for profiling one or more demographic, psychographic, behavioral, economic, geographic, or other attributes of a set of customers, including based on historical purchasing data, loyalty program data, behavioral tracking data (including data captured in interactions by a customer with a smart product 650), online clickstream data, interactions with intelligent agents, and other data sources); and/or a component supply application 948 (such as for managing a supply chain of components for a set of products 650).

Referring still to FIG. 10, the set of applications 630 provided on the VCNP 604, integrated with the VCNP 604 and/or managed by or for the VCNP 604 and/or involving a set of value chain network entities 652 may further include, without limitation: a policy management application 868 (such as for deploying one or more policies, rules, or the like for governance of one or more value chain network entities 652 or applications 630, such as to govern execution of one or more workflows (which may involve configuring polices in the platform 604 on a per-workflow basis), to govern compliance with regulations (including maritime, food & drug, medical, environmental, health, safety, tax, financial reporting, commercial, and other regulations as described throughout this disclosure or as would be understood in the art), to govern provisioning of resources (such as connectivity, computing, human, energy, and other resources), to govern compliance with corporate policies, to govern compliance with contracts (including smart contracts, wherein the platform 604 may automatically deploy governance features to relevant entities 652 and applications 630, such as via connectivity facilities 642), to govern interactions with other entities (such as involving policies for sharing of information and access to resources), to govern data access (including privacy data, operational data, status data, and many other data types), to govern security access to infrastructure, products, equipment, locations, or the like, and many others; a product configuration application 870 (such as for allowing a product manager and/or automated product configuration process (optionally using robotic process automation) to determine a configuration for a product 650, including configuration on-the-fly, such as during agile manufacturing, or involving configuration or customization in route (such as by 3D printing one or more features or elements), or involving configuration or customization remotely, such as by downloading firmware, configuring field programmable gate arrays, installing software, or the like; a warehousing and fulfillment application 872 (such as for managing a warehouse, distribution center, fulfillment center, or the like, such as involving selection of products, configuring storage locations for products, determining routes by which personnel, mobile robots, and the like move products around a facility, determining picking and packing schedules, routes and workflows, managing operations of robots, drones, conveyors, and other facilities, determining schedules for moving products out to loading docks or the like, and many other functions); a kit configuration and deployment application 874 (such as for enabling a user of the VCNP to configure a kit, box, or otherwise pre-integrated, pre-provisioned, and/or pre-configured system to allow a customer or worker to rapidly deploy a subset of capabilities of the VCNP 604 for a specific value chain network entity 652 and/or application 630); and/or a product testing application 878 for testing a product 650 (including testing for performance, activation of capabilities and features, safety, compliance with policy or regulations, quality, quality of service, likelihood of failure, and many other factors).

Referring still to FIG. 10, the set of applications 630 provided on the VCNP 604, integrated with the VCNP 604 and/or managed by or for the VCNP 604 and/or involving a set of value chain network entities 652 may further include, without limitation a maritime fleet management application 880 (for managing a set of maritime assets, such as container ships, barges, boats, and the like, as well as related infrastructure facilities such as docks, cranes, ports, and others, such as to determine optimal routes for fleet assets based on weather, market, traffic, and other conditions, to ensure compliance with policies and regulations, to ensure safety, to improve environmental factors, to improve financial metrics, and many others); a shipping management application 882 (such as for managing a set of shipping assets, such as trucks, trains, airplanes, and the like, such as to optimize financial yield, to improve safety, to reduce energy consumption, to reduce delays, to mitigate environmental impact, and for many other purposes); an opportunity matching application 884 (such as for matching one or more demand factors with one or more supply factors, for matching needs and capabilities of value chain network entities 652, for identifying reverse logistics opportunities, for identifying opportunities for inputs to enrich analytics, artificial intelligence and/or automation, for identifying cost-saving opportunities, for identifying profit and/or arbitrage opportunities, and many others); a workforce management application 888 (such as for managing workers in various work forces, including work forces in, on or for fulfillment centers, ships, ports, warehouses, distribution centers, enterprise management locations, retail stores, online/ecommerce site management facilities, ports, ships, boats, barges, trains, depots, and other facilities mentioned throughout this disclosure); a distribution and delivery application 890 (such as for planning, scheduling, routing, and otherwise managing distribution and delivery of products 650 and other items); and/or an enterprise resource planning (ERP) application 892 (such as for planning utilization of enterprise resources, including workforce resources, financial resources, energy resources, physical assets, digital assets, and other resources).

Core Capabilities and Interactions of the Data Handling Layers (Adaptive Intelligence, Monitoring, Data Storage and Applications)

Figure 11:
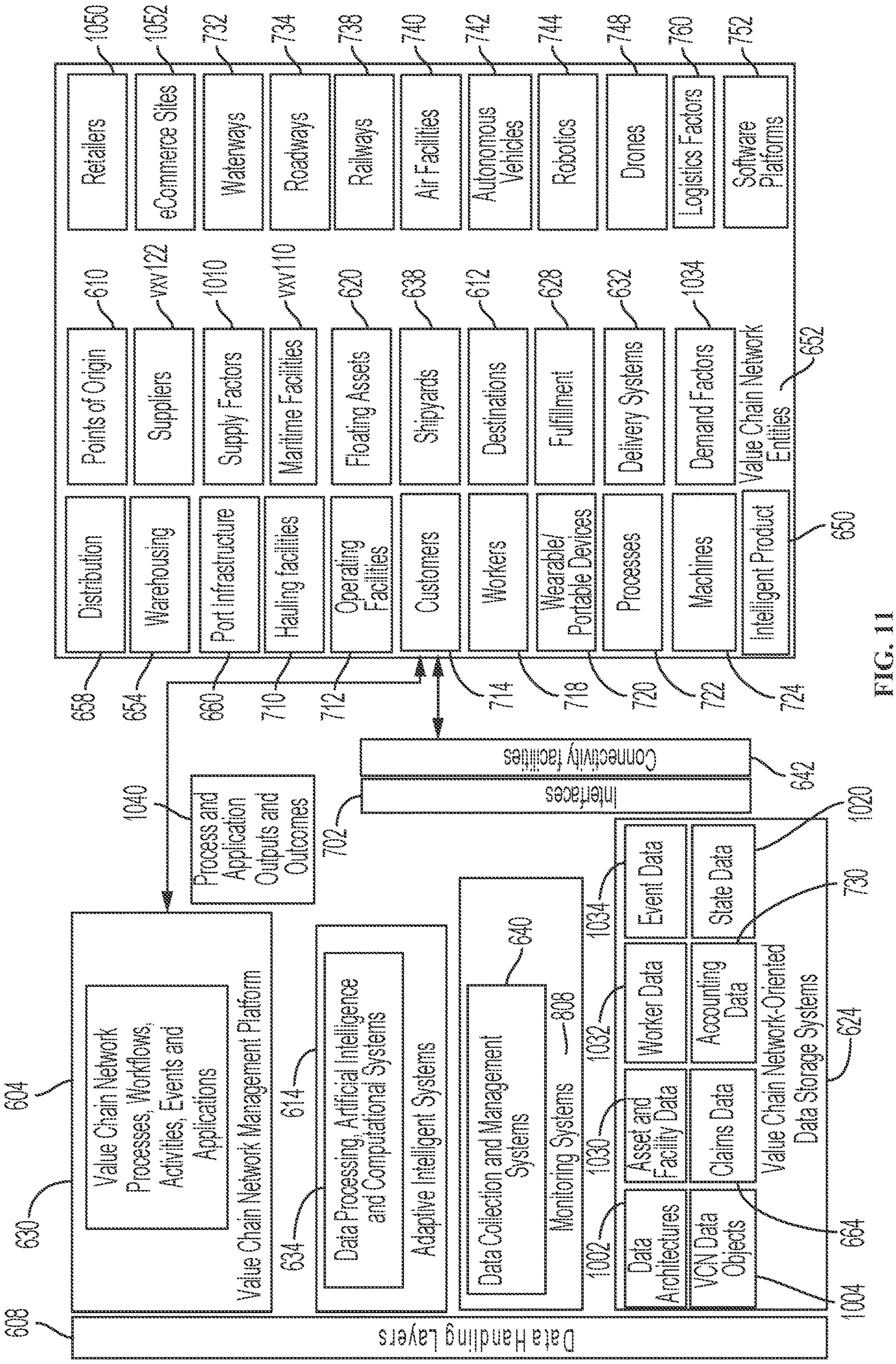
FIG. 11 is a block diagram showing components and relationships in embodiments of a value chain network management platform in accordance with the present disclosure.

Referring to FIG. 11, a high-level schematic of an embodiment of the value chain network management platform 604 is illustrated, including a set of systems, applications, processes, modules, services, layers, devices, components, machines, products, sub-systems, interfaces, connections, and other elements working in coordination to enable intelligent management of sets of the value chain entities 652 that may occur, operate, transact or the like within, or own, operate, support or enable, one or more value chain network processes, workflows, activities, events and/or applications 630 or that may otherwise be part of, integrated with, linked to, or operated on by the platform 604 in connection with a product 650 (which may be a finished good, software product, hardware product, component product, material, item of equipment, consumer packaged good, consumer product, food product, beverage product, home product, business supply product, consumable product, pharmaceutical product, medical device product, technology product, entertainment product, or any other type of product or related service, which may, in embodiments, encompass an intelligent product that is enabled with processing, networking, sensing, computation, and/or other Internet of Things capabilities). Value chain entities 652, such as involved in or for a wide range of value chain activities (such as supply chain activities, logistics activities, demand management and planning activities, delivery activities, shipping activities, warehousing activities, distribution and fulfillment activities, inventory aggregation, storage and management activities, marketing activities, and many others, as involved in various value chain network processes, workflows, activities, events and applications 630 may include any of the wide variety of assets, systems, devices, machines, components, equipment, facilities, individuals or other entities mentioned throughout this disclosure or in the documents incorporated herein by reference.

In embodiments, the value chain network management platform 604 may include the set of data handling layers 624, each of which is configured to provide a set of capabilities that facilitate development and deployment of intelligence, such as for facilitating automation, machine learning, applications of artificial intelligence, intelligent transactions, intelligent operations, remote control, analytics, monitoring, reporting, state management, event management, process management, and many others, for a wide variety of value chain network applications and end uses. In embodiments, the data handling layers 624 may include a value chain network monitoring systems layer 614, a value chain network entity-oriented data storage systems layer 624 (referred to in some cases herein for convenience simply as a data storage layer 624), an adaptive intelligent systems layer 614 and a value chain network management platform layer 604. The value chain network management platform 604 may include the data handling layers 624 such that the value chain network management platform layer 604 may provide management of the value chain network management platform 604 and/or management of the other layers such as the value chain network monitoring systems layer 614, the value chain network entity-oriented data storage systems layer 624 (e.g., data storage layer 624), and the adaptive intelligent systems layer 614. Each of the data handling layers 624 may include a variety of services, programs, applications, workflows, systems, components and modules, as further described herein and in the documents incorporated herein by reference. In embodiments, each of the data handling layers 624 (and optionally the platform 604 as a whole) is configured such that one or more of its elements can be accessed as a service by other layers 624 or by other systems (e.g., being configured as a platform-as-a-service deployed on a set of cloud infrastructure components in a microservices architecture). For example, the platform 604 may have (or may configure and/or provision), and a data handling layer 608 may use, a set of connectivity facilities 642, such as network connections (including various configurations, types and protocols), interfaces, ports, application programming interfaces (APIs), brokers, services, connectors, wired or wireless communication links, human-accessible interfaces, software interfaces, micro-services, SaaS interfaces, PaaS interfaces, IaaS interfaces, cloud capabilities, or the like by which data or information may be exchanged between a data handling layer 608 and other layers, systems or sub-systems of the platform 604, as well as with other systems, such as value chain entities 652 or external systems, such as cloud-based or on-premises enterprise systems (e.g., accounting systems, resource management systems, CRM systems, supply chain management systems and many others). Each of the data handling layers 624 may include a set of services (e.g., microservices), for data handling, including facilities for data extraction, transformation and loading; data cleansing and deduplication facilities; data normalization facilities; data synchronization facilities; data security facilities; computational facilities (e.g., for performing pre-defined calculation operations on data streams and providing an output stream); compression and de-compression facilities; analytic facilities (such as providing automated production of data visualizations) and others.

In embodiments, each data handling layer 608 has a set of application programming connectivity facilities 642 for automating data exchange with each of the other data handling layers 624. These may include data integration capabilities, such as for extracting, transforming, loading, normalizing, compression, decompressing, encoding, decoding, and otherwise processing data packets, signals, and other information as it exchanged among the layers and/or the applications 630, such as transforming data from one format or protocol to another as needed in order for one layer to consume output from another. In embodiments, the data handling layers 624 are configured in a topology that facilitates shared data collection and distribution across multiple applications and uses within the platform 604 by the value chain monitoring systems layer 614. The value chain monitoring systems layer 614 may include, integrate with, and/or cooperate with various data collection and management systems 640, referred to for convenience in some cases as data collection systems 640, for collecting and organizing data collected from or about value chain entities 652, as well as data collected from or about the various data layers 624 or services or components thereof. For example, a stream of physiological data from a wearable device worn by a worker undertaking a task or a consumer engaged in an activity can be distributed via the monitoring systems layer 614 to multiple distinct applications in the value chain management platform layer 604, such as one that facilitates monitoring the physiological, psychological, performance level, attention, or other state of a worker and another that facilitates operational efficiency and/or effectiveness. In embodiments, the monitoring systems layer 614 facilitates alignment, such as time-synchronization, normalization, or the like of data that is collected with respect to one or more value chain network entities 652. For example, one or more video streams or other sensor data collected of or with respect to a worker 718 or other entity in a value chain network facility or environment, such as from a set of camera-enabled IoT devices, may be aligned with a common clock, so that the relative timing of a set of videos or other data can be understood by systems that may process the videos, such as machine learning systems that operate on images in the videos, on changes between images in different frames of the video, or the like. In such an example, the monitoring systems layer 614 may further align a set of videos, camera images, sensor data, or the like, with other data, such as a stream of data from wearable devices, a stream of data produced by value chain network systems (such as ships, lifts, vehicles, containers, cargo handling systems, packing systems, delivery systems, drones/robots, and the like), a stream of data collected by mobile data collectors, and the like. Configuration of the monitoring systems layer 614 as a common platform, or set of microservices, that are accessed across many applications, may dramatically reduce the number of interconnections required by an owner or other operator within a value chain network in order to have a growing set of applications monitoring a growing set of IoT devices and other systems and devices that are under its control.

In embodiments, the data handling layers 624 are configured in a topology that facilitates shared or common data storage across multiple applications and uses of the platform 604 by the value chain network-oriented data storage systems layer 624, referred to herein for convenience in some cases simply as the data storage layer 624 or storage layer 624. For example, various data collected about the value chain entities 652, as well as data produced by the other data handling layers 624, may be stored in the data storage layer 624, such that any of the services, applications, programs, or the like of the various data handling layers 624 can access a common data source (which may comprise a single logical data source that is distributed across disparate physical and/or virtual storage locations). This may facilitate a dramatic reduction in the amount of data storage required to handle the enormous amount of data produced by or about value chain network entities 652 as applications 630 and uses of value chain networks grow and proliferate. For example, a supply chain or inventory management application in the value chain management platform layer 604, such as one for ordering replacement parts for a machine or item of equipment, may access the same data set about what parts have been replaced for a set of machines as a predictive maintenance application that is used to predict whether a component of a ship, or facility of a port is likely to require replacement parts. Similarly, prediction may be used with respect to the resupply of items.

In embodiments, value chain network data objects 1004 may be provided according to an object-oriented data model that defines classes, objects, attributes, parameters and other features of the set of data objects (such as associated with value chain network entities 652 and applications 630) that are handled by the platform 604.

In embodiments, the data storage systems layer 624 may provide an extremely rich environment for collection of data that can be used for extraction of features or inputs for intelligence systems, such as expert systems, analytic systems, artificial intelligence systems, robotic process automation systems, machine learning systems, deep learning systems, supervised learning systems, or other intelligent systems as disclosed throughout this disclosure and the documents incorporated herein by reference. As a result, each application 630 in the platform 604 and each adaptive intelligent system in the adaptive intelligent systems layer 614 can benefit from the data collected or produced by or for each of the others. In embodiments, the data storage systems layer 624 may facilitate collection of data that can be used for extraction of features or inputs for intelligence systems such as a development framework from artificial intelligence. In examples, the collections of data may pull in and/or house event logs (naturally stored or ad-hoc, as needed), perform periodic checks on onboard diagnostic data, or the like. In examples, pre calculation of features may be deployed using AWS Lambda, for example, or various other cloud-based on-demand compute capabilities, such as pre-calculations, multiplexing signals. In many examples, there are pairings (doubles, triples, quadruplets, etc.) of similar kinds of value chain entities that may use one or more sets of capabilities of the data handling layers 624 to deploy connectivity and services across value chain entities and across applications used by the entities even when amassing hundreds and hundreds of data types from relatively disparate entities. In these examples, various pairings of similar types of value chain entities using, at least in part, the connectivity and services across value chain entities and applications, may direct the information from the pairings of connected data to artificial intelligence services including the various neural networks disclosed herein and hybrid combinations thereof. In these examples, genetic programming techniques may be deployed to prune some of the input features in the information from the pairings of connected data. In these examples, genetic programming techniques may also be deployed to add to and augment the input features in the information from the pairings. These genetic programming techniques may be shown to increase the efficacy of the determinations established by the artificial intelligence services. In these examples, the information from the pairings of connected data may be migrated to other layers on the platform including to support or deploy robotic process automation, prediction, forecasting, and other resources such that the shared data schema may facilitate as capabilities and resources for the platform 604.

A wide range of data types may be stored in the storage layer 624 using various storage media and data storage types, data architectures 1002, and formats, including, without limitation: asset and facility data 1030, state data 1140 (such as indicating a state, condition status, or other indicator with respect to any of the value chain network entities 652, any of the applications 630 or components or workflows thereof, or any of the components or elements of the platform 604, among others), worker data 1032 (including identity data, role data, task data, workflow data, health data, attention data, mood data, stress data, physiological data, performance data, quality data and many other types); event data 1034 ((such as with respect to any of a wide range of events, including operational data, transactional data, workflow data, maintenance data, and many other types of data that includes or relates to events that occur within a value chain network 668 or with respect to one or more applications 630, including process events, financial events, transaction events, output events, input events, state-change events, operating events, workflow events, repair events, maintenance events, service events, damage events, injury events, replacement events, refueling events, recharging events, shipping events, warehousing events, transfers of goods, crossing of borders, moving of cargo, inspection events, supply events, and many others); claims data 664 (such as relating to insurance claims, such as for business interruption insurance, product liability insurance, insurance on goods, facilities, or equipment, flood insurance, insurance for contract-related risks, and many others, as well as claims data relating to product liability, general liability, workers compensation, injury and other liability claims and claims data relating to contracts, such as supply contract performance claims, product delivery requirements, warranty claims, indemnification claims, delivery requirements, timing requirements, milestones, key performance indicators and others); accounting data 730 (such as data relating to completion of contract requirements, satisfaction of bonds, payment of duties and tariffs, and others); and risk management data 732 (such as relating to items supplied, amounts, pricing, delivery, sources, routes, customs information and many others), among many other data types associated with value chain network entities 652 and applications 630.

In embodiments, the data handling layers 624 are configured in a topology that facilitates shared adaptation capabilities, which may be provided, managed, mediated and the like by one or more of a set of services, components, programs, systems, or capabilities of the adaptive intelligent systems layer 614, referred to in some cases herein for convenience as the adaptive intelligence layer 614. The adaptive intelligence systems layer 614 may include a set of data processing, artificial intelligence and computational systems 634 that are described in more detail elsewhere throughout this disclosure. Thus, use of various resources, such as computing resources (such as available processing cores, available servers, available edge computing resources, available on-device resources (for single devices or peered networks), and available cloud infrastructure, among others), data storage resources (including local storage on devices, storage resources in or on value chain entities or environments (including on-device storage, storage on asset tags, local area network storage and the like), network storage resources, cloud-based storage resources, database resources and others), networking resources (including cellular network spectrum, wireless network resources, fixed network resources and others), energy resources (such as available battery power, available renewable energy, fuel, grid-based power, and many others) and others may be optimized in a coordinated or shared way on behalf of an operator, enterprise, or the like, such as for the benefit of multiple applications, programs, workflows, or the like. For example, the adaptive intelligence layer 614 may manage and provision available network resources for both a supply chain management application and for a demand planning application (among many other possibilities), such that low latency resources are used for supply chain management application (where rapid decisions may be important) and longer latency resources are used for the demand planning application. As described in more detail throughout this disclosure and the documents incorporated herein by reference, a wide variety of adaptations may be provided on behalf of the various services and capabilities across the various layers 624, including ones based on application requirements, quality of service, on-time delivery, service objectives, budgets, costs, pricing, risk factors, operational objectives, efficiency objectives, optimization parameters, returns on investment, profitability, uptime/downtime, worker utilization, and many others.

The value chain management platform layer 604, referred to in some cases herein for convenience as the platform layer 604, may include, integrate with, and enable the various value chain network processes, workflows, activities, events and applications 630 described throughout this disclosure that enable an operator to manage more than one aspect of a value chain network environment or entity 652 in a common application environment (e.g., shared, pooled, similarly licenses whether shared data for one person, multiple people, or anonymized), such as one that takes advantage of common data storage in the data storage layer 624, common data collection or monitoring in the monitoring systems layer 614 and/or common adaptive intelligence of the adaptive intelligence layer 614. Outputs from the applications 630 in the platform layer 604 may be provided to the other data handing layers 624. These may include, without limitation, state and status information for various objects, entities, processes, flows and the like; object information, such as identity, attribute and parameter information for various classes of objects of various data types; event and change information, such as for workflows, dynamic systems, processes, procedures, protocols, algorithms, and other flows, including timing information; outcome information, such as indications of success and failure, indications of process or milestone completion, indications of correct or incorrect predictions, indications of correct or incorrect labeling or classification, and success metrics (including relating to yield, engagement, return on investment, profitability, efficiency, timeliness, quality of service, quality of product, customer satisfaction, and others) among others. Outputs from each application 630 can be stored in the data storage layer 624, distributed for processing by the data collection layer 614, and used by the adaptive intelligence layer 614. The cross-application nature of the platform layer 604 thus facilitates convenient organization of all of the necessary infrastructure elements for adding intelligence to any given application, such as by supplying machine learning on outcomes across applications, providing enrichment of automation of a given application via machine learning based on outcomes from other applications or other elements of the platform 604, and allowing application developers to focus on application-native processes while benefiting from other capabilities of the platform 604. In examples, there may be systems, components, services and other capabilities that optimize control, automation, or one or more performance characteristics of one or more value chain network entities 652; or ones that may generally improve any of process and application outputs and outcomes 1040 pursued by use of the platform 604. In some examples, outputs and outcomes 1040 from various applications 630 may be used to facilitate automated learning and improvement of classification, prediction, or the like that is involved in a step of a process that is intended to be automated.

Some Data Storage Layer Details—Alternative Data Architectures

Figure 12:
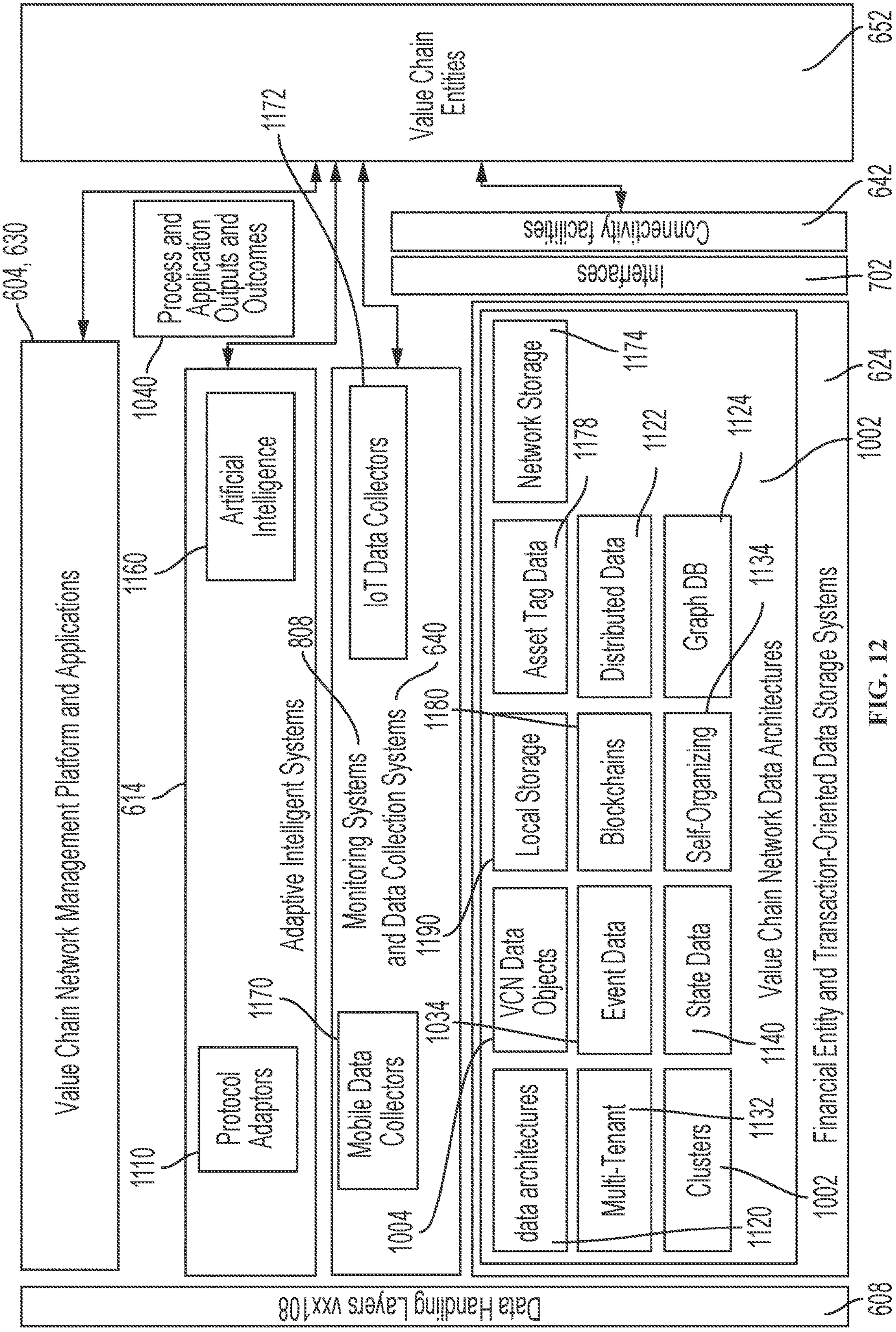
FIG. 12 is a block diagram showing components and relationships of a data storage layer in embodiments of a value chain network management platform in accordance with the present disclosure.

Referring to FIG. 12, additional details, components, sub-systems, and other elements of an optional embodiment of the data storage layer 624 of the platform 604 are illustrated. Various data architectures may be used, including conventional relational and object-oriented data architectures, blockchain architectures 1180, asset tag data storage architectures 1178, local storage architectures 1190, network storage architectures 1174, multi-tenant architectures 1132, distributed data architectures 1002, value chain network (VCN) data object architectures 1004, cluster-based architectures 1128, event data-based architectures 1034, state data-based architectures 1140, graph database architectures 1124, self-organizing architectures 1134, and other data architectures 1002.

The adaptive intelligent systems layer 614 of the platform 604 may include one or more protocol adaptors 1110 for facilitating data storage, retrieval access, query management, loading, extraction, normalization, and/or transformation to enable use of the various other data storage architectures 1002, such as allowing extraction from one form of database and loading to a data system that uses a different protocol or data structure.

In embodiments, the value chain network-oriented data storage systems layer 624 may include, without limitation, physical storage systems, virtual storage systems, local storage systems (e.g., part of the local storage architectures 1190), distributed storage systems, databases, memory, network-based storage, network-attached storage systems (e.g., part of the network storage architectures 1174 such as using NVME, storage attached networks, and other network storage systems), and many others.

In embodiments, the storage layer 624 may store data in one or more knowledge graphs (such as a directed acyclic graph, a data map, a data hierarchy, a data cluster including links and nodes, a self-organizing map, or the like) in the graph database architectures 1124. In example embodiments, the knowledge graph may be a prevalent example of when a graph database and graph database architecture may be used. In some examples, the knowledge graph may be used to graph a workflow. For a linear workflow, a directed acyclic graph may be used. For a contingent workflow, a cyclic graph may be used. The graph database (e.g., graph database architectures vpc608) may include the knowledge graph or the knowledge graph may be an example of the graph database. In example embodiments, the knowledge graph may include ontology and connections (e.g., relationships) between the ontology of the knowledge graph. In an example, the knowledge graph may be used to capture an articulation of knowledge domains of a human expert such that there may be an identification of opportunities to design and build robotic process automation or other intelligence that may replicate this knowledge set. The platform may be used to recognize that a type of expert is using this factual knowledge base (from the knowledge graph) coupled with competencies that may be replicable by artificial intelligence that may be different depending on type of expertise involved. For example, artificial intelligence such as a convolutional neural network may be used with spatiotemporal aspects that may be used to diagnose issues or packing up a box in a warehouse. Whereas the platform may use a different type of knowledge graph for a self-organizing map of an expert whose main job is to segment customers into customer segmentation groups. In some examples, the knowledge graph may be built from various data such as job credentials, job listings, parsing output deliverables. In embodiments, the data storage layer 624 may store data in a digital thread, ledger, or the like, such as for maintaining a serial or other records of an entities 652 over time, including any of the entities described herein. In embodiments, the data storage layer 624 may use and enable an asset tag 1178, which may include a data structure that is associated with an asset and accessible and managed, such as by use of access controls, so that storage and retrieval of data is optionally linked to local processes, but also optionally open to remote retrieval and storage options. In embodiments, the storage layer 624 may include one or more blockchains 1180, such as ones that store identity data, transaction data, historical interaction data, and the like, such as with access control that may be role-based or may be based on credentials associated with a value chain entity 652, a service, or one or more applications 630. Data stored by the data storage systems 624 may include accounting and other financial data 730, access data 734, asset and facility data 1030 (such as for any of the value chain assets and facilities described herein), asset tag data 1178, worker data 1032, event data 1034, risk management data 732, pricing data 738, safety data 664 and many other types of data that may be associated with, produced by, or produced about any of the value chain entities and activities described herein and in the documents incorporated by reference.

Adaptive Intelligent Systems and Monitoring Layers

Figure 13:
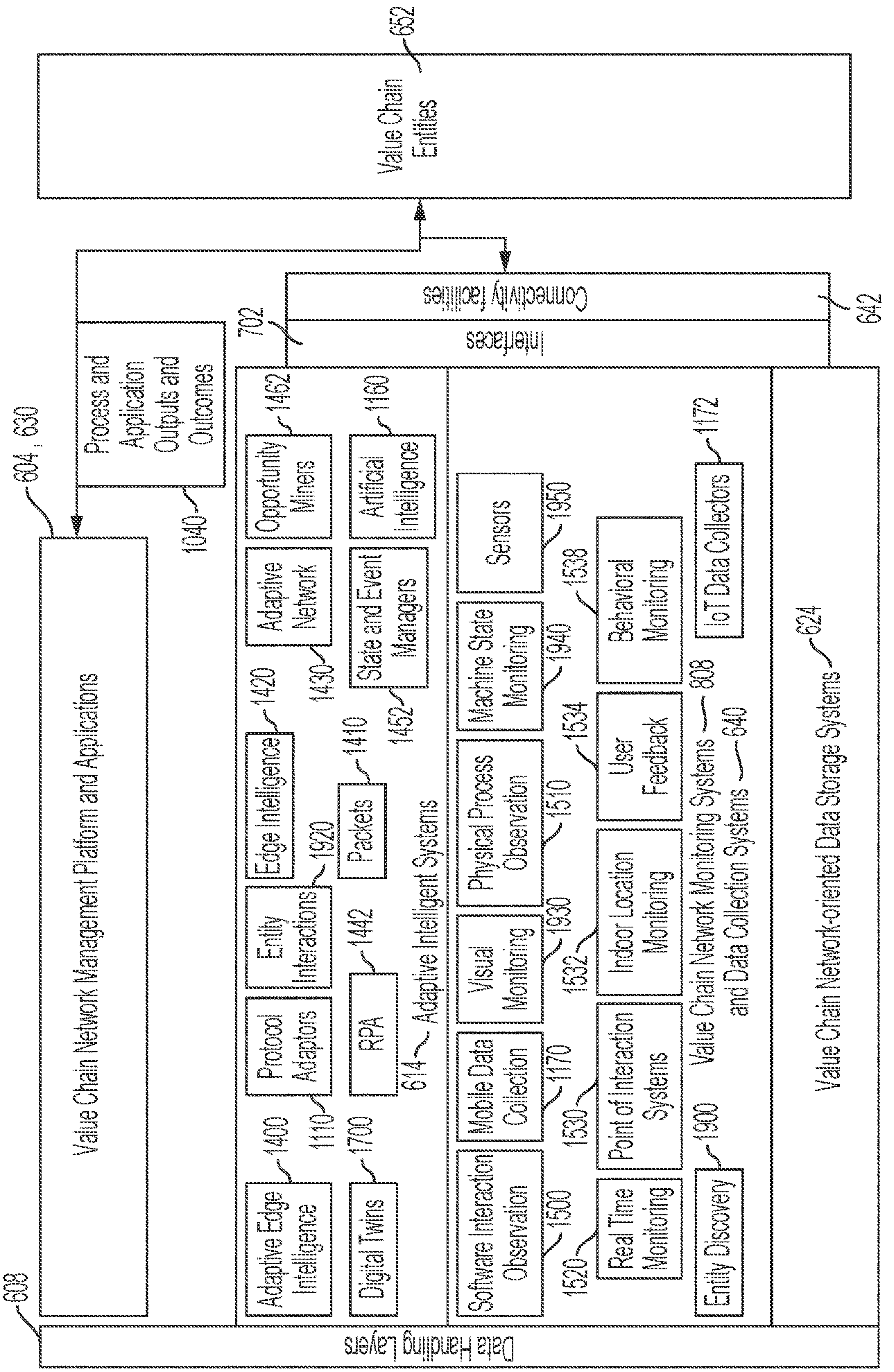
FIG. 13 is a block diagram showing components and relationships of an adaptive intelligent systems layer in embodiments of a value chain network management platform in accordance with the present disclosure.

Referring to FIG. 13, additional details, components, sub-systems, and other elements of an optional embodiment of the platform 604 are illustrated. The management platform 604 may, in various optional embodiments, include the set of applications 630, by which an operator or owner of a value chain network entity, or other users, may manage, monitor, control, analyze, or otherwise interact with one or more elements of a value chain network entity 652, such as any of the elements noted in connection above and throughout this disclosure.

In embodiments, the adaptive intelligent systems layer 614 may include a set of systems, components, services and other capabilities that collectively facilitate the coordinated development and deployment of intelligent systems, such as ones that can enhance one or more of the applications 630 at the application platform layer 604; ones that can improve the performance of one or more of the components, or the overall performance (e.g., speed/latency, reliability, quality of service, cost reduction, or other factors) of the connectivity facilities 642; ones that can improve other capabilities within the adaptive intelligent systems layer 614; ones that improve the performance (e.g., speed/latency, energy utilization, storage capacity, storage efficiency, reliability, security, or the like) of one or more of the components, or the overall performance, of the value chain network-oriented data storage systems 624; ones that optimize control, automation, or one or more performance characteristics of one or more value chain network entities 652; or ones that generally improve any of the process and application outputs and outcomes 1040 pursued by use of the platform 604.

These adaptive intelligent systems 614 may include a robotic process automation system 1442, a set of protocol adaptors 1110, a packet acceleration system 1410, an edge intelligence system 1420 (which may be a self-adaptive system), an adaptive networking system 1430, a set of state and event managers 1450, a set of opportunity miners 1460, a set of artificial intelligence systems 1160, a set of digital twin systems 1700, a set of entity interaction management systems 1900 (such as for setting up, provisioning, configuring and otherwise managing sets of interactions between and among sets of value chain network entities 652 in the value chain network 668), and other systems.

In embodiments, the value chain monitoring systems layer 614 and its data collection systems 640 may include a wide range of systems for the collection of data. This layer may include, without limitation, real time monitoring systems 1520 (such as onboard monitoring systems like event and status reporting systems on ships and other floating assets, on delivery vehicles, on trucks and other hauling assets, and in shipyards, ports, warehouses, distribution centers and other locations; on-board diagnostic (OBD) and telematics systems on floating assets, vehicles and equipment; systems providing diagnostic codes and events via an event bus, communication port, or other communication system; monitoring infrastructure (such as cameras, motion sensors, beacons, RFID systems, smart lighting systems, asset tracking systems, person tracking systems, and ambient sensing systems located in various environments where value chain activities and other events take place), as well as removable and replaceable monitoring systems, such as portable and mobile data collectors, RFID and other tag readers, smart phones, tablets and other mobile devices that are capable of data collection and the like); software interaction observation systems 1500 (such as for logging and tracking events involved in interactions of users with software user interfaces, such as mouse movements, touchpad interactions, mouse clicks, cursor movements, keyboard interactions, navigation actions, eye movements, finger movements, gestures, menu selections, and many others, as well as software interactions that occur as a result of other programs, such as over APIs, among many others); mobile data collectors 1170 (such as described extensively herein and in documents incorporated by reference), visual monitoring systems 1930 (such as using video and still imaging systems, LIDAR, IR and other systems that allow visualization of items, people, materials, components, machines, equipment, personnel, gestures, expressions, positions, locations, configurations, and other factors or parameters of entities 652, as well as inspection systems that monitor processes, activities of workers and the like); point of interaction systems 1530 (such as dashboards, user interfaces, and control systems for value chain entities); physical process observation systems 1510 (such as for tracking physical activities of operators, workers, customers, or the like, physical activities of individuals (such as shippers, delivery workers, packers, pickers, assembly personnel, customers, merchants, vendors, distributors and others), physical interactions of workers with other workers, interactions of workers with physical entities like machines and equipment, and interactions of physical entities with other physical entities, including, without limitation, by use of video and still image cameras, motion sensing systems (such as including optical sensors, LIDAR, IR and other sensor sets), robotic motion tracking systems (such as tracking movements of systems attached to a human or a physical entity) and many others; machine state monitoring systems 1940 (including onboard monitors and external monitors of conditions, states, operating parameters, or other measures of the condition of any value chain entity, such as a machine or component thereof, such as a machine, such as a client, a server, a cloud resource, a control system, a display screen, a sensor, a camera, a vehicle, a robot, or other machine); sensors and cameras 1950 and other IoT data collection systems 1172 (including onboard sensors, sensors or other data collectors (including click tracking sensors) in or about a value chain environment (such as, without limitation, a point of origin, a loading or unloading dock, a vehicle or floating asset used to convey goods, a container, a port, a distribution center, a storage facility, a warehouse, a delivery vehicle, and a point of destination), cameras for monitoring an entire environment, dedicated cameras for a particular machine, process, worker, or the like, wearable cameras, portable cameras, cameras disposed on mobile robots, cameras of portable devices like smart phones and tablets, and many others, including any of the many sensor types disclosed throughout this disclosure or in the documents incorporated herein by reference); indoor location monitoring systems 1532 (including cameras, IR systems, motion-detection systems, beacons, RFID readers, smart lighting systems, triangulation systems, RF and other spectrum detection systems, time-of-flight systems, chemical noses and other chemical sensor sets, as well as other sensors); user feedback systems 1534 (including survey systems, touch pads, voice-based feedback systems, rating systems, expression monitoring systems, affect monitoring systems, gesture monitoring systems, and others); behavioral monitoring systems 1538 (such as for monitoring movements, shopping behavior, buying behavior, clicking behavior, behavior indicating fraud or deception, user interface interactions, product return behavior, behavior indicative of interest, attention, boredom or the like, mood-indicating behavior (such as fidgeting, staying still, moving closer, or changing posture) and many others); and any of a wide variety of Internet of Things (IoT) data collectors 1172, such as those described throughout this disclosure and in the documents incorporated by reference herein.

In embodiments, the value chain monitoring systems layer 614 and its data collection systems 640 may include an entity discovery system 1900 for discovering one or more value chain network entities 652, such as any of the entities described throughout this disclosure. This may include components or sub-systems for searching for entities within the value chain network 668, such as by device identifier, by network location, by geolocation (such as by geofence), by indoor location (such as by proximity to known resources, such as IoT-enabled devices and infrastructure, Wifi routers, switches, or the like), by cellular location (such as by proximity to cellular towers), by identity management systems (such as where an entity 652 is associated with another entity 652, such as an owner, operator, user, or enterprise by an identifier that is assigned by and/or managed by the platform 604), and the like. Entity discovery 1900 may initiate a handshake among a set of devices, such as to initiate interactions that serve various applications 630 or other capabilities of the platform 604.

Figure 14:
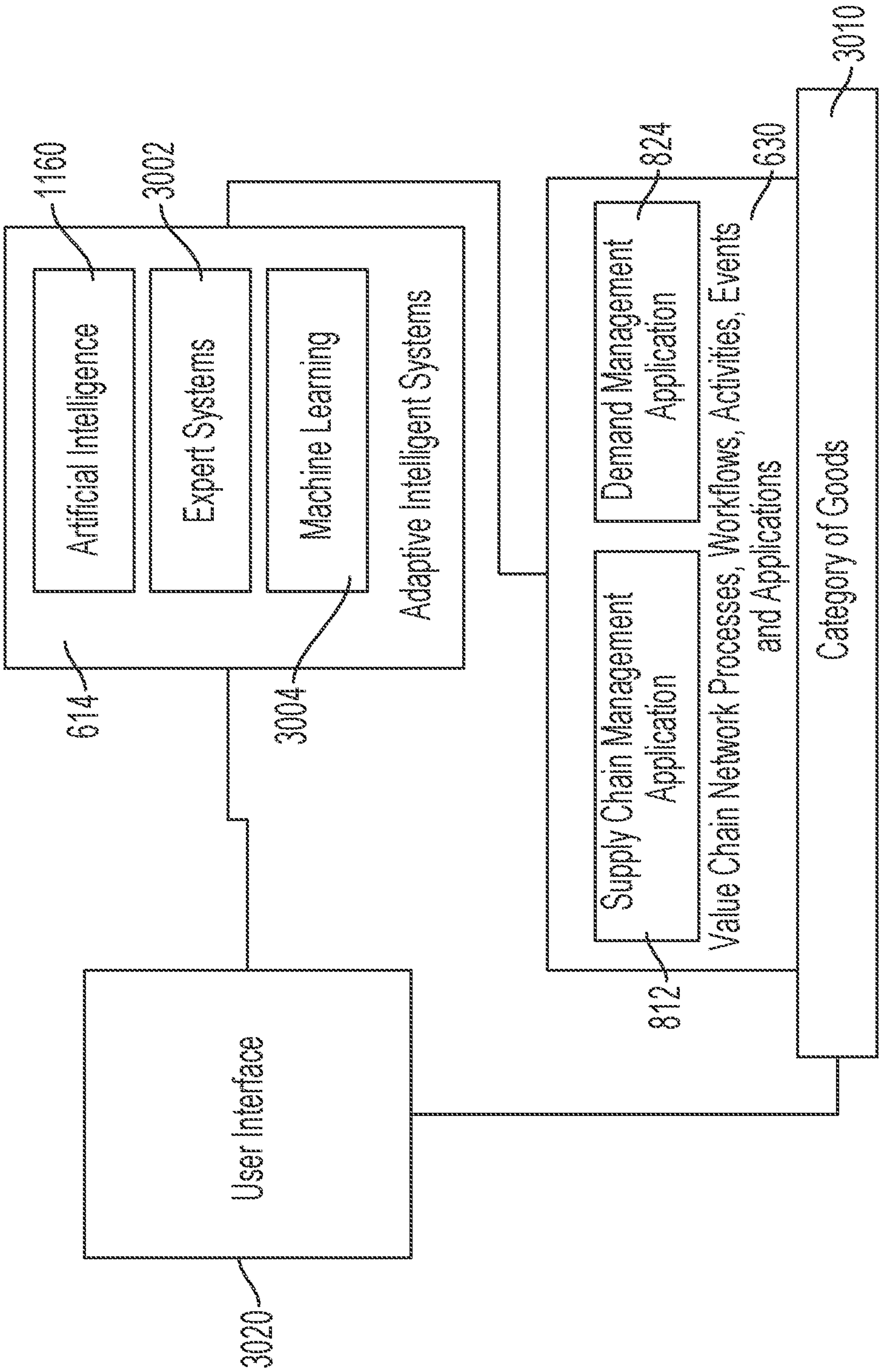
FIG. 14 is a block diagram that depicts providing adaptive intelligence systems for coordinated intelligence for sets of demand and supply applications for a category of goods in accordance with the present disclosure.

Referring to FIG. 14, a management platform of an information technology system, such as a management platform for a value chain of goods and/or services is depicted as a block diagram of functional elements and representative interconnections. The management platform includes a user interface 3020 that provides, among other things, a set of adaptive intelligence systems 614. The adaptive intelligence systems 614 provide coordinated intelligence (including artificial intelligence 1160, expert systems 3002, machine learning 3004, and the like) for a set of demand management applications 824 and for a set of supply chain applications 812 for a category of goods 3010, which may be produced and sold through the value chain. The adaptive intelligence systems 614 may deliver artificial intelligence 1160 through a set of data processing, artificial intelligence and computational systems 634. In embodiments, the adaptive intelligence systems 614 are selectable and/or configurable through the user interface 3020 so that one or more of the adaptive intelligence systems 614 can operate on or in cooperation with the sets of value chain applications (e.g., demand management applications 824 and supply chain applications 812). The adaptive intelligence systems 614 may include artificial intelligence, including any of the various expert systems, artificial intelligence systems, neural networks, supervised learning systems, machine learning systems, deep learning systems, and other systems described throughout this disclosure and in the documents incorporated by reference.

In embodiments, user interface may include interfaces for configuring an artificial intelligence system 1160 to take inputs from selected data sources of the value chain (such as data sources used by the set of demand management applications 824 and/or the set of supply chain applications 812) and supply them, such as to a neural network, artificial intelligence system 1160 or any of the other adaptive intelligence systems 614 described throughout this disclosure and in the documents incorporated herein by reference to enhance, control, improve, optimize, configure, adapt or have another impact on a value chain for the category of goods 3010. In embodiments, the selected data sources of the value chain may be applied either as inputs for classification or prediction, or as outcomes relating to the value chain, the category of goods 3010 and the like.

In embodiments, providing coordinated intelligence may include providing artificial intelligence capabilities, such as artificial intelligence systems 1160 and the like. Artificial intelligence systems may facilitate coordinated intelligence for the set of demand management applications 824 or the set of supply chain applications 812 or both, such as for a category of goods, such as by processing data that is available in any of the data sources of the value chain, such as value chain processes, bills of materials, manifests, delivery schedules, weather data, traffic data, goods design specifications, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System, and the like.

In embodiments, the user interface 3020 may provide access to, among other things artificial intelligence capabilities, applications, systems and the like for coordinating intelligence for applications of the value chain and particularly for value chain applications for the category of goods 3010. The user interface 3020 may be adapted to receive information descriptive of the category of goods 3010 and configure user access to the artificial intelligence capabilities responsive thereto, so that the user, through the user interface is guided to artificial intelligence capabilities that are suitable for use with value chain applications (e.g., the set of demand management applications 824 and supply chain applications 812) that contribute to goods/services in the category of goods 3010. The user interface 3020 may facilitate providing coordinated intelligence that comprises artificial intelligence capabilities that provide coordinated intelligence for a specific operator and/or enterprise that participates in the supply chain for the category of goods.

In embodiments, the user interface 3020 may be configured to facilitate the user selecting and/or configuring multiple artificial intelligence systems 1160 for use with the value chain. The user interface may present the set of demand management applications 824 and supply chain applications 812 as connected entities that receive, process, and produce outputs each of which may be shared among the applications. Types of artificial intelligence systems 1160 may be indicated in the user interface 3020 responsive to sets of connected applications or their data elements being indicated in the user interface, such as by the user placing a pointer proximal to a connected set of applications and the like. In embodiments, the user interface 3020 may facilitate access to the set of adaptive intelligence systems provides a set of capabilities that facilitate development and deployment of intelligence for at least one function selected from a list of functions consisting of supply chain application automation, demand management application automation, machine learning, artificial intelligence, intelligent transactions, intelligent operations, remote control, analytics, monitoring, reporting, state management, event management, and process management.

The adaptive intelligence systems 614 may be configured with data processing, artificial intelligence and computational systems 634 that may operate cooperatively to provide coordinated intelligence, such as when an artificial intelligence system 1160 operates on or responds to data collected by or produced by other systems of the adaptive intelligence systems 614, such as a data processing system and the like. In embodiments, providing coordinated intelligence may include operating a portion of a set of artificial intelligence systems 1160 that employs one or more types of neural network that is described herein and in the documents incorporated herein by reference and that processes any of the demand management application outputs and supply chain application outputs to provide the coordinated intelligence.

In embodiments, providing coordinated intelligence for the set of demand management applications 824 may include configuring at least one of the adaptive intelligence systems 614 (e.g., through the user interface 3020 and the like) for at least one or more demand management applications selected from a list of demand management applications including a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service, and the like.

Similarly, providing coordinated intelligence for the set of supply chain applications 812 may include configuring at least one of the adaptive intelligence systems 614 for at least one or more supply chain applications selected from a list of supply chain applications including a goods timing management application, a goods quantity management application, a logistics management application, a shipping application, a delivery application, an order for goods management application, an order for components management application, and the like.

In embodiments, the management platform 102 may, such as through the user interface 3020 facilitate access to the set of adaptive intelligence systems 614 that provide coordinated intelligence for a set of demand management applications 824 and supply chain applications 812 through the application of artificial intelligence. In such embodiments, the user may seek to align supply with demand while ensuring profitability and the like of a value chain for a category of goods 3010. By providing access to artificial intelligence capabilities 1160, the management platform allows the user to focus on the applications of demand and supply while gaining advantages of techniques such as expert systems, artificial intelligence systems, neural networks, supervised learning systems, machine learning systems, deep learning systems, and the like.

In embodiments, the management platform 102 may, through the user interface 3020 and the like provide a set of adaptive intelligence systems 614 that provide coordinated artificial intelligence 1160 for the sets of demand management applications 824 and supply chain applications 812 for the category of goods 3020 by, for example, determining (automatically) relationships among demand management and supply chain applications based on inputs used by the applications, results produced by the applications, and value chain outcomes. The artificial intelligence 1160 may be coordinated by, for example, the set of data processing, artificial intelligence and computational systems 634 available through the adaptive intelligence systems 614.

In embodiments, the management platform 102 may be configured with a set of artificial intelligence systems 1160 as part of a set of adaptive intelligence systems 614 that provide the coordinated intelligence for the sets of demand management applications 824 and supply chain applications 812 for a category of goods 3010. The set of artificial intelligence systems 1160 may provide the coordinated intelligence so that at least one supply chain application of the set of supply chain applications 812 produces results that address at least one aspect of supply for at least one of the goods in the category of goods as determined by at least one demand management application of the set of demand management applications 824. In examples, a behavioral tracking demand management application may generate results for behavior of uses of a good in the category of goods 3010. The artificial intelligence systems 1160 may process the behavior data and conclude that there is a perceived need for greater consumer access to a second product in the category of goods 3010. This coordinated intelligence may be, optionally automatically, applied to the set of supply chain applications 812 so that, for example, production resources or other resources in the value chain for the category of goods are allocated to the second product. In examples, a distributor who handles stocking retailer shelves may receive a new stocking plan that allocates more retail shelf space for the second product, such as by taking away space from a lower margin product and the like.

In embodiments, the set of artificial intelligence systems 1160 and the like may provide coordinated intelligence for the sets of supply chain and demand management applications by, for example, determining an optionally temporal prioritization of demand management application outputs that impact control of supply chain applications so that an optionally temporal demand for at least one of the goods in the category of goods 3010 can be met. Seasonal adjustments in prioritization of demand application results are one example of a temporal change. Adjustments in prioritization may also be localized, such as when a large college football team is playing at their home stadium and local supply of tailgating supplies may temporally be adjusted even though demand management application results suggest that small propane stoves are not currently in demand in a wider region.

A set of adaptive intelligence systems 614 that provide coordinated intelligence, such as by providing artificial intelligence capabilities 1160 and the like may also facilitate development and deployment of intelligence for at least one function selected from a list of functions consisting of supply chain application automation, demand management application automation, machine learning, artificial intelligence, intelligent transactions, intelligent operations, remote control, analytics, monitoring, reporting, state management, event management, and process management. The set of adaptive intelligence systems 614 may be configured as a layer in the platform and an artificial intelligence system therein may operate on or be responsive to data collected by and/or produced by other systems (e.g., data processing systems, expert systems, machine learning systems and the like) of the adaptive intelligence systems layer.

In addition to providing coordinated intelligence configured for specific categories of goods, the coordinated intelligence may be provided for a specific value chain entity 652, such as a supply chain operator, business, enterprise, and the like that participates in the supply chain for the category of goods.

Providing coordinated intelligence may include employing a neural network to process at least one of the inputs and outputs of the sets of demand management and supply chain applications. Neural networks may be used with demand applications, such as a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service, and the like. Neural networks may also be used with supply chain applications such as a goods timing management application, a goods quantity management application, a logistics management application, a shipping application, a delivery application, an order for goods management application, an order for components management application, and the like. Neural networks may provide coordinated intelligence by processing data that is available in any of a plurality of value chain data sources for the category of goods including without limitation processes, bill of materials, weather, traffic, design specification, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System, and the like. Neural networks configured for providing coordinated intelligence may share adaptation capabilities with other adaptive intelligence systems 614, such as when these systems are configured in a topology that facilitates such shared adaptation. In embodiments, neural networks may facilitate provisioning available value chain/supply chain network resources for both the set of demand management applications and for the set of supply chain applications. In embodiments, neural networks may provide coordinated intelligence to improve at least one of the list of outputs consisting of a process output, an application output, a process outcome, an application outcome, and the like.

Figure 15:
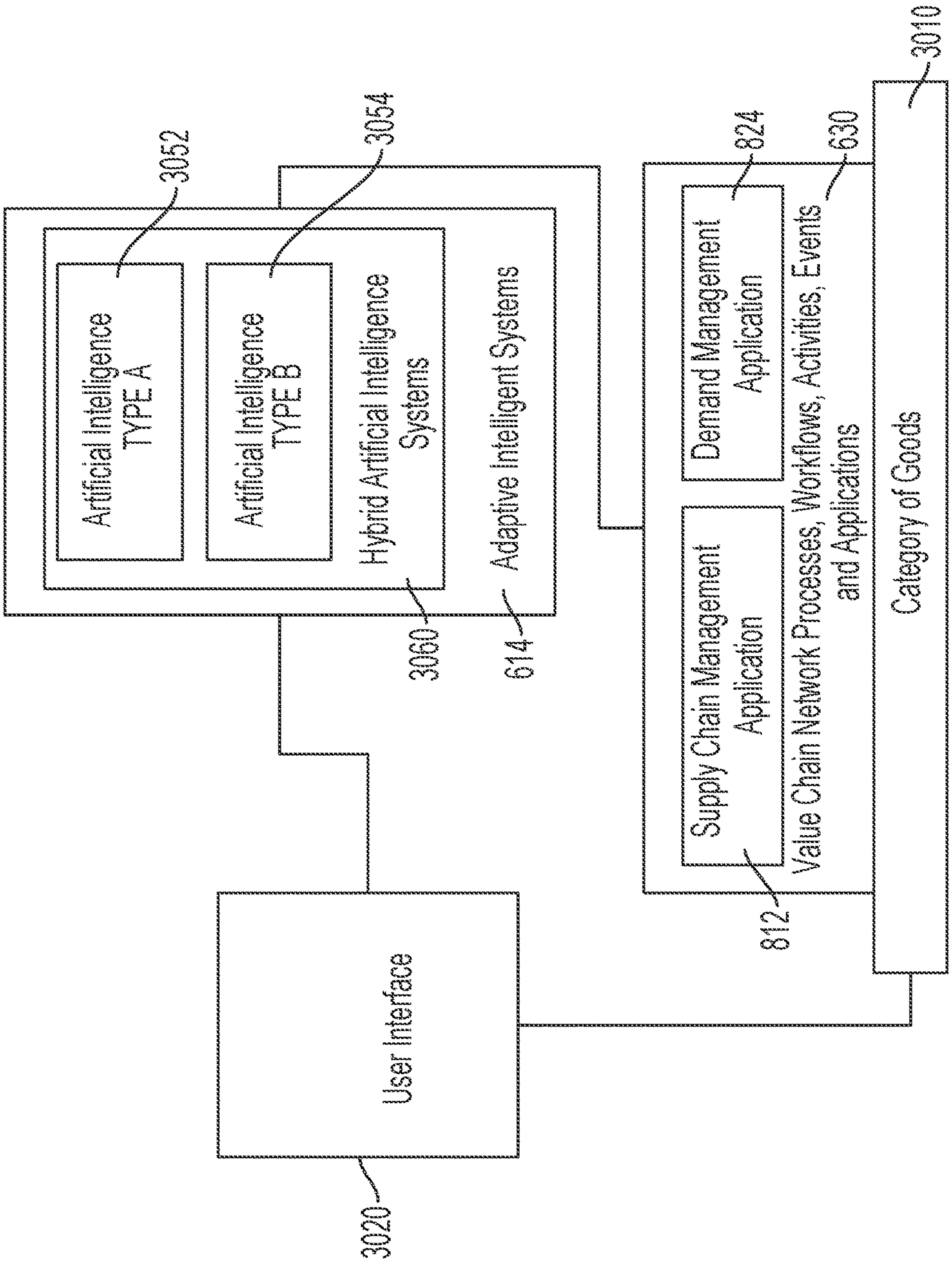
FIG. 15 is a block diagram that depicts providing hybrid adaptive intelligence systems for coordinated intelligence for sets of demand and supply applications or a category of goods in accordance with the present disclosure.

Referring to FIG. 15, a management platform of an information technology system, such as a management platform for a value chain of goods and/or services is depicted as a block diagram of functional elements and representative interconnections. The management platform includes a user interface 3020 that provides, among other things, a hybrid set of adaptive intelligence systems 614. The hybrid set of adaptive intelligence systems 614 provide coordinated intelligence through the application of artificial intelligence, such as through application of a hybrid artificial intelligence system 3060, and optionally through one or more expert systems, machine learning systems, and the like for use with a set of demand management applications 824 and for a set of supply chain applications 812 for a category of goods 3010, which may be produced and sold through the value chain. The hybrid adaptive intelligence systems 614 may deliver two types of artificial intelligence systems, type A 3052 and type B 3054 through a set of data processing, artificial intelligence and computational systems 634. In embodiments, the hybrid adaptive intelligence systems 614 are selectable and/or configurable through the user interface 3020 so that one or more of the hybrid adaptive intelligence systems 614 can operate on or in cooperation with the sets of supply chain applications (e.g., demand management applications 824 and supply chain applications 812). The hybrid adaptive intelligence systems 614 may include a hybrid artificial intelligence system 3060 that may include at least two types of artificial intelligence capabilities including any of the various expert systems, artificial intelligence systems, neural networks, supervised learning systems, machine learning systems, deep learning systems, and other systems described throughout this disclosure and in the documents incorporated by reference. The hybrid adaptive intelligence systems 614 may facilitate applying a first type of artificial intelligence system 1160 to the set of demand management applications 824 and a second type of artificial intelligence system 1160 to the set of supply chain applications 812, wherein each of the first type and second type of artificial intelligence system 1160 can operate independently, cooperatively, and optionally coordinate operation to provide coordinated intelligence for operation of the value chain that produces at least one of the goods in the category of goods 3010.

In embodiments, the user interface 3020 may include interfaces for configuring a hybrid artificial intelligence system 3060 to take inputs from selected data sources of the value chain (such as data sources used by the set of demand management applications 824 and/or the set of supply chain applications 812) and supply them, such as to at least one of the two types of artificial intelligence systems in the hybrid artificial intelligence system 3060, types of which are described throughout this disclosure and in the documents incorporated herein by reference to enhance, control, improve, optimize, configure, adapt or have another impact on a value chain for the category of goods 3010. In embodiments, the selected data sources of the value chain may be applied either as inputs for classification or prediction, or as outcomes relating to the value chain, the category of goods 3010 and the like.

In embodiments, the hybrid adaptive intelligence systems 614 provides a plurality of distinct artificial intelligence systems 1160, a hybrid artificial intelligence system 3060, and combinations thereof. In embodiments, any of the plurality of distinct artificial intelligence systems 1160 and the hybrid artificial intelligence system 3060 may be configured as a plurality of neural network-based systems, such as a classification-adapted neural network, a prediction-adapted neural network and the like. As an example of hybrid adaptive intelligence systems 614, a machine learning-based artificial intelligence system may be provided for the set of demand management applications 824 and a neural network-based artificial intelligence system may be provided for the set of supply chain applications 812. As an example of a hybrid artificial intelligence system 3060, the hybrid adaptive intelligence systems 614 may provide the hybrid artificial intelligence system 3060 that may include a first type of artificial intelligence that is applied to the demand management applications 824 and which is distinct from a second type of artificial intelligence that is applied to the supply chain applications 812. A hybrid artificial intelligence system 3060 may include any combination of types of artificial intelligence systems including a plurality of a first type of artificial intelligence (e.g., neural networks) and at least one second type of artificial intelligence (e.g., an expert system) and the like. In embodiments, a hybrid artificial intelligence system may comprise a hybrid neural network that applies a first type of neural network with respect to the demand management applications 824 and a second type of neural network with respect to the supply chain applications 812. Yet further, a hybrid artificial intelligence system 3060 may provide two types of artificial intelligence to different applications, such as different demand management applications 824 (e.g., a sales management application and a demand prediction application) or different supply chain applications 812 (e.g., a logistics control application and a production quality control application).

In embodiments, hybrid adaptive intelligence systems 614 may be applied as distinct artificial intelligence capabilities to distinct demand management applications 824. As examples, coordinated intelligence through a hybrid artificial intelligence capabilities may be provided to a demand planning application by a feed-forward neural network, to a demand prediction application by a machine learning system, to a sales application by a self-organizing neural network, to a future demand aggregation application by a radial basis function neural network, to a marketing application by a convolutional neural network, to an advertising application by a recurrent neural network, to an e-commerce application by a hierarchical neural network, to a marketing analytics application by a stochastic neural network, to a customer relationship management application by an associative neural network and the like.

Figure 16:
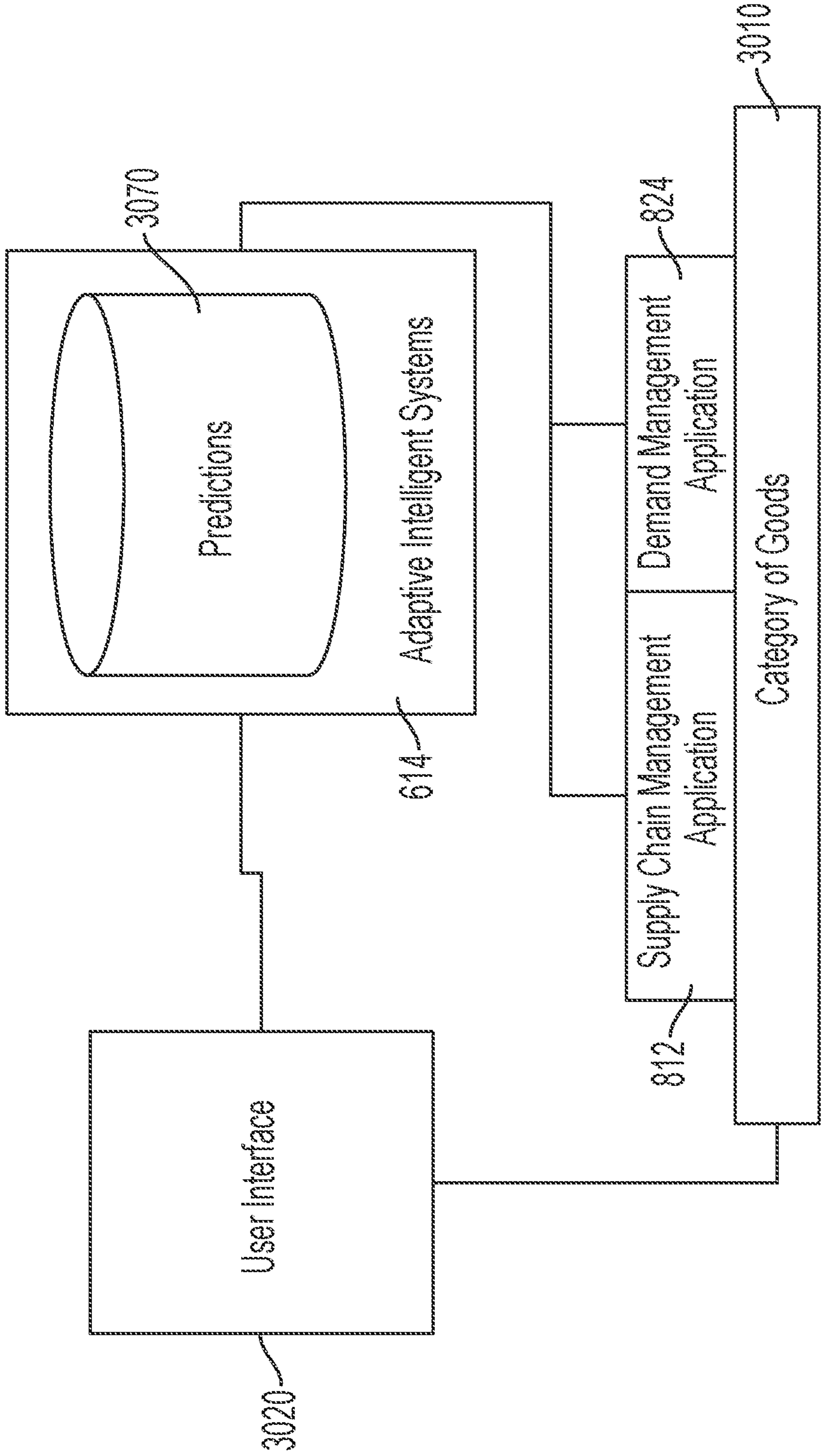
FIG. 16 is a block diagram that depicts providing adaptive intelligence systems for predictive intelligence for sets of demand and supply applications for a category of goods in accordance with the present disclosure.

Referring to FIG. 16, a management platform of an information technology system, such as a management platform for a value chain of goods and/or services is depicted as a block diagram of functional elements and representative interconnections for providing a set of predictions 3070. The management platform includes a user interface 3020 that provides, among other things, a set of adaptive intelligence systems 614. The adaptive intelligence systems 614 provide a set of predictions 3070 through the application of artificial intelligence, such as through application of an artificial intelligence system 1160, and optionally through one or more expert systems, machine learning systems, and the like for use with a coordinated set of demand management applications 824 and supply chain applications 812 for a category of goods 3010, which may be produced and sold through the value chain. The adaptive intelligence systems 614 may deliver the set of prediction 3070 through a set of data processing, artificial intelligence and computational systems 634. In embodiments, the adaptive intelligence systems 614 are selectable and/or configurable through the user interface 3020 so that one or more of the adaptive intelligence systems 614 can operate on or in cooperation with the coordinated sets of value chain applications. The adaptive intelligence systems 614 may include an artificial intelligence system that provides artificial intelligence capabilities known to be associated with artificial intelligence including any of the various expert systems, artificial intelligence systems, neural networks, supervised learning systems, machine learning systems, deep learning systems, and other systems described throughout this disclosure and in the documents incorporated by reference. The adaptive intelligence systems 614 may facilitate applying adapted intelligence capabilities to the coordinated set of demand management applications 824 and supply chain applications 812 such as by producing a set of predictions 3070 that may facilitate coordinating the two sets of value chain applications, or at least facilitate coordinating at least one demand management application and at least one supply chain application from their respective sets.

In embodiments, the set of predictions 3070 includes a least one prediction of an impact on a supply chain application based on a current state of a coordinated demand management application, such as a prediction that a demand for a good will decrease earlier than previously anticipated. The converse may also be true in that the set of predictions 3070 includes at least one prediction of an impact on a demand management application based on a current state of a coordinated supply chain application, such as a prediction that a lack of supply of a good will likely impact a measure of demand of related goods. In embodiments, the set of predictions 3070 is a set of predictions of adjustments in supply required to meet demand. Other predictions include at least one prediction of change in demand that impacts supply. Yet other predictions in the set of predictions predict a change in supply that impacts at least one of the set of demand management applications, such as a promotion application for at least one good in the category of goods. A prediction in the set of predictions may be as simple as setting a likelihood that a supply of a good in the category of goods will not meet demand set by a demand setting application.

In embodiments, the adaptive intelligence systems 614 may provide a set of artificial intelligence capabilities to facilitate providing the set of predictions for the coordinated set of demand management applications and supply chain applications. In one non-limiting example, the set of artificial intelligence capabilities may include a probabilistic neural network that may be used to predict a fault condition or a problem state of a demand management application such as a lack of sufficient validated feedback. The probabilistic neural network may be used to predict a problem state with a machine performing a value chain operation (e.g., a production machine, an automated handling machine, a packaging machine, a shipping machine and the like) based on a collection of machine operating information and preventive maintenance information for the machine.

In embodiments, the set of predictions 3070 may be provided by the management platform 102 directly through a set of adaptive artificial intelligence systems.

In embodiments, the set of predictions 3070 may be provided for the coordinated set of demand management applications and supply chain applications for a category of goods by applying artificial intelligence capabilities for coordinating the set of demand management applications and supply chain applications.

In embodiments, the set of predictions 3070 may be predictions of outcomes for operating a value chain with the coordinated set demand management applications and supply chain applications for the category of goods, so that a user may conduct test cases of coordinated sets of demand management applications and supply chain applications to determine which sets may produce desirable outcomes (viable candidates for a coordinated set of applications) and which may produce undesirable outcomes.

Figure 17:
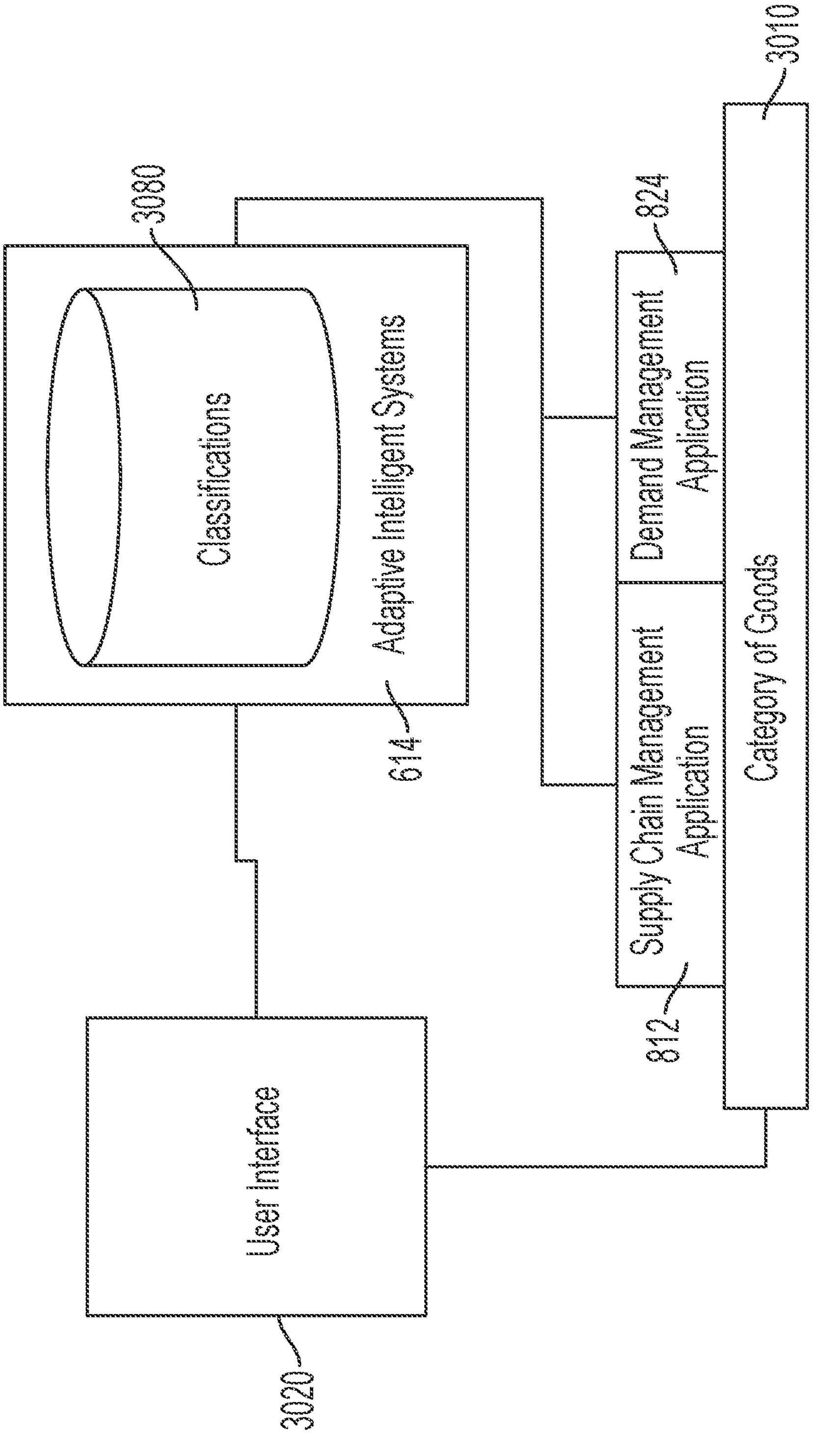
FIG. 17 is a block diagram that depicts providing adaptive intelligence systems for classification intelligence for sets of demand and supply applications for a category of goods in accordance with the present disclosure.

Referring to FIG. 17, a management platform of an information technology system, such as a management platform for a value chain of goods and/or services is depicted as a block diagram of functional elements and representative interconnections for providing a set of classifications 3080. The management platform includes a user interface 3020 that provides, among other things, a set of adaptive intelligence systems 614. The adaptive intelligence systems 614 provide a set of classifications 3080 through, for example, the application of artificial intelligence, such as through application of an artificial intelligence system 1160, and optionally through one or more expert systems, machine learning systems, and the like for use with a coordinated set of demand management applications 824 and supply chain applications 812 for a category of goods 3010, which may be produced, marketed, sold, resold, rented, leased, given away, serviced, recycled, renewed, enhanced, and the like through the value chain. The adaptive intelligence systems 614 may deliver the set of classifications 3080 through a set of data processing, artificial intelligence and computational systems 634. In embodiments, the adaptive intelligence systems 614 are selectable and/or configurable through the user interface 3020 so that one or more of the adaptive intelligence systems 614 can operate on or in cooperation with the coordinated sets of value chain applications. The adaptive intelligence systems 614 may include an artificial intelligence system that provides, among other things classification capabilities through any of the various expert systems, artificial intelligence systems, neural networks, supervised learning systems, machine learning systems, deep learning systems, and other systems described throughout this disclosure and in the documents incorporated by reference. The adaptive intelligence systems 614 may facilitate applying adapted intelligence capabilities to the coordinated set of demand management applications 824 and supply chain applications 812 such as by producing a set of classifications 3080 that may facilitate coordinating the two sets of value chain applications, or at least facilitate coordinating at least one demand management application and at least one supply chain application from their respective sets.

In embodiments, the set of classifications 3080 includes at least one classification of a current state of a supply chain application for use by a coordinated demand management application, such as a classification of a problem state that may impact operation of a demand management application, such as a marketing application and the like. Such a classification may be useful in determining how to adjust a market expectation for a good that is going to have a lower yield than previously anticipated. The converse may also be true in that the set of classifications 3080 includes at least one classification of a current state of a demand management application and its relationship to a coordinated supply chain application. In embodiments, the set of classifications 3080 is a set of classifications of adjustments in supply required to meet demand, such as adjustments to production worker needs would be classified differently that adjustments in third-party logistics providers. Other classifications may include at least one classification of perceived changes in demand and a resulting potential impact on supply management. Yet other classifications in the set of classifications may include a supply chain application impact on at least one of the set of demand management applications, such as a promotion application for at least one good in the category of goods. A classification in the set of classifications may be as simple as classifying a likelihood that a supply of a good in the category of goods will not meet demand set by a demand setting application.

In embodiments, the adaptive intelligence systems 614 may provide a set of artificial intelligence capabilities to facilitate providing the set of classifications 3080 for the coordinated set of demand management applications and supply chain applications. In one non-limiting example, the set of artificial intelligence capabilities may include a probabilistic neural network that may be used to classify fault conditions or problem states of a demand management application, such as a classification of a lack of sufficient validated feedback. The probabilistic neural network may be used to classify a problem state of a machine performing a value chain operation (e.g., a production machine, an automated handling machine, a packaging machine, a shipping machine and the like) as pertaining to at least one of machine operating information and preventive maintenance information for the machine.

In embodiments, the set of classifications 3080 may be provided by the management platform 102 directly through a set of adaptive artificial intelligence systems. Further, the set of classifications 3080 may be provided for the coordinated set of demand management applications and supply chain applications for a category of goods by applying artificial intelligence capabilities for coordinating the set of demand management applications and supply chain applications.

In embodiments, the set of classifications 3080 may be classifications of outcomes for operating a value chain with the coordinated set demand management applications and supply chain applications for the category of goods, so that a user may conduct test cases of coordinated sets of demand management applications and supply chain applications to determine which sets may produce outcomes that are classified as desirable (e.g., viable candidates for a coordinated set of applications) and outcomes that are classified as undesirable.

In embodiments, the set of classifications may comprise a set of adaptive intelligence functions, such as a neural network that may be adapted to classify information associated with the category of goods. In an example, the neural network may be a multilayered feed forward neural network.

In embodiments, performing classifications may include classifying discovered value chain entities as one of demand centric and supply centric.

In embodiments, the set of classifications 3080 may be achieved through use of artificial intelligence systems 1160 for coordinating the set of coordinated demand management and supply chain applications. Artificial intelligence systems may configure and generate sets of classifications 3080 as a means by which demand management applications and supply chain applications can be coordinated. In an example, classification of information flow throughout a value chain may be classified as being relevant to both a demand management application and a supply chain application; this common relevance may be a point of coordination among the applications. In embodiments, the set of classifications may be artificial intelligence generated classifications of outcomes of operating a supply chain that is dependent on the coordinated demand management applications 824 and supply chain applications 812.

Figure 18:
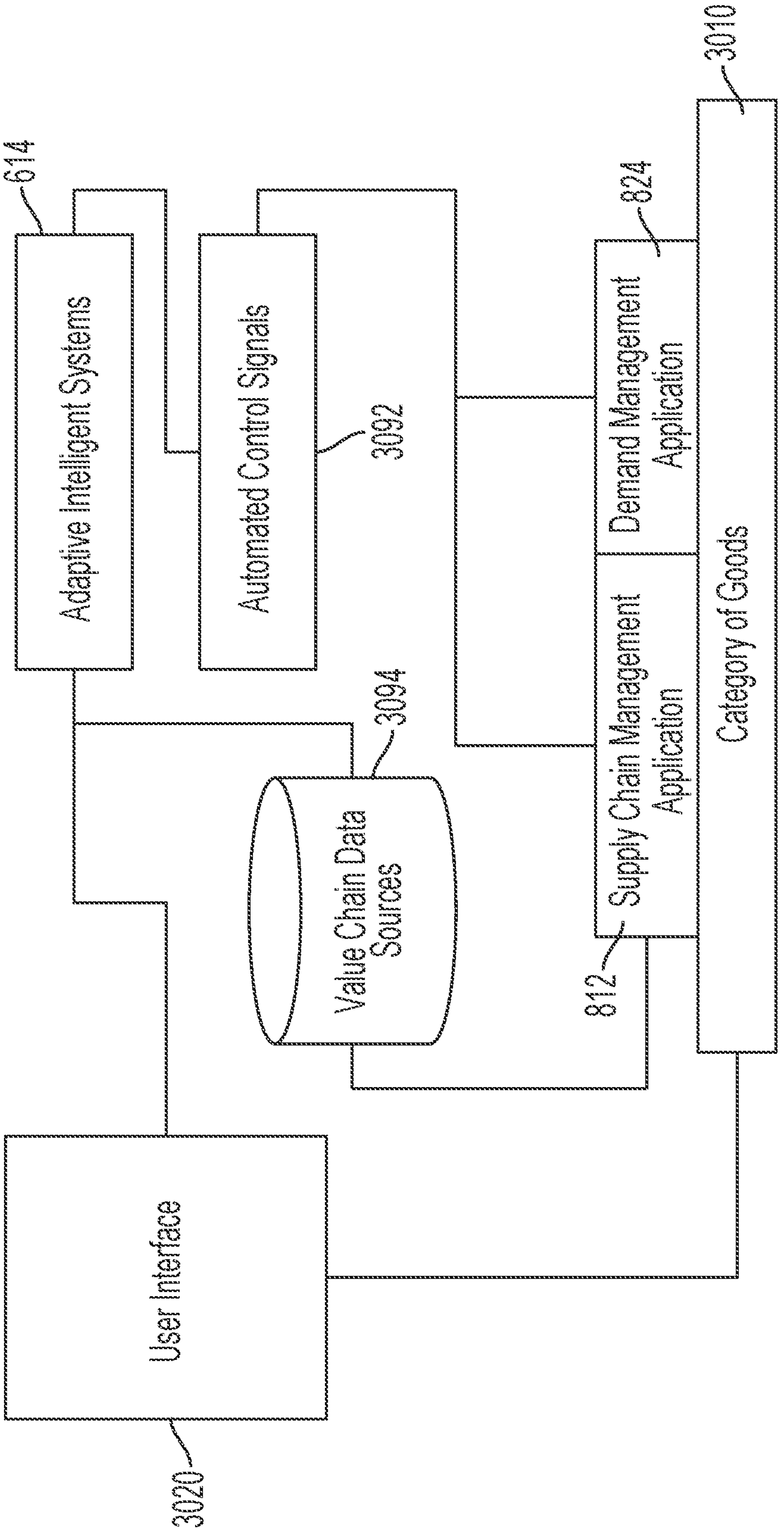
FIG. 18 is a block diagram that depicts providing adaptive intelligence systems to produce automated control signals for sets of demand and supply applications for a category of goods in accordance with the present disclosure.

Referring to FIG. 18, a management platform of an information technology system, such as a management platform for a value chain of goods and/or services is depicted as a block diagram of functional elements and representative interconnections for achieving automated control intelligence. The management platform includes a user interface 3020 that provides, among other things, a set of adaptive intelligence systems 614. The adaptive intelligence systems 614 provide automated control signaling 3092 for a coordinated set of demand management applications 824 and supply chain applications 812 for a category of goods 3010, which may be produced and sold through the value chain. The adaptive intelligence systems 614 may deliver the automated control signals 3092 through a set of data processing, artificial intelligence and computational systems 634. In embodiments, the adaptive intelligence systems 614 are selectable and/or configurable through the user interface 3020 so that one or more of the adaptive intelligence systems 614 can automatically control the sets of supply chain applications (e.g., demand management applications 824 and supply chain applications 812). The adaptive intelligence systems 614 may include artificial intelligence including any of the various expert systems, artificial intelligence systems, neural networks, supervised learning systems, machine learning systems, deep learning systems, and other systems described throughout this disclosure and in the documents incorporated by reference.

In embodiments, the user interface 3020 may include interfaces for configuring an adaptive intelligence systems 614 to take inputs from selected data sources of the value chain 3094 (such as data sources used by the coordinated set of demand management applications 824 and/or the set of supply chain applications 812) and supply them, such as to a neural network, artificial intelligence system 1160 or any of the other adaptive intelligence systems 614 described throughout this disclosure and in the documents incorporated herein by reference for producing automated control signals 3092, such as to enhance, control, improve, optimize, configure, adapt or have another impact on a value chain for the category of goods 3010. In embodiments, the selected data sources of the value chain may be used for determining aspects of the automated control signals, such as for temporal adjustments to control outcomes relating to the value chain at least for the category of goods 3010 and the like.

In an example, the set of automated control signals may include at least one control signal for automating execution of a supply chain application, such as a production start, an automated material order, an inventory check, a billing application and the like in the coordinated set of demand management applications and supply chain applications. In yet another example of automated control signal generation, the set of automated control signals may include at least one control signal for automating execution of a demand management application, such as a product recall application, an email distribution application and the like in the coordinated set of demand management applications and supply chain applications. In yet other examples, the automate control signals may control timing of demand management applications based on goods supply status.

In embodiments, the adaptive intelligence systems 614 may apply machine learning to outcomes of supply to automatically adapt a set of demand management application control signals. Similarly, the adaptive intelligence systems 614 may apply machine learning to outcomes of demand management to automatically adapt a set of supply chain application control signals. The adaptive intelligence systems 614 may provide further processing for automated control signal generation, such as by applying artificial intelligence to determine aspects of a value chain that impact automated control of the coordinated set of demand management applications and supply chain applications for a category of goods. The determined aspects could be used in the generation and operation of automated control intelligence/signals, such as by filtering out value chain information for aspects that do not impact the targeted demand management and supply chain applications.

Automated control of, for example, supply chain applications may be restricted, such as by policy, operational limits, safety constraints and the like. The set of adaptive intelligence systems may determine a range of supply chain application control values within which control can be automated. In embodiments, the range may be associated with a supply rate, a supply timing rate, a mix of goods in a category of goods, and the like.

Embodiments are described herein for using artificial intelligence systems or capabilities to identify, configure and regulate automated control signals. Such embodiments may further include a closed loop of feedback from the coordinated set of demand management and supply chain applications (e.g., state information, output information, outcomes and the like) that is optionally processed with machine learning and used to adapt the automated control signals for at least one of the goods in the category of goods. An automated control signal may be adapted based on, for example, an indication of feedback from a supply chain application that yield of a good suggests a production problem. In this example, the automated control signal may impact production rate and the feedback may cause the signal to automatically self-adjust to a slower production rate until the production problem is resolved.

Figure 19:
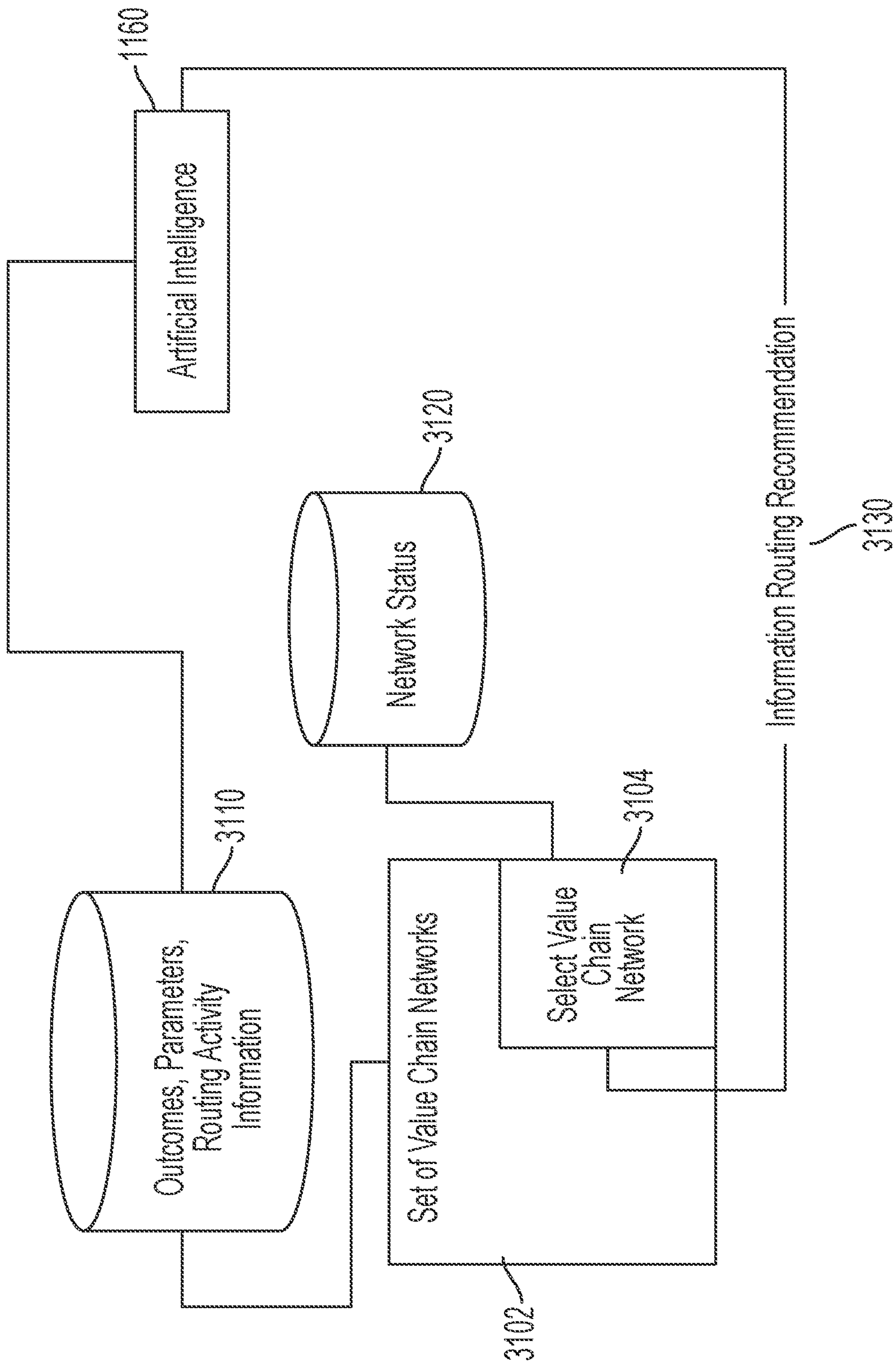
FIG. 19 is a block diagram that depicts training artificial intelligence/machine learning systems to produce information routing recommendations for a selected value chain network in accordance with the present disclosure.

Referring to FIG. 19, a management platform of an information technology system, such as a management platform for a value chain of goods and/or services is depicted as a block diagram of functional elements and representative interconnections for providing information routing recommendations. The management platform includes a set of value chain networks 3102 from which network data 3110 is collected from a set of information routing activities, the information including outcomes, parameters, routing activity information and the like. Within the set of value chain networks 3102 is selected a select value chain network 3104 for which at least one information routing recommendation 3130 is provided. An artificial intelligence system 1160 may include a machine learning system and may be trained using a training set derived from the network data 3110 outcomes, parameters and routing activity information for the set of value chain networks 3102. The artificial intelligence system 1160 may further provide an information routing recommendation 3130 based on a current status 3120 of the select value chain network 3104. The artificial intelligence system may use machine learning to train on information transaction types within the set of value chain networks 3102, thereby learning pertinent factors regarding different transaction types (e.g., real-time inventory updates, buyer credit checks, engineering signoff, and the like) and contributing to the information routing recommendation accordingly. The artificial intelligence system may also use machine learning to train on information value for different types and/or classes of information routed in and throughout the set of value chain networks 3102. Information may be valued on a wide range of factors, including timing of information availability and timing of information consumption as well as information content-based value, such as information without which a value chain network element (e.g., a production provider) cannot perform a desired action (e.g., starting volume production without a work order). Therefore information routing recommendations may be based on training on transaction type, information value, and a combination thereof. These are merely exemplary information routing recommendation training and recommendation basis factors and are presented here without limitation on other elements for training and recommendation basis.

In embodiments, the artificial intelligence system 1160 may provide an information routing recommendation 3130 based on transaction type, transaction type and information type, network type and the like. An information routing recommendation may be based on combinations of factors, such as information type and network type, such as when an information type (streaming) is not compatible with a network type (small transactions).

In embodiments, the artificial intelligence system 1160 may use machine learning to develop an understanding of networks within the selected value chain network 3104, such as network topology, network loading, network reliability, network latency and the like. This understanding may be combined with, for example, detected or anticipated network conditions to form an information routing recommendation. Aspects such as existence of edge intelligence in a value chain network 3104 can influence one or more information routing recommendations. In an example, a type of information may be incompatible with a network type; however the network may be configured with edge intelligence that can be leveraged by the artificial intelligence system 1160 to adapt the form of the information being routed so that it is compatible with a targeted network type. This is also an example of more general consideration for information routing recommendation—network resources (e.g., presence, availability, and capability), such as edge computing, server access, network-based storage resources and the like. Likewise, value chain network entities may impact information routing recommendations. In embodiments, an information routing recommendation may avoid routing information that is confidential to a first supplier in the value chain through network nodes controlled by competitors of the supplier. In embodiments, an information routing recommendation may include routing information to a first node where it is partially consumed and partially processed for further routing, such as by splitting up the portion partially processed for further routing into destination-specific information sets.

In embodiments, an artificial intelligence system 1160 may provide an information routing recommendation based on goals, such as goals of a value chain network, goals of information routing, and the like. Goal-based information routing recommendations may include routing goals, such as Quality of Service routing goals, routing reliability goals (which may be measured based on a transmission failure rate and the like). Other goals may include a measure of latency associated with one or more candidate routes. An information routing recommendation may be based on the availability of information in a selected value chain network, such as when information is available and when it needs to be delivered. For information that is available well ahead of when it is needed (e.g., a nightly production report that is available for routing at 2 AM is first needed by 7 AM), routing recommendations may include using resources that are lower cost, may involve short delays in routing and the like. For information that is available just before it is needed (e.g., a result of product testing is needed within a few hundred milliseconds of when the test is finished to maintain a production operation rate, and the like).

An information routing recommendation may be formed by the artificial intelligence system 1160 based on information persistence factors, such as how long information is available for immediate routing within the value chain network. An information routing recommendation that factors information persistence may select network resources based on availability, cost and the like during a time of information persistence.

Information value and an impact on information value may factor into an information routing recommendation. As an example, information that is valid for a single shipment (e.g., a production run of a good) may substantively lose value once the shipment has been satisfactorily received. In such an example, an information routing recommendation may indicate routing the relevant information to all of the highest priority consumers of the information while it is still valid. Likewise, routing of information that is consumed by more than one value chain entity may need to be coordinated so that each value chain entity receives the information at a desired time/moment, such as during the same production shift, at their start of day, which may be different if the entities are in different time zones, and the like.

In embodiments, information routing recommendations may be based on a topology of a value chain, based on location and availability of network storage resources, and the like.

In embodiments, one or more information routing recommendations may be adapted while the information is routed based on, for example, changes in network resource availability, network resource discovery, network dynamic loading, priority of recommendations that are generated after information for a first recommendation is in-route, and the like.

Figure 20:
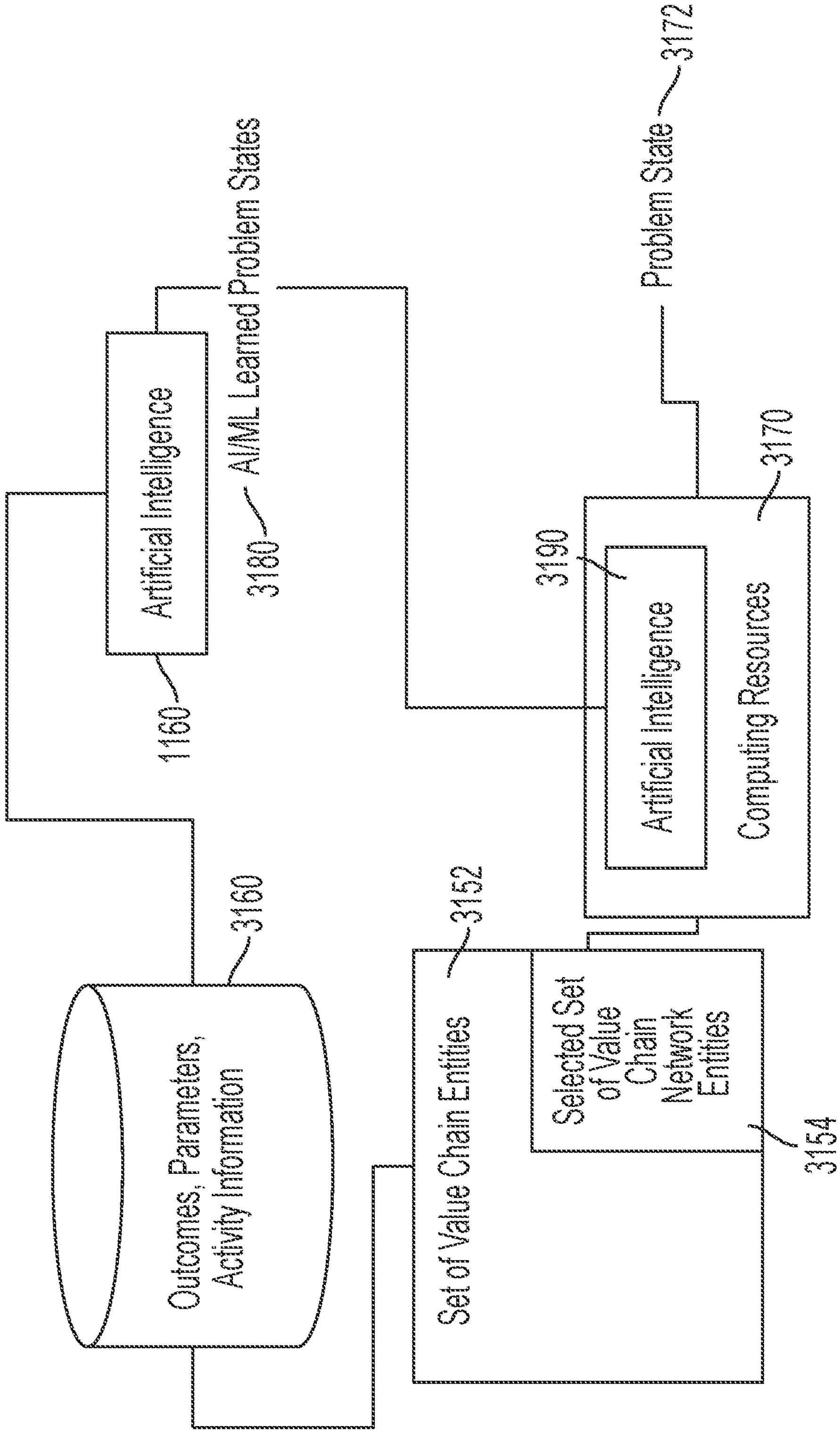
FIG. 20 is a block diagram that depicts a semi-sentient problem recognition system for recognition of pain points/problem states in a value chain network in accordance with the present disclosure.

Referring to FIG. 20, a management platform of an information technology system, such as a management platform for a value chain of goods and/or services is depicted as a block diagram of functional elements and representative interconnections for semi-sentient problem recognitions of pain points in a value chain network. The management platform includes a set of value chain network entities 3152 from which entity-related data 3160 is collected and includes outcomes, parameters, activity information and the like associated with the entities. Within the set of value chain network entities 3152 is selected a set of select value chain network entities 3154 for which at least one pain point problem state 3172 is detected. An artificial intelligence system 1160 may be training on a training set derived from the entity-related data 3160 including training on outcomes associated with value chain entities, parameters associated with, for example, operation of the value chain, value chain activity information and the like. The artificial intelligence system may further employ machine learning to facilitate learning problem state factors 3180 that may characterize problem states input as training data. These factors 3180 may further be used by an instance of artificial intelligence 1160' that operates on computing resources 3170 that are local to value chain network entities that are experiencing the problem/result of a pain point. A goal of such a configuration of artificial intelligence systems, data sets, and value chain networks is to recognize a problem state in a portion of the selected value chain.

In embodiments, recognizing problem states may be based on variance analysis, such as variances that occur in value chain measures (e.g., loading, latency, delivery time, cost, and the like), particularly in a specific measure over time. Variances that exceed a variance threshold (e.g., an optionally dynamic range of results of a value chain operation, such as production, shipping, clearing customs, and the like) may be indicative of a pain point.

In addition to detecting problem states, the platform 102, such as through the methods of semi-sentient problem recognition, predict a pain point based at least in part on a correlation with a detected problem state. The correlation may be derived from the value chain, such as a shipper cannot deliver international goods until they are processed through customs, or a sales forecast cannot be provided with a high degree of confidence without high quality field data and the like. In embodiments, a predicted pain point may be a point of value chain activity further along a supply chain, an activity that occurs in a related activity (e.g., tax planning is related to tax laws), and the like. A predicted pain point may be assigned a risk value based on aspects of the detected problem state and correlations between the predicted pain point activity and the problem state activity. If a production operation can receive materials from two suppliers, a problem state with one of the suppliers may indicate a low risk of a pain point of use of the material. Likewise, if a demand management application indicates high demand for a good and a problem is detected with information on which the demand is based, a risk of excess inventory (pain point) may be high depending on, for example how far along in the value chain the good has progressed.

In embodiments, semi-sentient problem recognition may involve more than mere linkages of data and operational states of entities engaged in a value chain. Problem recognition may also be based on human factors, such as perceived stress of production supervisors, shippers, and the like. Human factors for use in semi-sentient problem recognition may be collected from sensors that facilitate detection of human stress level and the like (e.g., wearable physiological sensors, and the like).

In embodiments, semi-sentient problem recognition may also be based on unstructured information, such as digital communication, voice messaging, and the like that may be shared among, originate with, or be received by humans involved in the value chain operations. As an example, natural language processing of email communications among workers in an enterprise may indicate a degree of discomfort with, for example, a supplier to a value chain. While data associated with the supplier (e.g., on-time production, quality, and the like) may be within a variance range deemed acceptable, information within this unstructured content may indicate a potential pain point, such as a personal issue with a key participant at the supplier and the like. By employing natural language processing, artificial intelligence, and optionally machine learning, problem state recognition may be enhanced.

In embodiments, semi-sentient problem recognition may be based on analysis of variances of measures of a value chain operation/entity/application including variance of a given measure over time, variance of two related measures, and the like. In embodiments, variance in outcomes over time may indicate a problem state and/or suggest a pain point. In embodiments, an artificial intelligence-based system may determine an acceptable range of outcome variance and apply that range to measures of a select set of value chain network entities, such as entities that share one or more similarities, to facilitate detection of a problem state. In embodiments, an acceptable range of outcome variance may indicate a problem state trigger threshold that may be used by a local instance of artificial intelligence to signal a problem state. In such a scenario, a problem state may be detected when at least one measure of the value chain activity/entity and the like is greater than the artificial intelligence-determined problem state threshold. Variance analysis for problem state detection may include detecting variances in start/end times of scheduled value chain network entity activities, variances in at least one of production time, production quality, production rate, production start time, production resource availability or trends thereof, variances in a measure of shipping supply chain entity, variances in a duration of time for transfer from one mode of transport to another (e.g., when the variance is greater than a transport mode problem state threshold), variances in quality testing, and the like.

In embodiments, a semi-sentient problem recognition system may include a machine learning/artificial intelligence prediction of a correlated pain point further along a supply chain due to a detected pain point, such as a risk and/or need for overtime, expedited shipping, discounting goods prices, and the like.

In embodiments, a machine learning/artificial intelligence system may process outcomes, parameters, and data collected from a set of data sources relating to a set of value chain entities and activities to detect at least one pain point selected from the list of pain points consisting of late shipment, damaged container, damaged goods, wrong goods, customs delay, unpaid duties, weather event, damaged infrastructure, blocked waterway, incompatible infrastructure, congested port, congested handling infrastructure, congested roadway, congested distribution center, rejected goods, returned goods, waste material, wasted energy, wasted labor force, untrained workforce, poor customer service, empty transport vehicle on return route, excessive fuel prices, excessive tariffs, and the like.

Figure 21:
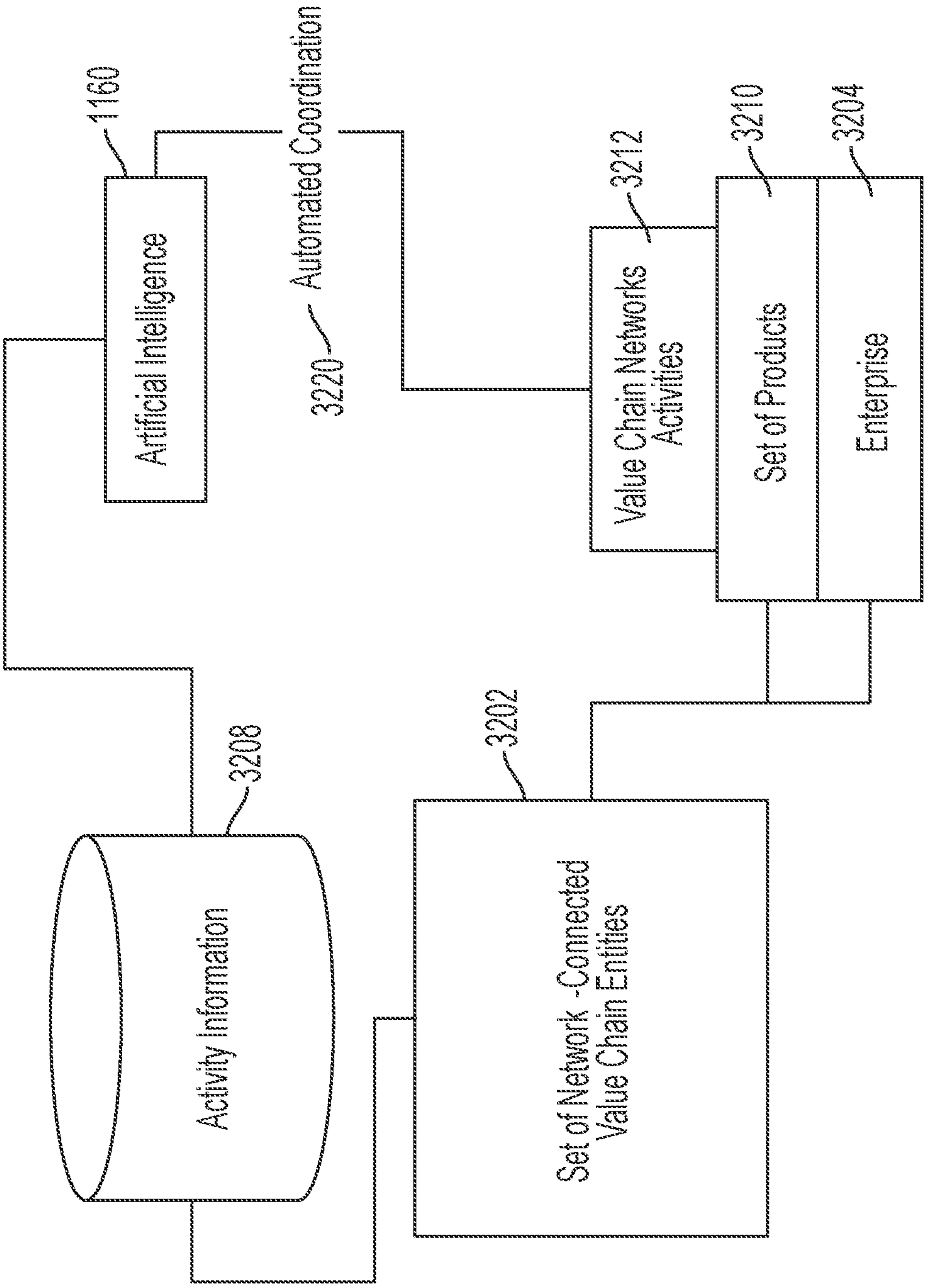
FIG. 21 is a block diagram that depicts a set of artificial intelligence systems operating on value chain information to enable automated coordination of value chain activities for an enterprise in accordance with the present disclosure.

Referring to FIG. 21, a management platform of an information technology system, such as a management platform for a value chain of goods and/or services is depicted as a block diagram of functional elements and representative interconnections automated coordination of a set of value chain network activities for a set of products of an enterprise. The management platform includes a set of network-connected value chain network entities 3202 that produce activity information 3208 that is used by an artificial intelligence system 1160 to provide automate coordination 3220 of value chain network activities 3212 for a set of products 3210 for an enterprise 3204. In embodiments, value chain monitoring systems 614 may monitor activities of the set of network-connected value chain entities 3202 and work cooperatively with data collection and management systems 640 to gather and store value chain entity monitored information, such as activity information, configuration information, and the like. This gathered information may be configured as activity information 3208 for a set of activities associated with a set of products 3210 of an enterprise 3204. In embodiments, the artificial intelligence systems 1160 may use application programming connectivity facilities 642 for automating access to the monitored activity information 3208.

A value chain may include a plurality of interconnected entities that each perform several activities for completing the value chain. While humans play a critical role in some activities within a value chain network, greater automated coordination and unified orchestration of supply and demand may be achieved using artificial intelligence-type systems (e.g., machine learning, expert systems, self-organizing systems, and the like including such systems describe herein and in the documents incorporated herein by reference) for coordinating supply chain activities. Use of artificial intelligence may further enrich the emerging nature of self-adapting systems, including Internet of Things (IoT) devices and intelligent products and the like that not only provide greater capabilities to end users, but can play a critical role in automated coordination of supply chain activities.

For example, an IoT system deployed in a fulfillment center 628 may coordinate with an intelligent product 650 that takes customer feedback about the product 650, and an application 630 for the fulfillment center 628 may, upon receiving customer feedback via a connection path to the intelligent product 650 about a problem with the product 650, initiate a workflow to perform corrective actions on similar products 650 before the products 650 are sent out from the fulfillment center 628. The workflow may be configured by an artificial intelligence system 1160 that analyzes the problem with the product 650, develops an understanding of value chain network activities that produce the product, determines resources required for the workflow, coordinates with inventory and production systems to adapt any existing workflows and the like. Artificial intelligence systems 1160 may further coordinate with demand management applications to address any temporary impact on product availability and the like.

In embodiments, automated coordination of a set of value chain network activities for a set of products for an enterprise may rely on the methods and systems of coordinated intelligence described herein, such as to facilitate coordinating demand management activities, supply chain activities and the like, optionally using artificial intelligence for providing the coordinated intelligence, coordinating the activities and the like. As an example, artificial intelligence may facilitate determining relationships among value change network activities based on inputs used by the activities and results produced by the activities. Artificial intelligence may be integrated with and/or work cooperatively with activities of the platform, such as value chain network entity activities to continuously monitor activities, identify temporal aspects needing coordination (e.g., when changes in supply temporally impact demand activities), and automate such coordination. Automated coordination of value chain network activities within and across value chain network entity activities may benefit from advanced artificial intelligence systems that may enable use of differing artificial intelligence capabilities for any given value chain set of entities, applications, or conditions. Use of hybrid artificial intelligence systems may provide benefits by applying more than one type of intelligence to a set of conditions to facilitate human and/or computer automated selection thereof. Artificial intelligence can further enhance automated coordination of value chain network entity activities through intelligent operations such as generating sets of predictions, sets of classifications, generation of automate control signals (that may be communicated across value chain network entities and the like). Other exemplary artificial intelligence-based influences on automated coordination of value chain network entity activities include machine learning-based information routing and recommendations thereto, semi-sentient problem recognition based on both structured (e.g., production data) and unstructured (e.g., human emotions) sources, and the like. Artificial intelligence systems may facilitate automated coordination of value chain network entity activities for a set of products or an enterprise based on adaptive intelligence provided by the platform for a category of goods under which the set of products of an enterprise may be grouped. In an example, adaptive intelligence may be provided by the platform for a drapery hanging category of goods and a set of products for an enterprise may include a line of adaptable drapery hangers. Through understanding developed for the overall drapery hanging category, artificial intelligence capabilities may be applied to value chain network activities of the enterprise for automating aspects of the value chain, such as information exchange among activities and the like.

Digital Twin System in Value Chain Entity Management Platform

Figure 22:
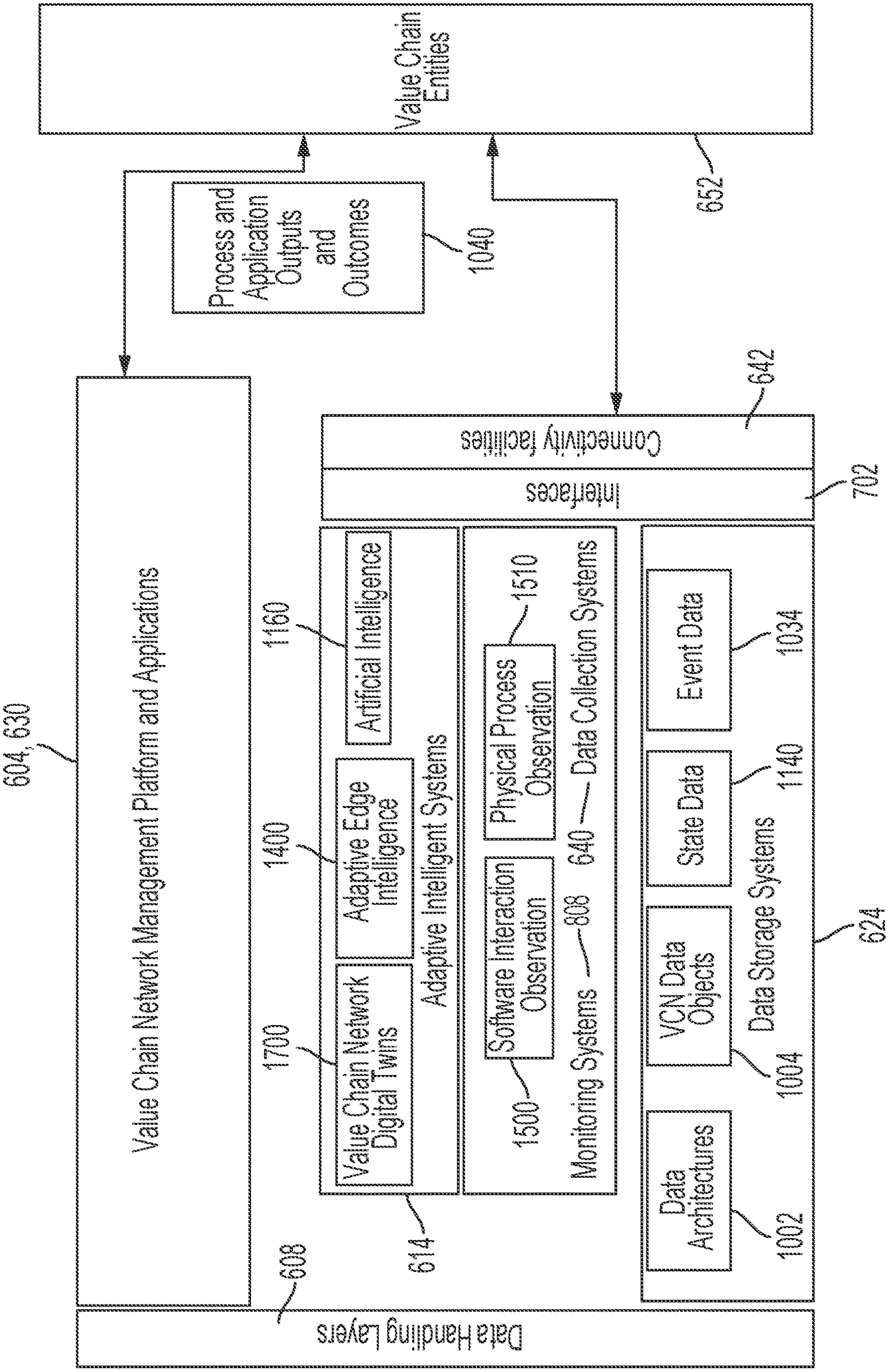
FIG. 22 is a block diagram showing components and relationships involved in integrating a set of digital twins in an embodiment of a value chain network management platform in accordance with the present disclosure.

Referring to FIG. 22, the adaptive intelligence layer 614 may include a value chain network digital twin system 1700, which may include a set of components, processes, services, interfaces and other elements for development and deployment of digital twin capabilities for visualization of various value chain entities 652, environments, and applications 630, as well as for coordinated intelligence (including artificial intelligence 1160, edge intelligence 1400, analytics and other capabilities) and other value-added services and capabilities that are enabled or facilitated with a digital twin 1700. Without limitation, a digital twin 1700 may be used for and/or applied to each of the processes that are managed, controlled, or mediated by each of the set of applications 630 of the platform application layer.

In embodiments, the digital twin 1700 may take advantage of the presence of multiple applications 630 within the value chain management platform layer 604, such that a pair of applications may share data sources (such as in the data storage layer 624) and other inputs (such as from the monitoring layer 614) that are collected with respect to value chain entities 652, as well as sharing outputs, events, state information and outputs, which collectively may provide a much richer environment for enriching content in a digital twin 1700, including through use of artificial intelligence 1160 (including any of the various expert systems, artificial intelligence systems, neural networks, supervised learning systems, machine learning systems, deep learning systems, and other systems described throughout this disclosure and in the documents incorporated by reference) and through use of content collected by the monitoring layer 614 and data collection systems 640.

In embodiments, a digital twin 1700 may be used in connection with shared or converged processes among the various pairs of the applications 630 of the application layer 604, such as, without limitation, of a converged process involving a security application 834 and an inventory management application 820, integrated automation of blockchain-based applications 844 with facility management applications 850, and many others. In embodiments, converged processes may include shared data structures for multiple applications 630 (including ones that track the same transactions on a blockchain but may consume different subsets of available attributes of the data objects maintained in the blockchain or ones that use a set of nodes and links in a common knowledge graph) that may be connected to with the digital twin 1700 such that the digital twin 1700 is updated accordingly. For example, a transaction indicating a change of ownership of an entity 652 may be stored in a blockchain and used by multiple applications 630, such as to enable role-based access control, role-based permissions for remote control, identity-based event reporting, and the like that may be connected to and shared with the digital twin 1700 such that the digital twin 1700 may be updated accordingly. In embodiments, converged processes may include shared process flows across applications 630, including subsets of larger flows that are involved in one or more of a set of applications 630 that may be connected to and shared with the digital twin 1700 such that the digital twin 1700 may be updated accordingly. For example, an inspection flow about a value chain network entity 652 may serve an analytics solution 838, an asset management solution 814, and others.

In embodiments, a digital twin 1700 may be provided for the wide range of value chain network applications 630 mentioned throughout this disclosure and the documents incorporated herein by reference. An environment for development of a digital twin 1700 may include a set of interfaces for developers in which a developer may configure an artificial intelligence system 1160 to take inputs from selected data sources of the data storage layer 624 and events or other data from the monitoring systems layer 614 and supply them for inclusion in a digital twin 1700. A digital twin 1700 development environment may be configured to take outputs and outcomes from various applications 630.

Value Chain Network Digital Twins

Figure 23:
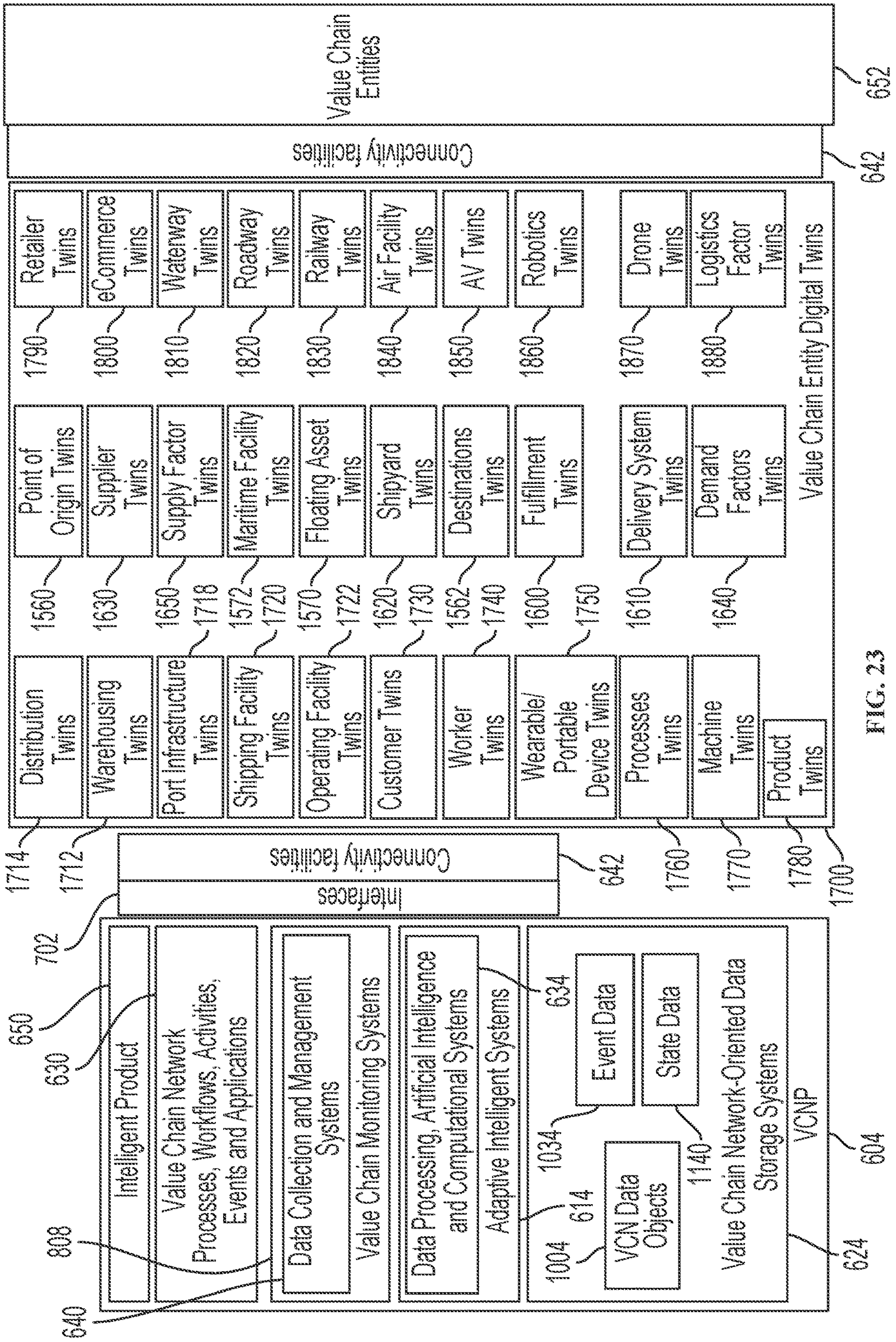
FIG. 23 is a block diagram showing a set of digital twins involved in embodiments of a value chain network management platform in accordance with the present disclosure.

Referring to FIG. 23, any of the value chain network entities 652 can be depicted in a set of one or more digital twins 1700, such as by populating the digital twin 1700 with value chain network data object 1004, such as event data 1034, state data 1140, or other data with respect to value chain network entities 652, applications 630, or components or elements of the platform 604 as described throughout this disclosure.

Thus, the platform 604 may include, integrate, integrate with, manage, control, coordinate with, or otherwise handle any of a wide variety of digital twins 1700, such as distribution twins 1714 (such as representing distribution facilities, assets, objects, workers, or the like); warehousing twins 1712 (such as representing warehouse facilities, assets, objects, workers and the like); port infrastructure twins 1714 (such as representing a seaport, an airport, or other facility, as well as assets, objects, workers and the like); shipping facility twins 1720; operating facility twins 1722; customer twins 1730 (such as representing physical, behavioral, demographic, psychographic, financial, historical, affinity, interest, and other characteristics of groups of customers or individual customers); worker twins 1740 (such as representing physical attributes, physiologic data, status data, psychographic information, emotional states, states of fatigue/energy, states of attention, skills, training, competencies, roles, authority, responsibilities, work status, activities, and other attributes of or involving workers); wearable/portable device twins 1750; process twins 1760; machine twins 1770 (such as for various machines used to support a value chain network 668); product twins 1780; point of origin twins 1560; supplier twins 1630; supply factor twins 1650; maritime facility twins 1572; floating asset twins 1570; shipyard twins 1620; destination twins 1562; fulfillment twins 1600; delivery system twins 1610; demand factor twins 1640; retailer twins 1790; ecommerce and online site and operator twins 1800; waterway twins 1810; roadway twins 1820; railway twins 1830; air facility twins 1840 (such as twins of aircraft, runways, airports, hangars, warehouses, air travel routes, refueling facilities and other assets, objects, workers and the like used in connection with air transport of products 650); autonomous vehicle twins 1850; robotics twins 1860; drone twins 1870; and logistics factor twins 1880; among others. Each of these may have characteristics of digital twins described throughout this disclosure and the documents incorporated by reference herein, such as mirroring or reflecting changes in states of associated physical objects or other entities, providing capabilities for modeling behavior or interactions of associated physical objects or other entities, enabling simulations, providing indications of status, and many others.

In example embodiments, a digital twin system may be configured to generate a variety of enterprise digital twins 1700 in connection with a value chain (e.g., specifically value chain network entities 652). For example, an enterprise that produces goods internationally (or at multiple facilities) may configure a set of digital twins 1700, such as supplier twins that depict the enterprise's supply chain, factory twins of the various production facilities, product twins that represent the products made by the enterprise, distribution twins that represent the enterprise's distribution chains, and other suitable twins. In doing so, the enterprise may define the structural elements of each respective digital twin as well as any system data that corresponds to the structural elements of the digital twin. For instance, in generating a production facility twin, the enterprise may the layout and spatial definitions of the facility and any processes that are performed in the facility. The enterprise may also define data sources corresponding to the value chain network entities 652, such as sensor systems, smart manufacturing equipment, inventory systems, logistics systems, and the like that provide data relevant to the facility. The enterprise may associate the data sources with elements of the production facility and/or the processes occurring the facility. Similarly, the enterprise may define the structural, process, and layout definitions of its supply chain and its distribution chain and may connect relevant data sources, such as supplier databases, logistics platforms, to generate respective distribution chain and supply chain twins. The enterprise may further associate these digital twins to have a view of its value chain. In embodiments, the digital twin system may perform simulations of the enterprise's value chain that incorporate real-time data obtained from the various value chain network entities 652 of the enterprise. In some of these embodiments, the digital twin system may recommend decisions to a user interacting with the enterprise digital twins 1700, such as when to order certain parts for manufacturing a certain product given a predicted demand for the manufactured product, when to schedule maintenance on machinery and/or replace machinery (e.g., when digital simulations on the digital twin indicates the demand for certain products may be the lowest or when it would have the least effect on the enterprise's profits and losses statement), what time of day to ship items, or the like. The foregoing example is a non-limiting example of the manner by which a digital twin may ingest system data and perform simulations in order to further one or more goals.

Entity Discovery and Interaction Management

Figure 24:
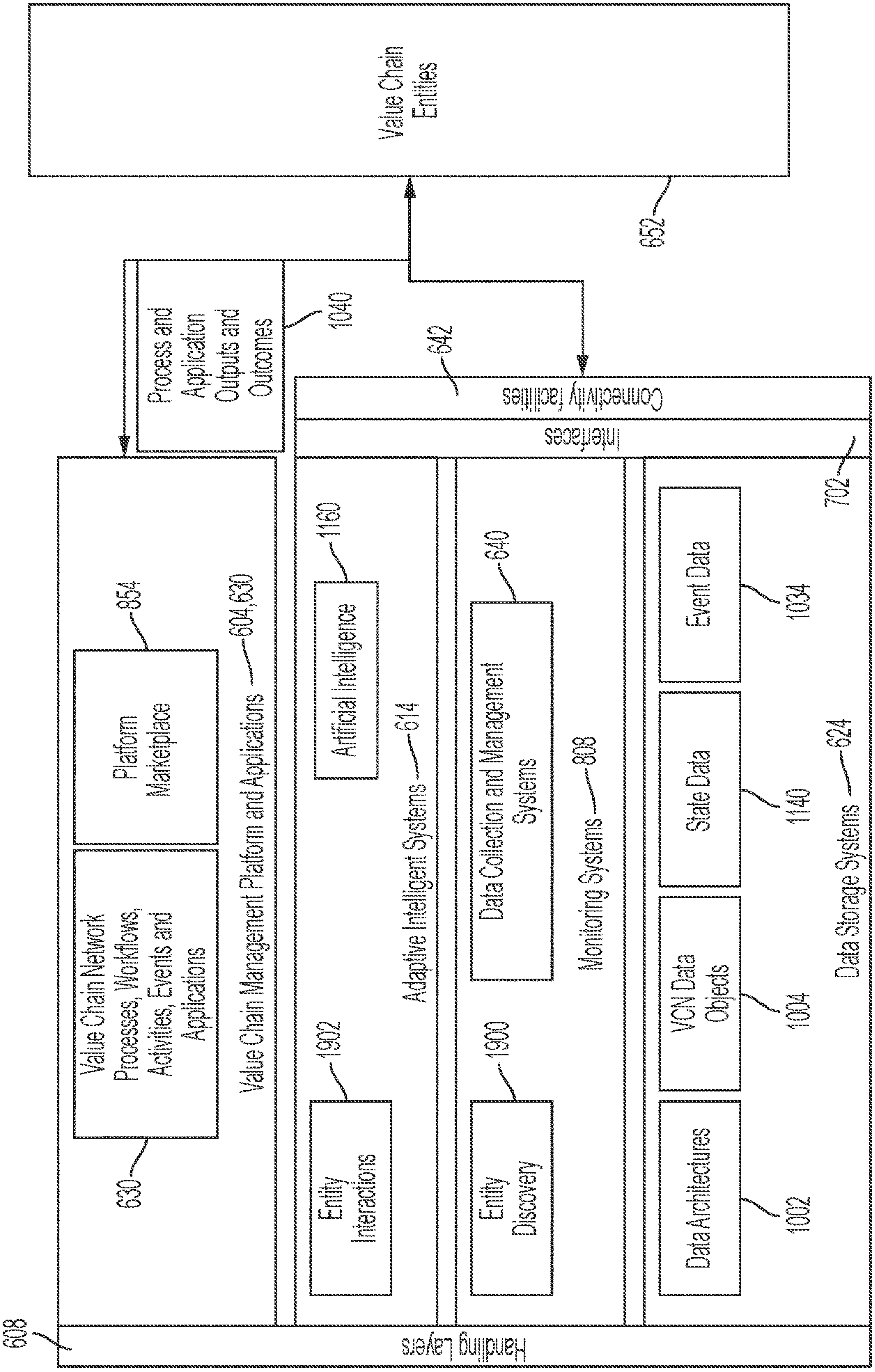
FIG. 24 is a block diagram showing components and relationships of entity discovery and management systems in embodiments of a value chain network management platform in accordance with the present disclosure.

Referring to FIG. 24, the monitoring systems layer 614, including various data collection systems 640 (such as IoT data collection systems, data collection systems that search social networks, websites, and other online resources, crowdsourcing systems, and others) may include a set of entity discovery systems 1900, such as for identifying sets of value chain network entities 652, identifying types of value chain network entities 652, identifying specific value chain network entities 652 and the like, as well as for managing identities of the value chain network entities 652, including for resolving ambiguities (such as where a single entity is identified differently in different systems, where different entities are identified similarly, and the like), for entity identity deduplication, for entity identity resolution, for entity identity enhancement (such as by enriching data objects with additional data that is collected about an entity within the platform), and the like. Entity discovery 1900 may also include discovery of interactions among entities, such as how entities are connected (e.g., by what network connections, data integration systems, and/or interfaces), what data is exchanged among entities (including what types of data objects are exchanged, what common workflows involve entities, what inputs and outputs are exchanged between entities, and the like), what rules or policies govern the entities, and the like. The platform 604 may include a set of entity interaction management systems 1902, which may comprise one or more artificial intelligence systems (including any of the types described throughout this disclosure) for managing a set of interactions among entities that are discovered through entity discovery 1900, including ones that learn on a training set of data to manage interactions among entities based on how entities have been managed by human supervisors or by other systems.

As an illustrative example among many possible ones, the entity discovery system 1900 may be used to discover a network-connected camera that shows the loading dock of facility that produces a product for an enterprise, as well as to identify what interfaces or protocols are needed to access a feed of video content from the camera. The entity interaction management system 1902 may then be used to interact with the interfaces or protocols to set up access to the feed and to provide the feed to another system for further processing, such as to have an artificial intelligence system 1160 process the feed to discovery content that is relevant to an activity of the enterprise. For example, the artificial intelligence system 1160 may process image frames of the video feed to find markings (such as produce labels, SKUs, images, logos, or the like), shapes (such as packages of a particular size or shape), activities (such as loading or unloading activities) or the like that may indicate that a product has moved through the loading dock. This information may substitute for, augment, or be used to validate other information, such as RFID tracking information or the like. Similar discovery and interaction management activities may be undertaken with any of the types of value chain network entities 652 described throughout this disclosure.

Robotic Process Automation in Value Chain Network

Figure 25:
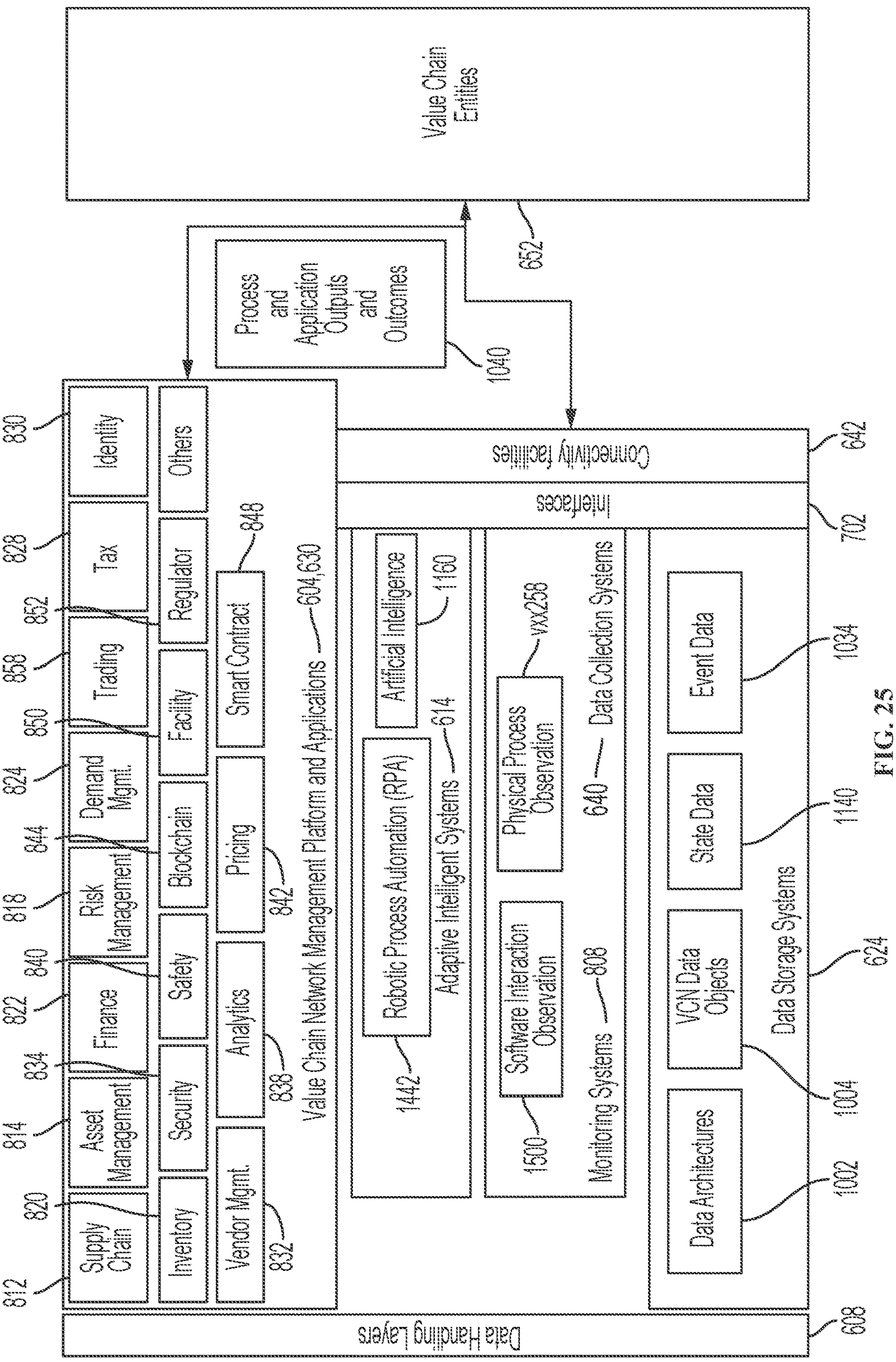
FIG. 25 is a block diagram showing components and relationships of a robotic process automation system in embodiments of a value chain network management platform in accordance with the present disclosure.

Referring to FIG. 25, the adaptive intelligence layer 614 may include a robotic process automation (RPA) system 1442, which may include a set of components, processes, services, interfaces and other elements for development and deployment of automation capabilities for various value chain entities 652, environments, and applications 630. Without limitation, robotic process automation 1442 may be applied to each of the processes that are managed, controlled, or mediated by each of the set of applications 630 of the platform application layer, to functions, components, workflows, processes of the VCNP 604 itself, to processes involving value chain network entities 652 and other processes.

In embodiments, robotic process automation 1442 may take advantage of the presence of multiple applications 630 within the value chain management platform layer 604, such that a pair of applications may share data sources (such as in the data storage layer 624) and other inputs (such as from the monitoring layer 614) that are collected with respect to value chain entities 652, as well as sharing outputs, events, state information and outputs, which collectively may provide a much richer environment for process automation, including through use of artificial intelligence 1160 (including any of the various expert systems, artificial intelligence systems, neural networks, supervised learning systems, machine learning systems, deep learning systems, and other systems described throughout this disclosure and in the documents incorporated by reference). For example, an asset management application 814 may use robotic process automation 1442 for automation of an asset inspection process that is normally performed or supervised by a human (such as by automating a process involving visual inspection using video or still images from a camera or other that displays images of an entity 652, such as where the robotic process automation 1442 system is trained to automate the inspection by observing interactions of a set of human inspectors or supervisors with an interface that is used to identify, diagnose, measure, parameterize, or otherwise characterize possible defects or favorable characteristics of a facility or other asset. In embodiments, interactions of the human inspectors or supervisors may include a labeled data set where labels or tags indicate types of defects, favorable properties, or other characteristics, such that a machine learning system can learn, using the training data set, to identify the same characteristics, which in turn can be used to automate the inspection process such that defects or favorable properties are automatically classified and detected in a set of video or still images, which in turn can be used within the value chain network asset management application 814 to flag items that require further inspection, that should be rejected, that should be disclosed to a prospective buyer, that should be remediated, or the like. In embodiments, robotic process automation 1442 may involve multi-application or cross-application sharing of inputs, data structures, data sources, events, states, outputs or outcomes. For example, the asset management application 814 may receive information from a marketplace application 854 that may enrich the robotic process automation 1442 of the asset management application 814, such as information about the current characteristics of an item from a particular vendor in the supply chain for an asset, which may assist in populating the characteristics about the asset for purposes of facilitating an inspection process, a negotiation process, a delivery process, or the like. These and many other examples of multi-application or cross-application sharing for robotic process automation 1442 across the applications 630 are encompassed by the present disclosure. Robotic process automation 1442 may be used with various functionality of the VCNP 604. For example, in some embodiments, robotic process automation 1442 may be described as training a robot to operate and automate a task that was, to at least a large extent, governed by a human. One of these tasks may be used to train a robot that may train other robots. The robotic process automation 1442 may be trained (e.g., through machine learning) to mimic interactions on a training set, and then have this trained robotic process automation 1442 (e.g., trained agent or trained robotic process automation system) execute these tasks that were previously performed by people. For example, the robotic process automation 1442 may utilize software that may provide software interaction observations (such as mouse movements, mouse clicks, cursor movements, navigation actions, menu selections, keyboard typing, and many others), such as logged and/or tracked by software interaction observation system 1500, purchase of the product by a customer 714, and the like. This may include monitoring of a user's mouse clicks, mouse movements, and/or keyboard typing to learn to do the same clicks and/or typing. In another example, the robotic process automation 1442 may utilize software to learn physical interactions with robots and other systems to train a robotic system to sequence or undertake the same physical interactions. For example, the robot may be trained to rebuild a set of bearings by having the robot watch a video of someone doing this task. This may include tracking physical interactions and tracking interactions at a software level. The robotic process automation 1442 may understand what the underlying competencies are that are being deployed such that the VCNP 604 preconfigure combinations of neural networks that may be used to replicate performance of human capabilities.

In embodiments, robotic process automation may be applied to shared or converged processes among the various pairs of the applications 630 of the application layer 604, such as, without limitation, of a converged process involving a security application 834 and an inventory application 820, integrated automation of blockchain-based applications 844 with vendor management applications 832, and many others. In embodiments, converged processes may include shared data structures for multiple applications 630 (including ones that track the same transactions on a blockchain but may consume different subsets of available attributes of the data objects maintained in the blockchain or ones that use a set of nodes and links in a common knowledge graph). For example, a transaction indicating a change of ownership of an entity 652 may be stored in a blockchain and used by multiple applications 630, such as to enable role-based access control, role-based permissions for remote control, identity-based event reporting, and the like. In embodiments, converged processes may include shared process flows across applications 630, including subsets of larger flows that are involved in one or more of a set of applications 630. For example, a risk management or inspection flow about an entity 652 may serve an inventory management application 832, an asset management application 814, a demand management application 824, and a supply chain application 812, among others.

In embodiments, robotic process automation 1442 may be provided for the wide range of value chain network processes mentioned throughout this disclosure and the documents incorporated herein by reference, including without limitation all of the applications 630. An environment for development of robotic process automation for value chain networks may include a set of interfaces for developers in which a developer may configure an artificial intelligence system 1160 to take inputs from selected data sources of the VCN data storage layer 624 and event data 1034, state data 1140 or other value chain network data objects 1004 from the monitoring systems layer 614 and supply them, such as to a neural network, either as inputs for classification or prediction, or as outcomes relating to the platform 102, value chain network entities 652, applications 630, or the like. The RPA development environment 1442 may be configured to take outputs and outcomes 1040 from various applications 630, again to facilitate automated learning and improvement of classification, prediction, or the like that is involved in a step of a process that is intended to be automated. In embodiments, the development environment, and the resulting robotic process automation 1442 may involve monitoring a combination of both software program interaction observations 1500 (e.g., by workers interacting with various software interfaces of applications 630 involving value chain network entities 652) and physical process interaction observations 1510 (e.g., by watching workers interacting with or using machines, equipment, tools or the like in a value chain network 668). In embodiments, observation of software interactions 1500 may include interactions among software components with other software components, such as how one application 630 interacts via APIs with another application 630. In embodiments, observation of physical process interactions 1510 may include observation (such as by video cameras, motion detectors, or other sensors, as well as detection of positions, movements, or the like of hardware, such as robotic hardware) of how human workers interact with value chain entities 652 (such as locations of workers (including routes taken through a location, where workers of a given type are located during a given set of events, processes or the like, how workers manipulate pieces of equipment, cargo, containers, packages, products 650 or other items using various tools, equipment, and physical interfaces, the timing of worker responses with respect to various events (such as responses to alerts and warnings), procedures by which workers undertake scheduled deliveries, movements, maintenance, updates, repairs and service processes; procedures by which workers tune or adjust items involved in workflows, and many others). Physical process observation 1510 may include tracking positions, angles, forces, velocities, acceleration, pressures, torque, and the like of a worker as the worker operates on hardware, such as on a container or package, or on a piece of equipment involved in handling products, with a tool. Such observations may be obtained by any combination of video data, data detected within a machine (such as of positions of elements of the machine detected and reported by position detectors), data collected by a wearable device (such as an exoskeleton that contains position detectors, force detectors, torque detectors and the like that is configured to detect the physical characteristics of interactions of a human worker with a hardware item for purposes of developing a training data set). By collecting both software interaction observations 1500 and physical process interaction observations 1510 the RPA system 1442 can more comprehensively automate processes involving value chain entities 652, such as by using software automation in combination with physical robots.

In embodiments, robotic process automation 1442 is configured to train a set of physical robots that have hardware elements that facilitate undertaking tasks that are conventionally performed by humans. These may include robots that walk (including walking up and down stairs to deliver a package), climb (such as climbing ladders in a warehouse to reach shelves where products 650 are stored), move about a facility, attach to items, grip items (such as using robotic arms, hands, pincers, or the like), lift items, carry items, remove and replace items, use tools and many others.

Value Chain Management Platform—Unified Robotic Process Automation for Demand Management and Supply Chain In embodiments, provided herein are methods, systems, components and other elements for an information technology system that may include a cloud-based management VCNP 604 with a micro-services architecture, a set of interfaces 702, a set of network connectivity facilities 642, adaptive intelligence facilities 614, data storage facilities 624, data collection systems 640, and monitoring facilities 614 that are coordinated for monitoring and management of a set of value chain network entities 652; a set of applications for enabling an enterprise to manage a set of value chain network entities from a point of origin to a point of customer use; and a unified set of robotic process automation systems 1442 that provide coordinated automation among various applications 630, including demand management applications, supply chain applications, intelligent product applications and enterprise resource management applications for a category of goods.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified set of robotic process automation systems that provide coordinated automation among at least two types of applications from among a set of demand management applications, a set of supply chain applications, a set of intelligent product applications and a set of enterprise resource management applications for a category of goods.

Value Chain Management Platform—Robotic Process Automation Services in Microservices Architecture for Value Chain Network In embodiments, provided herein are methods, systems, components and other elements for an information technology system that may include a cloud-based management VCNP 102 with a micro-services architecture, a set of interfaces 702, a set of network connectivity facilities 642, adaptive intelligence facilities 614, data storage facilities 624, data collection systems 640, and monitoring facilities 614 that are coordinated for monitoring and management of a set of value chain network entities 652; a set of applications for enabling an enterprise to manage a set of value chain network entities from a point of origin to a point of customer use; and a set of microservices layers including an application layer supporting at least one supply chain application and at least one demand management application, wherein the microservice layers include a robotic process automation layer 1442 that uses information collected by a data collection layer 640 and a set of outcomes and activities 1040 involving the applications of the application layer 630 to automate a set of actions for at least a subset of the applications 630.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of microservices layers including an application layer supporting at least one supply chain application and at least one demand management application, wherein the microservice layers include a robotic process automation layer that uses information collected by a data collection layer and a set of outcomes and activities involving the applications of the application layer to automate a set of actions for at least a subset of the applications.

Value Chain Management Platform—Robotic Process Automation for Value Chain Network Processes In embodiments, provided herein are methods, systems, components and other elements for an information technology system that may include a cloud-based management VCNP 102 with a micro-services architecture, a set of interfaces 702, a set of network connectivity facilities 642, adaptive intelligence facilities 614, data storage facilities 624, data collection systems 640, and monitoring facilities 614 that are coordinated for monitoring and management of a set of value chain network entities 652; a set of applications for enabling an enterprise to manage a set of value chain network entities from a point of origin to a point of customer use; and a set of robotic process automation systems 1442 for automating a set of processes in a value chain network, wherein the robotic process automation systems 1442 learn on a training set of data involving a set of user interactions with a set of interfaces 702 of a set of software systems that are used to monitor and manage the value chain network entities 652, as well as from various process and application outputs and outcomes 1040 that may occur with or within the VCNP 102.

In embodiments, the value chain network entities 652 may include, for example, products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, port infrastructure facilities, or many others.

In embodiments, the robotic process automation layer automates a process that may include, for example, without limitation, selection of a quantity of product for an order, selection of a carrier for a shipment, selection of a vendor for a component, selection of a vendor for a finished goods order, selection of a variation of a product for marketing, selection of an assortment of goods for a shelf, determination of a price for a finished good, configuration of a service offer related to a product, configuration of product bundle, configuration of a product kit, configuration of a product package, configuration of a product display, configuration of a product image, configuration of a product description, configuration of a website navigation path related to a product, determination of an inventory level for a product, selection of a logistics type, configuration of a schedule for product delivery, configuration of a logistics schedule, configuration of a set of inputs for machine learning, preparation of product documentation, preparation of required disclosures about a product, configuration of a product for a set of local requirements, configuration of a set of products for compatibility, configuration of a request for proposals, ordering of equipment for a warehouse, ordering of equipment for a fulfillment center, classification of a product defect in an image, inspection of a product in an image, inspection of product quality data from a set of sensors, inspection of data from a set of onboard diagnostics on a product, inspection of diagnostic data from an Internet of Things system, review of sensor data from environmental sensors in a set of supply chain environments, selection of inputs for a digital twin, selection of outputs from a digital twin, selection of visual elements for presentation in a digital twin, diagnosis of sources of delay in a supply chain, diagnosis of sources of scarcity in a supply chain, diagnosis of sources of congestion in a supply chain, diagnosis of sources of cost overruns in a supply chain, diagnosis of sources of product defects in a supply chain, prediction of maintenance requirements in supply chain infrastructure, or others.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; and a set of robotic process automation systems for automating a set of processes in a value chain network, wherein the robotic process automation systems learn on a training set of data involving a set of user interactions with a set of interfaces of a set of software systems that are used to monitor and manage the value chain network entities.

In embodiments, one of the processes automated by robotic process automation as described in any of the embodiments disclosed herein may involve the following. In embodiments, RPA involves selection of a quantity of product for an order. In embodiments, one of the processes automated by robotic process automation involves selection of a carrier for a shipment. In embodiments, one of the processes automated by robotic process automation involves selection of a vendor for a component. In embodiments, one of the processes automated by robotic process automation involves selection of a vendor for a finished goods order. In embodiments, one of the processes automated by robotic process automation involves selection of a variation of a product for marketing. In embodiments, one of the processes automated by robotic process automation involves selection of an assortment of goods for a shelf. In embodiments, one of the processes automated by robotic process automation involves determination of a price for a finished good. In embodiments, one of the processes automated by robotic process automation involves configuration of a service offer related to a product. In embodiments, one of the processes automated by robotic process automation involves configuration of product bundle. In embodiments, one of the processes automated by robotic process automation involves configuration of a product kit. In embodiments, one of the processes automated by robotic process automation involves configuration of a product package. In embodiments, one of the processes automated by robotic process automation involves configuration of a product display. In embodiments, one of the processes automated by robotic process automation involves configuration of a product image. In embodiments, one of the processes automated by robotic process automation involves configuration of a product description. In embodiments, one of the processes automated by robotic process automation involves configuration of a website navigation path related to a product. In embodiments, one of the processes automated by robotic process automation involves determination of an inventory level for a product. In embodiments, one of the processes automated by robotic process automation involves selection of a logistics type. In embodiments, one of the processes automated by robotic process automation involves configuration of a schedule for product delivery. In embodiments, one of the processes automated by robotic process automation involves configuration of a logistics schedule. In embodiments, one of the processes automated by robotic process automation involves configuration of a set of inputs for machine learning. In embodiments, one of the processes automated by robotic process automation involves preparation of product documentation. In embodiments, one of the processes automated by robotic process automation involves preparation of required disclosures about a product. In embodiments, one of the processes automated by robotic process automation involves configuration of a product for a set of local requirements. In embodiments, one of the processes automated by robotic process automation involves configuration of a set of products for compatibility. In embodiments, one of the processes automated by robotic process automation involves configuration of a request for proposals.

In embodiments, one of the processes automated by robotic process automation involves ordering of equipment for a warehouse. In embodiments, one of the processes automated by robotic process automation involves ordering of equipment for a fulfillment center. In embodiments, one of the processes automated by robotic process automation involves classification of a product defect in an image. In embodiments, one of the processes automated by robotic process automation involves inspection of a product in an image.

In embodiments, one of the processes automated by robotic process automation involves inspection of product quality data from a set of sensors. In embodiments, one of the processes automated by robotic process automation involves inspection of data from a set of onboard diagnostics on a product. In embodiments, one of the processes automated by robotic process automation involves inspection of diagnostic data from an Internet of Things system. In embodiments, one of the processes automated by robotic process automation involves review of sensor data from environmental sensors in a set of supply chain environments.

In embodiments, one of the processes automated by robotic process automation involves selection of inputs for a digital twin. In embodiments, one of the processes automated by robotic process automation involves selection of outputs from a digital twin. In embodiments, one of the processes automated by robotic process automation involves selection of visual elements for presentation in a digital twin. In embodiments, one of the processes automated by robotic process automation involves diagnosis of sources of delay in a supply chain. In embodiments, one of the processes automated by robotic process automation involves diagnosis of sources of scarcity in a supply chain. In embodiments, one of the processes automated by robotic process automation involves diagnosis of sources of congestion in a supply chain.

In embodiments, one of the processes automated by robotic process automation involves diagnosis of sources of cost overruns in a supply chain. In embodiments, one of the processes automated by robotic process automation involves diagnosis of sources of product defects in a supply chain. In embodiments, one of the processes automated by robotic process automation involves prediction of maintenance requirements in supply chain infrastructure.

In embodiments, the set of demand management applications, supply chain applications, intelligent product applications and enterprise resource management applications may include, for example, ones involving supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, enterprise resource planning, and many others.

Figure 26:
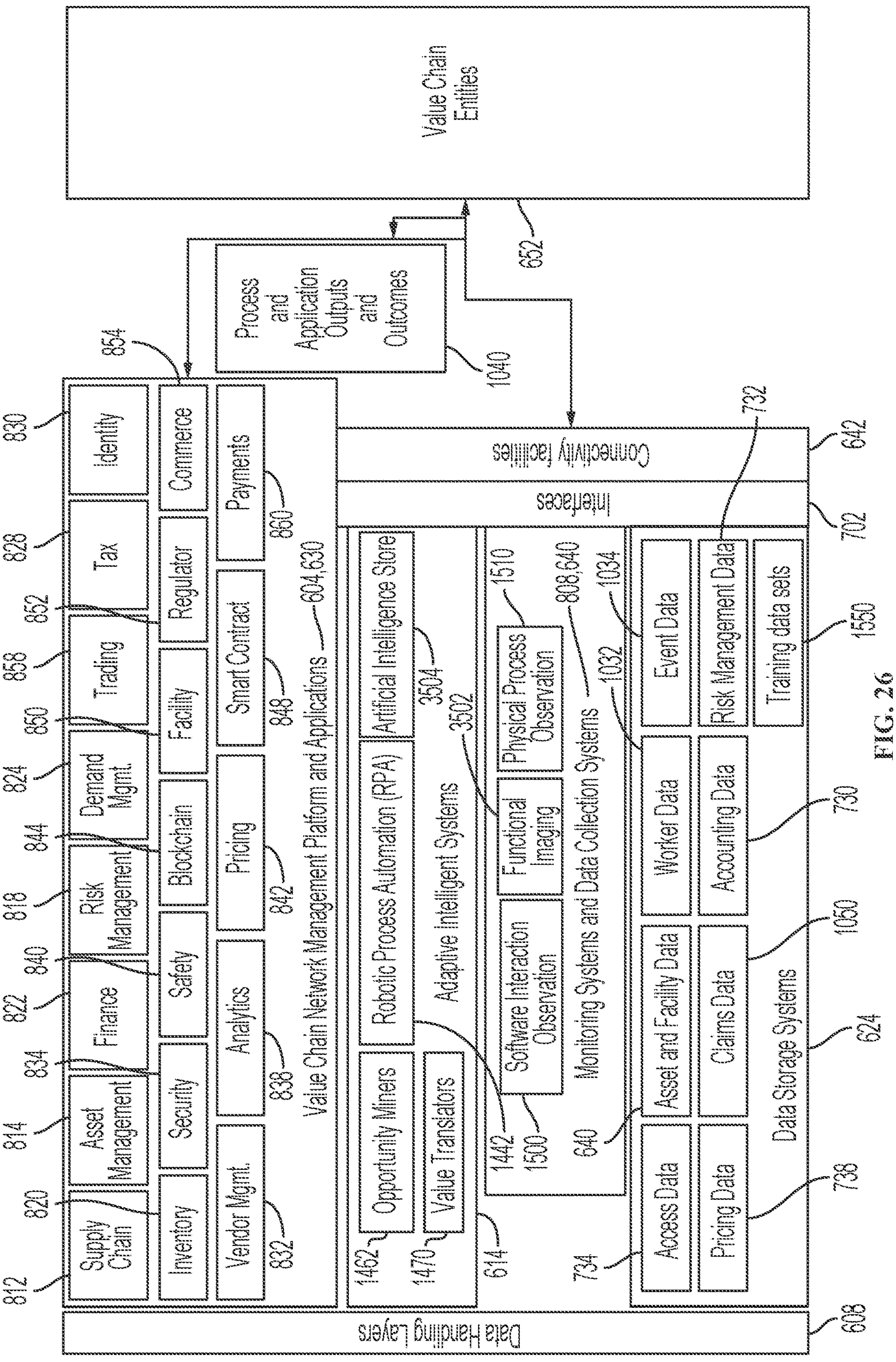
FIG. 26 is a block diagram showing components and relationships of a set of opportunity miners in an embodiment of a value chain network management platform in accordance with the present disclosure.

Introduction of Opportunity Miners for Automated Improvement of Adaptive Intelligence Referring to FIG. 26, a set of opportunity miners 1460 may be provided as part of the adaptive intelligence layer 614, which may be configured to seek and recommend opportunities to improve one or more of the elements of the platform 604, such as via addition of artificial intelligence 1160, automation (including robotic process automation 1442), or the like to one or more of the systems, subsystems, components, applications or the like of the VCNP 102 or with which the VCNP 102 interacts. In embodiments, the opportunity miners 1460 may be configured or used by developers of AI or RPA solutions to find opportunities for better solutions and to optimize existing solutions in a value chain network 668. In embodiments, the opportunity miners 1460 may include a set of systems that collect information within the VCNP 102 and collect information within, about and for a set of value chain network entities 652 and environments, where the collected information has the potential to help identify and prioritize opportunities for increased automation and/or intelligence about the value chain network 668, about applications 630, about value chain network entities 652, or about the VCNP 102 itself. For example, the opportunity miners 1460 may include systems that observe clusters of value chain network workers by time, by type, and by location, such as using cameras, wearables, or other sensors, such as to identify labor-intensive areas and processes in a set of value chain network 668 environments. These may be presented, such as in a ranked or prioritized list, or in a visualization (such as a heat map showing dwell times of customers, workers or other individuals on a map of an environment or a heat map showing routes traveled by customers or workers within an environment) to show places with high labor activity. In embodiments, analytics 838 may be used to identify which environments or activities would most benefit from automation for purposes of improved delivery times, mitigation of congestion, and other performance improvements.

In embodiments, opportunity mining may include facilities for solicitation of appropriate training data sets that may be used to facilitate process automation. For example, certain kinds of inputs, if available, would provide very high value for automation, such as video data sets that capture very experienced and/or highly expert workers performing complex tasks. Opportunity miners 1460 may search for such video data sets as described herein; however, in the absence of success (or to supplement available data), the platform may include systems by which a user, such as a developer, may specify a desired type of data, such as software interaction data (such as of an expert working with a program to perform a particular task), video data (such as video showing a set of experts performing a certain kind of delivery process, packing process, picking process, a container movement process, or the like), and/or physical process observation data (such as video, sensor data, or the like). The resulting library of interactions captured in response to specification may be captured as a data set in the data storage layer 624, such as for consumption by various applications 630, adaptive intelligence systems 614, and other processes and systems. In embodiments, the library may include videos that are specifically developed as instructional videos, such as to facilitate developing an automation map that can follow instructions in the video, such as providing a sequence of steps according to a procedure or protocol, breaking down the procedure or protocol into sub-steps that are candidates for automation, and the like. In embodiments, such videos may be processed by natural language processing, such as to automatically develop a sequence of labeled instructions that can be used by a developer to facilitate a map, a graph, or other models of a process that assists with development of automation for the process. In embodiments, a specified set of training data sets may be configured to operate as inputs to learning. In such cases the training data may be time-synchronized with other data within the platform 604, such as outputs and outcomes from applications 630, outputs and outcomes of value chain entities 652, or the like, so that a given video of a process can be associated with those outputs and outcomes, thereby enabling feedback on learning that is sensitive to the outcomes that occurred when a given process that was captured (such as on video, or through observation of software interactions or physical process interactions). For example, this may relate to an instruction video such as a video of a person who may be building or rebuilding (e.g., rebuilding a bearing set). This instruction video may include individual steps for rebuild that may allow a staging of the training to provide instructions such as parsing the video into stages that mimic the experts staging in the video. For example, this may include tagging of the video to include references to each stage and status (e.g., stage one complete, stage two, etc.) This type of example may utilize artificial intelligence that may understand that there may be a series of sub-functions that add up to a final function.

In embodiments, opportunity miners 1460 may include methods, systems, processes, components, services and other elements for mining for opportunities for smart contract definition, formation, configuration and execution. Data collected within the platform 604, such as any data handled by the data handling layers 624, stored by the data storage layer 624, collected by the monitoring layer 614 and collection systems 640, collected about or from entities 652 or obtained from external sources may be used to recognize beneficial opportunities for application or configuration of smart contracts. For example, pricing information about an entity 652, handled by a pricing application 842, or otherwise collected, may be used to recognize situations in which the same item or items is disparately priced (in a spot market, futures market, or the like), and the opportunity miner 1460 may provide an alert indicating an opportunity for smart contract formation, such as a contract to buy in one environment at a price below a given threshold and sell in another environment at a price above a given threshold, or vice versa.

In some examples, as shown in FIG. 26, the adaptive intelligent systems 614 may include value translators 1470. The value translators 1470 may relate to demand side of transactions. Specifically, for example, the value translators 1470 may understand negative currencies of two marketplaces and may be able to translate value currencies into other currencies (e.g., not only fiat currencies that already have clear translation functions). In some examples, value translators 1470 may be associated with points of a point-based system (e.g., in a cost-based routing system). In an example embodiment, value translators 1470 may be loyalty points offered that may be convertible into airline seats and/or may translate to refund policies for staying in a hotel room. In some examples, different types of entities may be connected as having native pricing or cost functions that do not always use the same currency or any currency. In another example, value translators 1470 may be used with network prioritization or cost-based routing that happens in networks off of priorities where the point system in these cost-based routing systems is not monetary-based.

Broad Management Platform

Figure 28:
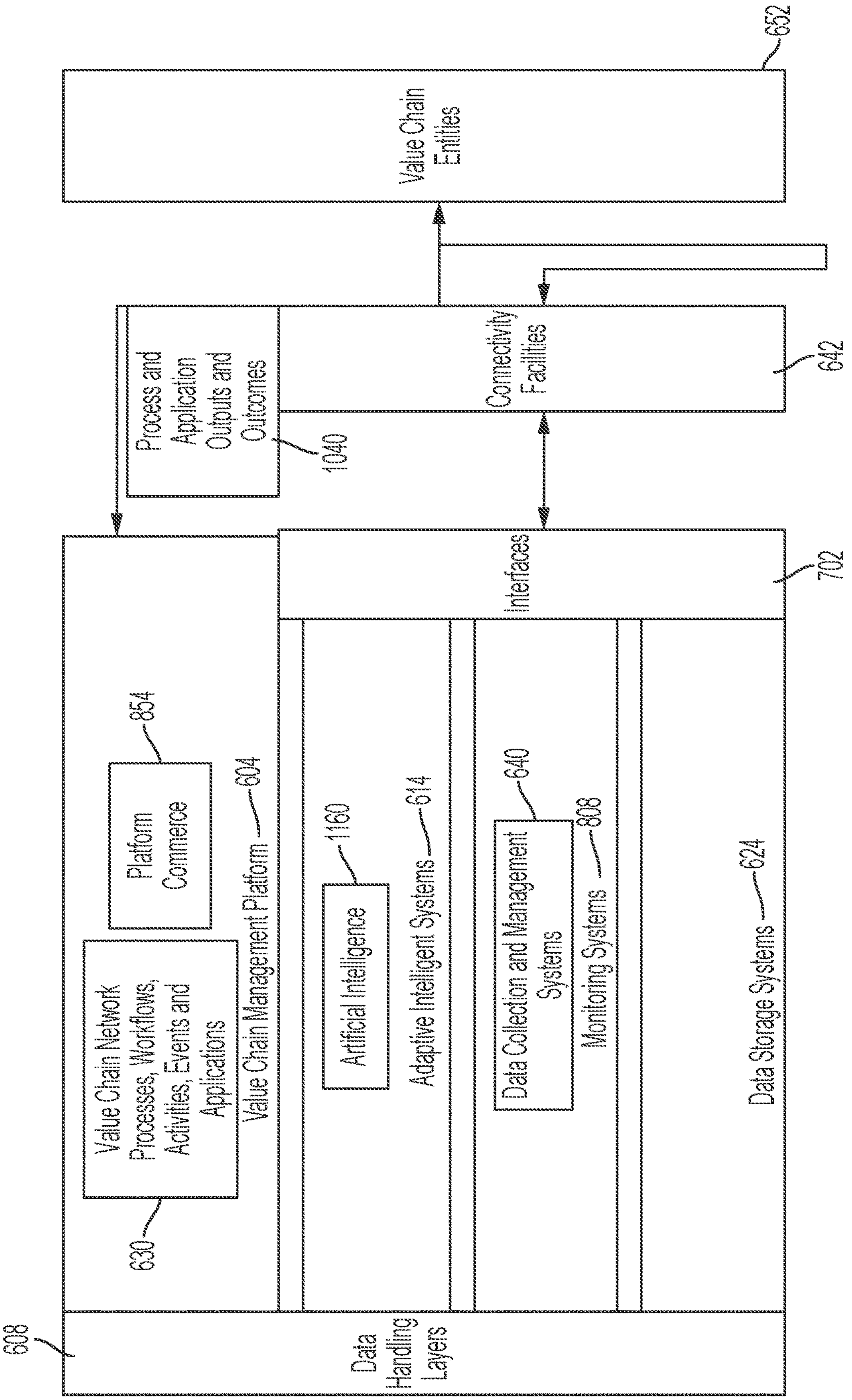
FIG. 28 is a block diagram showing components and relationships in an embodiment of a value chain network management platform in accordance with the present disclosure.

Referring to FIG. 28, additional details of an embodiment of the platform 604 are provided, in particular relating to an overall architecture for the platform 604. These may include, for the cloud-based management platform 604, employing a micro-services architecture, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

Thus, provided herein are methods, systems, components and other elements for an information technology system that may include: a cloud-based management platform with a micro-services architecture; a set of interfaces, network connectivity facilities, adaptive intelligence facilities, data storage facilities, and monitoring facilities; and a set of applications for enabling an enterprise to manage a set of value chain network entities from a point of origin to a point of customer use.

Also provided herein are methods, systems, components and other elements for an information technology system that may include: a cloud-based management platform with a micro-services architecture, the platform having: a set of interfaces for accessing and configuring features of the platform; a set of network connectivity facilities for enabling a set of value chain network entities to connect to the platform; a set of adaptive intelligence facilities for automating a set of capabilities of the platform; a set of data storage facilities for storing data collected and handled by the platform; and a set of monitoring facilities for monitoring the value chain network entities; wherein the platform hosts a set of applications for enabling an enterprise to manage a set of value chain network entities from a point of origin of a product of the enterprise to a point of customer use.

Broad Management Platform—Details

Figure 29:
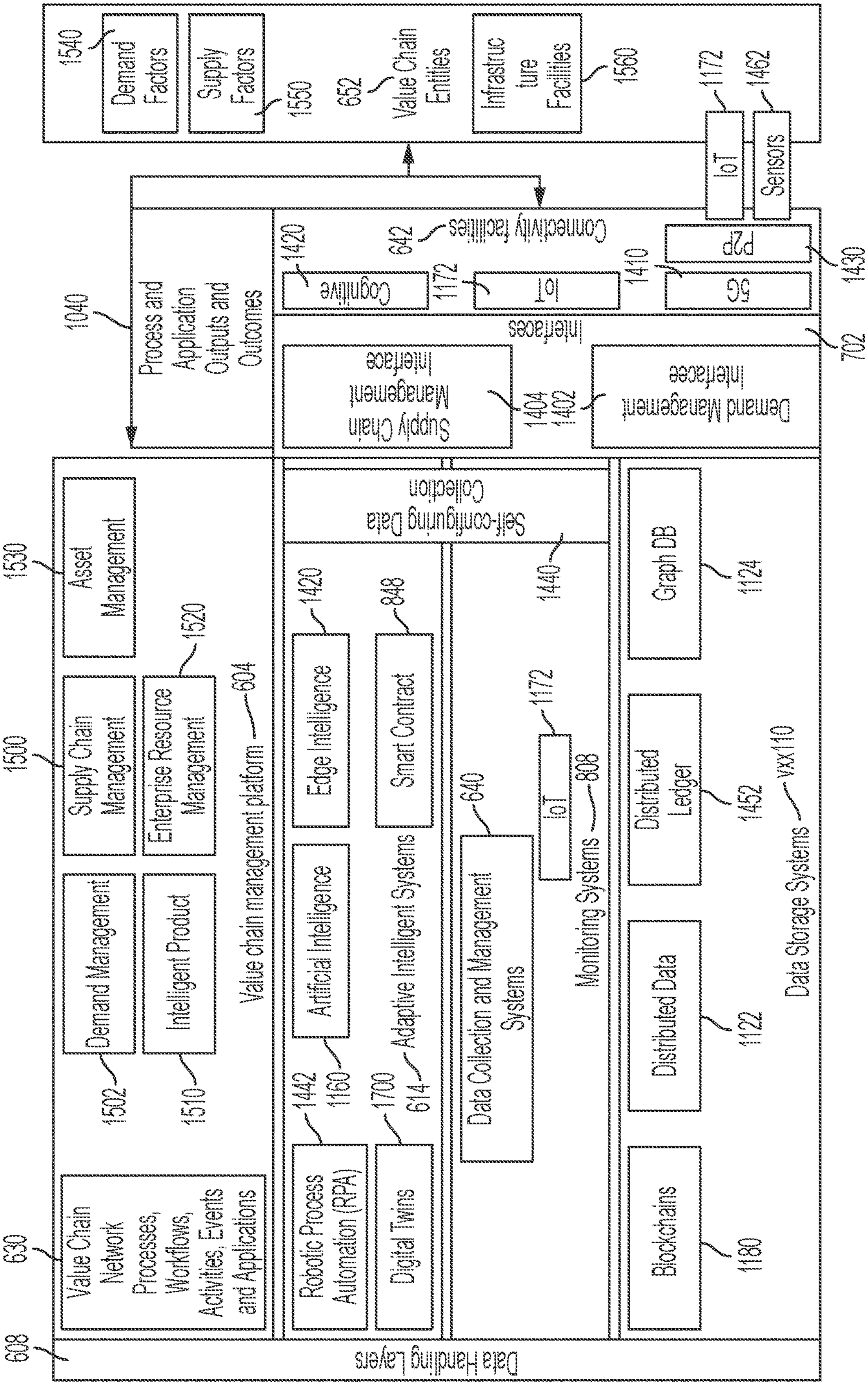
FIG. 29 is a block diagram showing additional details of components and relationships in embodiments of a value chain network management platform in accordance with the present disclosure.

Referring to FIG. 29, additional details of an embodiment of the platform 604 are provided, in particular relating to an overall architecture for the platform 604. These may include, for the cloud-based management platform 604, employing a micro-services architecture, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the set of interfaces 702 may include a demand management interface MPVC104 and a supply chain management interface MPVC108.

In embodiments, the set of network connectivity facilities 642 for enabling a set of value chain network entities 652 to connect to the platform 604 may include a 5G network system MPVC110, such as one that is deployed in a supply chain infrastructure facility operated by the enterprise.

In embodiments, the set of network connectivity facilities 642 for enabling a set of value chain network entities 652 to connect to the platform 604 may include an Internet of Things system 1172, such as one that is deployed in a supply chain infrastructure facility operated by the enterprise, in, on or near a value chain network entity 652, in a network system, and/or in a cloud computing environment (such as where data collection systems 640 are configured to collect and organize IoT data).

In embodiments, the set of network connectivity facilities 642 for enabling a set of value chain network entities 652 to connect to the VCNP 102 may include a cognitive networking system MPVC114 deployed in a supply chain infrastructure facility operated by the enterprise.

In embodiments, the set of network connectivity facilities 642 for enabling a set of value chain network entities 652 to connect to the VCNP 102 may include a peer-to-peer network system MPVC118, such as one that is deployed in a supply chain infrastructure facility operated by the enterprise.

In embodiments, the set of adaptive intelligence facilities or adaptive intelligent systems 614 for automating a set of capabilities of the platform 604 may include an edge intelligence system 1420, such as one that is deployed in a supply chain infrastructure facility operated by the enterprise.

In embodiments, the set of adaptive intelligence facilities or adaptive intelligent systems 614 for automating a set of capabilities of the platform 604 may include a robotic process automation system 1442.

In embodiments, the set of adaptive intelligence facilities or adaptive intelligent systems 614 for automating a set of capabilities of the platform 604 may include or may integrate with a self-configuring data collection system 1440, such as one that deployed in a supply chain infrastructure facility operated by the enterprise, one that is deployed in a network, and/or one that is deployed in a cloud computing environment. This may include elements of the data collection systems 640 of the data handling layers 624 that interact with or integrate with elements of the adaptive intelligent systems 614.

In embodiments, the set of adaptive intelligence facilities or adaptive intelligent systems 614 for automating a set of capabilities of the platform 604 may include a digital twin system 1700, such as one representing attributes of a set of value chain network entities, such as the ones controlled by an enterprise.

In embodiments, the set of adaptive intelligence facilities or adaptive intelligent systems 614 for automating a set of capabilities of the platform 604 may include a smart contract system 848, such as one for automating a set of interactions or transactions among a set of value chain network entities 652 based on status data, event data, or other data handled by the data handling layers 624.

In embodiments, the set of data storage facilities or data storage systems 624 for storing data collected and handled by the platform 604 uses a distributed data architecture 1122.

In embodiments, the set of data storage facilities for storing data collected and handled by the platform uses a blockchain 844.

In embodiments, the set of data storage facilities for storing data collected and handled by the platform uses a distributed ledger 1452.

In embodiments, the set of data storage facilities for storing data collected and handled by the platform uses graph database 1124 representing a set of hierarchical relationships of value chain network entities.

In embodiments, the set of monitoring facilities 614 for monitoring the value chain network entities 652 includes an Internet of Things monitoring system 1172, such as for collecting data from IoT systems and devices deployed throughout a value chain network.

In embodiments, the set of monitoring facilities 614 for monitoring the value chain network entities 652 includes a set of sensor systems 1462, such as ones deployed in a value chain environment or in, one or near a value chain network entity 652, such as in or on a product 650.

In embodiments, the set of applications 630 includes a set of applications, which may include a variety of types from among, for example, a set of supply chain management applications 1500, demand management applications 1502, intelligent product applications 1510 and enterprise resource management applications 1520.

In embodiments, the set of applications includes an asset management application 1530.

In embodiments, the value chain network entities 652 as mentioned throughout this disclosure may include, for example, without limitation, products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, port infrastructure facilities, or others.

In embodiments, the platform 604 manages a set of demand factors 1540, a set of supply factors 1550 and a set of value chain infrastructure facilities 1560.

In embodiments, the supply factors 1550 as mentioned throughout this disclosure may include, for example and without limitation, ones involving component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, route safety, and many others.

In embodiments, the demand factors 1540 as mentioned throughout this disclosure may include, for example and without limitation, ones involving product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, inferred interest, and many others.

In embodiments, the supply chain infrastructure facilities 1560 as mentioned throughout this disclosure may include, for example and without limitation, ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, border control, and other facilities.

In embodiments, the set of applications 630 as mentioned throughout this disclosure may include, for example and without limitation, supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, enterprise resource planning and other applications.

Control Tower

Figure 30:
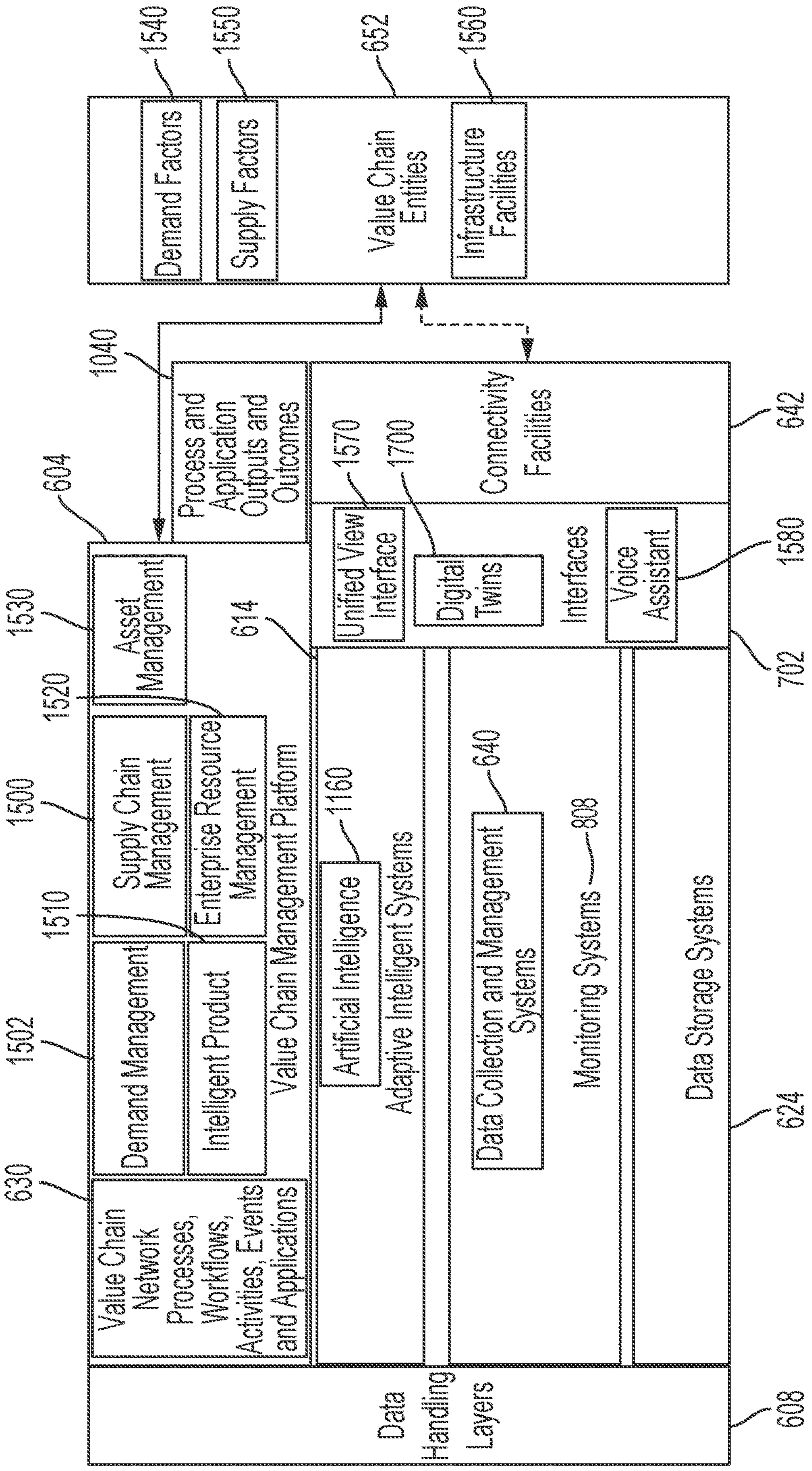
FIG. 30 is a block diagram showing components and relationships in an embodiment of a value chain network management platform that enables centralized orchestration of value chain network entities in accordance with the present disclosure.

Referring to FIG. 30, an embodiment of the platform 604 is provided. The platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the platform 604 may include a user interface 1570 that provides a set of unified views for a set of demand management information and supply chain information for a category of goods, such as one that displays status information, event information, activity information, analytics, reporting, or other elements of, relating to, or produced by a set of supply chain management applications 1500, demand management applications 1502, intelligent product applications 1510 and enterprise resource management applications 1520 that monitor and/or manage a value chain network and a set of value chain network entities 652. The unified view interface 1570 may thus provide, in embodiments, a control tower for an enterprise over a range of assets, such as supply chain infrastructure facilities 1560 and other value chain network entities 652 that are involved as a product 650 travels from a point of origin through distribution and retail channels to an environment where it is used by a customer. These may include views of demand factors 1540 and supply factors 1550, so that a user may develop insights about connections among the factors and control one or both of them with coordinated intelligence. Population of a set of unified views may be adapted over time, such as by learning on outcomes 1040 or other operations of the adaptive intelligent systems 614, such as to determine which views of the interface 1570 provide the most impactful insights, control features, or the like.

In embodiments, the user interface includes a voice operated assistant 1580.

In embodiments, the user interface includes a set of digital twins 1700 for presenting a visual representation of a set of attributes of a set of value chain network entities 652.

In embodiments, the user interface 1570 may include capabilities for configuring the adaptive intelligent systems 614 or adaptive intelligence facilities, such as to allow user selection of attributes, parameters, data sources, inputs to learning, feedback to learning, views, formats, arrangements, or other elements.

Value Chain Management Platform—Control Tower UI for Demand Management and Supply Chain Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a user interface that provides a set of unified views for a set of demand management information and supply chain information for a category of goods.

Unified Database

Figure 31:
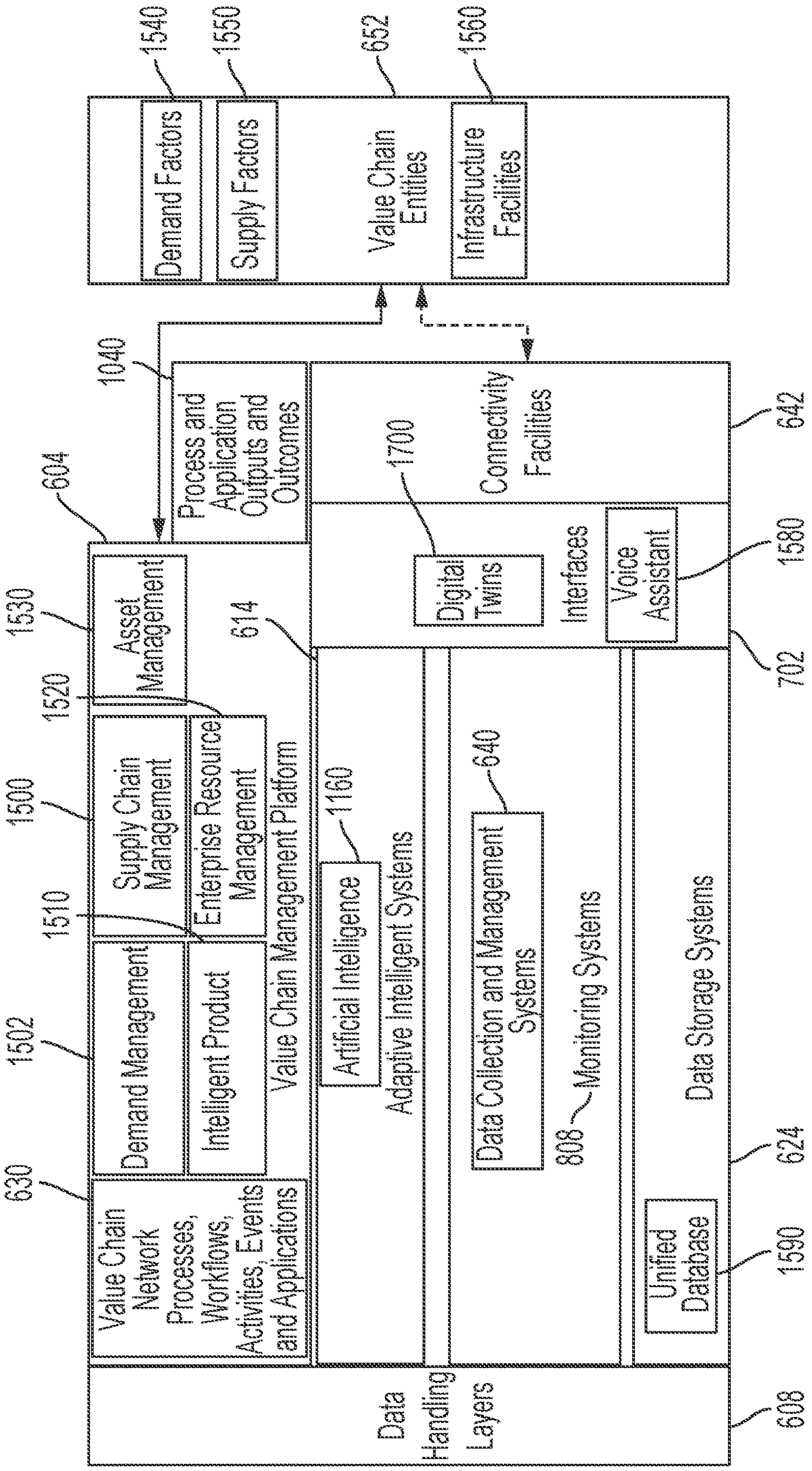
FIG. 31 is a block diagram showing components and relationships of a unified database in an embodiment of a value chain network management platform in accordance with the present disclosure.

Referring to FIG. 31, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the platform 604 may include a unified database 1590 that supports a set of applications of multiple types, such as ones among a set of supply chain management applications 1500, demand management applications 1502, intelligent product applications 1510 and enterprise resource management applications 1520 that monitor and/or manage a value chain network and a set of value chain network entities 652. The unified database 1590 may thus provide, in embodiments, unification of data storage, access and handling for an enterprise over a range of assets, such as supply chain infrastructure facilities 1560 and other value chain network entities 652 that are involved as a product 650 travels from a point of origin through distribution and retail channels to an environment where it is used by a customer. This unification may provide a number of advantages, including reduced need for data entry, consistency across applications 630, reduced latency (and better real-time reporting), reduced need for data transformation and integration, and others. These may include data relating to demand factors 1540 and supply factors 1550, so that an application 630 may benefit from information collected by, processed, or produced by other applications 630 of the platform 604 and a user can develop insights about connections among the factors and control one or both of them with coordinated intelligence. Population of the unified database 1590 may be adapted over time, such as by learning on outcomes 1040 or other operations of the adaptive intelligent systems 614, such as to determine which elements of the database 1590 should be made available to which applications, what data structures provide the most benefit, what data should be stored or cached for immediate retrieval, what data can be discarded versus saved, what data is most beneficial to support adaptive intelligent systems 614, and for other uses.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified database that supports a set of applications of at least two types from among a set of demand management applications, a set of supply chain applications, a set of intelligent product applications and a set of enterprise resource management applications for a category of goods.

In embodiments, the unified database that supports a set of demand management applications, a set of supply chain applications, a set of intelligent product applications and a set of enterprise resource management applications for a category of goods is a distributed database.

In embodiments, the unified database that supports a set of demand management applications, a set of supply chain applications, a set of intelligent product applications and a set of enterprise resource management applications for a category of goods uses a graph database architecture. In embodiments, the set of demand management applications includes a demand prediction application. In embodiments, the set of demand management applications includes a demand aggregation application. In embodiments, the set of demand management applications includes a demand activation application.

In embodiments, the set of supply chain management applications includes a vendor search application. In embodiments, the set of supply chain management applications includes a route configuration application. In embodiments, the set of supply chain management applications includes a logistics scheduling application.

Unified Data Collection Systems

Figure 32:
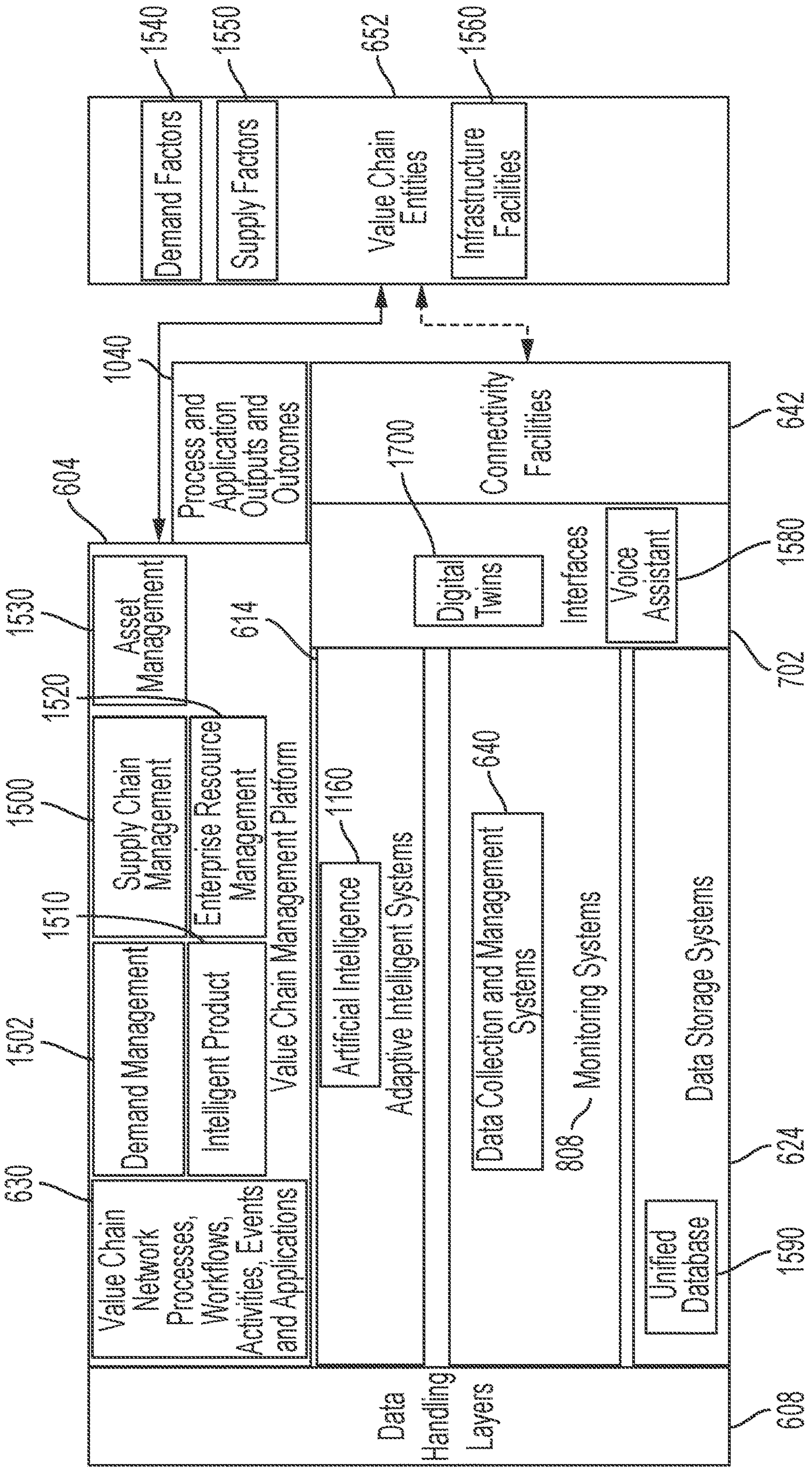
FIG. 32 is a block diagram showing components and relationships of a set of unified data collection systems in embodiments of a value chain network management platform in accordance with the present disclosure.

Referring to FIG. 32, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the platform 604 may include a set of unified set of data collection and management systems 640 of the set of monitoring facilities or systems 614 that support a set of applications 630 of various types, including a set of supply chain management applications 1500, demand management applications 1502, intelligent product applications 1510 and enterprise resource management applications 1520 that monitor and/or manage a value chain network and a set of value chain network entities 652. The unified data collection and management systems 640 may thus provide, in embodiments, unification of data monitoring, search, discovery, collection, access and handling for an enterprise or other user over a range of assets, such as supply chain infrastructure facilities 1560 and other value chain network entities 652 that are involved as a product 650 travels from a point of origin through distribution and retail channels to an environment where it is used by a customer. This unification may provide a number of advantages, including reduced need for data entry, consistency across applications 630, reduced latency (and better real-time reporting), reduced need for data transformation and integration, and others. These may include collection of data relating to demand factors 1540 and supply factors 1550, so that an application 630 may benefit from information collected by, processed, or produced by other applications 630 of the platform 604 and a user can develop insights about connections among the factors and control one or both of them with coordinated intelligence. The unified data collection and management systems 640 may be adapted over time, such as by learning on outcomes 1040 or other operations of the adaptive intelligent systems 614, such as to determine which elements of the data collection and management systems 640 should be made available to which applications 630, what data types or sources provide the most benefit, what data should be stored or cached for immediate retrieval, what data can be discarded versus saved, what data is most beneficial to support adaptive intelligent systems 614, and for other uses. In example embodiments, the unified data collection and management systems 640 may use a unified data schema which relates data collection and management for various applications. This may be a single point of truth database at the most tightly bound or a set of distributed data systems that may follow a schema that may be sufficiently common enough that a wide variety of applications may consume the same data as received. For example, sensor data may be pulled from a smart product that may be consumed by a logistics application, a financial application, a demand prediction application, or a genetic programming artificial intelligence (AI) application to change the product, and the like. All of these applications may consume data from a data framework. In an example, this may occur from blockchains that may contain a distributed ledger or transactional data for purchase and sales or blockchains where there may be an indication of whether or not events had occurred. In some example embodiments, as data moves through a supply chain, this data flow may occur through distributed databases, relational databases, graph databases of all types, and the like that may be part of the unified data collection and management systems 640. In other examples, the unified data collection and management systems 640 may utilize memory that may be dedicated memory on an asset, in a tag or part of a memory structure of the device itself that may come from a robust pipeline tied to the value chain network entities. In other examples, the unified data collection and management systems 640 may use classic data integration capabilities that may include adapting protocols such that they can ultimately get to the unified system or schema.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified set of data collection systems that support a set of applications of at least two types from among a set of demand management applications, a set of supply chain applications, a set of intelligent product applications and a set of enterprise resource management applications for a category of goods.

In embodiments, the unified set of data collection systems includes a set of crowdsourcing data collection systems. In embodiments, the unified set of data collection systems includes a set of Internet of Things data collection systems. In embodiments, the unified set of data collection systems includes a set of self-configuring sensor systems. In embodiments, the unified set of data collection systems includes a set of data collection systems that interact with a network-connected product.

In embodiments, the unified set of data collection systems includes a set of mobile data collectors deployed in a set of value chain network environments operated by an enterprise. In embodiments, the unified set of data collection systems includes a set of edge intelligence systems deployed in set of value chain network environments operated by an enterprise. In embodiments, the unified set of data collection systems includes a set of crowdsourcing data collection systems. In embodiments, the unified set of data collection systems includes a set of Internet of Things data collection systems. In embodiments, the unified set of data collection systems includes a set of self-configuring sensor systems. In embodiments, the unified set of data collection systems includes a set of data collection systems that interact with a network-connected product. In embodiments, the unified set of data collection systems includes a set of mobile data collectors deployed in a set of value chain network environments operated by an enterprise. In embodiments, the unified set of data collection systems includes a set of edge intelligence systems deployed in a set of value chain network environments operated by an enterprise.

Unified IoT Monitoring Systems

Figure 33:
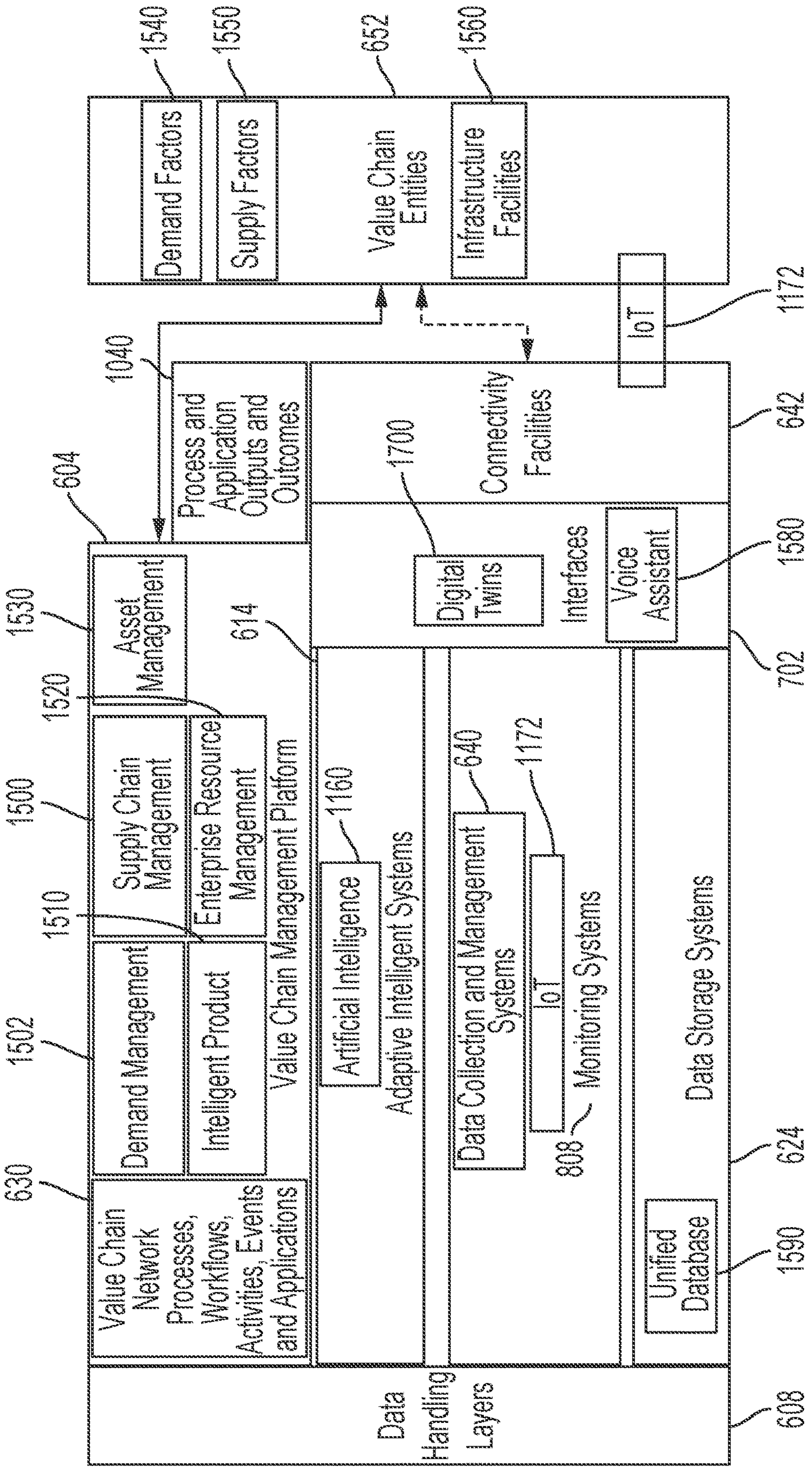
FIG. 33 is a block diagram showing components and relationships of a set of Internet of Things monitoring systems in embodiments of a value chain network management platform in accordance with the present disclosure.

Referring to FIG. 33, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the platform 604 may include a unified set of Internet of Things systems 1172 that provide coordinated monitoring of various value chain entities 652 in service of a set of multiple applications 630 of various types, such as a set of supply chain management applications 1500, demand management applications 1502, intelligent product applications 1510 and enterprise resource management applications 1520 that monitor and/or manage a value chain network and a set of value chain network entities 652.

The unified set of Internet of Things systems 1172 may thus provide, in embodiments, unification of monitoring of, and communication with, a wide range of facilities, devices, systems, environments, and assets, such as supply chain infrastructure facilities 1560 and other value chain network entities 652 that are involved as a product 650 travels from a point of origin through distribution and retail channels to an environment where it is used by a customer. This unification may provide a number of advantages, including reduced need for data entry, consistency across applications 630, reduced latency, real-time reporting and awareness, reduced need for data transformation and integration, and others. These may include Internet of Things systems 1172 that are used in connection with demand factors 1540 and supply factors 1550, so that an application 630 may benefit from information collected by, processed, or produced by the unified set of Internet of Things systems 1172 for other applications 630 of the platform 604, and a user can develop insights about connections among the factors and control one or both of them with coordinated intelligence. The unified set of Internet of Things systems 1172 may be adapted over time, such as by learning on outcomes 1040 or other operations of the adaptive intelligent systems 614, such as to determine which elements of the unified set of Internet of Things systems 1172 should be made available to which applications 630, what IoT systems 1172 provide the most benefit, what data should be stored or cached for immediate retrieval, what data can be discarded versus saved, what data is most beneficial to support adaptive intelligent systems 614, and for other uses. In some examples, the unified set of Internet of Things (IoT) systems 1172 may be IoT devices that may be installed in various environments. One goal of the unified set of Internet of Things systems 1172 may be coordination across a city or town involving citywide deployments where collectively a set of IOT devices may be connected by wide area network protocols (e.g., longer range protocols). In another example, the unified set of Internet of Things systems 1172 may involve connecting a mesh of devices across several different distribution facilities. The IoT devices may identify collection for each warehouse and the warehouses may use the IoT devices to communicate with each other. The IoT devices may be configured to process data without using the cloud.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications integrated with the platform for enabling an enterprise user of the platform to manage a set of value chain network entities from a point of origin to a point of customer use; and a unified set of Internet of Things systems that provide coordinated monitoring of a set of applications of at least two types from among a set of demand management applications, a set of supply chain applications, a set of intelligent product applications and a set of enterprise resource management applications for a category of goods.

In embodiments, the unified set of Internet of Things systems includes a set of smart home Internet of Things devices to enable monitoring of a set of demand factors and a set of Internet of Things devices deployed in proximity to a set of supply chain infrastructure facilities to enable monitoring of a set of supply factors.

In embodiments, the unified set of Internet of Things systems includes a set of workplace Internet of Things devices to enable monitoring of a set of demand factors for a set of business customers and a set of Internet of Things devices deployed in proximity to a set of supply chain infrastructure facilities to enable monitoring of a set of supply factors.

In embodiments, the unified set of Internet of Things systems includes a set of Internet of Things devices to monitor a set of consumer goods stores to enable monitoring of a set of demand factors for a set of consumers and a set of Internet of Things devices deployed in proximity to a set of supply chain infrastructure facilities to enable monitoring of a set of supply factors.

In embodiments, the Internet of Things systems as mentioned throughout this disclosure may include, for example and without limitations, camera systems, lighting systems, motion sensing systems, weighing systems, inspection systems, machine vision systems, environmental sensor systems, onboard sensor systems, onboard diagnostic systems, environmental control systems, sensor-enabled network switching and routing systems, RF sensing systems, magnetic sensing systems, pressure monitoring systems, vibration monitoring systems, temperature monitoring systems, heat flow monitoring systems, biological measurement systems, chemical measurement systems, ultrasonic monitoring systems, radiography systems, LIDAR-based monitoring systems, access control systems, penetrating wave sensing systems, SONAR-based monitoring systems, radar-based monitoring systems, computed tomography systems, magnetic resonance imaging systems, network monitoring systems, and many others.

Machine Vision Feeding Digital Twin

Figure 34:
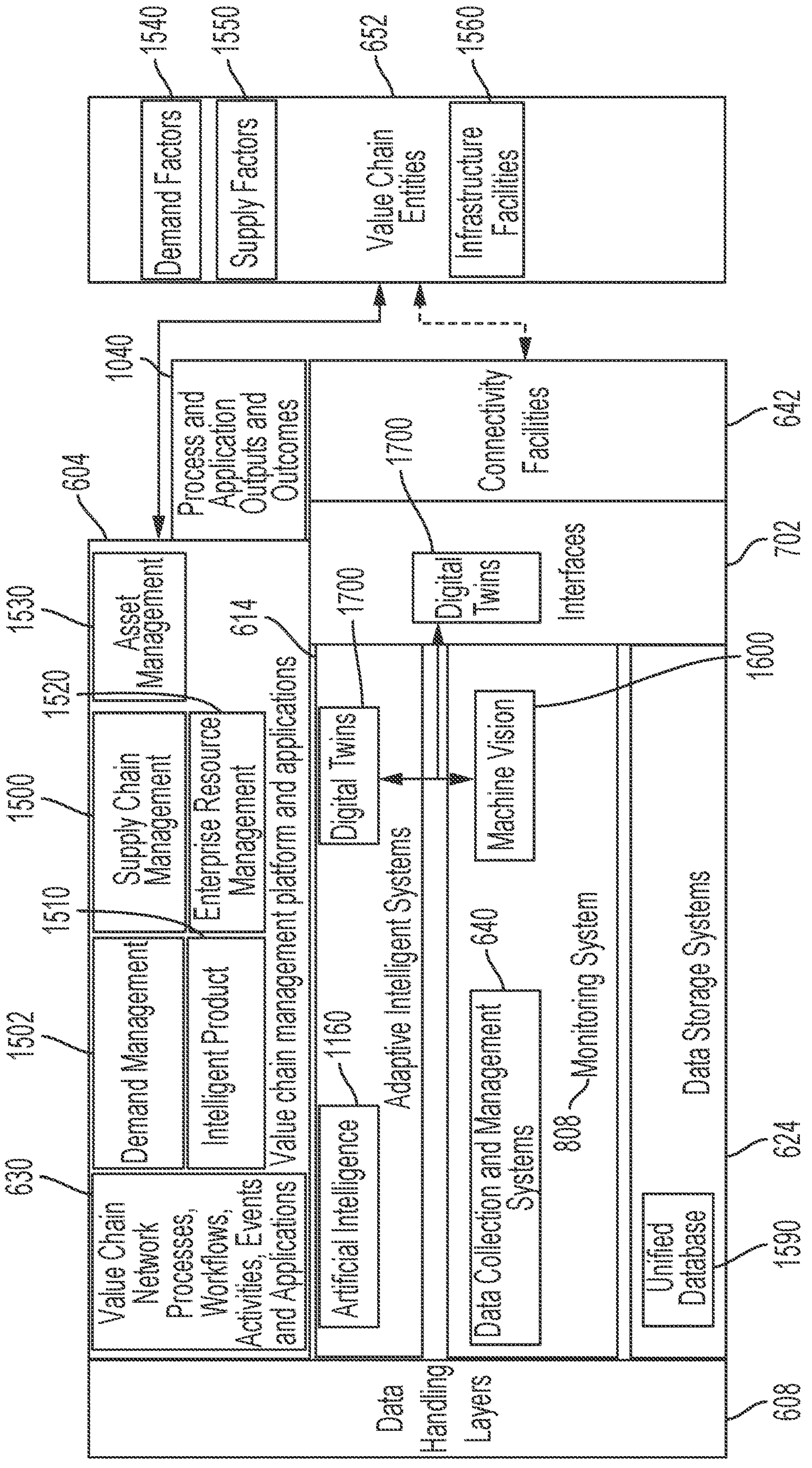
FIG. 34 is a block diagram showing components and relationships of a machine vision system and a digital twin in embodiments of a value chain network management platform in accordance with the present disclosure.

Referring to FIG. 34, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the platform 604 may include a machine vision system 1600 and a digital twin system 1700, wherein the machine vision system 1600 feeds data to the digital twin system 1700 (which may be enabled by a set of adaptive intelligent systems 614, including artificial intelligence 1160, and may be used as interfaces or components of interfaces 702, such as ones by which an operator may monitor twins 1700 of various value chain network entities 652). The machine vision system 1600 and digital twin system 1700 may operate in coordination for a set of multiple applications 630 of various types, such as a set of supply chain management applications 1500, demand management applications 1502, intelligent product applications 1510 and enterprise resource management applications 1520 that monitor and/or manage a value chain network and a set of value chain network entities 652.

The machine vision system 1600 and digital twin system 1700 may thus provide, in embodiments, image-based monitoring (with automated processing of image data) a wide range of facilities, devices, systems, environments, and assets, such as supply chain infrastructure facilities 1560 and other value chain network entities 652 that are involved as a product 650 travels from a point of origin through distribution and retail channels to an environment where it is used by a customer, as well as representation of images, as well as extracted data from images, in a digital twin 1700. This unification may provide a number of advantages, including improved monitoring, improved visualization and insight, improved visibility, and others. These may include machine vision systems 1600 and digital twin systems 1700 that are used in connection with demand factors 1540 and supply factors 1550, so that an application 630 may benefit from information collected by, processed, or produced by the machine vision system 1600 and digital twin system 1700 for other applications 630 of the platform 604, and a user can develop insights about connections among the factors and control one or both of them with coordinated intelligence. The machine vision system 1600 and/or digital twin system 1700 may be adapted over time, such as by learning on outcomes 1040 or other operations of the adaptive intelligent systems 614, such as to determine which elements collected and/or processed by the machine vision system 1600 and/or digital twin system 1700 should be made available to which applications 630, what elements and/or content provide the most benefit, what data should be stored or cached for immediate retrieval, what data can be discarded versus saved, what data is most beneficial to support adaptive intelligent systems 614, and for other uses.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and for a set of applications of at least two types from among a set of supply chain applications, a set of demand management applications, a set of intelligent product applications and a set of enterprise resource management applications and having a machine vision system and a digital twin system, wherein the machine vision system feeds data to the digital twin system.

In embodiments, the set of supply chain applications and demand management applications is among any described throughout this disclosure or in the documents incorporated by reference herein.

In embodiments, the set of supply chain applications and demand management applications includes, for example and without limitation one or more involving inventory management, demand prediction, demand aggregation, pricing, blockchain, smart contract, positioning, placement, promotion, analytics, finance, trading, arbitrage, customer identity management, store planning, shelf-planning, customer route planning, customer route analytics, commerce, ecommerce, payments, customer relationship management, sales, marketing, advertising, bidding, customer monitoring, customer process monitoring, customer relationship monitoring, collaborative filtering, customer profiling, customer feedback, similarity analytics, customer clustering, product clustering, seasonality factor analytics, customer behavior tracking, customer behavior analytics, product design, product configuration, A/B testing, product variation analytics, augmented reality, virtual reality, mixed reality, customer demand profiling, customer mood, emotion or affect detection, customer mood, emotion of affect analytics, business entity profiling, customer enterprise profiling, demand matching, location-based targeting, location-based offering, point of sale interface, point of use interface, search, advertisement, entity discovery, entity search, enterprise resource planning, workforce management, customer digital twin, product pricing, product bundling, product and service bundling, product assortment, upsell offer configuration, customer feedback engagement, customer survey, or others.

In embodiments, the set of supply chain applications and demand management applications may include, without limitation, one or more of supply chain, asset management, risk management, inventory management, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, supply chain digital twin, vendor profiling, supplier profiling, manufacturer profiling, logistics entity profiling, enterprise profiling, worker profiling, workforce profiling, component supply policy management, warehousing, distribution, fulfillment, shipping fleet management, vehicle fleet management, workforce management, maritime fleet management, navigation, routing, shipping management, opportunity matching, search, entity discovery, entity search, distribution, delivery, enterprise resource planning or other applications.

In embodiments, the set of supply chain applications and demand management applications may include, without limitation, one or more of asset management, risk management, inventory management, blockchain, smart contract, analytics, finance, trading, tax, regulatory, identity management, commerce, ecommerce, payments, security, safety, compatibility testing, compatibility management, incident management, predictive maintenance, monitoring, remote control, automation, self-configuration, self-healing, self-organization, waste reduction, augmented reality, virtual reality, mixed reality, product design, product configuration, product updating, product maintenance, product support, product testing, kit configuration, kit deployment, kit support, kit updating, kit maintenance, kit modification, kit management, product digital twin, opportunity matching, search, advertisement, entity discovery, entity search, variation, simulation, user interface, application programming interface, connectivity management, natural language interface, voice/speech interface, robotic interface, touch interface, haptic interface, vision system interface, enterprise resource planning, or other applications.

In embodiments, the set of supply chain applications and demand management applications may include, without limitation, one or more of operations, finance, asset management, supply chain management, demand management, human resource management, product management, risk management, regulatory and compliance management, inventory management, infrastructure management, facilities management, analytics, trading, tax, identity management, vendor management, process management, project management, operations management, customer relationship management, workforce management, incident management, research and development, sales management, marketing management, fleet management, opportunity analytics, decision support, strategic planning, forecasting, resource management, property management, or other applications.

In embodiments, the machine vision system includes an artificial intelligence system that is trained to recognize a type of value chain asset based on a labeled data set of images of such type of value chain assets.

In embodiments, the digital twin presents an indicator of the type of asset based on the output of the artificial intelligence system.

In embodiments, the machine vision system includes an artificial intelligence system that is trained to recognize a type of activity involving a set of value chain entities based on a labeled data set of images of such type of activity.

In embodiments, the digital twin presents an indicator of the type of activity based on the output of the artificial intelligence system.

In embodiments, the machine vision system includes an artificial intelligence system that is trained to recognize a safety hazard involving a value chain entity based on a training data set that includes a set of images of value chain network activities and a set of value chain network safety outcomes.

In embodiments, the digital twin presents an indicator of the hazard based on the output of the artificial intelligence system.

In embodiments, the machine vision system includes an artificial intelligence system that is trained to predict a delay based on a training data set that includes a set of images of value chain network activities and a set of value chain network timing outcomes.

In embodiments, the digital twin presents an indicator of a likelihood of delay based on the output of the artificial intelligence system.

As noted elsewhere herein and in documents incorporated by reference, artificial intelligence (such as any of the techniques or systems described throughout this disclosure) in connection with value chain network entities 652 and related processes and applications may be used to facilitate, among other things: (a) the optimization, automation and/or control of various functions, workflows, applications, features, resource utilization and other factors, (b) recognition or diagnosis of various states, entities, patterns, events, contexts, behaviors, or other elements; and/or (c) the forecasting of various states, events, contexts or other factors. As artificial intelligence improves, a large array of domain-specific and/or general artificial intelligence systems have become available and are likely to continue to proliferate. As developers seek solutions to domain-specific problems, such as ones relevant to value chain entities 652 and applications 630 described throughout this disclosure they face challenges in selecting artificial intelligence models (such as what set of neural networks, machine learning systems, expert systems, or the like to select) and in discovering and selecting what inputs may enable effective and efficient use of artificial intelligence for a given problem. As noted above, opportunity miners 1460 may assist with the discovery of opportunities for increased automation and intelligence; however, once opportunities are discovered, selection and configuration of an artificial intelligence solution still presents a significant challenge, one that is likely to continue to grow as artificial intelligence solutions proliferate.

One set of solutions to these challenges is an artificial intelligence store 3504 that is configured to enable collection, organization, recommendation and presentation of relevant sets of artificial intelligence systems based on one or more attributes of a domain and/or a domain-related problem. In embodiments, an artificial intelligence store 3504 may include a set of interfaces to artificial intelligence systems, such as enabling the download of relevant artificial intelligence applications, establishment of links or other connections to artificial intelligence systems (such as links to cloud-deployed artificial intelligence systems via APIs, ports, connectors, or other interfaces) and the like. The artificial intelligence store 3504 may include descriptive content with respect to each of a variety of artificial intelligence systems, such as metadata or other descriptive material indicating suitability of a system for solving particular types of problems (e.g., forecasting, NLP, image recognition, pattern recognition, motion detection, route optimization, or many others) and/or for operating on domain-specific inputs, data or other entities. In embodiments, the artificial intelligence store 3504 may be organized by category, such as domain, input types, processing types, output types, computational requirements and capabilities, cost, energy usage, and other factors. In embodiments, an interface to the application store 3504 may take input from a developer and/or from the platform (such as from an opportunity miner 1460) that indicates one or more attributes of a problem that may be addressed through artificial intelligence and may provide a set of recommendations, such as via an artificial intelligence attribute search engine, for a subset of artificial intelligence solutions that may represent favorable candidates based on the developer's domain-specific problem. Search results or recommendations may, in embodiments, be based at least in part on collaborative filtering, such as by asking developers to indicate or select elements of favorable models, as well as by clustering, such as by using similarity matrices, k-means clustering, or other clustering techniques that associate similar developers, similar domain-specific problems, and/or similar artificial intelligence solutions. The artificial intelligence store 3504 may include e-commerce features, such as ratings, reviews, links to relevant content, and mechanisms for provisioning, licensing, delivery and payment (including allocation of payments to affiliates and or contributors), including ones that operate using smart contract and/or blockchain features to automate purchasing, licensing, payment tracking, settlement of transactions, or other features.

Figure 43:
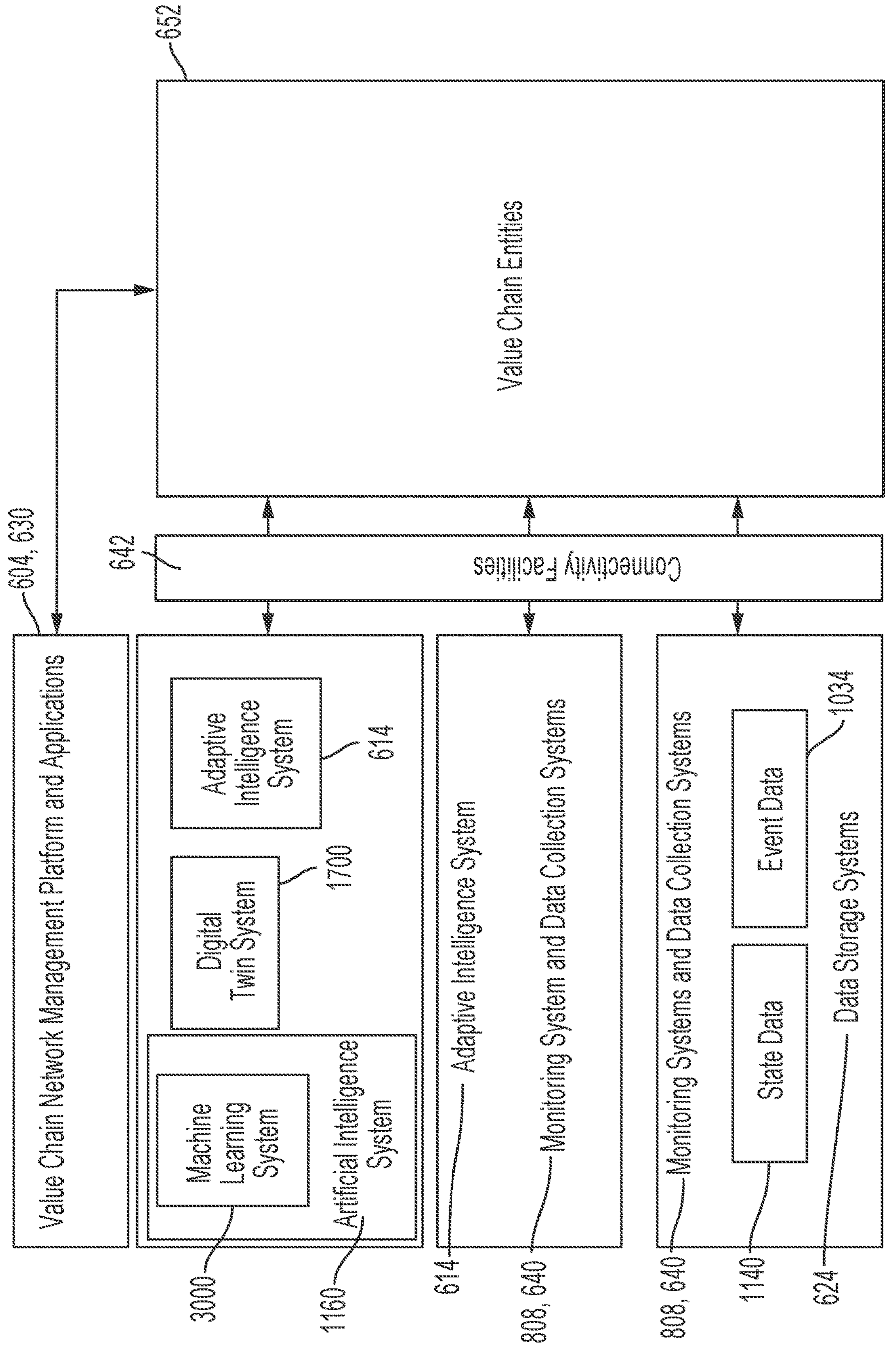
FIG. 43 is a schematic illustrating an example of a portion of an information technology system for value chain artificial intelligence leveraging digital twins according to some embodiments of the present disclosure.

Referring to FIG. 43, the artificial intelligence system 1160 may define a machine learning model 3000 for performing analytics, simulation, decision making, and prediction making related to data processing, data analysis, simulation creation, and simulation analysis of one or more of the value chain entities 652. The machine learning model 3000 is an algorithm and/or statistical model that performs specific tasks without using explicit instructions, relying instead on patterns and inference. The machine learning model 3000 builds one or more mathematical models based on training data to make predictions and/or decisions without being explicitly programmed to perform the specific tasks. The machine learning model 3000 may receive inputs of sensor data as training data, including event data 1034 and state data 1140 related to one or more of the value chain entities 652. The sensor data input to the machine learning model

3000 may be used to train the machine learning model 3000 to perform the analytics, simulation, decision making, and prediction making relating to the data processing, data analysis, simulation creation, and simulation analysis of the one or more of the value chain entities 652. The machine learning model 3000 may also use input data from a user or users of the information technology system. The machine learning model 3000 may include an artificial neural network, a decision tree, a support vector machine, a Bayesian network, a genetic algorithm, any other suitable form of machine learning model, or a combination thereof. The machine learning model 3000 may be configured to learn through supervised learning, unsupervised learning, reinforcement learning, self learning, feature learning, sparse dictionary learning, anomaly detection, association rules, a combination thereof, or any other suitable algorithm for learning.

The artificial intelligence system 1160 may also define the digital twin system 1700 to create a digital replica of one or more of the value chain entities 652. The digital replica of the one or more of the value chain entities 652 may use substantially real-time sensor data to provide for substantially real-time virtual representation of the value chain entity 652 and provides for simulation of one or more possible future states of the one or more value chain entities 652. The digital replica exists simultaneously with the one or more value chain entities 652 being replicated. The digital replica provides one or more simulations of both physical elements and properties of the one or more value chain entities 652 being replicated and the dynamics thereof, in embodiments, throughout the lifestyle of the one or more value chain entities 652 being replicated. The digital replica may provide a hypothetical simulation of the one or more value chain entities 652, for example during a design phase before the one or more value chain entities are constructed or fabricated, or during or after construction or fabrication of the one or more value chain entities by allowing for hypothetical extrapolation of sensor data to simulate a state of the one or more value chain entities 652, such as during high stress, after a period of time has passed during which component wear may be an issue, during maximum throughput operation, after one or more hypothetical or planned improvements have been made to the one or more value chain entities 652, or any other suitable hypothetical situation. In some embodiments, the machine learning model 3000 may automatically predict hypothetical situations for simulation with the digital replica, such as by predicting possible improvements to the one or more value chain entities 652, predicting when one or more components of the one or more value chain entities 652 may fail, and/or suggesting possible improvements to the one or more value chain entities 652, such as changes to timing settings, arrangement, components, or any other suitable change to the value chain entities 652. The digital replica allows for simulation of the one or more value chain entities 652 during both design and operation phases of the one or more value chain entities 652, as well as simulation of hypothetical operation conditions and configurations of the one or more value chain entities 652. The digital replica allows for invaluable analysis and simulation of the one or more value chain entities, by facilitating observation and measurement of nearly any type of metric, including temperature, wear, light, vibration, etc. not only in, on, and around each component of the one or more value chain entities 652, but in some embodiments within the one or more value chain entities 652. In some embodiments, the machine learning model 3000 may process the sensor data including the event data 1034 and the state data 1140 to define simulation data for use by the digital twin system 1700. The machine learning model 3000 may, for example, receive state data 1140 and event data 1034 related to a particular value chain entity 652 of the plurality of value chain entities 652 and perform a series of operations on the state data 1140 and the event data 1034 to format the state data 1140 and the event data 1034 into a format suitable for use by the digital twin system 1700 in creation of a digital replica of the value chain entity 652. For example, one or more value chain entities 652 may include a robot configured to augment products on an adjacent assembly line. The machine learning model 3000 may collect data from one or more sensors positioned on, near, in, and/or around the robot. The machine learning model 3000 may perform operations on the sensor data to process the sensor data into simulation data and output the simulation data to the digital twin system 1700. The digital twin simulation 1700 may use the simulation data to create one or more digital replicas of the robot, the simulation including for example metrics including temperature, wear, speed, rotation, and vibration of the robot and components thereof. The simulation may be a substantially real-time simulation, allowing for a human user of the information technology to view the simulation of the robot, metrics related thereto, and metrics related to components thereof, in substantially real time. The simulation may be a predictive or hypothetical situation, allowing for a human user of the information technology to view a predictive or hypothetical simulation of the robot, metrics related thereto, and metrics related to components thereof.

In some embodiments, the machine learning model 3000 and the digital twin system 1700 may process sensor data and create a digital replica of a set of value chain entities of the plurality of value chain entities 652 to facilitate design, real-time simulation, predictive simulation, and/or hypothetical simulation of a related group of value chain entities. The digital replica of the set of value chain entities may use substantially real-time sensor data to provide for substantially real-time virtual representation of the set of value chain entities and provide for simulation of one or more possible future states of the set of value chain entities. The digital replica exists simultaneously with the set of value chain entities being replicated. The digital replica provides one or more simulations of both physical elements and properties of the set of value chain entities being replicated and the dynamics thereof, in embodiments throughout the lifestyle of the set of value chain entities being replicated. The one or more simulations may include a visual simulation, such as a wire-frame virtual representation of the one or more value chain entities 652 that may be viewable on a monitor, using an augmented reality (AR) apparatus, or using a virtual reality (VR) apparatus. The visual simulation may be able to be manipulated by a human user of the information technology system, such as zooming or highlighting components of the simulation and/or providing an exploded view of the one or more value chain entities 652. The digital replica may provide a hypothetical simulation of the set of value chain entities, for example during a design phase before the one or more value chain entities are constructed or fabricated, or during or after construction or fabrication of the one or more value chain entities by allowing for hypothetical extrapolation of sensor data to simulate a state of the set of value chain entities, such as during high stress, after a period of time has passed during which component wear may be an issue, during maximum throughput operation, after one or more hypothetical or planned improvements have been made to the set of value chain entities, or any other suitable hypothetical situation. In some embodiments, the machine learning model 3000 may automatically predict hypothetical situations for simulation with the digital replica, such as by predicting possible improvements to the set of value chain entities, predicting when one or more components of the set of value chain entities may fail, and/or suggesting possible improvements to the set of value chain entities, such as changes to timing settings, arrangement, components, or any other suitable change to the value chain entities 652. The digital replica allows for simulation of the set of value chain entities during both design and operation phases of the set of value chain entities, as well as simulation of hypothetical operation conditions and configurations of the set of value chain entities. The digital replica allows for invaluable analysis and simulation of the one or more value chain entities, by facilitating observation and measurement of nearly any type of metric, including temperature, wear, light, vibration, etc. not only in, on, and around each component of the set of value chain entities, but in some embodiments within the set of value chain entities. In some embodiments, the machine learning model 3000 may process the sensor data including the event data 1034 and the state data 1140 to define simulation data for use by the digital twin system 1700. The machine learning model 3000 may, for example, receive state data 1140 and event data 1034 related to a particular value chain entity 652 of the plurality of value chain entities 652 and perform a series of operations on the state data 1140 and the event data 1034 to format the state data 1140 and the event data 1034 into a format suitable for use by the digital twin system 1700 in the creation of a digital replica of the set of value chain entities. For example, a set of value chain entities may include a die machine configured to place products on a conveyor belt, the conveyor belt on which the die machine is configured to place the products, and a plurality of robots configured to add parts to the products as they move along the assembly line. The machine learning model 3000 may collect data from one or more sensors positioned on, near, in, and/or around each of the die machines, the conveyor belt, and the plurality of robots. The machine learning model 3000 may perform operations on the sensor data to process the sensor data into simulation data and output the simulation data to the digital twin system 1700. The digital twin simulation 1700 may use the simulation data to create one or more digital replicas of the die machine, the conveyor belt, and the plurality of robots, the simulation including for example metrics including temperature, wear, speed, rotation, and vibration of the die machine, the conveyor belt, and the plurality of robots and components thereof. The simulation may be a substantially real-time simulation, allowing for a human user of the information technology to view the simulation of the die machine, the conveyor belt, and the plurality of robots, metrics related thereto, and metrics related to components thereof, in substantially real time. The simulation may be a predictive or hypothetical situation, allowing for a human user of the information technology to view a predictive or hypothetical simulation of the die machine, the conveyor belt, and the plurality of robots, metrics related thereto, and metrics related to components thereof.

In some embodiments, the machine learning model 3000 may prioritize collection of sensor data for use in digital replica simulations of one or more of the value chain entities 652. The machine learning model 3000 may use sensor data and user inputs to train, thereby learning which types of sensor data are most effective for creation of digital replicate simulations of one or more of the value chain entities 652. For example, the machine learning model 3000 may find that a particular value chain entity 652 has dynamic properties such as component wear and throughput affected by temperature, humidity, and load. The machine learning model 3000 may, through machine learning, prioritize collection of sensor data related to temperature, humidity, and load, and may prioritize processing sensor data of the prioritized type into simulation data for output to the digital twin system 1700. In some embodiments, the machine learning model 3000 may suggest to a user of the information technology system that more and/or different sensors of the prioritized type be implemented in the information technology and value chain system near and around the value chain entity 652 being simulation such that more and/or better data of the prioritized type may be used in simulation of the value chain entity 652 via the digital replica thereof.

In some embodiments, the machine learning model 3000 may be configured to learn to determine which types of sensor data are to be processed into simulation data for transmission to the digital twin system 1700 based on one or both of a modeling goal and a quality or type of sensor data. A modeling goal may be an objective set by a user of the information technology system or may be predicted or learned by the machine learning model 3000. Examples of modeling goals include creating a digital replica capable of showing dynamics of throughput on an assembly line, which may include collection, simulation, and modeling of, e.g., thermal, electrical power, component wear, and other metrics of a conveyor belt, an assembly machine, one or more products, and other components of the value chain. The machine learning model 3000 may be configured to learn to determine which types of sensor data are necessary to be processed into simulation data for transmission to the digital twin system 1700 to achieve such a model. In some embodiments, the machine learning model 3000 may analyze which types of sensor data are being collected, the quality and quantity of the sensor data being collected, and what the sensor data being collected represents, and may make decisions, predictions, analyses, and/or determinations related to which types of sensor data are and/or are not relevant to achieving the modeling goal and may make decisions, predictions, analyses, and/or determinations to prioritize, improve, and/or achieve the quality and quantity of sensor data being processed into simulation data for use by the digital twin system 1700 in achieving the modeling goal.

In some embodiments, a user of the information technology system may input a modeling goal into the machine learning model 3000. The machine learning model 3000 may learn to analyze training data to output suggestions to the user of the information technology system regarding which types of sensor data are most relevant to achieving the modeling goal, such as one or more types of sensors positioned in, on, or near a value chain entity or a plurality of value chain entities that is relevant to the achievement of the modeling goal is and/or are not sufficient for achieving the modeling goal, and how a different configuration of the types of sensors, such as by adding, removing, or repositioning sensors, may better facilitate achievement of the modeling goal by the machine learning model 3000 and the digital twin system 1700. In some embodiments, the machine learning model 3000 may automatically increase or decrease collection rates, processing, storage, sampling rates, bandwidth allocation, bitrates, and other attributes of sensor data collection to achieve or better achieve the modeling goal. In some embodiments, the machine learning model 3000 may make suggestions or predictions to a user of the information technology system related to increasing or decreasing collection rates, processing, storage, sampling rates, bandwidth allocation, bitrates, and other attributes of sensor data collection to achieve or better achieve the modeling goal. In some embodiments, the machine learning model 3000 may use sensor data, simulation data, previous, current, and/or future digital replica simulations of one or more value chain entities 652 of the plurality of value chain entities 652 to automatically create and/or propose modeling goals. In some embodiments, modeling goals automatically created by the machine learning model 3000 may be automatically implemented by the machine learning model 3000. In some embodiments, modeling goals automatically created by the machine learning model 3000 may be proposed to a user of the information technology system, and implemented only after acceptance and/or partial acceptance by the user, such as after modifications are made to the proposed modeling goal by the user.

In some embodiments, the user may input the one or more modeling goals, for example, by inputting one or more modeling commands to the information technology system. The one or more modeling commands may include, for example, a command for the machine learning model 3000 and the digital twin system 1700 to create a digital replica simulation of one value chain entity 652 or a set of value chain entities of the plurality of 652, may include a command for the digital replica simulation to be one or more of a real-time simulation, and a hypothetical simulation. The modeling command may also include, for example, parameters for what types of sensor data should be used, sampling rates for the sensor data, and other parameters for the sensor data used in the one or more digital replica simulations. In some embodiments, the machine learning model 3000 may be configured to predict modeling commands, such as by using previous modeling commands as training data. The machine learning model 3000 may propose predicted modeling commands to a user of the information technology system, for example, to facilitate simulation of one or more of the value chain entities 652 that may be useful for the management of the value chain entities 652 and/or to allow the user to easily identify potential issues with or possible improvements to the value chain entities 652.

In some embodiments, the machine learning model 3000 may be configured to evaluate a set of hypothetical simulations of one or more of the value chain entities 652. The set of hypothetical simulations may be created by the machine learning model 3000 and the digital twin system 1700 as a result of one or more modeling commands, as a result of one or more modeling goals, one or more modeling commands, by prediction by the machine learning model 3000, or a combination thereof. The machine learning model 3000 may evaluate the set of hypothetical simulations based on one or more metrics defined by the user, one or more metrics defined by the machine learning model 3000, or a combination thereof. In some embodiments, the machine learning model 3000 may evaluate each of the hypothetical simulations of the set of hypothetical simulations independently of one another. In some embodiments, the machine learning model 3000 may evaluate one or more of the hypothetical simulations of the set of hypothetical simulations in relation to one another, for example by ranking the hypothetical simulations or creating tiers of the hypothetical simulations based on one or more metrics.

In some embodiments, the machine learning model 3000 may include one or more model interpretability systems to facilitate human understanding of outputs of the machine learning model 3000, as well as information and insight related to cognition and processes of the machine learning model 3000, i.e., the one or more model interpretability systems allow for human understanding of not only "what" the machine learning model 3000 is outputting, but also "why" the machine learning model 3000 is outputting the outputs thereof, and what process led to the 3000 formulating the outputs. The one or more model interpretability systems may also be used by a human user to improve and guide training of the machine learning model 3000, to help debug the machine learning model 3000, to help recognize bias in the machine learning model 3000. The one or more model interpretability systems may include one or more of linear regression, logistic regression, a generalized linear model (GLM), a generalized additive model (GAM), a decision tree, a decision rule, RuleFit, Naive Bayes Classifier, a K-nearest neighbors algorithm, a partial dependence plot, individual conditional expectation (ICE), an accumulated local effects (ALE) plot, feature interaction, permutation feature importance, a global surrogate model, a local surrogate (LIME) model, scoped rules, i.e. anchors, Shapley values, Shapley additive explanations (SHAP), feature visualization, network dissection, or any other suitable machine learning interpretability implementation. In some embodiments, the one or more model interpretability systems may include a model dataset visualization system. The model dataset visualization system is configured to automatically provide to a human user of the information technology system visual analysis related to distribution of values of the sensor data, the simulation data, and data nodes of the machine learning model 3000.

In some embodiments, the machine learning model 3000 may include and/or implement an embedded model interpretability system, such as a Bayesian case model (BCM) or glass box. The Bayesian case model uses Bayesian case-based reasoning, prototype classification, and clustering to facilitate human understanding of data such as the sensor data, the simulation data, and data nodes of the machine learning model 3000. In some embodiments, the model interpretability system may include and/or implement a glass box interpretability method, such as a Gaussian process, to facilitate human understanding of data such as the sensor data, the simulation data, and data nodes of the machine learning model 3000.

In some embodiments, the machine learning model 3000 may include and/or implement testing with concept activation vectors (TCAV). The TCAV allows the machine learning model 3000 to learn human-interpretable concepts, such as "running," "not running," "powered," "not powered," "robot," "human," "truck," or "ship" from examples by a process including defining the concept, determining concept activation vectors, and calculating directional derivatives. By learning human-interpretable concepts, objects, states, etc., TCAV may allow the machine learning model 3000 to output useful information related to the value chain entities 652 and data collected therefrom in a format that is readily understood by a human user of the information technology system.

In some embodiments, the machine learning model 3000 may be and/or include an artificial neural network, e.g. a connectionist system configured to "learn" to perform tasks by considering examples and without being explicitly programmed with task-specific rules. The machine learning model 3000 may be based on a collection of connected units and/or nodes that may act like artificial neurons that may in some ways emulate neurons in a biological brain. The units and/or nodes may each have one or more connections to other units and/or nodes. The units and/or nodes may be configured to transmit information, e.g. one or more signals, to other units and/or nodes, process signals received from other units and/or nodes, and forward processed signals to other units and/or nodes. One or more of the units and/or nodes and connections therebetween may have one or more numerical "weights" assigned. The assigned weights may be configured to facilitate learning, i.e. training, of the machine learning model 3000. The weights assigned weights may increase and/or decrease one or more signals between one or more units and/or nodes, and in some embodiments may have one or more thresholds associated with one or more of the weights. The one or more thresholds may be configured such that a signal is only sent between one or more units and/or nodes, if a signal and/or aggregate signal crosses the threshold. In some embodiments, the units and/or nodes may be assigned to a plurality of layers, each of the layers having one or both of inputs and outputs. A first layer may be configured to receive training data, transform at least a portion of the training data, and transmit signals related to the training data and transformation thereof to a second layer. A final layer may be configured to output an estimate, conclusion, product, or other consequence of processing of one or more inputs by the machine learning model 3000. Each of the layers may perform one or more types of transformations, and one or more signals may pass through one or more of the layers one or more times. In some embodiments, the machine learning model 3000 may employ deep learning and being at least partially modeled and/or configured as a deep neural network, a deep belief network, a recurrent neural network, and/or a convolutional neural network, such as by being configured to include one or more hidden layers.

In some embodiments, the machine learning model 3000 may be and/or include a decision tree, e.g. a tree-based predictive model configured to identify one or more observations and determine one or more conclusions based on an input. The observations may be modeled as one or more "branches" of the decision tree, and the conclusions may be modeled as one or more "leaves" of the decision tree. In some embodiments, the decision tree may be a classification tree. the classification tree may include one or more leaves representing one or more class labels, and one or more branches representing one or more conjunctions of features configured to lead to the class labels. In some embodiments, the decision tree may be a regression tree. The regression tree may be configured such that one or more target variables may take continuous values.

In some embodiments, the machine learning model 3000 may be and/or include a support vector machine, e.g. a set of related supervised learning methods configured for use in one or both of classification and regression-based modeling of data. The support vector machine may be configured to predict whether a new example falls into one or more categories, the one or more categories being configured during training of the support vector machine.

In some embodiments, the machine learning model 3000 may be configured to perform regression analysis to determine and/or estimate a relationship between one or more inputs and one or more features of the one or more inputs. Regression analysis may include linear regression, wherein the machine learning model 3000 may calculate a single line to best fit input data according to one or more mathematical criteria.

In embodiments, inputs to the machine learning model 3000 (such as a regression model, Bayesian network, supervised model, or other type of model) may be tested, such as by using a set of testing data that is independent from the data set used for the creation and/or training of the machine learning model, such as to test the impact of various inputs to the accuracy of the model 3000. For example, inputs to the regression model may be removed, including single inputs, pairs of inputs, triplets, and the like, to determine whether the absence of inputs creates a material degradation of the success of the model 3000. This may assist with recognition of inputs that are in fact correlated (e.g., are linear combinations of the same underlying data), that are overlapping, or the like. Comparison of model success may help select among alternative input data sets that provide similar information, such as to identify the inputs (among several similar ones) that generate the least "noise" in the model, that provide the most impact on model effectiveness for the lowest cost, or the like. Thus, input variation and testing of the impact of input variation on model effectiveness may be used to prune or enhance model performance for any of the machine learning systems described throughout this disclosure.

In some embodiments, the machine learning model 3000 may be and/or include a Bayesian network. The Bayesian network may be a probabilistic graphical model configured to represent a set of random variables and conditional independence of the set of random variables. The Bayesian network may be configured to represent the random variables and conditional independence via a directed acyclic graph. The Bayesian network may include one or both of a dynamic Bayesian network and an influence diagram.

In some embodiments, the machine learning model 3000 may be defined via supervised learning, i.e. one or more algorithms configured to build a mathematical model of a set of training data containing one or more inputs and desired outputs. The training data may consist of a set of training examples, each of the training examples having one or more inputs and desired outputs, i.e. a supervisory signal. Each of the training examples may be represented in the machine learning model 3000 by an array and/or a vector, i.e. a feature vector. The training data may be represented in the machine learning model 3000 by a matrix. The machine learning model 3000 may learn one or more functions via iterative optimization of an objective function, thereby learning to predict an output associated with new inputs. Once optimized, the objective function may provide the machine learning model 3000 with the ability to accurately determine an output for inputs other than inputs included in the training data. In some embodiments, the machine learning model 3000 may be defined via one or more supervised learning algorithms such as active learning, statistical classification, regression analysis, and similarity learning. Active learning may include interactively querying, by the machine learning model AILD102T, a user and/or an information source to label new data points with desired outputs. Statistical classification may include identifying, by the machine learning model 3000, to which a set of subcategories, i.e. subpopulations, a new observation belongs based on a training set of data containing observations having known categories. Regression analysis may include estimating, by the machine learning model 3000 relationships between a dependent variable, i.e. an outcome variable, and one or more independent variables, i.e. predictors, covariates, and/or features. Similarity learning may include learning, by the machine learning model 3000, from examples using a similarity function, the similarity function being designed to measure how similar or related two objects are.

In some embodiments, the machine learning model 3000 may be defined via unsupervised learning, i.e. one or more algorithms configured to build a mathematical model of a set of data containing only inputs by finding structure in the data such as grouping or clustering of data points. In some embodiments, the machine learning model 3000 may learn from test data, i.e. training data, that has not been labeled, classified, or categorized. The unsupervised learning algorithm may include identifying, by the machine learning model 3000, commonalities in the training data and learning by reacting based on the presence or absence of the identified commonalities in new pieces of data. In some embodiments, the machine learning model 3000 may generate one or more probability density functions. In some embodiments, the machine learning model 3000 may learn by performing cluster analysis, such as by assigning a set of observations into subsets, i.e. clusters, according to one or more predesignated criteria, such as according to a similarity metric of which internal compactness, separation, estimated density, and/or graph connectivity are factors.

In some embodiments, the machine learning model 3000 may be defined via semi-supervised learning, i.e. one or more algorithms using training data wherein some training examples may be missing training labels. The semi-supervised learning may be weakly supervised learning, wherein the training labels may be noisy, limited, and/or imprecise. The noisy, limited, and/or imprecise training labels may be cheaper and/or less labor intensive to produce, thus allowing the machine learning model 3000 to train on a larger set of training data for less cost and/or labor.

In some embodiments, the machine learning model 3000 may be defined via reinforcement learning, such as one or more algorithms using dynamic programming techniques such that the machine learning model 3000 may train by taking actions in an environment in order to maximize a cumulative reward. In some embodiments, the training data is represented as a Markov Decision Process.

In some embodiments, the machine learning model 3000 may be defined via self-learning, wherein the machine learning model 3000 is configured to train using training data with no external rewards and no external teaching, such as by employing a Crossbar Adaptive Array (CAA). The CAA may compute decisions about actions and/or emotions about consequence situations in a crossbar fashion, thereby driving teaching of the machine learning model 3000 by interactions between cognition and emotion.

In some embodiments, the machine learning model 3000 may be defined via feature learning, i.e. one or more algorithms designed to discover increasingly accurate and/or apt representations of one or more inputs provided during training, e.g. training data. Feature learning may include training via principal component analysis and/or cluster analysis. Feature learning algorithms may include attempting, by the machine learning model 3000, to preserve input training data while also transforming the input training data such that the transformed input training data is useful. In some embodiments, the machine learning model 3000 may be configured to transform the input training data prior to performing one or more classifications and/or predictions of the input training data. Thus, the machine learning model 3000 may be configured to reconstruct input training data from one or more unknown data-generating distributions without necessarily conforming to implausible configurations of the input training data according to the distributions. In some embodiments, the feature learning algorithm may be performed by the machine learning model 3000 in a supervised, unsupervised, or semi-supervised manner.

In some embodiments, the machine learning model 3000 may be defined via anomaly detection, i.e. by identifying rare and/or outlier instances of one or more items, events and/or observations. The rare and/or outlier instances may be identified by the instances differing significantly from patterns and/or properties of a majority of the training data. Unsupervised anomaly detection may include detecting of anomalies, by the machine learning model 3000, in an unlabeled training data set under an assumption that a majority of the training data is "normal." Supervised anomaly detection may include training on a data set wherein at least a portion of the training data has been labeled as "normal" and/or "abnormal."

In some embodiments, the machine learning model 3000 may be defined via robot learning. Robot learning may include generation, by the machine learning model 3000, of one or more curricula, the curricula being sequences of learning experiences, and cumulatively acquiring new skills via exploration guided by the machine learning model 3000 and social interaction with humans by the machine learning model 3000. Acquisition of new skills may be facilitated by one or more guidance mechanisms such as active learning, maturation, motor synergies, and/or imitation.

In some embodiments, the machine learning model 3000 can be defined via association rule learning. Association rule learning may include discovering relationships, by the machine learning model 3000, between variables in databases, in order to identify strong rules using some measure of "interestingness." Association rule learning may include identifying, learning, and/or evolving rules to store, manipulate and/or apply knowledge. The machine learning model 3000 may be configured to learn by identifying and/or utilizing a set of relational rules, the relational rules collectively representing knowledge captured by the machine learning model 3000. Association rule learning may include one or more of learning classifier systems, inductive logic programming, and artificial immune systems. Learning classifier systems are algorithms that may combine a discovery component, such as one or more genetic algorithms, with a learning component, such as one or more algorithms for supervised learning, reinforcement learning, or unsupervised learning. Inductive logic programming may include rule-learning, by the machine learning model 3000, using logic programming to represent one or more of input examples, background knowledge, and hypothesis determined by the machine learning model 3000 during training. The machine learning model 3000 may be configured to derive a hypothesized logic program entailing all positive examples given an encoding of known background knowledge and a set of examples represented as a logical database of facts.

In embodiments, another set of solutions, which may be deployed alone or in connection with other elements of the platform, including the artificial intelligence store 3504, may include a set of functional imaging capabilities FMRP102, which may comprise monitoring systems 640 and in some cases physical process observation systems 1510 and/or software interaction observation systems 1500, such as for monitoring various value chain entities 652. Functional imaging systems FMRP102 may, in embodiments, provide considerable insight into the types of artificial intelligence that are likely to be most effective in solving particular types of problems most effectively. As noted elsewhere in this disclosure and in the documents incorporated by reference herein, computational and networking systems, as they grow in scale, complexity and interconnections, manifest problems of information overload, noise, network congestion, energy waste, and many others. As the Internet of Things grows to hundreds of billions of devices, and virtually countless potential interconnections, optimization becomes exceedingly difficult. One source for insight is the human brain, which faces similar challenges and has evolved, over millennia, reasonable solutions to a wide range of very difficult optimization problems. The human brain operates with a massive neural network organized into interconnected modular systems, each of which has a degree of adaptation to solve particular problems, from regulation of biological systems and maintenance of homeostasis, to detection of a wide range of static and dynamic patterns, to recognition of threats and opportunities, among many others. Functional imaging FMRP102, such as functional magnetic resonance imaging (fMRI), electroencephalogram (EEG), computed tomography (CT) and other brain imaging systems have improved to the point that patterns of brain activity can be recognized in real time and temporally associated with other information, such behaviors, stimulus information, environmental condition data, gestures, eye movements, and other information, such that via functional imaging FMRP102, either alone or in combination with other information collected by monitoring systems IPX106, the platform may determine and classify what brain modules, operations, systems, and/or functions are employed during the undertaking of a set of tasks or activities, such as ones involving software interaction 1500, physical process observations 1510, or a combination thereof. This classification may assist in selection and/or configuration of a set of artificial intelligence solutions, such as from an artificial intelligence store 3504, that includes a similar set of capabilities and/or functions to the set of modules and functions of the human brain when undertaking an activity, such as for the initial configuration of a robotic process automation (RPA) system 1442 that automates a task performed by an expert human. Thus, the platform may include a system that takes input from a functional imaging system FRMP102 to configure, optionally automatically based on matching of attributes between one or more biological systems, such as brain systems, and one or more artificial intelligence systems, a set of artificial intelligence capabilities for a robotic process automation system. Selection and configuration may further comprise selection of inputs to robotic process automation and/or artificial intelligence that are configured at least in part based on functional imaging of the brain while workers undertake tasks, such as selection of visual inputs (such as images from cameras) where vision systems of the brain are highly activated, selection of acoustic inputs where auditory systems of the brain are highly activated, selection of chemical inputs (such as chemical sensors) where olfactory systems of the brain are highly activated, or the like. Thus, a biologically aware robotic process automation system may be improved by having initial configuration, or iterative improvement, be guided, either automatically or under developer control, by imaging-derived information collected as workers perform expert tasks that may benefit from automation.

Figure 27:
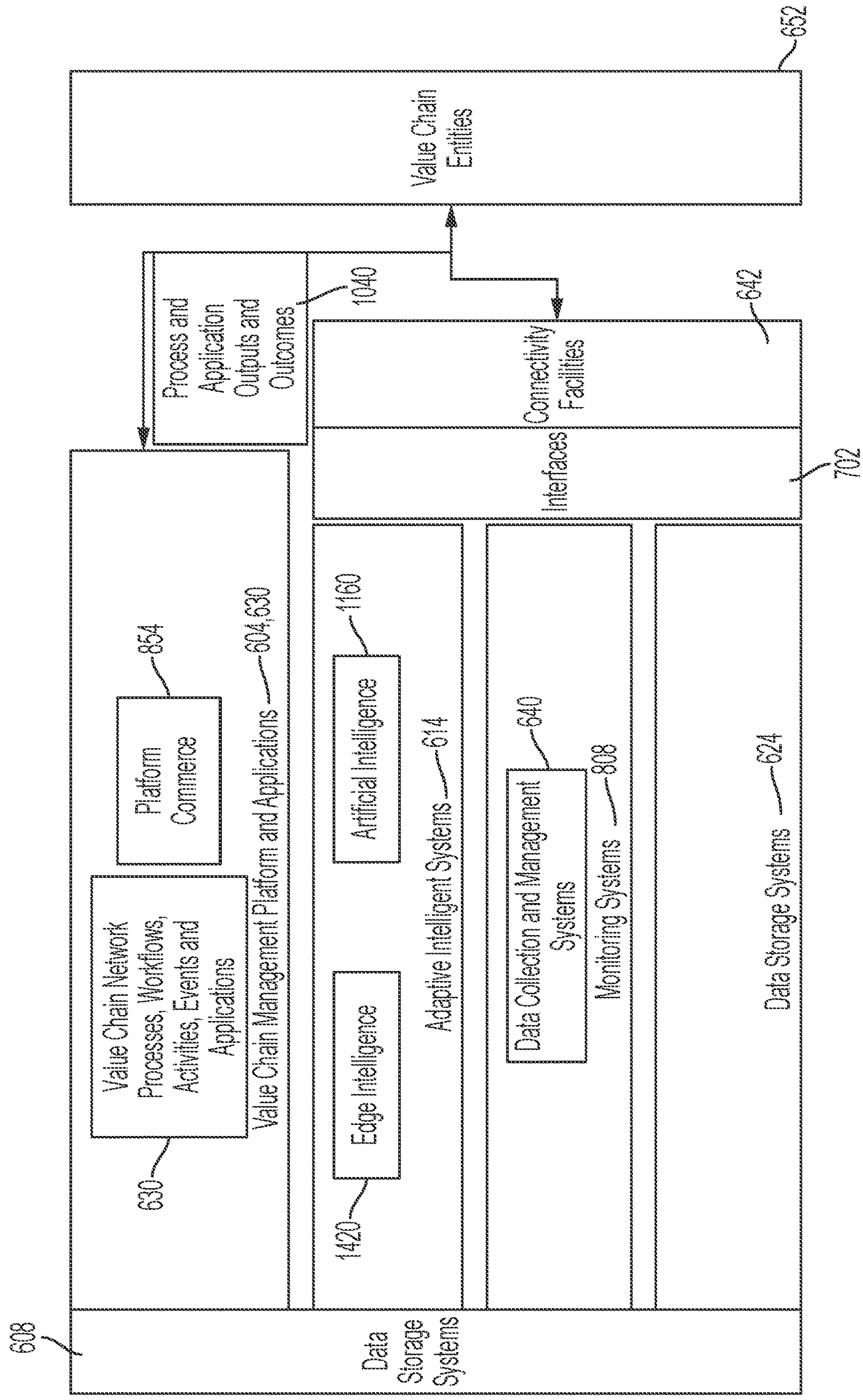
FIG. 27 is a block diagram showing components and relationships of a set of edge intelligence systems in embodiments of a value chain network management platform in accordance with the present disclosure.

Referring to FIG. 27, additional details of an embodiment of the platform 604 are provided, in particular relating to elements of the adaptive intelligence layer 614 that facilitate improved edge intelligence, including the adaptive edge compute management system 1400 and the edge intelligence system 1420. These elements provide a set of systems that adaptively manage "edge" computation, storage and processing, such as by varying storage locations for data and processing locations (e.g., optimized by AI) between on-device storage, local systems, in the network and in the cloud. These elements enable facilitation of a dynamic definition by a user, such as a developer, operator, or host of the platform 102, of what constitutes the "edge" for purposes of a given application. For example, for environments where data connections are slow or unreliable (such as where a facility does not have good access to cellular networks (such as due to remoteness of some environments (such as in geographies with poor cellular network infrastructure), shielding or interference (such as where density of network-using systems, thick metals hulls of container ships, thick metal container walls, underwater or underground location, or presence of large metal objects (such as vaults, hulls, containers and the like) interferes with networking performance), and/or congestion (such as where there are many devices seeking access to limited networking facilities), edge computing capabilities can be defined and deployed to operate on the local area network of an environment, in peer-to-peer networks of devices, or on computing capabilities of local value chain entities 652. For example, in an environment with a limited set of computational and/or networking resources, tasks may be intelligently load balanced based on a current context (e.g., network availability, latency, congestion, and the like) and, in an example, one type of data may be prioritized for processing, or one workflow prioritized over another workflow, and the like. Where strong data connections are available (such as where good backhaul facilities exist), edge computing capabilities can be disposed in the network, such as for caching frequently used data at locations that improve input/output performance, reduce latency, or the like. Thus, adaptive definition and specification of where edge computing operations are enabled, under control of a developer or operator, or optionally determined automatically, such as by an expert system or automation system, such as based on detected network conditions for an environment, for a financial entity 652, or for a network as a whole.

In embodiments, edge intelligence 1420 enables adaptation of edge computation (including where computation occurs within various available networking resources, how networking occurs (such as by protocol selection), where data storage occurs, and the like) that is multi-application aware, such as accounting for QoS, latency requirements, congestion, and cost as understood and prioritized based on awareness of the requirements, the prioritization, and the value (including ROI, yield, and cost information, such as costs of failure) of edge computation capabilities across more than one application, including any combinations and subsets of the applications 630 described herein or in the documents incorporated herein by reference.

Figure 35:
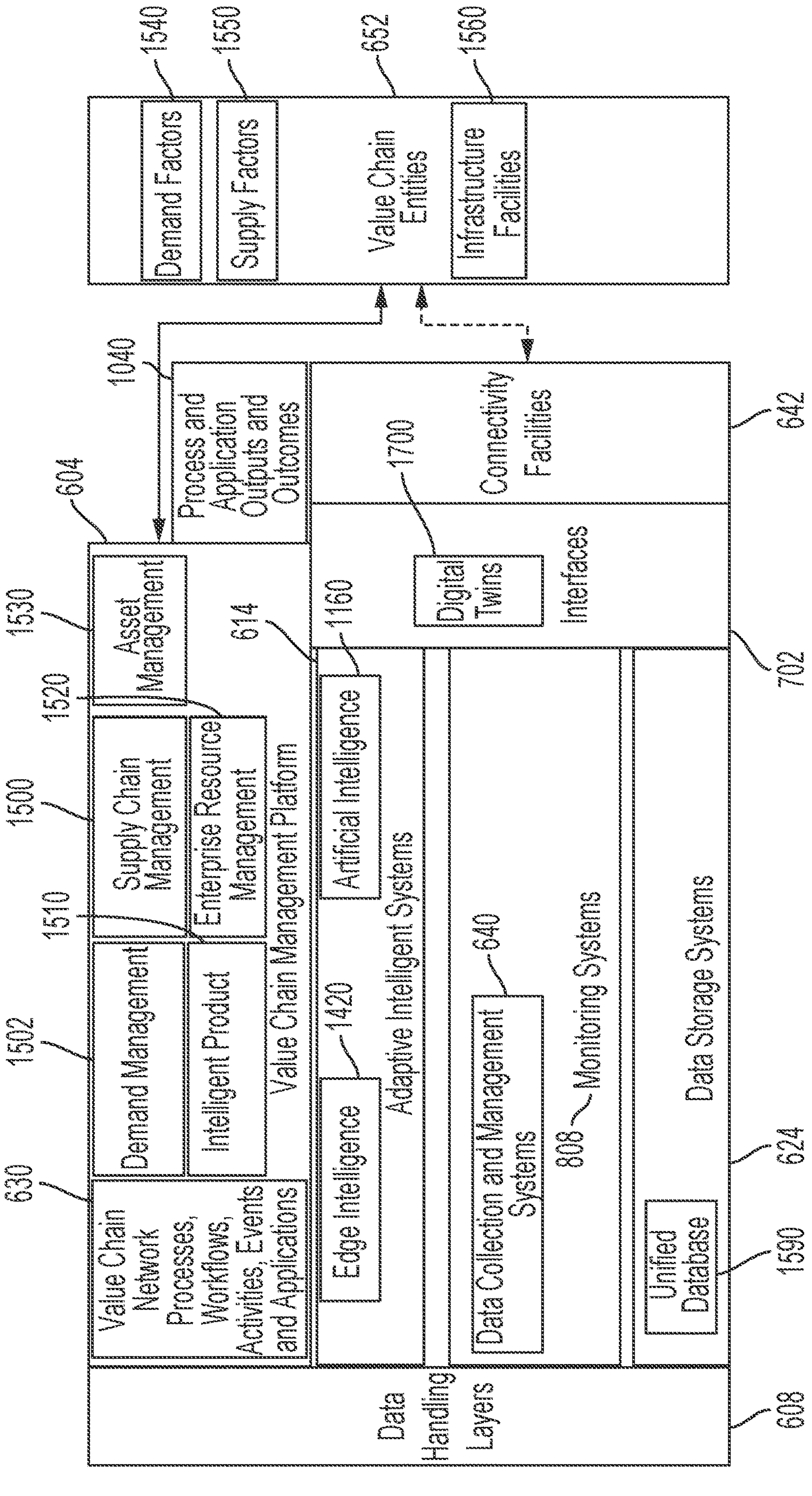
FIG. 35 is a block diagram showing components and relationships of a set of adaptive edge intelligence systems in embodiments of a value chain network management platform in accordance with the present disclosure.

Referring to FIG. 35, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the platform 604 may include a unified set of adaptive edge computing and other edge intelligence systems 1420 that provide coordinated edge computation and other edge intelligence 1420 capabilities for a set of multiple applications 630 of various types, such as a set of supply chain management applications 1500, demand management applications 1502, intelligent product applications 1510 and enterprise resource management applications 1520 that monitor and/or manage a value chain network and a set of value chain network entities 652. In embodiments, edge intelligence capabilities of the systems and methods described herein may include, but are not limited to, on-premise edge devices and resources, such as local area network resources, and network edge devices, such as those deployed at the edge of a cellular network or within a peripheral data center, both of which may deploy edge intelligence, as described herein, to, for example, carry out intelligent processing tasks at these edge locations before transferring data or other matter, to the primary or core cellular network command or central data center.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified set of adaptive edge computing systems that provide coordinated edge computation for a set of applications of at least two types from among a set of demand management applications, a set of supply chain applications, a set of intelligent product applications and a set of enterprise resource management applications for a category of goods.

The adaptive edge computing and other edge intelligence systems 1420 may thus provide, in embodiments, intelligence for monitoring, managing, controlling, or otherwise handling a wide range of facilities, devices, systems, environments, and assets, such as supply chain infrastructure facilities 1560 and other value chain network entities 652 that are involved as a product 650 travels from a point of origin through distribution and retail channels to an environment where it is used by a customer. This unification may provide a number of advantages, including improved monitoring, improved remote control, improved autonomy, improved prediction, improved classification, improved visualization and insight, improved visibility, and others. These may include adaptive edge computing and other edge intelligence systems 1420 that are used in connection with demand factors 1540 and supply factors 1550, so that an application 630 may benefit from information collected by, processed by, or produced by the adaptive edge computing and other edge intelligence systems 1420 for other applications 630 of the platform 604, and a user can develop insights about connections among the factors and control one or both of them with coordinated intelligence. For example, coordinated intelligence may include, but is not limited to, analytics and processing for monitoring data streams, as described herein, for the purposes of classification, prediction or some other type of analytic modeling. Such coordinated intelligence methods and systems may be applied in an automated manner in which differing combinations of intelligence assets are applied. As an example, within an industrial environment the coordinated intelligence system may monitor signals coming from machinery deployed in the environment. The coordinated intelligence system may classify, predict or perform some other intelligent analytics, in combination, for the purpose of, for example, determining a state of a machine, such as a machine in a deteriorated state, in an at-risk state, or some other state. The determination of a state may cause a control system to alter a control regime, for example, slowing or shutting down a machine that is in a deteriorating state. In embodiments, the coordinated intelligence system may coordinate across multiple entities of a value chain, supply chain and the like. For example, the monitoring of the deteriorating machine in the industrial environment may simultaneously occur with analytics related to parts suppliers and availability, product supply and inventory predictions, or some other coordinated intelligence operation. The adaptive edge computing and other edge intelligence systems 1420 may be adapted over time, such as by learning on outcomes 1040 or other operations of the other adaptive intelligent systems 614, such as to determine which elements collected and/or processed by the adaptive edge computing and other edge intelligence systems 1420 should be made available to which applications 630, what elements and/or content provide the most benefit, what data should be stored or cached for immediate retrieval, what data can be discarded versus saved, what data is most beneficial to support adaptive intelligent systems 614, and for other uses.

Figure 36:
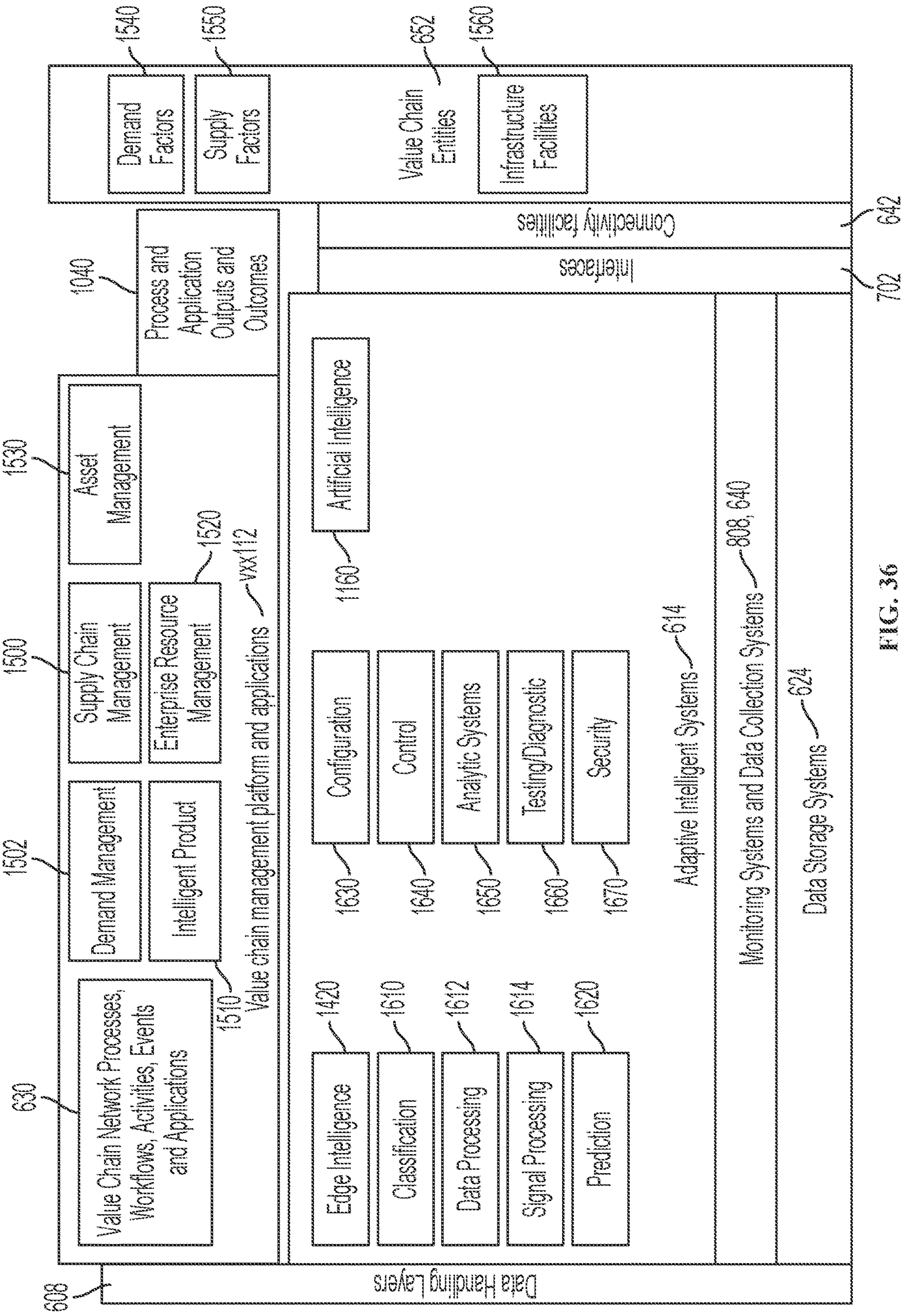
FIG. 36 is a block diagram showing additional details of components and relationships of a set of adaptive edge intelligence systems in embodiments of a value chain network management platform in accordance with the present disclosure.

Referring to FIG. 36, in embodiments, the unified set of adaptive edge computing systems that provide coordinated edge computation include a wide range of systems, such as classification systems 1610 (such as image classification systems, object type recognition systems, and others), video processing systems 1612 (such as video compression systems), signal processing systems 1614 (such as analog-to-digital transformation systems, digital-to-analog transformation systems, RF filtering systems, analog signal processing systems, multiplexing systems, statistical signal processing systems, signal filtering systems, natural language processing systems, sound processing systems, ultrasound processing systems, and many others), data processing systems 1630 (such as data filtering systems, data integration systems, data extraction systems, data loading systems, data transformation systems, point cloud processing systems, data normalization systems, data cleansing system, data deduplication systems, graph-based data storage systems, object-oriented data storage systems, and others), predictive systems 1620 (such as motion prediction systems, output prediction systems, activity prediction systems, fault prediction systems, failure prediction systems, accident prediction systems, event predictions systems, event prediction systems, and many others), configuration systems 1630 (such as protocol selection systems, storage configuration systems, peer-to-peer network configuration systems, power management systems, self-configuration systems, self-healing systems, handshake negotiation systems, and others), artificial intelligence systems 1160 (such as clustering systems, variation systems, machine learning systems, expert systems, rule-based systems, deep learning systems, and many others), system management and control systems 1640 (such as autonomous control systems, robotic control systems, RF spectrum management systems, network resource management systems, storage management systems, data management systems, and others), robotic process automation systems, analytic and modeling systems 1650 (such as data visualization systems, clustering systems, similarity analysis systems, random forest systems, physical modeling systems, interaction modeling systems, simulation systems, and many others), entity discovery systems, security systems 1670 (such as cybersecurity systems, biometric systems, intrusion detection systems, firewall systems, and others), rules engine systems, workflow automation systems, opportunity discovery systems, testing and diagnostic systems 1660, software image propagation systems, virtualization systems, digital twin systems, Internet of Things monitoring systems, routing systems, switching systems, indoor location systems, geolocation systems, and others.

In embodiments, the interface is a user interface for a command center dashboard by which an enterprise orchestrates a set of value chain entities related to a type of product.

In embodiments, the interface is a user interface of a local management system located in an environment that hosts a set of value chain entities.

In embodiments, the local management system user interface facilitates configuration of a set of network connections for the adaptive edge computing systems.

In embodiments, the local management system user interface facilitates configuration of a set of data storage resources for the adaptive edge computing systems.

In embodiments, the local management system user interface facilitates configuration of a set of data integration capabilities for the adaptive edge computing systems.

In embodiments, the local management system user interface facilitates configuration of a set of machine learning input resources for the adaptive edge computing systems.

In embodiments, the local management system user interface facilitates configuration of a set of power resources that support the adaptive edge computing systems.

In embodiments, the local management system user interface facilitates configuration of a set of workflows that are managed by the adaptive edge computing systems.

In embodiments, the interface is a user interface of a mobile computing device that has a network connection to the adaptive edge computing systems.

In embodiments, the interface is an application programming interface.

In embodiments, the application programming interface facilitates exchange of data between the adaptive edge computing systems and a cloud-based artificial intelligence system.

In embodiments, the application programming interface facilitates exchange of data between the adaptive edge computing systems and a real-time operating system of a cloud data management platform.

In embodiments, the application programming interface facilitates exchange of data between the adaptive edge computing systems and a computational facility of a cloud data management platform.

In embodiments, the application programming interface facilitates exchange of data between the adaptive edge computing systems and a set of environmental sensors that collect data about an environment that hosts a set of value chain network entities.

In embodiments, the application programming interface facilitates exchange of data between the adaptive edge computing systems and a set of sensors that collect data about a product.

In embodiments, the application programming interface facilitates exchange of data between the adaptive edge computing systems and a set of sensors that collect data published by an intelligent product.

In embodiments, the application programming interface facilitates exchange of data between the adaptive edge computing systems and a set of sensors that collect data published by a set of Internet of Things systems that are disposed in an environment that hosts a set of value chain network entities.

In embodiments, the set of demand management applications, supply chain applications, intelligent product applications and enterprise resource management applications may include, for example, any of the applications mentioned throughout this disclosure or in the documents incorporated by reference herein.

Unified Adaptive Intelligence

Figure 37:
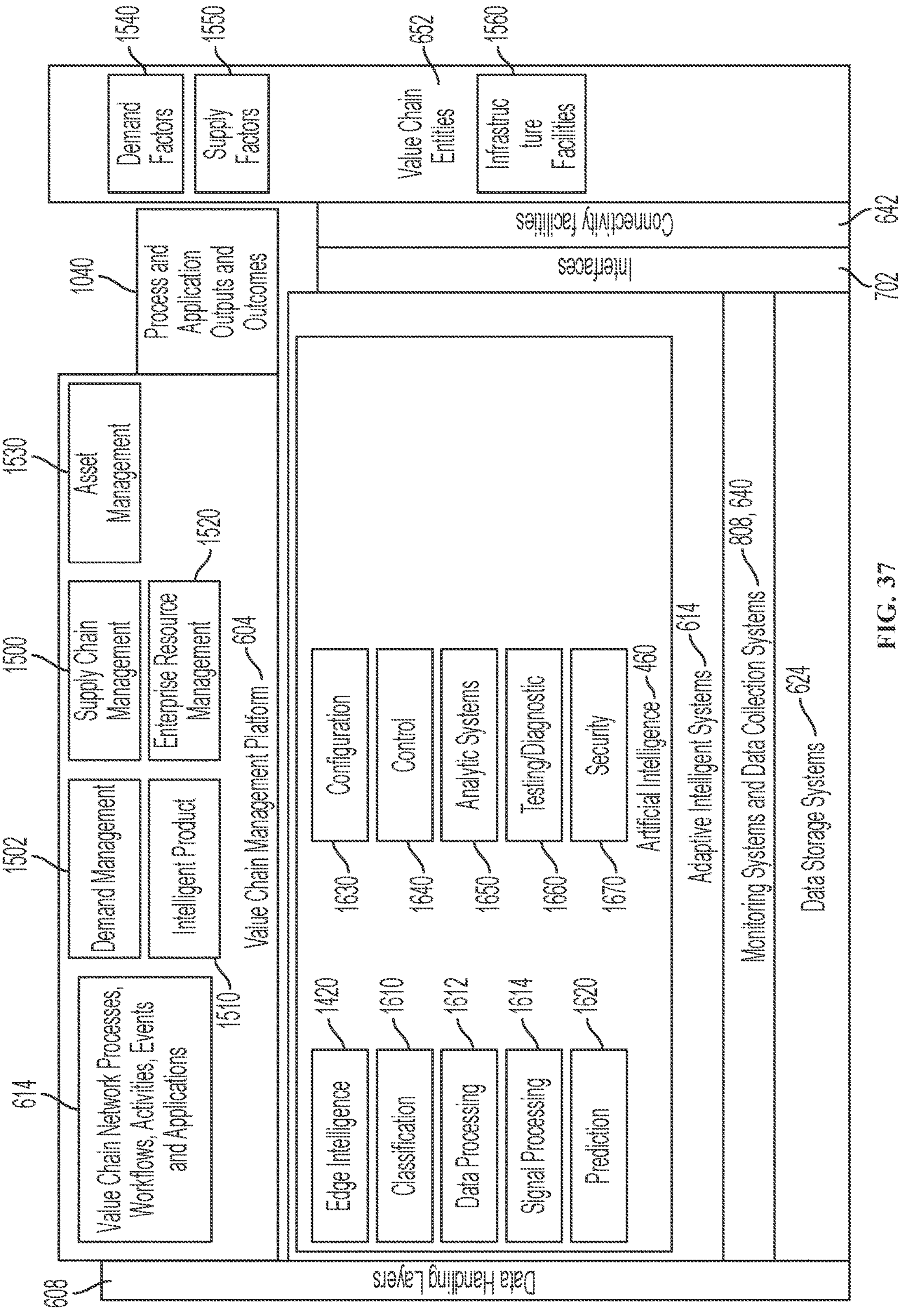
FIG. 37 is a block diagram showing components and relationships of a set of unified adaptive intelligence systems in embodiments of a value chain network management platform in accordance with the present disclosure.

Referring to FIG. 37, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the VCNP 102 may include a unified set of adaptive intelligent systems 614 that provide coordinated intelligence for a set of various applications, such as demand management applications 1502, a set of supply chain applications 1500, a set of intelligent product applications 1510, a set of enterprise resource management applications 1520 and a set of asset management applications 1530 for a category of goods.

In embodiments, the unified set of adaptive intelligence systems include a wide variety of systems described throughout this disclosure and in the documents incorporated herein by reference, such as, without limitation, the edge intelligence systems 1420, classification systems 1610, data processing systems 1612, signal processing systems 1614, artificial intelligence systems 1160, prediction systems 1620, configuration systems 1630, control systems 1640, analytic systems 1650, testing/diagnostic systems 1660, security systems 1670 and other systems, whether used for edge intelligence or for intelligence within a network, within an application, or in the cloud, as well as to serve various layers of the platform 604. These include neural networks, deep learning systems, model-based systems, expert systems, machine learning systems, rule-based systems, opportunity miners, robotic process automation systems, data transformation systems, data extraction systems, data loading systems, genetic programming systems, image classification systems, video compression systems, analog-to-digital transformation systems, digital-to-analog transformation systems, signal analysis systems, RF filtering systems, motion prediction systems, object type recognition systems, point cloud processing systems, analog signal processing systems, signal multiplexing systems, data fusion systems, sensor fusion systems, data filtering systems, statistical signal processing systems, signal filtering systems, signal processing systems, protocol selection systems, storage configuration systems, power management systems, clustering systems, variation systems, machine learning systems, event prediction systems, autonomous control systems, robotic control systems, robotic process automation systems, data visualization systems, data normalization systems, data cleansing systems, data deduplication systems, graph-based data storage systems, intelligent agent systems, object-oriented data storage systems, self-configuration systems, self-healing systems, self-organizing systems, self-organizing map systems, cost-based routing systems, handshake negotiation systems, entity discovery systems, cybersecurity systems, biometric systems, natural language processing systems, speech processing systems, voice recognition systems, sound processing systems, ultrasound processing systems, artificial intelligence systems, rules engine systems, workflow automation systems, opportunity discovery systems, physical modeling systems, testing systems, diagnostic systems, software image propagation systems, peer-to-peer network configuration systems, RF spectrum management systems, network resource management systems, storage management systems, data management systems, intrusion detection systems, firewall systems, virtualization systems, digital twin systems, Internet of Things monitoring systems, routing systems, switching systems, indoor location systems, geolocation systems, parsing systems, semantic filtering systems, machine vision systems, fuzzy logic systems, recommendation systems, dialog management systems, and others.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified set of adaptive intelligence systems that provide coordinated intelligence for a set of demand management applications, a set of supply chain applications, a set of intelligent product applications and a set of enterprise resource management applications for a category of goods.

In embodiments, the unified set of adaptive intelligent systems includes a set of artificial intelligence systems. In embodiments, the unified set of adaptive intelligent systems includes a set of neural networks. In embodiments, the unified set of adaptive intelligent systems includes a set of deep learning systems. In embodiments, the unified set of adaptive intelligent systems includes a set of model-based systems.

In embodiments, the unified set of adaptive intelligent systems includes a set of expert systems. In embodiments, the unified set of adaptive intelligent systems includes a set of machine learning systems. In embodiments, the unified set of adaptive intelligent systems includes a set of rule-based systems. In embodiments, the unified set of adaptive intelligent systems includes a set of opportunity miners.

In embodiments, the unified set of adaptive intelligent systems includes a set of robotic process automation systems. In embodiments, the unified set of adaptive intelligent systems includes a set of data transformation systems. In embodiments, the unified set of adaptive intelligent systems includes a set of data extraction systems. In embodiments, the unified set of adaptive intelligent systems includes a set of data loading systems. In embodiments, the unified set of adaptive intelligent systems includes a set of genetic programming systems.

In embodiments, the unified set of adaptive intelligent systems includes a set of image classification systems. In embodiments, the unified set of adaptive intelligent systems includes a set of video compression systems. In embodiments, the unified set of adaptive intelligent systems includes a set of analog-to-digital transformation systems. In embodiments, the unified set of adaptive intelligent systems includes a set of digital-to-analog transformation systems. In embodiments, the unified set of adaptive intelligent systems includes a set of signal analysis systems.

In embodiments, the unified set of adaptive intelligent systems includes a set of RF filtering systems. In embodiments, the unified set of adaptive intelligent systems includes a set of motion prediction systems. In embodiments, the unified set of adaptive intelligent systems includes a set of object type recognition systems. In embodiments, the unified set of adaptive intelligent systems includes a set of point cloud processing systems. In embodiments, the unified set of adaptive intelligent systems includes a set of analog signal processing systems.

In embodiments, the unified set of adaptive intelligent systems includes a set of signal multiplexing systems. In embodiments, the unified set of adaptive intelligent systems includes a set of data fusion systems. In embodiments, the unified set of adaptive intelligent systems includes a set of sensor fusion systems. In embodiments, the unified set of adaptive intelligent systems includes a set of data filtering systems. In embodiments, the unified set of adaptive intelligent systems includes a set of statistical signal processing systems.

In embodiments, the unified set of adaptive intelligent systems includes a set of signal filtering systems. In embodiments, the unified set of adaptive intelligent systems includes a set of signal processing systems. In embodiments, the unified set of adaptive intelligent systems includes a set of protocol selection systems. In embodiments, the unified set of adaptive intelligent systems includes a set of storage configuration systems. In embodiments, the unified set of adaptive intelligent systems includes a set of power management systems.

In embodiments, the unified set of adaptive intelligent systems includes a set of clustering systems. In embodiments, the unified set of adaptive intelligent systems includes a set of variation systems. In embodiments, the unified set of adaptive intelligent systems includes a set of machine learning systems. In embodiments, the unified set of adaptive intelligent systems includes a set of event prediction systems. In embodiments, the unified set of adaptive intelligent systems includes a set of autonomous control systems.

In embodiments, the unified set of adaptive intelligent systems includes a set of robotic control systems. In embodiments, the unified set of adaptive intelligent systems includes a set of robotic process automation systems. In embodiments, the unified set of adaptive intelligent systems includes a set of data visualization systems. In embodiments, the unified set of adaptive intelligent systems includes a set of data normalization systems. In embodiments, the unified set of adaptive intelligent systems includes a set of data cleansing systems.

In embodiments, the unified set of adaptive intelligent systems includes a set of data deduplication systems. In embodiments, the unified set of adaptive intelligent systems includes a set of graph-based data storage systems. In embodiments, the unified set of adaptive intelligent systems includes a set of intelligent agent systems. In embodiments, the unified set of adaptive intelligent systems includes a set of object-oriented data storage systems.

In embodiments, the unified set of adaptive intelligent systems includes a set of self-configuration systems. In embodiments, the unified set of adaptive intelligent systems includes a set of self-healing systems. In embodiments, the unified set of adaptive intelligent systems includes a set of self-organizing systems. In embodiments, the unified set of adaptive intelligent systems includes a set of self-organizing map systems.

In embodiments, the unified set of adaptive intelligent systems includes a set of cost-based routing systems. In embodiments, the unified set of adaptive intelligent systems includes a set of handshake negotiation systems. In embodiments, the unified set of adaptive intelligent systems includes a set of entity discovery systems. In embodiments, the unified set of adaptive intelligent systems includes a set of cybersecurity systems.

In embodiments, the unified set of adaptive intelligent systems includes a set of biometric systems. In embodiments, the unified set of adaptive intelligent systems includes a set of natural language processing systems. In embodiments, the unified set of adaptive intelligent systems includes a set of speech processing systems. In embodiments, the unified set of adaptive intelligent systems includes a set of voice recognition systems.

In embodiments, the unified set of adaptive intelligent systems includes a set of sound processing systems. In embodiments, the unified set of adaptive intelligent systems includes a set of ultrasound processing systems. In embodiments, the unified set of adaptive intelligent systems includes a set of artificial intelligence systems. In embodiments, the unified set of adaptive intelligent systems includes a set of rules engine systems.

In embodiments, the unified set of adaptive intelligent systems includes a set of workflow automation systems. In embodiments, the unified set of adaptive intelligent systems includes a set of opportunity discovery systems. In embodiments, the unified set of adaptive intelligent systems includes a set of physical modeling systems. In embodiments, the unified set of adaptive intelligent systems includes a set of testing systems.

In embodiments, the unified set of adaptive intelligent systems includes a set of diagnostic systems. In embodiments, the unified set of adaptive intelligent systems includes a set of software image propagation systems. In embodiments, the unified set of adaptive intelligent systems includes a set of peer-to-peer network configuration systems. In embodiments, the unified set of adaptive intelligent systems includes a set of RF spectrum management systems.

In embodiments, the unified set of adaptive intelligent systems includes a set of network resource management systems. In embodiments, the unified set of adaptive intelligent systems includes a set of storage management systems. In embodiments, the unified set of adaptive intelligent systems includes a set of data management systems. In embodiments, the unified set of adaptive intelligent systems includes a set of intrusion detection systems.

In embodiments, the unified set of adaptive intelligent systems includes a set of firewall systems. In embodiments, the unified set of adaptive intelligent systems includes a set of virtualization systems. In embodiments, the unified set of adaptive intelligent systems includes a set of digital twin systems. In embodiments, the unified set of adaptive intelligent systems includes a set of Internet of Things monitoring systems.

In embodiments, the unified set of adaptive intelligent systems includes a set of routing systems. In embodiments, the unified set of adaptive intelligent systems includes a set of switching systems. In embodiments, the unified set of adaptive intelligent systems includes a set of indoor location systems. In embodiments, the unified set of adaptive intelligent systems includes a set of geolocation systems.

In embodiments, the unified set of adaptive intelligent systems includes a set of parsing systems. In embodiments, the unified set of adaptive intelligent systems includes a set of semantic filtering systems. In embodiments, the unified set of adaptive intelligent systems includes a set of machine vision systems. In embodiments, the unified set of adaptive intelligent systems includes a set of fuzzy logic systems.

In embodiments, the unified set of adaptive intelligent systems includes a set of recommendation systems. In embodiments, the unified set of adaptive intelligent systems includes a set of dialog management systems. In embodiments, the set of interfaces includes a demand management interface and a supply chain management interface. In embodiments, the interface is a user interface for a command center dashboard by which an enterprise orchestrates a set of value chain entities related to a type of product.

In embodiments, the interface is a user interface of a local management system located in an environment that hosts a set of value chain entities. In embodiments, the local management system user interface facilitates configuration of a set of network connections for the adaptive intelligence systems. In embodiments, the local management system user interface facilitates configuration of a set of data storage resources for the adaptive intelligence systems. In embodiments, the local management system user interface facilitates configuration of a set of data integration capabilities for the adaptive intelligence systems.

In embodiments, the local management system user interface facilitates configuration of a set of machine learning input resources for the adaptive intelligence systems. In embodiments, the local management system user interface facilitates configuration of a set of power resources that support the adaptive intelligence systems. In embodiments, the local management system user interface facilitates configuration of a set of workflows that are managed by the adaptive intelligence systems.

In embodiments, the interface is a user interface of a mobile computing device that has a network connection to the adaptive intelligence systems.

In embodiments, the interface is an application programming interface. In embodiments, the application programming interface facilitates exchange of data between the adaptive intelligence systems and a cloud-based artificial intelligence system. In embodiments, the application programming interface facilitates exchange of data between the adaptive intelligence systems and a real-time operating system of a cloud data management platform.

In embodiments, the application programming interface facilitates exchange of data between the adaptive intelligence systems and a computational facility of a cloud data management platform.

In embodiments, the application programming interface facilitates exchange of data between the adaptive intelligence systems and a set of environmental sensors that collect data about an environment that hosts a set of value chain network entities. In embodiments, the application programming interface facilitates exchange of data between the adaptive intelligence systems and a set of sensors that collect data about a product.

In embodiments, the application programming interface facilitates exchange of data between the adaptive intelligence systems and a set of sensors that collect data published by an intelligent product.

In embodiments, the application programming interface facilitates exchange of data between the adaptive intelligence systems and a set of sensors that collect data published by a set of Internet of Things systems that are disposed in an environment that hosts a set of value chain network entities.

In embodiments, the set of demand management applications, supply chain applications, intelligent product applications and enterprise resource management applications may include, any of the applications mentioned throughout this disclosure or the documents incorporated herein by reference.

In embodiments, the adaptive intelligent systems layer 614 is configured to train and deploy artificial intelligence systems to perform value-chain related tasks. For example, the adaptive intelligent systems layer 614 may be leveraged to manage a container fleet, design a logistics system, control one or more aspects of a logistics system, select packaging attributes of packages in the value chain, design a process to meet regulatory requirements, automate processes to mitigate waste production (e.g., solid waste or waste water), and/or other suitable tasks related to the value-chain.

In some of these embodiments, one or more digital twins may be leveraged by the adaptive intelligent systems layer 614. A digital twin may refer to a digital representation of a physical object (e.g., an asset, a device, a product, a package, a container, a vehicle, a ship, or the like), an environment (e.g., a facility), an individual (e.g., a customer or worker), or other entity (including any of the value chain network entities 652 described herein), or combination thereof. Further examples of physical assets include containers (e.g., boxes, shipping containers, boxes, palates, barrels, and the like), goods/products (e.g., widgets, food, household products, toys, clothing, water, gas, oil, equipment, and the like), components (e.g., chips, boards, screens, chipsets, wires, cables, cards, memory, software components, firmware, parts, connectors, housings, and the like), furniture (e.g., tables, counters, workstations, shelving, etc.), and the like. Examples of devices include computers, sensors, vehicles (e.g., cars, trucks, tankers, trains, forklifts, cranes, and the like), equipment, conveyer belts, and the like. Examples of environments may include facilities (e.g., factories, refineries, warehouses, retail locations, storage buildings, parking lots, airports, commercial buildings, residential buildings, and the like), roads, water ways, cities, countries, land masses, and the like. Examples of different types of physical assets, devices, and environments are referenced throughout the disclosure.

In embodiments, a digital twin may be comprised of (e.g., via reference, or by partial or complete integration) other digital twins. For example, a digital twin of a package may include a digital twin of a container and one or more digital twins of one or more respective goods enclosed within the container. Taking this example one step further, one or more digital twins of the packages may be contained in a digital twin of a vehicle traversing a digital twin of a road or may be positioned on a digital twin of a shelf within a digital twin of a warehouse, which would include digital twins of other physical assets and devices.

In embodiments, the digital representation for a digital twin may include a set of data structures (e.g., classes of objects) that collectively define a set of properties, attributes, and/or parameters of a represented physical asset, device, or environment, possible behaviors or activities thereof and/or possible states or conditions thereof, among other things. For example, a set of properties of a physical asset may include a type of the physical asset, the shape and/or dimensions of the asset, the mass of the asset, the density of the asset, the material(s) of the asset, the physical properties of the material(s), the chemical properties of the asset, the expected lifetime of the asset, the surface of the physical asset, a price of the physical asset, the status of the physical asset, a location of the physical asset, and/or other properties, as well as identifiers of other digital twins contained within or linked to the digital twin and/or other relevant data sources that may be used to populate the digital twin (such as data sources within the management platform described herein or external data sources, such as environmental data sources that may impact properties represented in the digital twin (e.g., where ambient air pressure or temperature affects the physical dimensions of an asset that inflates or deflates). Examples of a behavior of a physical asset may include a state of matter of the physical asset (e.g., a solid, liquid, plasma or gas), a melting point of the physical asset, a density of the physical asset when in a liquid state, a viscosity of the physical asset when in a liquid state, a freezing point of the physical asset, a density of the physical asset when in a solid state, a hardness of the physical asset when in a solid state, the malleability of the physical asset, the buoyancy of the physical asset, the conductivity of the physical asset, electromagnetic properties of the physical asset, radiation properties, optical properties (e.g., reflectivity, transparency, opacity, albedo, and the like), wave interaction properties (e.g., transparency or opacity to radio waves, reflection properties, shielding properties, or the like), a burning point of the physical asset, the manner by which humidity affects the physical asset, the manner by which water or other liquids affect the physical asset, and the like. In another example, the set of properties of a device may include a type of the device, the dimensions of the device, the mass of the device, the density of the density of the device, the material(s) of the device, the physical properties of the material(s), the surface of the device, the output of the device, the status of the device, a location of the device, a trajectory of the device, identifiers of other digital twins that the device is connected to and/or contains, and the like. Examples of the behaviors of a device may include a maximum acceleration of a device, a maximum speed of a device, possible motions of a device, possible configurations of the device, operating modes of the device, a heating profile of a device, a cooling profile of a device, processes that are performed by the device, operations that are performed by the device, and the like. Example properties of an environment may include the dimensions of the environment, environmental air pressure, the temperature of the environment, the humidity of the environment, the airflow of the environment, the physical objects in the environment, currents of the environment (if a body of water), and the like. Examples of behaviors of an environment may include scientific laws that govern the environment, processes that are performed in the environment, rules or regulations that must be adhered to in the environment, and the like.

In embodiments, the properties of a digital twin may be adjusted. For example, the temperature of a digital twin, a humidity of a digital twin, the shape of a digital twin, the material of a digital twin, the dimensions of a digital twin, or any other suitable parameters may be adjusted to conform to current status data and/or to a predicted status of a corresponding entity.

In embodiments, a digital twin may be rendered by a computing device, such that a human user can view a digital representation of a set of physical assets, devices, or other entities, and/or an environment thereof. For example, the digital twin may be rendered and provided as an output, or may provide an output, to a display device. In some embodiments, the digital twin may be rendered and output in an augmented reality and/or virtual reality display. For example, a user may view a 3D rendering of an environment (e.g., using monitor or a virtual reality headset). While doing so, the user may inspect digital twins of physical assets or devices in the environment. In embodiments, a user may view processes being performed with respect to one or more digital twins (e.g., inventorying, loading, packing, shipping, and the like). In embodiments, a user may provide input that controls one or more properties of a digital twin via a graphical user interface.

In some embodiments, the adaptive intelligent systems layer 614 is configured to execute simulations using the digital twin. For example, the adaptive intelligent systems layer 614 may iteratively adjust one or more parameters of a digital twin and/or one or more embedded digital twins. In embodiments, the adaptive intelligent systems layer 614 may, for each set of parameters, execute a simulation based on the set of parameters and may collect the simulation outcome data resulting from the simulation. Put another way, the adaptive intelligent systems layer 614 may collect the properties of the digital twin and the digital twins within or containing the digital twin used during the simulation as well as any outcomes stemming from the simulation. For example, in running a simulation on a digital twin of a shipping container, the adaptive intelligent systems layer 614 can vary the materials of the shipping container and can execute simulations that outcomes resulting from different combinations. In this example, an outcome can be whether the goods contained in the shipping container arrive to a destination undamaged. During the simulation, the adaptive intelligent systems layer 614 may vary the external temperatures of the container (e.g., a temperature property of the digital twin of an environment of the container may be adjusted between simulations or during a simulation), the dimensions of the container, the products inside (represented by digital twins of the products) the container, the motion of the container, the humidity inside the container, and/or any other properties of the container, the environment, and/or the contents in the container. For each simulation instance, the adaptive intelligent systems layer 614 may record the parameters used to perform the simulation instance and the outcome of the simulation instance. In embodiments, each digital twin may include, reference, or be linked to a set of physical limitations that define the boundary conditions for a simulation. For example, the physical limitations of a digital twin of an outdoor environment may include a gravity constant (e.g., 9.8 m/s2), a maximum temperature (e.g., 60 degrees Celsius), a minimum temperature (e.g., −80 degrees Celsius), a maximum humidity (e.g., 110% humidity), friction coefficients of surfaces, maximum velocities of objects, maximum salinity of water, maximum acidity of water, minimum acidity of water. Additionally or alternatively, the simulations may adhere to scientific formulas, such as ones reflecting principles or laws of physics, chemistry, materials science, biology, geometry, or the like. For example, a simulation of the physical behavior of an object may adhere to the laws of thermodynamics, laws of motion, laws of fluid dynamics, laws of buoyancy, laws of heat transfer, laws of cooling, and the like. Thus, when the adaptive intelligent systems layer 614 performs a simulation, the simulation may conform to the physical limitations and scientific laws, such that the outcomes of the simulations mimic real world outcomes. The outcome from a simulation can be presented to a human user, compared against real world data (e.g., measured properties of a container, the environment of the container, the contents of the container, and resultant outcomes) to ensure convergence of the digital twin with the real world, and/or used to train machine learning models.

Figure 38:
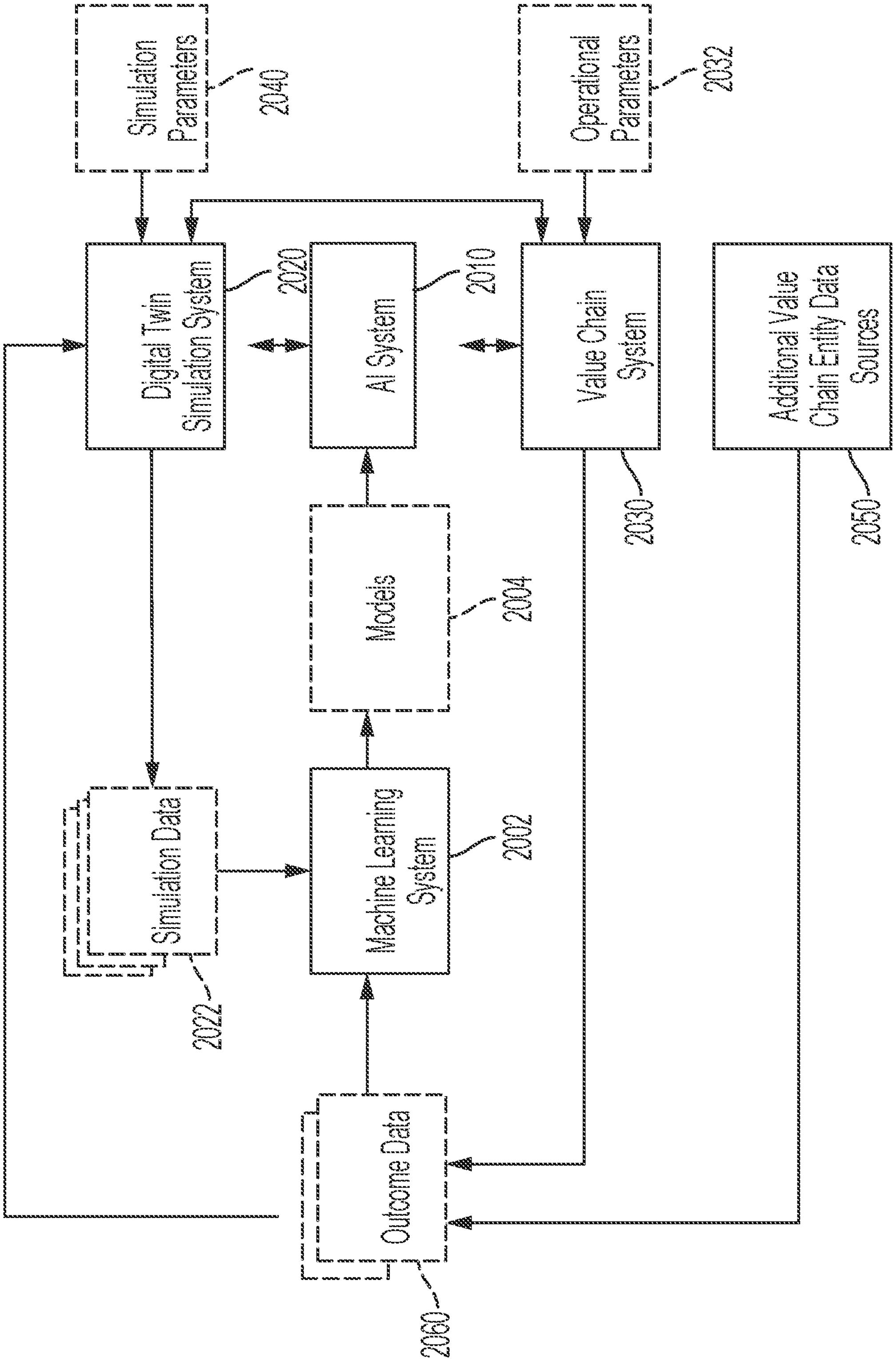
FIG. 38 is a schematic of a system configured to train an artificial system that is leveraged by a value chain system using real world outcome data and a digital twin system according to some embodiments of the present disclosure.

FIG. 38 illustrates example embodiments of a system for controlling and/or making decisions, predictions, and/or classification on behalf of a value chain system 2030. In embodiments, an artificial intelligence system 2010 leverages one or more machine-learned models 2004 to perform value chain-related tasks on behalf of the value chain system 2030 and/or to make decisions, classifications, and/or predictions on behalf of the value chain system 2030. In some embodiments, a machine learning system 2002 trains the machine learned models 2004 based on training data 2062, outcome data 2060, and/or simulation data 2022. As used herein, the term machine-learned model may refer to any suitable type of model that is learned in a supervised, unsupervised, or hybrid manner. Examples of machine-learned models include neural networks (e.g., deep neural networks, convolution neural networks, and many others), regression based models, decision trees, hidden forests, Hidden Markov models, Bayesian models, and the like. In embodiments, the artificial intelligence system 2010 and/or the value chain system 2030 may provide outcome data 2060 to the machine-learning system 2002 that relates to a determination (e.g., decision, classification, prediction) made by the artificial intelligence system 2010 based in part on the one or more machine-learned models and the input to those models. The machine learning system may in-turn reinforce/retrain the machine-learned models 2004 based on the feedback. Furthermore, in embodiments, the machine-learning system 2002 may train the machine-learning models based on simulation data 2022 generated by the digital twin simulation system 2020. In these embodiments, the digital twin simulation system 2020 may be instructed to run specific simulations using one or more digital twins that represent objects and/or environments that are managed, maintained, and/or monitored by the value chain system. In this way, the digital twin simulation system 2020 may provide richer data sets that the machine-learning system 2002 may use to train/reinforce the machine-learned models. Additionally or alternatively, the digital twin simulation system 2020 may be leveraged by the artificial intelligence system 2010 to test a decision made by the artificial intelligence system 2010 before providing the decision to the value chain entity.

In the illustrated example, a machine learning system 2002 may receive training data 2062, outcome data 2060, and/or simulation data 2022. In embodiments, the training data may be data that is used to initially train a model. The training data may be provided by a domain expert, collected from various data sources, and/or obtained from historical records and/or scientific experimentation. The training data 2062 may include quantified properties of an item or environment and outcomes relating from the quantified properties. In some embodiments, the training data may be structured in n-tuples, whereby each tuple includes an outcome and a respective set of properties relating to the outcome. In embodiments, the outcome data 2060 includes real world data (e.g., data measured or captured from one or more of IoT sensors, value chain entities, and/or other sources). The outcome data may include an outcome and properties relating to the outcome. Outcome data may be provided by the value chain system 2030 leveraging the artificial intelligence system 2010 and/or other data sources during operation of the value chain entity system 2010. Each time an outcome is realized (whether negative or positive), the value chain entity system 2010, the artificial intelligence system 2010, as well as any other data source 2050, may output data relating to the outcome to the machine learning system 2002. In embodiments, this data may be provided to the machine-learning system via an API of the adaptive intelligent systems layer 614. Furthermore, in embodiments, the adaptive intelligent systems layer 614 may obtain data from other types of external data sources that are not necessarily a value chain entity but may provide insightful data. For example, weather data, stock market data, news events, and the like may be collected, crawled, subscribed to, or the like to supplement the outcome data (and/or training data and/or simulation data).

In some embodiments, the machine learning system 2002 may receive simulation data 2022 from the digital twin simulation system 2020. Simulation data 2022 may be any data relating to a simulation using a digital twin. Simulation data 2022 may be similar to outcome data 2060, but the results are simulated results from an executed simulation rather than real-world data. In embodiments, simulation data 2022 may include the properties of the digital twin and any other digital twins that were used to perform the simulation and the outcomes stemming therefrom. In embodiments, the digital twin simulation system 2020 may iteratively adjust the properties of a digital twin, as well as other digital twins that are contained or contain the digital twin. During each iteration, the digital twin simulation system 2020 may provide the properties of the simulation (e.g., the properties of all the digital twins involved in the simulation) to the artificial intelligence system 2010, which then outputs predictions, classifications, or any other decisions to the digital twin simulation system 2020. The digital twin simulation system 2020 may use the decisions from the artificial intelligence system 2010 to execute the simulation (which may result in a series of decisions stemming from a state change in the simulation). At each iteration, the digital twin simulation system 2020 may output the properties used to run the simulation to the machine learning system 2002, any decisions from the artificial intelligence system 2010 used by the digital twin simulation system 2020, and outcomes from the simulation to the machine learning system 2002, such that the properties, decisions, and outcomes of the simulation are used to further train the model(s) used by the artificial intelligence system during the simulation.

In some embodiments, training data, outcome data 2060, and/or simulation data 2022 may be fed into a data lake (e.g., a Hadoop data lake). The machine learning system 2002 may structure the data from the data lake. In embodiments, the machine learning system 2002 may train/reinforce the models using the collected data to improve the accuracy of the models (e.g., minimize the error value of the model). The machine learning system may execute machine-learning algorithms on the collected data (e.g., training data, outcome data, and/or simulation data) to obtain the model. Depending on the type of model, the machine-learning algorithm will vary. Examples of learning algorithms/models include (e.g., deep neural networks, convolution neural networks, and many others as described throughout this disclosure), statistical models (e.g., regression-based models and many others), decision trees and other decision models, random/hidden forests, Hidden Markov models, Bayesian models, and the like. In collecting data from the digital twin simulation system 2020, the machine-learning system 2002 may train the model on scenarios not yet encountered by the value chain system 2030. In this way, the resultant models will have less "unexplored" feature spaces, which may lead to improved decisions by the artificial intelligence system 2010. Furthermore, as digital twins are based partly on assumptions, the properties of a digital twin may be updated/corrected when a real-world behavior differs from that of the digital twin. Examples are provided below.

Figure 39:
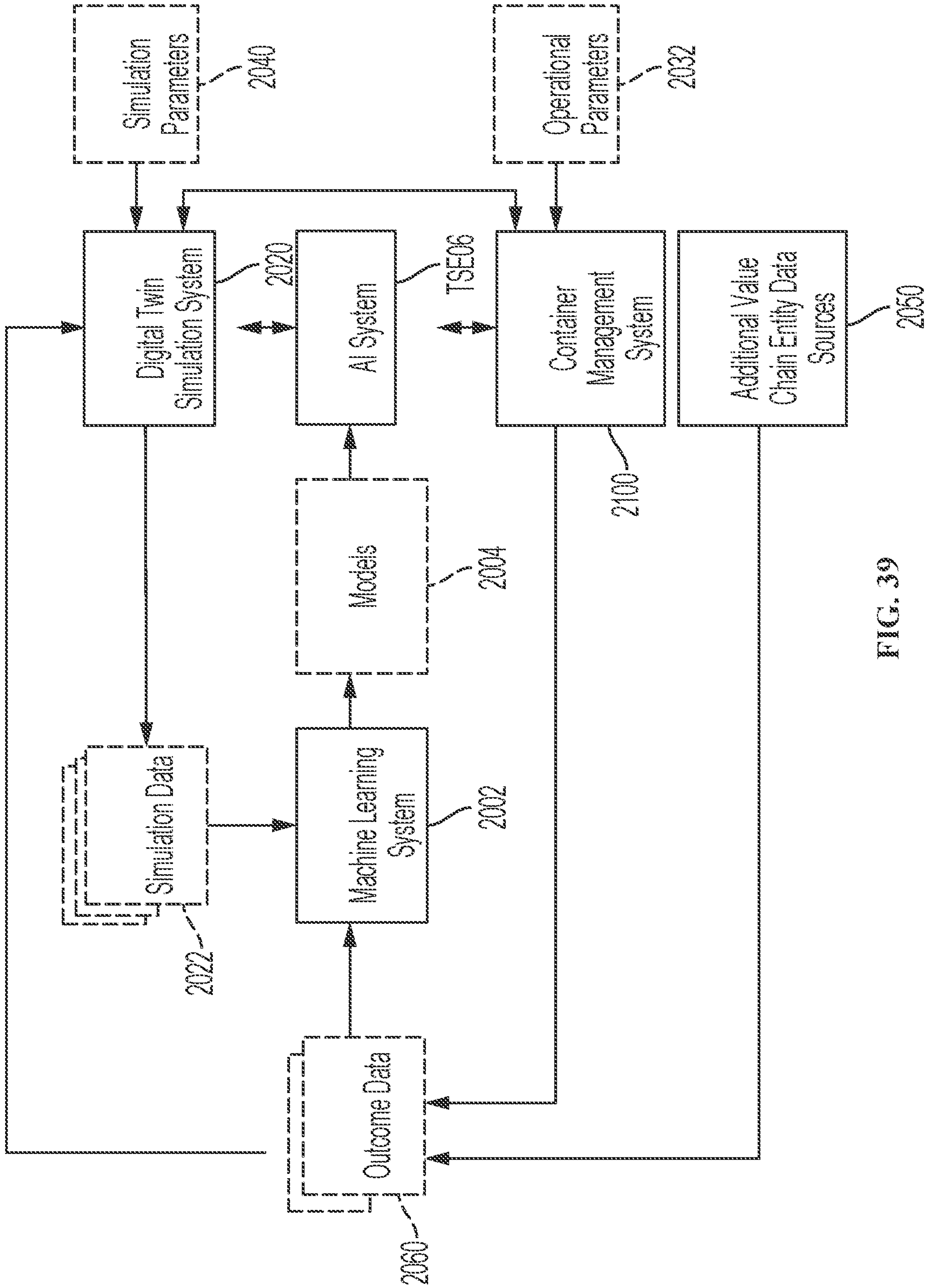
FIG. 39 is a schematic of a system configured to train an artificial system that is leveraged by a container fleet management system using real world outcome data and a digital twin system according to some embodiments of the present disclosure.

FIG. 39 illustrates an example of a container fleet management system 2070 that interfaces with the adaptive intelligent systems layer 614. In example embodiments, a container fleet management system 2070 may be configured to automate one or more aspects of the value chain as it applies to containers and shipping. In embodiments, the container fleet management system 2070 may be include one or more software modules that are executed by one or more server devices. These software modules may be configured to select containers to use (e.g., a size of container, the type of the container, the provider of the container, etc.) for a set of one or more shipments, schedule delivery/pickup of container, selection of shipping routes, determining the type of storage for a container (e.g., outdoor or indoor), select a location of each container while awaiting shipping, manage bills of lading and/or other suitable container fleet management tasks. In embodiments, the machine-learning system 2002 trains one or more models that are leveraged by the artificial intelligence system 2010 to make classifications, predictions, and/or other decisions relating to container fleet management. In example embodiments, a model 2004 is trained to select types of containers given one or more task-related features to maximize the likelihood of a desired outcome (e.g., that the contents of the container arrive in a timely manner with minimal loss at the lowest possible cost). As such, the machine-learning system 2002 may train the models using n-tuples that include the task-related features pertaining to a particular event and one or more outcomes associated with the particular event. In this example, task-related features for a particular event (e.g., a shipment) may include, but are not limited to, the type of container used, the contents of the container, properties of the container contents (e.g., cost, perishability, temperature restrictions, and the like), the source and destination of the container, whether the container is being shipped via truck, rail, or ship, the time of year, the cost of each container, and/or other relevant features. In this example, outcomes relating to the particular event may include whether the contents arrived safely, replacement costs (if any) associated with any damage or loss, total shipping time, and/or total cost of shipment (e.g., how much it cost to ship container). Furthermore, as international and/or interstate logistics may include many different sources, destinations, contents, weather conditions, and the like, simulations that simulate different shipping events may be run to richen the data used to train the model. For instance, simulations may be run for different combinations of ports and/or train depots for different combinations of sources, destinations, products, and times of year. In this example, different digital twins may be generated to represent the different combinations (e.g., digital twins of products, containers, and shipping-related environments), whereby one or more properties of the digital twins are varied for different simulations and the outcomes of each simulation may be recorded in a tuple with the proprieties. In this way, the model may be trained on certain combinations of routes, contents, time of year, container type, and/or cost that may not have been previously encountered in the real-world outcome data. Other examples of training a container fleet management model may include a model that is trained to determine where a container should be stored in a storage facility (e.g., where in a stack, indoors or outdoors, and/or the like) given the contents of the container, when the container needs to be moved, the type of container, the location, the time of year, and the like.

In operation, the artificial intelligence system 2010 may use the above-discussed models 2004 to make container fleet management decisions on behalf of a container fleet management system 2070 given one or more features relating to a task or event. For example, the artificial intelligence system 2010 may select a type of container (e.g., materials of the container, the dimensions of the container, the brand of the container, and the like) to use for a particular shipment. In this example, the container fleet management system 2070 may provide the features of an upcoming shipment to the artificial intelligence system 2010. These features may include what is being shipped (e.g., the type(s) of goods in the shipment), the size of the shipment, the source and destination, the date when the shipment is to be sent off, and/or the desired date or range of dates for delivery. In embodiments, the artificial intelligence system 2010 may feed these features into one or more of the models discussed above to obtain one or more decisions. These decisions may include which type of container to use and/or which shipping routes to use, whereby the decisions may be selected to minimize overall shipping costs (e.g., costs for container and transit+any replacement costs). The container fleet management system 2070 may then initiate the shipping event using the decision(s) made by the artificial intelligence system 2010. Furthermore, after the shipping event, the outcomes of the event (e.g., total shipping time, any reported damages or loss, replacement costs, total costs) may be reported to the machine-learning system 2002 to reinforce the models used to make the decisions. Furthermore, in some embodiments, the output of the container fleet management system 2070 and/or the other value chain entity data sources 2050 may be used to update one or more properties of one or more digital twins via the digital twin system 2020.

Figure 40:
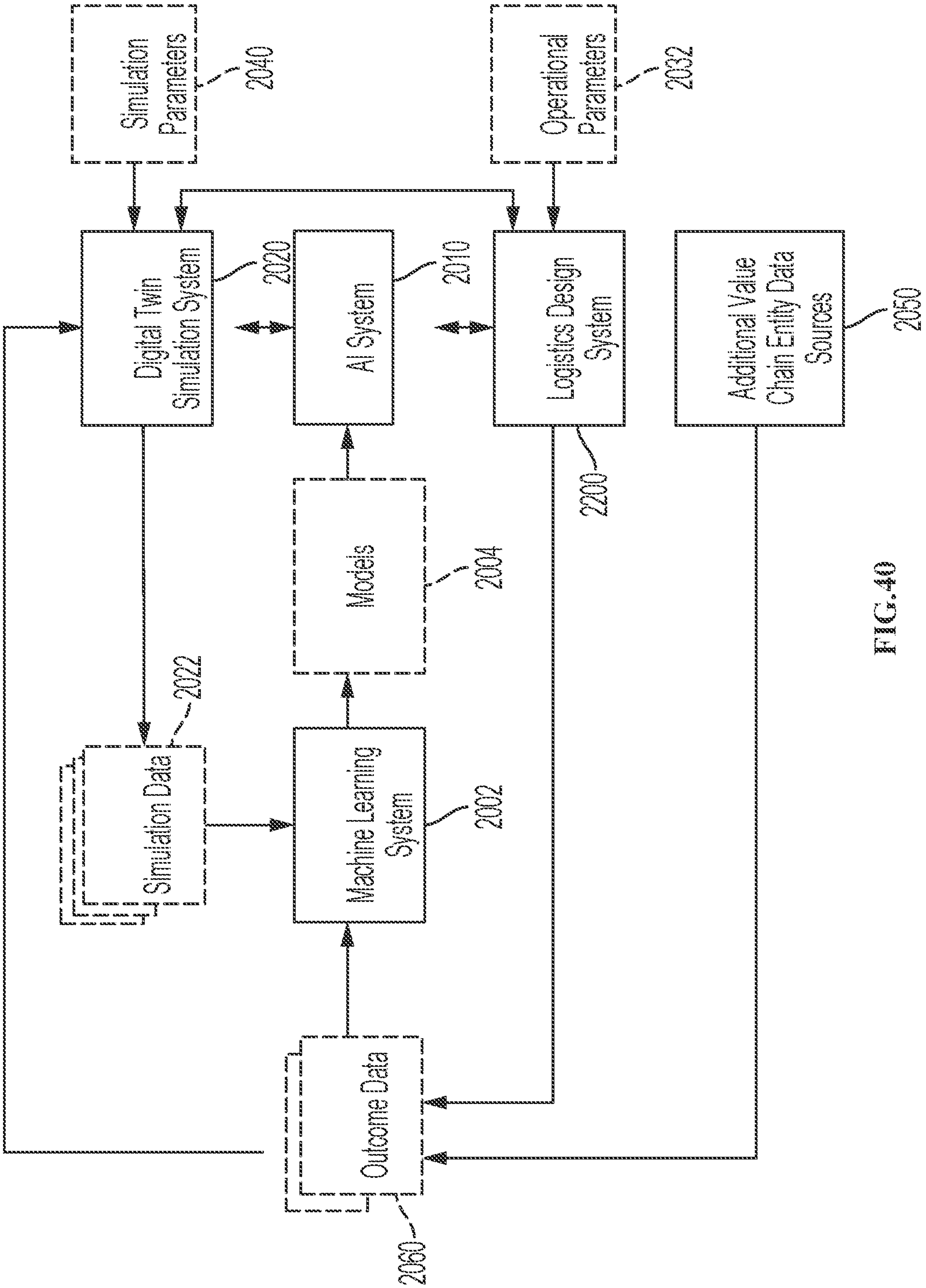
FIG. 40 is a schematic of a system configured to train an artificial system that is leveraged by a logistics design system using real world outcome data and a digital twin system according to some embodiments of the present disclosure.

FIG. 40 illustrates an example of a logistics design system that interfaces with the adaptive intelligent systems layer 614. In embodiments, a logistics design system may be configured to design one or more aspects of a logistics solution. For example, the logistics design system may be configured to receive one or more logistics factors (e.g., from a user via a GUI). In embodiments, logistics factors may include one or more present conditions, historical conditions, or future conditions of an organization (or potential organization) that are relevant to forming a logistics solution. Examples of logistics factors may include, but are not limited to the type(s) of products being produced/farmed/shipped, features of those products (e.g., dimensions, weights, shipping requirements, shelf life, etc.), locations of manufacturing sites, locations of distribution facilities, locations of warehouses, locations of customer bases, market penetration in certain areas, expansion locations, supply chain features (e.g., required parts/supplies/resources, suppliers, supplier locations, buyers, buyer locations), and/or the like) and may determine one or more design recommendations based on the factors. Examples of design recommendations may include supply chain recommendations (e.g., proposed suppliers (e.g., resource or parts suppliers), implementations of a smart inventory systems that order on-demand parts from available suppliers, and the like), storage and transport recommendations (e.g., proposed shipping routes, proposed shipping types (e.g., air, freight, truck, ship), proposed storage development (e.g., locations and/or dimensions of new warehouses), infrastructure recommendations (e.g., updates to machinery, adding cooled storage, adding heated storage, or the like), and combinations thereof. In embodiments, the logistics design system determines the recommendations to optimize an outcome. Examples of outcomes can include manufacturing times, manufacturing costs, shipping times, shipping costs, loss rate, environmental impact, compliance to a set of rules/regulations, and the like. Examples of optimizations include increased production throughput, reduced production costs, reduced shipping costs, decreased shipping times, reduced carbon footprint, and combinations thereof.

In embodiments, the logistics design system may interface with the artificial intelligence system 2010 to provide the logistics factors and to receive design recommendations that are based thereon. In embodiments, the artificial intelligence system 2010 may leverage one or more machine-learned models 2004 (e.g., logistics design recommendations models) to determine a recommendation. As will be discussed, a logistics design recommendation model may be trained to optimize one or more outcomes given a set of logistics factors. For example, a logistics design recommendation model trained to design supply chains may identify a set of suppliers that can supply a given manufacturer, the location of the manufacturer, the supplies needed, and/or other factors. The set of suppliers may then be used to implement an on-demand supply side inventory. In another example, the logistics design recommendation may take the same features of another manufacturer and recommend the purchase and use of one or more 3D printers.

In embodiments, the artificial intelligence system 2010 may leverage the digital twin system 2020 to generate a digital twin of a logistics system that implements the logistics design recommendation (and, in some embodiments, alternative systems that implement other design recommendations). In these embodiments, the digital twin system 2010 may receive the design recommendations and may generate a digital twin of a logistics environment that mirrors the recommendations. In embodiments, the artificial intelligence system 2010 may leverage the digital twin of the logistics environment to run simulations on the proposed solution. In embodiments, the digital twin system 2010 may display the digital twin of the logistics environment to a user via a display device (e.g., a monitor or a VR headset). In embodiments, the user may view the simulations in the digital twin. Furthermore, in embodiments, the digital twin system 2010 may provide a graphical user interface that the user may interact with to adjust the design of the logistics environment to adjust the design. The design provided (at least in part) by a user may also be represented in a digital twin of a logistics environment, whereby the digital twin system 2020 may perform simulations using the digital twin.

In some embodiments, the simulations run by the digital twin system 2010 may be used to train the recommendation models. Furthermore, when the design recommendations are implemented by an organization, the logistics system of the organization may be configured to report (e.g., via sensors, computing devices, manual human input) outcome data corresponding to the design recommendations to the machine learning system 2002, which may use the outcome data to reinforce the logistics design recommendation models.

Figure 41:
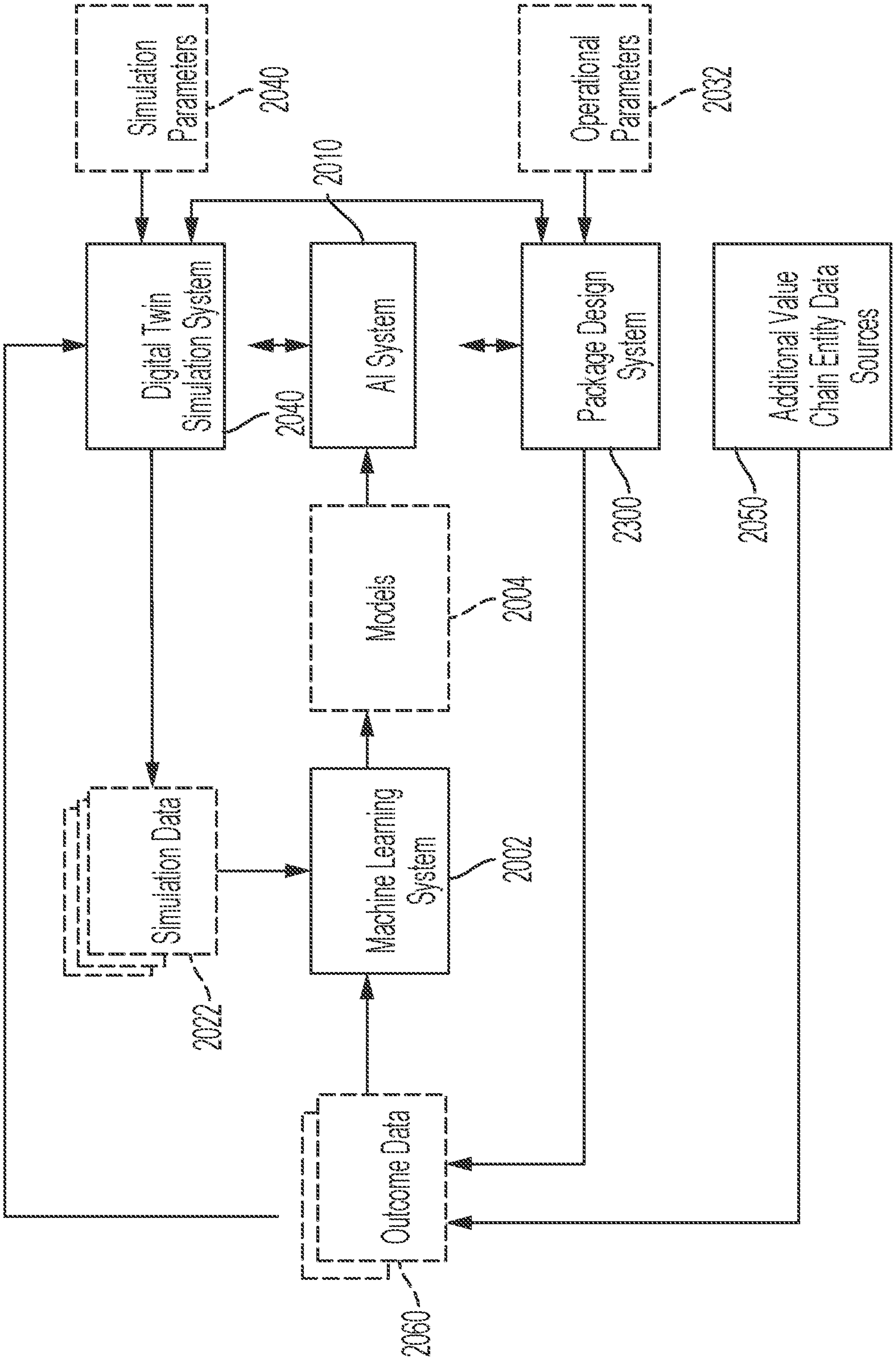
FIG. 41 is a schematic of a system configured to train an artificial system that is leveraged by a packaging design system using real world outcome data and a digital twin system according to some embodiments of the present disclosure.

FIG. 41 illustrates an example of a packaging design system that interfaces with the adaptive intelligent systems layer 614. In embodiments, the packaging design system may be configured to design one or more aspects of packaging for a physical object being conveyed in the value chain network. In some embodiments, the packaging design system may select one or more packaging attributes (e.g., size, material, padding, etc.) of the packaging to optimize one or more outcomes associated with the transport of the physical object. For example, the packaging attributes may be selected to reduce costs, decrease loss/damage, decrease weight, decrease plastic or other non-biodegradable waste, or the like. In embodiments, the packaging design system leverages the artificial intelligence system 2010 to obtain packaging attribute recommendations. In embodiments, the packaging design system may provide one or more features of the physical object. In embodiments, the features of the physical object may include the dimensions of the physical object, the mass of the physical object, the source of the physical object, one or more potential destinations of the physical object, the manner by which the physical object is shipped, and the like. In embodiments, the packaging design system may further provide one or more optimization goals for the package design (e.g., reduce cost, reduce damage, reduce environmental impact). In response, the artificial intelligence system 2010 may determine one or more recommended packaging attributes based on the physical asset features and the given objective. In embodiments, the packaging design system receives the packaging attributes and generates a package design based thereon. The package design may include a material to be used, the external dimensions of the packaging, the internal dimensions of the packaging, the shape of the packaging, the padding/stuffing for the packaging, and the like.

In some embodiments, the packaging design system may provide a packaging design to the digital twin system 2020, which generates a digital twin of the packaging and physical asset based on the packaging design. The digital twin of the packaging and physical asset may be used to run simulations that test the packaging (e.g., whether the packaging holds up in shipping, whether the packaging provides adequate insulation/padding, and the like). In embodiments, the results of the simulation may be returned to the packaging design system, which may output the results to a user. In embodiments, the user may accept the packaging design, may adjust the packaging design, or may reject the design. In some embodiments, the digital twin system may run simulations on one or more digital twins to test different conditions that the package may be subjected to (e.g., outside in the snow, rocking in a boat, being moved by a forklift, or the like). In some embodiments, the digital twin system may output the results of a simulation to the machine-learning system 2002, which can train/reinforce the packaging design models based on the properties used to run the simulation and the outcomes stemming therefrom.

In embodiments, the machine-learning system 2002 may receive outcome data from the packaging design system and/or other value chain entity data sources (e.g., smart warehouses, user feedback, and the like). The machine-learning system 2002 may use this outcome data to train/reinforce the packaging design models. Furthermore, in some embodiments, the outcome data may be used by the digital twin system 2020 to update/correct any incorrect assumptions used by the digital twin system (e.g., the flexibility of a packaging material, the water resistance of a packaging material, and the like).

Figure 42:
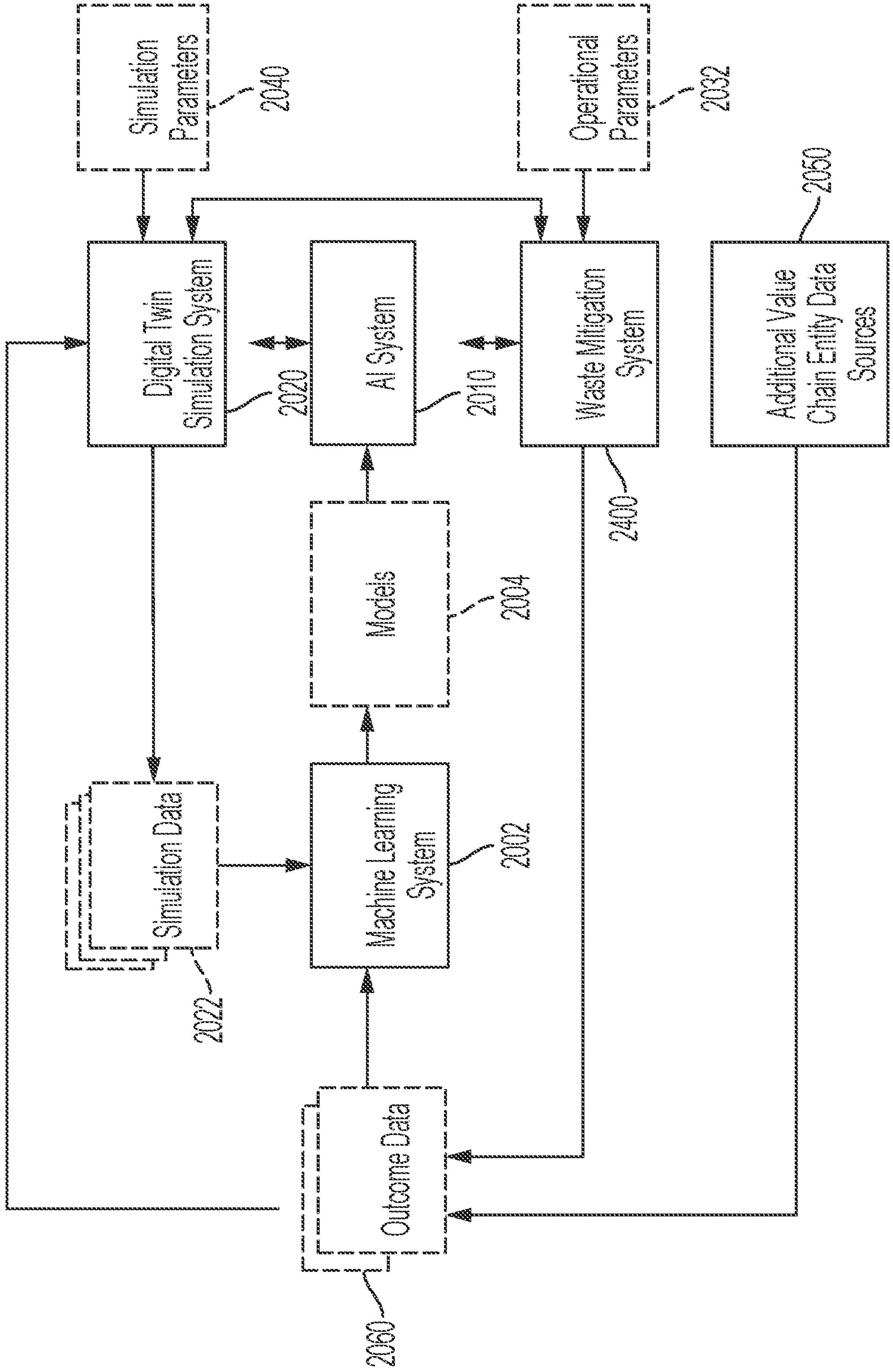
FIG. 42 is a schematic of a system configured to train an artificial system that is leveraged by a waste mitigation system using real world outcome data and a digital twin system according to some embodiments of the present disclosure.

FIG. 42 illustrates examples of a waste mitigation system that interfaces with the adaptive intelligent systems layer 614. In embodiments, the waste mitigation system is configured to analyze a process within the value chain (e.g., manufacturing of a product, oil refining, fertilization, water treatment, or the like) to mitigate waste (e.g., solid waste, wastewater, discarded packaging, wasted energy, wasted time, wasted resources, or other waste). In embodiments, the waste mitigation system may interface with the artificial intelligence system 2010 to automate one or more processes to mitigate waste.

In embodiments, the artificial intelligence system 2010 may provide control decisions to the waste mitigation system to mitigate solid waste production. Examples of waste production may include excess plastic or other non-biodegradable waste, hazardous or toxic waste (e.g., nuclear waste, petroleum coke, or the like), and the like. In some of these embodiments, the artificial intelligence system 2010 may receive one or more features of the process (or "process features"). Examples of process features may include, but are not limited to, the steps in the process, the materials being used, the properties of the materials being used, and the like. The artificial intelligence system 2010 may leverage one or more machine-learned models to control the process. In embodiments, the machine-learned models may be trained to classify a waste condition and/or the cause of the waste condition. In some of these embodiments, the artificial intelligence system 2010 may determine or select a waste mitigation solution based on the classified waste condition. For example, in some embodiments, the artificial intelligence system 2010 may apply rules-based logic to determine an adjustment to make to the process to reduce or resolve the waste condition. Additionally, or alternatively, the artificial intelligence may leverage a model that recommends an adjustment to make to the process to reduce or resolve the waste condition.

In embodiments, the artificial intelligence system 2010 may leverage the digital twin system 2020 to mitigate the waste produced by a process. In embodiments, the digital twin system 2020 may execute iterative simulations of the process in a digital twin of the environment in which the process is performed. When the simulation is executed, the artificial intelligence system 2010 may monitor the results of the simulation to determine a waste condition and/or the cause of the waste condition. During the simulations, the artificial intelligence system 2010 may adjust one or more aspects of the process to determine whether the adjustments mitigated the waste condition, worsened the waste condition, or had no effect. When an adjustment is found to mitigate the waste condition, the artificial intelligence system 2010 may adjust other aspects of the process to determine if an improvement can be realized. In embodiments, the artificial intelligence system 2010 may perform a genetic algorithm when iteratively adjusting the aspects of the process in the digital twin simulations. In these embodiments, the artificial intelligence system 2010 may identify aspects of the process that can be adjusted to mitigate the waste production.

Smart Project Management Facilities

Referring to FIG. 43, an embodiment of the platform 604 is provided. As with other embodiments, the platform 604 may employ a micro-services architecture with the various data handling layers 624, a set of network connectivity facilities 642 (which may include or connect to a set of interfaces 702 of various layers of the platform 604), a set of adaptive intelligence facilities or adaptive intelligent systems 614 (including artificial intelligence 1160), a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

In embodiments, the adaptive intelligence systems layer 614 may further include a set of automated project management facilities MPVC1102 that provide automated recommendations for a set of value chain project management tasks based on processing current status information, a set of application outputs and/or a set of outcomes 1040 for a set of demand management applications 1502, a set of supply chain applications 1500, a set of intelligent product applications 1510, a set of asset management applications 1530 and a set of enterprise resource management applications 1520 for a category of goods.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, the set of project management facilities are configured to manage a wide variety of types of projects, such as procurement projects, logistics projects, reverse logistics projects, fulfillment projects, distribution projects, warehousing projects, inventory management projects, product design projects, product management projects, shipping projects, maritime projects, loading or unloading projects, packing projects, purchasing projects, marketing projects, sales projects, analytics projects, demand management projects, demand planning projects, resource planning projects and many others.

In embodiments, the project management facilities are configured to manage a set of procurement projects. In embodiments, the project management facilities are configured to manage a set of logistics projects. In embodiments, the project management facilities are configured to manage a set of reverse logistics projects. In embodiments, the project management facilities are configured to manage a set of fulfillment projects.

In embodiments, the project management facilities are configured to manage a set of distribution projects. In embodiments, the project management facilities are configured to manage a set of warehousing projects. In embodiments, the project management facilities are configured to manage a set of inventory management projects. In embodiments, the project management facilities are configured to manage a set of product design projects.

In embodiments, the project management facilities are configured to manage a set of product management projects. In embodiments, the project management facilities are configured to manage a set of shipping projects. In embodiments, the project management facilities are configured to manage a set of maritime projects. In embodiments, the project management facilities are configured to manage a set of loading or unloading projects.

In embodiments, the project management facilities are configured to manage a set of packing projects. In embodiments, the project management facilities are configured to manage a set of purchasing projects. In embodiments, the project management facilities are configured to manage a set of marketing projects. In embodiments, the project management facilities are configured to manage a set of sales projects.

In embodiments, the project management facilities are configured to manage a set of analytics projects. In embodiments, the project management facilities are configured to manage a set of demand management projects. In embodiments, the project management facilities are configured to manage a set of demand planning projects. In embodiments, the project management facilities are configured to manage a set of resource planning projects.

Smart Task Recommendations

Referring to FIG. 282, an embodiment of the platform 604 is provided. As with other embodiments, the platform 604 may employ a micro-services architecture with the various data handling layers 624, a set of network connectivity facilities 642 (which may include or connect to a set of interfaces 702 of various layers of the platform 604), a set of adaptive intelligence facilities or adaptive intelligent systems 614 (including artificial intelligence 1160), a set of data storage facilities or systems 624, and a set of monitoring facilities or systems 614.

The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, the adaptive intelligent systems layer 614 may further include a set of process automation facilities 14402 that provide automated recommendations for a set of value chain process tasks MPVC1102 that provide automated recommendations for a set of value chain processes based on processing current status information, a set of application outputs and/or a set of outcomes 1040 for a set of demand management applications 1502, a set of supply chain applications 1500, a set of intelligent product applications 1510, a set of asset management applications 1530 and a set of enterprise resource management applications 1520 for a category of goods. In some examples, the process automation facilities 14402 may be used with basic rule-based training and recommendations. This may relate to following a set of rules that an expert has articulated such as when a trigger occurs, undertake a task. In another example, the process automation facilities 14402 may utilize deep learning to observe interactions such as deep learning on outcomes to learn to recommend decisions or tasks that produce a highest return on investment (ROI) or other outcome-based yield. The process automation facilities 14402 may be used to provide collaborative filtering such as look at a set of experts that are most similar in terms of work done and tasks completed being most similar. For example, the underlying software may be used to find customers similar to another set of customers to sell to, make a different offering to, or change price accordingly. In general, given a set of underlying pattern data, contextually, about a customer segment, purchasing patterns may be determined for that customer segment such as knowledge of cost and pricing patterns for that customer. This information may be used to learn to focus a next set of activities around pricing, promotion, demand management towards an ideal that may be based on deep learning or rules or collaborative filtering type work trying to leverage off of similar decisions made by similarly situated people (e.g., recommending movies to a similar cohort of people).

In embodiments, the set of facilities that provide automated recommendations for a set of value chain process tasks provide recommendations involving a wide range of types of activities, such as, without limitation, product configuration activities, product selection activities for a customer, supplier selection activities, shipper selection activities, route selection activities, factory selection activities, product assortment activities, product management activities, logistics activities, reverse logistics activities, artificial intelligence configuration activities, maintenance activities, product support activities, product recommendation activities and many others.

In embodiments, the automated recommendations relate to a set of product configuration activities. In embodiments, the automated recommendations relate to a set of product selection activities for a customer. In embodiments, the automated recommendations relate to a set of supplier selection activities. In embodiments, the automated recommendations relate to a set of shipper selection activities.

In embodiments, the automated recommendations relate to a set of route selection activities. In embodiments, the automated recommendations relate to a set of factory selection activities. In embodiments, the automated recommendations relate to a set of product assortment activities. In embodiments, the automated recommendations relate to a set of product management activities. In embodiments, the automated recommendations relate to a set of logistics activities.

In embodiments, the automated recommendations relate to a set of reverse logistics activities. In embodiments, the automated recommendations relate to a set of artificial intelligence configuration activities. In embodiments, the automated recommendations relate to a set of maintenance activities. In embodiments, the automated recommendations relate to a set of product support activities. In embodiments, the automated recommendations relate to a set of product recommendation activities.

Optimized Routing Among Nodes

Figure 44:
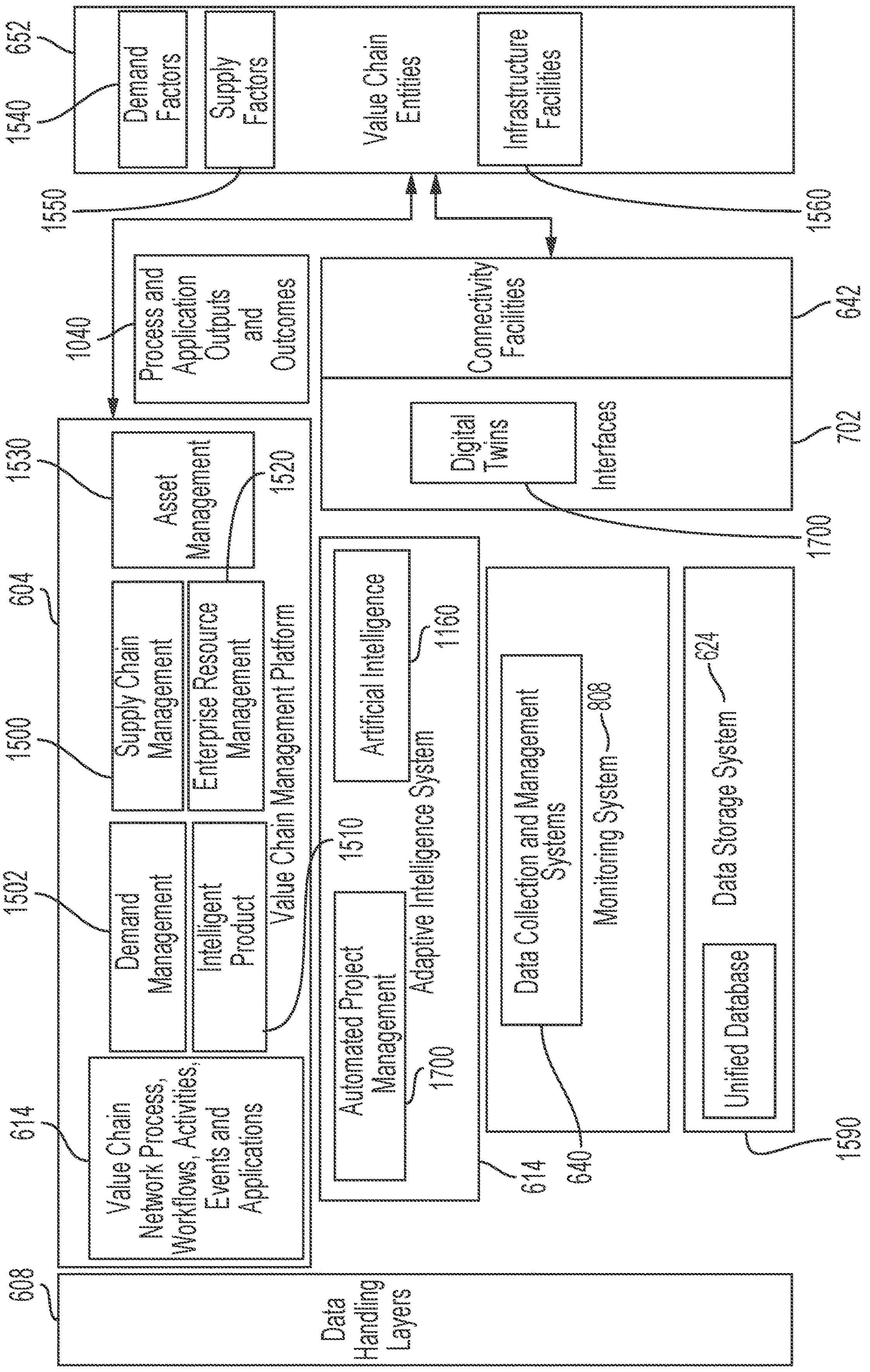
FIG. 44 is a block diagram showing components and relationships of a set of intelligent project management facilities in embodiments of a value chain network management platform in accordance with the present disclosure.
Figure 45:
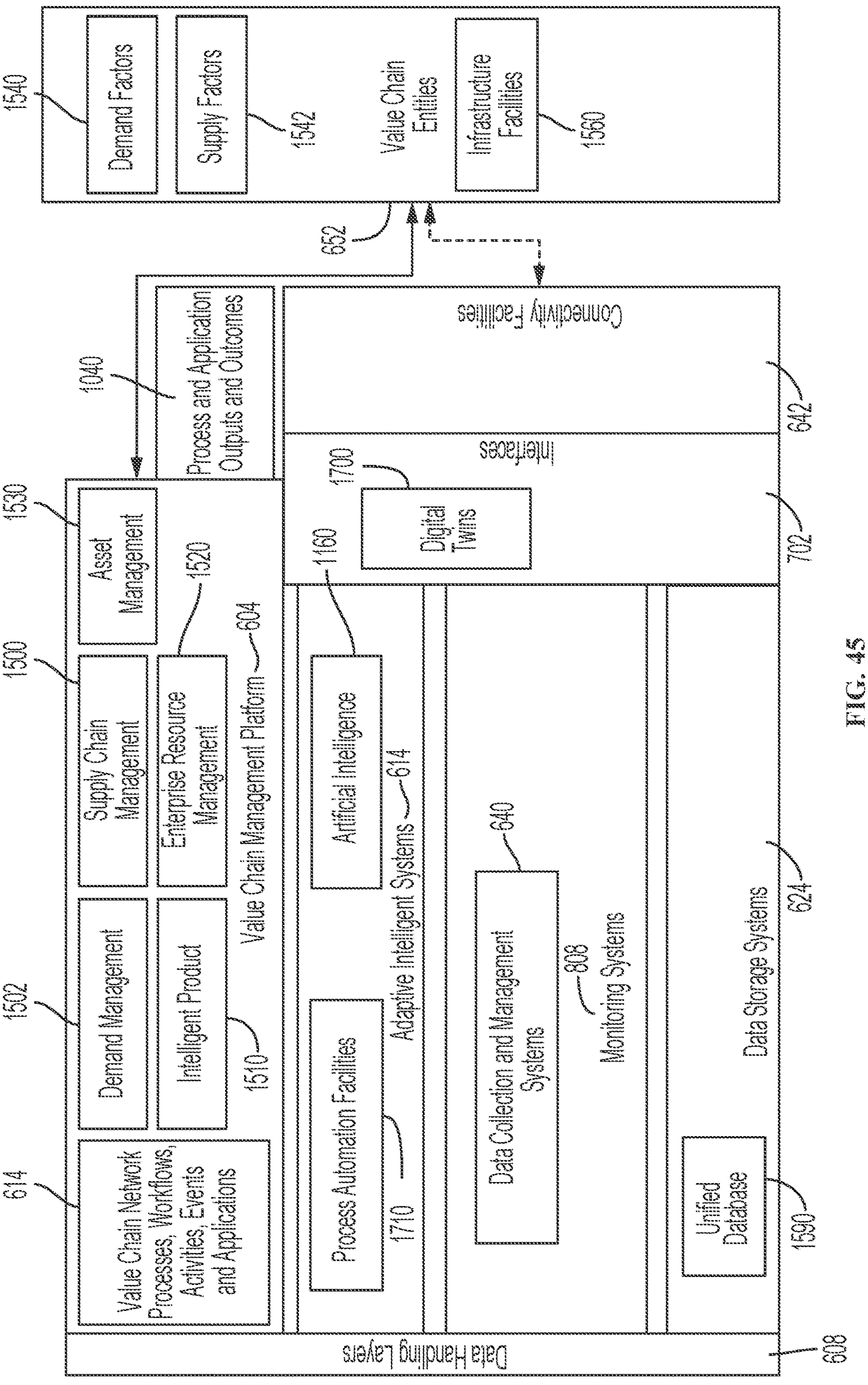
FIG. 45 is a block diagram showing components and relationships of an intelligent task recommendation system in embodiments of a value chain network management platform in accordance with the present disclosure.
Figure 46:
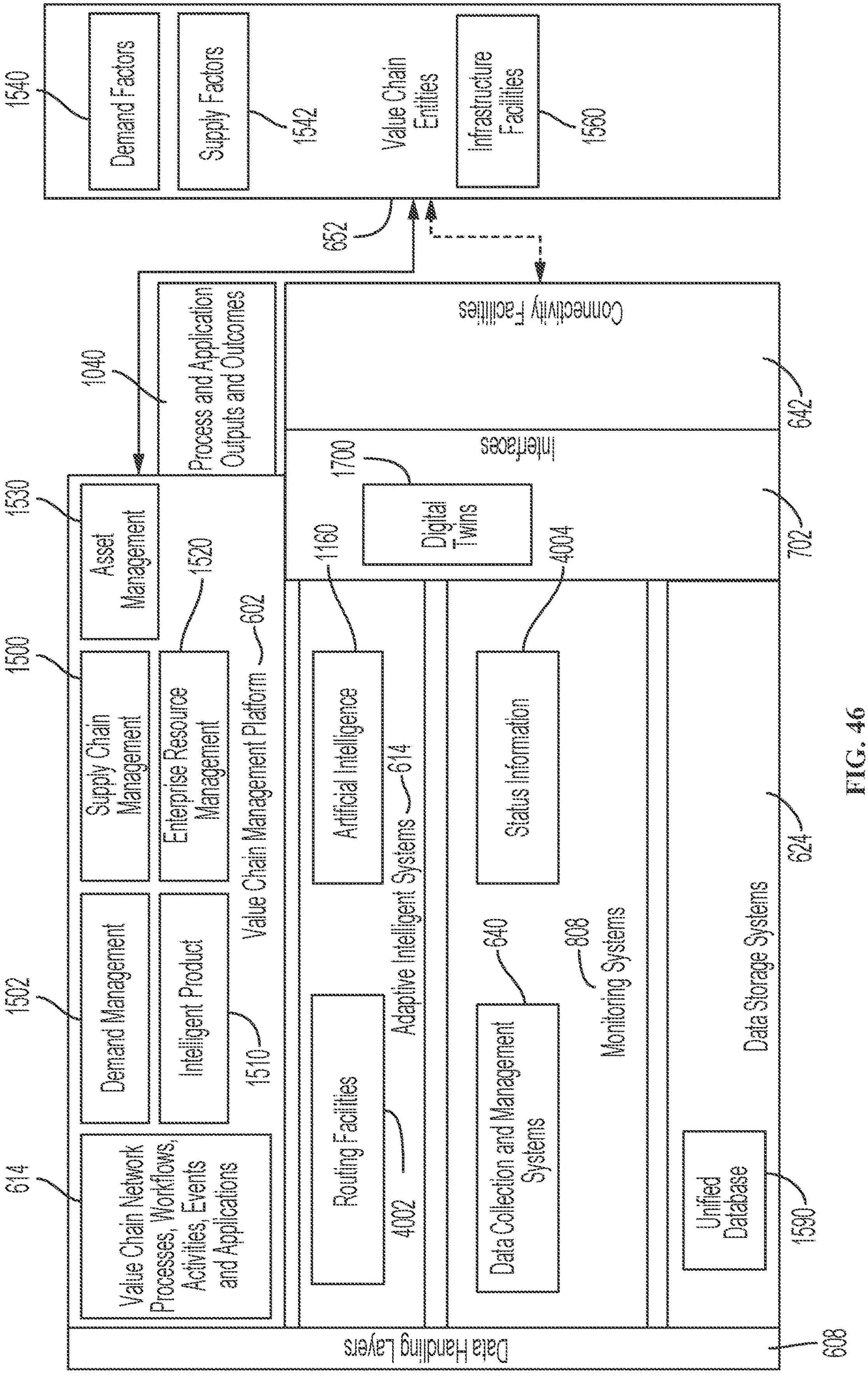
FIG. 46 is a block diagram showing components and relationships of a routing system among nodes of a value chain network in embodiments of a value chain network management platform in accordance with the present disclosure.
Figure 47:
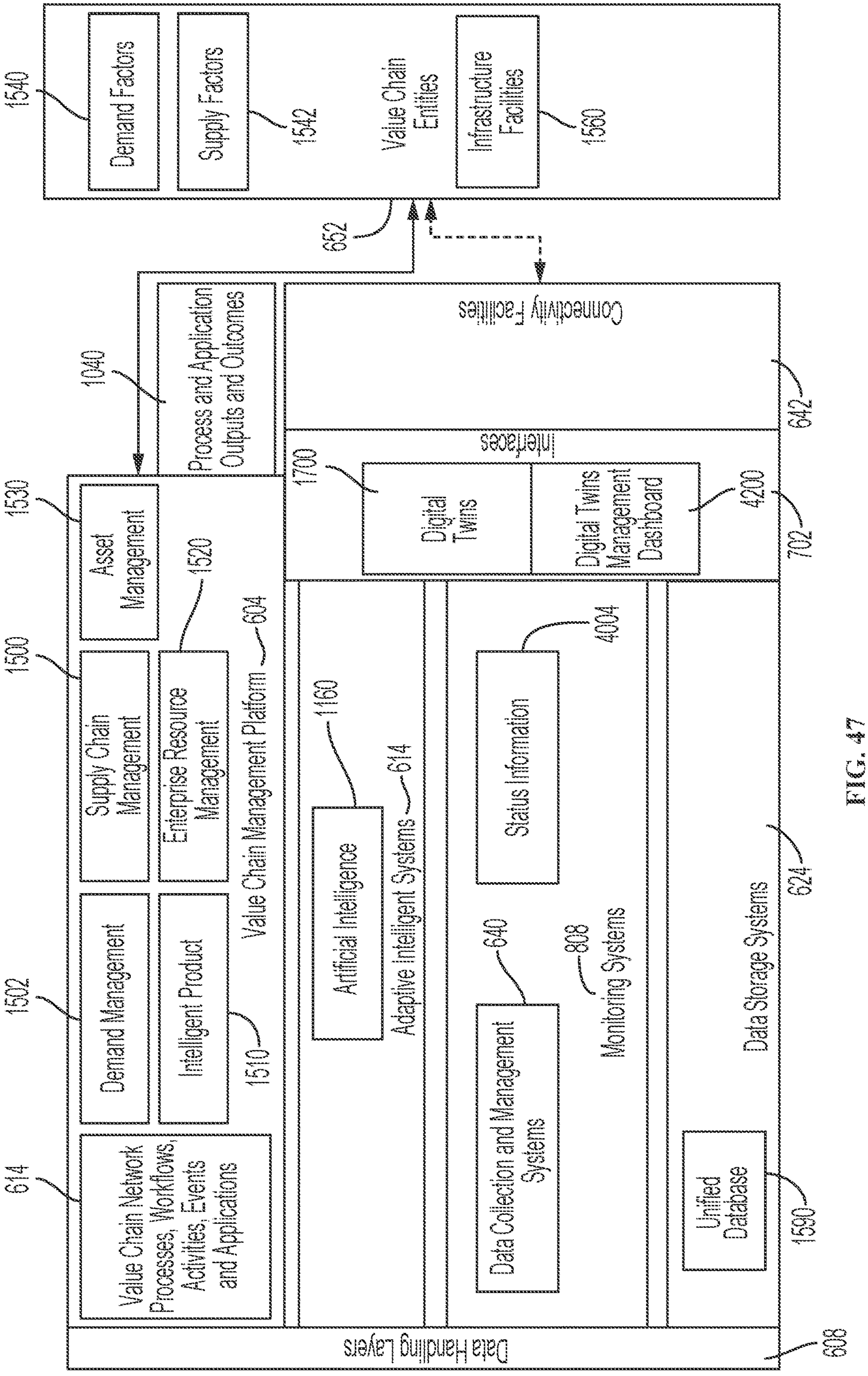
FIG. 47 is a block diagram showing components and relationships of a dashboard for managing a set of digital twins in embodiments of a value chain network management platform.
Figure 48:
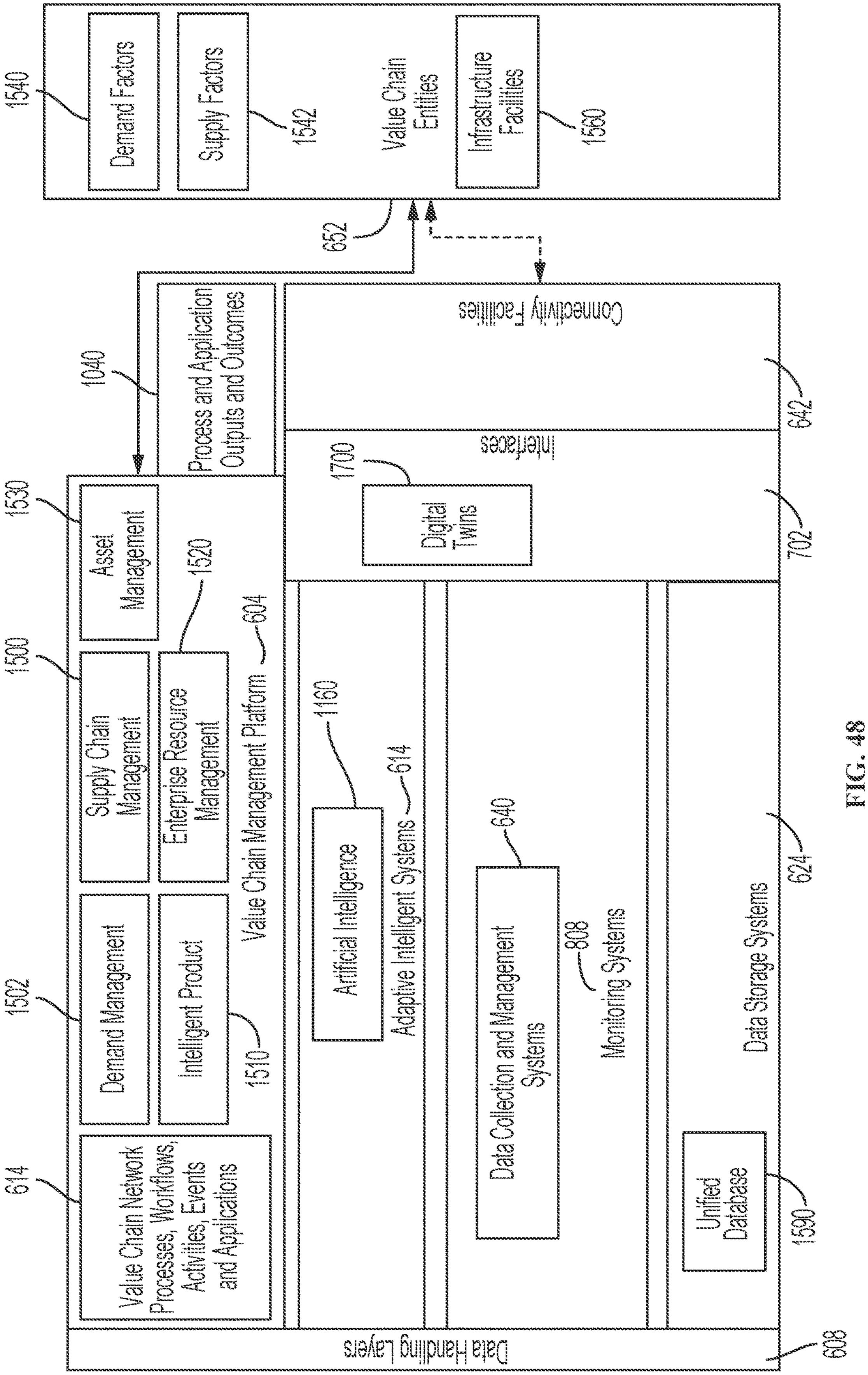
FIG. 48 is a block diagram showing components and relationships in embodiments of a value chain network management platform that uses a microservices architecture.
Figure 49:
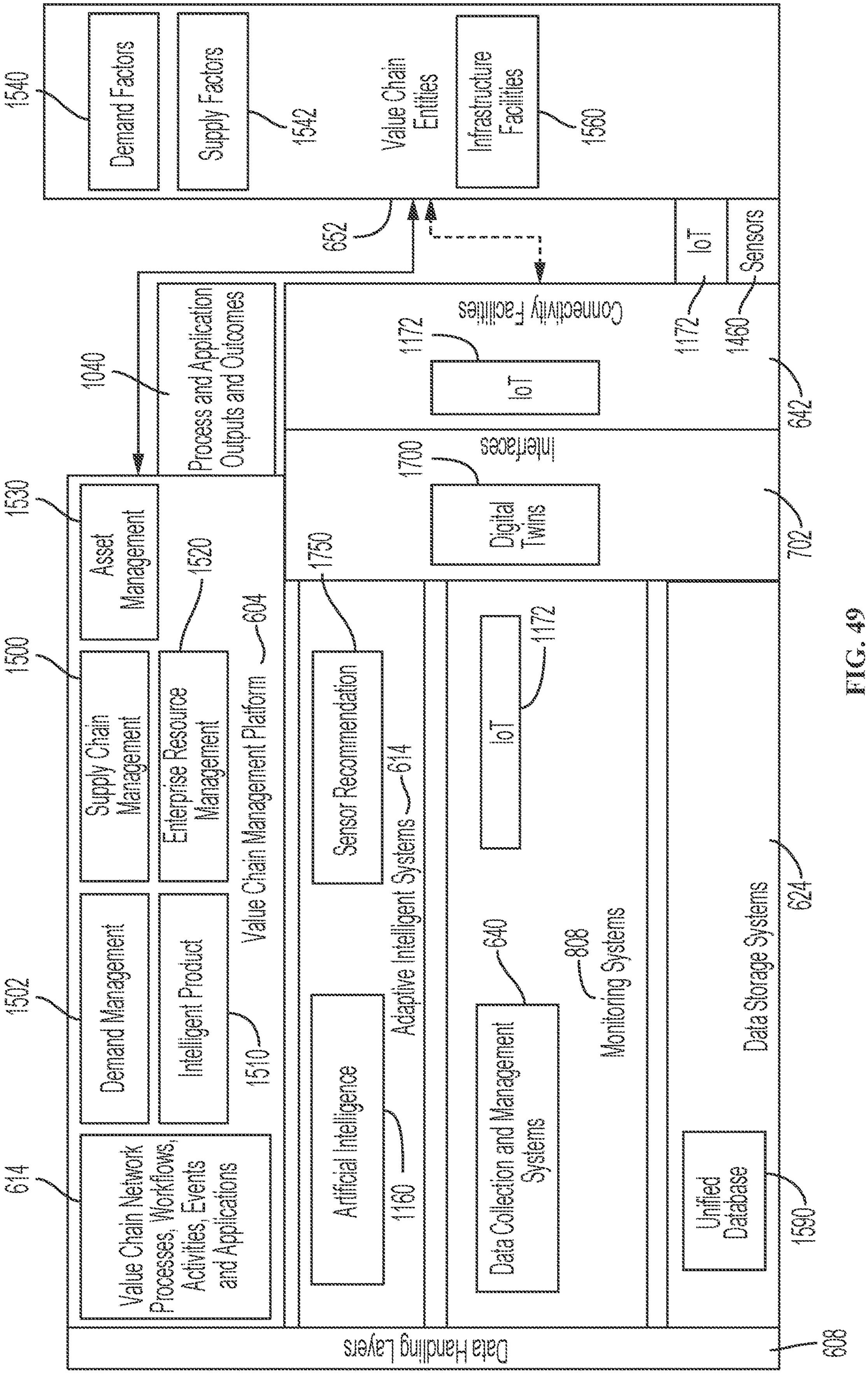
FIG. 49 is a block diagram showing components and relationships of an Internet of Things data collection architecture and sensor recommendation system in embodiments of a value chain network management platform.
Figure 50:
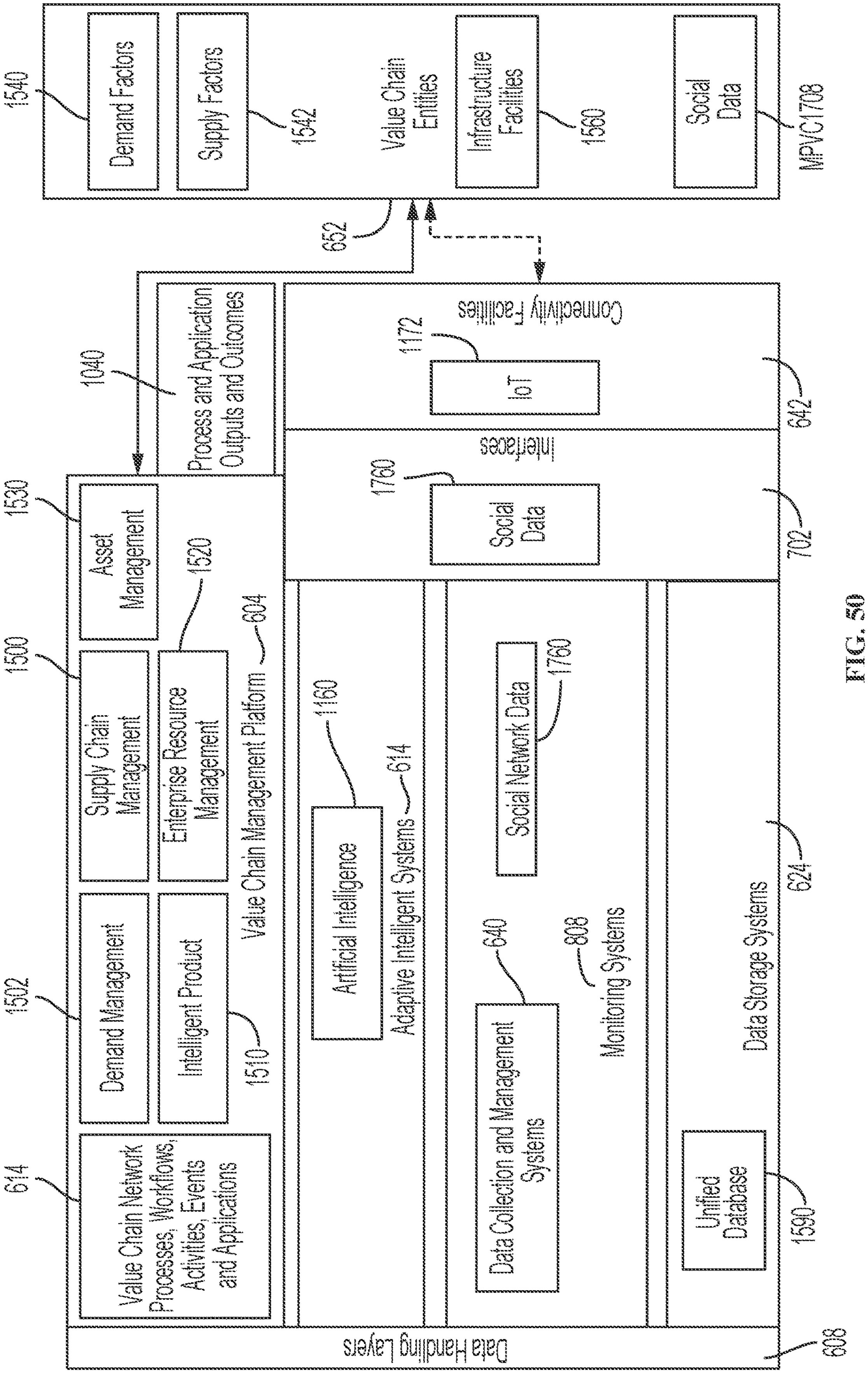
FIG. 50 is a block diagram showing components and relationships of a social data collection architecture in embodiments of a value chain network management platform.
Figure 51:
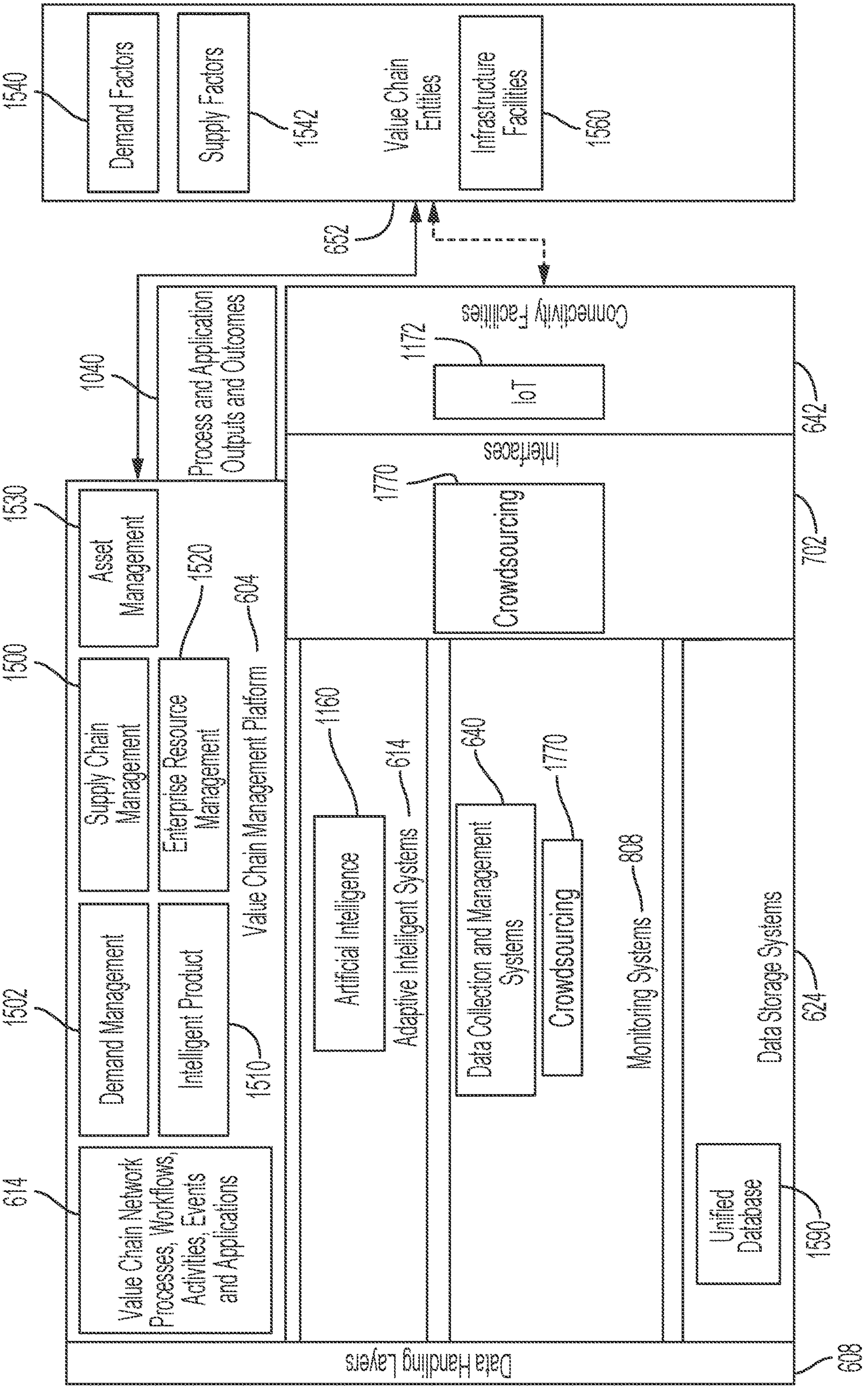
FIG. 51 is a block diagram showing components and relationships of a crowdsourcing data collection architecture in embodiments of a value chain network management platform.

Referring to FIG. 44, an embodiment of the platform 604 is provided. As with other embodiments, the platform 604 may employ a micro-services architecture with the various data handling layers 624, a set of network connectivity facilities 642 (which may include or connect to a set of interfaces 702 of various layers of the platform 604), a set of adaptive intelligence facilities or adaptive intelligent systems 614 (including artificial intelligence 1160), a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

Thus, provided herein are methods, systems, components and other elements for an information technology system that may include: a cloud-based management platform for a value chain network with a micro-services architecture, a set of interfaces, network connectivity facilities, adaptive intelligence facilities, data storage facilities, and monitoring facilities that are coordinated for monitoring and management of a set of value chain network entities; and a set of applications for enabling an enterprise to manage a set of value chain network entities from a point of origin to a point of customer use; wherein a set of routing facilities generate a set of routing instructions for routing information among a set of nodes in the value chain network based on current status information for the value chain network.

In embodiments, the adaptive intelligent systems layer 614 may further include a set of routing facilities 1720 that generate a set of routing instructions for routing information among a set of nodes in the value chain network, such as based on processing current status information 1730, a set of application outputs and/or a set of outcomes 1040, or other information collected by or used in the VCNP 102. Routing may include routing for the benefit of a set of demand management applications 1502, a set of supply chain applications 1500, a set of intelligent product applications 1510, a set of asset management applications 1530 and a set of enterprise resource management applications 1520 for a category of goods.

In embodiments, the set of routing facilities that generate a set of routing instructions for routing information among a set of nodes in the value chain network use a wide variety of routing systems or configurations, such as involving, without limitation, priority-based routing, master controller routing, least cost routing, rule-based routing, genetically programmed routing, random linear network coding routing, traffic-based routing, spectrum-based routing, RF condition-based routing, energy-based routing, latency-sensitive routing, protocol compatibility based routing, dynamic spectrum access routing, peer-to-peer negotiated routing, queue-based routing, and others.

In embodiments, the routing includes priority-based routing. In embodiments, the routing includes master controller routing. In embodiments, the routing includes least cost routing. In embodiments, the routing includes rule-based routing. In embodiments, the routing includes genetically programmed routing.

In embodiments, the routing includes random linear network coding routing. In embodiments, the routing includes traffic-based routing. In embodiments, the routing includes spectrum-based routing.

In embodiments, the routing includes RF condition-based routing. In embodiments, the routing includes energy-based routing. In embodiments, the routing includes latency-sensitive routing.

In embodiments, the routing includes protocol compatibility-based routing.

In embodiments, the routing includes dynamic spectrum access routing. In embodiments, the routing includes peer-to-peer negotiated routing. In embodiments, the routing includes queue-based routing.

In embodiments, the status information for the value chain network involves a wide range of states, events, workflows, activities, occurrences, or the like, such as, without limitation, traffic status, congestion status, bandwidth status, operating status, workflow progress status, incident status, damage status, safety status, power availability status, worker status, data availability status, predicted system status, shipment location status, shipment timing status, delivery status, anticipated delivery status, environmental condition status, system diagnostic status, system fault status, cybersecurity status, compliance status, demand status, supply status, price status, volatility status, need status, interest status, aggregate status for a group or population, individual status, and many others.

In embodiments, the status information involves traffic status. In embodiments, the status information involves congestion status. In embodiments, the status information involves bandwidth status. In embodiments, the status information involves operating status. In embodiments, the status information involves workflow progress status.

In embodiments, the status information involves incident status. In embodiments, the status information involves damage status. In embodiments, the status information involves safety status.

In embodiments, the status information involves power availability status. In embodiments, the status information involves worker status. In embodiments, the status information involves data availability status.

In embodiments, the status information involves predicted system status. In embodiments, the status information involves shipment location status. In embodiments, the status information involves shipment timing status. In embodiments, the status information involves delivery status.

In embodiments, the status information involves anticipated delivery status. In embodiments, the status information involves environmental condition status.

In embodiments, the status information involves system diagnostic status. In embodiments, the status information involves system fault status. In embodiments, the status information involves cybersecurity status. In embodiments, the status information involves compliance status.

Dashboard for Managing Digital Twins

Referring to FIG. 14, an embodiment of the platform 604 is provided. As with other embodiments, the platform 604 may employ a micro-services architecture with the various data handling layers 624, a set of network connectivity facilities 642 (which may include or connect to a set of interfaces 702 of various layers of the platform 604), a set of adaptive intelligence facilities or adaptive intelligent systems 614 (including artificial intelligence 1160), a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a dashboard for managing a set of digital twins, wherein at least one digital twin represents a set of supply chain entities, workflows and assets and at least one other digital twin represents a set of demand management entities and workflows.

In embodiments, the VCNP 604 may further include a dashboard 1740 for managing a set of digital twins 1700. In embodiments, this may include different twins, such as where one digital twin 1700 represents a set of supply chain entities, workflows and assets and another digital twin 1700 represents a set of demand management entities and workflows. In some example embodiments, managing a set of digital twins 1700 may refer to configuration (e.g., via the dashboard 1740) as described in the disclosure. For example, the digital twin 1700 may be configured through use of a digital twin configuration system to set up and manage the enterprise digital twins and associated metadata of an enterprise, to configure the data structures and data listening threads that power the enterprise digital twins, and to configure features of the enterprise digital twins, including access features, processing features, automation features, reporting features, and the like, each of which may be affected by the type of enterprise digital twin (e.g., based on the role(s) that it serves, the entities it depicts, the workflows that it supports or enables and the like). In example embodiments, the digital twin configuration system may receive the types of digital twins that may be supported for the enterprise, as well as the different objects, entities, and/or states that are to be depicted in each type of digital twin. For each type of digital twin, the digital twin configuration system may determine one or more data sources and types of data that feed or otherwise support each object, entity, or state that is depicted in the respective type of digital twin and may determine any internal or external software requests (e.g., API calls) that obtain the identified data types or other suitable data acquisitions mechanisms, such as webhooks, that may configured to automatically receive data from an internal or external data source In some embodiments, the digital twin configuration system may determine internal and/or external software requests that support the identified data types by analyzing the relationships between the different types of data that correspond to a particular state/entity/object and the granularity thereof. Additionally or alternatively, a user may define (e.g., via a GUI) the data sources and/or software requests and/or other data acquisition mechanisms that support the respective data types that are depicted in a respective digital twin. In these example embodiments, the user may indicate the data source that may be accessed and the types of data to be obtained from the respective data source.

The dashboard may be used to configure the digital twins 1700 for use in collection, processing, and/or representation of information collected in the platform 604, such as status information 1730, such as for the benefit of a set of demand management applications 1502, a set of supply chain applications 1500, a set of intelligent product applications 1510, a set of asset management applications 1530 and a set of enterprise resource management applications 1520 for a category of goods.

In embodiments, the dashboard for managing a set of digital twins, wherein at least one digital twin represents a set of supply chain entities and workflows and at least one other digital twin represents a set of demand management entities and workflows.

In embodiments, the entities and workflows relate to a set of products of an enterprise. In embodiments, the entities and workflows relate to a set of suppliers of an enterprise. In embodiments, the entities and workflows relate to a set of producers of a set of products. In embodiments, the entities and workflows relate to a set of manufacturers of a set of products.

In embodiments, the entities and workflows relate to a set of retailers of a line of products. In embodiments, the entities and workflows relate to a set of businesses involved in an ecosystem for a category of products. In embodiments, the entities and workflows relate to a set of owners of a set of assets involved in a value chain for a set of products. In embodiments, the entities and workflows relate to a set of operators of a set of assets involved in a value chain for a set of products.

In embodiments, the entities and workflows relate to a set of operating facilities. In embodiments, the entities and workflows relate to a set of customers. In embodiments, the entities and workflows relate to a set of consumers. In embodiments, the entities and workflows relate to a set of workers.

In embodiments, the entities and workflows relate to a set of mobile devices. In embodiments, the entities and workflows relate to a set of wearable devices. In embodiments, the entities and workflows relate to a set of distributors. In embodiments, the entities and workflows relate to a set of resellers.

In embodiments, the entities and workflows relate to a set of supply chain infrastructure facilities. In embodiments, the entities and workflows relate to a set of supply chain processes. In embodiments, the entities and workflows relate to a set of logistics processes. In embodiments, the entities and workflows relate to a set of reverse logistics processes.

In embodiments, the entities and workflows relate to a set of demand prediction processes. In embodiments, the entities and workflows relate to a set of demand management processes. In embodiments, the entities and workflows relate to a set of demand aggregation processes. In embodiments, the entities and workflows relate to a set of machines.

In embodiments, the entities and workflows relate to a set of ships. In embodiments, the entities and workflows relate to a set of barges. In embodiments, the entities and workflows relate to a set of warehouses. In embodiments, the entities and workflows relate to a set of maritime ports.

In embodiments, the entities and workflows relate to a set of airports. In embodiments, the entities and workflows relate to a set of airways. In embodiments, the entities and workflows relate to a set of waterways. In embodiments, the entities and workflows relate to a set of roadways.

In embodiments, the entities and workflows relate to a set of railways. In embodiments, the entities and workflows relate to a set of bridges. In embodiments, the entities and workflows relate to a set of tunnels. In embodiments, the entities and workflows relate to a set of online retailers.

In embodiments, the entities and workflows relate to a set of ecommerce sites. In embodiments, the entities and workflows relate to a set of demand factors. In embodiments, the entities and workflows relate to a set of supply factors. In embodiments, the entities and workflows relate to a set of delivery systems.

In embodiments, the entities and workflows relate to a set of floating assets. In embodiments, the entities and workflows relate to a set of points of origin. In embodiments, the entities and workflows relate to a set of points of destination. In embodiments, the entities and workflows relate to a set of points of storage.

In embodiments, the entities and workflows relate to a set of points of product usage. In embodiments, the entities and workflows relate to a set of networks. In embodiments, the entities and workflows relate to a set of information technology systems. In embodiments, the entities and workflows relate to a set of software platforms.

In embodiments, the entities and workflows relate to a set of distribution centers. In embodiments, the entities and workflows relate to a set of fulfillment centers. In embodiments, the entities and workflows relate to a set of containers. In embodiments, the entities and workflows relate to a set of container handling facilities.

In embodiments, the entities and workflows relate to a set of customs. In embodiments, the entities and workflows relate to a set of export control. In embodiments, the entities and workflows relate to a set of border control. In embodiments, the entities and workflows relate to a set of drones.

In embodiments, the entities and workflows relate to a set of robots. In embodiments, the entities and workflows relate to a set of autonomous vehicles. In embodiments, the entities and workflows relate to a set of hauling facilities. In embodiments, the entities and workflows relate to a set of drones, robots and autonomous vehicles. In embodiments, the entities and workflows relate to a set of waterways. In embodiments, the entities and workflows relate to a set of port infrastructure facilities.

In embodiments, the set of digital twins may include, for example and without limitation, distribution twins, warehousing twins, port infrastructure twins, shipping facility twins, operating facility twins, customer twins, worker twins, wearable device twins, portable device twins, mobile device twins, process twins, machine twins, asset twins, product twins, point of origin twins, point of destination twins, supply factor twins, maritime facility twins, floating asset twins, shipyard twins, fulfillment twins, delivery system twins, demand factors twins, retailer twins, ecommerce twins, online twins, waterway twins, roadway twins, roadway twins, railway twins, air facility twins, aircraft twins, ship twins, vehicle twins, train twins, autonomous vehicle twins, robotic system twins, drone twins, logistics factor twins and many others.

Microservices Architecture

Referring to FIG. 15, an embodiment of the platform 604 is provided. As with other embodiments, the platform 604 may employ a micro-services architecture with the various data handling layers 624, a set of network connectivity facilities 642 (which may include or connect to a set of interfaces 702 of various layers of the platform 604), a set of adaptive intelligence facilities or adaptive intelligent systems 614, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of microservices layers including an application layer supporting at least one supply chain application and at least one demand management application, wherein the applications of the application layer use a common set of services among a set of data processing services, data collection services, and data storage services.

In embodiments, the VCNP 604 may further include a set of microservices layers including an application layer supporting at least two applications among a set of demand management applications 1502, a set of supply chain applications 1500, a set of intelligent product applications 1510, a set of asset management applications 1530 and a set of enterprise resource management applications 1520 for a category of goods.

A microservices architecture provides several advantages to the platform 604. For example, one advantage may be the ability to leverage creation of improved microservices created by others such that developer may only need to define inputs and outputs such that the platform may use readily adapted services created by others. Also, use of the micro-services architecture may provide ability to modularize microservices into collections that may be used to achieve tasks. For example, a goal to determine what is happening in a warehouse may be achieved with a variety of microservices with minimal cost such as vision-based service, series of regular prompts that may ask and receive, reading off of event logs or feeds, and the like. Each one of these micro-services may be a distinct microservice that may be easily plugged in and used. If a particular microservice does not work effectively, the microservice may be replaced easily with another service with minimal impact to other components in the platform. Other microservices that may be used include recommendation service, collaborative filtering service, deep learning with semi-supervised learning service, etc. The microservice architecture may provide modularity at each stage in building a full workflow. In an example embodiment, a microservice may be built for multiple applications that may be consumed including shared data steam and anything else enabled by the microservices architecture.

IoT Data Collection Architecture Recommendation of Other Sensors and Cameras

Referring to FIG. 16, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of Internet of Things resources that collect information with respect to supply chain entities and demand management entities.

Also provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a machine learning/artificial intelligence system configured to generate recommendations for placing an additional sensor/ and or camera on and/or in proximity to a value chain entity and wherein data from the additional sensor and/or camera feeds into a digital twin that represents a set of value chain entities.

In embodiments, the VCNP 604 may further include a set of microservices, wherein the microservice layers include a monitoring systems and data collections systems layer 614 having data collection and management systems 640 that collect information from a set of Internet of Things resources 1172 that collect information with respect to supply chain entities and demand management entities 652. The microservices may support various applications among a set of demand management applications 1502, a set of supply chain applications 1500, a set of intelligent product applications 1510, a set of asset management applications 1530 and a set of enterprise resource management applications 1520 for a category of goods.

In embodiments, the platform 604 may further include a machine learning/artificial intelligence system 1160 that includes a sensor recommendation system 1750 that is configured to generate recommendations for placing an additional sensor 1462 and/or camera on and/or in proximity to a value chain network entity 652. For example, in some embodiments, the sensor recommendation system 1750 may generate recommendations by using load, array of signals, emergent situations, frequency response, maintenance, diagnosis, etc. Data from the additional sensor 1462 and/or camera may feed into a digital twin 1700 that represents a set of value chain entities 652. In embodiments, the set of Internet of Things resources that collect information with respect to supply chain entities and demand management entities collects information from entities of any of the types described throughout this disclosure and in the documents incorporated by reference herein.

In embodiments, the set of Internet of Things resources may be of a wide variety of types such as, without limitation, camera systems, lighting systems, motion sensing systems, weighing systems, inspection systems, machine vision systems, environmental sensor systems, onboard sensor systems, onboard diagnostic systems, environmental control systems, sensor-enabled network switching and routing systems, RF sensing systems, magnetic sensing systems, pressure monitoring systems, vibration monitoring systems, temperature monitoring systems, heat flow monitoring systems, biological measurement systems, chemical measurement systems, ultrasonic monitoring systems, radiography systems, LIDAR-based monitoring systems, access control systems, penetrating wave sensing systems, SONAR-based monitoring systems, radar-based monitoring systems, computed tomography systems, magnetic resonance imaging systems, network monitoring systems, or others.

In embodiments, the set of Internet of Things resources includes a set of camera systems. In embodiments, the set of Internet of Things resources includes a set of lighting systems. In embodiments, the set of Internet of Things resources includes a set of machine vision systems. In embodiments, the set of Internet of Things resources includes a set of motion sensing systems.

In embodiments, the set of Internet of Things resources includes a set of weighing systems. In embodiments, the set of Internet of Things resources includes a set of inspection systems. In embodiments, the set of Internet of Things resources includes a set of environmental sensor systems. In embodiments, the set of Internet of Things resources includes a set of onboard sensor systems.

In embodiments, the set of Internet of Things resources includes a set of onboard diagnostic systems. In embodiments, the set of Internet of Things resources includes a set of environmental control systems. In embodiments, the set of Internet of Things resources includes a set of sensor-enabled network switching and routing systems. In embodiments, the set of Internet of Things resources includes a set of RF sensing systems. In embodiments, the set of Internet of Things resources includes a set of magnetic sensing systems.

In embodiments, the set of Internet of Things resources includes a set of pressure monitoring systems. In embodiments, the set of Internet of Things resources includes a set of vibration monitoring systems. In embodiments, the set of Internet of Things resources includes a set of temperature monitoring systems. In embodiments, the set of Internet of Things resources includes a set of heat flow monitoring systems. In embodiments, the set of Internet of Things resources includes a set of biological measurement systems.

In embodiments, the set of Internet of Things resources includes a set of chemical measurement systems. In embodiments, the set of Internet of Things resources includes a set of ultrasonic monitoring systems. In embodiments, the set of Internet of Things resources includes a set of radiography systems. In embodiments, the set of Internet of Things resources includes a set of LIDAR-based monitoring systems. In embodiments, the set of Internet of Things resources includes a set of access control systems.

In embodiments, the set of Internet of Things resources includes a set of penetrating wave sensing systems. In embodiments, the set of Internet of Things resources includes a set of SONAR-based monitoring systems. In embodiments, the set of Internet of Things resources includes a set of radar-based monitoring systems. In embodiments, the set of Internet of Things resources includes a set of computed tomography systems. In embodiments, the set of Internet of Things resources includes a set of magnetic resonance imaging systems. In embodiments, the set of Internet of Things resources includes a set of network monitoring systems.

Social Data Collection Architecture

Referring to FIG. 17, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, the VCNP 604 may further include a set of microservices layers that include a data collection layer (e.g., monitoring systems and data collection systems layer 614) with a social data collection facility 1760 that collects information from a set of social network resources MPVC1708 that provide information with respect to supply chain entities and demand management entities. The social network data collection facilities 1760 may support various applications among a set of demand management applications 1502, a set of supply chain applications 1500, a set of intelligent product applications 1510, a set of asset management applications 1530 and a set of enterprise resource management applications 1520 for a category of goods. Social network data collection (using social network data collection facilities 1760) may be facilitated by a social data collection configuration interface, such as for configuring queries, identifying social data sources of relevance, configuring APIs for data collection, routing data to appropriate applications 630, and the like.

Crowdsourcing Data Collection Architecture

Referring to FIG. 18, an embodiment of the platform 604 is provided. As with other embodiments, the platform 604 may employ a micro-services architecture with the various data handling layers 614, a set of network connectivity facilities 642 (which may include or connect to a set of interfaces 702 of various layers of the platform 604), a set of adaptive intelligence facilities or adaptive intelligent systems 1160, a set of data storage facilities or systems 624, and a set of monitoring facilities or systems 614. The platform 604 may support a set of applications 630 (including processes, workflows, activities, events, use cases and applications) for enabling an enterprise to manage a set of value chain network entities 652, such as from a point of origin to a point of customer use of a product 650, which may be an intelligent product.

Thus, provided herein are methods, systems, components and other elements for an information technology system that may include: a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, the VCNP 604 may further include a set of microservices layers that include a monitoring systems and data collection systems layer 614 with a crowdsourcing facility 1770 that collects information from a set of crowdsourcing resources that provide information with respect to supply chain entities and demand management entities. The crowdsourcing services 1770 may support various applications among a set of demand management applications 1502, a set of supply chain applications 1500, a set of intelligent product applications 1510, a set of asset management applications 1530 and a set of enterprise resource management applications 1520 for a category of goods. Crowdsourcing may be facilitated by a crowdsourcing interface 1770, such as for configuring queries, setting rewards for information, configuring workflows, determining eligibility for participation, and other elements of crowdsourcing.

Value Chain Digital Twin Processing (DTPT)

Figure 52:
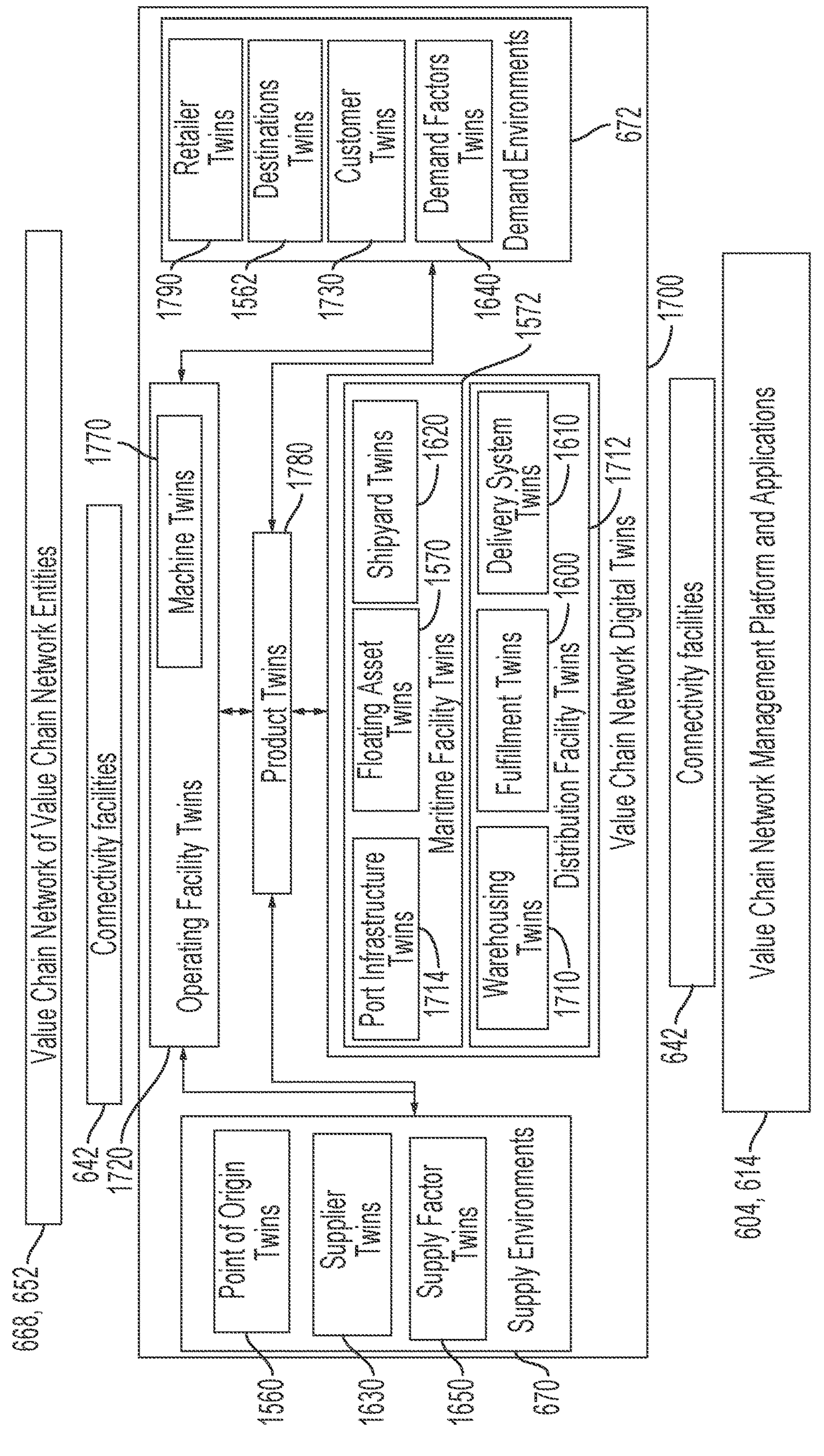
FIG. 52 is a diagrammatic view that depicts embodiments of a set of value chain network digital twins representing virtual models of a set of value chain network entities in accordance with the present disclosure.

Referring now to FIG. 52 a set of value chain network digital twins 1700 representing a set of value chain network entities 652 is depicted. The digital twins 1700 are configured to simulate properties, states, operations, behaviors and other aspects of the value chain network entities 652. The digital twins 1700 may have a visual user interface, e.g., in the form of 3D models, or may consist of system specifications or ontologies describing the architecture, including components and their interfaces, of the value chain network entities 652. The digital twins 1700 may include configuration or condition of the value chain network entities 652, including data records of the past and current state of the value chain network entities 652, such as captured through sensors, through user input, and/or determined by outputs of behavioral models that describe the behavior of the value chain network entities 652. The digital twins 1700 may be updated continuously to reflect the current condition of the value chain network entities 652, based on sensor data, test and inspection results, conducted maintenance, modifications, etc. The digital twins 1700 may also be configured to communicate with a user via multiple communication channels, such as speech, text, gestures, and the like. For example, a digital twin 1700 may receive queries from a user about the value chain network entities 652, generate responses for the queries, and communicate such responses to the user. Additionally or alternatively, digital twins 1700 may communicate with one another to learn from and identify similar operating patterns and issues in other value chain network entities 652, as well as steps taken to resolve those issues. The digital twins 1700 may be used for monitoring, diagnostics, simulation, management, remote control, and prognostics, such as to optimize the individual and collective performance and utilization of value chain network entities 652.

For example, machine twins 1770 may continuously capture the key operational metrics of the machines 724 and may be used to monitor and optimize machine performance in real time. Machine twins 1770 may combine sensor, performance, and environmental data, including insights from similar machines 724, enabling prediction of life span of various machine components and informed maintenance decisions. In embodiments, machine twins 1770 may generate an alert or other warning based on a change in operating characteristics of the machine 724. The alert may be due to an issue with a component of the machine 724. Additionally, machine twins 1770 may determine similar issues that have previously occurred with the machine or similar machines, provide a description of what caused the issues, what was done to address the issues, and explain differences between the present issue and the previous issues and what actions to take to resolve the issue, etc.

Similarly, warehousing twins 1712 may combine a 3D model of the warehouse with inventory and operational data including the size, quantity, location, and demand characteristics of different products. The warehousing twins 1712 may also collect sensor data in a connected warehouse, as well as data on the movement of inventory and personnel within the warehouse. Warehousing twins 1712 may help in optimizing space utilization and aid in identification and elimination of waste in warehouse operations. The simulation using warehousing twins 1712 of the movement of products, personnel, and material handling equipment may enable warehouse managers to test and evaluate the potential impact of layout changes or the introduction of new equipment and new processes.

In embodiments, multiple digital twins of the value chain network entities 652 may be integrated, thereby aggregating data across the value chain network to drive not only entity-level insights but also system-level insights. For example, consider a simple value chain network with an operating facility 712 comprising different machines 724 including conveyors, robots, and inspection devices. The operating facility digital twin 1172 may need to integrate the data from digital twins 1770 of different machines to get a holistic picture of the complete conveyor line in the operating facility 712 (e.g., a warehouse, distribution center, or fulfillment center where packages are moved along a conveyor and inspected before being sent out for delivery. While the digital twin of conveyor line may provide insights about only its performance, the composite digital twin may aggregate data across the different machines in the operating facility 712. Thus, it may provide an integrated view of individual machines and their interactions with environmental factors in the operating facility leading to insights about the overall health of the conveyor line within the operating facility 712. As another example, the supply factor twins 1650 and demand factor twins 1640 may be integrated to create a holistic picture of demand-supply equilibrium for a product 650. The integration of digital twins also enables the querying of multiple value chain network entities 652 and create a 360-degree view of the value chain network 668 and its various systems and subsystems.

It will be apparent that the ability to integrate digital twins of the value chain network entities 652 may be used to generate a value chain network digital twin system from a plurality of digital twin subsystems representing entities selected from among supply chain entities, demand management entities and value chain network entities. For example, a machine digital twin 1770 is comprised of multiple digital twins of sub-systems and individual components constituting the machine 724. The machine's digital twin may integrate all such component twins and their inputs and outputs to build the model of the machine. Also, for example, a distribution facility twins system 1714 may be comprised of subsystems, such as warehousing twins 1712, fulfilment twins 1600 and delivery system twins 1610.

Similarly, the process digital twin may be seen as comprised of digital twins of multiple sub-processes representing entities selected from among supply chain entities, demand management entities and value chain network entities. For example, the digital twin of a packaging process is comprised of digital twins of sub-processes for picking, moving, inspecting and packing the product. As another example, the digital twin of warehousing process may be seen as comprised of digital twins of multiple sub-processes including receiving, storing, picking and shipping of stored inventories.

It will be apparent that a value chain network digital twin system may be generated from a plurality of digital twin subsystems or conversely a digital twin subsystem may be generated from a digital twin system, wherein at least one of the digital twin subsystem and the digital twin system represents entities selected from among supply chain entities, demand management entities and value chain network entities.

Similarly, a value chain network digital twin process may be generated from a plurality of digital twin sub-processes or conversely digital twin sub-process generated from a digital twin process wherein at least one of the digital twin sub-process and the digital twin process represents entities selected from among supply chain entities, demand management entities and value chain network entities.

The analytics obtained from digital twins 1700 of the value chain network entities 652 and their interactions with one another provide a systemic view of the value chain network as well as its systems, sub-systems, processes and sub-processes. This may help in generating new insights into ways the various systems and processes may be evolved to improve their performance and efficiency.

In embodiments, the platform 604 and applications 630 may have a system for generating and updating a self-expanding digital twin that represents a set of value chain entities. The self-expanding digital twin continuously keeps learning and expanding in scope, with more and more data it collects and scenarios it encounters. As a result, the self-expanding twin can evolve with time and take on more complex tasks and answer more complex questions posed by a user of the self-expanding digital twin.

In embodiments, the platform 604 and applications 630 may have a system for scheduling the synchronization of a physical value chain entity's changing condition to a digital twin that represents a set of value chain entities. In embodiments, the synchronization between the physical value chain entity and its digital twin is on a near real-time basis.

In embodiments, the platform 604 and applications 630 may have an application programming interface for extracting, sharing, and/or harmonizing data from information technology systems associated with multiple value chain network entities that contribute to a single digital twin representing a set of value chain entities.

In embodiments, value chain network management platform 604 may include various subsystems that may be implemented as micro services, such that other subsystems of the system access the functionality of a subsystem providing a micro service via application programming interface API. In some embodiments, the various services that are provided by the subsystems may be deployed in bundles that are integrated, such as by a set of APIs.

In embodiments, value chain network management platform 604 may include a set of microservices for managing a set of value chain network entities for an enterprise and having a set of processing capabilities for at least one of creating, modifying, and managing the parameters of a digital twin that is used in the platform to represent a set of value chain network entities.

Value Chain Digital Twin Kit (DTIB)

The value chain network management platform may provide a digital twin sub-system in the form of an out-of-the-box kit system with self-configuring capabilities. The kit may provide a data-rich and interactive overview of a set of value chain network entities constituting the sub-system. For example, a supply chain out-of-the-box digital twin kit system may represent a set of supply chain entities that are linked to the identity of an owner or operator of the supply chain entities. The owner or operator of the supply chain entity may then use the kit to get a holistic picture of its complete portfolio. The owner may investigate for information related to various supply chain entities and ask interactive questions from the digital twin kit system.

In embodiments, a demand management out-of-the-box digital twin kit system may represent a set of demand management entities that are linked to the identity of an owner or operator of the demand management entities.

In embodiments, a value chain network digital twin kit system for providing out-of-the-box, self-configuring capabilities may represent a set of demand management entities and a set of supply chain entities that are linked to the identity of an owner or operator of the demand management entities and the supply chain entities.

In embodiments, a warehouse digital twin kit system for providing out-of-the-box, self-configuring capabilities may represent a set of warehouse entities that are linked to the identity of an owner or operator of the warehouse.

Figure 53:
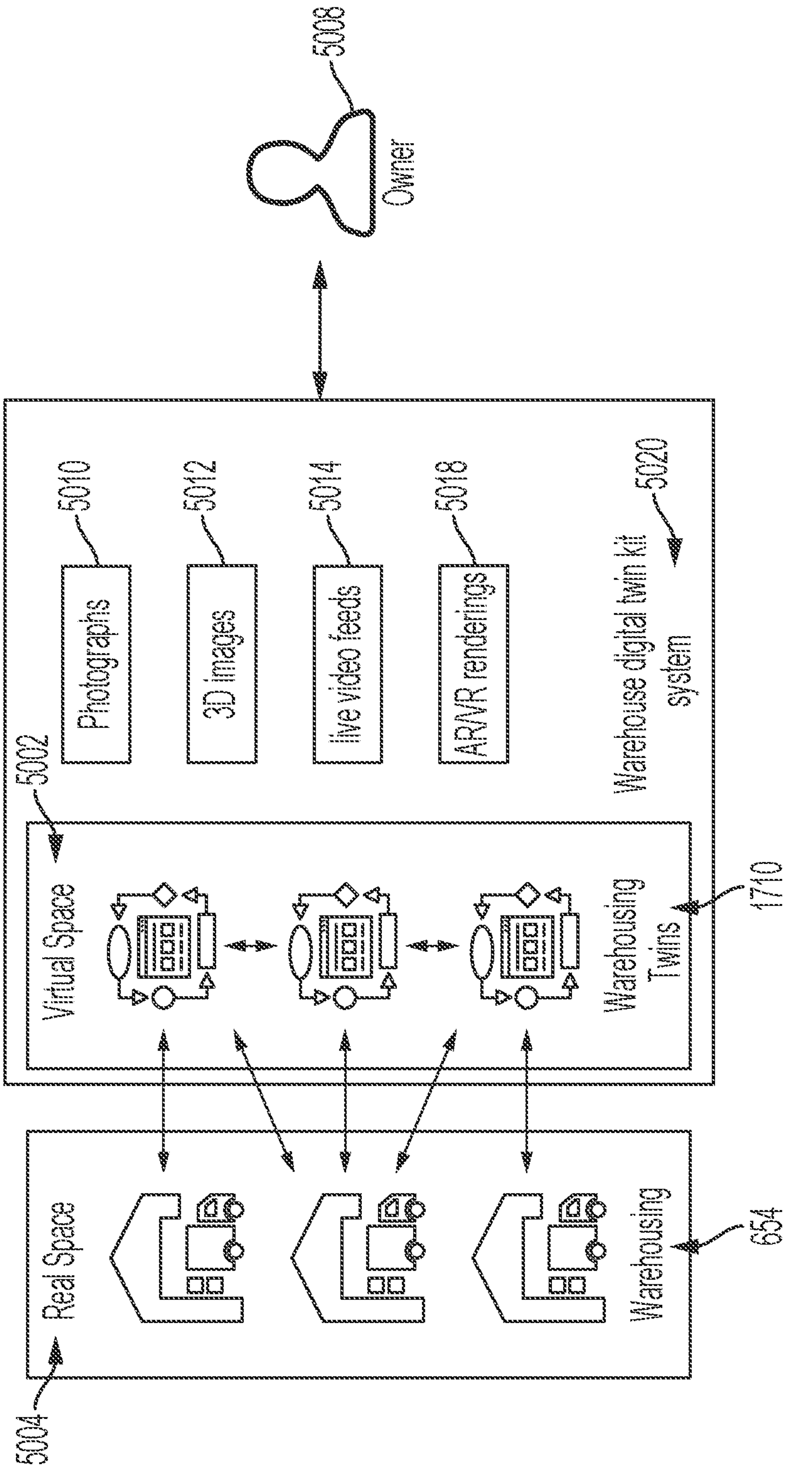
FIG. 53 is a diagrammatic view that depicts embodiments of a warehouse digital twin kit system in accordance with the present disclosure.

Referring now to FIG. 53, an example warehouse digital twin kit system 5000 is depicted. The warehouse digital twin kit system 5000 includes warehousing twins in the virtual space 5002 representing models of warehouses 654 in the real space 5004.

The warehouse digital twin kit system 5000 allows an owner or operator 5008 of the one or more warehouse entities 654 to get complete portfolio overview of all these entities-existing or in design or construction. The owner 5008 may navigate a wealth of information including warehouse photographs 5010, 3D images 5012, live video feeds 5014 of real-time construction progress and AR or VR renderings 5018 of the warehousing entities 654. The owner 5008 may investigate about the health of one or more entities 654 and ask interactive questions and search for detailed information about one or more warehouse entities 654. The warehouse digital twin kit system 5000 has access to real time dynamic data captured by IoT devices and sensors at warehouse entities 654 and may be supported with natural language capabilities enabling it to interact with the owner 5008 and answer any questions about the condition of the warehouse entities 654.

In embodiments, warehouse digital twin kit system 5000 may provide the portfolio overview of warehouse entities 654 to owner 5008 in the form of a 3D information map containing all the warehouse entities 654. Owner 5008 may select a specific entity on the map and get information about inventory, operational and health data from the warehousing twin 1710. Alternatively, the owner 5008 may ask for information about the overall portfolio of warehouse entities 654 owned. The warehouse digital twin kit system 5000 consolidates information from the multiple warehousing twins 1710 and provides a holistic view. The consolidated view may help owner 5008 to optimize operations across warehouse entities 654 by adjusting stock locations and staffing levels to match current or forecasted demand. The owner 5008 may also display the information from warehouse digital twin kit system 5000 on a website or marketing material to be accessed by any customers, suppliers, vendors and other partners.

In embodiments, a container ship digital twin kit system for providing out-of-the-box, self-configuring capabilities may represent a set of container ship entities that are linked to the identity of an owner or operator of the container ship.

In embodiments, a port infrastructure digital twin kit system for providing out-of-the-box, self-configuring capabilities may represent a set of port infrastructure entities that are linked to the identity of an owner or operator of the port infrastructure.

Value Chain Compatibility Testing (VCCT)

The platform 604 may deploy digital twins 1700 of value chain network entities 652 for testing the compatibility between different value chain network entities 652 interacting with one another and forming various systems and subsystems of the value chain network.

This brings visibility to the compatibility and performance of various systems and subsystems within the value chain network before there are any physical impacts. Any incompatibilities or performance deficiencies of different value chain network entities 652 may be highlighted through digital models and simulations rather than having to rely on physical systems to perform such tests which is both expensive and impractical.

The digital twin 1700 may make use of artificial intelligence 1160 (including any of the various expert systems, artificial intelligence systems, neural networks, supervised learning systems, machine learning systems, deep learning systems, and other systems described throughout this disclosure and in the documents incorporated by reference) for carrying out the compatibility testing in the value chain network.

In embodiments, the platform may provide a system for testing compatibility or configuration of a set of vendor components for a container ship using a set of digital twins representing the container ship and the vendor components.

In embodiments, the platform may provide a system for testing compatibility or configuration of a set of vendor components for a warehouse using a set of digital twins representing the warehouse and the vendor components.

In embodiments, the platform may provide a system for testing compatibility or configuration of a set of vendor components for a port infrastructure facility using a set of digital twins representing the port infrastructure facility and the vendor components.

In embodiments, the platform may provide a system for testing compatibility or configuration of a set of vendor components for a shipyard facility using a set of digital twins representing the shipyard facility and the vendor components.

In embodiments, the platform may provide a system for testing compatibility or configuration of a container ship and a set of port infrastructure facilities using a set of digital twins representing the container ship and the port infrastructure facility.

In embodiments, the platform may provide a system for testing compatibility or configuration of a barge and a set of waterways for a navigation route using a set of digital twins representing the barge and the set of waterways.

In embodiments, the platform may provide a system for testing compatibility or configuration of a container ship and a set of cargo for an identified shipment using a set of digital twins representing the container ship and the cargo.

In embodiments, the platform may provide a system for testing compatibility or configuration of a barge and a set of cargo for an identified shipment using a set of digital twins representing the barge and the cargo.

In embodiments, the platform may provide a system for testing compatibility or configuration of a set of cargo handling infrastructure facilities and a set of cargo for an identified shipment using a set of digital twins representing the cargo handling infrastructure facilities and the cargo.

Value Chain Infrastructure Testing (VCIT)

The platform 604 may deploy digital twins 1700 of value chain network entities 652 to perform stress tests on a set of value chain network entities. The digital twins may help simulate behavior of value chain network systems and sub-systems in a wide variety of environments. The stress tests may help run any "what-if" scenarios to understand the impact of change in relevant parameters beyond normal operating values and evaluate the resilience of the infrastructure of value chain network.

The platform 604 may include a system for learning on a training set of outcomes, parameters, and data collected from data sources relating to a set of value chain network activities to train artificial intelligence system 1160 (including any of the various expert systems, artificial intelligence systems, neural networks, supervised learning systems, machine learning systems, deep learning systems, and other systems described throughout this disclosure and in the documents incorporated) for performing such stress tests on the value chain network.

In embodiments, the platform may include a system for learning on a training set of machine outcomes, parameters, and data collected from data sources relating to a set of value chain network activities to train an artificial intelligence/machine learning system to perform stress tests on the machine using a digital twin that represents a set of value chain entities.

As described, the value chain network comprises a plurality of interrelated sub-systems and sub-processes that manage and control all aspects associated with the production and delivery of a finished product to an end-user—from the acquisition and distribution of raw materials between a supplier and a manufacturer, through the delivery, distribution, and storage of materials for a retailer or wholesaler, and, finally, to the sale of the product to an end-user. The complex interconnected nature of the value chain network means that an adverse event within one subsystem or one or more value chain entities reflect through the entire value chain network.

Figure 54:
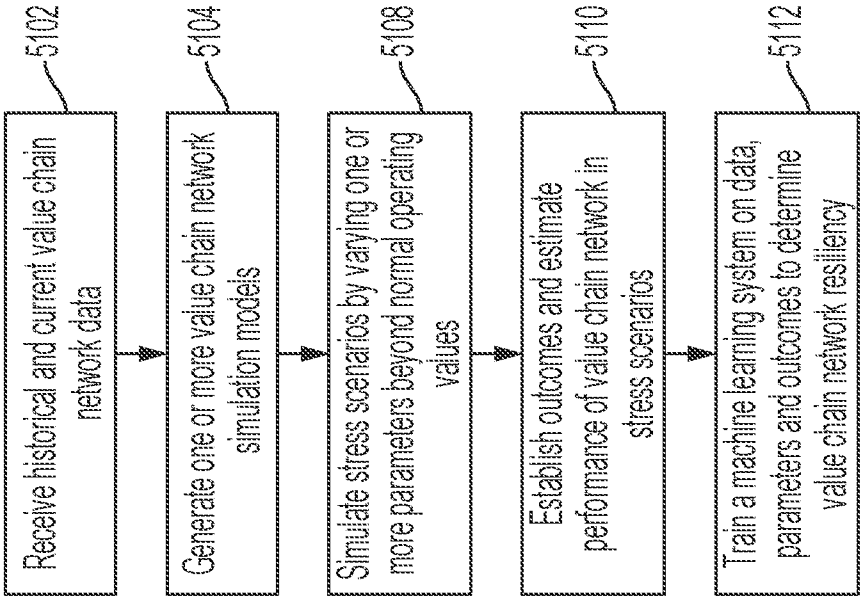
FIG. 54 is a diagrammatic view that depicts embodiments of a stress test performed on a value chain network in accordance with the present disclosure.

FIG. 54 is an example method for performing a stress test on the value chain network. The stress test may comprise a simulation exercise to test the resilience of the value chain network (including its subsystems) and determine its ability to deal with an adverse scenario, say a natural calamity, a congested route, a change in law, or a deep economic recession. Such adverse or stress scenarios may affect one or more entities or subsystems within the value chain network depending on the nature of the scenario. Hence, any stress tests would require simulating scenarios and analyzing the impact of different scenarios across different subsystems and on the overall value chain network.

At 5102, all historical and current data related to the value chain network are received. The data may include information related to various operating parameters of the value chain network over a particular historical time period, say last 12 months. The data may also provide information on the typical values of various operating parameters under normal conditions. Some examples of operating parameters include: product demand, procurement lead time, productivity, inventory level at one or more warehouses, inventory turnover rates, warehousing costs, average time to transport product from warehouse to shipping terminals, overall cost of product delivery, service levels, etc. At 5104, one or more simulation models of value chain network are created based on the data. The simulation models help in visualizing the value chain network as a whole and in predicting how changes in operating parameters affect the operation and performance of the value chain network. In embodiments, the simulation model may be a sum of multiple models of different subsystems of the value chain network.

At 5106, one or more stress scenarios may be simulated by changing one or more parameters beyond the normal operating values. The simulating of stress scenarios overcome the limitation of any analysis based only on historical data and helps analyze the network performance across a range of hypothetical yet plausible stress conditions. The simulation involves varying (shocking) one or more parameters while keeping the other parameters as fixed to analyze the impact of such variations on value chain network. In embodiments, a single parameter may be varied while keeping remaining parameters as fixed. In other embodiments, multiple parameters may be varied simultaneously. At 5108, the outcomes of stress scenario simulations are determined, and the performance of value chain network and its different subsystems is estimated across various scenarios. At 5110, the data, parameters and outcomes are fed into a machine learning process in the artificial intelligence system 1160 for further analysis.

An advantage of generating data through simulations and then training machine learning algorithms on this data is the control this approach provides on the features in the data as well as volume and frequency of data.

In embodiments, the platform may include a system for learning on a training set of outcomes, parameters, and data collected from data sources relating to a set of value chain network activities to train an artificial intelligence/machine learning system to perform stress tests on a physical object using a digital twin that represents a set of value chain entities.

In embodiments, the platform may include a system for learning on a training set of outcomes, parameters, and data collected from data sources relating to a set of value chain network activities to train an artificial intelligence/machine learning system to perform stress tests on a telecommunications network using a digital twin that represents a set of value chain entities in a connected network of entities and the telecommunications network.

For example, the telecommunications network may be stress tested for resiliency by deliberately increasing network traffic by generating and sending data packets to a specific target node within the telecommunications network. Further, the amount of traffic may be varied to create varying load conditions on the target node by manipulating the number, rate or amount of data in the data packets. The response from the target node may be determined to evaluate how the node performed in the stress test. The target node may be selected at different parts of the telecommunications network for stress testing so as to test robustness of any portion of the network in any topology. The simulated stress tests on the telecommunications network may be utilized to identify vulnerabilities in any portion of a network so that the vulnerability can be rectified before users experience network outages in a deployed network.

In embodiments, the platform may include a system for using a digital twin that represents a set of value chain entities in a demand management environment to perform a set of stress tests on a set of workflows in the demand management environment using the digital twin, wherein the stress tests represent impacts in the digital twin of varying a set of demand-relevant parameters to levels that exceed normal operating levels. For example, the demand of a product in the value chain network may be affected by factors like changes in consumer confidence, recessions, excessive inventory levels, substitute product pricing, overall market indices, currency exchange changes, etc. The demand factors twin 1640 may simulate such scenarios by varying supply parameters and evaluate the impact of such stresses on the demand environments 672. The stress tests performed using the digital twins may help in testing and evaluating the resiliency of the value chain network both in cases of over-demand and under-demand.

In embodiments, the platform may include a system for using a digital twin that represents a set of value chain entities in the supply chain to perform a set of stress tests on a set of workflows in the supply chain using the digital twin, wherein the stress tests represent impacts in the digital twin of varying a set of supply chain-relevant parameters to levels that exceed normal operating levels. For example, the supply of a product in the value chain network may be affected by factors like weather, natural calamities, traffic congestion, regulatory changes including taxes and subsidies and border restrictions, etc. The supply factors twin 1650 may simulate such scenarios by varying supply parameters and evaluate the impact of such stresses on the supply environments 670. The stress tests performed using the digital twins may help in testing and evaluating the resiliency of the value chain network both in cases of over-supply and under-supply.

Value Chain Incident Management (VCIM)

The platform 604 may deploy digital twins 1700 of value chain network entities 652 for automatically managing a set of incidents relating to a set of value chain network entities and activities. The incidents may include any events causing disruption to the value chain network like accidents, fires, explosions, labor strikes, increases in tariffs, changes in law, changes in market prices (e.g., of fuel, components, materials, or end products), changes in demand, activities of cartels, closures of borders or routes, and/or natural events and/or disasters (including storms, heat waves, winds, earthquakes, floods, hurricanes, tsunamis, etc.), among many others.

Also, the platform 604 may provide real-time visualization and analysis of mobility flows in the value chain network. This may help in quantifying risks, improving visibility and reacting to the disruptions in the value chain network. For example, real-time visualization of a utility flow for shipping activities using a digital twin may help in detecting the occurrence and location of an emergency involving a shipping system and deploying emergency services to the detected location.

In embodiments, the platform may deploy digital twins 1700 of value chain network entities 652 for more accurate determination of accident fault. The platform may learn on a training set of accident outcomes, parameters, and data collected from the monitoring layer 614 and data sources of the data storage layer 624 to train artificial intelligence system 1160 using a set of digital twins 1700 of involved value chain network entities 652 to determine accident fault. For example, data from digital twins of two colliding vehicles may be compared with each other in addition to data from the drivers, witnesses and police reports to determine accident fault.

In embodiments, the platform may include a system for learning on a training set of vehicular event outcomes, parameters, and data collected from data sources related to a set of value chain network entities 652 to train artificial intelligence system 1160 to use a digital twins 1700 of a selected set of value chain network entities 652 to detect an incidence of fraud. For example, comparing vehicular event data from digital twins of vehicles to any insurance claims, contract claims, maritime claims on such vehicles may help in detecting any mismatch in the two.

In embodiments, the platform may include a system for learning on a training set of vehicle outcomes, parameters, and data collected from data sources related to a set of value chain network entities 652 to train artificial intelligence system 1160 to use a digital twin 1700 of a selected set of value chain network entities 652 to detect unreported abnormal events with respect to selected set of value chain network entities 652. Consider an example where the digital twin of a vehicle shows an abnormal event like an accident but this event has not been reported by the driver of the vehicle. The unreported event may be added to the record of the vehicle and the driver by a lessor of the vehicle. Also, the lessor of the vehicle may charge the lessee for repairs or diminished value of the vehicle at lease-end and adjust residual value forecast for the same. Similarly, an insurer may add the unreported event to the record of the vehicle and the driver. The reporting may be as detailed as the exact nature, timing, location, fault, etc. of the accident or just the fact there was unreported accident. This information may then be used for calculating the insurance premium.

Finally, in case there are multiple entities involved in the accident, the data may be triangulated with the digital twin of another entity for validation.

Value Chain Predictive Maintenance (PMVC)

The platform 604 may deploy digital twins 1700 of value chain network entities 652 to predict when a set of value chain network entities should receive maintenance.

The digital twin may predict the anticipated wear and failure of components of a system by reviewing historical and current operational data thereby reducing the risk of unplanned downtime and the need for scheduled maintenance. Instead of over-servicing or over-maintaining products to avoid costly downtime, repairs or replacement, any product performance issues predicted by the digital twin may be addressed in a proactive or just-in-time manner.

The digital twins 1700 may collect events or state data about value chain entities 652 from the monitoring layer 614 and historical or other data from selected data sources of the data storage layer 624. Predictive analytics powered by artificial intelligence system 1160 dissect the data, search for correlations, and formulate predictions about maintenance need and remaining useful life of a set of value chain entities 652.

The platform 604 may include a system for learning on a training set of outcomes, parameters, and data collected from data sources relating to a set of value chain network activities to train artificial intelligence 1160 (including any of the various expert systems, artificial intelligence systems, neural networks, supervised learning systems, machine learning systems, deep learning systems, and other systems described throughout this disclosure and in the documents incorporated) for performing condition monitoring, anomaly detection, failure forecasting and predictive maintenance of a set of value chain entities 652.

In embodiments, the platform may include a system for learning on a training set of machine maintenance outcomes, parameters, and data collected from data sources relating to a set of machine activities to train an artificial intelligence/machine learning system to perform predictive maintenance on a machine using a digital twin of the machine.

In embodiments, artificial intelligence system 1160 may train models, such as predictive models (e.g., various types of neural networks, classification-based models, regression based models, and other machine-learned models). In embodiments, training can be supervised, semi-supervised, or unsupervised. In embodiments, training can be done using training data, which may be collected or generated for training purposes.

An example artificial intelligence system 1160 trains a machine predictive maintenance model. A predictive maintenance model may be a model that receives machine related data and outputs one or more predictions or answers regarding the remaining life of the machine. The training data can be gathered from multiple sources including machine specifications, environmental data, sensor data, run information, outcome data and notes maintained by machine operators. The artificial intelligence system 1160 takes in the raw data, pre-processes it and applies machine learning algorithms to generate the predictive maintenance model. In embodiments, the artificial intelligence system 1160 may store the predictive model in a model datastore within data storage layer 624.

Some examples of questions that the predictive model may answer are: when will the machine fail, what type of failure it will be, what is the probability that a failure will occur within the next X hours, what is the remaining useful life of the machine, is the machine behaving in an uncharacteristic manner, which machine requires maintenance most urgently and the like.

The artificial intelligence system 1160 may train multiple predictive models to answer different questions. For example, a classification model may be trained to predict failure within a given time window, while a regression model may be trained to predict the remaining useful life of the machine.

In embodiments, training may be done based on feedback received by the system, which is also referred to as "reinforcement learning." In embodiments, the artificial intelligence system 1160 may receive a set of circumstances that led to a prediction (e.g., attributes of a machine, attributes of a model, and the like) and an outcome related to the machine and may update the model according to the feedback.

In embodiments, artificial intelligence system 1160 may use a clustering algorithm to identify the failure pattern hidden in the failure data to train a model for detecting uncharacteristic or anomalous behavior. The failure data across multiple machines and their historical records may be clustered to understand how different patterns correlate to certain wear-down behavior and develop a maintenance plan resonant with the failure.

In embodiments, artificial intelligence system 1160 may output scores for each possible prediction, where each prediction corresponds to a possible outcome. For example, in using a predictive model used to determine a likelihood that a machine will fail in the next one week, the predictive model may output a score for a "will fail" outcome and a score for a "will not fail" outcome. The artificial intelligence system 1160 may then select the outcome with the greater score as the prediction. Alternatively, the system 1160 may output the respective scores to a requesting system. In embodiments, the output from system 1160 includes a probability of the prediction's accuracy.

Figure 55:
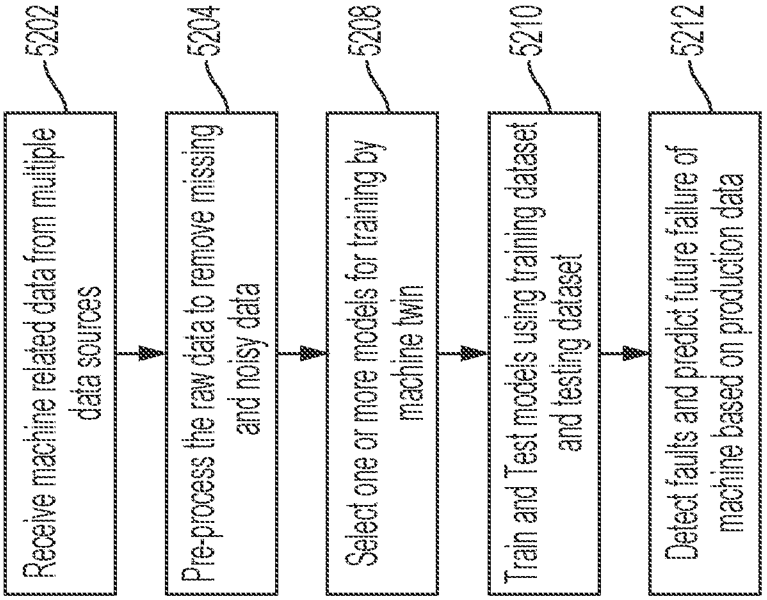
FIG. 55 is a diagrammatic view that depicts embodiments of methods used by a machine for detecting faults and predicting any future failures of the machine in accordance with the present disclosure.

FIG. 55 is an example method used by machine twin 1770 for detecting faults and predicting any future failures of machine 724.

At 5202, a plurality of streams of machine related data from multiple data sources are received at the machine twin 1770. This includes machine specifications like mechanical properties, data from maintenance records, operating data collected from the sensors, historical data including failure data from multiple machines running at different times and under different operating conditions and so on. At 5205, the raw data is cleaned by removing any missing or noisy data, which may occur due to any technical problems in the machine at the time of collection of data. At 5208, one or more models are selected for training by machine twin 1770. The selection of model is based on the kind of data available at the machine twin 1770 and the desired outcome of the model. For example, there may be cases where failure data from machines is not available, or only a limited number of failure datasets exist because of regular maintenance being performed. Classification or regression models may not work well for such cases and clustering models may be most suitable. As another example, if the desired outcome of the model is determining current condition of the machine and detecting any faults, then fault detection models may be selected, whereas if the desired outcome is predicting future failures then remaining useful life prediction model may be selected. At 5210, the one or more models are trained using training dataset and tested for performance using testing dataset. At 5212, the trained model is used for detecting faults and predicting future failure of the machine on production data.

Figure 56:
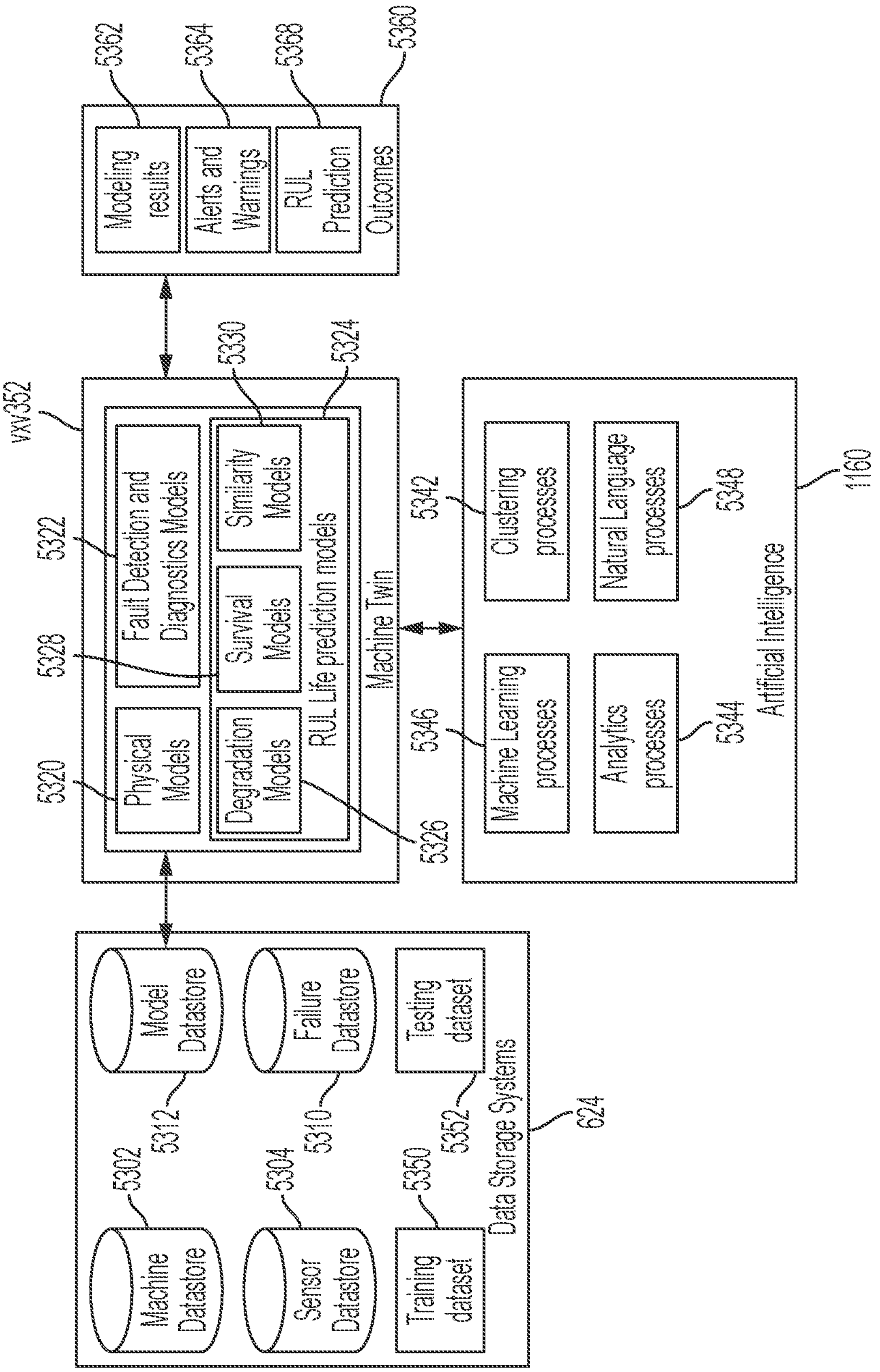
FIG. 56 is a diagrammatic view that depicts embodiments of deployment of machine twins to perform predictive maintenance on a set of machines in accordance with the present disclosure.

FIG. 56 is an example embodiment depicting the deployment of machine twins 1770 perform predictive maintenance on machines 724. Machine twin 1770 receives data from data storage systems 624 on a real-time or near real-time basis. The data storage systems 624 may store different types of data in different datastores. For example, machine datastore 5202 may store data related to machine identification and attributes, machine state and event data, data from maintenance records, historical operating data, notes from machine operator, etc. Sensor datastore 5204 may store sensor data from operation such as temperature, pressure, and vibration that may be stored as signal or time series data. Failure datastore 5310 may store failure data from machine 724 or similar machines running at different times and under different operating conditions. Model datastore 5312 may store data related to different predictive models including fault detection and remaining life prediction models.

Machine twin 1770 then coordinates with artificial intelligence system to select one or more of models based on the kind and quality of available data and the desired answers or outcomes. For example, physical models 5320 may be selected if the intended use of machine twin 1770 is to simulate what-if scenarios and predict how the machine will behave under such scenarios. Fault Detection and Diagnostics Models 5322 may be selected to determine the current health of the machine and any fault conditions. A simple fault detection model may use one or more condition indicators to distinguish between regular and faulty behaviors and may have a threshold value for the condition indicator that is indicative of a fault condition when exceeded. A more complex model may train a classifier to compare the value of one or more condition indicators to values associated with fault states and returns the probability of presence of one or more fault states.

Remaining Useful Life (RUL) Prediction models 5324 are used for predicting future failures and may include degradation models 5326, survival models 5328 and similarity models 5330. An example RUL prediction model may fit the time evolution of a condition indicator and predicts how long it will be before the condition indicator crosses some threshold value indicative of a failure. Another model may compare the time evolution of the condition indicator to measured or simulated time series from similar systems that ran to failure.

In embodiments, a combination of one or more of these models may be selected by the machine twin 1770.

Artificial Intelligence system 1160 may include machine learning processes 5340, clustering processes 5342, analytics processes 5344 and natural language processes 5348. Machine learning processes 5340 work with machine twin 1770 to train one or more models as identified above. An example of such machine learned model is the RUL prediction model 5324. The model 5324 may be trained using training dataset pmvc 230 from the Data Storage Systems 624. The performance of the model 5324 and classifier may then be tested using testing dataset 5350.

Clustering processes 5342 may be implemented to identify the failure pattern hidden in the failure data to train a model for detecting uncharacteristic or anomalous behavior. The failure data across multiple machines and their historical records may be clustered to understand how different patterns correlate to certain wear-down behavior. Analytics processes 5344 perform data analytics on various data to identify insights and predict outcomes. Natural language processes 4348 coordinate with machine twin 1770 to communicate the outcomes and results to the user of machine twin 1770.

The outcomes 5360 may be in the form of modeling results 5362, alerts and warnings 5364 or remaining useful life (RUL) predictions 5368. Machine twin 1770 may communicate with a user via multiple communication channels such as speech, text, gestures to convey outcomes 5360.

In embodiments, models may then be updated or reinforced based on the model outcomes 5360. For example, the artificial intelligence system may receive a set of circumstances that led to a prediction of failure and the outcome and may update the model based on the feedback.

In embodiments, the platform may include a system for learning on a training set of ship maintenance outcomes, parameters, and data collected from data sources relating to a set of ship activities to train an artificial intelligence/machine learning system to perform predictive maintenance on a ship using a digital twin of the ship.

In embodiments, the platform may include a system for learning on a training set of barge maintenance outcomes, parameters, and data collected from data sources relating to a set of barge activities to train an artificial intelligence/machine learning system to perform predictive maintenance on a barge using a digital twin of the barge.

In embodiments, the platform may include a system for learning on a training set of port maintenance outcomes, parameters, and data collected from data sources relating to a set of port activities to train an artificial intelligence/machine learning system to perform predictive maintenance on a port infrastructure facility using a digital twin of the port infrastructure facility.

In embodiments, the platform may include a system for learning on a training set of repair outcomes, parameters, and data collected from data sources related to a set of value chain entities to train an artificial intelligence/machine learning system to use a digital twin of a selected set of value chain entities to estimate the cost of repair of a damaged object.

In embodiments, the platform may include a system for learning on a training set of infrastructure outcomes, parameters, and data collected from data sources to train an artificial intelligence/machine learning system to predict deterioration of infrastructure using a digital twin of the infrastructure.

In embodiments, the platform may include a system for learning on a training set of natural hazard outcomes, parameters, and data collected from data sources relating to a set of shipping activities to train an artificial intelligence/machine learning system to model natural hazard risks for a set of shipping infrastructure facilities using a digital twin of a city.

In embodiments, the platform may include a system for learning on a training set of maintenance outcomes, parameters, and data collected from data sources relating to a set of shipping activities to train an artificial intelligence/machine learning system to monitor shipping infrastructure maintenance activities for a set of shipping infrastructure facilities using a digital twin of the set of facilities In embodiments, the platform may include a system for learning on a training set of maintenance outcomes, parameters, and data collected from data sources relating to a set of shipping activities to train an artificial intelligence/machine learning system to detect the occurrence and location of a maintenance issue using a digital twin of a set of shipping infrastructure facilities and having a system for automatically deploying maintenance services to the detected location.

Figure 57:
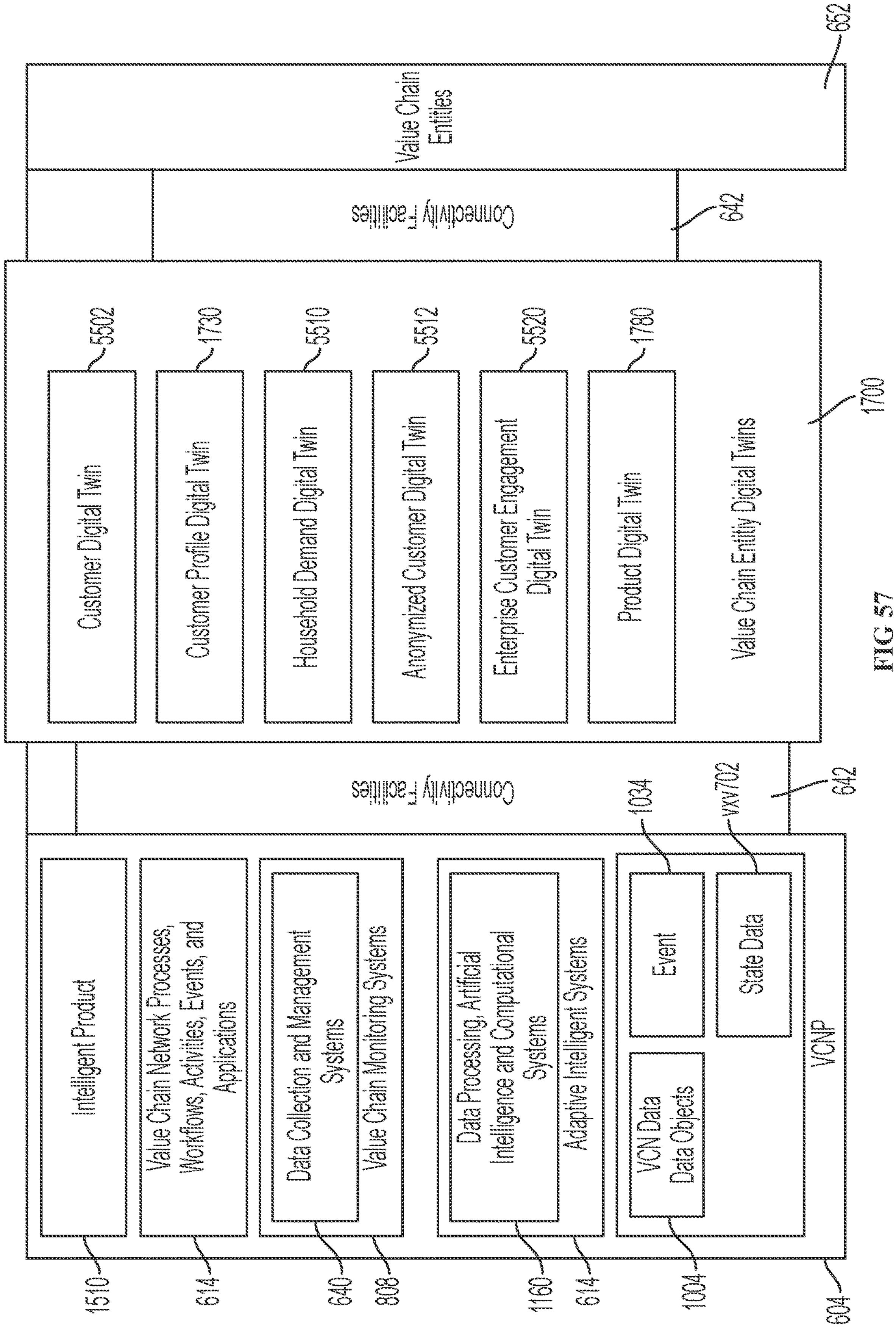
FIG. 57 is a schematic illustrating an example of a portion of a system for value chain customer digital twins and customer profile digital twins according to some embodiments of the present disclosure.

Referring to FIG. 57, the platform 604 may include, integrate, integrate with, manage, control, coordinate with, or otherwise handle customer digital twins 5502 and/or customer profile digital twins 1730.

Customer digital twins 5502 may represent evolving, continuously updated digital representations of value chain network customers 662. In embodiments, value chain network customers 662 include consumers, licensees, businesses, enterprises, value-added resellers and other resellers, distributors, retailers (including online retailers, mobile retailers, conventional brick and mortar retailers, pop-up shops and the like), end users, and others who may purchase, license, or otherwise use a category of goods and/or related services.

Customer profile digital twins 1730, on the other hand, may represent one or more demographic (age, gender, race, marital status, number of children, occupation, annual income, education level, living status (homeowner, renter, and the like) psychographic, behavioral, economic, geographic, physical (e.g., size, weight, health status, physiological state or condition, or the like) or other attributes of a set of customers. In embodiments, customer profile digital twins 1730 may be enterprise customer profile digital twins that represent attributes of a set of enterprise customers. In embodiments, a customer profiling application may be used to manage customer profiles 5504 based on historical purchasing data, loyalty program data, behavioral tracking data (including data captured in interactions by a customer with an intelligent product 650), online clickstream data, interactions with intelligent agents, and other data sources.

Customers 662 can be depicted in a set of one or more customer digital twins 5502, such as by populating the customer digital twin 1730 with value chain network data objects 1004, such as event data 1034, state data 1140, or other data with respect to value chain network customers 662. Likewise, customer profiles 5504 can be depicted in a set of one or more customer profile digital twins 1730, such as by populating the customer profile digital twins 1730 with value chain network data objects 1004, such as described throughout this disclosure.

Customer digital twins 5502 and customer profile digital twins 1730 may allow for modeling, simulation, prediction, decision-making, classification, and the like.

Where customers 662 are consumers, for example, the respective customer digital twins 1730 may be populated with identity data, account data, payment data, contact data, age data, gender data, race data, location data, demographic data, living status data, mood data, stress data, behavior data, personality data, interest data, preference data, style data, medical data, physiological data, phycological data, physical attribute data, education data, employment data, salary data, net worth data, family data, household data, relationship data, pet data, contact/connection data (such as mobile phone contacts, social media connections, and the like), transaction history data, political data, travel data, product interaction data, product feedback data, customer service interaction data (such as a communication with a chatbot, or a telephone communication with a customer service agent at a call center), fitness data, sleep data, nutrition data, software program interaction observation data 1500 (e.g., by customers interacting with various software interfaces of applications 630 involving value chain entities 652) and physical process interaction observation data 1510 (e.g., by watching customers interacting with products or other value chain entities 652), and the like.

In another example, where customers 662 are enterprises or businesses, the customer digital twin 1730 may be populated with identity data, account data, payment data, transaction data, product feedback data, location data, revenue data, enterprise type data, product and/or service offering data, worker data (such as identity data, role data, and the like), and other enterprise-related attributes.

Customer digital twins and customer profile digital twins 1730 may include a set of components, processes, services, interfaces, and other elements for development and deployment of digital twin capabilities for visualization of value chain network customers 662 and customer profiles 5504 as well as for coordinated intelligence (including artificial intelligence 1160, edge intelligence, analytics and other capabilities) and other value-added services and capabilities that are enabled or facilitated with digital twins.

In embodiments, the customer digital twins 5502 and customer profile digital twins 1730 may take advantage of the presence of multiple applications 630 within the value chain management platform layer 604, such that a pair of applications may share data sources (such as in the data storage layer 624) and other inputs (such as from the monitoring layer 614) that are collected with respect to value chain entities 652, as well as sharing events, state information and outputs, which collectively may provide a much richer environment for enriching content in the digital twins, including through use of artificial intelligence 1160 (including any of the various expert systems, artificial intelligence systems, neural networks, supervised learning systems, machine learning systems, deep learning systems, and other systems described throughout this disclosure and in the documents incorporated by reference) and through use of content collected by the monitoring layer 614 and data collection systems 640.

An environment for development of a customer digital twin 5502 may include a set of interfaces for developers in which a developer may configure an artificial intelligence system 1160 to take inputs from selected data sources of the data storage layer 624 and events or other data from the monitoring systems layer 614 and supply them for inclusion in a customer digital twin 5502. A customer digital twin development environment may be configured to take outputs and outcomes from various applications 630. In embodiments, a customer digital twin 1730 may be provided for the wide range of value chain network applications 630 mentioned throughout this disclosure and the documents incorporated herein by reference.

In embodiments, the customer digital twin 5502 may be rendered by a computing device, such that a user can view a digital representation of the customer 714. For example, a customer digital twin 5502 may be rendered and output to a display device. In another example, a 5502 may be rendered in a three-dimensional environment and viewed using a virtual reality headset.

An environment for development of a customer profile digital twin 1730 may include a set of interfaces for developers in which a developer may configure an artificial intelligence system 1160 to take inputs from selected data sources of the data storage layer 624 and events or other data from the monitoring systems layer 614 and supply them for inclusion in a customer profile digital twin 1730. A customer profile digital twin development environment may be configured to take outputs and outcomes from various applications 630. In embodiments, a customer profile digital twin 1730 may be provided for the wide range of value chain network applications 630 mentioned throughout this disclosure and the documents incorporated herein by reference.

In embodiments, the adaptive intelligent systems layer 614 is configured to train and implement artificial intelligence systems to perform tasks related to the value chain network 668 and/or value chain network entities 652. For example, the adaptive intelligent systems layer 614 may be leveraged to recommend products, enhance customer experience, select advertising attributes for advertisements relating to value chain products and/or services, and/or other appropriate value-chain tasks.

In embodiments, a customer profile digital twin 1730 or other customer digital twin may be created interactively and cooperatively with a customer, such as by allowing a customer to request, select, modify, delete, or otherwise influence a set of properties, states, behaviors, or other aspects represented in the digital twin 1730. For example, a customer could refine sizes (e.g., shoe size, dress size, shirt size, pant size, and the like), indicate interests and needs (e.g., what the customer is interested in buying), indicate behaviors (e.g., projects planned by an enterprise), update current states (e.g., to reflect changes), and the like. A version of the digital twin 1730 may thus be made available to a customer, such as in a graphical user interface, where the customer may manipulate one or more aspects of the digital twin 1730, request changes, and the like. In embodiments, multiple versions of a digital twin 1730 may be maintained for a given customer, such as a version for customer review, an internal version for an enterprise or host, a version for each of a specific set of brands (e.g., where a customer's appropriate clothing sizes vary by brand), a public version (such as one shared with a customer's social network for feedback, such as from friends), a private version (such as one where a customer is provided complete control over features and properties), a simulation version, a real-time version, and the like. In embodiments, the adaptive intelligent systems layer 614 is configured to leverage the customer digital twins 5502, customer profile digital twins 1730, and/or other digital twins 1700 of other value chain network entities 652. In embodiments, the adaptive intelligent systems layer 614 is configured to perform simulations using the customer digital twins 5502, customer profile digital twins 1730, and/or digital twins of other value chain network entities 652. For example, the adaptive intelligent systems layer 614 may vary one or more features of a product digital twin 1780 as its use is simulated by a customer digital twin 1730.

In embodiments, a simulation management system 5704 may set up, provision, configure, and otherwise manage interactions and simulations between and among digital twins 1700 representing value chain entities 652.

In embodiments, the adaptive intelligent systems layer 614 may, for each set of features, execute a simulation based on the set of features and may collect the simulation outcome data resulting from the simulation. For example, in executing a simulation involving the interactions of an intelligent product digital twin 1780 representing an intelligent product 650 and a customer digital twin 1730, the adaptive intelligent systems layer 614 can vary the dimensions of the intelligent product digital twin 1780 and can execute simulations that generate outcomes in a simulation management system 5704. In this example, an outcome can be an amount of time taken by a customer digital twin 5502 to complete a task using the intelligent product digital twin 1780. During the simulations, the adaptive intelligent systems layer 614 may vary the intelligent product digital twin 1780 display screen size, available capabilities (processing, speech recognition, voice recognition, touch interfaces, remote control, self-organization, self-healing, process automation, computation, artificial intelligence, data storage, and the like), materials, and/or any other properties of the intelligent product digital twin 1780. Simulation data 5710 may be created for each simulation and may include feature data used to perform the simulations, as well as outcome data. In the example described above, the simulation data 5710 may be the properties of the customer digital twin 5502 and the intelligent product digital twin 1780 that were used to perform the simulation and the outcomes resulting therefrom. In embodiments, a machine learning system 5720 may receive training data 5730, outcome data 5740, simulation data 5710, and/or data from other types of external data sources 5702 (weather data, stock market data, sports event data, news event data, and the like). In embodiments, this data may be provided to the machine-learning system 5720 via an API of the adaptive intelligent systems layer 614. The machine learning system 5720 may train, retrain, or reinforce machine leaning models 5750 using the received data (training data, outcome data, simulation data, and the like).

Figure 58:
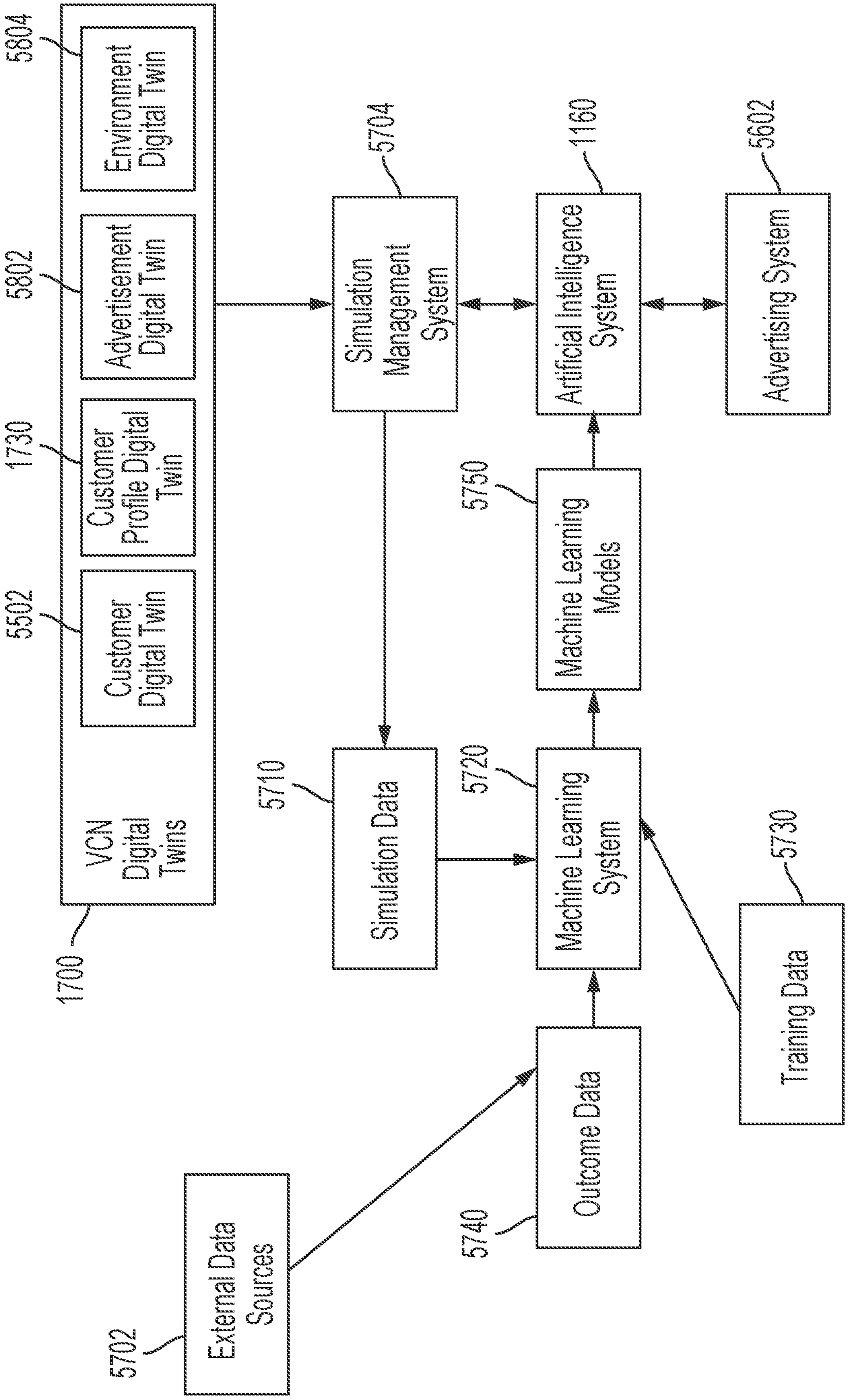
FIG. 58 is a schematic illustrating an example of an advertising application that interfaces with the adaptive intelligent systems layer in accordance with the present disclosure.

FIG. 58 illustrates an example of an advertising application that interfaces with the adaptive intelligent systems layer 614. In example embodiments, the advertising application may be configured automate advertising-related tasks for a value chain product or service.

In embodiments, the machine-learning system 5720 trains one or more models 5750 that are leveraged by the artificial intelligence system 1160 to make classifications, predictions, and/or other decisions relating to advertisements for a set of value chain products and/or services.

In example embodiments, a model 5750 is trained to select advertisement features to optimize one or more outcomes (e.g., maximize product sales for a product 650 in the value chain network 668). The machine-learning system 5720 may train the models 5750 using n-tuples that include the features pertaining to advertisements and one or more outcomes associated with the advertisements. In this example, features for an advertisement may include, but are not limited to, product and/or service category advertised, advertised product features (price, product vendor, and the like), advertised service features, advertisement type (television, radio, podcast, social media, e-mail or the like), advertisement length (10 seconds, 30 seconds, or the like), advertisement timing (in the morning, before a holiday, and the like), advertisement tone (comedic, informational, emotional, or the like), and/or other relevant advertisement features. In this example, outcomes relating to the advertisement may include product sales, total cost of the advertisement, advertisement interaction measures, and the like. In this example, one or more digital twins 1700 may be used to simulate the different arrangements (e.g., digital twins of advertisements, customers, customer profiles, and environments), whereby one or more properties of the digital twins are varied for different simulations and the outcomes of each simulation may be recorded in a tuple with the proprieties. Other examples of training advertising models may include a model that is trained to generate advertisements for value chain products 650, a model that is trained to manage an advertising campaign for value chain products 650, and the like. In operation, the artificial intelligence system 1160 may use such models 5750 to make advertisement decisions on behalf of an advertising application 5602 given one or more features relating to an advertising-related task or event. For example, the artificial intelligence system 1160 may select a type of advertisement (e.g., social media, podcast, and the like) to use for a value chain product 650. In this example, the advertising application 5602 may provide the features of the product to artificial intelligence system 1160. These features may include product vendor, the price of the product, and the like. In embodiments, the artificial intelligence system 1160 may insert these features into one or more of the models 5750 to obtain one or more decisions, which may include which type of advertisement to use. In embodiments, the artificial intelligence system 1160 may leverage the customer digital twins 5502 and/or customer profile digital twins 1730 to run simulations on the one or more decisions and generate simulation data 5710. The machine learning system 5720 may receive the simulation data 5710 and other data as described throughout this disclosure to retrain or reinforce machine leaning models. In embodiments, the customer digital twins 5502, customer profile digital twins 1730, and other digital twins 1700 may be leveraged by the artificial intelligence system 1160 to simulate a decision made by the artificial intelligence system 1160 before providing the decision to the value chain entity 652. In the present example, the customer profile digital twins 1730 may be leveraged by the artificial intelligence system 1160 to simulate decisions made by the artificial intelligence system 1160 before providing the decision to the advertising application 5602. In embodiments, where simulation outcomes are unacceptable, simulation data 5710 may be reported to the machine learning system 5720, which may use the received data to re-train machine learning models 5750, which may then be leveraged by the artificial intelligence system 1160 to make a new decision. The advertising application 824 may initiate an advertising event using the decision(s) made by the artificial intelligence system 1160. In embodiments, after the advertising event, the outcomes of the event (e.g., product sales) may be reported to the machine-learning system 5720 to reinforce the models 5750 used to make the decisions. Furthermore, in some embodiments, the output of the advertising application and/or the other value chain entity data sources may be used to update one or more properties of customer digital twins 5502, customer profile digital twins 1730 and/or other digital twins 1700.

Figure 59:
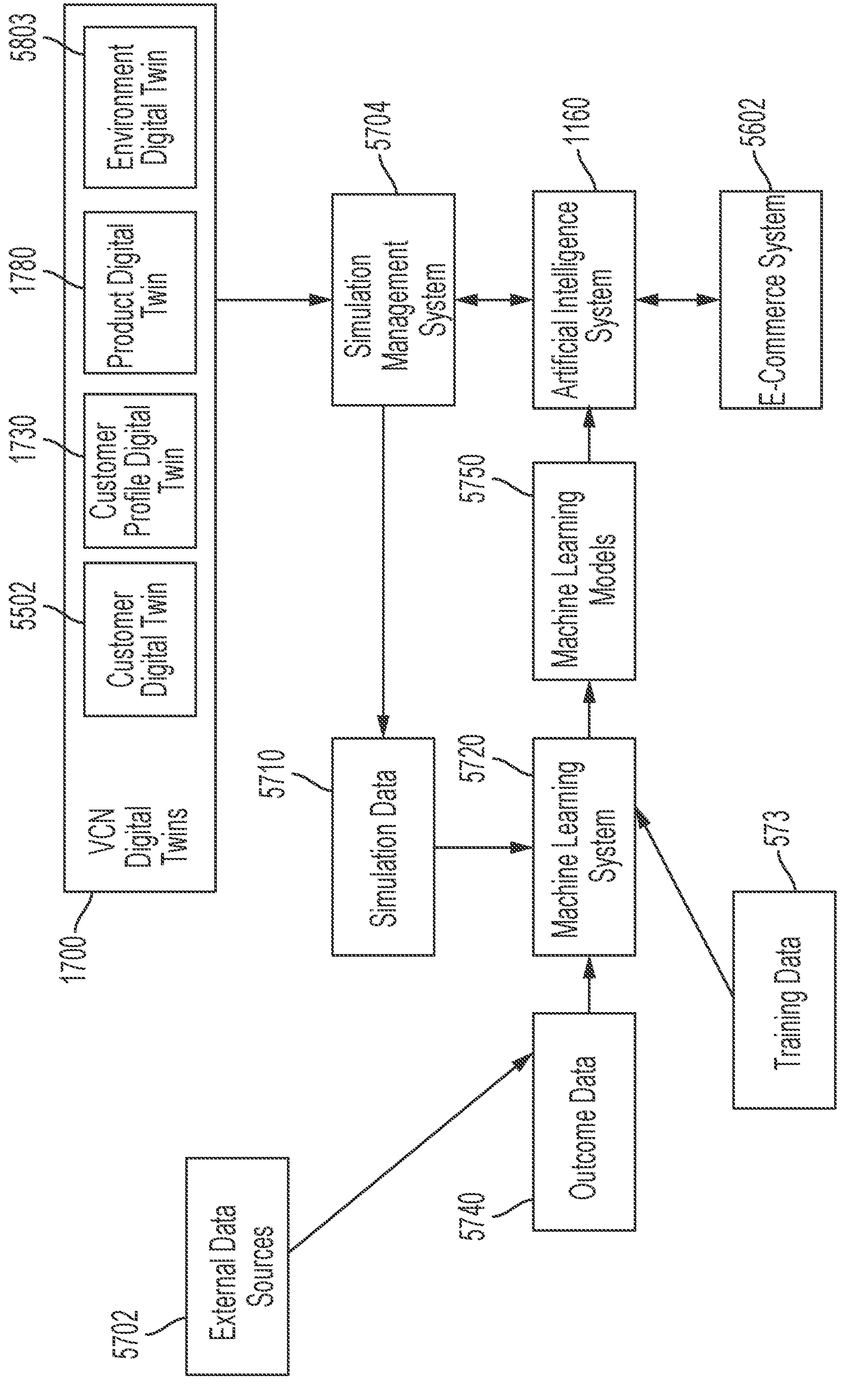
FIG. 59 is a schematic illustrating an example of an e-commerce application integrated with the adaptive intelligent systems layer in accordance with the present disclosure.

FIG. 59 illustrates an example of an e-commerce application 5604 integrated with the adaptive intelligent systems layer 614. In embodiments, an e-commerce application 5604 may be configured to generate product recommendations for value chain customers 662. For example, the ecommerce application 5604 may be configured to receive one or more product features for a value chain network product 650. Examples of product features may include, but are not limited to product types, product capabilities, product price, product materials, product vendor, and the like. In embodiments, the e-commerce application 5604 determines recommendations to optimize an outcome. Examples of outcomes can include software interaction observations (such as mouse movements, mouse clicks, cursor movements, navigation actions, menu selections, and many others), such as logged and/or tracked by software interaction observation system 1500, purchase of the product by a customer 714, and the like. In embodiments, the e-commerce application 5604 may interface with the artificial intelligence system 1160 to provide product features and to receive product recommendations that are based thereon. In embodiments, the artificial intelligence system 1160 may utilize one or more machine-learned models 5750 to determine a recommendation. In some embodiments, the simulations run by the customer digital twin 1730 may be used to train the product recommendation machine-learning models.

Figure 60:
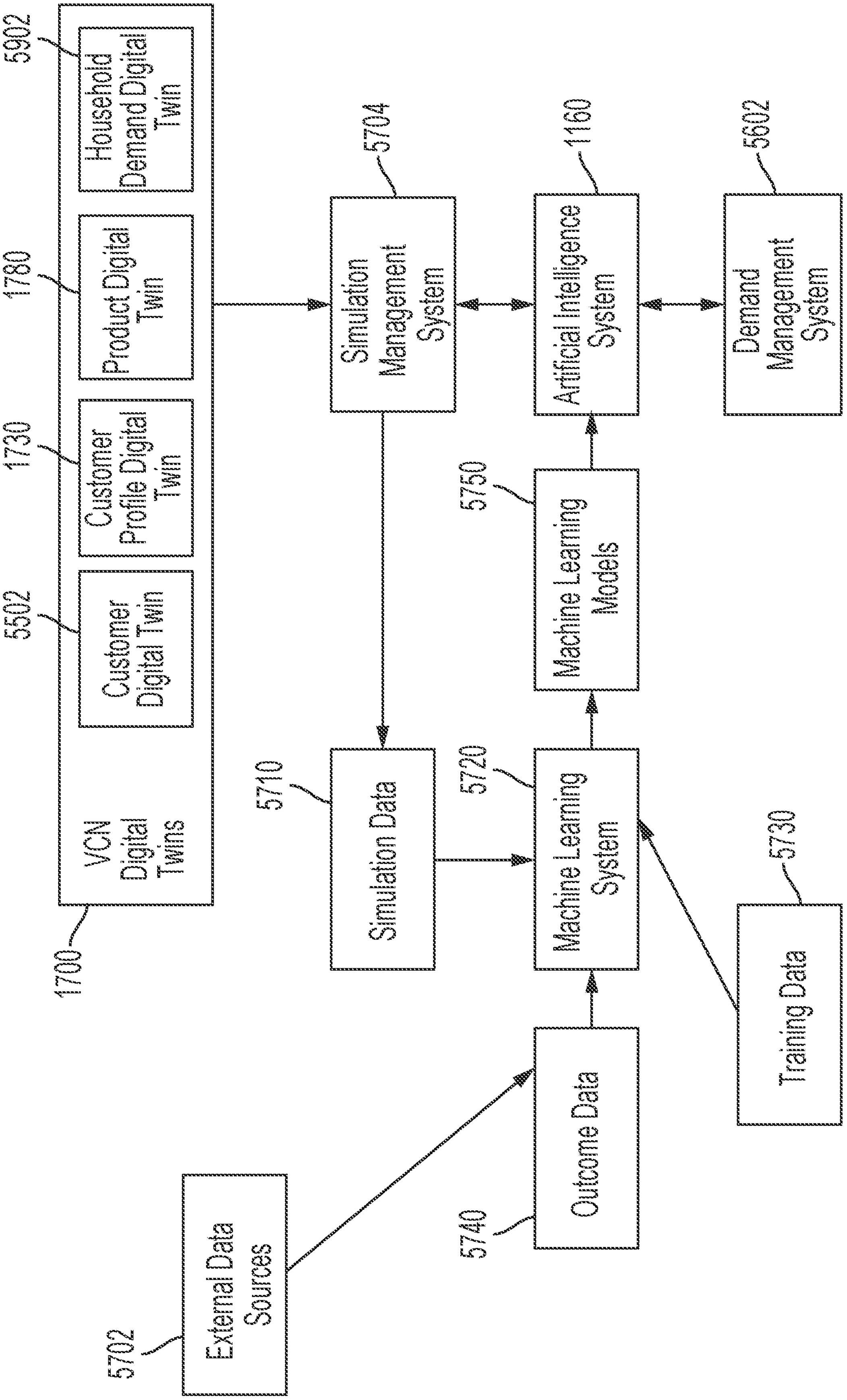
FIG. 60 is a schematic illustrating an example of a demand management application integrated with the adaptive intelligent systems layer in accordance with the present disclosure.

FIG. 60 is a schematic illustrating an example of demand management application 824 integrated with the adaptive intelligent systems layer 614. In embodiments, the artificial intelligence system 1160 may use machine-learning models 5750 trained to make demand management decisions for a demand environment 672 on behalf of a demand management application 824 given one or more demand factors 644. Demand factors 644 may include product type, product capabilities, product price, product materials, time of year, location, and the like. In embodiments, the artificial intelligence system 1160 may determine a demand management decision for a value chain product 650. For example, the artificial intelligence system 1160 may generate a demand management decision relating to how many printer ink cartridges should be supplied to a particular region for an upcoming month. In this example, the demand management system 824 may provide the demand factors 644 to artificial intelligence system 1160. In embodiments, the artificial intelligence system 1160 may insert these factors 644 into one or more machine-learning models 5750 to obtain one or more demand management decisions. These decisions may include the volume of ink cartridges should be sent to the select region during the select month.

In embodiments, the artificial intelligence system 1160 may leverage the customer profile digital twins 1730 to run simulations on the proposed decisions related to the demand management. The demand management application 824 may then initiate an ink resupply event using the decision(s) made by the artificial intelligence system 1160. Furthermore, after the ink resupply event, the outcomes of the event (e.g., ink cartridge sales) may be reported to the machine-learning system 5720 to reinforce the models used to make the decisions. Furthermore, in some embodiments, the output of the demand management system 824 and/or the other value chain entity data sources may be used to update one or more properties of customer profile digital twins 1730 and/or other digital twins 1700.

In embodiments, an API enables users to access the customer digital twins 5502 and/or customer profile digital twins 1730. In embodiments, an API enables users to receive one or more reports related to the digital twins.

The platform 604 may include, integrate, integrate with, manage, control, coordinate with, or otherwise handle household demand digital twins 5902. Household demand digital twins 5902 may be a digital representation of a household demand for a product category or for a set of product categories.

An environment for development of a household demand digital twin 5902 may include a set of interfaces for developers in which a developer may configure an artificial intelligence system 1160 to take inputs from selected data sources of the data storage layer 624 and events or other data from the monitoring systems layer 614 and supply them for inclusion in a household demand digital twin 5902. A household demand digital twin development environment may be configured to take outputs and outcomes from various applications 630. In embodiments, a household demand digital twin 5902 may be provided for the wide range of value chain network applications 630 mentioned throughout this disclosure and the documents incorporated herein by reference.

In embodiments, a digital twin 1700 may be generated from other digital twins. For example, a customer digital twin 5502 may be used to generate an anonymized customer digital twin 5902. The platform may include, integrate, integrate with, manage, control, coordinate with, or otherwise handle anonymized customer digital twins 5902. Anonymized customer digital twins 5902 may be an anonymized digital representation of a customer 714. In embodiments, anonymized customer digital twins 5902 are not populated with personally identifiable information but may otherwise be populated using the same data sources as its corresponding customer digital twin 5502.

In embodiments, an environment for development of an anonymized customer digital twin 1730 may include a set of interfaces for developers in which a developer may configure an artificial intelligence system 1160 to take inputs from selected data sources of the data storage layer 624 and events or other data from the monitoring systems layer 614 and supply them for inclusion in an anonymized customer digital twin 5902. An anonymized digital twin development environment may be configured to take outputs and outcomes from various applications 630. In embodiments, an anonymized customer digital twin 5902 may be provided for the wide range of value chain network applications 630 mentioned throughout this disclosure and the documents incorporated herein by reference.

In embodiments, the anonymized customer digital twin 5902 comprises an API that can receive an access request to the anonymized customer digital twin 5902. A requesting entity can use the API of the anonymized customer digital twin 5902 to issue an access request. The access request may be routed from the API to an access logic of the anonymized customer twin 5902, which can determine if the requesting entity is entitled to access. In embodiments, users may monetize access to anonymized customer digital twins 5902, such as by subscription or any other suitable monetization method.

The platform 604 may include, integrate, integrate with, manage, control, coordinate with, or otherwise handle enterprise customer engagement digital twins. Enterprise customer engagement digital twins may be a digital representation of a set of attributes of the enterprise customer that are relevant to engagement by the customer with a set of offerings of an enterprise.

An environment for development of an enterprise customer engagement digital twin may include a set of interfaces for developers in which a developer may configure an artificial intelligence system 1160 to take inputs from selected data sources of the data storage layer 624 and events or other data from the monitoring systems layer 614 and supply them for inclusion in an enterprise customer engagement digital twin. An enterprise customer engagement digital twin development environment may be configured to take outputs and outcomes from various applications 630. In embodiments, an enterprise customer engagement digital twin may be provided for the wide range of value chain network applications 630 mentioned throughout this disclosure and the documents incorporated herein by reference.

Figure 61:
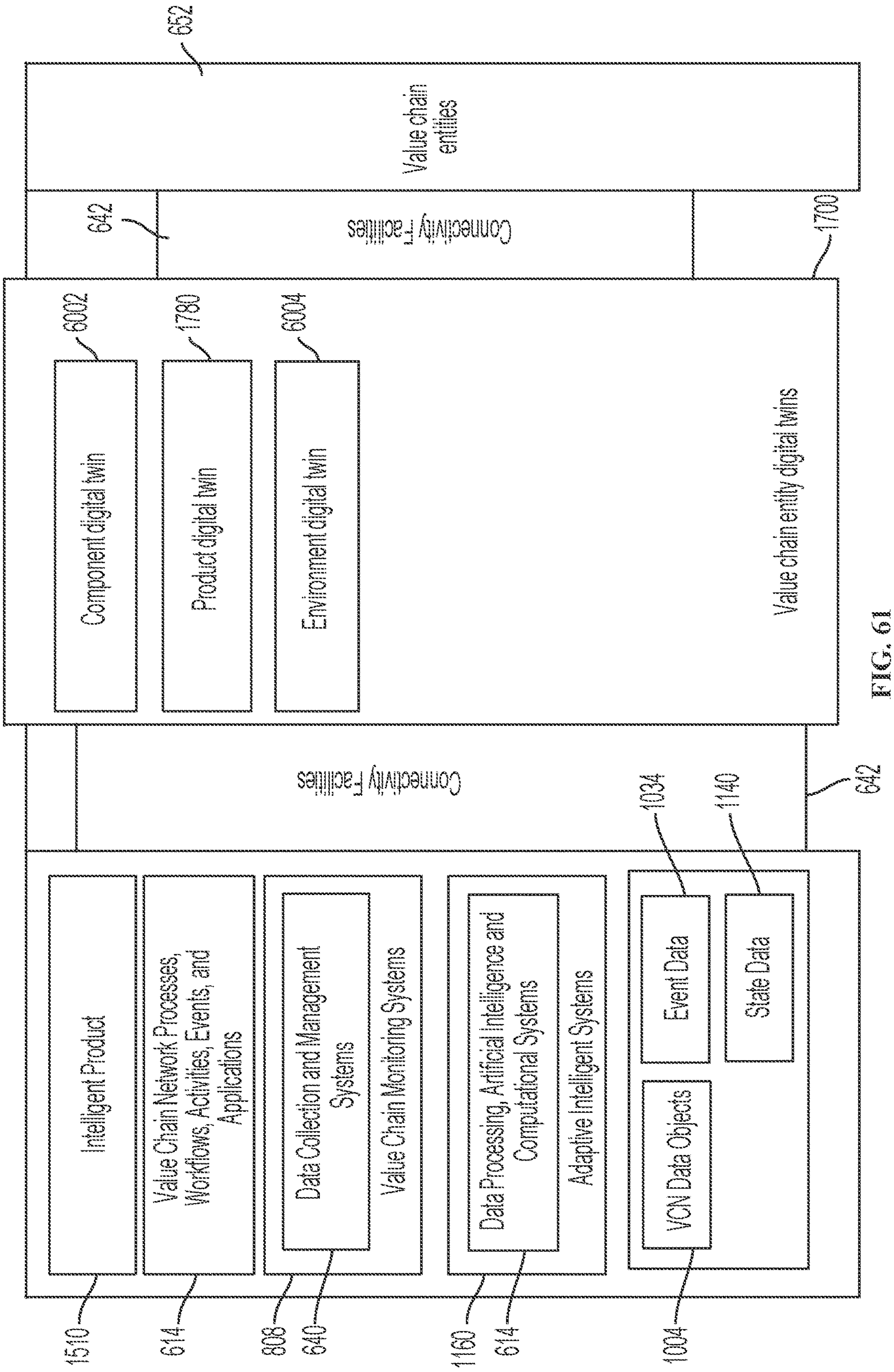
FIG. 61 is a schematic illustrating an example of a portion of a system for value chain smart supply component digital twins according to some embodiments of the present disclosure.
Figure 62:
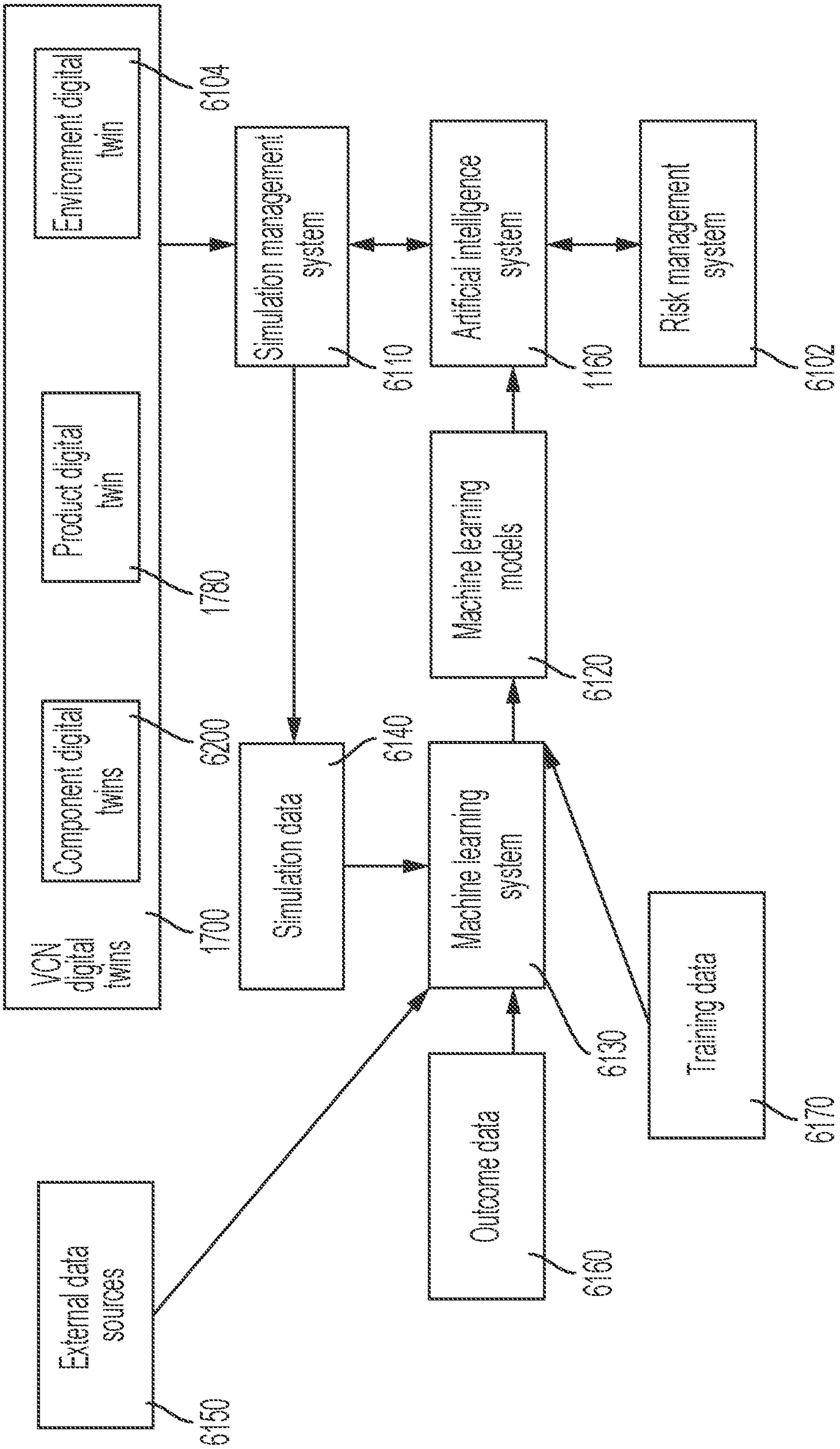
FIG. 62 is a schematic illustrating an example of a risk management application that interfaces with the adaptive intelligent systems layer in accordance with the present disclosure.

Referring to FIG. 61, the platform 604 may include, integrate, integrate with, manage, control, coordinate with, or otherwise handle component digital twins 6002. Component digital twins 6002 may represent evolving, continuously updated digital profiles of components 6002 of value chain products 650. Component digital twins 6002 may allow for modeling, simulation, prediction, decision-making, classification, and the like.

Product components 6002 can be depicted in a set of one or component digital twins 6002, such as by populating the component digital twins 6002 with value chain network data objects 1004, such as event data 1034, state data 1140, or other data with respect to value chain network product components 6002.

A product 650 may be any category of product, such as a finished good, software product, hardware product, component product, material, item of equipment, consumer packaged good, consumer product, food product, beverage product, home product, business supply product, consumable product, pharmaceutical product, medical device product, technology product, entertainment product, or any other type of product and/or set of related services, and which may, in embodiments, encompass an intelligent product 650 that is enabled with a set of capabilities such as, without limitation data processing, networking, sensing, autonomous operation, intelligent agent, natural language processing, speech recognition, voice recognition, touch interfaces, remote control, self-organization, self-healing, process automation, computation, artificial intelligence, analog or digital sensors, cameras, sound processing systems, data storage, data integration, and/or various Internet of Things capabilities, among others. A component 6002 may be any category of product component.

As an example, a component digital twin 6002 may be populated with supplier data, dimension data, material data, thermal data, price data, and the like.

A component digital twin 6002 may include a set of components, processes, services, interfaces, and other elements for development and deployment of digital twin capabilities for visualization of value chain network components 714 as well as for coordinated intelligence (including artificial intelligence 1160, edge intelligence, analytics and other capabilities) and other value-added services and capabilities that are enabled or facilitated with a component digital twin 1730.

In embodiments, the component digital twin 6002 may take advantage of the presence of multiple applications 630 within the value chain management platform layer 604, such that a pair of applications may share data sources (such as in the data storage layer 624) and other inputs (such as from the monitoring layer 614) that are collected with respect to value chain entities 652, as well sharing outputs, events, state information and outputs, which collectively may provide a much richer environment for enriching content in a component digital twin 6002, including through use of artificial intelligence 1160 (including any of the various expert systems, artificial intelligence systems, neural networks, supervised learning systems, machine learning systems, deep learning systems, and other systems described throughout this disclosure and in the documents incorporated by reference) and through use of content collected by the monitoring layer 614 and data collection systems 640.

An environment for development of a component digital twin 6002 may include a set of interfaces for developers in which a developer may configure an artificial intelligence system 1160 to take inputs from selected data sources of the data storage layer 624 and events or other data from the monitoring systems layer 614 and supply them for inclusion in a component digital twin 6002. A component digital twin development environment may be configured to take outputs and outcomes from various applications 630. In embodiments, a component digital twin 6002 may be provided for the wide range of value chain network applications 630 mentioned throughout this disclosure and the documents incorporated herein by reference. In embodiments, a digital twin 650 may be generated from other digital twins 1700. For example, a product digital twin 1780 may be used to generate component digital twins 6002. In another example, component digital twins 6002 may be used to generate product digital twins 1780. In embodiments, a digital twin 1700 may be embedded in another digital twin 1700. For example, a component digital twin 6002 may be embedded in a product digital twin 1780 which may be embedded in an environment digital twin 6004.

In embodiments, a simulation management system 6110 may set up, provision, configure, and otherwise manage interactions and simulations between and among digital twins 1700 representing value chain entities 652.

In embodiments, the adaptive intelligent systems layer 614 is configured to execute simulations in a simulation management system 6110 using the component digital twins 6002 and/or digital twins 1700 of other value chain network entities 652. For example, the adaptive intelligent systems layer 614 may adjust one or more features of an environment digital twin 6004 as a set of component digital twins 6002 are subjected to an environment. In embodiments, the adaptive intelligent systems layer 614 may, for each set of features, execute a simulation based on the set of features and may collect the simulation outcome data resulting from the simulation.

For example, in executing a simulation on a set of component digital twins 6002 representing components of value chain product 650 in an environment digital twin 6004, the adaptive intelligent systems layer 614 can vary the properties of the environment digital twin 6110 and can execute simulations that generate outcomes. During the simulation, the adaptive intelligent systems layer 614 may vary the environment digital twin temperature, pressure, lighting, and/or any other properties of the environment digital twin 6004. In this example, an outcome can be a condition of the component digital twin 6002 after being subjected to a high temperature. The outcomes from simulations can be used to train machine learning models 6120.

In embodiments, a machine learning system 6150 may receive training data 6170, outcome data 6160, simulation data 6140, and/or data from other types of external data sources 6150 (weather data, stock market data, sports event data, news event data, and the like). In embodiments, this data may be provided to the machine-learning system 6150 via an API of the adaptive intelligent systems layer 614. In embodiments, the machine learning system 6150 may receive simulation data 6140 relating to a component digital twin 6002 simulation. In this example, the simulation data 6140 may be the properties of the component digital twins 6002 that were used to perform the simulation and the outcomes resulting therefrom.

In embodiments, the machine learning system 6150 may train/reinforce machine leaning models 6120 using the received data to improve the models.

FIG. SCDT-2 illustrates an example of a risk management application 818 that interfaces with the adaptive intelligent systems layer 614. In example embodiments, the risk management application 818 may be configured to manage risk or liability with respect to a good or good component.

In embodiments, the machine-learning system 6150 trains one or more models 6120 that are utilized by the artificial intelligence system 1160 to make classifications, predictions, and/or other decisions relating to risk management, including for products 650 and product components 6002. In embodiments, may be equipment components. In example embodiments, a model 6120 is trained to mitigate risk and liability by detecting the condition of a set of components. The machine-learning system 6150 may train the models using n-tuples that include the features pertaining to components and one or more outcomes associated with the component condition. In this example, features for a component 6002 may include, but are not limited to, component material (plastic, glass, metal, or the like), component history (manufacturing dates, usage history, repair history), component properties, component dimensions, component thermal properties, component price, component supplier, and/or other relevant features. In this example, outcomes may include whether the digital twin of the component 6002 is in operating condition. In this example, one or more properties of the digital twins are varied for different simulations and the outcomes of each simulation may be recorded in a tuple with the proprieties. Other examples of training risk management models may include a model 6120 that is trained to optimize product safety, a model that is trained to identify components with a high likelihood of causing an undesired event, and the like.

In operation, the artificial intelligence system 1160 may use the above-discussed models 6120 to make risk management decisions on behalf of a risk management application 818 given one or more features relating to a task or event. For example, the artificial intelligence system 1160 may determine the condition of a component. In this example, the risk management application 818 may provide the features of the component to the artificial intelligence system 1160. These features may include component material, component history, component dimensions, component cost, component thermal properties, component supplier, and the like. In embodiments, the artificial intelligence system 1160 may feed these features into one or more of the models discussed above to obtain one or more decisions. These decisions may include whether the component is in operating condition.

In embodiments, the artificial intelligence system 1160 may leverage the component digital twins 6002 to run simulations on the proposed decisions.

The risk management application 818 may then initiate a component resupply event using the decision(s) made by the artificial intelligence system 1160. Furthermore, after the component resupply event, the outcomes of the event (e.g., improved product performance) may be reported to the machine-learning system 6150 to reinforce the models used to make the decisions.

The platform 604 may include, integrate, integrate with, manage, control, coordinate with, or otherwise handle component attribute digital twins 6140. Component attribute digital twins 6140 may be a digital representation of a set of attributes of a set of supply chain components in a supply for a set of products of an enterprise.

An environment for development of a component attribute digital twin 6140 may include a set of interfaces for developers in which a developer may configure an artificial intelligence system 1160 to take inputs from selected data sources of the data storage layer 624 and events or other data from the monitoring systems layer 614 and supply them for inclusion in a component attribute digital twin 6140. A component attribute digital twin development environment may be configured to take outputs and outcomes from various applications 630. In embodiments, a component attribute digital twin 6140 may be provided for the wide range of value chain network applications 630 mentioned throughout this disclosure and the documents incorporated herein by reference.

In embodiments, the methods, systems and apparatuses include an information technology system having a value chain network management platform with an asset management application associated with maritime assets and a data handling layer of the management platform including data sources containing information used to populate a training set based on a set of maritime activities of one or more of the maritime assets and one of design outcomes, parameters, and data associated with the one or more maritime assets. The information technology system also has an artificial intelligence system that is configured to learn on the training set collected from the data sources, that simulates one or more attributes of one or more of the maritime assets, and that generates one or more sets of recommendations for a change in the one or more attributes based on the training set collected from the data sources. The information technology system also has a digital twin system included in the value chain network management platform that provides for visualization of a digital twin of one or more of the maritime assets including detail generated by the artificial intelligence system of one or more of the attributes in combination with the one or more sets of recommendations.

In embodiments, the maritime assets include one or more container ships. In embodiments, the digital twin system further provides for visualization of the digital twin of one or more of the container ships including one or more of the attributes in combination with one or more of the sets of recommendations associated with the container ships.

In embodiments, the maritime assets include one or more barges. In embodiments, the digital twin system further provides for visualization of the digital twin of one or more of the barges including one or more of the attributes in combination with one or more of the sets of recommendations associated with the barges.

In embodiments, the maritime assets include one or more components of the port infrastructure installed on or adjacent to land. In embodiments, the digital twin system further provides for visualization of the digital twin of one or more of the components of port infrastructure including one or more of the attributes in combination with one or more of the sets of recommendations associated with the components of port infrastructure.

In embodiments, the maritime assets also include a container ship moored to a component of the port infrastructure. In embodiments, the maritime assets include one or more moored navigation units deployed on water. In embodiments, the maritime assets include one or more ships each connected to a barge.

In embodiments, the maritime assets are associated with a real-world maritime port. In embodiments, the digital twin system further provides for visualization of the digital twin of one or more of the components of the real-world maritime port including one or more of the attributes in combination with one or more of the sets of recommendations associated with the components of the real-world maritime port.

In embodiments, the maritime assets are associated with a real-world shipyard In embodiments, the digital twin system further provides for visualization of the digital twin of one or more of the components of the real-world shipyard including one or more of the attributes in combination with one or more of the sets of recommendations associated with the components of the real-world shipyard.

In embodiments, the digital twin of one or more of the maritime assets is a floating asset twin associated with a ship. In embodiments, the floating asset twin is configured to provide for visualization of a navigation course of the ship relative to a planned course of the ship and one or more of the sets of recommendations from the artificial intelligence system for a change in the navigation course of the ship. In embodiments, the floating asset twin is configured to provide for visualization of an engine performance of the ship and one or more of the sets of recommendations from the artificial intelligence system for a change in the engine performance of the ship. In embodiments, the visualization of an engine performance includes an emissions profile of the ship.

In embodiments, the floating asset twin is configured to provide for visualization of a hull integrity of the ship and one or more of the sets of recommendations from the artificial intelligence system for a change in maintenance of the hull of the ship. In embodiments, the floating asset twin is configured to provide for visualization of in-situ hydrodynamic changes to a portion of a hull disposed below a water line of the ship and one or more of the sets of recommendations from the artificial intelligence system for a change in a hydrodynamic surface to change performance of the ship. In embodiments, the floating asset twin is configured to determine a schedule for the change to the hydrodynamic surface of the hull disposed below the waterline of the ship to improve fuel efficiency based on known routes of travel and weather patterns. In embodiments, the floating asset twin is configured to provide visualizations of in-situ aerodynamic changes to a portion of a hull disposed above a water line of the ship and one or more of the sets of recommendations from the artificial intelligence system for a change in an aerodynamic surface to change performance of the ship. In embodiments, the floating asset twin is configured to determine a schedule for the change to the aerodynamic surface disposed above the waterline of the ship to improve fuel efficiency using known routes of travel and historical weather patterns.

In embodiments, the floating asset twin is configured to provide visualizations of extendable buoyant members from a hull of the ship to improve stability during certain maneuvers of the ship and one or more of the sets of recommendations from the artificial intelligence system for a change in the extendable buoyant members to change performance of the ship. In embodiments, the floating asset twin is configured to provide visualizations of a plurality of inspection points on the ship and maintenance histories associated with those inspection points. In embodiments, the floating asset twin is also configured to provide one or more of the sets of recommendations from the artificial intelligence system for a change in maintenance of the plurality of inspection points. In embodiments, the floating asset twin is configured to provide for visualizations of the plurality of inspection points on the ship affected by travel within a geofenced area and maintenance histories associated with those inspection points. In embodiments, the floating asset twin is also configured to provide one or more of the sets of recommendations from the artificial intelligence system for a change in maintenance of the plurality of inspection points. In embodiments, the floating asset twin is configured to provide details of a ledger of activity associated with the visualization of the plurality of inspection points on the ship affected by travel within a geofenced area and maintenance histories associated with those inspection points.

In embodiments, the floating asset twin is configured to provide for visualization for a first user of one of a navigation course of the ship and an engine performance of the ship within a first geofenced area and for visualization for a second user of one of the navigation course of the ship and the engine performance of the ship within a second different geofenced area and where transit between the first and second geofenced areas motivates a handoff of the floating asset twin of the ship between the first user and the second user.

In embodiments, the digital twin is configured to at least partially represent one or more of the maritime assets associated with an event investigation and to at least partially detail a timeline of the event investigation and associated maritime assets. In embodiments, the digital twin is also configured to provide one or more of the sets of recommendations from the artificial intelligence system for a change of one of the attributes of the associated maritime assets.

In embodiments, the digital twin is configured to at least partially represent one or more of the maritime assets associated with a legal proceeding and to at least partially detail at least a portion of a timeline pertinent to the legal proceeding and associated maritime assets. In embodiments, the digital twin is also configured to provide one or more of the sets of recommendations from the artificial intelligence system for a change of one of the attributes of the associated maritime assets. In embodiments, the digital twin is configured to at least partially represent one or more of the maritime assets associated with a casualty forecast and to at least partially detail at least a portion of a timeline pertinent to the casualty report and associated maritime assets. In embodiments, the digital twin is also configured to provide one or more of the sets of recommendations from the artificial intelligence system for a change of one of the attributes of the associated maritime assets to reduce exposure relative to a set of previous casualty forecasts.

In embodiments, the maritime assets include a port infrastructure facility. In embodiments, the data collected by a value chain network management platform facilitates identifying theft at or misuse of the port infrastructure facility by correlating data between a set of data collectors for one or more physical items in the port infrastructure facility and the digital twin detailing the one or more physical items of the port infrastructure facility for the at least one of the port infrastructure facility and the set of operators.

In embodiments, the digital twin details the one or more physical items of the port infrastructure facility for at least one operator that includes a view of expected states of at least a portion of the one or more physical items.

In embodiments, the maritime assets include a shipyard. In embodiments, the data collected by a value chain network management platform facilitates identifying theft at or misuse of one or more physical items in the shipyard by correlating data between a set of data collectors for the one or more physical items and the digital twin detailing the one or more physical items of the shipyard for the at least one of the shipyard and the set of operators. In embodiments, the digital twin details the one or more physical items of the shipyard for at least one operator that includes a view of expected states of at least a portion of the one or more physical items.

In embodiments, the artificial intelligence system determines a set of geofence parameters. In embodiments, the digital twin provides further visualization of at least one geofence that integrates representation of a set of the maritime assets with a representation of a maritime environment adjacent to the geofence. In embodiments, the digital twin is also configured to provide one or more of the sets of recommendations from the artificial intelligence system for a change of one of the attributes of the set of maritime assets.

In embodiments, the maritime assets are ships capable of carrying cargo. In embodiments, the artificial intelligence system determines a set of geofence parameters. In embodiments, the digital twin provides further visualization of at least one geofence that integrates representation of the ships capable of carrying cargo with a representation of a maritime environment. In embodiments, the digital twin is also configured to provide one or more of the sets of recommendations from the artificial intelligence system for a change of one of the attributes of the ships capable of carrying cargo.

In embodiments, the methods, systems and apparatuses include an information technology system having a value chain network management platform including an asset management application associated with one or more ships and a data handling layer of the management platform including data sources containing information used to populate a training set based on a set of maritime activities of one or more of the ships and one of design outcomes, parameters, and data associated with the one or more of the ships. The information technology system also has an artificial intelligence system that is configured to learn on the training set collected from the data sources, that simulates one or more design attributes of one or more of the ships, and that generates one or more sets of design recommendations based on the training set collected from the data sources. The information technology system also has a digital twin system included in the value chain network management platform that provides for visualization of a digital twin of one or more of the ships including detail generated by the artificial intelligence system of one or more of the design attributes in combination with the one or more sets of design recommendations.

In embodiments, one or more of the ships include one or more container ships. In embodiments, the digital twin system further provides for visualization of the digital twin of one or more of the container ships including one or more of the attributes in combination with one or more of the sets of recommendations associated with the container ships. In embodiments, one or more of the container ships are moored to a component of port infrastructure. In embodiments, one or more of the ships are connected to a barge. In embodiments, the digital twin is configured to provide further visualization of a navigation course relative to a planned course and one or more of the sets of recommendations from the artificial intelligence system for a change in the navigation course associated with one or more of the ships. In embodiments, the digital twin is configured to provide further visualization of an engine performance of one or more of the ships and one or more of the sets of recommendations from the artificial intelligence system for a change in the engine performance. In embodiments, the visualization of the engine performance includes an emissions profile of one or more of the ships.

In embodiments, the digital twin is configured to provide further visualization of a hull integrity of one or more of the ships and one or more of the sets of recommendations from the artificial intelligence system for a change in maintenance of a hull of one or more of the ships. In embodiments, the digital twin is configured to provide further visualization of in-situ hydrodynamic changes to a portion of a hull disposed below a water line of one or more of the ships and one or more of the sets of recommendations from the artificial intelligence system for a change in a hydrodynamic surface to change performance of one or more of the ships. In embodiments, the digital twin is configured to determine a schedule for the change to the hydrodynamic surface of the hull disposed below the waterline of one or more of the ships to improve fuel efficiency based on known routes of travel and weather patterns. In embodiments, the digital twin is configured to provide further visualization of in-situ aerodynamic changes to a portion of a hull disposed above a water line of one or more of the ships and one or more of the sets of recommendations from the artificial intelligence system for a change in an aerodynamic surface to change performance of one or more of the ships. In embodiments, the digital twin is configured to determine a schedule for the change to the aerodynamic surface disposed above the waterline of one or more of the ships to improve fuel efficiency using known routes of travel and historical weather patterns.

In embodiments, digital twin is configured to provide further visualization of extendable buoyant members from a hull of one or more of the ships to improve stability during certain maneuvers and one or more of the sets of recommendations from the artificial intelligence system for a change in the extendable buoyant members to change performance of one or more of the ships.

In embodiments, the digital twin is configured to provide further visualization of a plurality of inspection points on one or more of the ships and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide further visualization of the plurality of inspection points on the ship affected by travel within a geofenced area and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on one or more of the ships affected by travel within a geofenced area and maintenance histories associated with those inspection points.

In embodiments, the digital twin is configured to provide for visualization for a first user of one of a navigation course and an engine performance of one more of the ships within a first geofenced area and for visualization for a second user of one of the navigation course and the engine performance of one or more the ships within a second different geofenced area and where transit between the first and second geofenced areas motivates a handoff of one or more of the ships visualized by the digital twin of one or more of the ships between the first user and the second user.

In embodiments, the digital twin is configured to at least partially represent one or more of the ships associated with an event investigation and to at least partially detail a timeline of the event investigation and associated ships. In embodiments, the digital twin is also configured to provide one or more of the sets of recommendations from the artificial intelligence system for a change of one of the attributes of the associated ships. In embodiments, the digital twin is configured to at least partially represent one or more of the ships associated with a legal proceeding and to at least partially detail at least a portion of a timeline pertinent to the legal proceeding and associated ships. In embodiments, the digital twin is also configured to provide one or more of the sets of recommendations from the artificial intelligence system for a change of one of the attributes of the associated ships.

In embodiments, the digital twin is configured to at least partially represent one or more of the ships associated with a casualty forecast and to at least partially detail at least a portion of a timeline pertinent to the casualty report and associated ships. In embodiments, the digital twin is also configured to provide one or more of the sets of recommendations from the artificial intelligence system for a change of one of the attributes of the associated ships to reduce exposure relative to a set of previous casualty forecasts.

In embodiments, the data collected by a value chain network management platform facilitates identifying theft or misuse of physical items at one of the ships by correlating data between a set of data collectors for one or more physical items in one of the ships and the digital twin detailing one or more of the physical items associated with one of the ships for the at least one of the port infrastructure facility and the set of operators. In embodiments, the digital twin details the one or more physical items associated with one of the ships for at least one operator that includes a view of expected states of at least a portion of the one or more physical items.

In embodiments, the artificial intelligence system determines a set of geofence parameters. In embodiments, the digital twin provides further visualization of at least one geofence that integrates representation of one or more of the ships with a representation of a maritime environment adjacent to the geofence. In embodiments, the digital twin is also configured to provide one or more of the sets of recommendations from the artificial intelligence system for a change of one of the attributes of one or more of the ships.

In embodiments, one or more of the ships are capable of carrying cargo. In embodiments, the artificial intelligence system determines a set of geofence parameters. In embodiments, the digital twin provides further visualization of at least one geofence that integrates representation of one or more of the ships capable of carrying cargo with a representation of a maritime environment. In embodiments, the digital twin is also configured to provide one or more of the sets of recommendations from the artificial intelligence system for a change of one of the attributes of one or more of the ships capable of carrying cargo.

In embodiments, the maritime activities include the forward speed of one or more of the ships relative to water and weather conditions based on the parameters associated with energy consumption of the propulsion units on one or more of the ships.

In embodiments, the methods, systems and apparatuses include an information technology system having a value chain network management platform for learning on a training set of design outcomes, parameters, and data collected from data sources relating to a set of shipping activities to train an artificial intelligence system to simulate attributes of a container ship and generate a set of recommendations of changes to the attributes using a digital twin of the container ship.

In embodiments, the container ship is moored to port infrastructure installed on or adjacent to land. In embodiments, the shipping activities include the forward speed of the container ship relative to water and weather conditions based on the parameters associated with energy consumption of propulsion units on the container ship. In embodiments, the information technology system further includes an asset management application associated with one or more maritime facilities connected to the container ship. In embodiments, the asset management application is associated with one or more ships connected to barges.

In embodiments, the digital twin of the container ship provides for visualization of a navigation course of the container ship. In embodiments, the digital twin of the container ship provides for visualization of an engine performance of the container ship. In embodiments, the digital twin of the container ship provides for visualization of a hull integrity of the container ship. In embodiments, the digital twin of the container ship provides for visualization of in-situ hydrodynamic changes to a portion of a hull disposed below a water line of the container ship. In embodiments, the digital twin of the container ship determines a schedule of the in-situ hydrodynamic changes to the portion of the hull disposed below the waterline of the container ship to improve fuel efficiency using known routes of travel and historical weather patterns. In embodiments, the digital twin of the container ship provides for visualization of in-situ aerodynamic changes to a portion of a hull disposed above a water line of the container ship. In embodiments, the digital twin of the container ship determines a schedule of in-situ aerodynamic changes to the portion of the hull disposed above the waterline of the container ship to improve fuel efficiency using known routes of travel and historical weather patterns.

In embodiments, the digital twin of the container ship provides for visualization of extendable buoyant members from a hull of the container ship to improve stability during certain maneuvers of the container ship. In embodiments, the digital twin of the container ship provides for visualization of extendable buoyant members from a hull of the container ship to improve stability during certain maneuvers of the container ship.

In embodiments, the digital twin of the container ship provides for visualization of a plurality of inspection points on the container ship and maintenance histories associated with those inspection points. In embodiments, the digital twin of the container ship provides for the visualization of the plurality of inspection points on the container ship affected by travel within a geofenced area and maintenance histories associated with those inspection points when maintenance follows travel through the geofenced area. In embodiments, the digital twin of the container ship provides for details of a ledger of activity associated with the visualization of the plurality of inspection points on the container ship affected by travel within a geofenced area and maintenance histories associated with those inspection points when maintenance follows travel through the geofenced area.

In embodiments, the digital twin of the container ship provides for visualization for a first user of one of a navigation course of the container ship and an engine performance of the container ship within a first geofenced area and for visualization for a second user of one of the navigation course of the container ship and the engine performance of the container ship within a second geofenced area and where transit between the first and second geofenced areas motivates a handoff of the digital twin of the container ship between the first user and the second user.

In embodiments, the methods, systems and apparatuses include an information technology system having a value chain network management platform including an asset management application associated with one or more barges and a data handling layer of the management platform including data sources containing information used to populate a training set based on a set of maritime activities of one or more of the barges and one of design outcomes, parameters, and data associated with the one or more of the barges. The information technology system also has an artificial intelligence system that is configured to learn on the training set collected from the data sources, that simulates one or more design attributes of one or more of the barges, and that generates one or more sets of design recommendations based on the training set collected from the data sources. The information technology system also has a digital twin system included in the value chain network management platform that provides for visualization of a digital twin of one or more of the barges including detail generated by the artificial intelligence system of one or more of the design attributes in combination with the one or more sets of design recommendations.

In embodiments, the digital twin system further provides for visualization of the digital twin of one or more of the barges including one or more of the attributes in combination with one or more of the sets of recommendations associated with the barges. In embodiments, one of the barges is connected to a ship. In embodiments, the digital twin is configured to provide for visualization of a navigation course of one of the barges relative to a planned course of one of the barges and one or more of the sets of recommendations from the artificial intelligence system for a change in the navigation course of one of the barges.

In embodiments, the digital twin is configured to provide for visualization of a hull integrity of one of the barges relative to a planned course of one of the barges and one or more of the sets of recommendations from the artificial intelligence system for a change in maintenance of the hull of one of the barges.

In embodiments, the digital twin is configured to provide for visualization of in-situ hydrodynamic changes to a portion of a hull disposed below a water line of one or more of the barges and one or more of the sets of recommendations from the artificial intelligence system for a change in a hydrodynamic surface to change performance of one or more of the barges. In embodiments, the digital twin is configured to determine a schedule for the change to the hydrodynamic surface of the hull disposed below the waterline of one or more of the barges to improve fuel efficiency based on known routes of travel and weather patterns.

In embodiments, the digital twin is configured to provide visualizations of extendable buoyant members from a hull of one or more of the barges to improve stability during certain maneuvers of one or more of the barges and one or more of the sets of recommendations from the artificial intelligence system for a change in the extendable buoyant members to change performance of one or more of the barges. In embodiments, the digital twin is configured to provide visualizations of a plurality of inspection points on one or more of the barges and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide for visualizations of the plurality of inspection points on one or more of the barges affected by travel within a geofenced area and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on one or more of the barges affected by travel within a geofenced area and maintenance histories associated with those inspection points.

In embodiments, the digital twin is configured to provide for visualization for a first user of one of a navigation course of one or more of the barges within a first geofenced area and for visualization for a second user of one of the navigation course of one or more of the barges within a second different geofenced area and where transit between the first and second geofenced areas motivates a handoff of the digital twin of one or more of the barges between the first user and the second user. In embodiments, the digital twin is configured to at least partially represent one or more of the barges associated with an event investigation and to at least partially detail a timeline of the event investigation and associated maritime assets. In embodiments, the digital twin is also configured to provide one or more of the sets of recommendations from the artificial intelligence system for a change of one of the attributes of the associated barges.

In embodiments, the digital twin is configured to at least partially represent one or more of the barges associated with a legal proceeding and to at least partially detail at least a portion of a timeline pertinent to the legal proceeding and associated barges. In embodiments, the digital twin is also configured to provide one or more of the sets of recommendations from the artificial intelligence system for a change of one of the attributes of the associated barges. In embodiments, the digital twin is configured to at least partially represent one or more of the barges associated with a casualty forecast and to at least partially detail at least a portion of a timeline pertinent to the casualty report and associated barges. In embodiments, the digital twin is also configured to provide one or more of the sets of recommendations from the artificial intelligence system for a change of one of the attributes of the associated barges to reduce exposure relative to a set of previous casualty forecasts.

In embodiments, the data collected by a value chain network management platform facilitates identifying theft or misuse of physical items at on one of the barges by correlating data between a set of data collectors for one or more physical items on one of the barges and the digital twin detailing the one or more physical items on one of the barges for at least one of a port infrastructure facility and a set of operators. In embodiments, the digital twin details the one or more physical items on of the barges for at least one operator that includes a view of expected states of at least a portion of the one or more physical items. In embodiments, the artificial intelligence system determines a set of geofence parameters. In embodiments, the digital twin provides further visualization of at least one geofence that integrates representation of one or more of the barges with a representation of a maritime environment adjacent to the geofence. In embodiments, digital twin is also configured to provide one or more of the sets of recommendations from the artificial intelligence system for a change of one of the attributes of the set of one or more of the barges.

In embodiments, the asset management application is associated with one or more ships connected to one of the barges. In embodiments, the data handling layer of the management platform includes data sources containing information used to populate the training set based on a set of maritime activities of one or more of the barges underway and each connected to a ship and one of design outcomes, parameters, and data associated with the one or more of the barges and its associated ship.

In embodiments, the artificial intelligence system is configured to learn on the training set collected from the data sources and to simulate one or more design attributes of one or more of the barges each connected to a ship. In embodiments, the digital twin system provides for visualization of a digital twin of one or more of the barges and each of the ships to which they are connected.

In embodiments, the methods, systems and apparatuses include an information technology system having a value chain network management platform for learning on a training set of design outcomes, parameters, and data collected from data sources relating to a set of shipping activities to train an artificial intelligence system to simulate attributes of a barge and generate a set of recommendations of changes to the attributes using a digital twin of the barge.

In embodiments, the digital twin system further provides for visualization of the digital twin of one or more of the barges including one or more of the attributes in combination with one or more of the sets of recommendations of changes to the attributes associated with the barges. In embodiments, one of the barges is connected to a ship. In embodiments, the digital twin is configured to provide for visualization of a navigation course of one of the barges relative to a planned course of one of the barges and one or more of the sets of recommendations from the artificial intelligence system for a change in the navigation course of one of the barges.

In embodiments, the digital twin is configured to provide for visualization of a hull integrity of one of the barges relative to a planned course of one of the barges and one or more of the sets of recommendations from the artificial intelligence system for a change in maintenance of the hull of one of the barges. In embodiments, digital twin is configured to provide for visualization of in-situ hydrodynamic changes to a portion of a hull disposed below a water line of one or more of the barges and one or more of the sets of recommendations from the artificial intelligence system for a change in a hydrodynamic surface to change performance of one or more of the barges. In embodiments, the digital twin is configured to determine a schedule for the change to the hydrodynamic surface of the hull disposed below the waterline of one or more of the barges to improve fuel efficiency based on known routes of travel and weather patterns.

In embodiments, the digital twin is configured to provide visualizations of extendable buoyant members from a hull of one or more of the barges to improve stability during certain maneuvers of one or more of the barges and one or more of the sets of recommendations from the artificial intelligence system for a change in the extendable buoyant members to change performance of one or more of the barges. In embodiments, the digital twin is configured to provide visualizations of a plurality of inspection points on one or more of the barges and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide for visualizations of the plurality of inspection points on one or more of the barges affected by travel within a geofenced area and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on one or more of the barges affected by travel within a geofenced area and maintenance histories associated with those inspection points.

In embodiments, the digital twin is configured to provide for visualization for a first user of one of a navigation course of one or more of the barges within a first geofenced area and for visualization for a second user of one of the navigation course of one or more of the barges within a second different geofenced area and where transit between the first and second geofenced areas motivates a handoff of the digital twin of one or more of the barges between the first user and the second user. In embodiments, the digital twin is configured to at least partially represent one or more of the barges associated with an event investigation and to at least partially detail a timeline of the event investigation and associated maritime assets. In embodiments, the digital twin is also configured to provide one or more of the sets of recommendations from the artificial intelligence system for a change of one of the attributes of the associated barges.

In embodiments, the digital twin is configured to at least partially represent one or more of the barges associated with a legal proceeding and to at least partially detail at least a portion of a timeline pertinent to the legal proceeding and associated barges. In embodiments, the digital twin is also configured to provide one or more of the sets of recommendations from the artificial intelligence system for a change of one of the attributes of the associated barges. In embodiments, the digital twin is configured to at least partially represent one or more of the barges associated with a casualty forecast and to at least partially detail at least a portion of a timeline pertinent to the casualty report and associated barges. In embodiments, the digital twin is also configured to provide one or more of the sets of recommendations from the artificial intelligence system for a change of one of the attributes of the associated barges to reduce exposure relative to a set of previous casualty forecasts.

In embodiments, the data collected by a value chain network management platform facilitates identifying theft or misuse of physical items on one of the barges by correlating data between a set of data collectors for one or more physical items on one of the barges and the digital twin detailing the one or more physical items on one of the barges for at least one of a port infrastructure facility and a set of operators. In embodiments, the digital twin details the one or more physical items on of the barges for at least one operator that includes a view of expected states of at least a portion of the one or more physical items.

In embodiments, the artificial intelligence system determines a set of geofence parameters. In embodiments, the digital twin provides further visualization of at least one geofence that integrates representation of one or more of the barges with a representation of a maritime environment adjacent to the geofence. In embodiments, the digital twin is also configured to provide one or more of the sets of recommendations from the artificial intelligence system for a change of one of the attributes of the set of one or more of the barges.

In embodiments, the asset management application is associated with one or more ships connected to one of the barges. In embodiments, the data handling layer of the management platform includes data sources containing information used to populate the training set based on a set of maritime activities of one or more of the barges underway and each connected to a ship and one of design outcomes, parameters, and data associated with the one or more of the barges and its associated ship. In embodiments, the artificial intelligence system is configured to learn on the training set collected from the data sources and to simulate one or more design attributes of one or more of the barges each connected to a ship. In embodiments, the digital twin system provides for visualization of a digital twin of one or more of the barges and each of the ships to which they are connected.

In embodiments, the methods, systems and apparatuses includes an information technology system having a value chain network management platform including an asset management application associated with port infrastructure and a data handling layer of the management platform including data sources containing information used to populate a training set based on a set of maritime activities around the port infrastructure and one of design outcomes, parameters, and data associated with the port infrastructure. The information technology system also has an artificial intelligence system that is configured to learn on the training set collected from the data sources, that simulates one or more attributes of the port infrastructure, and that generates one or more sets of recommendations for a change in the one or more attributes based on the training set collected from the data sources. The information technology system also has a digital twin system included in the value chain network management platform that provides for visualization of a digital twin of the port infrastructure including detail generated by the artificial intelligence system of one or more of the attributes in combination with the one or more sets of recommendations.

In embodiments, the digital twin system further provides for visualization of the digital twin of one or more of container ships in the port infrastructure including one or more of the attributes in combination with one or more of the sets of recommendations associated with one or more of the container ships.

In embodiments, the digital twin system further provides for visualization of the digital twin of one or more of barges in the port infrastructure including one or more of the attributes in combination with one or more of the sets of recommendations associated with one or more of the barges. In embodiments, the port infrastructure includes one or more moored navigation units deployed on water. In embodiments, the port infrastructure includes one or more ships each connected to a barge. In embodiments, the port infrastructure is associated with a real-world maritime port. In embodiments, the digital twin system further provides for visualization of the digital twin of one or more of the components of the real-world maritime port including one or more of the attributes in combination with one or more of the sets of recommendations associated with the components of the real-world maritime port.

In embodiments, the port infrastructure is associated with a real-world shipyard. In embodiments, the digital twin system further provides for visualization of the digital twin of one or more of the components of the real-world shipyard including one or more of the attributes in combination with one or more of the sets of recommendations associated with the components of the real-world shipyard.

In embodiments, the digital twin is configured to provide for visualization of an engine performance of the port infrastructure and one or more of the sets of recommendations from the artificial intelligence system for a change in the engine performance installed in the port infrastructure. In embodiments, the visualization of an engine performance includes an emissions profile. In embodiments, the digital twin is configured to provide visualizations of a plurality of inspection points on the port infrastructure and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide for visualizations of the plurality of inspection points on the port infrastructure includes within a geofenced area and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on the port infrastructure includes within a geofenced area and maintenance histories associated with those inspection points.

In embodiments, the digital twin is configured to at least partially represent the port infrastructure associated with an event investigation and to at least partially detail a timeline of the event investigation. In embodiments, the digital twin is also configured to provide one or more of the sets of recommendations from the artificial intelligence system for a change of one of the attributes of the associated port infrastructure.

In embodiments, the digital twin is configured to at least partially represent the port infrastructure associated with a legal proceeding and to at least partially detail at least a portion of a timeline pertinent to the legal proceeding. In embodiments, the digital twin is also configured to provide one or more of the sets of recommendations from the artificial intelligence system for a change of one of the attributes of the associated port infrastructure.

In embodiments, the digital twin is configured to at least partially represent the port infrastructure associated with a casualty forecast and to at least partially detail at least a portion of a timeline pertinent to the casualty report. In embodiments, the digital twin is also configured to provide one or more of the sets of recommendations from the artificial intelligence system for a change of one of the attributes of the associated port infrastructure to reduce exposure relative to a set of previous casualty forecasts.

In embodiments, the data collected by a value chain network management platform facilitates identifying theft at or misuse at the port infrastructure by correlating data between a set of data collectors for one or more physical items at the port infrastructure and the digital twin detailing the one or more physical items of the port infrastructure for the at least one of a facility at the port infrastructure and the set of operators. In embodiments, the digital twin details the one or more physical items at the port infrastructure for at least one operator that includes a view of expected states of at least a portion of the one or more physical items.

In embodiments, the data collected by a value chain network management platform facilitates identifying theft at or misuse of one or more physical items at the port infrastructure by correlating data between a set of data collectors for the one or more physical items and the digital twin detailing the one or more physical items at the port infrastructure includes for the at least one of a facility at the port infrastructure and the set of operators. In embodiments, the digital twin details the one or more physical items at the port infrastructure for at least one operator that includes a view of expected states of at least a portion of the one or more physical items.

In embodiments, the artificial intelligence system determines a set of geofence parameters. In embodiments, the digital twin provides further visualization of at least one geofence that integrates representation of at least a portion of the port infrastructure with a representation of a maritime environment adjacent to the geofence. In embodiments, the digital twin is also configured to provide one or more of the sets of recommendations from the artificial intelligence system for a change of one of the attributes of the port infrastructure.

In embodiments, one or more components of the port infrastructure are installed on land. In embodiments, the one or more components of the port infrastructure include one or more moored navigation units deployed on water. In embodiments, the methods, systems and apparatuses include an information technology system having a value chain network management platform for learning on a training set of design outcomes, parameters, and data collected from data sources relating to a set of shipping activities to train an artificial intelligence system to simulate design attributes of a port infrastructure facility and generate a set of design recommendations using a digital twin of the port infrastructure facility. In embodiments, the digital twin system further provides for visualization of the digital twin of the port infrastructure facility including one or more of the attributes in combination with one or more of the sets of recommendations of changes to the attributes associated with the port infrastructure facility.

In embodiments, the digital twin is configured to provide visualizations of a plurality of inspection points on the port infrastructure facility and maintenance histories associated with those inspection points. In embodiments, the digital twin is also configured to provide one or more of the sets of recommendations from the artificial intelligence system for a change in maintenance of the plurality of inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on the port infrastructure facility within a geofenced area and maintenance histories associated with those inspection points.

In embodiments, the digital twin is configured to at least partially represent at least a portion of the port infrastructure facility associated with an event investigation and to at least partially detail a timeline of the event investigation and associated with the port infrastructure facility. In embodiments, the digital twin is also configured to provide one or more of the sets of recommendations from the artificial intelligence system for a change of one of the attributes of the port infrastructure facility.

In embodiments, the digital twin is configured to at least partially represent at least a portion of the port infrastructure facility associated with a legal proceeding and to at least partially detail at least a portion of a timeline pertinent to the legal proceeding and associated with the port infrastructure facility. In embodiments, the digital twin is also configured to provide one or more of the sets of recommendations from the artificial intelligence system for a change of one of the attributes of the associated port infrastructure facility In embodiments, the digital twin is configured to at least partially represent at least a portion of the port infrastructure facility associated with a casualty forecast and to at least partially detail at least a portion of a timeline pertinent to the casualty report and associated port infrastructure facility. In embodiments, the digital twin is also configured to provide one or more of the sets of recommendations from the artificial intelligence system for a change of one of the attributes of at least a portion of the port infrastructure facility to reduce exposure relative to a set of previous casualty forecasts.

In embodiments, the data collected by a value chain network management platform facilitates identifying theft or misuse of physical items in at least a portion of the port infrastructure facility by correlating data between a set of data collectors for one or more physical items in at least a portion of the port infrastructure facility and the digital twin detailing the one or more physical items in at least a portion of the port infrastructure facility for at least one of the port infrastructure facility and a set of operators. In embodiments, the digital twin details the one or more physical items in the port infrastructure facility for at least one operator that includes a view of expected states of at least a portion of the one or more physical items.

In embodiments, the artificial intelligence system determines a set of geofence parameters. In embodiments, the digital twin provides further visualization of at least one geofence that integrates representation of at least a portion of the port infrastructure facility with a representation of a maritime environment adjacent to the geofence. In embodiments, the digital twin is also configured to provide one or more of the sets of recommendations from the artificial intelligence system for a change of one of the attributes of at least a portion of the port infrastructure facility.

In embodiments, the methods, systems and apparatuses include an information technology system having a value chain network management platform including an asset management application associated with maritime assets involved in a maritime event and a data handling layer of the management platform including data sources containing information used to populate a training set based on a set of maritime activities of the maritime assets involved in the maritime event and one of design outcomes, parameters, and data associated with the maritime assets involved in the maritime event. The information technology system also has an artificial intelligence system that is configured to learn on the training set collected from the data sources, that simulates one or more design attributes of the maritime assets involved in a maritime event, and that generates one or more sets of design recommendations based on the training set collected from the data sources. The information technology system also has a digital twin system included in the value chain network management platform that provides for visualization of a digital twin of the maritime assets involved in a maritime event including detail generated by the artificial intelligence system of one or more of the design attributes in combination with the one or more sets of design recommendations applicable to at least one of the maritime assets involved in the maritime event.

In embodiments, the maritime assets include one or more container ships involved in the maritime event. In embodiments, the digital twin system further provides for visualization of the digital twin of one or more of the container ships including one or more of the attributes in combination with one or more of the sets of recommendations associated with the container ships.

In embodiments, the maritime assets include one or more barges involved in the maritime event. In embodiments, the digital twin system further provides for visualization of the digital twin of one or more of the barges including one or more of the attributes in combination with one or more of the sets of recommendations associated with the barges.

In embodiments, the maritime assets include one or more components of port infrastructure involved in the maritime event. In embodiments, the digital twin system further provides for visualization of the digital twin of one or more of the components of port infrastructure including one or more of the attributes in combination with one or more of the sets of recommendations associated with the components of port infrastructure.

In embodiments, the maritime assets are associated with a real-world maritime port. In embodiments, the digital twin system further provides for visualization of the digital twin of one or more of the components of the real-world maritime port involved in the maritime event including one or more of the attributes in combination with one or more of the sets of recommendations associated with the components of the real-world maritime port.

In embodiments, the maritime assets are associated with a real-world shipyard In embodiments, the digital twin system further provides for visualization of the digital twin of one or more of the components of the real-world shipyard involved in the maritime event including one or more of the attributes in combination with one or more of the sets of recommendations associated with the components of the real-world shipyard.

In embodiments, the digital twin of one or more of the maritime assets is a floating asset twin associated with a ship. In embodiments, the floating asset twin is configured to provide for visualization of a navigation course of the ship involved in the maritime event relative to a planned course of the ship and one or more of the sets of recommendations from the artificial intelligence system for a change in the navigation course of the ship. In embodiments, the floating asset twin is configured to provide for visualization of an engine performance of the ship involved in the maritime event and one or more of the sets of recommendations from the artificial intelligence system for a change in the engine performance of the ship. In embodiments, the visualization of an engine performance includes an emissions profile of the ship. In embodiments, the floating asset twin is configured to provide for visualization of a hull integrity of the ship involved in the maritime event and one or more of the sets of recommendations from the artificial intelligence system for a change in maintenance of the hull of the ship. In embodiments, the floating asset twin is configured to provide visualizations of a plurality of inspection points on the ship involved in the maritime event and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide for visualizations of the plurality of inspection points on the ship affected by travel within a geofenced area and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide details of a ledger of activity associated with the visualization of the plurality of inspection points on the ship involved in the maritime event within a geofenced area and maintenance histories associated with those inspection points.

In embodiments, the artificial intelligence system determines a set of geofence parameters. In embodiments, the digital twin provides further visualization of at least one geofence that integrates representation of a set of the maritime assets involved in the maritime event with a representation of a maritime environment adjacent to the geofence. In embodiments, the digital twin is also configured to provide one or more of the sets of recommendations from the artificial intelligence system for a change of one of the attributes of the set of maritime assets involved in the maritime event. In embodiments, the methods, systems and apparatuses include an information technology system having a value chain network management platform for learning on a training set of maritime event outcomes, parameters, and data collected from data sources to train an artificial intelligence system to use a digital twin to facilitate investigation of a maritime event.

In embodiments, the maritime event outcomes are associated with a real-world shipyard. In embodiments, the digital twin is configured to detail at least a portion of the real-world shipyard to facilitate investigation of the maritime event. In embodiments, the maritime event outcomes are associated with a real-world maritime port. In embodiments, the digital twin is configured to detail at least a portion of the real-world maritime port to facilitate investigation of the maritime event.

In embodiments, the maritime event outcomes are associated with one or more container ships. In embodiments, the digital twin is configured to detail one or more of the container ships to facilitate investigation of the maritime event. In embodiments, the maritime event outcomes are associated with one or more barges. In embodiments, the digital twin is configured to detail one or more of the barges to facilitate investigation of the maritime event.

In embodiments, the maritime event outcomes are associated with at least a portion of port infrastructure. In embodiments, the digital twin is configured to detail at least a portion of the port infrastructure to facilitate investigation of the maritime event. In embodiments, the digital twin is configured to at least partially represent activity of one or more maritime value chain network entities during a timeline associated with the maritime event. In embodiments, the one or more maritime value chain network entities are associated with a legal proceeding. In embodiments, the digital twin is further configured to at least partially represent activity of one or more maritime value chain network entities during a timeline associated with the legal proceeding. In embodiments, the one or more maritime value chain network entities are associated with a legal proceeding. In embodiments, the digital twin is further configured to at least partially represent activity of one or more maritime value chain network entities during a timeline associated with the legal proceeding.

In embodiments, the one or more maritime value chain network entities are associated with a casualty forecast. In embodiments, the digital twin is further configured to at least partially represent activity of one or more maritime value chain network entities during a timeline associated with the casualty forecast. In embodiments, one or more of the maritime value chain network entities is a port infrastructure facility. In embodiments, the data collected by the value chain network management platform facilitates identifying theft or misuse of one or more physical items of the port infrastructure facility by correlating data between a set of data collectors for one or more of the physical items in the port infrastructure facility and the digital twin detailing one or more of the physical items of the port infrastructure facility for the at least one of the port infrastructure facility and the set of operators to further facilitate investigation of the maritime event.

In embodiments, the maritime event includes a container ship that is moored to port infrastructure installed on or adjacent to land. In embodiments, the maritime event includes at least a container ship having a forward speed relative to water and weather conditions and parameters associated with energy consumption of propulsion units on the container ship.

In embodiments, the maritime event includes one or more ships connected to barges. In embodiments, the maritime event includes one or more ships. In embodiments, the digital twin provides for visualization of a navigation course of one or more of the ships during the maritime event. In embodiments, the maritime event includes one or more ships. In embodiments, the digital twin provides for visualization of an engine performance of one or more of the ships during the maritime event. In embodiments, the maritime event includes one or more ships. In embodiments, the digital twin provides for visualization of a hull integrity of one or more of the ships involved in the maritime event.

In embodiments, the maritime event includes one or more ships. In embodiments, the digital twin provides for visualization of a plurality of inspection points associated with one or more of the ships and maintenance histories associated with those inspection points.

In embodiments, the digital twin further provides for the visualization of the plurality of inspection points associated with one or more of the ships within a geofenced area related to the maritime event and maintenance histories associated with those inspection points. In embodiments, the digital twin further provides for details of a ledger of activity associated with the visualization of the plurality of inspection points associated with one or more of the ships within a geofenced area related to the maritime event and maintenance histories associated with those inspection points.

In embodiments, the methods, systems and apparatuses include an information technology system having a value chain network management platform including an asset management application associated with maritime assets involved in a maritime legal proceeding and a data handling layer of the management platform including data sources containing information used to populate a training set based on a set of maritime activities of the maritime assets involved in the maritime legal proceeding and one of parameters and data associated with the maritime assets involved in the maritime legal proceeding. The information technology system also has an artificial intelligence system that is configured to learn on the training set collected from the data sources, that simulates one or more attributes of one or more of the maritime assets involved in the maritime legal proceeding, and that generates one or more sets of recommendations for a change in the one or more attributes based on the training set collected from the data sources. The information technology system also has a digital twin system included in the value chain network management platform that provides for visualization of a digital twin of one or more of the maritime assets involved in the maritime legal proceeding including detail generated by the artificial intelligence system of one or more of the attributes in combination with the one or more sets of recommendations.

In embodiments, the maritime assets include one or more container ships involved in the maritime legal proceeding. In embodiments, the digital twin system further provides for visualization of the digital twin of one or more of the container ships including one or more of the attributes in combination with one or more of the sets of recommendations associated with the container ships.

In embodiments, the maritime assets include one or more barges involved in the maritime legal proceeding. In embodiments, the digital twin system further provides for visualization of the digital twin of one or more of the barges including one or more of the attributes in combination with one or more of the sets of recommendations associated with the barges.

In embodiments, the maritime assets include one or more components of port infrastructure involved in the maritime legal proceeding. In embodiments, the digital twin system further provides for visualization of the digital twin of one or more of the components of port infrastructure including one or more of the attributes in combination with one or more of the sets of recommendations associated with the components of port infrastructure.

In embodiments, the maritime assets are associated with a real-world maritime port. In embodiments, the digital twin system further provides for visualization of the digital twin of one or more of the components of the real-world maritime port involved in the maritime legal proceeding including one or more of the attributes in combination with one or more of the sets of recommendations associated with the components of the real-world maritime port.

In embodiments, the maritime assets are associated with a real-world shipyard. In embodiments, the digital twin system further provides for visualization of the digital twin of one or more of the components of the real-world shipyard involved in the maritime legal proceeding including one or more of the attributes in combination with one or more of the sets of recommendations associated with the components of the real-world shipyard.

In embodiments, the digital twin of one or more of the maritime assets is a floating asset twin associated with a ship. In embodiments, the floating asset twin is configured to provide for visualization of a navigation course of the ship involved in the maritime legal proceeding relative to a planned course of the ship and one or more of the sets of recommendations from the artificial intelligence system for a change in the navigation course of the ship. In embodiments, the floating asset twin is configured to provide for visualization of an engine performance of the ship involved in the maritime legal proceeding and one or more of the sets of recommendations from the artificial intelligence system for a change in the engine performance of the ship.

In embodiments, the visualization of an engine performance includes an emissions profile of the ship. In embodiments, the floating asset twin is configured to provide for visualization of a hull integrity of the ship involved in the maritime legal proceeding and one or more of the sets of recommendations from the artificial intelligence system for a change in maintenance of the hull of the ship. In embodiments, the floating asset twin is configured to provide visualizations of a plurality of inspection points on the ship involved in the maritime legal proceeding and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide for visualizations of the plurality of inspection points on the ship affected by travel within a geofenced area and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide details of a ledger of activity associated with the visualization of the plurality of inspection points on the ship involved in the maritime legal proceeding within a geofenced area and maintenance histories associated with those inspection points.

In embodiments, the artificial intelligence system determines a set of geofence parameters. In embodiments, the digital twin provides further visualization of at least one geofence that integrates representation of a set of the maritime assets involved in the maritime legal proceeding with a representation of a maritime environment adjacent to the geofence. In embodiments, the digital twin is also configured to provide one or more of the sets of recommendations from the artificial intelligence system for a change of one of the attributes of the set of maritime assets involved in the maritime legal proceeding.

In embodiments, the methods, systems and apparatuses include an information technology system having a value chain network management platform for learning on a training set of maritime legal outcomes, parameters, and data collected from data sources to train an artificial intelligence system to use a digital twin to generate a recommendation relating to a maritime legal proceeding.

In embodiments, the maritime legal outcomes are associated with a real-world shipyard. In embodiments, the digital twin is configured to detail at least a portion of the real-world shipyard associated with the maritime legal proceeding. In embodiments, the maritime legal outcomes are associated with a real-world maritime port. In embodiments, the digital twin is configured to detail at least a portion of the real-world maritime port associated with the maritime legal proceeding.

In embodiments, the maritime legal outcomes are associated with one or more container ships. In embodiments, the digital twin is configured to detail at least a portion of the one or more container ships associated with the maritime legal proceeding. In embodiments, the maritime legal outcomes are associated with one or more barges. In embodiments, the digital twin is configured to detail at least a portion of the one or more barges associated with the maritime legal proceeding.

In embodiments, the maritime legal outcomes are associated with at least a portion of port infrastructure. In embodiments, the digital twin is configured to detail at least a portion of the port infrastructure associated with the maritime legal proceeding.

In embodiments, the digital twin is configured to at least partially represent activity of one or more maritime value chain network entities during a timeline associated with the maritime legal proceeding. In embodiments, one or more of the maritime value chain network entities is a port infrastructure facility. In embodiments, the data collected by the value chain network management platform facilitates identifying theft or misuse of one or more physical items of the port infrastructure facility relating to the maritime legal proceeding by correlating data between a set of data collectors for one or more of the physical items in the port infrastructure facility. In embodiments, the digital twin is configured to further detail one or more of the physical items of the port infrastructure facility for the at least one of the port infrastructure facility and the set of operators.

In embodiments, the maritime legal proceeding includes a situation involving a container ship that is moored to port infrastructure installed on or adjacent to land. In embodiments, the maritime legal proceeding includes a situation involving a container ship having a forward speed relative to water and weather conditions and parameters associated with energy consumption of propulsion units on the container ship. In embodiments, the maritime legal proceeding includes a situation involving one or more ships connected to barges. In embodiments, the maritime legal proceeding includes a situation involving one or more ships. In embodiments, the digital twin provides for visualization of a navigation course of one or more of the ships relevant to the maritime legal proceeding. In embodiments, the maritime legal proceeding includes a situation involving one or more ships. In embodiments, the digital twin provides for visualization of an engine performance of one or more of the ships relevant to the maritime legal proceeding. In embodiments, the maritime legal proceeding includes a situation involving one or more ships. In embodiments, the digital twin provides for visualization of a hull integrity of one or more of the ships relevant to the maritime legal proceeding.

In embodiments, the maritime legal proceeding includes a situation involving one or more ships. In embodiments, the digital twin provides for visualization of a plurality of inspection points associated with one or more of the ships and maintenance histories associated with those inspection points. In embodiments, the digital twin further provides for the visualization of the plurality of inspection points associated with one or more of the ships within a geofenced area relevant to the maritime legal proceeding and maintenance histories associated with those inspection points. In embodiments, the digital twin further provides for details of a ledger of activity associated with the visualization of the plurality of inspection points associated with one or more of the ships within a geofenced area relevant to the maritime legal proceeding and maintenance histories associated with those inspection points.

In embodiments, the methods, systems and apparatuses include an information technology system having a value chain network management platform including an asset management application associated with maritime assets and a data handling layer of the management platform including data sources containing information used to populate a training set based on a set of maritime activities of one or more of the maritime assets involved in a loss event and one of outcomes, parameters, and data associated with the one or more maritime assets experiencing the loss event. The information technology system also has an artificial intelligence system that is configured to learn on the training set collected from the data sources, that simulates one or more attributes of one or more of the maritime assets, and that generates one or more sets of casualty forecasts based on the training set collected from the data sources. The information technology system also has a digital twin system included in the value chain network management platform that provides for visualization of one or more digital twins associated with one or more of the maritime assets involved in the loss event including detail generated by the artificial intelligence system of at least a portion of one of the sets of casualty forecasts.

In embodiments, the maritime assets include one or more container ships associated with at least a portion of one of the sets of casualty forecasts. In embodiments, the digital twin system further provides for visualization of the digital twin of one or more of the container ships including one or more of the attributes in combination with one or more of the sets of recommendations associated with the container ships.

In embodiments, the maritime assets include one or more barges with at least a portion of one of the sets of casualty forecasts. In embodiments, the digital twin system further provides for visualization of the digital twin of one or more of the barges including one or more of the attributes in combination with one or more of the sets of recommendations associated with the barges.

In embodiments, the maritime assets include one or more components of port infrastructure with at least a portion of one of the sets of casualty forecasts. In embodiments, the digital twin system further provides for visualization of the digital twin of one or more of the components of port infrastructure including one or more of the attributes in combination with one or more of the sets of recommendations associated with the components of port infrastructure associated with the sets of casualty forecasts.

In embodiments, the maritime assets are associated with a real-world maritime port. In embodiments, the digital twin system further provides for visualization of the digital twin of one or more of the components of the real-world maritime port associated at least a portion of one of the sets of casualty forecasts including one or more of the attributes in combination with one or more of the sets of recommendations associated with the components of the real-world maritime port.

In embodiments, the maritime assets are associated with a real-world shipyard. In embodiments, the digital twin system further provides for visualization of the digital twin of one or more of the components of the real-world shipyard associated at least a portion of one of the sets of casualty forecasts including one or more of the attributes in combination with one or more of the sets of recommendations associated with the components of the real-world shipyard.

In embodiments, the digital twin of one or more of the maritime assets is a floating asset twin associated with a ship associated with at least a portion of one of the sets of casualty forecasts. In embodiments, the floating asset twin is configured to provide for visualization of a navigation course of the ship associated at least a portion of one of the sets of casualty forecasts relative to a planned course of the ship and one or more of the sets of recommendations from the artificial intelligence system for a change in the navigation course of the ship. In embodiments, the floating asset twin is configured to provide for visualization of an engine performance of the ship associated at least a portion of one of the sets of casualty forecasts and one or more of the sets of recommendations from the artificial intelligence system for a change in the engine performance of the ship. In embodiments, the visualization of an engine performance includes an emissions profile of the ship. In embodiments, the floating asset twin is configured to provide for visualization of a hull integrity of the ship associated at least a portion of one of the sets of casualty forecasts and one or more of the sets of recommendations from the artificial intelligence system for a change in maintenance of the hull of the ship. In embodiments, the floating asset twin is configured to provide visualizations of a plurality of inspection points on the ship associated with at least a portion of one of the sets of casualty forecasts and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide for visualizations of the plurality of inspection points on the ship affected by travel within a geofenced area and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide details of a ledger of activity associated with the visualization of the plurality of inspection points on the ship associated at least a portion of one of the sets of casualty forecasts within a geofenced area and maintenance histories associated with those inspection points.

In embodiments, the artificial intelligence system determines a set of geofence parameters. In embodiments, the digital twin provides further visualization of at least one geofence that integrates representation of a set of the maritime assets associated at least a portion of one of the sets of casualty forecasts with a representation of a maritime environment adjacent to the geofence. In embodiments, the digital twin is also configured to provide one or more of the sets of recommendations from the artificial intelligence system for a change of one of the attributes of the set of maritime assets associated with at least a portion of one of the sets of casualty forecasts.

In embodiments, the methods, systems and apparatuses include an information technology system having a value chain network management platform for learning on a training set of maritime outcomes, parameters, and data collected from data sources to train an artificial intelligence system to use a digital twin to predict and display a casualty forecast for a set of maritime assets.

In embodiments, the set of maritime assets includes a real-world shipyard. In embodiments, the digital twin is configured to detail at least a portion of the real-world shipyard associated with the casualty forecast.

In embodiments, the set of maritime assets includes a real-world maritime port. In embodiments, the digital twin is configured to detail at least a portion of the real-world maritime port associated with the casualty forecast.

In embodiments, the set of maritime assets includes one or more container ships. In embodiments, the digital twin is configured to detail at least a portion of the one or more container ships associated with the casualty forecast.

In embodiments, the set of maritime assets includes one or more barges. In embodiments, the digital twin is configured to detail at least a portion of the one or more barges associated with the casualty forecast. In embodiments, the set of maritime assets includes at least a portion of port infrastructure. In embodiments, the digital twin is configured to detail at least a portion of the port infrastructure associated with the casualty forecast. In embodiments, the digital twin is configured to at least partially represent activity of the set of maritime assets during a timeline associated with the casualty forecast.

In embodiments, the set of maritime assets includes a port infrastructure facility. In embodiments, data collected by the value chain network management platform facilitates identifying theft or misuse of one or more physical items of the port infrastructure facility relating to the casualty forecast by correlating data between a set of data collectors for one or more of the physical items in the port infrastructure facility. In embodiments, the digital twin is configured to further detail one or more of the physical items of the port infrastructure facility for the at least one of the port infrastructure facility and the set of operators.

In embodiments, the set of maritime assets includes a container ship that is moored to port infrastructure installed on or adjacent to land. In embodiments, the set of maritime assets includes one or more ships connected to barges. In embodiments, the set of maritime assets includes one or more ships. In embodiments, the digital twin provides for visualization of a navigation course of one or more of the ships relevant to the casualty forecast. In embodiments, the set of maritime assets includes one or more ships. In embodiments, the digital twin provides for visualization of an engine performance of one or more of the ships relevant to the casualty forecast. In embodiments, the set of maritime assets includes one or more ships. In embodiments, the digital twin provides for visualization of a hull integrity of one or more the ships relevant to the casualty forecast.

In embodiments, the set of maritime assets includes one or more ships. In embodiments, the digital twin provides for visualization of a plurality of inspection points associated with one or more of the ships and maintenance histories associated with those inspection points relevant to the casualty forecast. In embodiments, the digital twin further provides for the visualization of the plurality of inspection points associated with one or more of the ships within a geofenced area relevant to the casualty forecast and maintenance histories associated with those inspection points. In embodiments, the digital twin further provides for details of a ledger of activity associated with the visualization of the plurality of inspection points associated with one or more of the ships within a geofenced area relevant to the casualty forecast and maintenance histories associated with those inspection points.

In embodiments, the methods, systems and apparatuses include an information technology system having a value chain network management platform for identifying theft or misuse of a port infrastructure facility by correlating data between a set of data collectors for the physical item and a set of digital twins for at least one of the port infrastructure facility and a set of operators.

In embodiments, the set of digital twins of the port infrastructure facility includes one or more of the attributes in combination with one or more of the sets of recommendations of changes to attributes associated with the port infrastructure facility. In embodiments, the set of digital twins is configured to provide visualizations of a plurality of inspection points on the port infrastructure facility and maintenance histories associated with those inspection points. In embodiments, the set of digital twins is configured to provide details of a ledger of activity associated with the visualization of the plurality of inspection points on the port infrastructure facility within a geofenced area and maintenance histories associated with those inspection points.

In embodiments, the set of digital twins is configured to at least partially represent at least a portion of the port infrastructure facility associated with an event investigation and to at least partially detail a timeline of the event investigation and associated with the port infrastructure facility. In embodiments, the set of digital twins is configured to at least partially represent at least a portion of the port infrastructure facility associated with a legal proceeding and to at least partially detail at least a portion of a timeline pertinent to the legal proceeding and associated with the port infrastructure facility. In embodiments, the set of digital twins is configured to at least partially represent at least a portion of the port infrastructure facility associated with a casualty forecast and to at least partially detail at least a portion of a timeline pertinent to the casualty report and associated port infrastructure facility.

In embodiments, the digital twin details the one or more physical items in the port infrastructure facility for at least one operator that includes a view of expected states of at least a portion of the one or more physical items. In embodiments, the set of digital twins provides further visualization of at least one geofence that integrates representation of at least a portion of the port infrastructure facility with a representation of a maritime environment adjacent to the geofence.

In embodiments, the methods, systems and apparatuses include an information technology system having a value chain network management platform identifying theft or misuse of a shipyard facility by correlating data between a set of data collectors for the physical item and a set of digital twins for at least one of the shipyard facility and a set of operators.

In embodiments, the set of digital twins for at least one of the shipyard facility and a set of operators includes one or more of the attributes in combination with one or more of the sets of recommendations of changes to attributes associated with the shipyard facility.

In embodiments, the set of digital twins is configured to provide visualizations of a plurality of inspection points on in the shipyard facility and maintenance histories associated with those inspection points. In embodiments, the set of digital twins is configured to provide details of a ledger of activity associated with the visualization of the plurality of inspection points on the shipyard facility within a geofenced area and maintenance histories associated with those inspection points.

In embodiments, the set of digital twins is configured to at least partially represent at least a portion of the shipyard facility associated with an event investigation and to at least partially detail a timeline of the event investigation and associated with the port infrastructure facility. In embodiments, the set of digital twins is configured to at least partially represent at least a portion of the shipyard facility associated with a legal proceeding and to at least partially detail at least a portion of a timeline pertinent to the legal proceeding and associated with the shipyard facility. In embodiments, the set of digital twins is configured to at least partially represent at least a portion of the shipyard facility associated with a casualty forecast and to at least partially detail at least a portion of a timeline pertinent to the casualty report and associated shipyard facility.

In embodiments, the digital twin details the one or more physical items in the shipyard facility for at least one operator that includes a view of expected states of at least a portion of the one or more physical items. In embodiments, the set of digital twins provides further visualization of at least one geofence that integrates representation of at least a portion of the shipyard facility with a representation of a maritime environment adjacent to the geofence.

In embodiments, the methods, systems and apparatuses include an information technology system having a value chain network management platform for learning on a training set of maritime outcomes, parameters, and data collected from data sources to train an artificial intelligence system to determine a set of geofence parameters and represent at least one geofence in a digital twin that integrates representation of a set of maritime entities with a representation of a maritime environment.

In embodiments, the set of maritime entities is associated with a real-world shipyard. In embodiments, the digital twin is configured to represent the real-world shipyard and geofence parameters include a location within the real-world shipyard.

In embodiments, the set of maritime entities is associated with a real-world maritime port. In embodiments, the digital twin is configured to represent the real-world maritime port and geofence parameters include a location within the real-world maritime port.

In embodiments, the set of maritime entities is associated with one or more container ships. In embodiments, the digital twin is configured to represent the one or more container ships relative to the geofence parameters. In embodiments, the set of maritime entities is associated with one or more container barges. In embodiments, the digital twin is configured to represent the one or more barges relative to the geofence parameters. In embodiments, the set of maritime entities is associated with an event investigation. In embodiments, the digital twin is configured to at least partially represent the set of maritime entities as it at least one of interacted during a timeline associated with the event investigation or is predicted to act based on a suggestion associated with the event investigation.

In embodiments, the set of maritime entities is associated with a legal proceeding. In embodiments, the digital twin is configured to at least partially represent the set of maritime entities as it at least one of interacted during a timeline associated with the legal proceeding or is predicted to act based on a suggestion associated with the legal proceeding.

In embodiments, the data collected by the value chain network management platform relates to a casualty report. In embodiments, the digital twin of the set of maritime entities is configured to simulate possibilities of a loss relevant to the casualty report based on the data collected by the value chain network management platform.

In embodiments, the data collected by a value chain network management platform facilitates identifying theft or misuse of physical items contained on the set of maritime entities by correlating data between a set of data collectors for one or more physical items on the set of maritime entities and the digital twin detailing the one or more physical items associated with the set of maritime entities for the at least one of a port infrastructure facility and a set of operators.

In embodiments, the set of maritime entities is a container ship that is moored to port infrastructure installed on or adjacent to land. In embodiments, data collected by a value chain network management platform is based on at least a ship having a forward speed relative to water and weather conditions and parameters associated with energy consumption of propulsion units on the ship.

The information technology system also includes an asset management application associated with the value chain network management platform and one or more maritime entities connected to a ship. In embodiments, the asset management application is associated with one or more ships connected to barges.

In embodiments, the set of maritime entities includes one or more ships. In embodiments, the digital twin provides for visualization of a navigation course of one or more of the ships. In embodiments, the set of maritime entities includes one or more ships. In embodiments, the digital twin provides for visualization of an engine performance of one or more of the ships. In embodiments, the set of maritime entities includes one or more ships. In embodiments, the digital twin provides for visualization of a hull integrity of one or more of the ships.

In embodiments, the digital twin provides for visualization of a plurality of inspection points on the set of the maritime entities and maintenance histories associated with those inspection points.

In embodiments, the digital twin further provides for the visualization of the plurality of inspection points on the set of the maritime entities within the geofenced parameters and maintenance histories associated with those inspection points. In embodiments, the digital twin further provides for details of a ledger of activity associated with the visualization of the plurality of inspection points on the maritime entities within the geofenced parameters and maintenance histories associated with those inspection points. In embodiments, the training set of maritime outcomes, parameters, and data collected from the data sources is related to a set of shipping activities.

In embodiments, the methods, systems and apparatuses include an information technology system having a value chain network management platform for learning on a training set of maritime outcomes, parameters, and data collected from data sources relating to a set of shipping activities to train an artificial intelligence system to determine a set of geofence parameters and represent at least one geofence in a digital twin that integrates representation of a set of maritime entities with a representation of a maritime environment.

In embodiments, the set of maritime entities is associated with a real-world shipyard. In embodiments, the digital twin is configured to represent the real-world shipyard, its associated set of the shipping activities and geofence parameters include a location within the real-world shipyard. In embodiments, the set of maritime entities is associated with a real-world maritime port. In embodiments, the digital twin is configured to represent the real-world maritime port, its associated set of the shipping activities and geofence parameters include a location within the real-world maritime port. In embodiments, the set of maritime entities is associated with one or more container ships. In embodiments, the digital twin is configured to represent the one or more container ships and its associated set of the shipping activities relative to the geofence parameters.

In embodiments, the set of maritime entities is associated with one or more container barges. In embodiments, the digital twin is configured to represent the one or more barges and its associated set of the shipping activities relative to the geofence parameters. In embodiments, the set of maritime entities is associated with an event investigation. In embodiments, the digital twin is configured to at least partially represent the set of maritime entities and its associated set of the shipping activities at least partially detailed on a timeline associated with the event investigation. In embodiments, the set of maritime entities is associated with a legal proceeding. In embodiments, the digital twin is configured to at least partially represent the set of maritime entities as it at least one of interacted during a timeline associated with the legal proceeding or is predicted to act based on a suggestion associated with the legal proceeding.

In embodiments, the data collected by the value chain network management platform relates to a casualty report. In embodiments, the digital twin of the set of maritime entities is configured to simulate possibilities of a loss relevant to the casualty report based on the data collected by the value chain network management platform.

In embodiments, the data collected by a value chain network management platform facilitates identifying theft or misuse of physical items contained on the set of maritime entities by correlating data between a set of data collectors for one or more physical items on the set of maritime entities and the digital twin detailing the one or more physical items associated with the set of maritime entities for the at least one of a port infrastructure facility and a set of operators.

In embodiments, the set of maritime entities is a container ship that is moored to port infrastructure installed on or adjacent to land. In embodiments, data collected by a value chain network management platform is based on at least a ship having a forward speed relative to water and weather conditions and parameters associated with energy consumption of propulsion units on the ship.

In embodiments, the information technology system also has an asset management application associated with the value chain network management platform and one or more maritime entities connected to a ship. In embodiments, the asset management application is associated with one or more ships connected to barges. In embodiments, the set of maritime entities includes one or more ships. In embodiments, the digital twin provides for visualization of a navigation course of one or more of the ships. In embodiments, the set of maritime entities includes one or more ships. In embodiments, the digital twin provides for visualization of an engine performance of one or more of the ships. In embodiments, the set of maritime entities includes one or more ships. In embodiments, the digital twin provides for visualization of a hull integrity of one or more of the ships.

In embodiments, the digital twin provides for visualization of a plurality of inspection points on the set of the maritime entities and one of maintenance histories and the set of shipping activities associated with those inspection points. In embodiments, the digital twin further provides for the visualization of the plurality of inspection points on the set of the maritime entities within the geofenced parameters and one of maintenance histories and the set of shipping activities associated with those inspection points. In embodiments, the digital twin further provides for details of a ledger of activity associated with the visualization of the plurality of inspection points on the maritime entities within the geofenced parameters and one of maintenance histories and the set of shipping activities associated with those inspection points.

In embodiments, the methods, systems and apparatuses include an information technology system having a value chain network management platform generating a digital twin representing a real-world maritime port.

In embodiments, the digital twin representing the real-world maritime port includes one or more container ships. In embodiments, the digital twin representing the real-world maritime port includes one or more barges. In embodiments, the digital twin representing the real-world maritime port includes one or more components of the port infrastructure installed on or adjacent to land.

In embodiments, the digital twin representing the real-world maritime port also includes a container ship moored to a component of the port infrastructure. In embodiments, the digital twin representing the real-world maritime port includes include one or more moored navigation units deployed on water. In embodiments, the digital twin representing the real-world maritime port includes include one or more ships connected to barges.

In embodiments, the digital twin representing the real-world maritime port includes a ship. In embodiments, the digital twin is configured to provide for visualization of a navigation course of the ship in a simulated maritime port based on the real-world maritime port. In embodiments, the digital twin is configured to provide for visualization of an engine performance of the ship including an emissions profile as the ship moves around the real-world maritime port. In embodiments, the digital twin is configured to provide for visualization of a hull of the ship as it moves through the real-world maritime port on a path having a water depth. In embodiments, the digital twin is configured to further provide for visualization of a proximity of a portion of the hull to a portion of a seafloor in the real-word shipyard. In embodiments, the digital twin displays suggestions from an artificial intelligence system that generates a portion of a maintenance schedule to maintain the water depth through the real-world maritime port based on at least a combination of a portion of actual activity in the real-world maritime port and simulations provided by the digital twin of the real-world maritime port. In embodiments, the digital twin is configured to provide visualizations of a plurality of inspection points in the real-world maritime port and maintenance histories associated with those inspection points. In embodiments, the digital twin is configured to provide for visualizations of the plurality of inspection points in the real-world maritime port and maintenance histories associated with those inspection points when within a geofenced area. In embodiments, the digital twin is configured to provide details of a ledger of activity associated with the visualization of the plurality of inspection points and maintenance histories associated with those inspection points within a geofenced of the real-world maritime port. In embodiments, the digital twin is configured to provide for further visualization for a first user of one of a navigation course of a ship and an engine performance of the ship within a first geofenced area of the real-world maritime port and for further visualization for a second user of one of the navigation course of the ship and the engine performance of the ship within a second different geofenced area in the real-world maritime port and where transit between the first and second geofenced areas motivates a handoff of the ship between the first user and the second user as depicted by the digital twin representing the real-world maritime port including the ship.

In embodiments, the methods, systems and apparatuses include an information technology system having a value chain network management platform for generating a digital twin representing a real-world shipyard. In embodiments, the digital twin representing the real-world shipyard includes one or more container ships. In embodiments, the digital twin representing the real-world shipyard includes one or more barges. In embodiments, the digital twin representing the real-world shipyard includes one or more components of the port infrastructure installed on or adjacent to land. In embodiments, the digital twin representing the real-world shipyard also includes a container ship moored to a component of the port infrastructure.

In embodiments, the digital twin representing the real-world shipyard includes include one or more moored navigation units deployed on water. In embodiments, the digital twin representing the real-world shipyard includes include one or more ships connected to barges. In embodiments, the digital twin representing the real-world shipyard includes a ship. In embodiments, the digital twin is configured to provide for visualization of a navigation course of the ship in a simulated shipyard based on the real-world shipyard. In embodiments, the digital twin is configured to provide for visualization of an engine performance of the ship including an emissions profile as the ship moves around the real-world shipyard. In embodiments, the digital twin is configured to provide for visualization of a hull of the ship as it moves through the real-world shipyard on a path having a water depth. In embodiments, the digital twin is configured to further provide for visualization of a proximity of a portion of the hull to a portion of a seafloor in the real-word shipyard. In embodiments, the digital twin displays suggestions from an artificial intelligence system that generates a portion of a maintenance schedule to maintain the water depth through the real-world shipyard based on at least a combination of a portion of actual activity in the real-world shipyard and simulations provided by the digital twin of the real-world shipyard. In embodiments, the digital twin is configured to provide visualizations of a plurality of inspection points in the real-world shipyard and maintenance histories associated with those inspection points. In embodiments, the digital twin is configured to provide for visualizations of the plurality of inspection points in the real-world shipyard and maintenance histories associated with those inspection points when within a geofenced area. In embodiments, the digital twin is configured to provide details of a ledger of activity associated with the visualization of the plurality of inspection points and maintenance histories associated with those inspection points within a geofenced of the real-world shipyard.

In embodiments, the digital twin is configured to provide for further visualization for a first user of one of a navigation course of a ship and an engine performance of the ship within a first geofenced area of the real-world shipyard and for further visualization for a second user of one of the navigation course of the ship and the engine performance of the ship within a second different geofenced area in the real-world shipyard and where transit between the first and second geofenced areas motivates a handoff of the ship between the first user and the second user as depicted by the digital twin representing the real-world shipyard including the ship.

In embodiments, the methods, systems and apparatuses include an information technology system having a set of intelligent systems for automatically populating a digital twin of a maritime value chain network entity based on data collected by a value chain network management platform.

In embodiments, the maritime value chain network entity is associated with a real-world shipyard. In embodiments, the digital twin is configured to represent the real-world shipyard. In embodiments, the maritime value chain network entity is associated with a real-world maritime port. In embodiments, the digital twin is configured to represent the real-world maritime port. In embodiments, the maritime value chain network entity is associated with a container ship. In embodiments, the digital twin is configured to represent the container ship.

In embodiments, the maritime value chain network entity is associated with a barge. In embodiments, the digital twin is configured to represent the barge. In embodiments, the maritime value chain network entity is associated with port infrastructure. In embodiments, the digital twin is configured to represent one or more components of the port infrastructure. In embodiments, the maritime value chain network entity is associated with an event investigation. In embodiments, the digital twin is configured to at least partially represent the maritime value chain network entity as it interacted during a timeline associated with the event investigation.

In embodiments, the maritime value chain network entity is associated with a legal proceeding. In embodiments, the digital twin is configured to at least partially represent the maritime value chain network entity as it interacted during a timeline associated with the legal proceeding.

In embodiments, the data collected by a value chain network management platform relates to a casualty report. In embodiments, the digital twin of the maritime value chain network entity is configured to simulate possibilities of a loss relevant to the casualty report based on the data collected by a value chain network management platform.

In embodiments, the maritime value chain network entity is a port infrastructure facility. In embodiments, the data collected by a value chain network management platform facilitates identifying theft or misuse of the port infrastructure facility by correlating data between a set of data collectors for one or more physical items in the port infrastructure facility and the digital twin detailing the one or more physical items of the port infrastructure facility for the at least one of the port infrastructure facility and the set of operators.

In embodiments, the maritime value chain network entity is a container ship that is moored to port infrastructure installed on or adjacent to land. In embodiments, data collected by a value chain network management platform is based on at least a container ship having a forward speed relative to water and weather conditions and parameters associated with energy consumption of propulsion units on the container ship. The information technology system also has an asset management application associated with the value chain network management platform and one or more maritime facilities connected to a container ship. In embodiments, the asset management application is associated with one or more ships connected to barges. In embodiments, the maritime value chain network entity is one or more ships. In embodiments, the digital twin provides for visualization of a navigation course of one or more of the ships.

In embodiments, the maritime value chain network entity is one or more ships. In embodiments, the digital twin provides for visualization of an engine performance of one or more of the ships. In embodiments, the maritime value chain network entity is one or more ships. In embodiments, the digital twin provides for visualization of a hull integrity of one or more of the ships. In embodiments, the digital twin provides for visualization of a plurality of inspection points on the maritime value chain network entity and maintenance histories associated with those inspection points. In embodiments, the digital twin further provides for the visualization of the plurality of inspection points on the maritime value chain network entity within a geofenced area and maintenance histories associated with those inspection points. In embodiments, the digital twin further provides for details of a ledger of activity associated with the visualization of the plurality of inspection points on the maritime value chain network entity within a geofenced area and maintenance histories associated with those inspection points.

A more complete understanding of the disclosure will be appreciated from the description and accompanying drawings and the claims, which follow.

Referring to FIG. 6, the value chain network management platform 604 orchestrates a variety of factors involved in planning, monitoring, controlling, and optimizing various entities and activities involved in the value chain network 668 as it is applied to maritime assets, activities, logistics, and planning including supply and production factors, demand factors, logistics and distribution factors, and the like. The management platform 604 can facilitate the monitoring and managing of supply factors and demand factors, the sharing of status information about and between various entities as demand factors are understood and accounted for, as orders are generated and fulfilled, and as products are created and moved through a supply chain. Referring to FIG. 7, the management platform 604 may include a set of value chain network entities 652 including various delivery systems 632 that can include and connect to maritime facilities 622. The maritime facilities 622 can include port infrastructure facilities 660, floating assets 620, and shipyards 638, and the like. In embodiments, the value chain network management platform 604 monitors, controls, and otherwise enables management (and in some cases autonomous or semi-autonomous behavior) of a wide range of value chain network 668 processes, workflows, activities, events and applications 630 applicable in the maritime environment.

Referring to FIGS. 6 and 11, the management platform 604 deployed in the maritime environment may include a set of data handling layers 624 each of which is configured to provide a set of capabilities that facilitate development and deployment of intelligence, such as for facilitating automation, machine learning, applications of artificial intelligence, intelligent transactions, state management, event management, process management, and many others, for a wide variety of value chain network applications and end uses in the maritime environment. In embodiments, the data handling layers 624 are configured in a topology that facilitates shared data collection and distribution across multiple applications and uses within the management platform 604 by the value chain monitoring systems layer 614. The value chain monitoring systems layer 614 may include, integrate with, and/or cooperate with various data collection and management systems 640, referred to for convenience in some cases as data collection systems 640, for collecting and organizing data collected from or about value chain entities 652, as well as data collected from or about the various data layers 624 or services or components thereof.

In embodiments, the data handling layers 624 are configured in a topology that facilitates shared or common data storage across multiple applications and uses of the platform 604 by the value chain network-oriented data storage systems layer 624, referred to herein for convenience in some cases simply as the data storage layer 624 or storage layer 624. For example, various data collected about the value chain entities 652, as well as data produced by the other data handling layers 624, may be stored in the data storage layer 624, such that any of the services, applications, programs, or the like of the various data handling layers 624 can access a common data source, which may comprise a single logical data source that is distributed across disparate physical and/or virtual storage locations. This may facilitate a dramatic reduction in the amount of data storage required to handle the enormous amount of data produced by or about value chain network entities 652 as applications 630 and uses of value chain networks grow and proliferate. For example, a supply chain or inventory management application in the value chain management platform layer 604, such as one for ordering replacement parts for a machine or item of equipment, may access the same data set about what parts have been replaced for a set of machines as a predictive maintenance application that is used to predict whether a component of a ship, or facility of a port is likely to require replacement parts. Similarly, prediction may be used with respect to resupply of items.

Referring to FIGS. 6 and 12, the value chain network-oriented data storage systems layer 624 may include, without limitation, physical storage systems, virtual storage systems, local storage systems 1190, distributed storage systems, databases, memory, network-based storage, network-attached storage systems. In embodiments, the storage layer 624 may store data in one or more knowledge graphs in the graph database architectures 1124, such as a directed acyclic graph, a data map, a data hierarchy, a data cluster including links and nodes, a self-organizing map, or the like. In embodiments, the data storage layer 624 may store data in a digital thread, ledger, distributed ledger or the like, such as for maintaining a serial or other records of an entity 652 over time, including any of the entities described herein. In embodiments, the storage layer 624 may include one or more blockchains 1180, such as ones that store identity data, transaction data, historical interaction data, and the like, such as with access control that may be role-based or may be based on credentials associated with a value chain entity 652, a service, or one or more applications 630. Data stored by the data storage systems 624 may include accounting and other financial data 730, access data 734, asset and facility data 1032, asset tag data 1178, worker data 1032, event data 1034, risk management data 732, pricing data 738, safety data 664 and the like.

Figure 63:
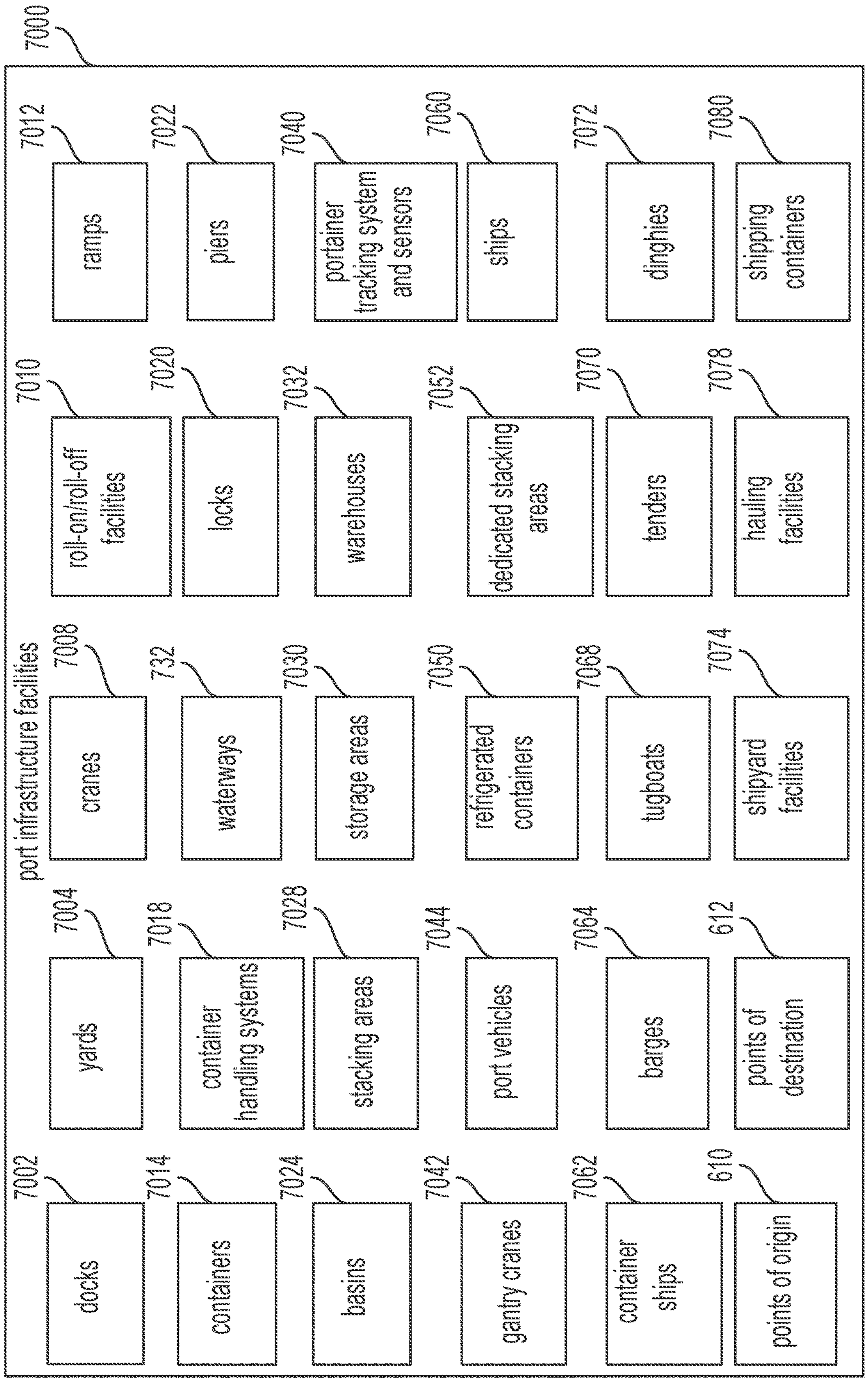
FIG. 63 is a diagrammatic view of maritime assets associated with a value chain network management platform including components of a port infrastructure in accordance with the present disclosure.

Referring to FIG. 8, the value chain network management platform 604 includes one or more sets of value chain entities 652 that may be subject to management by the management platform 604, may integrate with or into the management platform 604, and/or may supply inputs to and/or take outputs from the management platform 604, such as ones involved in or for a wide range of value chain activities. These value chain entities 652 may include any of the wide variety of assets, systems, devices, machines, components, equipment, facilities, and individuals that can support a wide range of operating facilities 712 including maritime facilities 622. Referring to FIG. 63, the maritime facilities can include port infrastructure facilities 1034. In embodiments, the port infrastructure facilities 1034 can include docks 7002, yards 7004, cranes 7008, roll-on/roll-off facilities 7010, ramps 7012, containers 7014, container handling systems 7018, waterways 732, and locks 7020, as applicable. In embodiments, the docks 7002 and their adjacent areas may include piers 7022, basins 7024, stacking areas 7028, storage areas 7030, and warehouses 7032. In embodiments, the container handling systems 7018 can include portainer tracking system and sensors 7040, such as for monitoring, reporting on, or managing one or more portainers or other systems for moving shipping containers, such as cranes (e.g., Gottwald cranes, gantry cranes, and others), straddle carriers, multitrailers, reach stackers, and the like. In embodiments, the port infrastructure facilities 1034 can further include gantry cranes 7042 and the port vehicles 7044 that can be used to move containers 7014, such as straddle carriers. In embodiments, the port infrastructure facilities 1034 also include refrigerated containers 7050 with dedicated stacking areas 7052 and cooling infrastructure to maintain the controlled environments in the refrigerated containers 7050.

The port infrastructure facilities 1034 further include shipyard facilities 638 and floating assets 620. The floating assets 620 can include ships 7060 and boats, container ships 7062, barges 7064, tugboats 7068, 7070, and dinghies 7072, as well as partially floating assets, such as submarines, underwater drones, and the like. By way of these examples, the floating assets 620 can operate among facilities and other items at points of origin 610 and/or points of destination 628. The shipyard facilities 638 can include the hauling facilities 710 such as many of the floating assets 620 as well as land-based vehicles and other delivery systems 632 used for conveying goods, such as trucks, trains, and the like Referring to FIGS. 63, orchestration of a set of deeply interconnected value chain network entities 652 by the management platform 604 can include providing interconnectivity for the value chain network entities 652 using local network connections, a peer-to-peer connections, connections through one or more mobile networks, and connections via a cloud network facility, satellite uplinks, microwave communications or other connections. The management platform 604 may manage the connections, configure or provision resources to enable connectivity, and/or manage applications 630 that take advantage of the connections knowing that are many maritime environments where connectivity may be poor or non-existent relative to when the floating assets 620 are closer to port or other land-based communication systems. In many examples, a port infrastructure facility 660, such as a yard for holding shipping containers 7080, may inform a fleet of floating assets 620 via connections to the floating assets 620 that the port is near capacity. With this knowledge, the floating assets 620 movement can be varied to extend times including reducing approach speeds to delay arrival, direction to other ports, and the like. In further examples, the news of the port reaching capacity can result in starting a negotiation process with the floating assets 620 looking to arrive at port. In embodiments, the negotiation process with the floating assets 620 can include an automated negotiation based on a set of rules and governed by a smart contract for the remaining capacity and enabling some floating assets 620 to be redirected to alternative ports or holding facilities.

Figure 64:
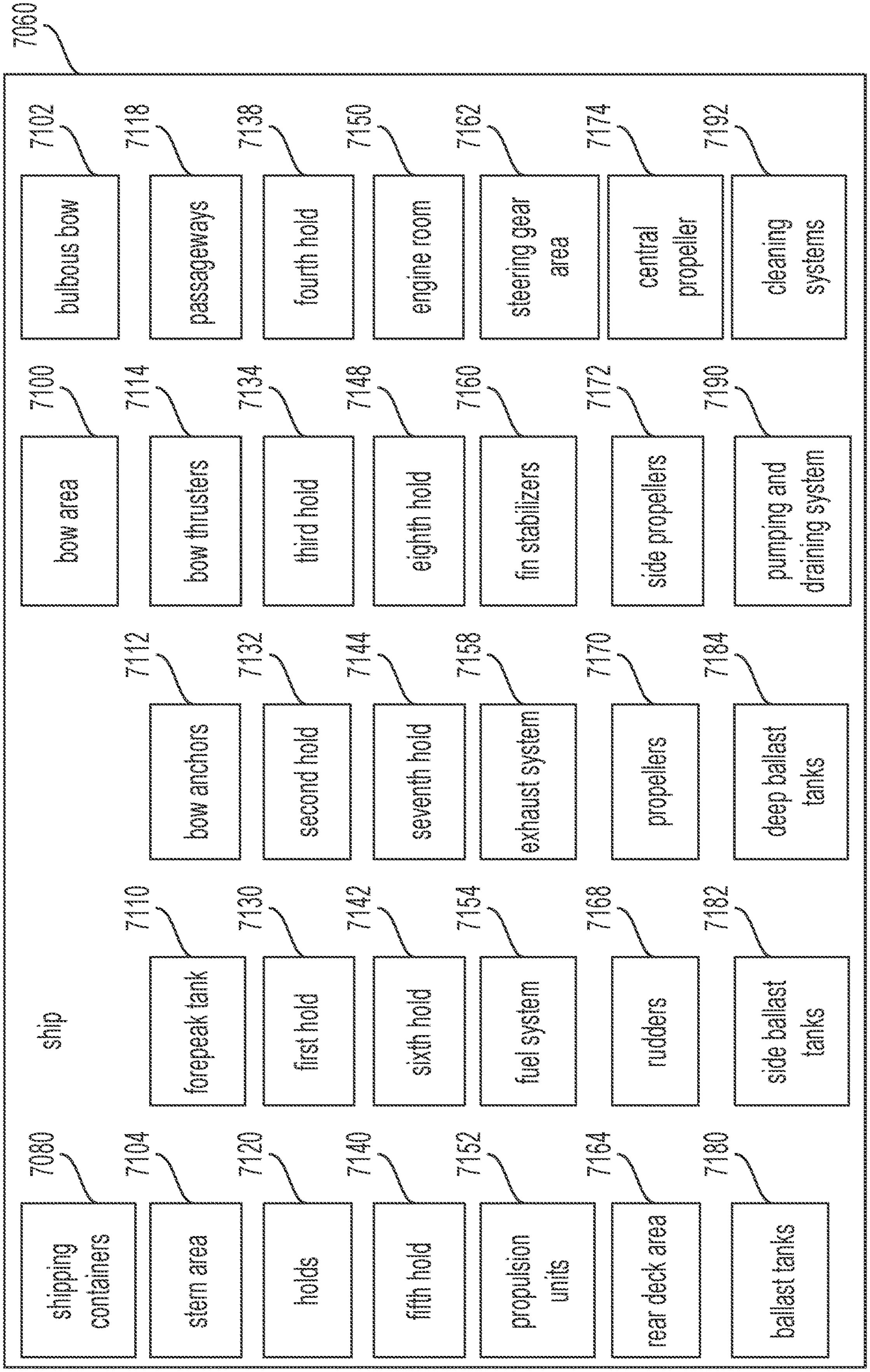
FIGS. 64 and 65 are diagrammatic views of maritime assets associated with a value chain network management platform including components of a ship in accordance with the present disclosure.
Figure 65:
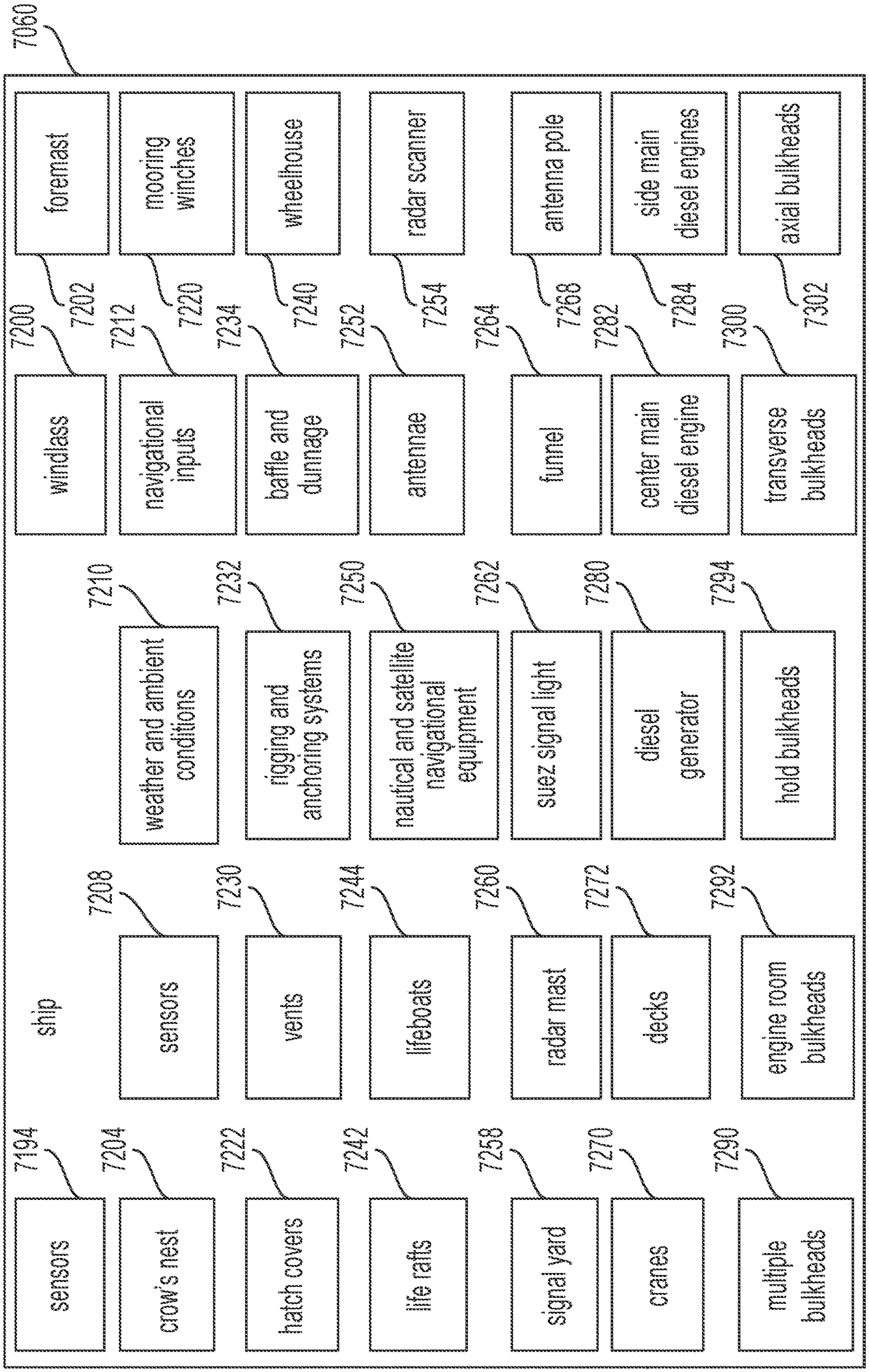

In embodiments, the maritime facilities 622 can include floating assets 620 including many different ships 7060. Referring to FIGS. 64 and 65, the ship 7060 can be one or more container ships 7062 that can haul many shipping containers 7080. In other examples, the ship 7060 can be one or more container ships 7062 that can haul raw materials, processed goods in bulk, gaseous cargo and many other forms of cargo not otherwise transported in shipping containers 7080. In many examples, the ship 7060 can include a bow area 7100. The bow area 7100 can include a bulbous bow 7102. In some examples, the bulbous bow 7102 can be configured in-situ in response to control from the management platform 604. Inboard from the bow area 7100 and traveling toward the stern area 7104 of the ship 7060, the ship 7060 can include a forepeak tank 7110. In this same area, the ship 7060 can include one or more bow anchors 7112 and bow thrusters 7114. Various passageways 7118 connect these areas in the bow area 7100. Depending on the configuration of the ship 7060, the hold 7120 can be configured and re-configured to accommodate various products such as product 650, raw materials, material in process, and combinations thereof. In some examples, the ship 7060 can include multiple holds 7120. In examples, the container ship 7062 can be configured with eight holds: container hold 7130, 7132, 7134, 7138, 7140, 7142, 7144, and 7148. Toward the stern area 7104, the ship 7060 includes an engine room 7150 including one or more propulsion units 7152. Each of the one or more propulsion units 7152 is fed by a fuel system 7154 and its emissions are controlled by an exhaust system 7158. In various locations on the ship 7060, one or more fin stabilizers 7160 may be deployed. In the stern area 7104, the ship 7060 includes a steering gear area 7160 below a rear deck area 7162. One or more rudders 7164 can extend from the steering gear area 7160.

One or more propellers 7170 can extend from the stern area 7104 with a rotating power connection to the propulsion units. In embodiments, one or more propellers 7170 can extend from the ship 7060 with an electrical connection to the propulsion units but no physical rotating power connection. In embodiments, one or more propellers 7170 can extend from the ship 7060 with a hydraulic connection to the propulsion units but no physical rotating power connection. In further examples, steam or other working fluids may be employed to drive the propulsion of the ship 7060. In further examples, mechanical rotating power, electrical drive, hydraulic drive, steam and various combinations thereof can be used for propulsion. In various examples, the one or more propellers 7170 can include side propellers 7172 and a central propeller 7174. In other examples, two propellers 7170 can be deployed. In embodiments, the propellers 7170 can be fixed such that the plane in which the propeller rotates is fixed relative to the ship 7060. By way of these examples, the propellers 7170 can be fixed and can be driven by mechanical linkage to propulsion units of the ship 7060. In other examples, the propellers 7170 can be fixed and can be driven by electrical motors adjacent each of the propellers 7170. In embodiments, the position of the propellers 7170 can be variable such that the plane in which the propeller rotates is movable relative to the ship 7060. By way of these examples, the propellers 7170 can be driven by electrical motors adjacent to each of the propellers 7170. In one or more locations on the ship 7060, the propellers 7170 can be deployed in pods that can include an independently controlled and movable electrical drivetrain and propeller so that the entire pod can be moved into various positions to facilitate forward propulsion, steering, maneuvering, docking, evasive maneuvers, and the like.

In further examples, the ship 7060 is configured with one or more ballast tanks 7180. In various examples, the ship 7060 can include side ballast tanks 7182 and deep ballast tanks 7184. The ballast tanks 7180 can each include pumping and draining systems 7190, cleaning systems 7192, sensors 7194 to determine characteristics of the ballast water such as salinity, foreign particles, organic material, garbage, restricted content relative to geofenced areas, regulated zones, ad-hoc demarcated areas, and the like. The sensors 7194 can also determine tank characteristics including wear from fatigue, corrosion, physical damage, or the like. In the bow area 7100, the ship 7060 can include a windlass 7200, a foremast 7202, and a crow's-nest 7204 on which various sensors 7208 can be located to observe characteristics of the ship 7060, the weather and ambient conditions 7210, and navigational inputs 7212. In various locations on the ship 7060, one of more mooring winches 7220 can be deployed to assist in docking, in connection to suitable mooring connections points, connection other vessels in transit such as tenders, and the like. In various locations on the ship 7060, one or more hatch covers 7222 can be deployed to permit access to various areas and passageways on the ship 7060.

In further examples, the ship 7060 is configured as a container ship 7062 that can be configured with eight holds: container hold 7130, 7132, 7134, 7138, 7140, 7142, 7144, and 7148. In further examples, the ship 7060 is configured as a container ship 7062 with various numbers of holds 7120. In further examples, the ship 7060 is configured as a container ship 7062 with in-situ configurable holds. In further examples, the ship 7060 is configured as a container ship 7062 with various numbers of holds some of which are in-situ configurable. In embodiments, the holds 7120 can include one or more vents 7240 deployed to facilitate an atmosphere in the hold suitable for transit and for the care of the cargo. In embodiments, the holds 7120 can include one or more rigging and anchoring systems 7242 to secure one or more loads within holds 7120 configured or reconfigured for such cargo. In embodiments, the holds 7120 can include one or more movable baffle and dunnage 7244 to secure one or more loads within holds 7120 configured or reconfigured for such cargo.

In further examples, the ship 7060 includes a wheelhouse 7250 and one or more life rafts 7252 and lifeboats 7254. In further examples, the ship 7060 includes nautical and satellite navigational equipment 7260. By way of these examples, the ship can include direction finder antennae 7262, radar scanner 7264, a signal yard 7268. In these examples, the ship 7060 includes a radar mast 7270 and a Suez signal light 7272, a funnel 7274 and an antenna pole 7278.

In further examples, the ship 7060 includes one or more cranes 7280 that can be used to move things in and about the decks 7282 and in and out of the holds 7120 of the ship 7060. In these examples, the ship 7060 can contain or carry on top many containers of various sizes including twenty-foot and forty-foot containers. In these examples, the ship 7060 can contain or carry on top many containers of various sizes including twenty-foot dry freight containers, twenty-foot open-top containers, twenty-foot collapsible flat rack containers, twenty-foot refrigerated containers, and the like. In these examples, the ship 7060 can contain or carry on top many containers of various sizes including forty-foot high cube containers, forty-foot open-top containers, forty-foot collapsible flat rack containers, forty-foot high cube refrigerated containers, and the like. In these examples, the ship 7060 can contain or carry on top many containers of various sizes including forty-five-foot high cube dry containers, and the like.

In embodiments, the ship 7060 can contain engine units that include a diesel generator 7280 that can supply electrical power throughout the ship 7060. The ship 7060 can also contain engine units that include a center main diesel engine 7282 and one or more side main diesel engines 7284. In embodiments, the ship 7060 can contain engine units that are configured to combust natural gas, propane, gasoline, methanol, and the like. In embodiments, the ship 7060 can contain engine units that are configured to be powered by nuclear units that can be used to heat water to steam-driven electrical systems. In embodiments, the ship 7060 can contain engine units that are configured to be powered by nuclear units and internal combustion engines in a hybrid arrangement. In embodiments, the ship 7060 can contain engine units that are configured to be powered by nuclear units and internal combustion engines, and other renewables in a hybrid arrangement such as solar and wind where each of these can feed an electrical and battery system to power propulsion and ship operations.

In embodiments, the ship 7060 can contain multiple bulkheads 7290. By way of these examples, the engine room can be framed in engine room bulkheads 7292 to contain the various powerplant units. In embodiments, the cargo and hold region of the ship 7060 can contain hold bulkheads 7294 to contain the various powerplant units. In embodiments, the ship 7060 can contain structural transverse bulkheads 7300 and axial bulkheads 7302.

Figure 66:
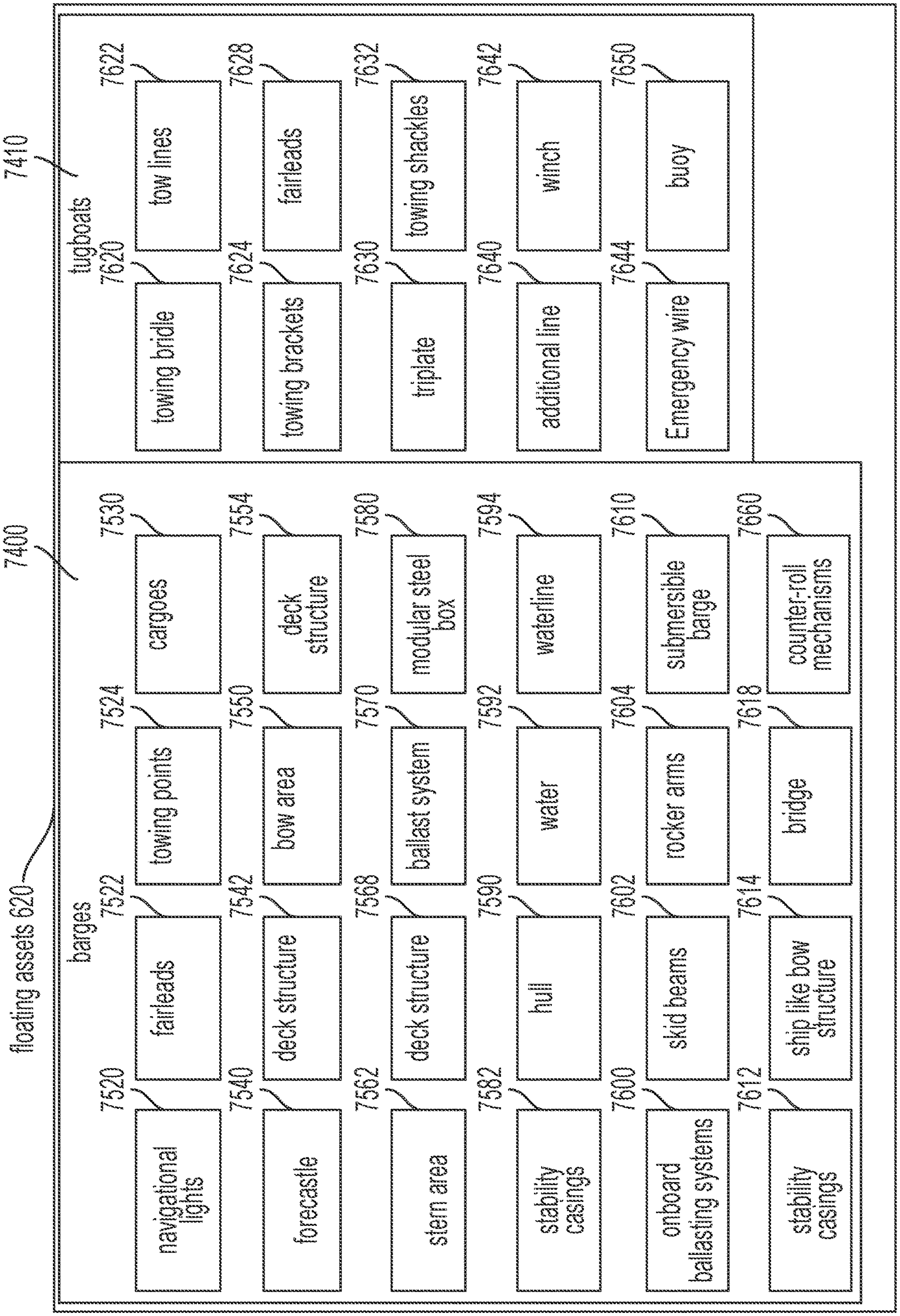
FIG. 66 is a diagrammatic view of maritime assets associated with a value chain network management platform including components of a barge in accordance with the present disclosure.
Figure 67:
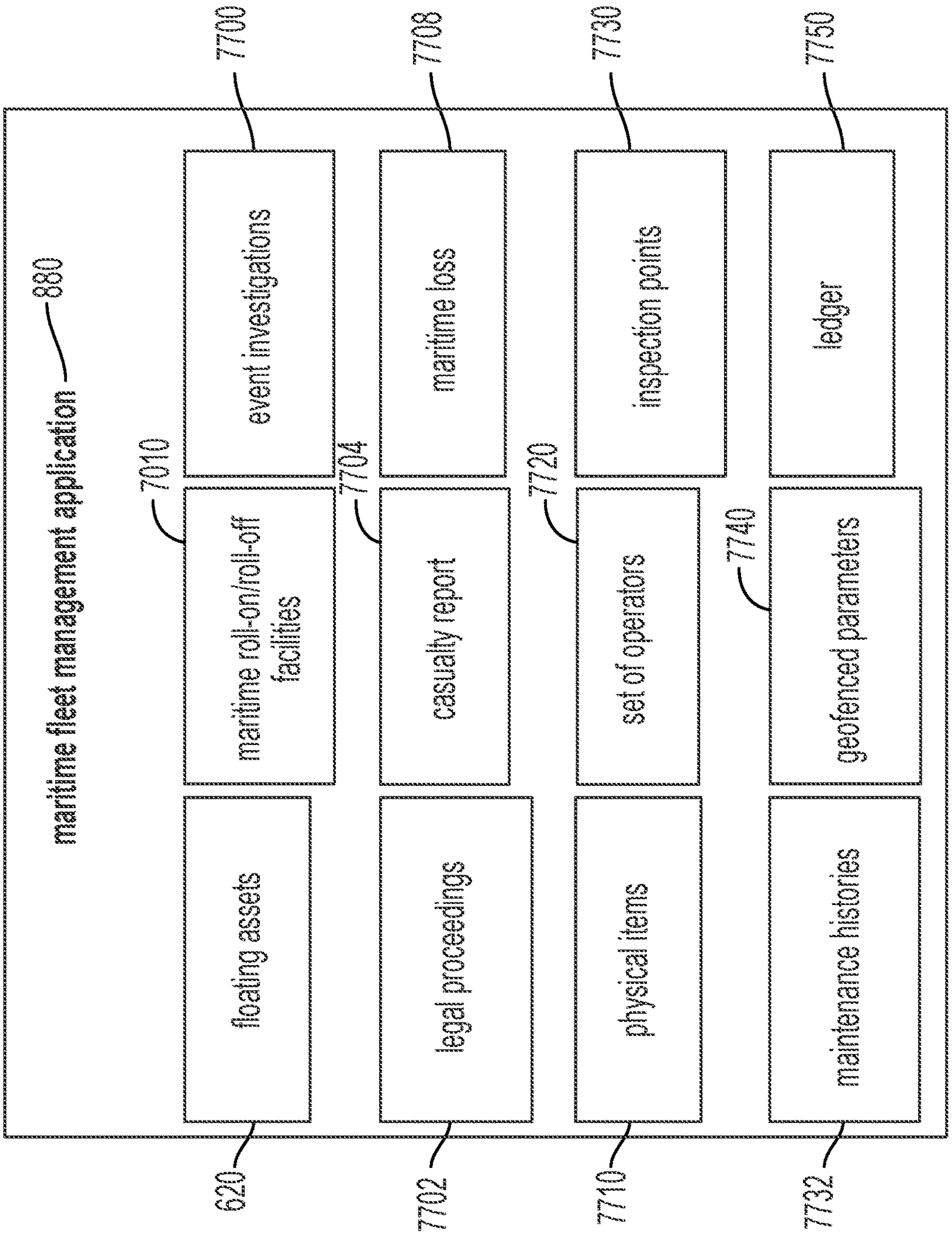
FIG. 67 is a diagrammatic view of maritime assets associated with a value chain network management platform including those involved in maritime events, legal proceedings and making use of geofenced parameters in accordance with the present disclosure.

In embodiments, the maritime facilities 622 can include floating assets 620 including many different barges 7500. Referring to FIG. 66, one or more of the barges 7500 can be transport barges, cargo barges, submersible barges, and the like that can in size and capacity. In many examples, barges are available in many varieties of towed barges and self-propelled ships including submersible heavy lift vessels. In many examples, the barges 7500 can be towed or pushed by tug boats 7510 to transport from one location to another. In many examples, the barges 7500 can be flat top and bottom and can be equipped with navigational lights 7520, fairleads 7522 and towing points 7524.

In some examples, the barges 7500 can be designed to be submerged so as to pick up cargoes 7530 such as floating cargoes. By way of these examples, the barges 7500 can be equipped with a forecastle 7540 and a deck structure 7542 at a bow area 7550 opposite a deck structure 7544 at a stern area 7552. There can be additional deck structure 7548 between the bow area 7550 and the stern area 7552 that can be configured and re-configured to hold the cargoes 7530. In these examples, the barges 7500 can be equipped with their own ballast system 7560. In embodiments, the barges 7500 can include a modular steel box 7570 and stability casings 7572 that may be added at the stern area 7552 to some predetermined degree to effectively provide additional portions of a hull 7580 in the water 7582 that can be shown to enhance the stability of the barge 7500 and its cargoes 7530 as the deck structures 7542, 7544, 7548 go through a waterline 7584. In these examples, the modular steel box 7570 and stability casings 7572 can be removable and can be stowed away on one of the deck structures 7542, 7544, 7548 of the barge 7500 or stored onshore when not required. In doing so, the barge 7500 can be relatively more efficient when lighter loads warrant the relatively smaller hull structure.

In many examples, barges 7500 can be classified not only by their length and width but also how they are used, launched and the like. In some examples, one or more of the barges 7500 can be less than 200 feet in length and 50 feet wide. By way of these examples, the barge 7500 can include small pontoons can be used for carrying small structures in sheltered inshore waters. In some examples, one or more of the barges 7500 can be about 250 feet by 70 feet and can include small pontoons to support the barge 7500 that is otherwise configured without an onboard ballast system. By way of these examples, barges in these configurations can be used to transport small offshore loads, do work in and near port infrastructures, perform maintenance in a shipyard, etc. In some examples, one or more of the barges 7500 can be about 300 feet and can be 90 or 100 feet wide. By way of these examples, one or more barges in these configurations can be used as standard cargo barges but may not be equipped with an onboard ballast system. In some examples, one or more barges 7500 can be about 400 feet by 100 feet and these barges can be equipped with an onboard ballast system.

In some examples, one or more of the barges 7500 can be about 450 feet and longer and can be deployed with an onboard ballasting systems 7590. By way of these examples, one or more of the barges 7500 can also be deployed with skid beams 7592. One or more of the barges 7500 can also be deployed with rocker arms 7594 at the stern area 7552 to enable, for example, the launching of jackets or other loads that may be too heavy to lift. In examples, the Heerema H851 brand barge is nominally 850 feet long by 200 feet wide and can be a suitable example of one of the largest commercially available barges.

In embodiments, one or more of the barges 7500 can also be configured as a submersible barge 7600, which can be a towed barge that can be equipped with stability casings 7602 in the stern area 7552. In examples, the submersible barge 7600 can be configured with a ship-like bow structure 7604. In these examples, the ship like bow structure 7604 can be configured with a bridge 7608 sufficiently tall to enable the submerging of the barge above at least a portion of its deck structures. In examples, the Boa brand barges have nominal dimensions of 400 feet by 100 feet, the AMT brand barges have nominal dimensions 470 feet by 120 feet and Hyundai brand barges having nominal dimensions 460 feet by 120 feet can be suitable examples of commercially available submersible barges. By way of these examples, these barges can submerge up to 18 to 24 feet above their decks.

It will be appreciated in light of the disclosure that barges are rated and paired with jobs in terms of deadweight which provides a broad indication of the barges' carrying capacity. The barges, however, have additional requirements such as their global strength, local deck and frame strengths and height of the cargo's center of gravity. With regard to center of gravity, one exemplary barge may be able to transport a 20,000-ton structure with its center of gravity very close to the deck sufficiently tied and supported on the deck. The same exemplary barge may only be able to transport a half of the weight if the cargo has a relatively high center of gravity. With that in mind, many attributes of one or more of the barges are the placement, orientation, center of gravity and weight of the cargoes on their decks.

In embodiments, one of the barges can be towed by one of the ships, tugboats 7510, or the like with a towing bridle 7610. In many examples, two lines 7612 can run from tow brackets 7614 through fairleads 7618 on one of the barges and connect to a triplate 7620 on the barge through towing shackles 7622. By way of this example, a third line 7630 can connect the triplate 7620 to a winch 7640 on one of the tugboats 7510. In further examples, an emergency wire 7642 can be installed along the length of the barge. The emergency wire 7642 can be attached to a connector 7644 that can terminate with a buoy 7650. The buoy 7650 can trail behind the barge 7650 during tow and can form part of the towing arrangement.

In some examples, roll accelerations of the barge can be directly proportional to the transverse stiffness of the barge, which can be measured by its metacentric height. In some arrangements, a barge can have a large metacentric height and as a result, roll accelerations can be severe. In further examples with relatively tall cargo, the metacentric height can be low resulting in the period and amplitude of roll and the static force resulting from the load being greater but the dynamic component may be less. In many examples, attributes of the barge 7500 include positioning of cargoes 7530 on its deck structures and its effective metacentric height. In further examples, counter-roll mechanisms 7660 can be installed on the barge 7500. By way of these examples, the adaptive intelligence layer 614 can update the program of the counter-roll mechanisms 7660 and can be shown to increase its efficacy to changing cargo load and water and weather conditions. In embodiments, the adaptive intelligence layer 614 can update the speed and angles of the of the counter-roll mechanisms 7660 and can be shown to increase its efficacy to changing cargo load and water and weather conditions.

In embodiments, the management platform 604 may include a set of value chain network entities 652 including various delivery systems 632 that can include and connect to the maritime facilities 622. The maritime facilities 622 can include port infrastructure facilities 660, floating assets 620, and shipyards 638, and the like. In embodiments, the value chain network management platform 604 monitors, controls, and otherwise enables management (and in some cases autonomous or semi-autonomous behavior) of a wide range of value chain network 668 processes, workflows, activities, events and applications 630 applicable in the maritime environment.

The maritime facilities 622 can include one or more ships 7060 of various sizes to service the facilities. The maritime facilities 622 can include one or more fixed or moored navigation aids within the water or on land to facilitate the movement ships of various sizes and vehicles on land. In embodiments, the maritime facilities 622 can be configured as a seaport in that it can be configured to accept deep-draft ships with a draft of 20 feet or more. In embodiments, some of the larger maritime facilities 622 can include areas outside the boundaries of the seaports, shipyard, maritime ports, and the like that are related to port operations or to an intermodal connection to the seaports, shipyard, maritime ports, and the like.

In embodiments, the management platform 604 can manage port gate-in and gate-out improvements to the logistics of the flow of assets and cargoes around the maritime facilities 622. In embodiments, the management platform 604 can manage road improvements both within and connecting to the maritime facilities 622. In embodiments, the management platform 604 can manage rail improvements both within and connecting to the maritime facilities 622. In embodiments, the management platform 604 can manage berth improvements in the maritime facilities 622 including to docks, wharves, piers and the like. In embodiments, the management platform 604 can manage berth improvements including dredging at the berths, approach and departure areas adjacent to the berth, and in areas around maritime facilities. In embodiments, the management platform 604 can manage cargo moving equipment used on land. In embodiments, the management platform 604 can manage facilities necessary to improve cargo transport including silos, elevators, conveyors, container terminals, roll-on/roll-off facilities including parking garages necessary for inter-modal freight transfer, warehouses including refrigerated facilities, bunkering facilities for oil or gas products, lay-down areas, transit sheds, and the like. In embodiments, the management platform 604 can manage utilities necessary for standard operations including lighting, stormwater, and the like that can be incidental to a larger set of maritime facilities. In embodiments, the management platform 604 can manage port-related intelligent transportation system hardware and software including all technologies used to promote efficient port movements including routing and communications for vessels, trucks, and rail cargo movements as well as flow-through processing for import/export requirements, storage and tracking, and asset/equipment management. In embodiments, the management platform 604 can manage phytosanitary treatment facilities to support phytosanitary treatment requirements. In embodiments, the management platform 604 can manage, configure and re-configure fully automated cargo-handling equipment.

In embodiments, the adaptive intelligent systems layer 614 may include a set of systems, components, services and other capabilities that collectively facilitate the coordinated development and deployment of intelligent systems, such as ones that can enhance one or more of the applications 630 at the application platform layer 604; ones that can improve the performance of one or more of the components, or the overall performance (e.g., speed/latency, reliability, quality of service, cost reduction, or other factors) of the connectivity facilities 642; ones that can improve other capabilities within the adaptive intelligent systems layer 614; ones that improve the performance (e.g., speed/latency, energy utilization, storage capacity, storage efficiency, reliability, security, or the like) of one or more of the components, or the overall performance, of the value chain network-oriented data storage systems 624; ones that optimize control, automation, or one or more performance characteristics of one or more value chain network entities 652; or ones that generally improve any of the process and application outputs and outcomes 1040 pursued by use of the platform 604.

These adaptive intelligent systems 614 may be deployed in and among the maritime facilities 622 and floating assets 620. These adaptive intelligent systems 614 may include a robotic process automation system 1442, a set of protocol adaptors 1110, a packet acceleration system 1410, an edge intelligence system 1430 (which may be a self-adaptive system), an adaptive networking system 1430, a set of state and event managers 1450, a set of opportunity miners 1460, a set of artificial intelligence systems 1160, a set of digital twin systems 1700, a set of entity interaction management systems 1902 (such as for setting up, provisioning, configuring and otherwise managing sets of interactions between and among sets of value chain network entities 652 in the value chain network 668), and other systems.

In embodiments, a set of digital twin systems 1700 may be deployed for each of the maritime facilities 622 and each of the floating assets 620. Referring to FIG. 6, the connected value chain network 668 benefits from digital twin systems deployed throughout the value chain network management platform 604 to facilitate the management, visualization, and modeling of the orchestration of a variety of factors involved in planning, monitoring, controlling, and optimizing various entities and activities involved in the value chain network 668, such as supply and production factors, demand factors, logistics and distribution factors, and the like. By virtue of the unified platform 604 for monitoring and managing supply factors and demand factors, digital twins for status information can be shared about and between various entities to facilitate modeling and analytics and to provide for visualization of changing demand factors becomes operational realities, as orders are generated and fulfilled, and as products are created and moved through a supply chain.

In embodiments, the value chain monitoring systems layer 614 and its data collection systems 640 may include a wide range of systems for the collection of data from the maritime facilities 622 and the floating assets 620. This layer may include, without limitation, real time monitoring systems 1520 (such as onboard monitoring systems like event and status reporting systems on ships and other floating assets, on delivery vehicles, on trucks and other hauling assets, and in shipyards, ports, warehouses, distribution centers and other locations; on-board diagnostic (OBD) and telematics systems on floating assets, vehicles and equipment; systems providing diagnostic codes and events via an event bus, communication port, or other communication system; monitoring infrastructure (such as cameras, motion sensors, beacons, RFID systems, smart lighting systems, satellite connections, asset tracking systems, person tracking systems, and ambient sensing systems located in various environments where value chain activities and other events take place), as well as removable and replaceable monitoring systems on maritime assets and cargo or other assets contained therein or in transit thereon, such as portable and mobile data collectors, RFID and other tag readers, smart phones, tablets and other mobile devices that are capable of data collection and the like); software interaction observation systems 1500 that can be deployed into portable and onboard systems of the maritime facilities 622 and floating assets 620; visual monitoring systems 1930 such as using video and still imaging systems, LIDAR, IR and other systems that allow visualization of items, people, materials, components, machines, equipment, personnel, and the like to detail cargo in the hold of floating assets 620, to detail activity of personal and gear deployed at the maritime facilities 622 and on the floating assets 620; point of interaction systems 1530 (such as dashboards, user interfaces, and control systems for value chain entities); physical process observation systems 1510 (such as for tracking physical activities of operators, workers, customers, or the like, physical activities of individuals (such as shippers, delivery workers, packers, pickers, assembly personnel, customers, merchants, vendors, distributors and others), physical interactions of workers with other workers, interactions of workers with physical entities like machines and equipment, and interactions of physical entities with other physical entities, including, without limitation, by use of video and still image cameras, motion sensing systems (such as including optical sensors, LIDAR, IR and other sensor sets), robotic motion tracking systems (such as tracking movements of systems attached to a human or a physical entity) and many others; machine state monitoring systems 1940 (including onboard monitors and external monitors of conditions, states, operating parameters, or other measures of the condition of any value chain entity, such as a machine or component thereof, such as a machine, such as a client, a server, a cloud resource, a control system, a display screen, a sensor, a camera, a vehicle, a robot, or other machine); sensors and cameras 1950 and other IoT data collection systems 1172 (including onboard sensors, sensors or other data collectors (including click tracking sensors) in or about a value chain environment (such as, without limitation, a point of origin, a loading or unloading dock, a vehicle or floating asset used to convey goods, a container, a port, a distribution center, a storage facility, a warehouse, a delivery vehicle, and a point of destination), cameras for monitoring an entire environment, dedicated cameras for a particular machine, process, worker, or the like, wearable cameras, portable cameras, cameras disposed on mobile robots, cameras of portable devices like smart phones and tablets, and many others, including any of the many sensor types disclosed throughout this disclosure or in the documents incorporated herein by reference); indoor location monitoring systems 1532 (including cameras, IR systems, motion-detection systems, beacons, RFID readers, smart lighting systems, triangulation systems, RF and other spectrum detection systems, time-of-flight systems, chemical noses and other chemical sensor sets, as well as other sensors); user feedback systems 1534 (including survey systems, touch pads, voice-based feedback systems, rating systems, expression monitoring systems, affect monitoring systems, gesture monitoring systems, and others); behavioral monitoring systems 1538 (such as for monitoring movements, shopping behavior, buying behavior, clicking behavior, behavior indicating fraud or deception, user interface interactions, product return behavior, behavior indicative of interest, attention, boredom or the like, mood-indicating behavior (such as fidgeting, staying still, moving closer, or changing posture) and many others); and any of a wide variety of Internet of Things (IoT) data collectors 1172, such as those described throughout this disclosure and in the documents incorporated by reference herein.

Referring to FIG. 26, a set of opportunity miners 1460 may be provided as part of the adaptive intelligence layer 614, which may be configured to seek and recommend opportunities to improve one or more of the elements of the platform 604, such as via addition of artificial intelligence 1160, automation (including robotic process automation 1402), or the like to one or more of the maritime facilities 622 and for each of floating assets 620 including their systems, sub-systems, components, applications with which the platform 100 interacts. In embodiments, the opportunity miners 1460 may be configured or used by developers of AI or RPA solutions to find opportunities for better solutions and to optimize existing solutions in a value chain network 668. In embodiments, the opportunity miners 1460 may include a set of systems that collect information within the management platform 604 and collect information within, about and for a set of maritime facilities 622 and for each of floating assets 620, where the collected information has the potential to help identify and prioritize opportunities for increased automation and/or intelligence about the value chain network 668, about applications 630, one or more of the maritime facilities 622 and the floating assets 620. For example, the opportunity miners 1460 may include systems that observe clusters of value chain network workers by time, by type, and by location (whether on the water or land), such as using cameras, wearables, or other sensors, such as to identify labor-intensive areas and processes in set of value chain network 668 environments. These may be presented, such as in a ranked or prioritized list, or in a visualization (such as a heat map showing dwell times of customers, workers or other individuals on a map of an environment or a heat map showing routes traveled by customers or workers within an environment) to show places with high labor activity. In embodiments, analytics 838 may be used to identify which environments or activities would most benefit from automation for purposes of improved delivery times, mitigation of congestion, and other performance improvements.

In embodiments, opportunity mining may include facilities for solicitation of appropriate training data sets that may be used to facilitate process automation. For example, certain kinds of inputs, if available, would provide very high value for automation, such as video data sets that capture very experienced and/or highly expert workers performing complex tasks. This information becomes even more valuable when collected in close proximity to other maritime facilities 622 and with deployed floating assets 620. Opportunity miners 1460 may search for such video data sets as described herein; however, in the absence of success (or to supplement available data), the management platform 604 may include systems by which a user at a maritime facility or deployed on a maritime asset may specify a desired type of data, such as software interaction data (such as of an expert working with a program to perform a particular task), video data (such as video showing a set of experts performing a certain kind of delivery process, unloading process, securing and logistics process, cleaning and maintenance process, a container movement process, or the like), and/or physical process observation data (such as video, sensor data, or the like). The resulting library of interactions captured in response to the specification may be captured as a data set in the data storage layer 624, such as for consumption by various applications 630, adaptive intelligence systems 614, and other processes and systems. In embodiments, the library may include videos that are specifically developed as instructional videos, such as to facilitate developing an automation map that can follow instructions in the video, such as providing a sequence of steps according to a procedure or protocol, breaking down the procedure or protocol into sub-steps that are candidates for automation, and the like. In embodiments, such videos may be processed by natural language processing, such as to automatically develop a sequence of labeled instructions that can be used by a developer to facilitate a map, a graph, or other models of a process that assists with development of automation for the process.

In embodiments, the value chain monitoring systems layer 614 and its data collection systems 640 may include an entity discovery system 1900 for discovering one or more value chain network entities 652, such as any of the entities described throughout this disclosure and especially those that can be loaded and offloaded as control passes from various maritime facilities 622 and floating assets 620. This may include components or sub-systems for searching for entities at maritime facilities 622 and floating assets 620 within the value chain network 668, such as by device identifier, by network location, by geolocation (such as by geofence), by indoor location (such as by proximity to known resources, such as IoT-enabled devices and infrastructure, Wifi routers, switches, or the like), by cellular location (such as by proximity to cellular towers), by maritime navigation aids and vessel identity beacons, by identity management systems (such as where an entity 652 is associated with another entity 652, such as an owner, operator, user, or enterprise by an identifier that is assigned by and/or managed by the platform 604), and the like. In these examples, an entity discovery system 1900 may interact with established maritime asset logistic systems used to track traffic and location. In these examples, an entity discovery system 1900 may interact with established maritime asset autopilot and auto-navigation systems obtaining information relevant to intended navigation destinations and from there, the error and magnitude of corrective action need to arrive at the navigation destination.

Referring to FIG. 22, the adaptive intelligence layer 614 may include a value chain network digital twin system 1700, which may include a set of components, processes, services, interfaces and other elements for development and deployment of digital twin capabilities for visualization of various value chain entities 652 in environments, and applications 630, as well as for coordinated intelligence (including artificial intelligence 1160, edge intelligence 1420, analytics and other capabilities) and other value-added services and capabilities that are enabled or facilitated with a digital twin 1700. In embodiments, a digital twin system 1700 may be deployed with each facility (or groups thereof) among the maritime facilities 622 and may be deployed for each of floating assets 620. In many instances, each floating asset 620 and physical assets in the maritime facilities 622 can be coordinated and managed with its digital twin supported by the digital twin system 1700. Without limitation, a digital twin system 1700 may be used for and/or applied to each of the processes that is managed, controlled, or mediated by each of the set of applications 630 of the platform application layer that may be deployed in various systems, networks, and infrastructures (or across groups thereof) of the floating assets 620 and in and among the maritime facilities 622.

In embodiments, the digital twin 1700 may take advantage of the presence of multiple applications 630 within the value chain management platform layer 604, such that a pair of applications may share data sources (such as in the data storage layer 624) and other inputs (such as from the monitoring layer 614) that are collected (to support fusion of collected signals and the like) with respect to value chain entities 652, as well sharing outputs, events, state information and outputs, which collectively may provide a much richer environment for enriching content in a digital twin 1700, including through use of artificial intelligence 1160 including any of the various expert systems, artificial intelligence systems, neural networks, supervised learning systems, machine learning systems, deep learning systems, and other systems described throughout this disclosure and in the documents incorporated by reference and through use of content collected by the monitoring layer 614 and data collection systems 640.

Referring to FIG. 23, any of the value chain network entities 652 can be depicted in a set of one or more digital twins 1700, such as by populating the digital twin 1700 with value chain network data object 1004, such as event data 1034, state data 1140, or other data with respect to value chain network entities 652, applications 630, or components or elements of the platform 604 as described throughout this disclosure.

Thus, the platform 604 may include, integrate, integrate with, manage, control, coordinate with, or otherwise handle any of a wide variety of digital twins 1700, such as distribution twins 1714 (such as representing distribution facilities, assets, objects, workers, or the like); warehousing twins 1712 (such as representing warehouse facilities, assets, objects, workers and the like); port infrastructure twins 1714 (such as representing a seaport, an airport, or other facility, as well as assets, objects, workers and the like); shipping facility twins 1720; operating facility twins 1172; customer twins 1730; worker twins 1740; wearable/portable device twins 1750; process twins 1760; machine twins 1770 (such as for various machines used to support a value chain network 668); product twins 1780; point of origin twins 1502; supplier twins 1630; supply factor twins 1650; maritime facility twins 1572; floating asset twins 1570; shipyard twins 1620; destination twins 1562; fulfillment twins 1600; delivery system twins 1610; demand factor twins 1640; retailer twins 1790; ecommerce and online site and operator twins 1800; waterway twins 1810; roadway twins 1820; railway twins 1830; air facility twins 1840 (such as twins of aircraft, runways, airports, hangars, warehouses, air travel routes, refueling facilities and other assets, objects, workers and the like used in connection with air transport of products 650); autonomous vehicle twins 1850; robotics twins 1860; drone twins 1870; and logistics factor twins 1880; among others.

Referring to FIG. 27, additional details of an embodiment of the platform 604 are provided, in particular relating to elements of the adaptive intelligence layer 614 that facilitate improved edge intelligence, including the adaptive edge compute management system 1400 and the edge intelligence system 1420. These elements provide a set of systems that adaptively manage "edge" computation, storage and processing, such as by varying storage locations for data and processing locations (e.g., optimized by AI) between on-device storage, local systems, peer-to-peer, in the network and in the cloud. These elements can enable facilitation of a dynamic definition by a user, such as a developer, operator, or host of the platform 102, of what constitutes the "edge" for purposes of a given application anywhere in the world and especially in regions of the oceans where connectivity can be constrained. For example, for environments where data connections are slow or unreliable (such as where a facility does not have good access to cellular networks (such as due to remoteness on the globe), shielding or interference (such as where density of network-using systems, thick metals hulls of container ships, thick metal container walls, underwater or underground location, or presence of large metal objects (such as vaults, hulls, containers, cranes, stacked raw materials, and the like,) interferes with networking performance), and/or congestion (such as where there are many devices seeking access to limited networking facilities), edge computing capabilities can be defined and deployed to operate on the local area network of an environment, in peer-to-peer networks of devices, or on computing capabilities of local value chain entities 652. Where strong data connections are available (such as where good backhaul facilities exist), edge computing capabilities can be disposed in the network, such as for caching frequently used data at locations that improve input/output performance, reduce latency, or the like. Thus, adaptive definition and specification of where edge computing operations are enabled, under control of a developer or operator, or optionally determined automatically among a fleet or deployed in a geographic region, such as by an expert system or automation system that may be based on detected network conditions for an environment. In embodiments, edge intelligence 1420 enables adaptation of edge computation (including where computation occurs within various available networking resources, how networking occurs (such as by protocol selection), where data storage occurs, and the like) that is multi-application aware, such as accounting for QoS, latency requirements, congestion, and cost as understood and prioritized based on awareness of the requirements, the prioritization, and the value of edge computation capabilities across more than one application.

In embodiments, the digital twin system 1700 may host floating asset twins 1570 that can be associated with one or more of the floating assets 620. By way of these examples, one or more of the floating asset twins 1570 can simulate how one or more of the floating assets 620 will perform without needing to test the one or more of the floating assets 620 in the real world. Further examples include visualization of all systems of the ship, its navigation course, and functional needs including various details all forms of information on a ship, from engine performance to hull integrity, available at a glance throughout the full lifetime of the vessel through its floating asset twins 1570.

In embodiments, use of the floating asset twins 1570 during operation can be shown to provide beneficial visualization of any and all important components of the one or more the floating assets 620. The use of the floating asset twins 1570 during operation can be shown to be beneficial to carry out analyses and improve the operation on the structural and functional components of the floating assets 620. In further examples, use of the floating asset twins 1570 during operation of the one or more of the floating assets 620 can be used to model in-situ hydrodynamic and aerodynamic changes to the structures and hull surfaces of the floating assets 620. In embodiments, the floating assets 620 can deploy systems to alter the configuration of the cross-sections of certain portions of the hull, alter the configuration of hydrodynamic control surfaces below the water line, alter the configuration of aerodynamic control surfaces above the waterline, extended additional buoyant members from the hull to improve hull stability during certain maneuvers, and the like. In these examples, artificial intelligence systems 1160 can study simulated hull configurations deployed on the floating asset twins 1570 to determine a schedule of hull configuration changes to improve fuel efficiency using known routes of travel and historical weather patterns.

In embodiments, use of the floating asset twins 1570 during operation can be shown to benefit operators as they can plan for more efficient inspections and maintenance of one or more floating assets 620. In embodiments, use of the port infrastructure twins 1714 during operation can be shown to benefit operators that can plan for more efficient inspections and maintenance of one or more physical assets in the maritime facilities 622. This can also lead to an extension of the physical assets' lifetimes, as preventive measures will be taken to avoid damages.

In embodiments, use of the floating asset twins 1570 during operation can be shown to provide operators with an ability to create visual models of the ship and its underlying systems, such as engine spaces and pumps, and continuously record its fuel consumption, distributed on sources of energy, such as engines, boilers and batteries. By way of these examples, operators can plan for more efficient operations, inspections and maintenance of one or more floating assets 620. In embodiments, use of the port infrastructure twins 1714 during operation can be shown to provide operators with ability to create visual models of the maritime assets at a port, on land, moored in location and placed as navigation aids including their underlying systems, such as systems powerplants, and continuously record their energy consumption, distributed on sources of energy, such as engines, boilers and batteries. By way of these examples, operators can plan for more efficient operations, inspections and maintenance of one or more physical assets in the maritime facilities 622. In embodiments, the digital twin systems can include simulation and analytical models that can be developed to acquire the optimum fuel consumption for a particular voyage with a specific cargo, by including external factors such as wind, current and weather conditions. In embodiments, the digital twin systems can include simulation and analytical models that can be developed to acquire the optimum energy consumption for a particular port activity such as unloading with a specific cargo, by including external factors such as weather conditions and other assets monitored by the adaptive intelligence layer 614.

In embodiments, use of the floating asset twins 1570 and the port infrastructure twins 1714 during operation can be shown to provide operators with ability to visualize control and adapt the operation of machinery systems in one or more floating assets 620 or deployed in the physical assets in the maritime facilities 622, especially when the supply chain is across the one or more floating assets 620 and the physical assets in the maritime facilities 622 and processes can be held, increased, decreased based on the progress of other processed on land or on the water.

In embodiments, use of the floating asset twins 1570 and the port infrastructure twins 1714 during operation can be shown to provide optimal points during the voyage or during service life on land to retrofit batteries and replace other switchgear. In embodiments, use of the floating asset twins 1570 during operation can be shown to provide a basis for changing to more powerful, more efficient, or more versatile engines, thrusters or other propulsion systems upon the usual maintenance cycles or at opportune times for retrofit of components.

In embodiments, use of the floating asset twins 1570 during operation can be shown to provide a basis for tuning a schedule to adjust the front bulbous bow of the floating assets 620 to improve efficient flow around the bow of the vessel in various combinations of vessel speed, water activity and weather. In these examples, the front bulbous bow can adjust its shape based on the predetermined schedule or the revised schedule adjust by the adaptive intelligence layer 614 for a shape of the bow for most efficient running.

In embodiments, use of the floating asset twins 1570 during operation can be shown to provide optimal points during the voyage to perform hull cleaning, maintenance or painting or perform propeller cleaning, maintenance or replacement. In embodiments, use of the floating asset twins 1570 during operation can be shown to provide basis for scheduling when hull or propeller cleaning is needed, where in the journey contributes to greatest need to clean systems and determining with simulation using the floating asset twins 1570 whether such maintenance justified or routing of the floating assets 620 to different passages may inflict less of a maintenance burden.

In embodiments, use of the floating asset twins 1570 during operation can be shown to provide detailed simulation and visualization of optimal points during the voyage to perform hull cleaning, maintenance or painting or perform propeller cleaning, maintenance or replacement. In embodiments, use of the floating asset twins 1570 during operation can be shown to provide basis for scheduling when hull or propeller cleaning is needed, where in the journey contributes to greatest need to clean systems and determining with simulation using the floating asset twins 1570 whether such maintenance justified or routing of the floating assets 620 to different passages may inflict less of a maintenance burden.

In embodiments, use of the floating asset twins 1570 during operation can be shown to provide detailed simulation and visualization the performance of one or more ships or floating assets 620 on a detailed level so users can see the effects of design choices and changes on the one or more ships or floating assets 620 as they simulate historical voyages, predicted voyages, and previous voyages modified to further simulate activity encountered to enhance training and safety. In embodiments, use of the floating asset twins 1570 during operation can be shown to provide detailed simulation and visualization the performance of multiple ships or floating assets 620 on a detailed level so users can make use of the digital twins for benchmarking performance towards the other ships or maritime assets and these comparisons can be used to simulate historical voyages, predicted voyages, and previous voyages modified to further simulate activity encountered to enhance training and safety.

In embodiments, use of the floating asset twins 1570 can be shown to provide ship owners a tool for visualization of ships and their subsystems (and various other maritime assets), qualification and analytics of operational data, optimization of ship performance, improved internal and external communication, safe handling of increased levels of autonomy and safe decommissioning.

In embodiments, use of the floating asset twins 1570 can be shown to provide equipment manufacturers a tool to facilitate system integration, demonstrate technology performance, perform system quality assurance and promote additional services for monitoring and maintenance.

In embodiments, use of the floating asset twins 1570 and the port infrastructure twins 1714 can be shown to provide authorities a systematic framework that can be set up with applications to feed live information and generate required reports from each maritime asset whether ships, barges, other floating assets, and port infrastructure including moored navigation aids, cargo in unloaded and loaded conditions and even personnel that move throughout the port infrastructure to ensure its operation. In many examples, use of the floating asset twins 1570 and the port infrastructure twins 1714 can be shown to ensure higher quality reporting on critical issues without putting additional burdens or cognitive load on crew already ensuring operations of the various maritime assets. In many examples, use of the floating asset twins 1570 and the port infrastructure twins 1714 can be shown to ensure higher quality reporting on legal and regulatory issues by providing time-stamped ledgers of activity paired with agreements and contracts underlying the commerce supporting the maritime activity without putting additional burdens or cognitive load on crew already ensuring operations of the various maritime assets.

In embodiments, use of the floating asset twins 1570 and the port infrastructure twins 1714 can be shown to provide universities, colleges, and municipalities with platforms on which to increase system understanding and facilitate knowledge exchange enhancing research and development and education in a range of technological disciplines. By way of these examples, use of the floating asset twins 1570 and the port infrastructure twins 1714 can be shown to provide maritime academies platforms for training that can increase the candidates' understanding of the whole ship or specific maritime asset and train them in systems understanding to see the integrated consequences of actions taken as it affects that asset, all (or some) of the assets including floating and infrastructure assets. In these examples, systems understanding can be shown to be improved because the integrated consequences of actions taken can be seen at the asset level, the fleet of asset level, the infrastructure level, and the business level showing how activity in fleet can affect the profitability of the fleet with combinations of improving revenues and reducing expense where it makes sense all of which can be visualized and interpreted from the floating asset twins 1570 and the port infrastructure twins 1714 including suggestions from the adaptive intelligence layer 614.

In embodiments, an information technology system including a value chain network management platform 604 can have an asset management application 814 such as a maritime fleet management application 880 associated with one or more maritime assets such as one or more floating assets 620 or assets in the maritime facilities 622. In embodiments, a data handling layer 608 of the management platform 604 including data sources such as in the data storage layer 624 and from other inputs such as from the monitoring layer 614 that are collected with respect to any of the value chain entities 652 including one more maritime assets. In embodiments, the data sources contain information used to populate a training set based on a set of maritime activities of one or more of the maritime assets and one of design outcomes, parameters, and data from one or more of the data handling layers 624 is associated with the one or more maritime assets. In embodiments, an artificial intelligence system such as the adaptive intelligence layer 614 can be configured to learn on one or more of the training sets obtained from the data sources from the one or more data handling layers 624. In doing so, the artificial intelligence system can simulate one or more design attributes of one or more of the maritime assets. The artificial intelligence system can also generate one or more sets of design recommendations based on the training sets collected from the data sources. In embodiments, a digital twin system 1700 in the value chain network management platform 604 can provides for visualization of one or more digital twins of one or more of the maritime assets including detail generated by the artificial intelligence system of one or more of the design attributes in combination with the one or more sets of design recommendations.

In embodiments, the maritime assets can include one or more container ships. In embodiments, the maritime assets include one or more barges. In embodiments, the maritime assets include one or more components of the port infrastructure installed on or adjacent to land. In embodiments, the maritime assets include one or more moored navigation units deployed on water. In embodiments, the maritime assets include a ship and the maritime activities include the forward speed of the ship relative to water and weather conditions based on the parameters associated with energy consumption of the propulsion units on the ship.

In embodiments, an information technology system includes a set of intelligent systems for automatically populating a digital twin of a maritime value chain network entity based on data collected by the value chain network management platform 604. In embodiments, the maritime value chain network entity is associated with one or more of the real-world shipyards and the digital twin can be configured to represent one or more of the real-world shipyards. In embodiments, the maritime value chain network entity is associated with a real-world maritime port and the digital twin can be configured to represent one or more of the real-world maritime ports. In embodiments, the maritime value chain network entity is associated with one or more of the container ships and the digital twin can be configured to represent one or more of the container ships. In embodiments, the maritime value chain network entity is associated with one or more of the barges and the digital twin can be configured to represent one or more of the barges.

In embodiments, the maritime value chain network entity is associated with one or more event investigations 7700 and the digital twin can be configured to at least partially represent the maritime value chain network entity as it can act and interact with other assets during a timeline associated with one or more of the event investigations 7700. In embodiments, the maritime value chain network entity is associated with one or more legal proceedings 7702 and the digital twin can be configured to at least partially represent the maritime value chain network entity as it can act and interact with other assets during a timeline associated with the one or more of the legal proceedings 7702. In embodiments, the data collected by a value chain network management platform relates to a casualty report 7704 and the digital twin of the maritime value chain network entity is configured to simulate possibilities of a loss 7708 relevant to the casualty report 7704 based on the data collected by a value chain network management platform.

In embodiments, the maritime value chain network entity is a port infrastructure facility, wherein the data collected by a value chain network management platform facilitates identifying theft or misuse of the port infrastructure facility by correlating data between a set of data collectors for one or more physical items 7710 in the port infrastructure facility and the digital twin can be configured to detail the one or more physical items 7710 of the port infrastructure facility for the at least one of the port infrastructure facility and the set of operators 7720.

In embodiments, the maritime value chain network entity is a container ship that is moored to port infrastructure installed on or adjacent to land.

In embodiments, data collected by a value chain network management platform is based on at least a container ship having a forward speed relative to water and weather conditions and parameters associated with energy consumption of propulsion units on the container ship.

In embodiments, the value chain network management platform 604 includes an asset management application 814 associated with the value chain network management platform and one or more maritime facilities connected to a container ship.

In embodiments, the asset management application is associated with one or more ships connected to barges.

In embodiments, the maritime value chain network entity is one or more ships and the digital twin can provide for visualization of a navigation course of one or more of the ships. In embodiments, the maritime value chain network entity is one or more ships and the digital twin can provide for visualization of an engine performance of one or more of the ships. In embodiments, the maritime value chain network entity is one or more ships and the digital twin can provide for visualization of a hull integrity of one or more of the ships.

In embodiments, the digital twin can provide for visualization of a plurality of inspection points 7730 on the maritime value chain network entity and maintenance histories 7732 associated with those inspection points. In embodiments, the digital twin can further provide for the visualization of the plurality of the inspection points 7730 on the maritime value chain network entity within geofenced parameters 7740 and maintenance histories 7732 associated with those inspection points 7730.

In embodiments, the digital twin can further provide for details of a ledger 7750 of activity associated with the visualization of the plurality of inspection points 7730 on the maritime value chain network entity within geofenced parameters 7740 and maintenance histories mardst832 associated with those inspection points 7730.

Control Tower and Enterprise Management Platform for Value Chain Network

In embodiments, the control tower may include or interface with an enterprise management platform (or "EMP"). In embodiments, an EMP may be configured to generate, integrate with, support, and/or or operate on one or more digital twins. In general, digital twins merge data from multiple data sources into a model and representation of the salient characteristics of things, assets, systems, devices, machines, components, equipment, facilities, individuals or other entities mentioned throughout this disclosure or in the documents incorporated herein by reference, such as, without limitation: machines and their components (e.g., delivery vehicles, forklifts, conveyors, loading machines, cranes, lifts, haulers, trucks, loading machines, unloading machines, packing machines, picking machines, and many others, including robotic systems (e.g., physical robots, collaborative robots, "cobots"), drones, autonomous vehicles, software bots and many others); value chain processes, such as shipping processes, hauling processes, maritime processes, inspection processes, hauling processes, loading/unloading processes, packing/unpacking processes, configuration processes, assembly processes, installation processes, quality control processes, environmental control processes (e.g., temperature control, humidity control, pressure control, vibration control, and others), border control processes, port-related processes, software processes (including applications, programs, services, and others), packing and loading processes, financial processes (e.g., insurance processes, reporting processes, transactional processes, and many others), testing and diagnostic processes, security processes, safety processes, reporting processes, asset tracking processes, and many others; wearable and portable devices, such as mobile phones, tablets, dedicated portable devices for value chain applications and processes, data collectors (including mobile data collectors), sensor-based devices, watches, glasses, wearables, head-worn devices, clothing-integrated devices, bands, bracelets, neck-worn devices, AR/VR devices, headphones, and many others; workers, such as delivery workers, shipping workers, barge workers, port workers, dock workers, train workers, ship workers, distribution of fulfillment center workers, warehouse workers, vehicle drivers, business managers, engineers, floor managers, demand managers, marketing managers, inventory managers, supply chain managers, cargo handling workers, inspectors, delivery personnel, environmental control managers, financial asset managers, process supervisors and workers (for any of the processes mentioned herein), security personnel, safety personnel and many others); suppliers, such as suppliers of goods and related services of all types, component suppliers, ingredient suppliers, materials suppliers, manufacturers, and many others; customers, including consumers, licensees, businesses, enterprises, value added and other resellers, retailers, end users, distributors, and others who may purchase, license, or otherwise use a category of goods and/or related services; a wide range of operating facilities, such as loading and unloading docks, storage and warehousing facilities, vaults, distribution facilities and fulfillment centers, air travel facilities, including aircraft, airports, hangars, runways, refueling depots, and the like, maritime facilities, such as port infrastructure facilities, such as docks, yards, cranes, roll-on/roll-off facilities, ramps, containers, container handling systems, waterways, locks, and many others), shipyard facilities, floating assets, such as ships, barges, boats and others), facilities and other items at points of origin and/or points of destination, hauling facilities, such as container ships, barges, and other floating assets, as well as land-based vehicles and other delivery systems used for conveying goods, such as trucks, trains, and the like; items or elements factoring in demand (i.e., demand factors), including market factors, events, and many others; items or elements factoring in supply (i.e., supply factors), including market factors, weather, availability of components and materials, and many others; logistics factors, such as availability of travel routes, weather, fuel prices, regulatory factors, availability of space, such as on a vehicle, in a container, in a package, in a warehouse, in a fulfillment center, on a shelf, or the like, and many others; retailers, including online retailers and others; pathways for conveyance, such as waterways, roadways, air travel routes, railways and the like; robotic systems, including mobile robots, cobots, robotic systems for assisting human workers, robotic delivery systems, and others; drones, including for package delivery, site mapping, monitoring or inspection, and the like; autonomous vehicles, such as for package delivery; software platforms, such as enterprise resource planning platforms, customer relationship management platforms, sales and marketing platforms, asset management platforms, Internet of Things platforms, supply chain management platforms, platform-as-a-service platforms, infrastructure-as-a-service platforms, software-based data storage platforms, analytic platforms, artificial intelligence platforms, and others; and many others.

In embodiments, a digital twin can represent a process, such as a workflow, such as with moving elements that represent steps of the process, such as the flow of items through a plant or warehouse. A digital twin can also provide a logical representation, such as various topologies, clusters, networks, hierarchies or the like of logically related elements, such as an organizational chart of roles and/or personnel, the logical steps of a process, or the like. Thus, the term digital twin may refer to a digital representation of a thing or set of things. An enterprise digital twin may refer to any digital twin related to an enterprise and the wide array of things that relate to the enterprise and its operations. This may include digital twins of other enterprises and cohorts related to the enterprise, such as competitors, vendors, suppliers, distributors, customers, and the like. An enterprise may refer to a company, organization, corporation, LLC, non-profit organization, or the like. Enterprise digital twins may be used for a wide variety of user-facing applications that benefit from digital representation of salient features of elements of the enterprise, including monitoring of assets and operations, convenient generation and representation of a wide variety of analytic results, generation and display of simulations, such as for scenario planning, generation and display of recommendations and other decision support, collaborative decision support, and control of assets and operations, among many others. Enterprise digital twins may include organizational digital twins, executive digital twins, cohort digital twins, process digital twins, logical digital twins, real-time digital twins, AI-driven digital twins, environment digital twins, infrastructure and equipment digital twins, workforce digital twins, asset digital twins, product digital twins, system digital twins, and/or the like, which are discussed in greater detail throughout the disclosure.

In embodiments, digital twins may be visual digital twins and/or data-based digital twins or combinations of visual and data-based digital twins. A visual digital twin may refer to a digital twin that is capable of being depicted in a display such as a traditional 2D display (optionally with touch, voice, optical, auditory, or other control features), a 3D display, an augmented reality display, a virtual-reality display, and/or a mixed-reality display, any of which may include various combinations of computer-generated display elements (such as animations and other computer-generated graphics, including ones generated or derived from CAD and/or 3D models), elements captured by cameras (such as video and still images), visual elements captured or derived from various sensor systems, such as LIDAR and other point cloud systems, structured light systems, waveforms or other representations of information from acoustic sensor systems, vibration sensing systems, electromagnetic sensing systems, and many others, and/or elements captured, received, or derived from data collection and generation systems of enterprise assets, such as onboard diagnostic and reporting systems, IT systems (e.g., logs), information from wearable devices, and many others. A data-based digital twin may refer to a data structure that contains a set of parameters that are parameterized to represent a state of a thing or group of things, such that a data-based digital twin may be leveraged by a computing application, such as for simulation, modeling, predictions, classifications, and the like. As used herein, the term "depict" may refer to the visual display of a thing and/or a digital representation of a thing in a data structure (e.g., in a data-based digital twin). It is noted that visual digital twins may also be data-based digital twins, or combinations of visual and data-based digital twins.

In some embodiments, a digital twin may be updated with real-time data, such that the digital twin reflects the state of a thing or set of things in real-time. For example, a digital twin of an operating environment or facility (e.g., a factory, warehouse, campus, or the like) may depict the physical structure of the environment (e.g., walls, floors, ceilings, rooms and the like), as well as objects appearing in the environment (e.g., machines, products, employees, robots, and the like). Furthermore, depending on the manner in which this digital twin is configured, the digital twin of the operating facility may include things such as piping, conduits, wiring, foundations, and the like. In embodiments the digital twin may represent the information technology infrastructure of the facility, including wireless and fixed networking devices and systems and their operating capabilities and characteristics. In some implementations, the digital twin of the manufacturing environment may be updated with data received from sensors (e.g., IoT sensors deployed in or around a facility or equipment or machinery within the facility, wearable devices worn by workers within the facility, and other suitable data sources). For example, as a worker wearing a wearable device moves through the facility, the wearable device may communicate the relative location of the worker within the environment to the EMP, which in turn may update the digital twin to reflect the location of a representation of the worker in the digital twin of the facility. In scenarios where the digital twin is of a process, the digital twin may depict the process. For example, in the context of a manufacturing process, a digital twin of the process may depict the status and/or outcomes of different stages in the manufacturing pipeline. In some implementations, the EMP 80 may receive data from various sources (e.g., IoT sensors, data from smart equipment, computing devices, smart products, smart infrastructure, or the like) and may update the digital twin of the process to reflect the received data. The EMP may be configured to generate, update, and/or provide enterprise digital twins for different types of enterprises, including manufacturing enterprises, retail and marketing enterprises (merchants, advertisers, retail chains, restaurant chains, malls, and the like), technology enterprises (e.g., software, database and information technology companies), logistics enterprises (e.g., shipping and delivery entities), service-based enterprises (e.g., airlines, law firms, hospitals, accounting firms, and the like) and many others. For example, enterprise digital twins of a fast food enterprise may include digital twins of food production facilities, food production processes, food shipping facilities (e.g., warehouses and/or trucks), retail locations (e.g., individual restaurant locations), and/or retail processes (e.g., food preparation processes and/or customer workflows). In this example, these digital twins may identify the sources of contaminations (e.g., based on abnormal temperature readings in a food production facility), delays (e.g., based on outcomes of the production and/or shipping processes), customer satisfaction (e.g., based on data related to food preparation and/or customer workflows), and the like.

In embodiments, the EMP may be configured to perform simulations using and/or with respect to one or more enterprise digital twins. In embodiments, digital twins (including enterprise digital twins) may be configured to behave in accordance with a set of constraints, such as laws of nature, laws of physics, mechanical properties, material properties, economic principals, chemical properties, and the like. In this way, the EMP may vary one or more parameters of an enterprise digital twin and may execute a simulation within the digital twin that conforms with real-word conditions and behaviors. For example, in executing a simulation of a logistics process that simulates outcomes associated with different packaging materials, the EMP may simulate variation of the packaging materials of one or more products. During the simulation, the products may be "exposed" to different conditions (e.g., different temperatures, humidity, motions, and the like) by varying one or more parameters of an environment digital twin of an environment of the products, a product digital twin of the product, and/or the logistics digital twin. The simulation may be executed to determine the fraction of products that are likely to be damaged using the different packaging materials, which may affect the profitability of shipments vis-à-vis the cost of the different packaging materials and cost of replacing damaged products. In this way, the simulation may be run to help select the most cost-effective packaging material, such that estimated product loss is taken into account. Furthermore, in some embodiments, digital twins may be leveraged to perform simulations to predict future states of the thing or group of things and/or modeling behaviors in order to extrapolate states of the thing or group of things; to represent results of such simulations (including states, event and flows); and to offer opportunities to control things that are represented in the digital twins based on the simulations. For example, the EMP may receive sensor readings from temperature sensors, humidity sensors, and fan speed sensors deployed throughout an environment. The EMP may apply one or more thermodynamics equations to the received sensor readings and the dimensions of the environment to model the thermodynamic behavior of the environment to determine, to represent in the digital twin the temperatures in areas that do not have temperature sensors and to offer opportunities to adjust one or more systems, such as HVAC systems, or components thereof, to induce a change in the environment.

In some embodiments, the EMP is configured to generate organizational digital twins. In some embodiments, an organizational digital twin incorporates the organization chart ("org chart") of an enterprise. In embodiments, an org chart may define the different divisions (also referred to as business units) within an enterprise, the roles within each division, the reporting structure of the enterprise, and the individuals filling these roles. In embodiments, the organizational digital twin may further include additional data for the business units, roles, and/or individuals filling the roles. For example, the organizational digital twin may include budgets for each business unit, salary ranges for roles, titles for roles, salaries for individuals, open roles, start dates for individuals, and the like. In some embodiments, an organizational digital twin may further incorporate data access rules for different divisions and/or roles within the organization, including permissions, access rights, and restrictions.

In some embodiments an organizational digital twin may represent the organization as a hierarchy or other topology, where entities and relationships are represented, such as reporting relationships, relationships of authority or decision-making, or the like. In embodiments the organizational structure may be represented and maintained in a graph structure, such as a directed acyclic graph, a tree, or the like. In embodiments, an organizational structure, such as an organizational chart or graph, may be parsed by an artificial intelligence system to automatically infer a set of entities, relationships, and roles, which in turn may be used to determine, or recommend, a set of default parameters for configuration of a digital twin. In embodiments, the default parameters may be automatically configured for each user based on a role of the user within the organization, as inferred by the artificial intelligence system. In embodiments parameters may be adjusted by one or more authorized users, such as to adjust or correct the roles, using a digital twin configuration interface of the organizational digital twin. The parameters for configuration of a role-specific digital twin may include permissions (such as for data access), communication settings, availability of features (such as role-specific views of data and analytics, simulation features, control features, and many other features described throughout this disclosure), and the like. In embodiments the artificial intelligence services system may incorporate any of the techniques described throughout this disclosure or the documents incorporated by reference, such as a machine learning, deep learning, convolutional neural networks, robotic process automation, or the like. In embodiments, the artificial intelligence system may include a machine learning system that is trained to infer roles within an organizational chart or structure based on a training set of data, such as one where roles and relationships within an organizational chart are provided by a set of human experts and/or where roles and relationships are explicitly stated within the organizational chart. For example, the artificial intelligence system may learn that the top of the organizational chart is likely to comprise the role of CEO and/or President of an organization, and that other roles, such as the CFO or COO, are likely to be represented in nodes that link directly to the CEO role. In embodiments, the artificial intelligence system may be trained to operate on various data sources to determine and/or augment understanding of an organizational structure, such as public data sets, such as securities filings, social media information, web sites (such as securities information sites), public relations and other news about the organization, or the like. In embodiments, the machine learning system may parse social media sites, such as LinkedIn™, to determine roles of individuals and/or to help infer roles. In embodiments, data sources such as social data, web data, new articles, or the like may be used to determine competencies of individuals, which may be associated with roles (e.g., the AI system may infer that a person with a finance degree is likely to be in a financial role within the organization). In embodiments, settings for a user may be automatically configured to provide features that are appropriate for the training, education, experience and/or competencies of the user, as explicitly entered into the system or as inferred from information associated with the identity of the individual. For example, an individual who has a degree in physics and an MBA may be provided default access to physical model simulations and to financial simulations, while an individual who did not have those educational credentials might be required to obtain authorization and/or training before those features are made available in the digital twin. Thus, the EMP may include artificial intelligence systems that have been trained and/or configured to provide automated understanding of organizational structures and relationships, automated configuration of digital twins for roles within an organization based on the understanding of structures and relationships, and automated configuration of digital twin parameters, settings, and features based on the role and/or the identity of the user filling the role (including the competencies, education, experience, training, or the like of the user).

In embodiments, a digital twin may be provided to represent the organizational structure of a third-party organization in the cohort of the organization of the user of the EMP, such as a supplier, vendor, distributor, logistics partner, value added reseller, representative, agent, venture partner, competitor, advertiser, marketplace or the like. An organizational digital twin of a cohort organization may represent structure, relationships, roles, identities, and competencies of individuals within roles or the organization, such that a user of the EMP may quickly and readily view salient information about the relevant parts of the organization. The organizational digital twin of the cohort organization may be automatically maintained by an artificial intelligence system of the EMP, such as by spidering, webscraping, and parsing websites, news feeds, press releases, social media data, and other available data sources, in order to maintain an accurate representation of the organization. The artificial intelligence system may be trained on a training set of data labelled by human users and/or automatically labelled to maintain an updated organizational structure. The resulting cohort digital twin may be configured to provide various role-specific views within the EMP. For example, a salesperson may be presented a digital twin view of the part of the cohort organization that is most likely to include individuals who are likely to be involved in a decision to purchase the user's offerings, while an HR person's view may be configured to present a digital twin view of the part of the cohort organization that provides the most comparable benchmark information for human resources. Digital twin views of cohort organizations may be automatically populated and/or configured, by training artificial intelligence systems on a process-specific or role-specific basis, to support a wide range of processes and features within the EMP, such as identification of recruiting candidates, benchmarking as to organizational structures, benchmarking as to competencies and talent, identification and/or configuration of sales and business development targets, identification of competitive offerings and/or projects, identification of targets for mergers and acquisitions, identification of targets for competitive research, and many others.

Digital twins can be helpful for visualizing the current state of a system, running simulations on those systems, and modeling behaviors, amongst many other uses. Depending on the configuration of the digital twin, however, a particular view or feature may not be useful for some members of an organization, as the configuration of the digital twin dictates the data that is depicted/visualized by the digital twin. Thus, as noted above, in some embodiments, the EMP is configured to generate role-based digital twins. Role-based digital twins may refer to digital twins of one or more segments/aspects of an enterprise, where the one or more segments/aspects and/or the granularity of the data represented by the role-based digital twin are tailored to a particular role within the entity and/or to the identity of a user that is associated with the role (optionally accounting for the competencies, training, education, experience, authority and/or permissions of the user, or other characteristics). In embodiments, the role-based digital twins include executive digital twins. Executive digital twins may refer to digital twins that are configured for a respective executive within an enterprise. Examples of executive digital twins may include CEO digital twins, CFO (Financial) digital twins, COO (Operations) digital twins, HR digital twins, CTO (Technology) digital twins, CMO (Marketing) digital twins, General Counsel (Legal) digital twins, CIO (Information) digital twins, and the like. In some of these embodiments, the EMP generates different types of executive digital twins for users having different roles within the organization. In some of these embodiments, the respective configuration of each type of executive digital twin may be predefined with default digital twin data types, default relationships among entities, default features, and default granularities, among other elements. The default data types, entities, features and granularities may be determined based on a model of an organization, which may in turn be based on an industry-specific or domain-specific model or template, such as one that is based on a typical organizational structure for an industry (e.g., an automotive manufacturer, a consumer packaged goods manufacturer, a nationwide retailer, a regional grocery chain, or many others). In embodiments, an artificial intelligence system may be trained, such as on a labeled industry-specific or domain-specific data set, to automatically generate an industry-specific or domain-specific digital twin for an instance of an EMP for an organization, with default configuration of data types, entities, features and granularities for various roles within an organization of that industry or domain. The defaults can then be reconfigured in a user interface of an authorized user to reflect company-specific variations from the industry-specific or domain-specific defaults. In some embodiments, a user (e.g., during an on-boarding process) may define the types of data depicted in the different types of executive digital twins, the entities to be represented, the features to be provided and/or the granularities of the different types of executive digital twins. Features may include what data is permitted to be accessed, what views are represented, levels of granularity of views, what analytic models and results can be accessed, what simulations can be undertaken, what changes can be made (including changes relevant to permissions of other users), communication and collaboration features (including receipt of alerts and the capacity to communicate directly to digital twins of other roles and users), control features, and many others. For convenience of reference, references to views, data, features, control or granularity throughout this disclosure should be understood to encompass any and all of the above, except where context specifically indicates otherwise. Granularity may refer to the level of detail at which a particular type of data or types of data is/are represented in a digital twin. For example, a CEO digital twin may include P&L data for a particular time period but may not depict the various revenue streams and costs that contribute to the P&L data during the time period. Continuing this example, the CFO digital twin may depict the various revenue streams and costs during the time period in addition to the high-level P&L data. The foregoing examples are not intended to limit the scope of the disclosure. Additional examples and configurations of different executive digital twins are described throughout the disclosure.

In some embodiments, executive digital twins may allow a user (e.g., a CEO, CFO, COO, VP, Board member, GC, or the like) to increase the granularity of a particular state depicted in the digital twin (also referred to "drilling down into" a state of the digital twin). For example, a CEO digital twin may depict low granularity snapshots or summaries of P&L data, sales figures, customer satisfaction, employee satisfaction, and the like. A user (e.g., the CEO of an enterprise) may opt to drill down into the P&L data via a client application depicting the CEO digital twin. In response, the EMP may provide higher resolution P&L data, such as real-time revenue streams, real-time cost streams, and the like. In another example, the CEO digital twin may include visual indicators of different states of the enterprise. For example, the CEO digital twin may depict different colored icons to differentiate a condition (e.g., current and/or forecasted condition) of a respective data item. For example, a red icon may indicate a warning state, a yellow icon may indicate a neutral state, and a green icon may indicate a satisfactory state. In this example, the user (e.g., a CEO) may drill down into a particular data item (e.g., may select a red sales icon to drill down into the sales data, to see more specific and/or additional data, in order to determine why there is the warning state). In response, the CEO digital twin may depict one or more different data streams relating to the selected data item.

In embodiments, a user interacting with a digital twin may escalate or deescalate a state to another user associated within an enterprise. For example, a COO or other operations executive may view a COO digital twin that depicts various operations related data. In this example, the COO may escalate a particular data set depicted in the COO digital twin to the CEO. Once escalated, the particular data set may appear in the CEO digital twin (e.g., with a message from the escalating executive).

In some embodiments, the EMP supports rolled-up real-time reporting. In some of these embodiments, data from IoT systems, sensors, onboard diagnostic systems, wearable devices, enterprise software systems, and/or other data sources (such as data feeds, news feeds, social media data sources, crowdsourced data, data obtained by spidering websites, sales data, marketing data, advertising data, market data, weather data, pricing data, and many others) may undergo one or more data fusion operations and an AI-based agent may determine which individuals within the enterprise to report results of analytics performed on the unfused or fused data. In embodiments, the EMP may access data of or about an organization (and third-party or external data) that is available from a range of connected information technology and connectivity systems of the organization, including data collection, monitoring and storage systems as described elsewhere in this disclosure and in the documents incorporated herein by reference. In embodiments, the data collection, monitoring, and storage systems may include a "data pipeline" of such connected information technology and connectivity systems that may include one or more of individual sensors that are disposed on or around and/or are integrated into items (such as enterprise assets), packages of such sensors, data collection, detection and reading systems (such as asset tag readers, sensor readers, and many others); onboard diagnostic systems, log systems, and other onboard reporting systems producing feeds of data from machines, components or systems; networking devices, including switches, access points, routers, repeaters, mesh networking nodes, gateways, and the like, as well as a host of different types of smart or network-connected edge and IoT devices, and including Bluetooth, BLE, WIFI, NFC, IR and other wireless devices, as well as 5G, 4G, 3G, LTE and other cellular infrastructure systems, including cellular chips and boards, gateways, towers and backhaul systems; data storage and processing systems, including local storage, distributed storage, database systems, caching systems, local memory systems, and many others; computational systems, including edge computational systems, serverless computational systems; and clients, servers, on-premises IT systems, cloud-based systems, and many others. Data may be transmitted and/or stored at points along this pipeline in raw form (such as in packets of raw data, with metadata, in streams, as events or transactions, as syndicated data, and in other forms) and/or in various processed forms, such as compressed data (including where compression is undertaken by trained artificial intelligence systems), summarized data (including where summarization is undertaking by trained artificial intelligence system), augmented data (such as by metadata and/or one or more analytic results), fused (e.g., multiplexed with one or more other sources), or the like. Collection, processing, storage and or transmission may be automated by one or more intelligence services systems as disclosed elsewhere in this document and the documents incorporated by reference herein, such as to provide for improved reliability, quality-of-service, efficiency, or the like, such as by intelligent protocol selection for data paths among nodes, intelligent filtering of RF-domain wireless transmission, and the like. As an example, a set of vibration sensors deployed on industrial machines/equipment in a factory may report vibration signatures of various components of the industrial machines/equipment. Edge devices may be configured to fuse the sensor data from an environment (e.g., a factory, warehouse, distribution center, office building, or many others) with other data collected with respect to the environment, whereby the fused data is fed to the digital twin. The EMP may then update the digital twin with the fused data and an AI system may analyze the digital twin and/or the fused data to identify data items to report, the proper role(s) to report to (e.g., CEO, COO, CFO, or the like), and then may provide the report to the appropriate individual(s). Enterprise digital twins, including executive digital twins, are discussed in greater detail throughout the application.

In embodiments, the EMP may be configured to provide a set of collaboration tools that allow for collaboration between users (e.g., members of an organization and/or with third parties). In some embodiments, the collaboration tools allow users to collaborate with respect to and/or within one or more enterprise digital twins. In some embodiments, users can interact while viewing the same digital twin or multiple digital twins showing different aspects of the enterprise, showing different views or features of the digital twin(s) and/or displaying information at different granularities.

In embodiments, the collaboration tools include a video conferencing service. In some of these embodiments, the video conferencing service includes a graphical user interface that allows a user to create subchats during a video conference. A subchat may refer to an embedded video conferencing session where the members of the subchat are selected from an ongoing video chat. In some embodiments, the video conferencing service allows users to participate in video conferences within a digital twin. For example, users may access an environment digital twin via a VR-head set, whereby the participants may view the environment digital twin and see avatars of other participants within the "in-twin" video conference. In embodiments, configuration of subchats may be created based on roles within an enterprise, such as where a role has authority to pull other roles into a subchat, such as roles that report to the authority role.

In embodiments, the collaboration tools include interactive white boards, productivity tools (e.g., word processors, spreadsheets applications, slide decks/presentation applications, and the like), or some other type of collaboration tool. In these embodiments, users may import data from a digital twin (e.g., an executive twin) into a medium, such as into a word processor document or a spreadsheet. For example, when preparing a quarterly report, a CFO may import data from a CFO digital twin directly into the document containing the quarterly report. Collaboration tools are described in greater detail throughout the disclosure. In embodiments, a digital twin may import data from one or more other collaboration environments into the digital twin, such that collaboration entities can be viewed alongside other entities represented in the digital twin. For example, a Google™ document containing an analytic report on the performance of a logistics system may be presented in a view of the elements of the logistics system in a digital twin.

In embodiments, the EMP trains and deploys expert agents on behalf of enterprise users. In embodiments, an expert agent is an AI-based software agent, using, for example, robotic process automation, that performs tasks on behalf of and/or suggests actions to a respective user having a defined role that requires some expertise in a particular field. In embodiments, the expert agent may be trained within the EMP or otherwise, such as based on interactions of the user with a client application, such as actions taken by a user with respect to an executive digital twin, interactions with sensor data or other data collected by the EMP, interactions with systems or components of a workflow, and the like. In embodiments, an expert agent may be an executive agent trained for executive roles. For example, an executive agent may be trained for performing or recommending actions to a user in an executive role, such as CEO role, a COO role, a CFO role, a CTO role, a CIO role, a CTO role, a CMO (chief marketing officer) role, a GC (general counsel) role, an HR (human resources) executive role, a board member role, a CDO (chief data officer) role, a CPO (chief product officer) role, and the like. In embodiments, the EMP includes capabilities to train expert agents for other roles within an enterprise, such as an investor role, an engineering manager role, a project manager role, an operations manager role, and a business development role, a factory manager role, a factory operations role, a factory worker role, a power plant manager role, a power plant operations role, a power plant worker role, an equipment service role, an equipment maintenance operator role, a logistics manager role, a supply chain manager, and the like.

In embodiments, the expert agents are trained based on training data that includes actions taken by users and features relating to the circumstances surrounding the action (e.g., the type of action taken, the scenario that prompted the action, and the like). In embodiments, the EMP receives telemetry data from a client application associated with a particular user and learns the workflows performed by the particular user based on the telemetry data and the surrounding circumstances. For example, the user may be a COO that is presented a COO digital twin. Among the responsibilities of the COO may be scheduling maintenance and replacement of equipment or other infrastructure in a facility. The states depicted in the COO digital twin may include depictions of the condition of different pieces of equipment or infrastructure within the facility. In this example, the COO may schedule maintenance via the digital twin when a piece of equipment is determined to be in a first condition (e.g., a deteriorating condition) and may issue a request to the CFO via the COO digital twin for authorization of finances to replace the piece of equipment when the equipment is determined to be in a second condition (e.g., a critical condition). The executive agent may be trained to identify the COO's tendencies based on the COO's previous interaction with the COO digital twin. Once trained, the executive agent may automatically request replacements from the CEO when a particular piece of equipment is determined to be in the second condition and may automatically schedule maintenance if the piece of equipment is in the first condition. Further discussion of executive agents is provided throughout the disclosure. While reference is made to an expert agent being trained for a particular user, it is understood that an expert agent may be trained using the actions of one or more different users and may be used in connection with users that were not involved in training the expert agent. Expert agents, including executive agents, are discussed in greater detail throughout the disclosure.

Figure 68:
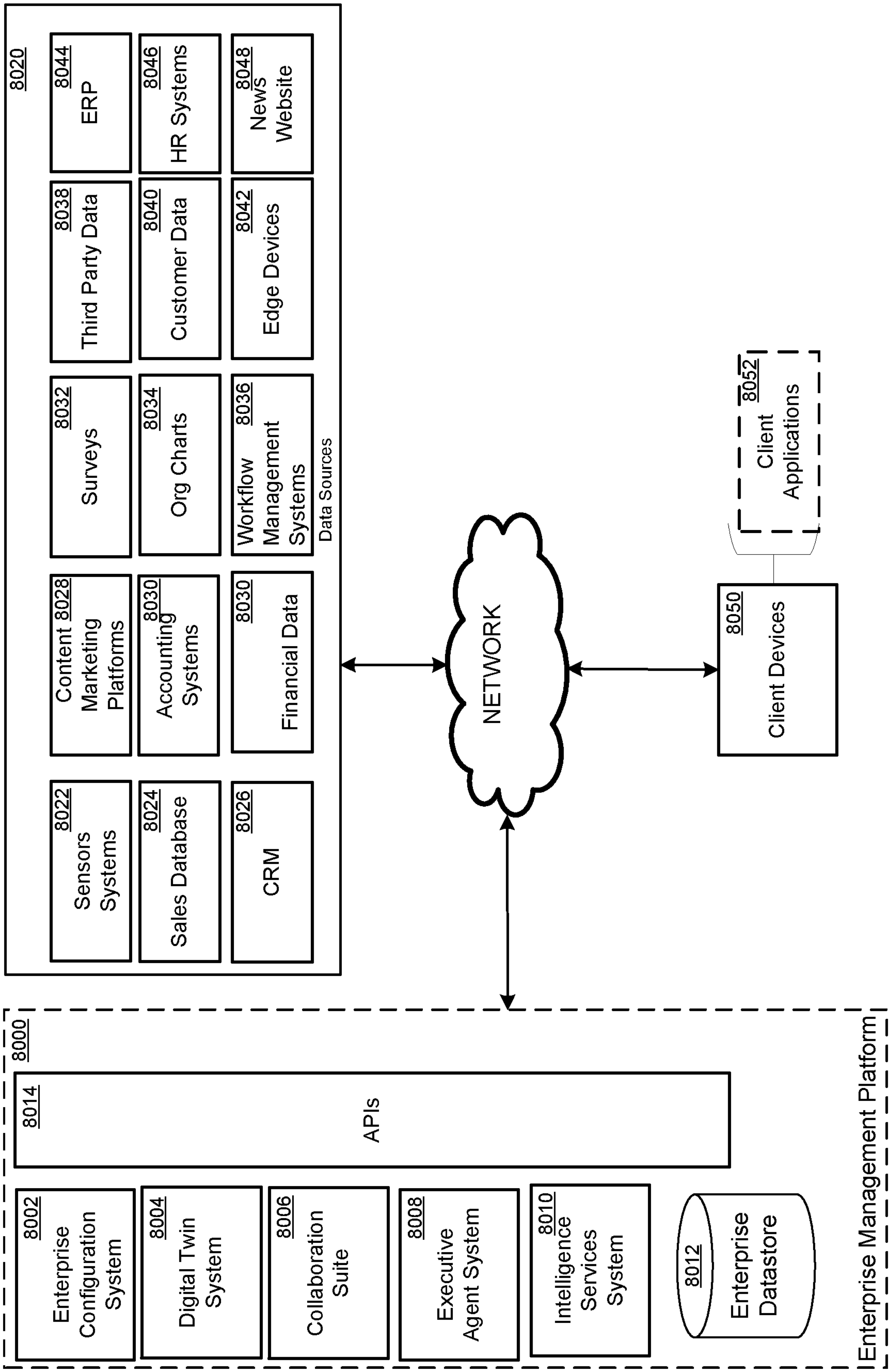
FIG. 68 is a schematic illustrating an example environment of the enterprise and executive control tower and management platform, including data sources in communication therewith, according to some embodiments of the present disclosure.

FIG. 68 is a schematic of an example environment of an enterprise management platform 8000. In embodiments, the EMP 8000 may be integrated with or accessible to a control tower via an application programming interface (API). In some of these embodiments, the EMP 8000 may be a series of microservices that are accessible to the control tower.

In embodiments, the EMP 8000 includes an enterprise configuration system 8002, a digital twin system 8004, a collaboration suite 8006, an expert agent system 8008, and an intelligence service system 8010. In embodiments, the EMP 8000 includes an API system 8014 that facilitates the transfer of data between one or more external systems and the EMP 8000. In some embodiments, the EMP8010 includes an enterprise data store 8012 that stores data relating to enterprises, whereby the enterprise data is used by the digital twin system 8004, the collaboration suite 8006, and/or the expert agent system 8008. The enterprise data store 8012 may store any of a wide variety of data, such as any data involved in the data pipeline described above and throughout this disclosure and the documents incorporated herein by reference. In embodiments, the enterprise data store 8012 may store data that is being used to update digital twins in real-time or substantially real time. In embodiments, the enterprise data store 8012 may store databases, file systems, folders, files, documents, transient data (e.g., real-time data or substantially real-time data), sensor data, and the like.

In embodiments, the enterprise configuration system 8002 provides an interface (e.g., a graphical user interface (GUI)) by which a user (e.g., an "on-boarding" user) may upload or otherwise provide data relating to an enterprise. As used herein, an enterprise may refer to a for-profit or non-profit organization, company, governmental agency, non-governing organization, or the like. While described as an on-boarding user, the configuration of the enterprise management platform 8000 for a particular enterprise may be performed by any number of users, including individuals associated with the enterprise, individuals associated with the EMP, and/or individuals associated with a third-party, such as a third host of a hosted EMP for an enterprise (which may be deployed on cloud resources, platform-as-a-service, software-as-a-service, multi-tenant data resources and/or similar resources) and/or a service provider.

In embodiments, the on-boarding user may define the types of enterprise digital twins that may be generated by the digital twin system 8004 on behalf of the enterprise being on-boarded. In embodiments, the on-boarding user may select different types of digital twins that will be supported for the enterprise by the EMP 8000 via a GUI presented by the enterprise configuration system 8002. For example, the user may select different types role-based digital twins from a menu of digital twin types, where the different types of role-based digital twins include executive digital twins. As another example, the user may select a type of organizational digital twin that is suitable for the user's organization, such as from a library of industry-specific or domain-specific organizational templates. In some embodiments, each type of executive digital twin has a predefined set of states (such term as referenced herein encompassing states, entities, relationships, parameters, and other characteristics) that are depicted in the respective executive digital twin and predefined granularity levels and/or other features for each state of the set. In some embodiments, the set of states that are depicted in the executive digital twin, the granularity of each, and/or other features may be customized (e.g., by the on-boarding user). In these embodiments, a user may define the different states that are represented in each type of executive digital twin and/or the granularity for each of the states depicted in the digital twin. For example, if the CEO of an enterprise has a financial background, the CEO may wish to have more financial data depicted in the CEO digital twin, such that the financial data is displayed at a higher granularity, or the CEO may wish to have access to underlying information on financial models that are available to the digital twin, such as models used for determination of state information (e.g., financial predictions or forecasts) or models used for augmentation of states (such as highlighting important deviations from expectations). By contrast, if the CEO has less financial experience or training, the CEO digital twin may be configured with summary financial data and may include prompts (which may be generated by an intelligent agent trained on a set of enterprise and/or industry outcomes) to obtain CFO input when states deviate from normal operating conditions. In this example, the CEO digital twin may be configured to depict the desired financial data fields at a granularity level set defined by a user (e.g., the financial data may include various revenue streams, cost streams, and the like). In another example, the CEO may have a technical background. In this example, the CEO digital twin may be configured to depict one or more states related to the enterprise's product and R&D efforts, patent development, and product roadmaps at higher granularity levels. In yet another example, a COO may be tasked with overseeing a product team, a marketing team, and an HR department of the enterprise. In this example, the COO may wish to view marketing-related states, product development-related states, and HR-related states at a lower granularity level. In this example, the COO digital twin may be configured to show visual indicators that indicate whether any of the states are at a critical condition, an exceptional condition, or a satisfactory condition. For instance, if employee turnover is very high and employee satisfaction is low, the COO digital twin may depict that the HR-state is at a critical level. In this configuration, the COO may select to drill down into the HR-state, where she may view the employee turnover rate, hiring rate, and employee satisfaction survey results.

In another example, a COO or CTO digital twin may be configured to represent and assist with discovery and management of interconnections, relationships and dependencies between enterprise operations and information technology. For example, a COO digital twin or a CFO digital twin may be configured to depict a set of operations entities and workflows (e.g., flow diagrams that represent a production process, an assembly process, a logistics process, or the like), where entities (including human workers, robots, processing equipment, and other assets) are depicted to operate on a set of inputs such as materials, components, products, containers and information) in order produce and hand off a set of outputs (of similar varied types) to the next set of entities in the workflow for further processing. These may be represented, for example, in a flow diagram that depicts each entity and its relationship in the flow to other entity. In embodiments, a role-based digital twin (such as a CIO digital twin) may also represent an information technology system, such as representing sensors, IoT devices, data collection and monitoring systems, data storage systems, edge and other computational systems, wired and wireless networking systems, and the like, including any of the types described throughout this disclosure. Each information technology component or system may be depicted in the role-based digital twin, along with related data, such as specifications, configuration parameters and settings, processing capabilities, along with its relationship to other components, such as representing data and networking connectivity to other components or systems. In embodiments, a role-based digital twin may provide a converged view that depicts operations technology entities and information technology entities in relation to each other, such as indicating which information technology entities are located with wired or proximal wireless connectivity to which operational entities, indicating which informational technology entities are logically associated to which operational entities (such as where cloud resources, computational resources, artificial intelligence resources, database resources, application resources, or other resources are provisioned to support or interact with operational entities, such as in virtual machine, container or other logical relationships). In embodiments, the converged view presented in the role-based digital twin may thus depict location-based and/or logical interconnections between operations and information technologies. In embodiments, alerts, such as indicating failure modes, congestion, delays, interruptions in service, poor latency, diminished quality of service, bandwidth constraints, poor performance on key performance indicators, downtime, or other issues may be provided as augmentations or overlays of the converged information technology and operations digital twin, so that the COO, CTO, CIO or other user may see interconnections between information technology entities and operational entities that may be contributing to problems. Other types of issues that may be provided as augmentations or overlays may include alerts as to existing conditions and/or forecasts or predictions of such conditions, such as by analytic systems or forecasting artificial intelligence systems, such as expert agents trained to make such forecasts. In an example, if high latency in a control system for a warehouse is slowing down the process of picking and packing goods due to a related edge computational node experiencing congestion on an input data path, the user of the role-based digital twin may be alerted to the fact that operations are being adversely impacted by the congestion, and a recommendation may be presented to augment, update, upgrade, or replace either the system providing connectivity to the edge node or the edge node itself. Thus, a converged digital twin of operations technology entities and information technology entities may provide for insight into how an executive may adjust operations and/or information technology to improve results and/or avoid anticipated problems before they become catastrophic failures.

In embodiments, a user (e.g., an on-boarding user) may connect one or more data sources 8020 to the EMP 8000. Examples of data sources 8020 that may be connected to the EMP may include, but are not limited to, a sensor system 8022 (e.g., a set of IoT sensors), a sales database 8024 that is updated with sales figures in real time, a customer relationship management (CRM) system 8026, a marketing campaign platform 8028, news websites 8048, a financial database 8030 that tracks costs of the business, surveys 8032 (e.g., customer satisfaction and/or employee satisfaction surveys), an org chart 8034, a workflow management system 8036, customer databases 1S40 that store customer data, external data feeds (such as news feeds, public relations feeds, weather feeds, trade data, pricing data, market data, and the like), data obtained by spidering, webscraping, or otherwise parsing website and social media sites, data obtained by crowdsourcing, and/or data from many and various third-party data sources 8038 that store third-party data. The data sources 8020 may include additional or alternative data sources without departing from the scope of the disclosure. Once the user has defined the configuration of each respective executive digital twin, where the configuration includes the selected states to be depicted (which may include entities, relationships, and characteristics), the features that are to be enabled, and/or the desired granularity of each state, the user may then define the data sources 8020 that are fed into the respective executive digital twin, including any of the data sources in the data pipeline described above. In some embodiments, data from one or more of the data sources may be fused and/or analyzed before being fed into a respective digital twin.

In some embodiments, the on-boarding user may select among various types of enterprise digital twins that are supported for the enterprise, including environment digital twins, information technology digital twins, operations digital twins, organizational digital twins, supply chain digital twins, product digital twins, facility digital twins, customer digital twins, cohort digital twins and/or process digital twins, among others. In some of these embodiments, the user may define the data sources used to generate these digital twins and to update the enterprise digital twins. In embodiments, the user may define any physical locations that will be represented as an environment digital twin (which may be a digital twin of a facility or other suitable environments). For example, the user may define manufacturing facilities (e.g., factories), shipping facilities, warehouses, office buildings, and the like. Each facility may be given a location (which may include a logical and/or virtual location and/or a geo-location) and an identifier, such as a name and type description. In embodiments, the enterprise configuration system 8002 may assign an identifier to each facility and may associate the location of the facility with the identifier. In embodiments, the user may define the types of objects that are included in the environment and/or may be found within an environment. For example, the user may define the types of enterprise resources (e.g., factory, warehouse, or distribution center equipment and machines, assembly lines, conveyors, vehicles, robots, high-lows, and the like, IT systems, workers, and many others) that are in the environment, the types of products, materials and components that are made in, stored in, moved around, assembled, used as inputs within, produced in, sold from, and/or received in the environment, the types of sensors/sensor kits and/or data collection, storage and/or processing devices that are used in the environment, the workers and workflows involved, and the like. Examples of how environment and process digital twins are generated and updated may be found in the U.S. Provisional Application No. 62/931,193, filed Nov. 5, 2019, entitled Methods and Systems of Value Chain Network Management Platform and U.S. Provisional Application No. 62/969,153, filed Feb. 3, 2020, entitled Methods and Systems of Value Chain Network Management Platform, the contents of which are herein incorporated by reference.

In embodiments, the enterprise configuration system 8002 (in combination with the digital twin system 8004) is configured to generate organizational digital twins that represent an organizational structure of an enterprise. In some embodiments, the organizational digital twin may depict individuals/roles occupying the management and expert levels of an enterprise. Alternatively, the organizational digital twin may include a workforce digital twin that represents the entire workforce of an enterprise, including all the employees and/or contractors of the enterprise, or a defined part thereof. For example, in an enterprise setting, workforces may include a logistics workforce, a warehouse workforce, a distribution workforce, a reverse logistics workforce, a delivery workforce, a factory operations workforce, a plant operations workforce, a resource extraction operations workforce, a network operations workforce (e.g., for operating internal networks of an industrial enterprise), a sales workforce, a marketing workforce, an advertising workforce, a retail workforce, an R&D workforce, a technology workforce, an engineering workforce, and/or the like. In another example, with respect to a value chain network, workforces may include a supply chain management workforce, a logistics planning workforce, a vendor management workforce, and the like. In another example, in the context of a marketplace setting, workforces may include a brokering workforce for a marketplace, a trading workforce for a marketplace, a trade reconciliation workforce for a marketplace, a transactional execution workforce for a marketplace, and/or the like. Enterprises may include additional or alternative workforces. In some embodiments, an organizational digital twin may include management-level roles within a workforce. Examples of management-level roles of an enterprise include a CEO role, a COO role, a CFO role, a counsel role, a board member role, a CTO role, an information technology manager role, a chief information officer role, a chief data officer role, an investor role, an engineering manager role, a project manager role, an operations manager role, a business development role. Furthermore, the management-level roles of a workforce may include a factory manager role, a factory operations role, a factory worker role, a power plant manager role, a power plant operations role, a power plant worker role, an equipment service role, and an equipment maintenance operator role. In a value chain context, the management-level roles of a workforce may include a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role. In the context of marketplaces, the management-level roles of a workforce may include a market maker role, an exchange manager role, a broker-dealer role, a trading role, a reconciliation role, a contract counterparty role, an exchange rate setting role, a market orchestration role, a market configuration role, and a contract configuration role. It is appreciated that not all of the roles defined above apply to a particular workforce type. Furthermore, some roles may be associated with different types of workforces.

In some embodiments, an organizational digital twin may further incorporate data access rules for different divisions and/or roles within the organization. For example, the CEO may be granted access to most or all of the organization's data, the CFO may be granted access to financial-related data and restricted from viewing R&D data, the CTO may be granted access to R&D-related data and restricted from viewing financial data, members of the engineering team may be restricted in accessing financial related data, or the like. Similar rules may be applied to access to features, such as analytic models, artificial intelligence systems, intelligent agents, and the like, including role-based or identity-based control of the ability to view results, to configure inputs, to configure or adjust models (e.g., weights, inputs, or processing functions), to undertake control actions, or the like. In some embodiments, the EMP may utilize the organizational digital twin when determining the level of access a particular individual may be granted and/or whether to deny certain types of access to the individual. In some embodiments, the access rights may limit the types of data that particular users can access, such as information about each individual listed in the organizational digital twin (e.g., salary, start date, availability, work status, and the like). For example, lower level employees may not be granted access to sensitive information, such as financial data, product strategies, marketing strategies, trade secrets, or the like. In some embodiments, certain users may be granted permission to change the access rights of other employees, which may be reflected in the organizational digital twin. For example, certain executives and managers may be granted permission to grant access rights to members of their respective teams when working on certain projects.

In embodiments, the enterprise configuration system 8002 receives an organization chart ("org chart") definition of an enterprise and generates an organizational digital twin based on the org chart definition. In embodiments, the org chart definition may define the business units/departments of the enterprise, the reporting structure of the enterprise, various roles of the enterprise/within each business unit, and the individuals in the respective roles. In some embodiments, the user can upload the enterprise's org chart to the EMP 8000 via the enterprise configuration system 8002. Additionally or alternatively, the user can define the structure of the org chart (e.g., roles, business units, reporting structure) and may populate the various roles with names and/or other identifiers of the individuals filling the respective roles defined in the org chart. In some embodiments, the enterprise configuration system 8002 may access an enterprise resource planning system 8044 and/or an HR system 8046 of the enterprise to obtain organizational data of the enterprise, such as the roles of the enterprise, the individuals that fill the roles, the salaries of the individuals that fill the roles, the reporting structure of the enterprise, and the like. In these embodiments, the digital twin system 8004 (discussed below) may continue to communicate with the ERP system 8044 and/or HR system 8046 to receive the data needed to maintain the organizational digital twin in a real-time or near-real-time manner.

In embodiments, the enterprise configuration system 8002 (in cooperation with the digital twin system 8004, discussed below) may generate an organizational digital twin of the enterprise based on the org chart definition and the individuals that populate the roles within the org chart definition. In embodiments, a user may define one or more restrictions, permissions, and/or access rights of the individuals indicated in the organizational digital twin via the enterprise configuration system 8002. In embodiments, a restriction may define one or more types of data or features that a particular user or group of users is not allowed to access (either directly or in a digital twin). In embodiments, an access right may define one or more types of data or features that a particular user or group of users may access and the type of access that a user or group of users can access. In embodiments, a permission may define operations that a user or a group of users may perform with respect to the EMP 8000. In embodiments, one or more of the access rights, permissions, and restrictions may be defined geographically and/or temporally limited. For example, some types of data or features may only be viewed or otherwise accessed in certain areas (e.g., sensitive data may only be viewed in the corporate offices) or at certain times (e.g., during Board meetings). In embodiments, the restrictions, permissions, and/or access rights may be set with respect to roles or the users themselves. As such, defining access rights, permissions, and/or restrictions for a user or a group of users may also include defining access rights, permissions, and/or restrictions to a role and/or business unit within the enterprise. In embodiments, the organizational digital twin may be deployed to manage the rights, permissions, and/or restrictions for the users of an enterprise. Furthermore, in embodiments, the organizational digital twin may define the types of role-based digital twins (and other enterprise digital twins) that various users may have access to. In some embodiments, the organizational digital twin may depict additional or alternative information.

In embodiments, the digital twin system 8004 is configured to generate, update, and serve enterprise digital twins of an enterprise. In some embodiments, the digital twin system 8004 is configured to generate and serve role-based digital twins on behalf of an enterprise and may serve the role-based digital twins to a client device 8050 (e.g., a mobile device, a tablet, a personal computer, a laptop, AR/VR-enabled device, workflow-specific device or equipment, or the like). As discussed, during the configuration phase, a user may define the different types of data and the corresponding data sources, data sets, and features that are used to generate and maintain each respective type of the different types of enterprise digital twins. Initially, the digital twin system 8004 configures the data structures that support each type of enterprise digital twin, including any underlying data sources/databases (e.g., SQL databases, graph databases, relational databases, distributed databases, blockchains, distributed ledgers, data feeds, data streams, and the like) that store or produce data that is ingested by the respective enterprise digital twins. Once the data structures that support a digital twin are configured, the digital twin system 8004 receives data from one or more data sources 8020. In embodiments, the digital twin system 8004 may structure and/or store the received data in one or more databases. When a specific digital twin is requested (e.g., by a user via a client application 8052 or by a software component of the EMP 8000), the digital twin system may determine the views that are represented in the requested digital twin and may generate the requested digital twin based on data from the configured databases and/or real-time data received via an API. The digital twin system 8004 may serve the requested digital twin to the requestor (e.g., the client application or a backend software component of the EMP 8000). After an enterprise digital twin is served, some enterprise digital twins may be subsequently updated with real-time data received via the API system 8014. In embodiments an API may provide information to the data pipeline as to the type of data required for the digital twin, such that the data pipeline may be configured (by a user, or by an automated/intelligence systems) to handle the data effectively. For example, the data pipeline may be configured to deliver data over a data path that uses an appropriate protocol for efficient delivery, delivering the data over a cost-appropriate path (e.g., an inexpensive path for data that does not require low latency or real-time updating), or the like. Thus, in some embodiments, configuration of a digital twin may include providing inputs as to the requirements of the digital twin for low-latency, high quality-of-service, high accuracy, high granularity, high reliability, or the like, based on, for example, the priority of the mission served by the data type. In embodiments, an intelligent expert agent (or “intelligent agent” or “expert agent”) may be trained on a training set of configurations of inputs to one or more data pipelines that were previously configured by experts, such that the intelligent agent may learn to automatically configure APIs for digital twins to provide appropriate inputs to data pipelines for subsequent digital twins involving similar or analogous workflows for similar or analogous roles, identities, industries and/or domains. In embodiments, such training of an intelligent agent may include learning as to specific user interactions, such as learning which users within a role use which types of data at what times and for what purposes, such that data resources are appropriately allocated to support actual user requirements. For example, an automated intelligent agent managing the configuration of a data pipeline for a COO digital twin may learn that an operations executive (e.g., a COO user) checks production data for each facility at the end of each eight-hour shift (e.g., after 5:00 pm), such that mid-shift data updates are delivered over lower-cost data resources, but end-of-shift data is delivered over low-latency data paths that have high reliability and quality-of-service. Continuing this example, the intelligent agent may determine the frequency at which the production data is updated with respect to the COO digital twin, such that the COO digital twin is updated less frequently in the mornings and mid-afternoons, but is updated more frequently at the end of business hours. In embodiments, the intelligent agent may be configured with business logic that defines overall strategies (e.g., when to use low-latency networks v. higher-latency networks and/or how often to update a certain type of data within a particular digital twin) and customized based on the preferences and use by the end user of the digital twin, whereby the overall strategies may be learned from training data sets obtained from experts and/or may be hard-coded by a developer, and the customization piece may be learned from monitoring the use of the digital twin by the end intended user (e.g., when she typically checks the production data of each facility). Additional or alternative examples of such data prioritization strategies and/or other configuration strategies should be understood to be encompassed herein. For example, upon receipt of inputs as to performance requirements, artificial intelligence capabilities of the data pipeline that is integrated with, linked to, or supporting of the EMP 100 may automatically or under user control employ techniques to provide appropriate resources at the right time and place, including, but not limited to: adaptive coding of data path transmissions between networked data communication nodes; adaptive filtering, repeating and amplification of RF/wireless signals (including software-implemented band-pass filtering); dynamic allocation of use of cellular and other wireless spectrum, adaptive, ad-hoc, cognitive management of wireless mesh network nodes; adaptive data storage; cost-based routing of wireless and wired signals; priority-based routing; channel- and performance-aware protocol selection for communications; context-aware allocation of computational resources, serverless computational systems, adaptive edge computational systems, channel-aware error correction, smart-contract-implemented network resource allocation; and/or other suitable techniques.

In embodiments, the digital twin system 8004 may be further configured to perform simulations and modeling with respect to the enterprise digital twins. In embodiments, the digital twin system 8004 is configured to run data simulations and/or environment simulations using a digital twin. For example, a user may, via a client device, instruct the digital twin system 8004 to perform a simulation with respect to one or more states and/or workflows depicted in a digital twin. The digital twin system 8004 may run the simulation on the digital twin and may depict the results of the simulation in the digital twin. In this example, the digital twin may need to simulate at least some of the data used to run the simulation of the environment, so that there is reliable data when performing the requested environment simulation. The digital twin system 8004 is discussed in greater detail throughout the disclosure.

In embodiments, the collaboration suite 8006 provides a set of various collaboration tools that may be leveraged by various users of an enterprise. The collaboration tools may include video conferencing tools, “in-twin” collaboration tools, whiteboard tools, presentation tools, word processing tools, spreadsheet tools, and the like. In embodiments, an “in-twin” collaboration tool allows multiple users to view and collaborate within a digital twin. For example, in embodiments, the collaboration tools may include an in-twin collaboration tool that that enables a digital twin experience and a collaboration experience within the same interface (e.g., within a AR/VR-enabled user interface, a standard GUI, or the like), such as where collaboration entities and events (such as version-controlled objects, comment streams, editing events and other changes) are represented within the digital twin interface and linked to digital twin entities. For example, multiple users may be granted access to view an environment digital twin of a facility, such as a warehouse or factory, via an in-twin collaboration tool. Once viewing the environment digital twin, the users may then change one or more features of the environment depicted in the environment digital twin and may instruct the digital twin system to perform a simulation. In this example, the results of the simulation may be presented to the users in the digital twin and may be automatically populated into a shared document (e.g., a spreadsheet or presentation document). Users may collaborate in additional manners with respect to a digital twin, as will be discussed throughout the disclosure. For example, in some embodiments, the collaboration suite 8006 may allow a user to call a video conference with another user, where the users see each other and see aspects of a specific digital twin that relates to the topics of discussion for the conference. In this example, users may, for example, see a representation of workpiece under discussion and see each other, so that a user can see gestures or indications from another user about how the workpiece should be acted upon. In another example, a conferencing feature of the twin may show participants in a view of a set of environments of facilities by their locations, so that users can recognize which participants may have closest proximity to relevant assets that are the subject of collaboration. In some embodiments, the collaboration suite 8006 interfaces with third-party applications, whereby data may be imported to and/or from the third-party application. For example, in collaborating on a Board presentation, different executives may export data from their respective executive digital twin into a shared presentation file (e.g., PowerPoint™ file or Google™ slide presentation). In another example, a first user (e.g., the CEO of an enterprise) may request certain information (e.g., financial projections for the enterprise) from a second user (e.g., the CTO of the enterprise) via a first executive digital twin configured for the first user (e.g., a CEO digital twin of the enterprise). In response, the second user may upload/export the requested data from a second executive digital twin that was configured for the second user (e.g., the CTO) to the EMP100 (e.g., to the collaboration suite 8006 and/or the digital twin system 8004, which may then update the executive digital twin configured for the first user. Additional examples and descriptions of the collaboration suite 8006 and underlying collaboration tools are discussed throughout the disclosure.

In embodiments, the collaboration suite 8006 may be configured to interface with the digital twin system 8004 (e.g., independent of or under control of the digital twin system 8004) to provide role-specific views and other features within a collaboration environment and/or workflow of a collaboration tool, such that different participants in the same collaboration environment and/or workflow experience different views or features of the same digital twin entities and/or workflows. For example, a CFO may collaborate with a COO and a CTO about the possible replacement of an internal system or a piece of machinery or equipment, where the current system, machinery or equipment and/or the potential replacement system, machinery, or equipment is/are represented in the digital twin by visual and other elements. During collaboration, the collaboration suite 8006 may recognize the identities/roles of the CFO, COO and CTO and may automatically configure their respective collaboration views into the example digital twin based on those roles. For example, the CFO may be presented with a view that is augmented with financial data, such as the cost of the item and various possible replacements, terms and conditions of leasing agreements, depreciation information, information on the financial impacts on productivity, or the like. Meanwhile, the collaboration suite 8006 may present the COO with information depicting the relationship of the item to operational processes, such as linkages to other systems involved in a production line, timing information (such as scheduled downtimes for a facility) and the like. In this example, the CTO may be presented with performance specifications and capability information for an item and various possible replacements, including, for example, compatibility information that indicates the extent to which various possible replacements are compatible with other items represented in the digital twin (including physical/mechanical compatibility, data compatibility, software compatibility, and many other forms of technology compatibility), reviews and ratings, and other technical information. Each executive user may be presented with respective information that is in the respective user's "native language" (e.g., information that is tailored to each executive's respective expertise and needs) and with respective views and/or features that are comfortable for that user, while the group can collaborate (in live or asynchronous modes) to raise issues, engage in commentary and dialog, perform analysis (including simulations as described herein) to arrive at a decision (e.g., about selection and timing of a replacement, or an alternative like a repair) that is financially prudent, operationally effective, and technologically sound. Thus, a role-sensitive collaboration environment integrated with respect to a shared enterprise digital twin enables collaboration around digital twin entities and workflows while allowing users to engage with role-sensitive views and features. In embodiments the collaboration suite 8006 and or other systems of the EMP100 (e.g., the digital twin system 8004) may access a semantic model of an enterprise taxonomy to automatically generate and/or provide information that is presented in a shared digital twin (such as role-specific augmentation of entities with text or symbols that is derived from data or metadata based on state information or other data). In embodiments, the enterprise taxonomy may be learned by the EMP100 via an analysis of data provided by the enterprise or may be manually uploaded by a user (e.g., a configurating user associated with the enterprise). The information in the digital twin may be presented with a role-specific understanding of the taxonomy, such as where the same entity (e.g., a piece of equipment) is given a different name by different groups in the enterprise (e.g., referred to as an "asset" by the finance department and a "machine" by the operations team) and/or where attributes of the entity or related workflows use different terminology, codes, symbols, or the like that are role-specific or group-specific. In embodiments the collaboration suite 8006 may automatically enable translation of terminology between roles, such as translating commentary that uses the name of an entity or that describes attributes of the entity from one role-specific form to another role-specific form. Automatic translation may present alternative terms together (e.g., as the "asset/machine" or "code red/urgent"). In embodiments, automated translation may be performed by translation models (e.g., enterprise-specific translation models) that are trained by machine learning or similar techniques, whereby the translation models may be leveraged to provide automated translation for role-sensitive entity, workflow and attribute presentation. In embodiments, the translation models may be trained using a training data set of translations generated by human experts and/or by unsupervised learning techniques that operate on the data of the enterprise to identify associations between different terms used by different roles and/or groups to describe the same thing. In embodiments, translation models may be seeded by an explicit translation model or may be accomplished by deep learning or similar techniques known to those of skill in the art.

In embodiments, the expert agent system 8008 trains expert agents that perform/recommend actions on behalf of an expert. An expert agent may be a software module that implements and/or leverages artificial intelligence services to perform/recommend actions on behalf of or in lieu of an expert. In embodiments, an expert agent may include one or more machine-learned models (e.g., neural networks, prediction models, classification models, Bayesian models, Gaussian models, decision trees, random forests, and the like, including any of the artificial intelligence systems, expert systems, or the like described throughout this disclosure and/or the documents incorporated herein by reference) that perform machine-learning tasks, including robotic process automation, in connection with a defined role. Additionally or alternatively, an expert agent may be configured with artificial intelligence rules that determine actions in connection with a defined role. The artificial intelligence rules may be programmed by a user or may be generated by the expert agent system 8008. An expert agent may be executed at a client device 8050 and/or may be executed by or by a system that is linked to or integrated with the EMP 8000. In embodiments, the expert agent may be accessed as a service (e.g., via an API), such as in a service-oriented architecture, which in embodiments may be integrated with the EMP as service that is part of a microservices architecture. In embodiments where an expert agent is at least partially executed at a client device, the EMP 8000 may train an executive agent and may serve the trained executive agent to a client application 8052. In embodiments, an expert agent may be implemented as a container (e.g., a Docker container), virtual machine, virtualized application, or the like that may execute at the client device 8050 or at the EMP 8000. In embodiments the expert agent is further configured to collect and report data to the expert agent system 8008, which the expert agent system 8008 uses to train/reinforce/reconfigure the expert agent. Many examples of such training are described throughout this disclosure and many others are intended to be encompassed by the disclosure.

In some embodiments, the expert agent system 8008 (working in connection with the artificial intelligence services system 8010) may train expert agents (e.g., executive agents and other expert agents), such as using robotic process automation techniques, machine learning techniques, or other artificial intelligence or expert systems as described throughout this disclosure and/or the documents incorporated by reference herein to perform one or more executive actions on behalf of respective users, such as executives or other users who are responsible for undertaking activities that are automated by the robotic process automation or other techniques. In some of these embodiments, a client application 8052 may execute on a client device 8050 (e.g., a user device, such as a tablet, an AR and/or VR headset, a mobile device, or a laptop, an embedded device, an enterprise server, or the like) associated with a user (e.g., an executive, an administrative assistant of the executive, a board member, a role-based expert, a manager, a worker, or any other suitable employee or affiliate). In embodiments, the client application 8052 may record the interactions of a user with the client application 8052 and may report the interactions to the expert agent system 8008. In these embodiments, the client application 8052 may further record and report features relating to the interaction, such as any stimuli or inputs that were presented to the user, what the user was viewing at the time of the interaction, the type of interaction, the role of the user, whether the interaction was requested by someone else, the role of the individual that requested the interaction, contextual information, state information, workflow information, event information, and the like. The expert agent system 8008 may receive the interaction data and related features and may generate, train, configure, and/or update an executive agent based thereon. In embodiments, the interactions may be interactions by the user with an enterprise digital twin (e.g., an environment digital twin, a role-based digital twin, a process digital twin, and the like). In embodiments, the interactions may be interactions by the user with data, such as sensor data (e.g., vibration data, temperature data, pressure data, humidity data, radiation data, electromagnetic radiation data, motion data, and/or the like) and/or data streams collected form physical entities of the enterprise (e.g., machinery, a building, a shipping container, or the like), data from various enterprise and/or third-party data sources (as described throughout this disclosure and incorporated documents), entity data (such as characteristics, features, parameters, settings, configurations, attributes and the like), workflow data (such as timing, decision steps, events, tasks activities, dependencies, resources, or the like), and many other types of data. For example, a user may be presented with sensor data from a particular piece of machinery or equipment and, in response, may determine that a corrective action to be taken with respect to the piece of machinery or equipment. In this example, the expert agent may be trained on the conditions that cause the user to take a corrective action as well as instances where the user did not take corrective actions. In this example, the expert agent may learn the circumstances in which corrective action is taken.

In embodiments, the expert agent system 8008 may train expert agents based on user interactions with network entities and/or computation entities. For example, the expert agent system 8008 may train an expert agent to learn the manner by which an IT expert diagnoses and handles a security breach. In this example, the expert agent may be trained to learn the steps undertaken by the expert to diagnose a security breach, the individuals within the enterprise that the security breach is reported to, and any actions undertaken by the expert to resolve the security breach.

In embodiments, the types of actions that an expert agent may be trained to perform/recommend include: selection of a tool, selection of a task, selection of a dimension, setting of a parameter, configuration of settings, flagging an item for review, providing an alert, providing a summary report of data, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource, amongst other possible types of actions. In embodiments, an expert agent may be trained to perform other types of tasks, such as: determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware. As discussed, an expert agent is configured to determine an action and may output the action to a client application 8052. Examples of an output of an expert agent may include a recommendation, a classification, a prediction, a control instruction, an input selection, a protocol selection, a communication, an alert, a target selection for a communication, a data storage selection, a computational selection, a configuration, an event detection, a forecast, and the like. Furthermore, in some embodiments, the expert agent system 8008 may train expert agents to provide training and/or guidance rather in addition to or in lieu of outputting an action. In these embodiments, the training and/or guidance may be specific for a particular individual or role or may be used for other individuals.

In embodiments, the expert agent system 8008 is configured to provide benefits to experts that participate in the training of expert agents. In some embodiments, the benefit is a reward that is provided based on the outcomes stemming from the user of an expert agent that is trained at least in part based on actions by the expert user. In some embodiments, the benefit is a reward that is provided based on the productivity of the expert agent. For example, if an expert agent trained by an individual is leveraged in connection with a set of users in the enterprise (or outside the enterprise), an account with the individual may be credited with a benefit such as a cash rewards, stock rewards, gift card rewards, or the like. As the expert agent is used more, the benefit to the individual may be increased. In some embodiments, the benefit is a reward that is provided based on a measure of expertise of the expert agent. For example, individuals having a more sought after/valuable skill may be awarded greater benefits than individuals having a less sought after/valuable skill. In some embodiments, the benefit is a share of the revenue or profit generated by, or cost savings resulting from, the work produced by the expert agent. In some embodiments, the benefit is tracked using a distributed ledger (e.g., a blockchain) that captures information associated with a set of actions and events involving the expert agent. In some of these embodiments, a smart contract may govern the administration of the reward to the expert user.

In some embodiments, a set of expert agents trained by the expert agent system 8008 may be deployed as a double of at least a portion of a workforce of an enterprise, where the expert agents perform tasks of different roles within the enterprise. In some of these embodiments, the expert agents may be trained upon a training set of data that includes a set of interactions by members of a defined workforce of the enterprise during performance of the defined set of roles of the defined workforce (e.g., interactions with physical entities, digital twins, sensor data, data streams, computational entities, and/or network entities, among many others). In some embodiments, the interactions may be parsed to identify a chain of operations performed by the workforce and/or a chain of reasoning, whereby the chain of operations and/or chain of reasoning are used to train the expert agents. In some embodiments, the interactions may be parsed to identify types of processing performed by the workforce upon a set of information, whereby the type of processing is embodied in the configuration of the respective expert agents. Examples of workforces may include, factory operations, plant operations, resource extraction operations, network operations (e.g., responsible for operating a network for an industrial enterprise), a supply chain workforce, a logistics planning workforce, a vendor management workforce, a brokering workforce for a marketplace, a trading workforce for a marketplace, a trade reconciliation workforce for a marketplace, a transactional execution workforce for a marketplace, and the like.

In some embodiments, the expert agent system 8008 and/or a client application 8052 can monitor outcomes related to the user's interactions and may reinforce the training of the expert agent based on the outcomes. For example, each time the user takes a corrective action, the expert agent system 8008 may determine the outcome (e.g., whether a particular condition or issue was resolved) and whether the outcome is a positive outcome or a negative outcome. The expert agent system 8008 may then retrain the expert agent based on the outcome. Examples of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome. In these embodiments, the expert agent system 8008 may monitor data obtained from the various data sources after an action is taken to determine an outcome (e.g., sales increased/decreased and by how much, energy utilization decreased/increased and by how much, costs decreased/increased and by how much, revenue increased/decreased and by how much, whether consumption decreased/increased and by how much, whether a fault condition was resolved, and the like). The expert agent system 8008 may include the outcome in the training data set associated with the action undertaken by the expert that resulted in the outcome.

In some embodiments, the expert agent system 8008 receives feedback from users regarding respective executive agents. For example, in some embodiments, a client application 8052 that leverages an expert agent may provide an interface by which a user can provide feedback regarding an action output by an expert agent. In embodiments, the user provides the feedback that identifies and characterizes any errors by the expert agent. In some of these embodiments, a report may be generated (e.g., by the client application or the EMP 8000) that indicates the set of errors encountered by the expert. The report may be used to reconfigure/retrain the executive agent. In embodiments, the reconfiguring/retraining an executive agent may include removing an input that is the source of the error, reconfiguring a set of nodes of the artificial intelligence system, reconfiguring a set of weights of the artificial intelligence system, reconfiguring a set of outputs of the artificial intelligence system, reconfiguring a processing flow within the artificial intelligence system, and/or augmenting the set of inputs to the artificial intelligence system.

In embodiments, the expert agent may be configured to, at least partially, operate as a double of the expert for a defined role within an enterprise. In these embodiments, the expert agent system 8008 trains an expert agent based on a training data set that includes a set of interactions by a specific expert worker during the performance of their respective role. For example, the set of interactions that may be used to train the executive agent may include interactions of the expert with the physical entities of an enterprise, interactions of the expert with an enterprise digital twin, interactions of the expert with sensor data obtained from a sensor system of the enterprise, interactions of the expert with data streams generated by the physical entities of the enterprise, interactions of the expert with the computational entities of the enterprise, interactions of the expert with the network entities, and the like. In some embodiments, the expert agent system 8008 parses the training data set of interactions to identify a chain of reasoning of the expert upon a set of interactions. In some of these embodiments, the chain of reasoning may be parsed to identify a type of reasoning of the worker, which may be used as a basis for configuring/training the expert agent. For example, the chain of reasoning may be a deductive chain of reasoning, an inductive chain of reasoning, a predictive chain of reasoning, a classification chain of reasoning, an iterative chain of reasoning, a trial-and-error chain of reasoning, a Bayesian chain of reasoning, a scientific method chain of reasoning, and the like. In some embodiments, the expert agent system parses the training data set of interactions to identify a type of processing undertaking by the expert in analyzing the set of interactions. For example, types of processing may include audio processing in analyzing audible information, tactile or "touch" processing in analyzing physical sensor information, olfactory processing in analyzing chemical sensing information, textual information processing in analyzing text, motion processing in analyzing motion information, taste processing in analyzing chemical information, mathematical processing in mathematically operating on numerical data, executive manager processing in making executive decisions, creative processing when deriving alternative options, analytic processing when selecting from a set of options, and the like.

In embodiments the expert agents include executive agents that are trained to output actions on behalf of executive and/or an administrator of an executive. In these embodiments, an expert agent may be trained for executive roles, such that a user in an executive role can train the executive agent by performing their respective role. For example, an executive agent may be trained for performing actions on behalf of or recommending actions to a user in an executive role. In some of these embodiments, the client application 8052 may provide the functionality of the enterprise management platform 8000. For example, in some embodiments, users may view executive digital twins and/or may use the collaboration tools via the client application 8052. During the use of the client application 8052, an executive may either escalate issues identified in the respective executive digital twin to another member of the enterprise. Each time the user interacts with the client application 8052, the client application 8052 may monitor the user's actions and may report the actions back to the expert agent system 8008. Over time, the expert agent system 8008 may learn how the particular user responds to certain situations. For instance, if the user is the CFO and each time a critical state with revenue or costs is identified in the CFO digital, the CFO escalates the critical state to the CEO, the expert agent system 8008 may learn to automatically escalate critical revenue states and critical cost states to the CEO. Further implementations of the expert agent system 8008 are discussed further in the disclosure.

In embodiments, the artificial intelligence services system 8010 performs machine learning, artificial intelligence, and analytics tasks on behalf of the EMP 8000. In embodiments, the artificial intelligence services system 8010 includes a machine learning system that trains machine learned models that are used by the various systems of the EMP 8000 to perform some intelligence tasks, including robotic process automation, predictions, classifications, natural language processing, and the like. In embodiments, the EMP 8000 includes an artificial intelligence system that performs various AI tasks, such as automated decision making, robotic process automation, and the like. In embodiments, the EMP 8000 includes an analytics system that performs different analytics across enterprise data to identify insights to various states of an enterprise. For example, in embodiments, the analytics system may analyze the financial data of an enterprise to determine whether the enterprise is financially stable, in a critical condition, or a desirable condition. In embodiments, the analytics system may perform the analytics in real-time as data is ingested from the various data sources to update one or more states of an enterprise digital twin. In embodiments, the intelligence system includes a robotic process automation system that learns behaviors of respective users and automates one or more tasks on behalf of the users based on the learned behaviors. In some of these embodiments, the robotic process automation system may configure expert agents on behalf of an enterprise. The robotic process automation system may configure machine-learned models and/or AI logic that operate to output actions given stimulus. In embodiments, the robotic process automation system receives training data sets of interactions by experts and configures the machine-learned models and/or AI logic based on the training data sets. In embodiments, the artificial intelligence services system 8010 includes a natural language processing system that receives text/speech and determines a context of the text and/or generates text in response to a request to generate text. The intelligence services are discussed in greater detail throughout the disclosure.

In embodiments, the EMP 8000 includes an enterprise data store 8012 that stores data on behalf of customer enterprises. In embodiments, each customer enterprise may have an associated data lake that receives data from various data sources 8020. In some embodiments, the EMP 8000 receives the data via one or more APIs 8014. For example, in embodiments, the API may be configured to obtain real-time sensor data from one or more sensor systems 8022 of an enterprise. The sensor data may be collected in a data lake associated with the enterprise. The digital twin system 8004 and the artificial intelligence services system 8010 may structure the data in the data lake and may populate one or more respective enterprise digital twins based on the collected data. In some embodiments, the data sources 8020 may include a set of edge devices 8042 that collect, receive and process data from a sensor system 8022, from suitable IoT devices, from local networking devices (e.g., wireless and fixed network resources, including repeaters, switches, mesh network nodes, routers, access points, gateways, and others), from general purpose networking devices (e.g., computers, laptops, tablets, smartphones and the like), from smart products, from telemetry systems of machinery, equipment, systems and components (e.g., onboard diagnostic systems, reporting systems, streaming systems, syndication systems, event logs and the like), data collected by data collectors (including drones, mobile robots, RFID and other readers, and human-portable collectors) and/or other suitable data sources. In some of these embodiments, the edge devices 8042 may be configured to process sensor data (or other suitable data) collected at a "network edge" of the enterprise. Edge processing of enterprise data may include sensor fusion, data compression, computation, filtering, aggregation, multiplexing, selective switching, batching, packetization, streaming, summarization, fusion, fragmentation, encoding, decoding, transcoding, copying, storage, decompression, syndication, augmentation (e.g., by metadata), content inspection, classification, extraction, transformation, normalization, loading, formatting, error correction, data structuring, and/or many other processing actions. In some embodiments, the edge device 8042 may be configured to operate on the collected data and to adjust an output data stream or feed based on the contents of the collected data and/or based on contextual information, such as network conditions, operational conditions, environmental conditions, workflow conditions, entity state information, data characteristics, or many others. For example, an edge device 8042 may stream granular sensor data that is identified to be anomalous without compression, while the edge device 8042 may compress, summarize, or otherwise pass on a less granular data that is considered to be within a tolerance range of normal conditions or that reflects characteristics (e.g., statistical or signal characteristics) that suggest a lower likelihood that the data is likely to be of high interest. In this way, the edge device 8042 may provide semi-sentient data streams. Semi-sentience at the edge device 8042 may be improved by machine learning and training on a set of outcomes or feedback from users using process automation, machine learning, deep learning, or other artificial intelligence techniques as described herein. In embodiments, the EMP 8000 may store the data streams in the data lake and/or may update one or more enterprise digital twins with some or all of the received data.

In embodiments, the client devices 8050 may execute one or more client applications 8052 that interface with the EMP 8000. In embodiments, a client application 8052 may request and display one or more enterprise digital twins. In some of these embodiments, a client application 8052 may depict an executive digital twin corresponding to the role of the user. For example, if the user is designated as the Chief Marketing Officer, the EMP 8000 may provide a CMO digital twin of the enterprise of the user. In some of these embodiments, the user data stored at the EMP 8000 and/or the client device 8050 may indicate the role of the user and/or the types of enterprise digital twins (and features thereof) to which the user has access.

In embodiments, the client application 8052 may display the requested executive digital twin and may provide one or more options to perform one or more respective actions/operations corresponding to the executive digital twin and the states depicted therein. In embodiments, the actions/operations may include one or more of "drilling down" into a particular state, escalating or otherwise notifying another user of a state or set of states, exporting a state or set of states into a collaborative environment (e.g., into a word processor document, a spreadsheet, a presentation document, a slide show, a model (e.g., a CAD model, a 3D model, or the like), a report (e.g., an annual report, a quarterly report, or the like), a website, a Wiki, a dashboard, a collaboration environment location (e.g. a Slack™ location), a workflow application, or the like), sending a request for action with respect to one or more states from another user, performing a simulation, adjusting interface elements (such as changing sizes, colors, locations, brightness, presence/absence of display, etc.), or the like. For example, a COO or other operations executive may view an operations or COO digital twin. The states that may be depicted in the COO digital twin may include notifications of potential issues with one or more pieces of machinery or equipment (e.g., among many others, as observed from analyzing a stream of data from one or more sensors on a piece of robotic equipment). In viewing the COO digital twin, the user may wish to escalate the issue, such as to the CEO, request input from another executive and/or to instruct an operations manager, such as a warehouse or plant manager, to handle the issue. In this example, the client application depicting the COO digital twin may allow the user to select an option to escalate the issue. In response to the user selecting the "escalate" option, the client application 8052 transmits the escalate request to the EMP 8000. The EMP 8000 may then determine the appropriate user or users to which the issue is escalated. In some embodiments, the EMP 8000 may determine the reporting structure of the enterprise from an organizational digital twin of the enterprise to which the users belong. In this example, if the operations executive elects to have the operations manager handle the issue, the user may select an option to share the state with another user. The user may then enter an identifier of the intended recipient (e.g., an email address, phone number, text address, user name, role description, or other identifier of the recipient (such as identifiers for the recipient in various workflow environments, collaboration environments and the like (including other digital twins), and the like) and may input a message indicating instructions to the intended recipient. In response, the EMP 8000 may communicate the identified state to the intended recipient.

In another example, the client application 8052 may depict a CFO digital twin to a user (e.g., the CFO of an enterprise). In this example, the CFO may be tasked with preparing a quarterly report at the request of the CEO. In this example, the CFO may view a set of different financial states, including a P&L data, historical sales data (e.g., quarterly sales data and/or annual sales data), real-times sales data, projected sales data, historical cost data (e.g., quarterly costs and/or annual costs), projected costs, and the like. In this example, the CFO may select the states to include in the annual report, including the P&L data, quarterly sales data, and quarterly cost data. In response to the user selection, the client application 8052 may transmit a request to export the selected states into the annual report. In this example, the EMP 8000 may receive the request, identify the document (e.g., the annual report), and may include the selected states into the identified document.

In embodiments, the client application 8052 may include a monitoring agent that monitors the manner by which a user responds to specific requests (e.g., a request from the CEO to populate a report) or notifications (e.g., a notification that a piece of machinery requires maintenance). The monitoring agent may report the user's response to such prompts to the EMP 8000. In response, the EMP 8000 may train an executive agent (which may include one or more machine-learned models) to handle such notifications when they next arrive. In some embodiments, the monitoring agent may be incorporated in an executive agent that is incorporated in the client application 8052.

Figure 69:
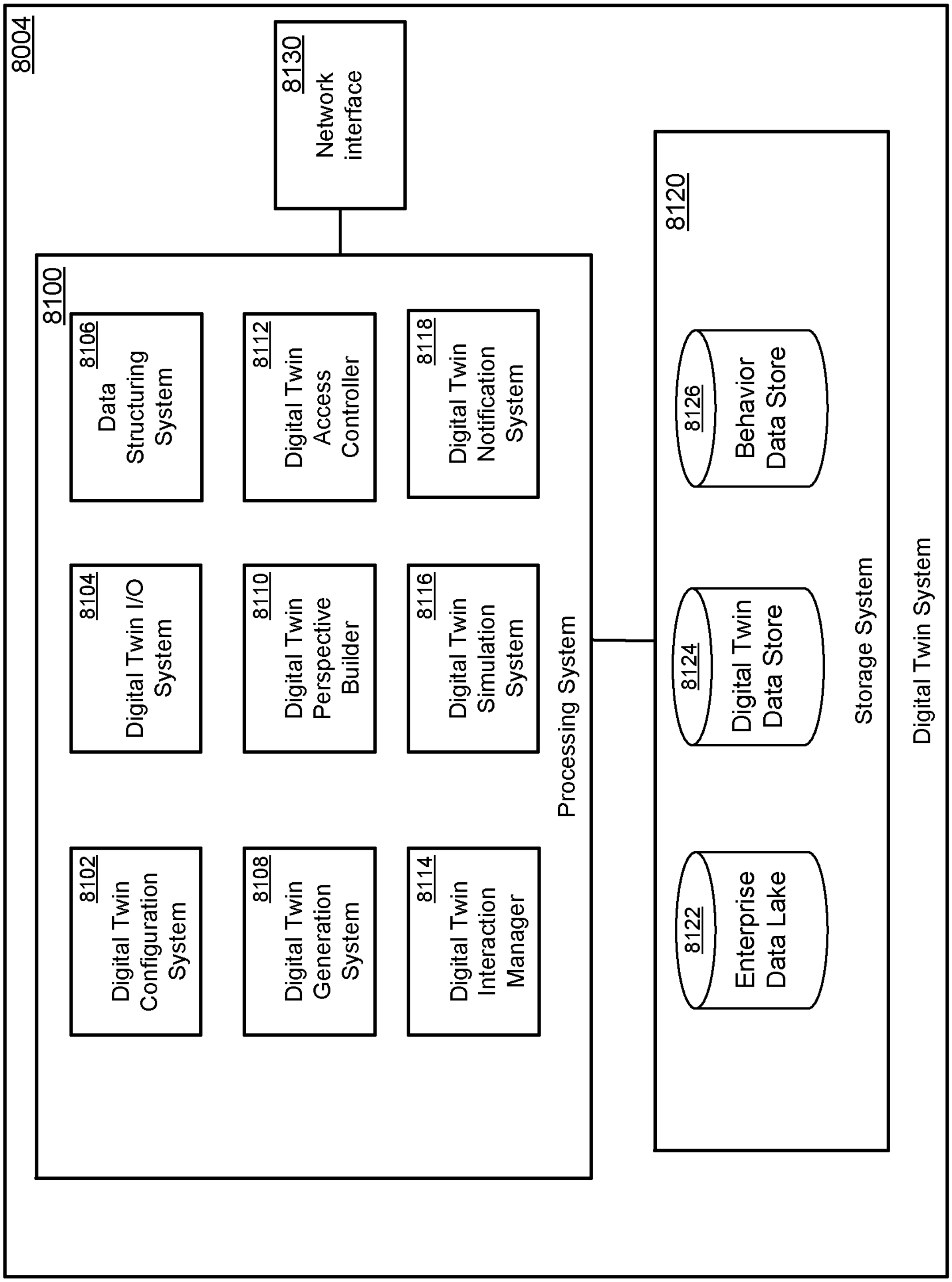
FIG. 69 is a schematic illustrating an example set of components of the enterprise control tower and management platform according to some embodiments of the present disclosure.

FIG. 69 illustrates an example set of components of a digital twin system 8004. As discussed, a digital twin system 8004 is configured to generate visual and/or data-based digital twins, including enterprise digital twins, and to serve the digital twins to a client (e.g., a user device, a server, and/or internal and/or external applications that leverage digital twins). In embodiments, the digital twin system 8004 is an infrastructure component of the EMP 8000. In embodiments, the digital twin system 8004 is a microservice that is accessible by the EMP 8000 and/or other components of a value chain control tower.

In embodiments, the digital twin system 8004 is executed by a computing system (e.g., one or more servers) that may include a processing system 8100 that includes one or more processors, a storage system 8120 that includes one or more computer-readable mediums, and a network interface 8130 that includes one or more communication units that communicate with a network (e.g., the Internet, a private network, and the like). In the illustrated example embodiments, the processing system 8100 may execute one or more of a digital twin configuration system 8102, digital twin I/O system 8104, a data structuring system 8106, a digital twin generation system 8108, a digital twin perspective builder 8110, a digital twin access controller 8112, a digital twin interaction manager 8114, an digital twin simulation system 8116, and a digital twin notification system 8118. The processing system 8100 may execute additional or alternative components without departing from the scope of the disclosure. In embodiments, the storage system 8120 may store enterprise data, such as an enterprise data lake 8122, a digital twin data store 8124, a behavior datastore 8126 and/or other datastore, such as a distributed datastore, such as a set of blockchains or distributed data storage resources. The storage system 8120 may store additional or alternative data stores without departing from the scope of the disclosure. In embodiments, the digital twin system 8004 may interface with the other components of the EMP 8000, such as the enterprise configuration system 8002, the collaboration suite 8006, the expert agent system 8008, and/or the artificial intelligence services system 8010.

In embodiments, the digital twin configuration system 8102 is configured to set up and manage the enterprise digital twins and associated metadata of an enterprise, to configure the data structures and data listening threads that power the enterprise digital twins, and to configure features of the enterprise digital twins, including access features, processing features, automation features, reporting features, and the like, each of which may be affected by the type of enterprise digital twin (e.g., based on the role(s) that it serves, the entities it depicts, the workflows that it supports or enables and the like). In embodiments, the digital twin configuration system 8102 receives the types of digital twins that will be supported for the enterprise, as well as the different objects, entities, and/or states that are to be depicted in each type of digital twin. For each type of digital twin, the digital twin configuration system 8102 determines one or more data sources and types of data that feed or otherwise support each object, entity, or state that is depicted in the respective type of digital twin and may determine any internal or external software requests (e.g., API calls) that obtain the identified data types or other suitable data acquisitions mechanisms, such as webhooks, that are configured to automatically receive data from an internal or external data source In some embodiments, the digital twin configuration system 8102 determines internal and/or external software requests that support the identified data types by analyzing the relationships between the different types of data that correspond to a particular state/entity/object and the granularity thereof. Additionally or alternatively, a user may define (e.g., via a GUI) the data sources and/or software requests and/or other data acquisition mechanisms that support the respective data types that are depicted in a respective digital twin. In these embodiments, the user may indicate the data source that are to be accessed and the types of data to be obtained from the respective data source. For example, if a user is configuring an enterprise digital twin of a supply chain process, the user may identify an inventory management system to obtain inventory levels, various supplier systems to obtain pricing data of particular items, sensor systems to obtain sensor data from various points within the enterprise's supply chain (e.g., manufacturing facilities, warehouse facilities, and the like), and other suitable systems for other suitable data types. In this data definition process a user may associate specific data types and/or data sources to corresponding structural elements of a digital twin (e.g., layouts, spatial elements, processes, or components thereof). For example, the user can match a specific cost of a good (e.g., the cost of a bearing on a compressor, a headlight that goes into an automobile, an automobile, or any other suitable good) that is obtained via an API request to a seller of the good with a digital twin element representing the good (e.g., a 3D model of the good). In this example, the digital twin of the good may depict the cost of the good, and as the price of the good changes, so too may the depiction of the good.

In embodiments, the configuration system 8102 generates one or more foreign keys for each digital twin that collectively associate different data types with the structural elements of the digital twin. Thus, when a digital twin is generated, the foreign key may be leveraged to connect data obtained from the data sources to the structural elements of the digital twin. In some embodiments, a configuring user may define the associations that are used to generate the set of foreign keys.

In embodiments, the digital twin configuration system 8102 determines, defines, and manages the data structures needed to support each type of digital twin, such as data lakes, relational databases, SQL databases, NOSQL databases, graph databases, and the like. For example, for an environment digital twin, the digital twin configuration system 8102 may instantiate a database (e.g., a graph database that defines the ontology of the environment and the objects existing (or potentially existing) within the environment and the relationships therebetween), whereby the instantiated database contains and/or references the underlying data that powers the environmental digital twin (e.g., sensor data and analytics relating thereto, 3D maps, physical asset twins within the environment, and the like). In some embodiments, a user may define an ontology of a respective digital twin, such that the ontology defines the types of data depicted in the digital twin and the relationships between those data types. Additionally or alternatively, the digital twin configuration system 8102 may derive the ontology based on the types of digital twins that are to be configured.

In some embodiments, the different types of enterprise digital twins may be configured in accordance with a set of preference settings, granularity settings, alert settings, taxonomy settings, topology settings, and the like. In some embodiments, the configuration system 8102 may utilize pre-defined preferences (e.g., default preference templates for different types of enterprise digital twins, including ones that are domain-specific, role-specific, industry-specific, workflow-specific and the like), taxonomies (e.g., default taxonomies for different types of enterprise digital twins), and/or topologies (e.g., default topologies for different types of twins, such as graph-based topologies, tree-based topologies, serial topologies, flow-based topologies, loop-based topologies, network-based topologies, mesh topologies, and others)). Additionally or alternatively, the configuration system 8102 may receive custom preference settings and taxonomies from a configuring user. Non-limiting examples of role-specific templates that are used to configure a role-based digital twin may include may include CEO template, a COO template, a CFO template, a counsel template, a board member template, a CTO template, a chief marketing officer template, an information technology manager template, a chief information officer template, a chief data officer template, an investor template, a customer template, a vendor template, a supplier template, an engineering manager template, a project manager template, an operations manager template, a sales manager template, a salesperson template, a service manager template, a maintenance operator template, and/or a business development template. Similarly, examples of taxonomies that are used to configure different types of role-based digital twins may include CEO taxonomy, a COO taxonomy, a CFO taxonomy, a counsel taxonomy, a board member taxonomy, a CTO taxonomy, a chief marketing officer taxonomy, an information technology manager taxonomy, a chief information officer taxonomy, a chief data officer taxonomy, an investor taxonomy, a customer taxonomy, a vendor taxonomy, a supplier taxonomy, an engineering manager taxonomy, a project manager taxonomy, an operations manager taxonomy, a sales manager taxonomy, a salesperson taxonomy, a service manager taxonomy, a maintenance operator taxonomy, and/or a business development taxonomy. Each of the role-specific templates may include data types that are specific to the kinds of interactions the role might have and the specific responses to interactions, which may be role-based. For example, a CEO template may include data type definitions for supplier information and labor cost information across the entire organization, and may include responses to interactions with a CEO digital twin, such as drilling down to specific suppliers and/or labor groups within the enterprise.

In embodiments, the digital twin configuration system 8102 may be configured to configure and instantiate the databases that support each respective enterprise digital twin of an enterprise (e.g., role-based digital twins, environment digital twins, organizational digital twins, process digital twins, and the like), which may be stored on the digital twin data store 8124. In embodiments, for each database configuration, the digital twin configuration system 8102 may identify and connect any external resources needed to collect data for each respective data type. For each identified external resource, the digital twin configuration system 8102 may configure one or more data collection threads to access an API, SDK, port, webhook, search facility, database access facility, and/or other connection facility For example, certain executive digital twins (e.g., CEO digital twin, CFO digital twin, COO digital twin, and CMO digital twin) may each require data derived and/or obtained from a CRM 8026 of the enterprise. In this example, the digital twin configuration system 8102 may configure one or more data collection threads to access an API, SDK, port, webhook, search facility, database access facility, and/or other connection facility of the CRM 8026 of the enterprise on behalf of the enterprise and may obtain any necessary security credentials to access the API. In another example, in order to collect data from one or more edge devices 8042 of the enterprise, the configuration system 8102 may initiate a process of granting access to the edge devices 8042 of the enterprise to the APIs of the EMP 8000, such that the edge devices 8042 may provide digital twin data to the EMP 8000.

In embodiments, the digital twin I/O system 8104 is configured to obtain data from a set of data sources (e.g., users, sensor systems, internal and/or external databases, software platforms (e.g., CRMs, ERPs, CRMs, workflow management system), surveys, customers, and the like). In some embodiments, the digital twin I/O system 8104 (or other suitable component) may provide a graphical user interface that allows a user affiliated with an enterprise to upload various types of data that may be leveraged to generate the enterprise digital twins of the enterprise. For example, in providing data to support an environment digital twin, a user may upload 3D scans, still and video images, LIDAR scans, structured light scans, blueprints, 3D floor plans, object types (e.g., products, sensors, machinery, furniture, and the like), object properties (e.g., materials, physical properties, descriptions, price, and the like), output type (e.g., sensor units), architectural drawings, CAD documents, equipment specifications, and many others via the digital twin I/O system 8104. In embodiments, the digital twin I/O system 8104 may subscribe to or otherwise automatically receive data streams (e.g., publicly available data streams, such as RSS feeds, news streams, event streams, log streams, sensor system streams, and the like) on behalf of an enterprise. Additionally or alternatively, the digital twin system I/O system 8104 may periodically query and/or receive data from a connected data source 8020, such as a sensor system 8022 having sensors that sensor data from facilities (e.g., manufacturing facilities, shipping facilities, warehouse facilities, logistics facilities, retail facilities, distribution facilities, agricultural facilities, resource extraction facilities, computing facilities, transportation facilities, infrastructure facilities, networking facilities, data center facilities, and many others) and/or other physical entities of the enterprise, a sales database 8024 that is updated with sales figures in real time, a CRM system 8026, a content marketing platform 8028, financial databases 8030, surveys 8032, org charts 8034, workflow management systems 8036, third-party data sources 8038, customer databases 8040 that store customer data, and/or third-party data sources 8038 that store third-party data, edge devices 8042 that report data relating to physical assets (e.g., smart machinery/manufacturing equipment, sensor kits, autonomous vehicles, of the enterprise, wearable devices, and the like), enterprise resource management systems 8044, HR systems 8046, content management systems 8026, and the like). In embodiments, the digital twin I/O system 8104 may employ a set of web crawlers to obtain data. In embodiments, the digital twin I/O system 8104 may include listening threads that listen for new data from a respective data source. In embodiments, the digital twin I/O system 8104 may be configured with a set of webhooks that receive data from a respective set of data sources. In these embodiments, the digital twin I/O system 8104 may receive data that is pushed from an external data source, such as real-time data.

In some embodiments, the digital twin I/O system 8104 is configured to serve the obtained data to instances of enterprise digital twins (which is used to populate digital twins) that are executed by a client device 8050 or the EMP 8000. In embodiments, the digital twin I/O system 8104 receives data stream feeds received data streams received and/or collected on behalf on an enterprise and stores at least a portion of the streams into a data lake 8122 associated with the enterprise. In embodiments, the data that is streamed into the data lake 8122 may be structured and stored in one or more databases stored in the digital twin data stores 8124.

In embodiments, the data structuring system 8106 is configured to process and structure data into a format that can be consumed by an enterprise digital twin. In embodiments, processing by the data structuring system 8106 may include compression, computation, filtering, aggregation, multiplexing, selective switching, batching, packetization, streaming, summarization, fusion, fragmentation, encoding, decoding, transcoding, encryption, decryption, duplication, deduplication, normalization, cleansing, identification, copying, storage, decompression, syndication, augmentation (e.g., by metadata), content inspection, classification, extraction, transformation, loading, formatting, error correction, data structuring, and/or many other processing actions. In embodiments, the data structuring system 8106 may leverage ETL (extract, transform, load) tools, data streaming, and other data integration tooling to structure the various types of digital twin data. In embodiments, the data structuring system 8106 structures the data according to a digital twin data model that may be defined by the digital twin configuration system 8102 and/or a user. In embodiments, a digital twin data model may refer to an abstract model that organizes elements of enterprise-related data and standardizes the manner by which those elements relate to one another and to the properties of digital twin entities. For instance, a digital twin data model of an environment that includes vehicles (e.g., a vehicle assembly facility or an environment where vehicles operate) may specify that the data element representing a vehicle be composed of a number of other elements which represent sub-elements or attributes of the vehicle (the color of the vehicle, the dimensions of the vehicle, the engine of the vehicle, the engine parts of the vehicle, the owner of the vehicle, the performance specifications of the vehicle, and the like). In this example, the digital twin model components may define how the physical attributes are tied to respective physical locations on the vehicle. In embodiments, digital twin data models may define a formalization of the objects and relationships found in a particular application domain. For example, a digital twin data model may represent the customers, products, and orders found in a manufacturing enterprise and how they relate to each other within the various digital twins. In another example, a digital twin data model may define a set of concepts (e.g., entities, attributes, relations, tables, and/or the like) used in defining such formalizations of data or metadata within the environment. For example, a digital twin data model used in connection with a banking application may be defined using the entity-relationship data model and how the entity-relationship data model is then related to the various executive digital twin views.

In embodiments, the digital twin generation system 8108 serves enterprise digital twins on behalf of an enterprise. In some instances, the digital twin generation system 8108 receives a request for a specific type of digital twin from a client application 8052 being executed by a client device 8050 (e.g., via an API). Additionally or alternatively, the digital twin generation system 8108 receives a request for a specific type of digital twin from a component of EMP 8000 (e.g., the digital twin simulation system 8116). The request may indicate the enterprise, the type of digital twin, the user (whose access rights may be verified or determined by the digital access controller 8112), and/or a role of the user. In some embodiments, the digital twin generation system 8108 may determine and provide the client device 8050 (or requesting component) with the data structures, definition of grain of data the, response patterns to specific inputs, animation sequences for illustrating behaviors, display aggregation methods for smaller displays (such as mobile phone), immersive data interaction systems, security constraints on the data viewing, viewing interaction speed (frame rate), nature of light sources (simulate actual or continuous), multiple user engagement protocols, network bandwidth constraints, metadata, ontology and information on hooks to data feeds as well as the digital twin constructs. This information may be used by the client to generate the digital twin in the end user device (e.g., an immersive device, such as AR devices or VR devices, tablet, personal computer, mobile, or the like). In embodiments, the digital twin generation system 8108 may determine the appropriate perspective for the requested digital twin (e.g., via the digital twin perspective builder 8110, which may include device-sensitive perspectives, such as delivering in appropriate formats based on the type of end user device) and any data restrictions, interaction restrictions, depth of data restrictions, usage restrictions, length of visibility restrictions, that the user may have (e.g., via the access controller 8112). In response to determining the perspective and data restrictions, the digital twin generation system 8108 may generate the requested digital twin. In some embodiments, generating the requested digital twin may include identifying the appropriate data structure given the perspective and obtaining the data that parameterizes the digital twin, as well as any additional metadata that is served with the enterprise digital twin.

In embodiments, the digital twin generation system 8108 may deliver the enterprise digital twin to the requesting client application 8052 (or requesting component). In embodiments, the digital twin generation system 8108 (or another suitable component) may continue to update a served digital twin with real-time data (or data that is derived from real-time data) as the real-time data is received and potentially analyzed, extrapolated, derived, predicted, and/or simulated by the EMP 8000.

In some embodiments, the digital twin generation system 8108 (in combination with the digital twin I/O system 8104) may obtain data streams from traditional data sources, such as relational databases, API interfaces, direct sensor input, human generated input, Hadoop file stores, graph databases that underlie operational and reporting tooling in the environment, telemetry data sources, onboard diagnostic systems, blockchains, distributed ledgers, distributed data sources, feed, streams, and many other sources. In embodiments, the digital twin generation system 8108 may obtain data streams that are associated with the structural aspects of the data, such as the layout and 3D object properties of entities within facilities, geospatial information systems, the hierarchical design of a system of accounts, and/or the logical relationships of entities and actions in a workflow. In embodiments, the data streams may include metadata streams that are associated with the nature of the data and data streams containing primary data (e.g., sensor data, sales data, survey data, and the like). For example, the metadata associated with a physical facility or other entity may include the types and layers of data that are being managed, while the primary data may include the instances of objects that fall within each layer. Layers for which metadata may be tracked and/or created may include, for example, metadata with respect to attributes, parameters or representations of a whole facility, component systems and assets within the facility (equipment, network entities, workforce entities, assets, and the like), sub-components and sub-systems, and further sub-components and sub-systems down to arbitrarily lower levels of granularity (e.g., a ball bearing of a rotating axle assembly of a fan that is part of a motor assembly driving an assembly line in a location of a warehouse). In embodiments, layers may include, in another example, logical or operational layers, such as a reporting structure, such as from a COO to a VP of operations to a distribution manager to a warehouse manager to a shift manager to a warehouse worker. In embodiments, layers may include workflow or process flow layers, such as from an overall process to its sub-components and decision points, such as an overall assembly process having sub-layers of gathering of input materials and components, positioning of workers, a series of assembly steps, inspection of outputs, and delivery to a post-assembly location.

In embodiments, the digital twin perspective builder 8110 leverages metadata, artificial intelligence, heuristic methods, 3D rendering algorithms and/or other data processing techniques to produce a definition of information required for generation of the digital twin in the digital twin generation system 8108. In some embodiments, different relevant datasets are hooked to a digital twin (e.g., an executive digital twin, an environment digital twin, or the like) at the appropriate level of granularity, thereby allowing for the structural aspects of the data (e.g., system of accounts, sensor readings, sales data, or the like) to be a part of the data analytics process. One aspect of making a perspective function is that the user can change the structural view or the granularity of data while potentially forecasting future events or changes to the structure to guide control of the area of the business at question. In embodiments, the term "grain of data" may refer to the base unit of a type of data, such as a single line of data, a single aggregated line of data, a single byte of data, a single file, a single instance, or the like. Examples of "grains of data" may include a detailed record on a single sale, a single block in a blockchain in a distributed ledger, a single event in an event log, a single vibration reading from a vibration sensor, or similar singular or atomic data units, and the like. Grain or atomicity may impose a constraint in how the data can be combined or processed to form different outputs. For example if some element of data is captured only at the level of once-per-day, then it can only be broken down to single days (or aggregation of days) and cannot be broken down to hours or minutes, unless derived from the day representation (e.g., using inference techniques and/or statistical models). Similarly, if data is provided only at the aggregate business unit level, it can be broken down to the level of an individual employee only by, for example, averaging, modeling, or inductive functions. Generally, role-based and other enterprise digital twins may often benefit from finer levels of data, as aggregations and other processing steps may produce outputs that are dynamic in nature and/or that relate to dynamic processes and/or real-time decision-making. It is noted that different types of digital twins may have different "sized" grains of data. For example, the grains of data that feed a CEO digital twin may be at a higher granularity level than the grains of data that feed a COO digital twin. In some embodiments, however, a CEO may drill down into a state of the CEO digital twin and the granularity for the selected state may be increased.

In embodiments, the perspective builder 8110 adds relevant perspective to the data underlying the digital twin, which is provided to the digital twin generation system 8108. In embodiments, "perspective" may refer to the adjustments to, aggregations of, simplifications of, and/or detail additions to the ontology of a particular digital twin (e.g., a role-based digital twin) that provide the appropriate ontological view of the underlying data with the correct types at the appropriate granularity level. For example, a CEO digital twin may link in fuzzy data with markets data and depict the potential impacts of market forces on a simulated digital twin environment for different scenarios. In another example, in a CFO level digital twin, the internal financial system of accounts may be allocated across the physical structure of the digital twin providing an ability to understand the relationship between revenue generation, cost allocation, and the structural aspects of the business (e.g. the layout of a factory floor, a warehouse, a distribution center, a logistics facility, an office building, a retail location, a container ship, or the like). Continuing this example, the CTO digital twin may include data overlays with current market information on new technologies and linkages therebetween. In this example, the CTO digital twin builds in linkages between an impact of changing technology platforms and outside information that may be used for enhancement of the facility. These different perspectives generated by the perspective builder 8110 combine with the digital twin simulation system 8116 to provide relevant simulations of how scenario-based future states might be handled by the facility, the digital twin simulation system 8116 provides for, recommendations on how to enhance the digitally twin represented facility structurally to meet the needs of the future states, responses to specific changes in the digital twin environment or alterations in the information relating to digital twin simulate elements. In embodiments, the perspective builder 8110 may build perspectives that depict intersections or overlays of operational states and entities with information technology states and entities, which may facilitate recognition of opportunities and/or problems involving the interplay and convergence of information technology and operations technology within the operations of a wide range of industries and domains. In further embodiments, the perspective builder 8110 may build perspectives that allow for different roles to interact with the same digital twin while maintaining different perspectives on the operational states and entities, which allows for these different roles to have a meaningful interaction while maintaining their role-specific perspective. In embodiments, the perspective builder 8110 builds a perspective for a digital twin by providing each different user/role with a respective diagrammatic view expressed as in the digital twin where that diagram includes information and structure at a level relevant to the specific user's role. This user-specific diagram is then connected to the underlying data to provide for the role-based digital twin experience.

In embodiments, the digital twin access controller 8112 informs the generation system 8108 of specific constraints around the roles of users able to view the digital twin as well as providing for dynamically adjustable digital twins that can adapt to constrain or release views of the data or other features specific to each user role. For example sensitive salary data might be obfuscated from most administrative employees when viewing an organizational digital twin, but the CEO may be granted access to view the salary information directly. In embodiments, the digital twin access controller 8112 may receive a user identifier and one or more data types. In response, the digital twin access controller 8112 may determine whether the user indicated by the user identifier has access to the one more data types or other features. In some of these embodiments, the digital twin access controller may look up the user in the organizational digital twin of the enterprise of the user and may determine the user's permissions and restrictions based thereon. Alternatively, the user's permissions and restrictions may be indicated in a user database. In embodiments the organizational digital twin may, as noted above, be generated automatically, such as by parsing available data sources to automatically construct a representation of the organization, such as a hierarchical organizational chart, a graph of the organization with nodes representing organizational entities (e.g., workgroups, roles, assets and personnel), links or connections indicating relationships (e.g., reporting relationships, lines of authority, group affiliations, and the like), and data or metadata indicating other attributes of the entities and relationship, and the like.

In embodiments, the digital twin interaction manager 8114 manages the relationship between the structural view of the data in an enterprise digital twin (e.g., as depicted/represented by the client application 8052) and the underlying data streams and data sources. In embodiments, this interaction layer makes the digital twin into a window into the underlying data streams through the lens of the structure of the data. In embodiments, the digital twin interaction manager 8114 determines the types of data, or the nature of the human interface for building these interactions, that are being fed to an instance of an enterprise digital twin (e.g., an environment digital twin or an executive digital twin) while the instance is being executed by a client application 8052. Put another way, the digital twin interaction manager 8114 determines and serves data for an in-use digital twin. In embodiments, the digital twin interaction manager 8114 has specific user interactions and controls that govern the relationship between a user interface and the role based digital twin. Furthermore, in embodiments, these role-based digital twin interactions can be with a shared digital twin with different roles interacting seamlessly. In embodiments, the digital twin interaction manager 8114 feeds raw data received from a data source to the digital twin or from the digital twin I/O system 8104, or a combination of the digital twin I/O system 8104 and role-based human interactions For example, sensor readings of temperatures throughout an environment may be fed directly to the executing environment digital twin of the environment through the digital twin I/O system 8104 and in response to a human interaction with the environment digital twin to adjust a temperature setting of the environment, the digital twin interaction manager 8114 may issue a control signal to a temperature controller within the environment to increase or decrease the temperature.

In embodiments, the digital twin interaction manager 8114 obtains data and/or instructions that are derived by another component of the EMP 8000. For example, a CEO digital twin may depict analytical data obtained from the artificial intelligence services system 8010 that is derived from incoming financial data, marketing data, operational data, and sensor data. In this example, the digital twin interaction manager 8114 may receive a request to drill down into the analytical data from the user and in response, the digital twin interaction manager 8114 may obtain the financial data, marketing data, and/or the sensor data from which the analytical data was derived. In another example, the digital twin interaction manager 8114 may receive simulated cost data from the digital twin simulation system 8116 to convey revenue/costs with respect to different asset maintenance schedules, whereby the simulated data is derived using historical maintenance data of the enterprise, historical sensor data collected by sensors in a facility of the enterprise. In this example, the digital twin interaction manager 8114 may receive requests for different maintenance schedules from a client device depicting an executive digital twin (e.g., a CFO digital twin, a CTO digital twin, or a CEO digital twin) and may initiate the simulations for each of the different maintenance schedules. The digital twin interaction manager 8114 may then serve the results of the simulation to the requesting client application.

In embodiments, the digital twin interaction manager 8114 may manage one or more workflows that are performed via an executive digital twin. For example, the EMP 8000 may store a set of executive workflows, where each executive workflow corresponds to a role within an enterprise and includes one or more stages. In embodiments, the digital twin interaction manager 8114 may receive a request to execute a workflow. The request may indicate the workflow and a user identifier. In response, the digital twin interaction manager 8114 may retrieve the requested workflow and may provide specific instructions, including role-based interactions, and/or data to the client device 8052

In embodiments, the digital twin simulation system 8116 receives requests to run simulations using one or more digital twins. In embodiments, the request may indicate a set of parameters that are to be varied and/or one or more simulation outcomes to output. In embodiments, the digital twin simulation system 8116 may request one or more digital twins from the digital twin generation system 8108 and may varying a set of different parameters for the simulation. In embodiments, the digital twin simulation system 8116 may construct new digital twins and new data streams within existing digital twins. In embodiments, the digital twin simulation system 8116 may perform environment simulations and/or data simulations. The environment simulation is focused on simulation of the digital twin ontology rather than the underlying data streams. In embodiments, the digital twin simulation system 8116 generates simulated data streams appropriate for respective digital twin environments. This simulation allows for real world simulations of how a digital twin will respond to specific events such as changes in the cost of good supplied, or changes in the demand on the output of the facility.

In embodiments, the digital twin simulation system 8116 implements a set of models, in some instances including role-specific response patterns, (e.g., physical mathematical forecasts, logical representations, or process diagrams) that develop the framework where data and the response of the digital twin can be simulated in response to different situational or contextual inputs/stimuli. In embodiments, the digital twin simulation system 8116 may include or leverage a computerized model builder that constructs a predicted future state of either the data and/or the response of the digital twin to the input data. In some embodiments, the computerized model library may be obtained from a behavior model data store 8126 that stores one or more models that defines one or more behaviors of entities, such as based on scientific, economic, statistical, psychological, sociological, econometric, engineering, mathematical, physical, chemical, biological, architectural, computational, or other models, formulas, functions, processes, algorithms, or the like of the various types described herein or in the documents incorporated by reference herein (collectively referred to herein as "behavior models" or "models" except where context indicates otherwise). In embodiments, value chain network data objects may be provided according to an object-oriented data model that defines classes, objects, attributes, parameters and other features of the set of data objects (such as associated with value chain network entities and applications) that are handled by the platform. The computerized digital twin model calculates the results of the model based on available inputs to build an interactive environment where users can watch and manipulate salient features of the simulated environment seeing how the entire system responds to specific changes in the environment. For example, the digital twin simulation may display how a set of objects that are stacked in a container will respond to tilting the container, where the behavior of the objects is based on a mechanical engineering model and/or an architectural model of the stacked objects, including structural features, weight distributions, and the like. This may assist in assessing the probability and/or impact of various fault modes, such as breaking, spilling, or the like, in response to seismic events, road conditions, weather conditions, wave action, or the like, as well as in simulating the response of other objects in the simulated environment, including in a chain of events. This may, for example, allow a user to identify events and consequences that occur as a result of multiple simultaneous or related faults or other events.

In embodiments, digital twin behavior models may be updated and improved using results of actual experiments and real-world events. The use of such digital twin mathematical models and their simulations avoids actual experimentation, which can be costly and time-consuming. Instead, acquired knowledge about behavior of entities and computational power are used to diagnose and solve real-world problems cheaply and/or in a time-efficient manner. As such, the digital twin simulation system 8116 can facilitate understanding a system's behavior without actually testing the system in the real world. For example, to determine which type of wheel configuration would improve traction the most while designing a tractor, a digital twin model simulation of the tractor could be used to estimate the effect of different wheel configurations on towing capacity. Useful insights about different decisions in the design may be gleaned without actually building the tractor. In addition, the digital twin simulation can support experimentation that occurs totally in software, or in human-in-the-loop environments where the digital twin represents systems or generates data needed to meet experiment objectives. Furthermore, digital twin simulations can be used to train persons using a perspective-appropriate virtual environment that would otherwise be difficult or expensive to produce.

In embodiments, simulation environments may be constructed using models configured to predict a set of future states. These models may include deep learning, regression models, quantum prediction engines, inference engines, pattern recognition engines, and many other forms of modelling engines that use historical outcomes, current state information, and other inputs to build a future state prediction. In some embodiments, a consideration in making the digital twin models' function is the ability to also show the response of the perspective-based digital twin structural elements (e.g., defining the deformation of the axle of a vehicle in response to different size loads). For example, the resultant digital twin representation can then be presented to the user in a virtual reality or augmented reality environment where specific perspectives are shown in their digital twin form.

In embodiments, digital twins, as described herein, may operate in coordination with an adaptive edge computing system and/or a set of adaptive edge computing systems that provide coordinated edge computation include a wide range of systems, such as classification systems (such as image classification systems, object type recognition systems, and others), video processing systems (such as video compression systems), signal processing systems (such as analog-to-digital transformation systems, digital-to-analog transformation systems, RF filtering systems, analog signal processing systems, multiplexing systems, statistical signal processing systems, signal filtering systems, natural language processing systems, sound processing systems, ultrasound processing systems, and many others), data processing systems (such as data filtering systems, data integration systems, data extraction systems, data loading systems, data transformation systems, point cloud processing systems, data normalization systems, data cleansing system, data deduplication systems, graph-based data storage systems, object-oriented data storage systems, and others), predictive systems (such as motion prediction systems, output prediction systems, activity prediction systems, fault prediction systems, failure prediction systems, accident prediction systems, event predictions systems, event prediction systems, and many others), configuration systems (such as protocol selection systems, storage configuration systems, peer-to-peer network configuration systems, power management systems, self-configuration systems, self-healing systems, handshake negotiation systems, and others), artificial intelligence systems (such as clustering systems, variation systems, machine learning systems, expert systems, rule-based systems, deep learning systems, and many others), system management and control systems (such as autonomous control systems, robotic control systems, RF spectrum management systems, network resource management systems, storage management systems, data management systems, and others), robotic process automation systems, analytic and modeling systems (such as data visualization systems, clustering systems, similarity analysis systems, random forest systems, physical modeling systems, interaction modeling systems, simulation systems, and many others), entity discovery systems, security systems (such as cybersecurity systems, biometric systems, intrusion detection systems, firewall systems, and others), rules engine systems, workflow automation systems, opportunity discovery systems, testing and diagnostic systems, software image propagation systems, virtualization systems, digital twin systems, IoT monitoring systems, routing systems, switching systems, indoor location systems, geolocation systems, and others.

In embodiments, the digital twin notification system 8118 provides notifications to users via enterprise digital twins associated with the respective users. In some embodiments, digital twin notifications are an important part of the overall interaction. Digital twin notification system 8118 may provide the digital twin notifications within the context of the digital twin setting so that the perspective view of the notification is set up specifically to enable enlightenment of how the notification fits into the general digital twin represented ontology, taxonomy, topology or the like.

As discussed, a digital twin model is based on a combination of data and the data's relationship to the digital twin environments and/or processes. As such, different digital twins may share the same data and different digital twin perspectives can be the results of a set of metadata built on top of a digital twin data model or data environment. In embodiments, the digital twin data model provides the details of the information to be stored and it is used to build a layered system where the final computer software code is able to represent the information in the lower levels in a form that is appropriate for the digital twin perspective being used. One aspect of the digital twin model is that one digital can be shared across multiple perspectives, each perspective viewer can then interact with the same underlying digital twin model. In this way the multiple perspectives are like translations allowing each type of user to interact in an appropriate way for their skill sets or their level of knowledge.

Figure 70:
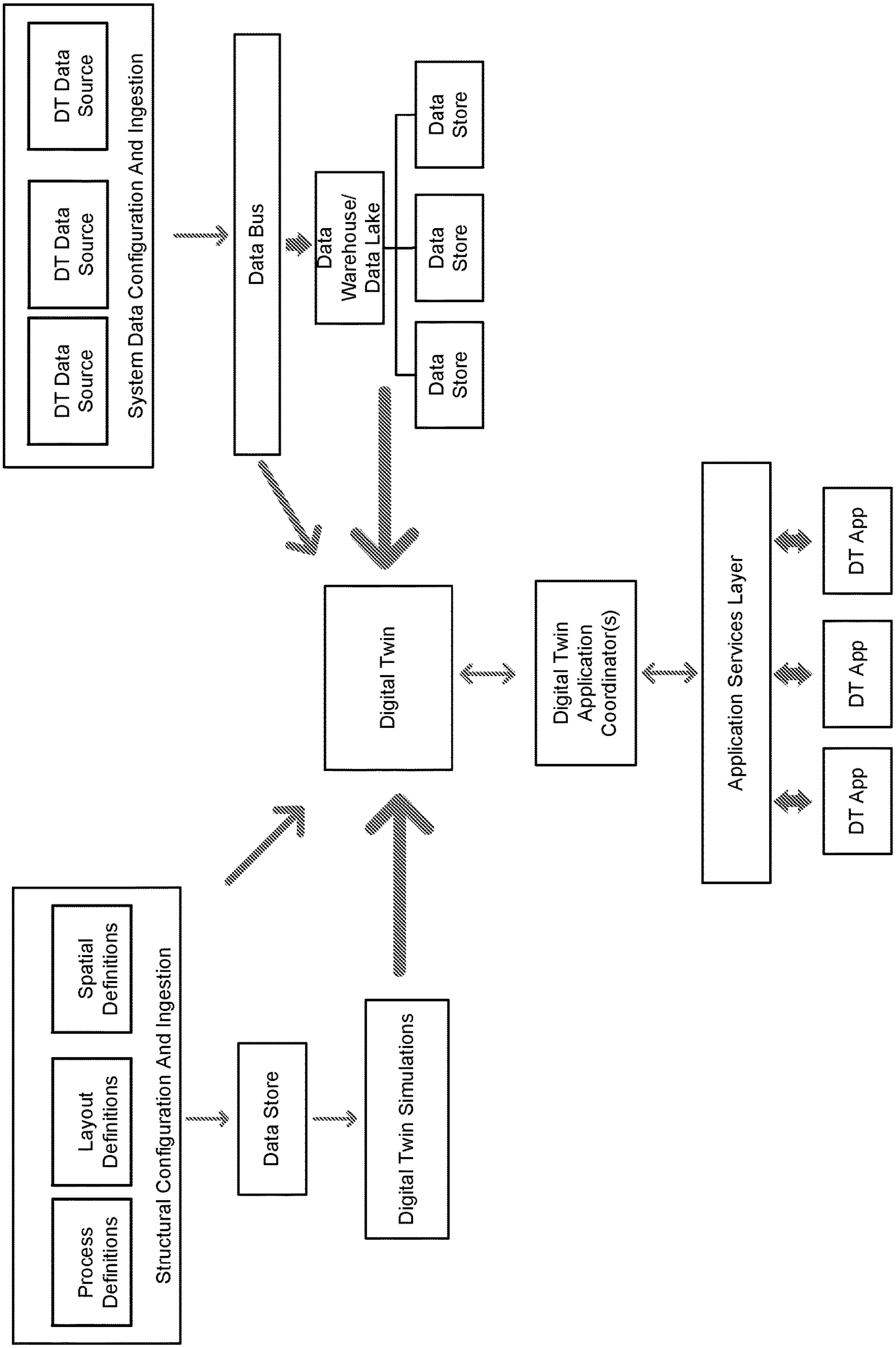
FIG. 70 is a schematic illustrating and example of an enterprise data model according to some embodiments of the disclosure.

FIG. 70 illustrates an example of a digital twin data model and the manner by which a digital twin is generated, executed, and served to a requesting digital twin application, wherein the digital twin data model defines the physical implementation of the underlying data streams from existing systems and digital twin structures to achieve a digital twin representation. In embodiments, the digital twin data model 81B00 defines the manner by which traditional data streams are tied together with the digital twin structures to achieve the digital twin representation. In embodiments, digital twins are a combination of processes/structures and system data streams. Put another way, process and structure definitions define the real-world "things" (for example a factory, a robot, a cargo container, a ship, a road, or the like) or logical "things" (for example an organizational chart, a hiring process, a marketing campaign, a tax reporting workflow, or the like) that are representable by a digital twin, while the system data stream definitions define the manner by which real-world data may be ingested into digital twin representations of the real-world and/or logical "things". Thus, configuring a digital twin includes structural configuration and ingestion and data configuration and ingestion.

During structural configuration and ingestion, the digital twin system 8004 receives the structural aspects of a digital twin. In embodiments, the structural aspects may include process definitions, layout definitions, and/or spatial definitions. In embodiments, a process definition defines a logical process that can be mapped to a diagrammatic format that forms the basis of what a digital twin viewer can interact with. Examples of processes may include workflows, hiring processes, manufacturing processes, logistics processes, inventory processes, product management processes, software processes, and the like. In embodiments, the spatial definition defines the geospatial configuration of an object or an environment. In embodiments, the spatial definition may be a 2D or 3D representation of an object or an environment. The spatial definition of an object or an environment may be provided as a CAD file, a LIDAR scan, a 2D or 3D image, or the like, including logical relationships, organizational hierarchy, physical relationships, schematic relationships, and/or interconnectivity between objects and/or environments. In embodiments, a layout definition defines the relationship between objects with other objects and/or an environment. In embodiments, the layout definition may further define the manner by which objects move with respect to other objects and/or an environment. Examples of layouts may include electrical wiring diagrams, piping schematics, assembly line diagrams, circuit diagrams, hierarchical relationships, network layouts, network schematics, organizational charts, and the like. In embodiments, a layout definition may include a set of properties of an object or environment. Examples of properties of an object may include physical properties, such as a material of an object, a weight of an object, a density of an object, a conductivity of an object, a resistance of an object, a maximum speed of an object, a maximum acceleration of an object, possible movements of an object, a reactivity of an object, and/or the like. Examples of properties of an environment may include materials of the floors, walls, the roof, and the like, coefficient of friction of the floor, restricted areas within the environment, paths within the environment, and/or other suitable properties. In some embodiments, users may upload layout definitions, process definitions, and/or spatial definitions to the digital twin system 8004. Additionally or alternatively, the digital twin system 8004 may provide a graphical user interface that allows users to define the layout definitions, process definitions, and/or spatial definitions. In some embodiments, users may import digital twins from 3rd party sources. For example, a producer of a particular object may also provide a digital twin of the object, which may then be imported to the digital twin system 8004.

During system data configuration and ingestion, a user defines the data sources that provide data that hydrates or populates a digital twin and configures a data bus to receive data from the various data sources. As discussed, the data sources may be received from various systems, including sensor systems, ERPs, CRMs, financial systems, inventory management systems, invoicing systems, 3rd party systems (e.g., weather services, news services, government databases, and the like), and other suitable systems. In embodiments, the user may identify the data sources and may provide any information required to enable a data bus to receive data from the data sources and may further define the associations between the data derived from the data sources and the digital twin elements. A data bus may refer to a middleware layer that provides the data wiring and data infrastructure for moving data from one system to another. The data bus may be configured to handle real-time data, near real-time data, aggregated data, and/or stored data, or any combination thereof. The data bus may provide data directly to a digital twin and/or may store the data in the data warehouse that hydrates the digital twins. In embodiments, the user may provide API interface or keys and/or webhook URLs to the digital twin system 8004 (e.g., via a GUI) thereby enabling data acquisition from the data sources. In embodiments, the digital twin system 8004 may configure the data bus to access the data sources and/or to receive data from the data sources. In some of these embodiments, the digital twin system 8004 may generate a webhook URL for a particular digital twin or set of digital twins and may provide the webhook URL to the data source, such that the data source can push real-time or near real-time data to the data bus. Additionally or alternatively, the digital twin system 8004 may obtain an API interface or key from the data source, such that the data bus can request data from the data source using the API interface or key.

In embodiments, the digital twin system 8004 may generate a foreign key that associates different types of data with the structural elements of the digital twin. In this way, the foreign key ties particular data types to various structural or logical or schematic elements, such that when the digital twin is depicted, the real-world data collected from the various data sources is connected to the corresponding states of the digital twin. For example, sensor data received from a subset of sensors of a sensor system that monitor a particular machine component in a real world environment may be associated with a digital twin of a machine component, such that the sensor data may be depicted in the digital twin of the machine component. In embodiments, the user may provide input to the digital twin system 8004 during the configuration phase to tie particular data types to various elements of a digital twin. The data types that are associated with the digital twin may include raw data, processed data, analytical data, derived data, and the like. To the extent a particular data stream is processed before being served into a digital twin (e.g., sensor data that is averaged over a period of time or a warning condition that is depicted when sales data dips below a threshold), the user may define the operations or the associated display highlight that are performed on the data before it is served into a digital twin. In these scenarios, the processed data may be associated with a respective digital twin component in the foreign key.

Once the data bus is configured for a particular digital twin and the structural, logical, or schematic elements (e.g., layout definitions, process definitions, and spatial definitions) of the digital twin are defined, the digital twin system 8004 may perform digital simulations on the digital twin and/or may serve the digital twin to a digital twin-enabled application based on the structural elements of the digital twin, the connected systems data sources, and the foreign key of the digital twin. In embodiments, the digital twins may be role-based digital twin, whereby the views into the digital twin that are served to a user occupying a particular role within an organization. In this way, each user can interact with a respective role-based digital twin and may gain appropriate perspectives based on their respective needs with respect to an organization. In another embodiment, a plurality of users can interact with a shared role-enabled digital twin and may gain appropriate perspectives based on their respective needs with respect to an organization to that single digital twin. In embodiments, a role-based digital twin may allow the user to provide feedback to the source systems to allow for controls of the source system environments, such as corrective actions taken with respect to a source system. In some embodiments, a plurality of users can make operational changes with a shared role-based digital twin and each user sees these changes in an appropriate way for their role. Furthermore if the operational change involves multiple users, the digital twin can enable a role-based workflow management of the depicted environment (e.g., the CEO may approve an expenditure to change machinery as requested by the CTO).

In embodiments, the digital twin system 8004 may receive requests to execute digital twin simulations with respect to a digital twin. Requests to perform digital twin simulations may be received from digital twin applications and/or from internal processes. In embodiments, a digital twin simulation allows for the building of interactive models based on the processes, layouts, and/or spatial representations of a digital twin. The digital twin simulations may provide the degrees of freedom to allow for the different processes to be altered in response to dynamic data inputs. For example, a digital twin simulation may be executed to depict how a bearing can move on a compressor when the compressor is operated at different operating conditions or how water flows through a systems of pipes model at different temperatures or with different amounts of buildup in the piping. In embodiments, the digital twin system 8004 may output the results of the simulation, which may, for example, depict the impact of the simulation parameters on a particular aspect of the digital twin.

In embodiments, a digital twin application may request and depict a digital twin to a user, this digital twin can be a new twin for that user or role specific access with role specific views to an existing or shared digital twin. A digital twin application may be provided on mobile applications, virtual reality applications, PCs, and the like. In embodiments, a digital twin application provides a request to the digital twin system 8004 for a particular digital twin, where the request may include a user identifier of the user and/or a role of the user. In embodiments, the digital twin system 8004 may include or interface with digital twin application coordinators that receive requests from digital twin applications for a digital twin. In embodiments, a digital twin application controller maintains and leverages a set of business rules for a particular digital twin that are required by a digital twin application. In some of these embodiments, the set of role-based rules are a set of role-based rules that control the states that a user can access given their role within an organization and a clearance of the user. In these embodiments, the digital twin application controller may determine whether to grant an instance of a digital twin application access to a particular user based on the business rules and the role of the user. In embodiments, the digital twin system 8004 may include an application services layer that allows multiple users to connect to the back end of the digital twin application coordinator, either directly or through a shared digital twin. In embodiments, these connections may include web services, publish and subscribe information buses, simple object access protocols, and/or other suitable application interfaces. The application services layer may return a requested digital twin to a requesting instance of a digital twin application, which in turn depicts the digital twin to the user. The user may then interact with the digital twin via the application to view different states of the digital twin, to request simulations, or to interact with other users of the same role or different roles in the digital twin environment, and the like.

In an example implementation of the framework discussed in FIG. 70, the digital twin system 8004 may be configured to generate enterprise digital twins in connection with a value chain. For example, an enterprise that produces goods internationally (or at multiple facilities) may configure a set of digital twins, such as supplier twins that depict the enterprise's supply chain, factory twins of the various production facilities, product twins that represent the products made by the enterprise, distribution twins that represent the enterprise's distribution chains, and other suitable twins. In doing so, the enterprise may define the structural elements of each respective digital twin as well as any system data that corresponds to the structural elements of the digital twin. For instance, in generating a production facility twin, the enterprise may the layout and spatial definitions of the facility and any processes that are performed in the facility. The enterprise may also define data sources corresponding to value chain entities, such as sensor systems, smart manufacturing equipment, inventory systems, logistics systems, and the like that provide data relevant to the facility. The enterprise may associate the data sources with elements of the production facility and/or the processes occurring the facility. Similarly, the enterprise may define the structural, process, and layout definitions of its supply chain and its distribution chain and may connect relevant data sources, such as supplier databases, logistics platforms, to generate respective distribution chain and supply chain twins. The enterprise may further associate these digital twins to have a view of its value chain. In embodiments, the digital twin system 8004 may perform simulations of the enterprise's value chain that incorporate real-time data obtained from the various value chain entities of the enterprise. In some of these embodiments, the digital twin system 8004 may recommend decisions to a user interacting with the enterprise digital twins, such as when to order certain parts for manufacturing a certain product given a predicted demand for the manufactured product, when to schedule maintenance on machinery and/or replace machinery (e.g., when digital simulations on the digital twin indicates the demand for certain products may be the lowest or when it would have the least effect on the enterprise's profits and losses statement), what time of day to ship items, or the like. The foregoing example is a non-limiting example of the manner by which a digital twin may ingest system data and perform simulations in order to further one or more goals.

Figure 71:
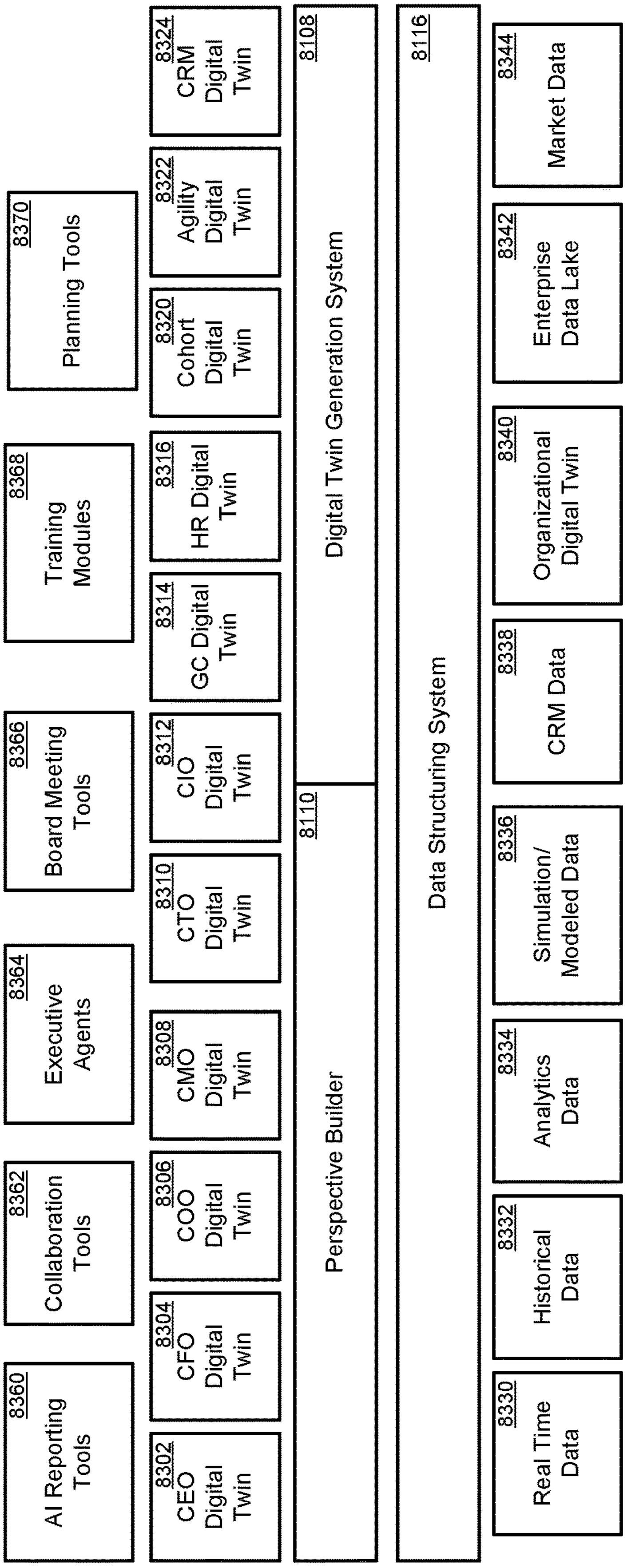
FIG. 71 is a schematic illustrating examples of different types of enterprise digital twins, including executive digital twins, in relation to the data layer, processing layer, and application layer of the enterprise digital twin framework according to some embodiments of the present disclosure.
Figure 72:
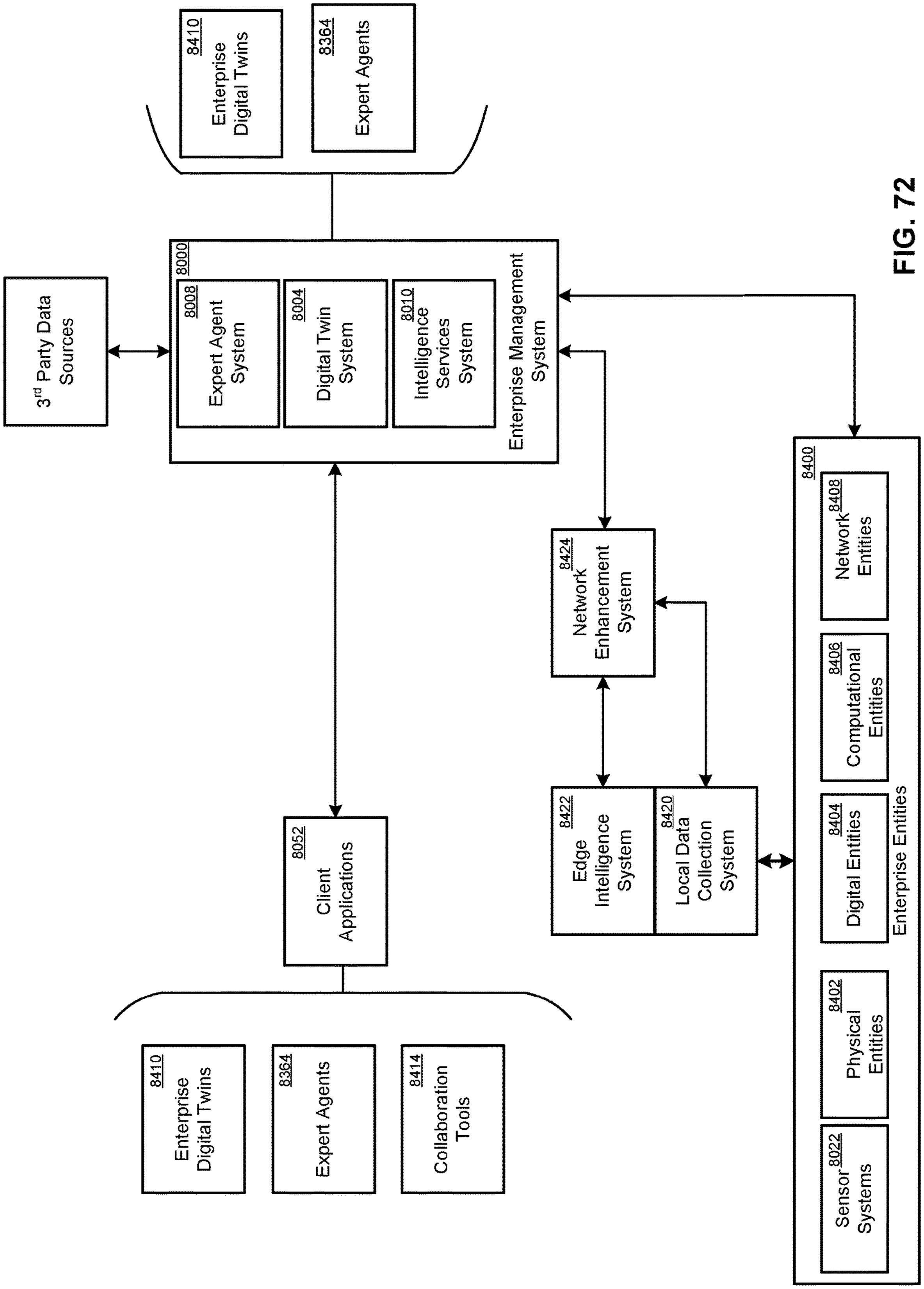
FIG. 72 is a schematic illustrating an example implementation of the enterprise and executive control tower and management platform according to some embodiments of the present disclosure.

FIG. 71 illustrates examples of different types of enterprise digital twins, including executive digital twins, in relation to the data layer, processing layer, and application layer of the enterprise digital twin framework. In embodiments, executive digital twins may include, but are not limited to, CEO digital twins 8302, CFO digital twins 8304, COO digital twins 8306, CMO digital twins 8308, CTO digital twins 8310, CIO digital twins 8312, GC digital twins 8314, HR digital twins 8316, and the like. Additionally, the enterprise digital twins that may be relevant to the executive suite may include cohort digital twins 8320, agility digital twins 8322, CRM digital twins 8324, and the like. The discussion of the different types of digital twins is provided for example and not intended to limit the scope of the disclosure. It is understood that in some embodiments, users may alter the configuration of the various executive digital twins based on the business needs of the enterprise, the reporting structure of the enterprise, and the roles and responsibilities of the various executives within the enterprise.

In embodiments, executive digital twins and the additional enterprise digital twins are generated using various types of data collected from different data sources. As discussed, the data may include real-time data 8330, historical data 8332, analytics data 8334, simulation/modeled data 8336, CRM data 8338, organizational data, such as org charts and/or an organizational digital twin 8340, an enterprise data lake 8342, and market data 8344. In embodiments, the real-time data 8330 may include sensor data collected from one or more IoT sensor systems, which may be collected directly from each sensor and/or by various data collection devices associated with the enterprise, including readers (e.g., RFID, NFC, and Bluetooth readers), beacons, gateways, repeaters, mesh network nodes, WIFI systems, access points, routers, switches, gateways, local area network nodes, edge devices, and the like. Real-time data 8330 may include additional or alternative types of data that are collected in real-time, such as real-time sales data, real-time cost data, project management data that indicates the status of current projects, and the like. Historical data may be any data collected by the enterprise and/or on behalf of the enterprise in the past. This may include sensor data collected from the sensor systems of the enterprise, sales data, cost data, maintenance data, purchase data, employee hiring data, employee on-boarding data, employee retention data, legal-related data indicating legal proceedings, patent filing data indicating patent filings and issued patents, project management data indicating historical progress of past and current projects, product data indicating products that are on the market, and the like. Analytics data 8334 may be data derived by performing one or more analytics processes on data collected by and/or on behalf of the enterprise. Simulation/modeled data 8336 may be any data derived from simulation and/or behavior modeling processes that are performed with respect to one or more digital twins. CRM data 8336 may include data obtained from a CRM of the enterprise. An organizational digital twin 8340 may be a digital twin of the enterprise. The enterprise data lake 8342 may be a data lake that includes data collected from any number of sources. In embodiments, the market data 8342 may include data that is collected from disparate data sources concerning or related to competitors and other cohorts in the marketplace and supply chain. Market data 8342 may be collected from many different sources and may be structured or unstructured. In embodiments, market data 8342 may contain an element of uncertainty that may be depicted in a digital twin that relies on such market data 8342, such as by showing error bars, probability cones, random walk paths, or the like. It is appreciated that the different types of data highlighted above may overlap. For example: historical data may be obtained from the CRM data; the enterprise data lake 8342 may include real-time data 8330, historical data 8332, analytics data 8332, simulated/modeled data 8336, and/or CRM data 8336; and analytics data 8334 may be based on historical data 8332, real-time data 8332, CRM data 8336, and/or market data 8342. Additional or alternative types of data may be used to populate an enterprise digital twin.

In embodiments, the data structuring system 8106 may structure the various data collected by and/or on behalf of the enterprise. In embodiments, the digital twin generation system 8108 generates the enterprise digital twins. As discussed, the digital twin generation system 8108 may receive a request for a particular type of digital twin (e.g., a CEO digital twin 8302 or a CTO digital twin 8310) and may determine the types of data needed to populate the digital twin based on the configuration of the requested type of digital twin. In embodiments, the digital twin generation system 8108 may then generate the requested digital twin based on the various types of data (which may include structured data structured by the data structuring system 8106). In some embodiments, the digital twin generation system 8108 may output the generated digital twin to a client application 8052, which may then display the requested digital twins.

In embodiments, a CEO digital twin 8302 is a digital twin configured for the CEO or analogous top-level decision maker of an enterprise. The CEO digital twin 8302 may include high-level views of different states and/or operations data of the enterprise, including real-time and historical representations of major assets, processes, divisions, performance metrics, the condition of different business units of the enterprise, and any other mission-critical information type. In embodiments, the CEO digital twin 8302 may work in connection with the EMP 8000 to provide simulations, predictions, statistical summaries, decision-support based on analytics, machine learning, and/or other AI and learning-type processing of inputs (e.g., fiscal data, competitor data, product data, and the like). In embodiments, a CEO digital twin 8302 may provide functionality including, but not limited to, management of personnel, delegation of tasks, decisions, or tasks, coordination with the Board of Directors and/or strategic partners, risk management, policy management, oversight of budgets, resource allocation, investments, and other executive-related resources.

In embodiments, the types of data that may be populate a CEO digital twin 8302 may include, but are not limited to: macroeconomic data, microeconomic analytic data, forecast data, demand planning data, employment and salary data, analytic results of AI and/or machine learning modeling (e.g., financial forecasting), prediction data, recommendation data, securities-relevant financial data (e.g., earnings, profitability), industry analyst data (e.g., Gartner quadrant), strategic competitive data (e.g., news and events regarding industry trends and competitors), business performance metrics by business unit that may be relevant to evaluating performance of the business units (e.g., P&L, head count, factory health, supply chain metrics, sales metrics, R&D metrics, marketing metrics, and many others), Board package data, or some other type of data relevant to the operations of the CEO and/or executive department. In embodiments, the digital twin system 8004 may obtain securities-relevant financial data from, for example, the enterprise's accounting software (e.g., via an API), publicly disclosed financial statements, third-party reports, tax filings, and the like. In embodiments, the digital twin system 8004 may obtain strategic competitive data from public news sources, from publicly disclosed financial reports, and the like. In embodiments, macroeconomic data may be derived analytically from various financial and operational data collected by the EMP 8000. In embodiments, the business performance metrics may be derived analytically, based at least in part on real time operations data, by the artificial intelligence services system 8010 and/or provided from other users and/or their respective executive digital twins. The CEO digital twin 8302 may be used to define real time operations data parameters of interest and to monitor, collect, analyze, and interpret real time operations data for conformance to and alignment with an organization's stated business objects, Board requirements, industry best practice, regulation, or some other criterion.

In embodiments, a CEO digital twin 8302 may include high-level views of different states of the enterprise, including real-time and historical representations of major assets, the condition of different business units of the enterprise, and any mission-critical information. The CEO digital twin 8302 may initially depict the various states at a lower granularity level. In embodiments, a user that is viewing the CEO digital twin 8302 may select a state to drill down into the selected state and view the selected state at a higher level of granularity. For example, the CEO digital twin 8302 may initially depict a subset of the various states of the enterprise at a lower granularity level, including a financial-department state (e.g., a visual indicator indicating an overall financial health score of the enterprise). In response to selection, the CEO digital twin 8302 may provide data, analytics, summary, and/or reporting including, but not limited to, real-time, historical, aggregated, comparison, and/or forecasted financial information (e.g., real-time, historical, simulated, and/or forecasted revenues, liabilities, and the like). In this way, the CEO digital twin 8302 may initially present the user (e.g., the CEO) with a view of various different aspects of the enterprise (e.g., different indicators to indicate different "health" levels of a respective business unit or part of the enterprise) but may allow the user to select which aspects require more of her attention. In response to such a selection, the CEO digital twin 8302 may request a more granular view of the selected state(s) from the EMP 8000, which may return the requested states at the more granular level.

In embodiments, a CEO digital twin 8302 may include an executive-level digital twin of the executive department (e.g., C-suite, directors, Board members, and the like), which the user may use to identify, assign, instruct, oversee and review executive department personnel and third-party personnel, departments, organizations and the like that are associated with the activities of the executive of an organization, including the Board of Directors and the like that are involved in the oversight of the organization's management. In embodiments, the executive-level digital twin may include a definition of the various roles, employees, and departments working under the CEO, the reporting structure for each individual in the business unit and may be populated with the various names and/or other identifiers of the individuals filling the respective roles. In embodiments, the CEO digital twin 8302 may include a graphical user interface that provides the user the ability to define/redefine personnel groupings, assign performance criteria and metrics to business units, roles, and/or individuals, and/or assign/delegate tasks to business units, roles, and/or individuals, and the like via the executive-level digital twin. In embodiments, the executive-level digital twin may provide real-time operations data of the organization to continuously evaluate the personnel groupings' performance against the stored performance criteria.

In embodiments, a CEO digital twin 8302 may be configured to interface with the collaboration suite 8006 to specify and provide a set of collaboration tools that may be leveraged by the executive department and associated parties. The collaboration tools may include video conferencing tools, "in-twin" collaboration tools (e.g., where the collaboration occurs to some extent within a common interface by which the digital twin entities are viewed and collaboration activities take place and/or where the components of the EMP that used to configure, operate or support the digital twin also govern collaboration around digital twin entities and workflows), whiteboard tools, agile development environment tools (such as features in Slack™ environments), presentation tools, word processing tools, spreadsheet tools, and the like, as described herein. Collaboration and communication rules may be configured based at least in part on using the AI reporting tool, as described herein. The collaboration tools may include collaborative communication (e.g., facilitating live conferencing where participants are simultaneously presented with conference-related views of digital twin entities or workflows), asynchronous collaboration (such as where actions on digital twin entities, comments, or the like are represented to different users who interact with the entities), version control features, and many others.

In embodiments, a CEO digital twin 8302 may be configured to provide research, track, and report on an executive department initiative including, but not limited to, an overall strategic goal, policy implementation, product roll-out, Board interaction, investment or acquisition, investor relations, public relations and press handling, budgeting, or some other type of executive initiative. The CEO digital twin 8302 may interact with and share such data and reporting with other executive digital twins, including, but not limited to, a CFO digital twin, a COO digital twin, and the like. In embodiments, the CEO digital twin 8302 or an executive agent integrated with or within it (such as one trained to undertake expert executive actions as described elsewhere herein) may leverage intelligence services (e.g., data analytics, machine learning and A.I. processes) to analyze financial reports, projections, simulations, budgets, and related summaries to identify key departments, personnel, third-party or others that are, for example, listed in, or subject to, a project, initiative, budget line item and the like, and who therefore may have an interest in such material. Such material pertaining to a given party may be abstracted and summarized for presentation, and formatted and presented automatically, or at the direction of the CEO or other user, to the party that is the origin of the expense and/or subject of the material. For example, the CEO digital twin 8302 may assemble materials for the purposes of developing presentations, speaking points, press releases, or some other material for the CEO or other executive personnel to use for public presentation. In an example, a CEO in anticipation of giving a conference presentation on the introduction of anew company product may use the CEO digital twin 8302 to specify and configure the identification, collection and assembly of operations data that is relevant to the upcoming presentation, such as product data (e.g., units produced, units shipped), financial data (e.g., products sold, products reserved), graphic presentation information (e.g., product photos, maps of product distribution, graphs of anticipated sales), forecasting data (e.g., market growth expected), or some other type of data and assemble such information in a presentation format, such as presentation slides, white paper template, speech talking points, press release, or some other summary format that may form the basis of the presentation or be distributed in conjunction with the presentation and/or its marketing.

In embodiments, a CEO digital twin 8302 may be configured to track and report on stakeholder communications (e.g., reports, Board requests, investor requests) related to the executive department. The CEO digital twin 8302 may present, store, analyze, reconcile and/or report on executive activities related to parties with whom the executive department is contracting, cooperating with, reporting to and so forth, such as key personnel, outside contractors, the press, the Board of Directors, or others.

In embodiments, the CEO digital twin 8302 may be configured to simulate one or more aspects of the enterprise. Such simulations may assist the user (e.g., the CEO) in making executive level decisions. For example, simulations of a proposed executive initiative may be tested, for example using the modeling, machine learning, and/or AI techniques, as described herein, by simulating temporal effects on initiatives (e.g., introduction of a new product), varying financial parameters (e.g., potential investment levels), targeting parameters (e.g., geographic, demographic, or the like), and/or other suitable executive parameters. In embodiments, the digital twin simulation system 8116 may receive a request to perform an executive simulation requested by the CEO digital twin 8302, where the request indicates one or more parameters that are to be varied in one or more enterprise digital twins. In response, the digital twin simulation system 8116 may return the simulation results to the CEO digital twin 8302, which in turn outputs the results to the user via the client device display. In this way, the user may be provided with various outcomes corresponding to different parameter configurations. For example, a user may request a set of simulations to be run to test different supply chain strategies to see how the different strategies affect the throughput of a manufacturing facility and the overall impact on the profits and losses of the enterprise. The digital twin simulation system 8116 may perform the simulations by varying the different supply chain strategies and may output the throughputs and P&L forecasts for each respective supply chain strategy. In some embodiments, the user may select a parameter set based on the various outcomes, and iterate simulations based at least on the varied prior outcomes. Drawing from the previous example, the user may decide to select the supply chain strategy that maximizes P&L forecasts but does not adversely affect throughput of the manufacturing facility. In some embodiments, an executive agent may be trained to recommend and/or select a parameter set based on the respective outcomes associated with each respective parameter set.

In embodiments, a CEO digital twin 8302 may be configured to store, aggregate, merge, analyze, prepare, report and distribute material relating to an executive strategy, executive planning, executive activities, and/or executive initiatives. For example, the CEO digital twin 8302 may be associated with a plurality of databases or other repositories of financial materials, summaries and reports and analytics, including such materials, summaries and reports and analytics related to prior executive activity (e.g., prior quarterly financial performance, prior investments, prior strategic partners, co-developments, and the like), each of which may be further associated with financial and performance metrics pertaining to the campaign and which are also accessible to the CEO digital twin 8302.

In embodiments, a CEO digital twin 8302 may be configured to store, aggregate, merge, analyze, prepare, report and distribute material relating to financial reporting, ratings, rankings, financial trend data, income data, or other data related to an executive's responsibilities. A CEO digital twin 8302 may link to, interact with, and be associated with external data sources, and able to upload, download, aggregate external data sources, including with the EMP's internal data, and analyze such data, as described herein. Data analysis, machine learning, AI processing, and other analysis may be coordinated between the CEO digital twin 8302 and an analytics team based at least in part on using the artificial intelligence services system 8010. This cooperation and interaction may include assisting with seeding executive-related data elements and domains in the enterprise data store 8012 for use in modeling, machine learning, and AI processing to identify an optimal business strategy, or some other executive-relating metric or aspect, as well as identification of the optimal data measurement parameters on which to base judgement of an executive initiative's success. Examples of data sources 8020 that may be connected to, associated with, and/or accessed from the CEO digital twin 8302 may include, but are not limited to, a sensor system 8022 having sensors that sensor data from facilities (e.g., manufacturing facilities, shipping and logistics facilities, transportation facilities, agricultural facilities, resource extraction facilities, computing facilities, and many others) and/or other physical entities of the enterprise, a sales database 8024 that is updated with sales figures in real time, a CRM system 8026, a content marketing platform 8028, financial databases 8030, surveys 8032, org charts 8034, workflow management systems 8036, third-party data sources 8038, customer databases 8040 that store customer data, and/or third-party data sources 8038 that store third-party data, edge devices 8042 that report data relating to physical assets (e.g., smart machinery/manufacturing equipment, sensor kits, autonomous vehicles of the enterprise, wearable devices, and the like), enterprise resource management systems 8044, HR systems 8046, content management systems 8016, and the like). In embodiments, the digital twin system 8004 abstracts the different views (or states) within the digital twin to the appropriate granularity. For instance, the digital twin system 8004 may have access to all the sensor data collected on behalf of the enterprise as well as access to real-time sensor data streams. Typically, such data is far too granular for an executive such as a CEO, and sensor data readings are often of little importance to the CEO unless associated with a mission critical state or operation. In this example, however, if the sensor readings from a particular physical asset (e.g., a critical piece of manufacturing equipment) are indicative of a potentially critical situation (e.g., failure state, dangerous condition, or the like), then the analytics that indicate the potentially critical situation may become very important to the CEO. Thus, the digital twin system 8004 may, when building the appropriate perspective for the CEO, include a state indicator of the physical asset in the CEO digital twin. In this way, the CEO can drill down into the state indicator of the physical asset to view the potentially critical situation at a greater granularity (e.g., the machinery and an analysis of the sensor data used to identify the situation).

In embodiments, a CEO digital twin 8302 may be configured to monitor an organization's performance based at least in part on real time operations data and the use of the monitoring agent of the client application 8052, as described herein, that is associated with the CEO digital twin 8302. The monitoring agent may report on such activities to the EMP 8000 for presentation in a user interface that is associated with the CEO digital twin 8302. In response, the EMP 8000 may train an executive agent (which may include one or more machine-learned models) to handle and process such notifications when they next arrive, and escalate and/or alert the CEO when such notifications are of an urgent nature, such as an announcement of an acquisition by a competitor, a report indicating an under-performing business unit, a high-profile press article, a radical change in the stock market (for the CEO's company, a cohort member, or the market as a whole), a downgrade in rating by an industry analyst, an external event likely to disrupt operations (such as a natural disaster or epidemic) or some other important event. In embodiments, the CEO digital twin 8302 may generate performance alerts based on real time operations data, performance trends, and the like. This may allow a CEO to optimize initiatives in real-time without having to manually request such real-time data; the CEO digital twin 8302 may automatically present such information and related/necessary alerts as configured by the organization, CEO, or some other interested party.

In embodiments, a CEO digital twin 8302 may be configured to report on the performance of the executive department, personnel of the executive department, executive activities, executive content, executive platforms, executive partners, or some other aspect of management within a CEO's responsibilities. Reporting may be to the CEO, the executive department, to other executives of an organization (e.g., the COO), or to outside third parties (e.g., partners, press releases, and the like). As described herein, reporting may include stakeholder summaries, minutes of meetings, presentations, sales data, customer data, financial performance metrics, personnel metrics, data regarding resource usage, industry summaries (e.g., summaries of merger and acquisition activity in an industry segment), or some other type of reporting data. Reporting and the content of reporting may be shared by the CEO digital twin 8302 with other executive digital twins. The reporting functionality of the CEO digital twin 8302 may also be used for populating new or preset reporting formats, and the like. Templets of common reporting formats may be stored and associated with the CEO digital twin 8302 to automate the presentation of data and analytics according to pre-defined formats, styles and system requirements. In embodiments, an executive agent trained by the user may be trained to surface the most important reports to the user. For example, if the user (e.g., the CEO) consistently views and follows up on sales data reports but routinely skips over reports relating to the manufacturing KPIs, the executive agent may automatically surface sales data reports to the user and may automatically delegate manufacturing KPIs to another executive digital twin (e.g., the COO digital twin).

In embodiments, a CEO digital twin 8302 may be configured to monitor, store, aggregate, merge, analyze, prepare, report and distribute material relating to competitors of a CEO's organization, or named entities of interest. In embodiments, such data may be collected by the EMP 8000 via data aggregation, spidering, web-scraping, or other techniques to search and collect competitor information from sources including, but not limited to, information on investment and/or acquisitions, press releases, SEC or other financial reports, or some other publicly available data. For example, a user wishing to monitor a certain competitor may request that the CEO digital twin 8302 provide materials relating to the certain competitor. In response, the EMP 8000 may identify a set of data sources that are either publicly available or to which the enterprise of the CEO has access (e.g., internal data sources, licensed third-party data, or the like). The EMP 8000 may configure a cohort digital twin 8320 based on the types of data/analysis/services the user requests and the identified set of data sources. The EMP 8000 may then serve the cohort digital twin 8320 associated with the requested party (e.g., competitor) to the CEO digital twin 8302.

In embodiments, a CEO digital twin 8302 may be configured to monitor, store, aggregate, merge, analyze, prepare, report and distribute material relating to regulatory activity, such as government regulations, industry best practices or some other requirement or standard. For example, the CEO digital twin 8302 may be in communication with another enterprise digital twin, such as a General Counsel digital twin 8314, through which the legal team can keep the CEO apprised of new regulation or regulation changes as they occur.

In embodiments, the client application 8052 that executes the CEO digital twin 8302 may be configured with an executive agent 8364 that is trained on the CEO's actions (which may be indicative of behaviors, and/or preferences). In embodiments, the executive agent 8364 may record the features relating to the actions (e.g., the circumstances relating to the user's action) to the expert agent system 8008. For example, the executive agent 8364 may record each time the user delegates a task to a subordinate (which is the action) as well as the features surrounding the delegation of the task (e.g., an event that caused the user to delegate the task, the type of task that was delegated, the role to which the task was delegated, instructions provided by the user with the delegation, and the like). The executive agent 8364 may report the actions and features to the expert agent system 8008 and the expert agent system 8008 may train the executive agent 8364 on the manner by which the executive agent 8364 can delegate or recommend delegation of tasks in the future. Once trained, the executive agent 8364 may automatically perform actions and/or recommend actions to the user. Furthermore, in embodiments, the executive agent 8364 may record outcomes related to the performed/recommended actions, thereby creating a feedback loop with the expert agent system 8008.

References to features and functions of the EMP and digital twins in this example of a CEO digital twin 8302 should be understood to apply to other digital twins, and their respective projects and workflows, except where context indicates otherwise.

In embodiments, a Chief Financial officer (CFO) digital twin 8304 may be a digital twin configured for a CFO of an enterprise, or an analogous executive tasked with overseeing the finance-related tasks of the enterprise. A CFO digital twin 8304 may provide data, analytics, summary, and/or reporting including, but not limited to, real-time, historical, aggregated, comparison, and/or forecasted financial information (e.g., real-time, historical, simulated, and/or forecasted sales figures, expenditures, revenues, liabilities, and the like). In embodiments, the CFO digital twin may work in connection with the EMP 8000 to provide simulations, predictions, statistical summaries, decision support based on analytics, machine learning, and/or other AI and learning-type processing of inputs (e.g., accounting data, sales data, sensor data and the like).

In embodiments, a CFO digital twin 8304 may provide features and functionality including, but not limited to, management of financial personnel, partners and outside consultants and contractors (e.g., accounting firms, auditors and the like), oversight of budgets, procurement, expenditures, receivables, and other finance-related resources, compliance, oversight of sales and sales staff and departments' financial performance, management of contracting, management of internal policies (e.g., policies related to expenditures and reporting), tax law, finance-related privacy law (e.g., pertaining to credit agency data), reporting, compliance, and regulatory analysis.

In embodiments, the types of data that may populate a CFO digital twin may include, but are not limited to, financial performance metrics by business unit, by product, by geography, by factory, by store location(s), by asset class, earnings, cash, balance sheet data, cash flow, profitability, resource utilization, audit data, general ledger data, asset performance data, securities and commodities data, insurance and risk management data, asset aging and depreciation data, asset allocation data, macroeconomic data, microeconomic analytic data, tax data, pricing data, competitive product and pricing data, forecast data, demand planning data, employment and salary data, analytic results of AI and/or machine learning modeling (e.g., financial forecasting), prediction data, recommendation data, or some other type of data relevant to the operations of the CFO and/or finance department. In embodiments, "datum," "data," "dataset," "datastore," "data warehouse," and/or "database," as used herein, may refer to information that is stored in a numeric or statistical format, including summaries, inputs or outputs in statistical or scientific notation, and also includes information that is stored in natural language format (e.g., text excerpts from reports, press releases, statutes and the like), information in a graphic format (e.g., financial performance graphs), information in audio and/or audio-visual format (e.g., recorded audio from conference calls or video from presentations, including natural language transcript summaries of audio and/or audio-visual formatted information), or some other type of information.

In embodiments, a CFO digital twin 8304 may depict a finance department twin of the finance department, which the user may use to identify, assign, instruct, oversee and review finance department personnel and third-party personnel that are associated with the finance activities of an organization, including third-party partners and other outside contractors, such as accounting firms, tax lawyers and the like that are involved in the organization's finance endeavors. Examples of such organization personnel include, but are not limited to, finance department staff, sales analysts, statisticians, data scientists, executive personnel, human resources staff, Board Members, advisors, or some other type of organization personnel relevant to the functioning of a finance department. Examples of a finance department's third-party personnel include, but are not limited to, lawyers, accountants, management consultants, social media platform personnel, finance partners, consultants, contractors, financial firm staff, auditors, or some other type of third-party personnel.

In embodiments, the CFO digital twin 8304 may include a definition of the various roles/employees working under the CFO, the reporting structure, and associated permissions, for each individual in the business unit, and may be populated with the various names and/or other identifiers of the individuals filling the respective roles. In embodiments, a user (e.g., the CFO of an enterprise) may use the CFO digital twin 8304 to adjust the reporting structure within the finance department and/or to grant permissions to one or more individuals within the department.

In embodiments, a CFO digital twin 8304 may be configured to interface with the collaboration suite 8006 to specify and provide a set of collaboration tools that may be leveraged by the finance department and associated parties. The collaboration tools may include video conferencing tools, "in-twin" collaboration tools, whiteboard tools, presentation tools, word processing tools, spreadsheet tools, and the like, as described herein. Collaboration and communication rules may be configured based at least in part on using the AI reporting tool, as described herein.

In embodiments, a CFO digital twin 8304 may be configured to research, create, track and report on a finance department initiative including, but not limited to, an overall department budget, a budget for a single or group of finance initiatives, an audit, a third-party vendor activity, or some other type of expense or budget. In embodiments, the CFO digital twin 8304 may interact with and share such expense or budget data and reporting with other enterprise twins, as described herein, including, but not limited to, a digital twin related to accounts payable, executive staff such as the CEO (e.g., CEO digital twin) or COO (e.g., the COO digital twin), or other suitable enterprise digital twins. In embodiments, the CFO digital twin 8304 may leverage one or more intelligence services of the EMP 8000 based at least in part on the data analytics, machine learning and A.I. processes, as described herein, to provide financial reports, projections, simulations, budgets and related summaries. In some of these embodiments, the CFO digital twin 8304 may use the intelligence services to identify key departments, personnel, third-party or others that are, for example, listed in, or subject to, the budget line item and who therefore may have an interest in such material. Budget material pertaining to a given party may be abstracted and summarized for presentation independent from the entirety of the budget, and formatted and presented automatically, or at the direction of the CFO or other user, to the party that is the origin of the expense and/or subject of the budget item.

In some embodiments, a CFO digital twin 8304 may be configured to track and report on inbound and outbound billing (i.e., accounts receivable and payable) related to the finance department and/or organization. In embodiments, the CFO digital twin 8304 may include a billing digital twin that identifies the billing department, personnel, processes and systems associated with the billing workflows of the enterprise. In these embodiments, the billing digital twin may interact present, store, analyze, reconcile and/or report on billing activities related to parties with whom the finance department is interacting. In some embodiments, the user of the CFO digital twin 8304 may approve bills, issue bills, drill down into a set of bills, initiate investigations of bills or the like via the GUI if the CFO digital twin 8304.

In embodiments, a CFO digital twin 8304 may be configured to provide a user (e.g., a CFO or other finance department executive) with information that is unique to the CFO digital twin 8304 and thus can provide insights and perspectives on financial performance that are unique to the CFO digital twin 8304. For example, in supply chain planning, demand forecasting, operational planning and other of the CFO's activities, traditional data sources, models and projections may be "siloed" in ways, meaning they may be quantitatively robust within a particular domain, but that domain may be constrained by factors including, but not limited to, the origins of the data, the format within which the data is recorded, the statistical weights used in creating or transforming the data that is available, or some other constraint. In embodiments, the EMP 8000 in connection with the CFO digital twin 8304 may create and derive new financial metrics and analytics including, but not limited to, functionalities such as native data and model creation, and data and model combinations and aggregations based at least in-part on the real time operations of an organization. Native data and model creation, such as specifying the data to be collected, the format within which to collect and store the data, the data transformations to model, and so forth gives one the ability to craft, combine, aggregate, modify, transform, and/or weight the native data (including in combination with other third-party data) in manners that are appropriately mathematically tuned to the modeling, analysis, machine learning, and/or AI techniques that are performed by the EMP 8000 and CFO digital twin 8304, rather than being reliant on data and/or model presets. Similarly, in the analytic context of the CFO's operations and the function of the EMP and CFO digital twin 8304, native data and model creation and structuring by the EMP and CFO digital twin 8304 enables analytics, machine learning, AI operations and the like, yielding new analytic results and insights, based at least in part on the real time operations of an organization, because the EMP and CFO digital twin 8304 has enabled the CFO to move further up in financial data creation and modeling operations to assert greater creative control over the types of data and other input material to be used in developing analytic insights that may be created and reported for the purpose of improving performance including, but not limited to, product margins (e.g., gross, contribution, net and the like), product features, upsell opportunities or some other performance metric.

In embodiments, the CFO digital twin 8304 may be configured to simulate finance-related activities on behalf of a user. In these embodiments, the user may identify one or more parameters that can be varied during for a simulation including, but not limited to, financial and/or budget parameters, pricing and sales goal settings, process designs, and maintenance/infrastructure upgrades, internal controls design, product testing frequencies/types, manufacturing down-times, flexible workforce planning, and the like. In these embodiments, the digital twin simulation system 8116 may receive a request to perform the simulation requested by the CFO digital twin 8304, where the request indicates features and the parameters, including financial parameters, that are to be varied. In response, the digital twin simulation system 8116 may return the simulation results to the CFO digital twin 8304, which in turn outputs the results to the user via the client device display. In this way, the user is provided with various outcomes corresponding to different parameter configurations. In some embodiments, the user may select a parameter set based on the various outcomes. In some embodiments, an executive agent trained by the user may select the parameter sets based on the various outcomes. The simulations, analytics and/or modeling performed by the CFO digital twin 8304 may be used to mitigate risk for IPO, M&A, equity and debt offerings, or some other type of transaction. The simulations, analytics and/or modeling performed by the CFO digital twin 8304 may be used to create and structure sales incentives, including commissions and other performance-based compensation. The simulations, analytics and/or modeling performed by the CFO digital twin 8304 may be used to evaluate insurance offerings and other information related to business interruption preparedness. The simulations, analytics and/or modeling performed by the CFO digital twin 8304 may be used to analyze loan covenant monitoring and projections. The CFO equipped with digital twin 8304 will be better able to adapt quickly to change by predicting headwinds, forecasting operational performance, and making informed decisions across departments while mitigating risk.

In embodiments, a CFO digital twin 8304 may be configured to manage operational planning, based at least in part by leveraging predictive analytics for sales planning, and supply chain management in order to increase company efficacy while optimizing operating expenses.

In embodiments, a CFO digital twin 8304 may be configured to access insights across environmental resource management (ERM) solutions for risk oversight that includes, but is not limited to, internal controls design, testing, certification, and reporting while directing listed actions into a repository. In embodiments, a CFO digital twin 8304 may be configured to streamline governance, risk management, and compliance processes in order to connect risk and compliance across the organization and manage complex audit fieldwork and work papers.

In embodiments, a CFO digital twin 8304 may be configured to store, aggregate, merge, analyze, prepare, report and distribute material relating to a financial strategy, plan, activity or initiative. For example, the CFO digital twin 8304 may be associated with a plurality of databases or other repositories of financial materials, summaries and reports and analytics, including such materials, summaries and reports and analytics related to prior financial activity (e.g., prior quarterly financial performance), each of which may be further associated with third-party financial or economic data.

In embodiments, a CFO digital twin 8304 may be configured to store, aggregate, merge, analyze, prepare, report and distribute material relating to financial reporting, ratings, rankings, financial trend data, income data, or other finance department-related data. A CFO digital twin 8304 may link to, interact with, and be associated with external data sources, and able to upload, download, aggregate external data sources, including with the EMP's internal data, and analyze such data. Data analytics, machine learning, AI processing, and other data-driven processes may be coordinated between the CFO digital twin 8304 and an analytics team based at least in-part on insights derived by the artificial intelligence services system 8010. This cooperation and interaction may include assisting with seeding finance-related data elements and domains in the enterprise data store 8012 for use in modeling, machine learning, and AI processing to identify the optimal financial strategy, or some other finance-related metric or aspect, as well as identification of the optimal data measurement parameters on which to base judgement of a finance endeavor's success. Examples of data sources 8020 that may be connected to, associated with, and/or accessed from the CFO digital twin 8304 may include, but are not limited to, a sensor system 8022, a sales database 8024 that is updated with sales figures in real time, a CRM system 8026, news websites 8048, a financial database 8030 that tracks costs of the business, an org chart 8034, a workflow management system 8036, customer databases 1S40 that store customer data, and/or third-party data sources 8038 that store third-party data.

In embodiments, a CFO digital twin 8304 may aggregate data sources and types, creating new data types, summaries and reports that are not available elsewhere. This may reduce reliance upon the need of multiple third-party providers and current solutions. This may, among other benefits and improvements, reduce expenses associated with acquiring data needed for sound financial decision making.

In embodiments, a CFO digital twin 8304 may be configured to monitor a user's performance of finance-related tasks via a monitoring function of an agent of the client application 8052 executing the CFO digital twin 8304. In embodiments, the monitoring function of the executive agent may report on certain activities to the EMP 8000 that are undertaken by the user when interfacing with the CFO digital twin 8304. In response, the EMP 8000 may train the executive agent (which may include one or more machine-learned models) to handle and process such finance-related tasks when they next arrive. For example, the monitoring function may monitor when the user (e.g., the CFO) escalates a state of the CFO digital twin 8304 to the CEO and/or when the user delegates a task to a subordinate via the CFO digital twin 8304. Each time such escalations and/or delegation events occur and/or when the user (e.g., the CFO or other finance executive) responds to an alert or other notifications of an urgent nature and may report and may report the actions taken by the user in response to each respective account to the EMP 8000. In response, the expert agent system 8008 may train an executive agent 8364 based on the reported actions, which in turn may be leveraged by the CFO digital twin to respond to certain later occurring events on which the executive agent 8364 was trained on (e.g., analytics showing poor financial performance or finance activity (e.g., a new investment). For example, an executive agent 8364 trained with respect to a CFO digital twin 8304 may automatically issue financial performance alerts to certain employees based on performance trends of one or more business units. In another example, the executive agent 8304 may automatically escalate a notification to the CEO (which may be depicted in the CEO digital twin 8302) when certain metrics indicate a poor financial forecast. In embodiments, the executive agent 8364 in connection with the CFO digital twin 8304 may allow a CFO to optimize initiatives in real-time without having to manually request such real-time financial performance data. In some embodiments, the CFO digital twin 8304 may automatically present such information and related/necessary alerts as configured by the configuring user, the CFO, or some other user having such permissions.

In embodiments, an executive agent 8364 trained in connection with a CFO digital twin 8304 may be configured to report on the performance of the finance department, personnel of the finance department, finance activities, finance content, finance platforms, finance partners, or some other aspect of management within a CFO's responsibilities. Reporting may be to the CEO, the Board of Directors, other executives of an organization (e.g., the COO), or to outside third parties (e.g., partners, press releases, and the like). The reporting functionality of the CFO digital twin 8304 may also be used for populating required data for formal reporting requirements such as shareholder statements, annual reports, SEC filings, and the like. Templets of common reporting formats may be stored and associated with the CFO digital twin 8304 to automate the presentation of data and analytics according to pre-defined formats, styles and system requirements.

In embodiments, a CFO digital twin 8304 in combination with the EMP 8000 may be configured to monitor, store, aggregate, merge, analyze, prepare, report and distribute material relating to competitors of a CFO's organization, or named entities of interest. In embodiments, such data may be collected by the EMP 8000 via data aggregation, spidering, web-scraping, or other techniques to search and collect competitor information from sources including, but not limited to, press releases, SEC or other financial reports, mergers and acquisitions activity, or some other publicly available data.

In embodiments, a CFO digital twin 8304 in combination with the EMP 8000 may be configured to monitor, store, aggregate, merge, analyze, prepare, report and distribute material relating to regulatory activity, such as government regulations, industry best practices or some other requirement or standard. For example, the CFO digital twin 8304 may be in communication with another enterprise digital twin, such as a General Counsel digital twin 8314, through which the legal team can keep the CFO apprised of new regulations or regulation changes as they occur.

In embodiments, the client application 8052 that executes the CFO digital twin 8304 may be configured with an executive agent that reports a CFO's behaviors and preferences (or other finance personnel's behaviors and preferences) to the expert agent system 8008, as described herein, and the expert agent system 8008 may train the executive agent on how the CFO or other finance personnel respond to certain situations and adjust its operation based at least in part on the data collection, analysis, machine learning and A.I. techniques, as described herein. The foregoing examples are optional examples and are not intended to limit the scope of the disclosure.

References to features and functions of the EMP and digital twins in this example of a finance department and a CFO digital twin 8304 should be understood to apply to other departments and digital twins, and their respective projects and workflows, except where context indicates otherwise.

In embodiments, a Chief Operating officer (COO) digital twin 8306 may be a digital twin configured for a COO of an enterprise, or an analogous executive tasked with overseeing the operations tasks of the enterprise. A COO digital twin 8306 may provide functionality including, but not limited to, management of personnel and partners, oversight of various departments (e.g., oversight over marketing department, HR department, sales department, and the like), project management, implementation and/or rollouts of business processes and workflows, budgeting, reporting, and many other operations-related tasks.

In embodiments, a COO digital twin 8306 may provide data, analytics, summary, and/or reporting including, but not limited to, real-time, historical, aggregated, comparison, and/or forecasted financial information (e.g., sales, expenditures, revenues, liabilities, profitability, cash flow and the like), mergers and acquisitions information, systems data, reporting and controls data, or some other operations related information. In embodiments, the COO digital twin 8306 may work in connection with the EMP 8000 to provide simulations, predictions, statistical summaries, decision support based on analytics, machine learning, and/or other AI and learning-type processing of inputs (e.g., equipment data, sensor data and the like), for example those related to the development, communication and implementation of effective growth strategies and processes for an organization.

In embodiments, the types of data that may populate a COO digital twin may include, but are not limited to, operations data, key performance indicators (KPIs) for factories/plants, business units, assets/equipment; uptime/downtime, safety data, risk management data, supply chain/component availability data, demand plan data, logistics data, workflow data, financial performance metrics by business unit, by product, by geography, by factory, by store location(s), by asset class, earnings, resource utilization; audit data, asset performance data, asset aging and depreciation data, asset allocation data, or some other type of operations-relevant data or information.

In embodiments, a COO digital twin 8306 may depict a twin of the operations department, which the user may use to identify, assign, instruct, oversee and review operations department personnel and third-party personnel that are associated with the design, implementation and evaluation of operational processes, internal infrastructures, reporting systems, company policies, and the like.

In embodiments, the COO digital twin 8306 may include a definition of the various roles/employees working under the COO, the reporting structure, and associated permissions, for each individual in the business unit, and may be populated with the various names and/or other identifiers of the individuals filling the respective roles.

In embodiments, a COO digital twin 8306 may be configured to interface with the collaboration suite 8006 to specify and provide a set of collaboration tools that may be leveraged by the operations department and associated parties. The collaboration tools may include video conferencing tools, "in-twin" collaboration tools, whiteboard tools, presentation tools, word processing tools, spreadsheet tools, and the like, as described herein. Collaboration and communication rules may be configured based at least in part on using the AI reporting tool, as described herein.

In some of these embodiments, the COO digital twin 8306 may be configured to simulate operations activities, such as a proposed new operational plan, process or program. In these embodiments, the digital twin simulation system 8116 may receive a request to perform the simulation requested by the COO digital twin 8306, where the request indicates features and the parameters of the operational plan or other activity that is proposed for implementation, the associated variables for which may be altered or varied to produce differing simulation environments. In response, the digital twin simulation system 8116 may return the simulation results to the COO digital twin 8306, which in turn outputs the results to the user via the client device display. In this way, the user is provided with various outcomes corresponding to different operational parameter configurations. In embodiments, an executive agent trained by the user may select the parameter sets based on the various outcomes.

In embodiments, a COO digital twin 8306 may be configured to store, aggregate, merge, analyze, prepare, report and distribute material relating to an operations strategy, plan, activity or initiative. For example, the COO digital twin 8306 may be associated with a plurality of databases or other repositories of operational data, summaries and reports and analytics, including such materials, summaries and reports and analytics related to prior operations activity, each of which may be further associated with financial and performance metrics pertaining to the activity and which are also accessible to the COO digital twin 8306.

In embodiments, a COO digital twin 8306 may be configured to monitor operational performance, including in real time, based at least in part on use of the monitoring agent of the client application 8052, as described herein, that is associated with the COO digital twin 8306. The monitoring agent may report on such activities to the EMP 8000 for presentation in a user interface that is associated with the COO digital twin 8306. In response, the EMP 8000 may train an executive agent (which may include one or more machine-learned models) to handle and process such notifications when they next arrive and escalate and/or alert the COO when such notifications are of an urgent nature.

In embodiments, a COO digital twin 8306 may be configured to report on the performance of the operations department, personnel of the operations department, operations activities, operations content, operations platforms, operations partners, or some other aspect of management within a COO's responsibilities.

In embodiments, the EMP 100 trains and deploys executive agents on behalf of enterprise users. In embodiments, an executive agent is an AI-based software system that performs tasks on behalf of and/or suggests actions to a respective executive user. In embodiments, the EMP 100 receives data from various data sources associated with a particular entity or workflow and learns the workflows performed by the particular user based on the data and the surrounding circumstances or context. For example, the user may be a COO that is presented a COO digital twin 8306. Among the responsibilities of the COO may be scheduling maintenance and replacement of equipment in a manufacturing, warehouse, or other operational facility. The states depicted in the COO digital twin 8306 may include depictions of the condition of different pieces of equipment within the operational facility. In this example, the COO may schedule maintenance via the digital twin when a piece of equipment is determined to be in a first condition (e.g., a deteriorating condition) and may issue a request to the COO via the COO digital twin 8306 to replace the piece of equipment when the equipment is determined to be in a second condition (e.g., a critical condition). The executive agent may learn the COO's tendencies based on the COO's previous interaction with the COO digital twin 8306. Once trained, the executive agent may automatically request replacements from the COO when a particular piece of equipment is determined to be in the second condition and may automatically schedule maintenance if the piece of equipment is in the first condition.

In embodiments, the client application 8052 that executes the COO digital twin 8306 may be configured with an executive agent that reports a COO's behaviors and preferences (or other operations personnel's behaviors and preferences) to the executive agent system 8008, as described herein, and the executive agent system 8008 may train the executive agent on how the COO or other executive personnel respond to certain situations and adjust its operation based at least in part on the data collection, analysis, machine learning and A.I. techniques, as described herein. The foregoing examples are optional examples and are not intended to limit the scope of the disclosure.

References to features and functions of the EMP and digital twins in this example of an operations department and a COO digital twin 8306 should be understood to apply to other departments and digital twins, and their respective projects and workflows, except where context indicates otherwise.

In embodiments, a Chief Marketing officer (CMO) digital twin 8308 may be a digital twin configured for a CMO of an enterprise, or an analogous executive tasked with overseeing the marketing tasks of the enterprise. A CMO digital twin 8308 may provide functionality including, but not limited to, management of personnel and partners, development and oversight of marketing budgets and resources, management of marketing and advertising platforms, development and management of marketing content, strategies and campaigns, reporting, competitor analysis, regulatory analysis, and management of data privacy and security.

In embodiments, the types of data that may populate and/or be utilized by a CMO digital twin 8308 may include, but are not limited to, macroeconomic data; market pricing data; competitive product and pricing data; microeconomic analytic data; forecast data; demand planning data; competitive matrix data; product roadmap; product capability data; consumer behavior data; consumer profile data; collaborative filtering data; analytic results of AI and/or machine learning modeling; channel data; demographic data; geographic data; prediction data; recommendation data, or some other type of data relevant to the operations of the CMO and/or marketing department.

In embodiments, an executive digital twin, such as a CMO digital twin 8308 or other executive digital twin may depict a twin of a department, such as the marketing department or other department, which the user may use to identify, assign, instruct, oversee and review department personnel and third-party personnel that are associated with the activities of a particular department of an organization, including third-party partners and other outside associates involved in the organization's related endeavors. Examples of such organization personnel include, but are not limited to, an organization's marketing staff, sales staff, finance staff, product design personnel, engineers, analysts, statisticians, data scientists, advertising staff, executive personnel, human resources staff, Board Members, advisors, or some other type of organization personnel. Examples of an organization's third-party personnel include, but are not limited to, advertising firm staff, ad exchange staff, outside creative or content developers, social media platform personnel, co-marketing partners, consultants, contractors, financial firm staff, auditors, or some other type of third-party personnel. In embodiments, the departmental twin (in this example a marketing department twin) may include a definition of the various roles/employees working under the executive (e.g., CMO), the reporting structure, and associated permissions, for each individual in the business unit, and may be populated with the various the names and/or other identifiers of the individuals filling the respective roles. In embodiments, the department twin (e.g., marketing department twin) may include subsections that are specific to an activity or initiative, such as a marketing or advertising campaign. In this way, the executive (e.g., a CMO) may easily identify the personnel and third-party providers that are involved in the initiative and/or assign individuals and/or third parties to the initiative. A user may define one or more restrictions, permissions, and/or access rights of the individuals indicated in the business unit (e.g., using the enterprise configuration system 8002), as described herein, such that the restrictions, permissions, and/or access rights can be controlled by the CMO (or analogous user). In embodiments, the permissions to define such restrictions and/or rights may be, for example, defined in the organizational digital twin that lists the user as having a role that permits implementing permissions, restrictions, and/or access rights to roles/individuals In embodiments, a personnel restriction or right associated with a role/individual may be specific to a project, such as a marketing or advertising campaign, and may define one or more types of data that a particular user or group of users is allowed, or not allowed, to access (either directly or in a digital twin). For example, a first marketing campaign twin may allow a marketing department employee to review the first marketing budget for a first marketing campaign and approve marketing expenditures for the first marketing campaign up to $10,000, but a second marketing campaign twin may disallow the same employee from any budgetary review or expenditures. Similar approaches can be used by projects of various types across an organization and its departments, such as product development projects, logistics projects, corporate development projects, service projects, and many others. In embodiments, a breach, or attempted breach, of a restriction, permission or access right may invoke a notice, alert, warning or some other action to an individual notifying them of the breach or attempted breach. In an example such a notice, alert, or warning may be sent to an individual that is identified based at least in part on the individual's position in the org chart relative to the person breaching or attempting to breach a restriction, permission or access right. In another example, such a notice, alert, or warning may be sent to an individual that is not identified in a departmental org chart and/or specific project or campaign, but rather may be sent to an individual that is identified based at least in part on a rule that is defined in the organizational twin of the entire enterprise. For example, a rule stored within an organizational digital twin of the entity may specify that an alert must be sent to an Information Security Department staff member, or some other staff member, upon an attempted login to a forbidden file, or other, system. Other rules may be related to geographic, temporal, or other types of restrictions, as described herein. In embodiments, an alert may be an email, phone call, text, or some other communication type.

In embodiments, a CMO digital twin 8308 may be configured to oversee and manage personnel and human resources issues and activities related to the marketing department. For example, a marketing department twin may map each individual within the marketing department to her respective marketing department. Using the CMO digital twin 8308, the user may be able to select a department to see greater detail on the functioning of the department. Alternatively, this step may be automatically performed by the CMO digital twin 8308, requiring no action from the user (e.g., the CMO) (e.g., via an executive agent trained by the user). For example, the greater detail might include the number of vacancies currently associated with the department and the duration that each of the open positions has remained unfilled, estimated salary data associated with the open positions, and the like. The user may be able to also select to see more information on the budget associated with a given department, such as a department with a personnel vacancy, in order to see if there is currently available budget to cover a new hire for the department. Alternatively, this step may be automatically performed by the CMO digital twin 8308, requiring no action from the user. Continuing the example, if there is budget to cover a new hire, the CMO digital twin 8308 may provide a link or other opportunity for the user to initiate a communication with human resources or some other department personnel to begin the process of posting a job listing. Alternatively, this step may be automatically performed by the CMO digital twin 8308 (e.g., via an executive agent executing on behalf of the user), requiring no action from the user. This communication may be drawn from a repository of form emails, letters or other communications so that the user need not compose the communication, but rather only signal within the CMO digital twin 8308 that such communication should be sent. Similarly, based on the communication type (e.g., "initiate a new marketing job posting") the user may not need to select the receiving party, whom may be stored in the EMP as the appropriate recipient based at least in part on a rule associated with the communication type. Continuing the example further, alternatively, if there is not budget available to cover a new hire, a second type of communication may be invoked by the CMO digital twin 8308, for example, an email, calendar invitation to reserve a meeting, or some other type of communication may be selected to be sent to the CFO, or other financial personnel, to request a meeting to discuss the marketing department's budget or initiate some other activity. Following this example, if and when the new hires are approved, the CMO digital twin may allow the user to delegate the hiring task to a subordinate or herself. In the event the user is assigned the hire the new employee, the CMO digital twin 8308 may provide materials regarding candidates (e.g., resume, referrals, interview notes from interviewers, or the like) and the user may select one or more candidates to further consider, interview, or hire.

In an example, a user may be able to select a sub-department within the marketing department to view the performance of the sub-department in greater detail. For example, the greater detail might include the number of types of training sessions, tutorials, events, conferences, and the like that personnel in the selected marketing department have received. The user may be able to compare such training and event attendance levels with a specified target criterion that is stored in EMP, or that is associated with the EMP. This may result in the CMO digital twin 8308 reporting to the CMO a listing of personnel in her department whose training and/or event attendance fails to meet the target criterion. This listing may be prioritized by the CMO digital twin 8308 to highlight those staff members most in need of further training. The user may be able to also select to see more information on the budget associated with a given department, such as a department with staff who do not have adequate training according to the target criterion, in order to see if there is currently available budget to cover additional training for the department. If there is budget to cover additional training, the CMO digital twin 8308 may provide, for example, a link or other opportunity for the user to initiate a communication to a staff member in need of training to alert them that they must schedule training and/or attendance at an event within a timeframe. This communication may be drawn from a repository of form emails, letters or other communications so that the user need not compose the communication, but rather only signal within the CMO digital twin 8308 that such communication should be sent. Continuing the example further, a second type of communication may be invoked by the CMO digital twin 8308, for example, a request for information, training registration, or some other type of communication may be selected to be sent to a third-party training vendor that is used by the marketing department, a conference event registration, or other training or event entity, to request scheduling training and/or event registration, or some other activity. Alternatively, the steps, discussed above, for tracking and reporting on marketing personnel training and attendance may be automatically performed by the CMO digital twin 8308, requiring no action from the user. References to features and functions of the EMP and digital twins in this example of a marketing department and a CMO digital twin 8308 should be understood to apply to other departments and digital twins, and their respective projects and workflows, except where context indicates otherwise.

In embodiments, a CMO digital twin 8308 may be configured to interface with the collaboration suite 8006 to specify and provide a set of collaboration tools that may be leveraged by the marketing department and associated parties. The collaboration tools may include video conferencing tools, "in-twin" collaboration tools, whiteboard tools, presentation tools, word processing tools, spreadsheet tools, and the like, as described herein. Collaboration and communication rules may be configured based at least in part on using the AI reporting tool, as described herein.

In embodiments, a CMO digital twin 8308 may be configured to research, create, track and report on a marketing department budget including, but not limited to, an overall department budget, a budget for a single or group of marketing or advertising campaigns, a budget for a third-party vendor, or some other type of budget. The CMO digital twin 8308 may interact with and share such budget data and reporting with other executive twins, as described herein, including, but not limited to, a digital twin related to the finance department, accounts payable, executive staff such as the CEO and CFO, or others. The CMO digital twin 8308 may include intelligence, based at least in part on the data analytics, machine learning and A.I. processes, as described herein, to read marketing budgets and related summaries and data in order to identify key departments, personnel, third-party or others that are, for example, listed in, or subject to, the budget line item and who therefore may have an interest in such material. Budget material pertaining to a given party may be abstracted and summarized for presentation independent from the entirety of the budget, and formatted and presented automatically, or at the direction of a user, to the party that is the subject of the budget item. In a simplified example, a CMO may create a new marketing campaign, "Airline—Airfare coupon texting campaign—January," which includes the following line items: Third-party advertising firm content creation $15,000; Social media platform placement $50,000; analytics department $25,000, and so forth. The entirety of the budget may be shared (at the election of the user or automatically) with parties that must approve the full budget, such as a CFO. As described herein this sharing may be accomplished by the CMO digital twin 8308 communicating directly with a CFO digital twin, so that the information is presented to the CFO without requiring the CFO to have knowledge of the budget or requesting the budget. Subparts of the budget, for example, the analytics department line item, may be automatically sent to the head of the analytics department by the CMO digital twin 8308 to inform that department of the total amount of authorized spending that is approved for that department for the specific marketing campaign.

In embodiments, a CMO digital twin 8308 may be configured to track and report on inbound and outbound billing (i.e., accounts receivable and payable) related to the marketing department. The billing department, personnel, processes and systems, including a Billing digital twin may interact with the CMO digital twin 8308 to present, store, analyze, reconcile and/or report on billing activities related to parties with whom the marketing department is contracting, such as ad agencies, ad networks, ad exchanges, content creators, advertisers, social media platforms, television, radio, online entities, or others.

In embodiments, a CMO digital twin 8308 may be configured to depict marketing campaign twins. In these embodiments, the CMO digital twin 8308 may depict various states and/or items relating to a marking campaign such as marketing content associated with a marketing campaign, market research performed with respect to a marketing campaign, tracking data of marketing content associated with marketing campaigns (e.g., geographic reach of marketing campaigns, demographic data associated with campaigns, etc.), analyses of marketing campaigns (e.g., outcomes related to marketing campaigns on various platforms), and the like. In some embodiments, a CMO digital twin may be configured to automatically report on marketing campaign-related activity via a user interface associated with the CMO digital twin 8308. Such activities may be determined using marketing department metadata that indicates state changes, such as an alteration to a website content, a change to a product photograph in an advertisement, a change in wording of a mailing, and the like. The CMO digital twin 8308 may also depict activity among a class of entities that are monitored or that are specified for monitoring in the CMO digital twin 8308, such as a new press release regarding a discounted advertising opportunity available from an ad exchange. In embodiments, a CMO digital twin 8308 may be configured to provide research, tracking, monitoring, and analyses of media content performance across various marketing related platforms, and automatically report on such activity to a user interface associated with the CMO digital twin 8308. Such platforms may include, but are not limited to, customer relationship platforms (CRMs), organization website(s), social media, blogs, press releases, mailings, in-store or other promotions, or some other type of marketing platform-related material or activity.

In some of these embodiments, the CMO digital twin 8308 may be configured to simulate marketing campaigns, such that the simulations of the marketing campaign may vary parameters such as vehicles (e.g., social media, television, billboards, print, etc.), budget, targeting parameters (e.g., geographic, demographic, or the like), and/or other suitable marketing campaign parameters. In these embodiments, the digital twin simulation system 8116 may receive a request to perform the simulation CMO digital twin, where the request indicates campaign features and the parameters that are to be varied. In response, the digital twin simulation 8116 may return the simulation results to the CMO digital twin 8308, which in turn outputs the results to the user via the client device display. In this way, the user is provided with various outcomes corresponding to different parameter configurations. In some embodiments, the user may select a parameter set based on the various outcomes. In some embodiments, an executive agent trained by the user may select the parameter sets based on the various outcomes.

In embodiments, a CMO digital twin 8308 may be configured to store, aggregate, merge, analyze, prepare, report and distribute material relating to a marketing strategy, plan, campaign or initiative. For example, the CMO digital twin 8308 may be associated with a plurality of databases or other repositories of marketing presentation materials, summaries and reports and analytics, including such presentation materials, summaries and reports and analytics related to prior marketing campaigns, each of which may be further associated with financial and performance metrics pertaining to the campaign and which are also accessible to the CMO digital twin 8308. Such historical marketing campaign material may consist of advertising, marketing or other content that may be categorized based in part on the financial and performance metrics with which it is associated. For example, there may be a first category called "Market Tested Content," which consists of content that has been field deployed in a marketing campaign within a customer population, the actual performance of which is therefore fully known based on actual market testing. Because the marketing content from this category has been field tested, the content may be scored based at least in part on the financial, performance or other data with which it is associated. A second category may be "New Content—Simulation Tested," which consists of content that has not been deployed in the field, but which has been subject to analytic testing such as simulated customer segmentation analysis, simulated A/B testing, simulated attribution modeling, simulated market mix modeling, machine learning, A.I. techniques including, but not limited to, classification, probabilistic modeling, learning techniques, and the like. Because the marketing content from this category has been simulation tested, the content may be scored based at least in part on the simulated performance data or other data with which it is associated. Continuing the example, a third category of content may be "New Content—Panel Tested," which consists of content that has not been deployed in the field, nor simulation tested, but which has been subject to testing among a human panel for their views, opinions and impressions. Because the marketing content from this category has been human panel tested, the content may be scored based at least in part on the performance data, as reported by the human panel, or other data with which it is associated. A final, fourth category of content may be "New—Untested," which is newly developed or other content that has not been tested in the field, in simulation, or by a human panel. The CMO digital twin 8308 may utilize the machine learning, A.I. and other analytic capabilities, as described herein, to analyze the content of the four categories of content and classify and score the content characteristics that are probabilistically associated with improved financial or other performance for stated types of marketing campaigns or marketing subject matter. Statistical weights may be applied to such characteristics, where the weight is indicative of a greater degree of financial or some performance metric of interest. Similarly, the characteristics of the market may be analyzed vis-a-vis the marketing content to determine the consumer characteristics that are probabilistically associated with improved financial or other performance for given marketing content. The CMO digital twin 8308 may provide a user interface within which access to this repository of stored data on content category, consumer and performance is available. When planning a marketing campaign, the CMO, or other marketing personnel, may use the CMO digital twin 8308 to select from this repository of content, that content which probabilistically will perform better with the intended consumer targets of the new campaign. For example, from historical marketing field tests from actual prior marketing campaigns, the data may show that marketing content having images of large dogs outperformed (based on, for example, ad conversion rates) content picturing small dogs, and this effect was positively correlated with age (i.e., older persons have an even greater preference for larger dogs). The performance data from the simulation-tested content may show a similar, but smaller effect based on the size of the dog images in the content, and the panel-tested data may show a similar effect for large dog imagery in content, but also have performance data indicating that the effect appears, based on the panel data, to be muted for persons 15 years or younger (i.e., young persons are more attracted to smaller dog breeds than older persons). For the CMO using the CMO digital twin 8308 this data, and the characteristics of the more successful content, may be used to select from the fourth category of content ("New—Untested") that content that is most appropriate for a new marketing campaign intended to sell a soft drink. In embodiments, the artificial intelligence services system 8010 of the EMP 8000 may select the content and segment its presentation based at least in part on the prior performance data, so that the ads that are presented on platforms that tend to have persons over 15 will use content having a predominance of large breed dogs, and those platforms with younger audiences will offer a greater mix of dog breeds and possibly a preference for small breed dogs in marketing images. As the marketing campaign deployed to the field, the CMO digital twin 8308 may monitor, track and report on the marketing campaign's performance so that the CMO can review and intervene as necessary. Once the new content has been field tested it may be stored and classified in the first category of content, "Market Tested Content," along with the related financial and performance metrics. In another example, similar stored content, content categories, characteristics and financial and performance metrics may be used by the CMO digital twin 8308 to recommend, for example, search engine optimization (SEO), or other marketing strategies and techniques.

In embodiments, a CMO digital twin 8308 may be configured to store, aggregate, merge, analyze, prepare, report and distribute material relating to market surveys, online surveys, customer panels, ratings, rankings, marketing trend data or other data related to marketing. A CMO digital twin 8308 may link to, interact with, and be associated with external data sources, and able to upload, download, aggregate external data sources, including with the EMP's internal data, and analyze such data, as described herein. Data analysis, machine learning, AI processing, and other analysis may be coordinated between the CMO digital twin 8308 and an analytics team based at least in part on using the artificial intelligence services system 8010. This cooperation and interaction may include assisting with seeding data elements and domains in the enterprise data store 8012 for use in modeling, machine learning, and AI processing to identify the optimal marketing content, sales channels, target consumers, price points, timing, or some other marketing-relating metric or aspect, as well as identification of the optimal data measurement parameters on which to base judgement of a marketing endeavor's success. Examples of data sources 8020 that may be connected to, associated with, and/or accessed from the CMO digital twin 8308 may include, but are not limited to, a sensor system 8022, a sales database 8024 that is updated with sales figures in real time, a CRM system 8026, a content marketing platform 8028, news websites, a financial database 8030 that tracks costs of the business, surveys 8032 (e.g., customer satisfaction surveys), an org chart 8034, a workflow management system 8036, customer databases 8040 that store customer data, and/or third-party data sources 8038 that store third-party data.

In embodiments, a CMO digital twin 8308 may be configured to assist in the development of a new marketing campaign. For example, the CMO digital twin 8308 may identify an internal and external partner team for a marketing campaign. For example, individuals who are ideal candidates to assist with a marketing campaign may be identified based at least in part on experience and expertise data that is stored within or in association with the CMO digital twin 8308. In another example, the CMO digital twin 8308 may identify marketing campaign goals and record, monitor and track the campaign's performance relative to those goals and present, in real-time, the tracking of the campaign to the CMO within a user interface that is associated with the CMO digital twin 8308. Examples of marketing targets include, but are not limited to, unit distribution, customer acquisition customer retention, customer churn, customer loyalty (e.g., repeat purchases), customer acquisition costs, duration of average sales cycle, ad conversion rate, sales growth, geographic expansion of sales, demographic expansion of sales, market penetration, percentage of market control, marketing campaign ROI, regional comparison of performance, channel analysis, sales partner analysis, marketing partner analysis, or some other marketing target.

In embodiments, a CMO digital twin 8308 may be configured to monitor customer feedback loops, customer opinions, customer satisfaction, complaints, product returns and the like based at least in part on use of the monitoring agent of the client application 8052, as described herein, that is associated with the CMO digital twin 8308. Such feedback data may include, but is not limited to, data that derives from call center activity, chatbot activity, email (e.g., complaints), product returns, Better Business Bureau submissions, or some other type of customer feedback or manifestation of customer opinion. The client application 8052 may include a monitoring agent that monitors the manner by which customers or others respond to a marketing campaign. The monitoring agent may report the customer's response to such campaigns to the EMP 8000 for presentation in a user interface that is associated with the CMO digital twin 8308. In response, the EMP 8000 may train an executive agent (which may include one or more machine-learned models) to handle and process such notifications when they next arrive, and escalate and/or alert the CMO when such notifications are of an urgent nature, for example, an announcement of a class action lawsuit related to a product that is the subject of a marketing campaign. In embodiments, the CMO digital twin 8308 may generate performance alerts based on performance trends. This may allow a CMO to optimize marketing campaigns in real-time without having to manually request such real-time performance data; the CMO digital twin 8308 may automatically present such information and related/necessary alerts as configured by the organization, CMO, or some other interested party.

In embodiments, a CMO digital twin 8308 may be configured to report on the performance of the marketing department, personnel of the marketing department, marketing campaigns, marketing content, marketing platforms, marketing partners, or some other aspect of management within a CMO's purview. Reporting may be to the CMO, the marketing department, to other executives of an organization (e.g., the CEO), or to outside third parties (e.g., marketing partners, press releases, and the like). As described herein, reporting may include sales summaries, customer data, marketing campaign performance metrics, cost-per-sale data, cost-per-conversion data, customer analysis, such as predicted customer lifetime value for newly acquired customers, or some other type of reporting data. Reporting and the content of reporting may be shared by the CMO digital twin 8308 with other executive digital twins, for example, data related to new customers having a particularly high predicted customer lifetime value may be shared with a sales staff for the purpose of exploring cross-selling opportunities. The reporting functionality of the CMO digital twin 8308 may also be used for populating required data for formal reporting requirements such as shareholder statements, annual reports, SEC filings, and the like. Templets of common reporting formats may be stored and associated with the CMO digital twin 8308 to automate the presentation of data and analytics according to pre-defined formats, styles and system requirements In embodiments, a CMO digital twin 8308 may be configured to monitor, store, aggregate, merge, analyze, prepare, report and distribute material relating to competitors of a CMO's organization, or named entities of interest. In embodiments, such data may be collected by the EMP 8000 via data aggregation, spidering, web-scraping, or other techniques to search and collect competitor information from sources including, but not limited to, press releases, SEC or other financial reports, mergers and acquisitions activity, or some other publicly available data.

In embodiments, a CMO digital twin 8308 may be configured to monitor, store, aggregate, merge, analyze, prepare, report and distribute material relating to regulatory activity, such as government regulations, industry best practices or some other requirement or standard. For example, the marketing industry is subject to data privacy and security laws in many jurisdictions, and it is an area of law and regulation that is experiencing rapid change. In embodiments, the CMO digital twin 8308 may be in communication with another enterprise digital twin, such as a General Counsel digital twin 8314, through which the legal team can keep the CMO apprised of new regulation or regulation changes as they occur. Similarly, as a CMO develops new market campaigns and selects the jurisdictions (e.g., United States vs Europe) and populations that will be a part of the campaigns (e.g., minors vs. adults), the CMO digital twin 8308 may automatically send a synopsis of the aspects of the campaigns that are relevant for privacy law review so that the campaign may be vetted for legal and regulatory compliance prior to launch. In an example, such a marketing campaign synopsis might include a summary of the jurisdictions of the campaign, intended audience, means of obtaining consent, the type of consent to be obtained (e.g., opt-in, opt-out, passive), and so forth. Once approved and launched, as customer consents and other data privacy-related information is received by an organization, the CMO digital twin 8308 may facilitate the CMO tracking metrics, for example the percentage of customers choosing to opt-in to receive future marketing material (e.g., email solicitations). As the organization receives privacy related material it may store such information for future retrieval, summary, deletion or other activity, for example, in response to a data subject request from an EU citizen who has requested their data be deleted (i.e., exercising their "right to be forgotten"). In embodiments, the CMO digital twin 8308 may monitor, store, aggregate, merge, analyze, prepare, report and distribute material relating to what customer data is collected, the party responsible for its collection and storage, the location and duration of storage, and so forth. This data may be called forth by the CMO digital twin 8308, for example, in the event of a data breach. The CMO digital twin 8308 may be able to summarize, for example, a list of persons affected by the breach and the type of data that was breached and share this information with a Chief Privacy Officer (CPO), including sharing with the CPO digital twin.

In embodiments, the client application 8052 that executes the CMO digital twin 8308 may be configured with an executive agent that reports a CMO's behaviors and preferences (or other marketing personnel's behaviors and preferences) to the expert agent system 8008, as described herein, and the expert agent system 8008 may train the executive agent on how the CMO or other marketing personnel respond to certain situations and adjust its operation based at least in part on the data collection, analysis, machine learning and A.I. techniques, as described herein.

In embodiments, a Chief Technical officer (CTO) digital twin 8310 may be a digital twin configured for a CTO or other technology executive of an enterprise tasked with overseeing and managing the R&D, technology development, technical implementations of the enterprise, and/or engineering activities of the enterprise. In embodiments, a CTO digital twin 8310 provides real-time views of enterprise technology assets, including technology capabilities and versions. For example, in a manufacturing enterprise, a CTO digital twin 8310 may depict where environment-compatible updates, upgrades, or substitutions may be available. A CTO digital twin 8310 may provide data, analytics, summary, and/or technical reporting including, but not limited to, real-time, historical, aggregated, comparison, and/or forecasted technical information (e.g., real-time, historical, simulated, and/or forecasted technical performance data related to company products, benchmarking results, and the like). A CTO using by a CTO digital twin 8310 may be better able to stay abreast of technical developments and software engineering impacts by engaging in continuous virtualized learning using the CTO digital twin 8310. In embodiments, a CTO digital twin 8310 may assist in virtual collaboration (a CTO-essential skill), as a CTO will need to partner with in-house engineers and external vendors in a virtual environment to imagine and ideate to achieve something, often something that hasn't been done before. In embodiments, the CTO digital twin may work in connection with the EMP 8000 to provide simulations, predictions, statistical summaries, decision support based on analytics, machine learning, and/or other AI and learning-type processing of inputs (e.g., technical performance data, sensor data and the like).

In embodiments, a CTO digital twin 8310 may provide features and functionality including, but not limited to, management of technical personnel, partners and outside consultants and contractors (e.g., developers, beta testers, and the like), oversight of budgets, procurement, expenditures, policy compliance (e.g., policies related to code usage, storage, documentation, and the like), and other technology, development, and/or engineering-related resources, and/or reporting.

In embodiments, the types of data that may populate a CTO digital twin may include, but are not limited to, technology performance and specification data, interoperability and compatibility data, cybersecurity data, competitor data, failure mode effects analysis (FMEA) data, technology/engineering roadmap data, information technology systems data (including with respect to any of the hardware, software, networking, and other types mentioned or described herein), operations technology and systems data, uptime/downtime/operational performance data, asset aging/vintage/timing data, technical performance metrics by business unit, by product, by geography, by factory, by store location(s), resource utilization, competitive product and pricing data, forecast data, demand planning data, analytic results of AI and/or machine learning modeling (e.g., technical forecasting), prediction data, metrics relating to patent disclosures, patent filings, and/or patent grants, recommendation data, and/or other types of data relevant to the operations of the CTO and/or technology, development, and/or engineering department.

In embodiments, a CTO digital twin 8310 may depict a twin of a set of technology, development, and/or engineering departments, which the user may use to identify, assign, instruct, oversee and review technology, development, and/or engineering department personnel and third-party personnel that are associated with the technology, development, and/or engineering activities of an organization, including third-party partners and other outside contractors, such as third-party developers and/or testers that are involved in the organization's technology, development, and/or engineering activities. Examples of such organization personnel include, but are not limited to, technology, development, and/or engineering department staff, sales staff and analysts, statisticians, data scientists, or some other type of organization personnel relevant to the functioning of a technology, development, and/or engineering department. Examples of a technology, development, and/or engineering department's third-party personnel include, but are not limited to, management consultants, developers, software engineers, testers, and/or engineering partners, consultants, contractors, technical firm staff, auditors, or some other type of third-party personnel.

In embodiments, the CTO digital twin 8310 may include a definition of the various roles/employees working under the CTO, the reporting structure, and associated permissions, for each individual in the business unit, and may be populated with the various names and/or other identifiers of the individuals filling the respective roles.

In embodiments, a client application 8052 executing a CTO digital twin 8310 may interface with the collaboration suite 8006 to specify and provide a set of collaboration tools that may be leveraged by the technology, development, and/or engineering department and associated parties. The collaboration tools may include video conferencing tools, "in-twin" collaboration tools, whiteboard tools, presentation tools, word processing tools, spreadsheet tools, and the like, as described herein. Collaboration and communication rules may be configured based at least in part on using the AI reporting tool, as described herein. Collaboration and communication tools and associated rules may be configured to use company-, industry- and domain-specific taxonomies and lexicons when representing entities, states and flows within the CTO digital twin 8310.

In embodiments, a CTO digital twin 8310 may be configured to allow a user to research, create, track and report on a technology, development, and/or technology or engineering department initiative including, but not limited to, a new product development, update, enhancement, replacement, upgrade, or the like. In embodiments, the CTO digital twin 8310 may be associated and/or in communication with databases, including databases storing analytic and/or product data and product performance data, and present information to an interface associated with the CTO digital twin 8310, as described herein. As product development advances, real time operations and other technical information may be used to continuously update the product development summary that is available for the CTO or other technical personnel to review. The CTO digital twin 8310 may be also be associated and/or in communication with databases, including databases storing analytic and/or competitive product data and product performance data, and present this information to an interface associated with the CTO digital twin 8310, as described herein. As the CTO's company's products change, and competitor products change, their current state and specifications may be presented by the CTO digital twin 8310 for the CTO or other technical personnel to review direct product comparisons. Such comparisons may be used, in part, to produce analytics, scores, reports and the like indicating the relative advantages and/or disadvantages that a company's product(s) has relative to competitor product(s). In an example, a report may be automatically provided to the marketing department to emphasize the relative advantages that a company product has over a competitor product (e.g., speed of processing) that should be used in a new marketing campaign. Sharing with the marketing department may be accomplished, in part, by the CTO digital twin 8310 communicating with the CMO digital twin 8308 to present reports or other information to the CMO or marketing staff.

In embodiments, the CTO digital twin 8310 may be configured to present simulations of technology development and/or engineering activities. For example, in some embodiments, the digital twin system 8004 may simulate product usage under a plurality of constraints that might impact product performance, such as an operating environment, processing speed, storage or other platform characteristics. In embodiments, real time operations data, such as operations data available through the EMP 100, may be incorporated into simulated data for the purposes of running operational simulations. This may allow a CTO to a gain a deeper understanding of the operation of the company's products in the real world and within an altered, simulated real world environment. It may also allow operational digital twin-based product architectures to be built that link actual product production with business priorities to enable simulated decision making in a virtual environment and assist in the evaluation of vendor supplied solutions by enabling the review of such digital twins in the context of their supplied solutions and the relationship to the business. In embodiments, simulations may also include simulations related to varying technical and/or product specification parameters, product design and monitoring, internal controls design, testing, certification, and deliver technical and non-technical data in reports, presentations, and dashboards for technical decision making. In these embodiments, the digital twin simulation system 8116 may receive a request to perform the simulation requested by the CTO digital twin 8310, where the request indicates features and the parameters, including technical parameters, that are to be varied. In response, the digital twin simulation system 81D16 may return the simulation results to the CTO digital twin 8310, which in turn outputs the results to the user via the client device display. In this way, the user is provided with various outcomes corresponding to different technical and/or product parameter configurations. In some embodiments, the user may select a parameter set based on the various outcomes. In some embodiments, an executive agent trained by the user may select a technical parameter set based on the various outcomes. The simulations, analytics and/or modeling performed by the CTO digital twin 8310 may be used to reduce testing time, design time, or some other type of technical cost. The simulations, analytics and/or modeling performed by the CTO digital twin 8310 may be used to create and structure product development and testing plans. The simulations, analytics and/or modeling performed by the CTO digital twin 8310 may be used to evaluate product go-to-market timing and preparedness. The CTO equipped with a CTO digital twin 8310 will be better able to adapt quickly to identify product and/or technical parameters in need of further development and predict products' operational performance. This may reduce errors, speed testing and reduce the need for patches, bug fixes, updates and the like and flatten agile process management.

In embodiments, a CTO digital twin 8310 may provide an interface that allows a user to research, create, track and report on a technology, development, and/or engineering department initiative including, but not limited to, an overall department budget, a budget for a single or group of technology, development, and/or engineering initiatives, a third-party vendor activity, or some other type of expense or budget. The CTO digital twin 8310 may interact with and share such expense or budget data and reporting with other executive twins, including, but not limited to, a digital twin related to accounts payable, executive staff such as the CEO, and/or others.

In embodiments, the CTO digital twin 8310 may leverage the artificial intelligence services system 8010 (e.g., data analytics, machine learning and A.I. processes) to read technical reports, projections, simulations, and related summaries and data in order to identify key departments, personnel, third-party or others that are, for example, listed in, or subject to, a technical item or detail provided.

In embodiments, a CTO digital twin 8310 may be configured to provide a CTO, or other technology, development, and/or engineering department personnel, with information that is unique to the CTO digital twin 8310 and thus can provide insights and perspectives on technical performance that are unique to the CTO digital twin 8310, based at least in part on the CTO digital twin 8310 make making use of real time production, development and operational data based on both real world and simulated activity.

In embodiments, the CTO digital twin 8310 may be configured to manage operational planning, based at least in part by leveraging predictive analytics for development planning, and supply chain management in order to increase company efficacy while optimizing operating expenses. In embodiments, the CTO digital twin 8310 may be configured to obtain and depict oversight activity that includes, but is not limited to, internal controls design, testing, and reporting while directing listed actions the appropriate personnel.

In embodiments, a CTO digital twin 8310 may be configured to depict, aggregate, merge, analyze, prepare, report and distribute material relating to a technical strategy, plan, activity or initiative. For example, the CTO digital twin 8310 may be associated with a plurality of databases or other repositories of technical materials, summaries and reports and analytics, including such materials, summaries and reports and analytics related to prior technical activity and results (e.g., bug testing), each of which may be further associated with third-party technical or economic data, including competitor product data and/or technical benchmarks.

In embodiments, a CTO digital twin 8310 may be configured to depict, aggregate, merge, analyze, prepare, report and distribute material relating to technical reporting, ratings, rankings, technical trend data, or other data related to company technology, development, and/or engineering. A CTO digital twin 8310 may link to, interact with, and be associated with external data sources, and able to upload, download, aggregate external data sources, including with the EMP's internal data, and analyze such data, as described herein. Data analysis, machine learning, AI processing, and other analysis may be coordinated between the CTO digital twin 8310 and an analytics team based at least in part on using the intelligence services system 8010. This cooperation and interaction may include assisting with seeding technology, development, and/or engineering-related data elements and domains in the enterprise data store 8012 for use in modeling, machine learning, and AI processing to identify the optimal technical strategy, or some other technology, development, and/or engineering-relating metric or aspect, as well as identification of the optimal data measurement parameters on which to base judgement of a technology initiative, development initiative, and/or engineering endeavor's success. Examples of data sources 8020 that may be connected to, associated with, and/or accessed from the CTO digital twin 8310 may include, but are not limited to, a sensor system 8022, a sales database 8024 that is updated with sales figures in real time, a technology, development, and/or engineering platform, news websites 8048, a technical database that tracks costs of the business, an org chart 8034, a workflow management system 8036, customer databases 8040 that store customer data, and/or third-party data sources 8038 that store third-party data.

In embodiments, a CTO digital twin 8310 may aggregate data sources and types, creating new data types, summaries and reports that are not available elsewhere. This may reduce reliance upon the need of multiple third-party providers and current solutions. This may, among other benefits and improvements, reduce expenses associated with acquiring data needed for sound technical decision making.

In embodiments, a CTO digital twin 8310 may be configured to monitor technical performance, including real time monitoring, based at least in part on use of the monitoring agent of the client application 8052, as described herein, that is associated with the CTO digital twin 8310. The monitoring agent may report on such activities to the EMP 8000 for presentation in a user interface that is associated with the CTO digital twin 8310. In response, the EMP 8000 may train an executive agent (which may include one or more machine-learned models) to handle and process such notifications when they next arrive, and escalate and/or alert the CTO when such notifications are of an urgent nature, for example, an identification of a new technical bug or a security patch that is urgently needed. In embodiments, the CTO digital twin 8310 may generate technical performance alerts based on performance trends. This may allow a CTO to optimize initiatives in real-time without having to manually request such real-time technical performance data; the CTO digital twin 8310 may automatically present such information and related/necessary alerts as configured by the organization, CTO, or some other interested party.

In embodiments, a CTO digital twin 8310 may be configured to report on the performance of the technology, development, and/or engineering department, personnel of the technology, development, and/or engineering department, technology, development, and/or engineering activities, technology, development, and/or engineering content, technology, development, and/or engineering platforms, technology, development, and/or engineering partners, or some other aspect of management within a CTO's responsibilities. Reporting may be to the CEO, the technology, development, and/or engineering department, to other executives of an organization (e.g., the CIO), or to outside third parties.

In embodiments, a CTO digital twin 8310 may be configured to monitor, store, aggregate, merge, analyze, prepare, report and distribute material relating to industry best practices, benchmarks, or some other requirement or standard. For example, the CTO digital twin 8310 may be in communication with another enterprise digital twin, such as a CIO digital twin 8312, through which the technical team can keep the CIO apprised of changes as they occur.

In embodiments, the client application 8052 that executes the CTO digital twin 8310 may be configured with an executive agent that reports a CTO's behaviors and preferences (or other technology, development, and/or engineering personnel's behaviors and preferences) to the executive agent system 8008, as described herein, and the executive agent system 8008 may train the executive agent on how the CTO or other technology, development, and/or engineering personnel respond to certain situations and adjust its operation based at least in part on the data collection, analysis, machine learning and A.I. techniques, as described herein.

References to features and functions of the EMP and digital twins in this example of a CTO digital twin 8310 should be understood to apply to other departments and digital twins, and their respective projects and workflows, except where context indicates otherwise.

In embodiments, a Chief Information Officer (CIO) digital twin 8312 may be a digital twin configured for the CIO of an enterprise, or analogous executive tasked with overseeing the intelligence, information, data, knowledge, and/or IT operations of the enterprise. In embodiments, a CIO digital twin 8312 depicts a real time representation of an organization's information assets and workflows including data relating to data security, network security and enterprise knowledge. The real time representation may be based at least in part on real-time operations data that tracks the performance of an organization's information infrastructure, including internal information assets, customer-facing technologies, and information assets provided and/or serviced by third parties, such as cloud computing service providers. For example, a CIO digital twin 8312 may receive real time information regarding the performance of a network, such as an intranet used by an organization, APIs that are accessed by the enterprise, APIs that are exposed by the enterprise, software that is running on the enterprises software, or the like. The information may be aggregated and presented to a CIO in order to provide him an overview of the general performance of the computing infrastructure of the enterprise. For example, the CIO digital twin may indicate whether there are any network outages occurring, whether there are any security risks detected in the enterprises network, whether any software systems are operating improperly, and may other scenarios. In embodiments, the CIO digital twin 8312 may present a user interface that allows a user (e.g., the CIO) to select particular network assets to review in greater detail, such as an asset the real time operations data indicates is experiencing an operational failure or other issue. Such real time operations data related to IT and other information asset performance may allow the CIO to better track the performance and needs of an organization's information and IT infrastructure and better enable him to troubleshoot issues, simulate solutions, select appropriate information and IT management actions, and maintain the organization's information and IT infrastructure.

In embodiments, a CIO digital twin 8312 may provide data, analytics, summary, and/or information and IT reporting including, but not limited to, real-time, historical, aggregated, comparison, and/or forecasted information (e.g., real-time, historical, simulated, and/or forecasted performance data related to company information and IT assets, third-party assets, and the like). A CIO empowered by a CIO digital twin 8312 may be better able to maintain and evolve information and IT assets through continuous monitoring using the CIO digital twin 8312. A CIO digital twin 8312 may assist in virtual monitoring and testing in a virtual environment to test implementations, changes, reconfigurations, the introduction and/or removal of components and other assets, and the like. In embodiments, the CIO digital twin may work in connection with the EMP 8000 to provide simulations, predictions, statistical summaries, decision support based on analytics, machine learning, and/or other AI and learning-type processing of inputs (e.g., performance data, sensor data, and the like).

In embodiments, the types of data that may populate a CIO digital twin 8312 may include, but are not limited to, information and IT asset performance and specification data, interoperability and compatibility data, cybersecurity data, uptime/downtime/operational performance data, asset aging/vintage/timing data, resource utilization, results of AI and/or machine learning modeling (e.g., IT performance simulations), or some other type of data relevant to the operations of the CIO.

In embodiments, a CIO digital twin 8312 may be configured to interface with the collaboration suite 8006 to specify and provide a set of collaboration tools that may be leveraged by the technology, development, and/or engineering department and associated parties. The collaboration tools may include video conferencing tools, "in-twin" collaboration tools, whiteboard tools, presentation tools, word processing tools, spreadsheet tools, and the like, as described herein. Collaboration and communication rules may be configured based at least in part on using the AI reporting tool, as described herein. Collaboration and communication tools and associated rules may be configured to use company-, industry- and domain-specific taxonomies and lexicons when representing entities, states and flows within the CIO digital twin 8312.

In embodiments, the CIO digital twin 8312 may be configured to provide simulations of an organization's information and IT activities including, but not limited to network utilization, disaster planning, IT asset selection, maintenance protocols, downtime planning, and the like that is simulated under a plurality of hypothetical IT environments and scenarios that might impact performance, such as a security breach, IT asset failure, information failure, network congestion, or other activity or event. Real time operations data, such as that available through the EMP, as described herein, may be incorporated into simulated information or IT Infrastructure scenarios for the purposes of running operational simulations. The simulations, analytics and/or modeling performed by the EMP 100 with respect to a CIO digital twin 8312 may be used to reduce testing time, design time, or some other type of IT cost. The simulations, analytics and/or modeling performed by the CIO digital twin 8312 may be used to create and structure IT assets, networks, and guide development and testing plans. The simulations, analytics and/or modeling performed by the CIO digital twin 8312 may be used to evaluate network security, performance, and other features. The CIO equipped with digital twin 8312 may quickly identify optimal asset configurations to maximize operational performance.

In embodiments, a CIO digital twin 8312 may be configured to provide a user (e.g., the CIO) with information that is unique to the CIO digital twin 8312 and thus can provide insights and perspectives on information and IT asset performance that are unique to the CIO digital twin 8312, based at least in part on the CIO digital twin 8312 make making use of real time production, development and operational data based on both real world and simulated activity. In embodiments, the CIO digital twin 8312 may be configured to manage operational planning, based at least in part by leveraging predictive analytics for development planning. In embodiments, a CIO digital twin 8312 may be configured to store, aggregate, merge, analyze, prepare, report and distribute material relating to an information and/or IT strategy, scenario, event, plan, activity or initiative. For example, the CIO digital twin 8312 may be associated with a plurality of databases or other repositories of information, materials, summaries and reports and analytics, including such materials, summaries and reports and analytics related to prior events, activity and results (e.g., a system outage).

In embodiments, a CIO digital twin 8312 may be configured to store, aggregate, merge, analyze, prepare, report and distribute material relating to information and/or IT reporting, ratings, rankings, information, knowledge and IT trend data, or other data related to company information and/or IT assets and infrastructure. A CIO digital twin 8312 may link to, interact with, and be associated with external data sources, such that the CIO digital twin 8312 may upload, download, aggregate external data sources, and/or analyze such enterprise data.

In embodiments, a CIO digital twin 8312 may be configured to monitor IT performance, including in real time, based at least in part on use of the monitoring agent of the client application 8052, as described herein, that is associated with the CIO digital twin 8312. The monitoring agent may report on such activities to the EMP 8000 for presentation in a user interface that is associated with the CIO digital twin 8312. In response, the EMP 8000 may train an executive agent (which may include one or more machine-learned models) to handle and process such notifications when they next arrive and escalate and/or alert the CIO when such notifications are urgent.

In embodiments, a CIO digital twin 8312 may be configured to report on the performance of an organization's IT assets, network, or some other aspect of management within a CIO's responsibilities. In embodiments, the client application 8052 that executes the CIO digital twin 8312 may be configured with an executive agent that reports a CIO's behaviors and preferences to the executive agent system 8008, and the executive agent system 8008 may train the executive agent on how the CIO or other personnel respond to certain IT situations and adjust its operation based at least in part on the data collection, analysis, machine learning and A.I. techniques described throughout the disclosure.

References to features and functions of the EMP and digital twins in this example of a marketing department and a CIO digital twin 8312 should be understood to apply to other departments and digital twins, and their respective projects and workflows, except where context indicates otherwise.

In embodiments, a general counsel (GC) digital twin 8314 may be an executive digital twin configured for the general counsel (GC) of an enterprise, or an analogous executive tasked with overseeing the legal department and/or outside counsel of the enterprise. A GC digital twin 8314 may provide functionality including, but not limited to, management of legal personnel, partners and outside counsel, oversight of legal budgets and resources, compliance, management of contracting and litigation, management of internal policies, intellectual property, employment law, tax law, privacy law, reporting, and regulatory analysis.

In embodiments, the types of data that may populate and/or be utilized by a GC digital twin 8314 may include, but are not limited to, budgetary data (e.g., external legal spend, internal legal spend, ancillary legal costs, and the like), regulatory data (e.g., regulatory requirements, regulatory actions taken, and the like); contract and licensing data (e.g., in progress negotiations, current contract obligations, past contract obligations, and the like); compliance data (e.g., compliance requirements, compliance actions taken, and the like, litigation data (e.g. potential litigations sources, pending litigations, past litigations, settlement agreements, and the like), employment data (e.g., employment contracts, employee complaints, employee stock options, and the like), intellectual property data (e.g., filed patent applications, patent dockets, issued patents, trademark applications, trademark docket data, registered trademarks, and the like), tax data, privacy data, regulatory data, analytic results of AI and/or machine learning modeling; prediction data; recommendation data, or some other type of data relevant to the operations of the GC and/or legal department.

In embodiments, a GC digital twin 8314 may be configured based at least in part on using the collaboration suite 8006 to specify and provide a set of collaboration tools that may be leveraged by the legal department and associated parties. The collaboration tools may include video conferencing tools, "in-twin" collaboration tools, whiteboard tools, presentation tools, word processing tools, spreadsheet tools, and the like, as described herein. Collaboration and communication rules may be configured based at least in part on using the AI reporting tool, as described herein. Collaboration and communication tools and associated rules may be configured to use company-, industry- and domain-specific taxonomies and lexicons when representing entities, states and flows within the GC digital twin 8314, such as ones related to particular bodies of law, regulation, jurisdiction, or practice area, such as ones related to corporate law, commercial law, bankruptcy law, the law of secured transactions, banking law, customs law, export control regulations, maritime law, trade law, international treaties, securities law, contracts law, environmental law, international law, privacy law, data privacy law, patent law, civil and criminal procedure, trademark law, copyright law, trade secret law, unfair competition law, law of torts, property law, advertising law, and many others.

In embodiments, a GC digital twin 8314 may be configured to research, create, track and issue reports on a legal department budget including, but not limited to, an overall department budget, a budget for a specific project, such as "U.S. patent filings," or group of projects, a budget for a specific litigation, a budget for a third-party vendor, such as outside counsel, or some other type of legal budget. A GC digital twin 8314 may be configured to create, track, provide research, and report on financial data related to material under review or supervisions of the legal department including, but not limited to, licensing revenues, licensing expenditures, or some other type of financial data related to legal department review and responsibilities. In embodiments, the GC digital twin 8314 may interact with and share such licensing revenue and/or budget data and reporting with other executive twins, as described herein, including, but not limited to, a CFO digital twin 8304, CEO digital twin, COO digital twin, CTO digital twin, and the like. In embodiments, the GC digital twin 8314 may include intelligence, based at least in part on the data analytics, machine learning and A.I. processes, as described herein, to read legal contracts, licenses, budgets and related summaries and data in order to identify key departments, personnel, third-party or others that are, for example, listed in, or subject to, or impacted by a license and/or budget line item and who therefore may have an interest in such material. License and/or budget material pertaining to a given party may be abstracted and summarized for presentation independent from the entirety of the budget, and formatted and presented automatically, or at the direction of a user, to the party that is the subject of the budget item. In a simplified example, a GC may have license(s) under her department's review which have line items, schedules, appendices and the like detailing licensing revenues that will be owed to the organization over a prescribed timeframe. The GC may use the GC digital twin 8314 to consolidate, summarize and/or share such financial data derived, or to be derived, from licensing revenues with another executive in an organization, such as the CFO (e.g., via a CFO digital twin) and/or CEO (e.g., via a CEO digital twin). The data shared may indicate the licensing revenues to be obtained in a given financial quarter to assist the CFO and others in maintaining an accurate and current summary of projected quarterly revenues.

In embodiments, a GC digital twin 8314 may be configured to track and report on inbound (e.g., settlement or litigation revenue) and outbound billing (e.g., outside counsel costs) related to the legal department. The billing department, personnel, processes and systems may interact with the GC digital twin 8314 to present, store, analyze, reconcile and/or report on billing activities related to parties with whom the legal department is contracting, such as outside counsel, consultants, research services, online entities, or others. In embodiments, a GC digital twin 8314 may be configured to research, track, monitor, store, analyze, create and distribute legal content, and automatically report on such activity to a user interface associated with the GC digital twin 8314. Such activities might include storing data so that the GC digital twin 8314 may detect a state change, for example, a new court filing in a litigation, a communication received from outside counsel, a new license draft from opposing counsel, a draft patent application, a notice from the United States Patent and Trademark Office, or some other type of new or updated material. The GC digital twin 8314 may also detect activity among a class of entities that are monitored or that are specified for monitoring in the GC digital twin 8314, such as particular courts, regulatory or legislative bodies or some other type of entity. In embodiments, a GC digital twin 8314 may be configured to research, track, monitor, store, and analyze content of various legal related platforms, and automatically report on such activity to a user interface associated with the GC digital twin 8314. Such platforms may include, but are not limited to, bar or other legal associations, courts, legal search platforms, social media, legal blogs, press releases, or some other type of legal platform-related material or activity.

In embodiments, a GC digital twin 8314 may be configured to store, aggregate, merge, analyze, prepare, report and distribute material relating to a legal strategy, legal documents, litigation, legal recommendations or some other legal activity. For example, the GC digital twin 8314 may be associated with a plurality of databases or other repositories of legal materials, contracts, licenses, intellectual property (e.g., patent filings), summaries and reports and analytics. A GC digital twin 8314 may link to, interact with, and be associated with external data sources, and able to upload, download, aggregate external data sources, including with the EMP's internal data, and analyze such data, as described herein. Data analysis, machine learning, AI processing, and other analysis may be coordinated between the GC digital twin 8314 and an analytics team based at least in part on using the intelligence services system 8010. This cooperation and interaction may include assisting with seeding data elements and domains in the enterprise data store 8012 for use in modeling, machine learning, and AI processing to identify the optimal and/or relevant legal content, legal documents, parties associated with a legal activity (e.g., a litigation), as well as identification of the optimal data measurement parameters on which to base judgement of a legal endeavor's success (e.g., licensing revenue, staying within a stated budget for the use of outside counsel, and the like). Examples of data sources 8020 that may be connected to, associated with, and/or accessed from the GC digital twin 8314 may include, but are not limited to, a legal research platform, legal websites, news websites 8048, a financial database 8030, contracts database, an HR database 8046, a workflow management system 8036, and/or third-party data sources 8038 that store third-party data.

In embodiments, a GC digital twin 8314 may be configured to assist in the development of a new legal endeavor, such as pursuit of a new contract, review of a new law or regulation impacting a business, litigation or arbitration, or some other legal activity. For example, the GC digital twin 8314 may identify an internal and external partner (e.g., outside counsel) team for a legal action. For example, individuals who are ideal candidates to assist with a legal action may be identified based at least in part on experience and expertise data that is stored within or in association with the GC digital twin 8314. For example, the GC may be initiating negotiations of a joint development agreement between entities that are located in the United States and Taiwan and may need to obtain outside Taiwanese counsel. Using the GC digital twin 8314, the GC may be presented with details of prior outside counsel used in Taiwan for similar projects. In another example, if the GC digital twin 8314 does not locate details of prior outside counsel used in Taiwan for similar projects, the GC digital twin 8314 may scan, research, collect and summarize information from public or other sources on highly rated, recommended or other Taiwanese outside counsel that may be appropriate, based on skills, experience and the like, to work on the joint development agreement project.

In embodiments, the GC digital twin 8314 may identify legal project goals and record, monitor and track the project's performance relative to those goals and present, in real-time, the tracking of the project to the GC within a user interface that is associated with the GC digital twin 8314. For example, the GC digital twin 8314 may include a clickable dashboard that, when clicked, illustrates the status of a set of legal projects. In some embodiments, the dashboard may include timelines for each project and a relative status of each project with respect to its timeline.

In embodiments, a GC digital twin 8314 may be configured to report on the performance of the legal department, personnel of the legal department, legal actions, legal content, legal platforms, legal partners, or some other aspect of a GC's management. Reporting may be to the GC, the legal department, to other executives of an organization (e.g., the CEO), or to outside third parties (e.g., outside counsel, legal notices, press releases, and the like). Reporting and the content of reporting may be shared by the GC digital twin 8314 with other executive digital twins, for example, data related to regulation compliance, ongoing litigation, or some other legal activity. The reporting functionality of the GC digital twin 8314 may also be used for populating required data for formal reporting requirements such as shareholder statements, annual reports, SEC filings, and the like. Templates of common reporting formats may be stored and associated with the GC digital twin 8314 to automate the presentation of data and analytics according to pre-defined formats, styles and system requirements. In some embodiments, the GC digital twin may be configured to leverage an executive agent 8364 trained on behalf of the GC to create and disseminate the reports.

In embodiments, a GC digital twin 8314 may be configured to monitor, store, aggregate, merge, analyze, prepare, report and distribute material relating to regulatory activity, such as government regulations, regulatory compliance, legislation, court opinions, industry best practices or some other requirement or standard. For example, the GC digital twin 8314 may keep the GC apprised of new regulation or regulation changes as they occur. The GC may set parameters of the GC digital twin 8314 regarding the legal domains, subject matter areas, jurisdictions, or some other parameter, that are of interest to the GC that the GC digital twin 8314 should monitor.

In embodiments, a GC digital twin 8314 may leverage an executive agent 8364 that is trained on user's (e.g., GC) behaviors and preferences (or other legal personnel's behaviors and preferences). In embodiments, the client application 8052 hosting the GC digital twin 8314 may track the user's actions relating to various events, notifications, alerts, or the like and may report the tracked events using the expert agent system 8008, as described herein. In response, the expert agent system 8008 may learn how the GC or other legal personnel respond to certain situations and may train an execute agent 8364 on behalf of the user (e.g., GC), such that the executive agent 8364 may respond to similar situations once deployed.

References to features and functions of the EMP and digital twins in this example of a legal department and a GC digital twin 8314 should be understood to apply to other departments and digital twins, and their respective projects and workflows, except where context indicates otherwise.

In embodiments, a Chief Human Resources Officer (CHRO) digital twin 8316 (or HR digital twin 8316) is an executive digital twin configured for a human resources executive (e.g., a CHRO) of an enterprise or analogous executive tasked with overseeing the human resources HR aspects of the enterprise, such as a Chief People Officer (CPO), a chief talent officer, a head of human resources, a director of human resources, or the like. In embodiments, the CHRO digital twin 8316 may depict different HR-related states of the enterprise, such as states relating to human capital management, workforce management, risk management, and the management of payroll, recruitment, regulatory compliance, employee performance, benefits, employee relations, time and attendance, training and development, compensation, onboarding, offboarding, succession planning, and the like. In embodiments, the CHRO digital twin 8316 may initially depict the various states at a lower granularity level. A user that is viewing the CHRO digital twin 8316 may select a state to drill down into the selected state and view the selected state at a higher level of granularity.

In embodiments, the types of data that may be depicted in CHRO digital twin 8316 may include, but are not limited to: individual employee data, key performance indicators by business unit, key performance indicators by individual employee, risk management data, regulatory compliance data (e.g., OSHA and EPA compliance data), safety data, diversity data, benefits data (e.g., medical, dental, vision, and health savings accounts (HSA)) compensation data, compensation comparison data, compensation trend data, payroll data, overtime data, recruitment data, employee referrals data, applicant data, applicant screening data, applicant reference data, applicant background check data, offer data, time and attendance data, employee relations data, employee complaints data, onboarding data, offboarding data, employee training and development data, employee turnover rate data, voluntary employee turnover rate data, new hire turnover rate data, high performer turnover rate data, turnover rate by performance rating data, headcount and/or headcount planning data (e.g., headcount to plan percentage), promotion rate data, succession plan data, organizational levels data, span of control data, employee survey data, cost to move employees below midpoint data, comparative ratio data, simulation data, decision support data from AI and/or machine learning systems, prediction data from AI and/or machine learning systems, classification data from AI and/or machine learning systems, detection and/or identification data from AI and/or machine learning systems, and the like.

In embodiments, a CHRO digital twin 8316 may depict a data item with an icon indicating whether the data item is at a normal state, a suboptimal state, a critical state, or an alarm state. In embodiments, the icons may be different colors, fonts, symbols, codes or the like. For example, a CHRO digital twin 8316 may depict high performer turnover rate data with an orange icon indicating that the high performer turnover rate is at a critical level. Continuing the example, an HR executive may be enabled to escalate the high performer turnover rate data to another executive, such as the CEO, via the CHRO digital twin 8316. In embodiments, a CHRO digital twin 8316 may automatically highlight data items that are at suboptimal, critical, or alarm state.

In embodiments, a CHRO digital twin 8316 may be configured to provide an "in-twin" collaboration suite having tools that may facilitate communication and collaboration between enterprise stakeholders. In embodiments, the "in-twin" collaboration tools may include an interface enabling a user to escalate and/or deescalate data sets to another user associated with the enterprise. In embodiments, the interface may be configured to enable a user to send a message with the data set, generate a request or assign a task related to the data set, and/or schedule an event associated with the data set. In embodiments, AI and/or machine learning could be leveraged to suggest message content, suggest event scheduling, suggest a request or task, and/or suggest a request or task assignee. For example, an HR executive could escalate a data set related to employee training to the GC with a predictive text message about employee training and a calendar request at a time determined by AI and/or machine learning to attend a meeting related to employee training. In embodiments, the "in twin" collaboration tools include digital twin conferences. In embodiments, the "in twin" collaboration tools may include an "in-twin" messaging system and/or an "in-twin" video conferencing system for enabling enterprise stakeholders to communicate. In embodiments, a machine learning and/or AI system may be leveraged for automatically generating and/or assigning tasks from these communications. In embodiments, the "in-twin" videoconferencing system supports subchats. In embodiments, the subchats may be created via a "drag-and-drop" action in the user interface. In embodiments, the "in-twin" videoconferencing system may leverage machine learning and/or AI to make suggestions to optimize a user's lighting, audio, camera placement, and the like. In embodiments, the "in twin" videoconferencing system leverages machine learning and/or AI to automatically disable the video feed upon the detection of an inappropriate activity in the video feed. In embodiments, the "in twin" collaboration suite includes an "in-twin" stakeholder approval system for collecting approval on actions from other enterprise stakeholders. In embodiments, "in-twin" collaboration tools may include an AI-driven translation system configured to intelligently translate communications amongst enterprise stakeholders to achieve maximum understanding by the user of the digital twin, wherein the AI driven translation system is configured to translate from a first language to a second language (e.g., translate English into a foreign language) and is also configured to translate terminology or jargon such that it is consumable by the user. These features described in connection with the CHRO digital twin 8316 may be deployed with other types of digital twins described herein, including ones for other executives, including to facilitate collaboration among different types of executives, such as for enterprise control tower activities, such as monitoring operations, development activities, or other aspects of the enterprise across locations, departments, and functions. Collaboration and communication tools and associated rules may be configured to use company-, industry- and domain-specific taxonomies and lexicons when representing entities, states and flows within the CHRO digital twin 8316, such as ones relating to health and safety of workers, ones related to education and training, ones related to performance indicators, ones related to worker attributes (including psychographic, demographic and similar factors), and many others.

In embodiments, a CHRO digital twin 8316 may be configured to identify, interview, select, hire, and onboard new employees. In some of these embodiments, the CHRO digital twin 8316 may be configured to research, track, and report on applicant data, including, but not limited to, employee referral data, applicant education data, applicant testing data, applicant experience data, applicant reference data, applicant screening data, applicant background check data, applicant interview data, job application data, applicant resume data, applicant cover letters, applicant offer data, and the like. The CHRO digital twin 8316 may interact with and share such applicant data and reporting with other executive digital twins, as described herein. The CHRO digital twin 8316 may include machine learning, AI, and/or other intelligence such as analytics, to process job applications, resumes, cover letters, applicant reference materials, applicant screening data, applicant interview data, and the like in order to identify and select potential new employees and/or to identify other executives or enterprise stakeholders that may be interested in such information.

In embodiments, the EMP 8000 may obtain HR-relevant data from the enterprise's human resources management software (e.g., via an API), human capital software, workforce management software, payroll software, applicant tracking software, accounting software, employee applicant software, publicly disclosed financial statements, third-party reports, tax filings, social media software, job listing websites, recruitment software, and the like.

In embodiments, a CHRO digital twin 8316 may provide an interface for an HR executive to perform one or more HR-related workflows. For example, the CHRO digital twin 8316 may provide an interface for an HR-executive to perform, supervise, or monitor workflows, the entities involved in the workflows, and attributes thereof, such as onboarding workflows, offboarding workflows, dismissal workflows, decision documentation workflows, succession planning workflows, candidate assessment workflows, candidate screening workflows, compliance workflows, disciplinary workflows, review workflows, interview workflows, offer workflows, employee training workflows, and many others.

In embodiments, a CHRO digital twin 8316 may leverage an executive agent 8364 that is trained on a user's (e.g., an HR executive's) actions (e.g., behaviors, responses, interactions and preferences) using the expert agent system 8008 in response to events and situations encountered by the user (e.g., alerts, notifications, escalations, delegations, presentations of data, events, and the like). In some of these embodiments, the client application 8052 hosting the CHRO digital twin 8316 may report actions taken by the user in response to various events encountered by the user via the CHRO digital twin 8316. For example, the client application 8052 may identify events such as a request to authorize a new hire, a request to terminate an employee, or a notification indicating that employee turnover has reached a critical threshold. In this example, the client application 8052 may record and report the actions taken by the user in response to such events and may report the actions in relation to the identified events to the expert agent system 8008, as well as any other features that are relevant to the event. In response, the expert agent system 8008 may train an executive agent 8364 on behalf of the user, such that the executive agent may perform or recommend actions to the user when similar events are encountered in the future.

References to features and functions of the EMP and digital twins in this example of a human resources department and a CHRO digital twin 8316 should be understood to apply to other departments and digital twins, and their respective projects and workflows, except where context indicates otherwise.

In embodiments, the executive digital twins may link to, interact with, integrate with and/or be used by a number of different applications. For example, the executive digital twins may be used in automated AI-reporting tools 8360, collaboration tools 8362, in connection with executive agents 8364, in board meeting tools 8366, for training modules 8368, and for planning tools 8370.

In embodiments, AI reporting tools 8360 assist users to report one or more states to another user. For example, a subordinate may need to report an identified issue to a higher-ranking member of the enterprise (e.g., CTO may wish to report an issue that needs to be addressed to the CEO). In embodiments, the AI reporting tool 8360 may be configured to receive a request to report a state from a client device 8050. In embodiments, the AI-reporting tool 8360 may identify the appropriate recipients of the reported state based on the type of request, the role of the user that issued the request and the organizational structure of the entity. In some embodiments, the AI-reporting tool may determine the role of the user and the recipients of the report from the organizational digital twin of the enterprise. In some embodiments, the AI-reporting tool 8360 may determine whether the intended recipients of a notification have access rights to the data being shared from the executive digital twin. For example, if the CFO is reporting to the CEO, it is likely that the CEO has access to all the enterprise's data and will not be precluded from receiving the report. Conversely, if the CFO wishes to delegate the handling of an issue via the AI-reporting tool to an employee in her business unit, the recipient may not have access to such data. In this scenario, the AI-reporting tool 8360 may notify the requesting user (e.g., the CFO) that certain types of data may not be shared with the subordinate employee and may determine a manner by which the issue may be reported to the subordinate without sharing the non-accessible data. Upon determining that a user has access rights to view a particular state of data, the AI-reporting tool 8360 may generate a report that is for the intended recipient. In embodiments, the AI-reporting tool may leverage the NLP services of the intelligence system to generate the report. In some embodiments, the AI-reporting tool 8360 may leverage an executive agent 8364 to determine when to report a state and the appropriate recipients of the reported state. In these embodiments, the executive agent 8364 may be trained on interactions of the user with the client application 8052 and digital twins that were previously presented to the user.

In some embodiments, the AI-reporting tool 8360 may be configured to monitor one or more user-defined key performance indicators (KPIs). Examples of KPIs of an enterprise may include, but are not limited to, with respect to systems, facilities, processes, functions, or workforce units: uptime (e.g., of an assembly line or other manufacturing system), capacity utilization, on-standard operating efficiency, overall effectiveness, downtime, amount of unscheduled downtime, setup time, an amount of inventory turns, inventory accuracy, quality metrics relating to products and services, first-pass yield amounts for the enterprise, an amount of rework required, days-sales-outstanding (DSOs), an amount of scrap or waste produced, throughput, changeover, maintenance percentage, yield per system or unit, overall yield, industry reviews, industry ratings, customer reviews, customer ratings, editorial reviews, awards, social media and website attention metrics, search engine performance metrics, safety metrics, health metrics, environmental impact metrics, political metrics, certification and testing metrics, regulatory metrics, social impact metrics, financial and investment metrics, corporate bond ratings, trade association metrics, union metrics, lobbying organization ratings, advertising performance metrics, referral metrics, and many others. Additional or alternative KPI metrics may be defined by a user. Examples of these KPI metrics may include an amount or percentage of failed audits, a number or percentage of deliveries that are on-time/late, a number of customer returns, a number of employee training hours, employee turnover percentage, number of reportable health or safety incidents, revenue per employee, profit per employee, schedule attainment metrics, total cycle time, and the like.

In embodiments, the collaboration tools 8362 include various tools that allow collaboration between executives of the enterprise. In embodiments, the collaboration tools include digital-twin enabled video conferencing. In these embodiments, the EMP 8000 may present participants in the video conference with the requested view of an enterprise digital twin. For example, during a Board meeting, a CTO proposing an update to the machinery or equipment in a facility may present an environment digital twin of the facility where the updates to the machinery or equipment would be made. In this example, the CTO may illustrate the results of simulations performed in the facility without the updates and with the updates. The simulation may illustrate how the update may benefit the enterprise using a number of selected metrics (e.g., throughput, profits, employee safety, or the like). Collaboration and communication tools and associated rules may be configured to use company-, industry- and domain-specific taxonomies and lexicons when representing entities, states and flows within the digital twin.

In embodiments, executive agents 8364 are expert agents that are trained to perform tasks on behalf of executive users. As discussed, in some embodiments, a client application may monitor the user of the client application by a user when using the client application 8052. In these embodiments, the client application 8052 may monitor the states of an executive digital twin that the user drills down into, the states that the user reports to a superior and/or delegates to a team member in her respective business unit, decisions that are made, and the like. As the user uses the client application 8052, the expert agent system 8008 may train one or more machine-learned models on behalf of the particular user, such that the models may be leveraged by an executive agent 8364 to perform tasks on behalf of or recommend actions to the user.

In embodiments, Board meeting tools 8366 are tools that are used to prepare for, to access within and/or to follow-up on board and similar meetings, such as Board of Directors, Board of Trustees, shareholder meetings, annual meetings, investor meetings, and other important meetings. References to Board meetings herein should be understood to encompass these and other important meetings that require executive preparation, attendance and/or attention. In embodiments, Board meeting tools 8366 may allow different users to present one or more states of an enterprise digital twins within the context of a Board report or Board meeting. For example, a user (e.g., a COO) may share a simulation of a proposed logistics solution from the COO digital twin 8366 with one or more devices (e.g., a device in the Board room and/or devices of participants accessing the Board meeting remotely). In embodiments, a Board meeting tool 8366 may limit access to certain types of data based on time, scope, and permissions. For example, a Board meeting tool 8366 may require that all geolocations that board members be registered before a Board meeting (e.g., Board room, designated home offices for those joining by phone or video, and the like), such that some or all of the data depicted in a digital twin that is being presented can only be viewed on a device that is at one of the registered geolocations and/or only for a defined duration, such as from a few hours before through a few hours after a meeting, or only during the meeting. Similarly, in embodiments, the Board meeting tools 8366 may limit access to some or all of the data shared in a presented digital twin to particular times (e.g., during the Board meeting or the day of the Board meeting). Other examples of board meeting tools 8366 are discussed throughout the application.

In embodiments, training modules 8368 may include software tools that are used to train a user. In embodiments, the training modules 8368 may leverage digital twins to improve executive training for an enterprise. For example, a training module 8368 may provide real-world examples that are based on the data collected from the enterprise. The training module 8368 may present the user with different scenarios via an executive digital twin 8368 and the user may take actions. Based on the actions, the training module 8368 may request a simulation from the EMP 8000, which in turn returns the results to the user. In this way, the user may be trained on scenarios that are based on the actual enterprise of the user.

In embodiments, planning tools 8370 are software tools that leverage digital twins to assist users to make plans for the enterprise. In embodiments, a planning tool 8370 may be configured to provide a graphical user interface that allows an executive to make plans (e.g., budgets, defining KPIs, etc.). In some embodiments, the planning tool 8370 may be configured to request a simulation from the IMP 8000 given the parameters set in the created plan. In response, the EMP 8000 may return the results of the simulation and the user can determine whether to adjust the plan. In this way, the user may iteratively refine the plan to achieve one or more objectives. In embodiments, an executive agent 8362 may monitor the track the actions taken while the plan is being refined by the user so that the expert agent system 8008 may train the executive agent 8362 to generate or recommend plans to the user in the future.

The enterprise digital twins may be leveraged and/or interface with other software applications without departing from the scope of the disclosure.

Figure 84:
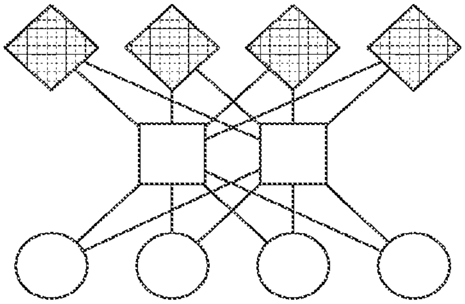
Figure 88:
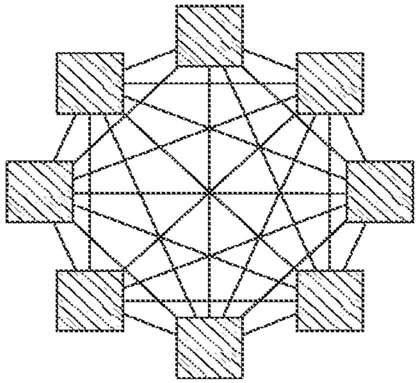
Figure 89:
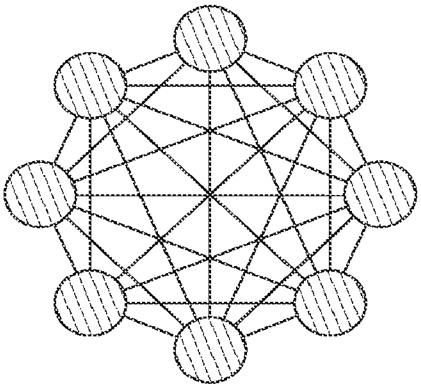
Figure 90:
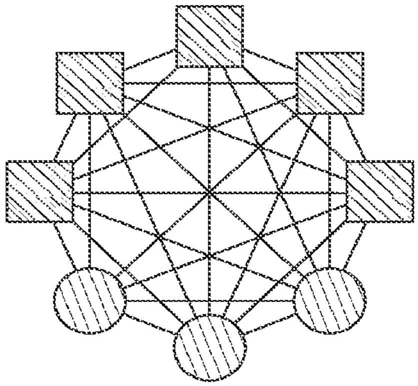
Figure 91:
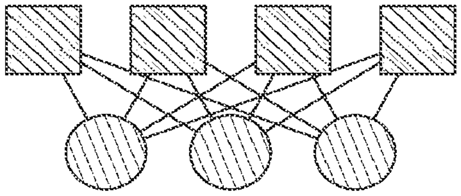
Figure 92:
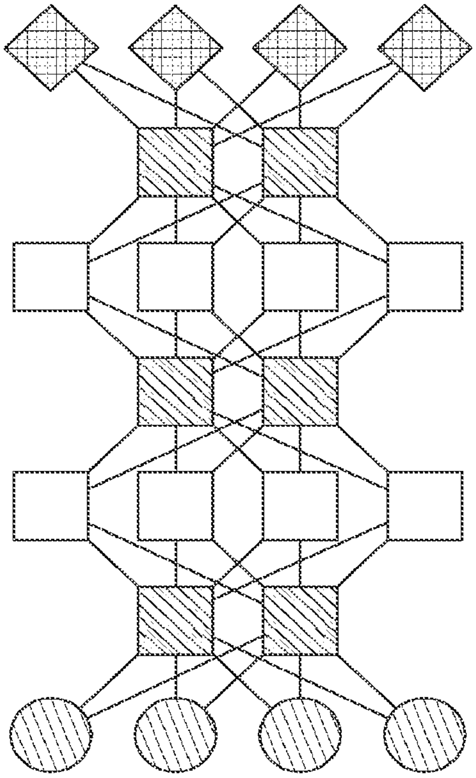
Figure 94:
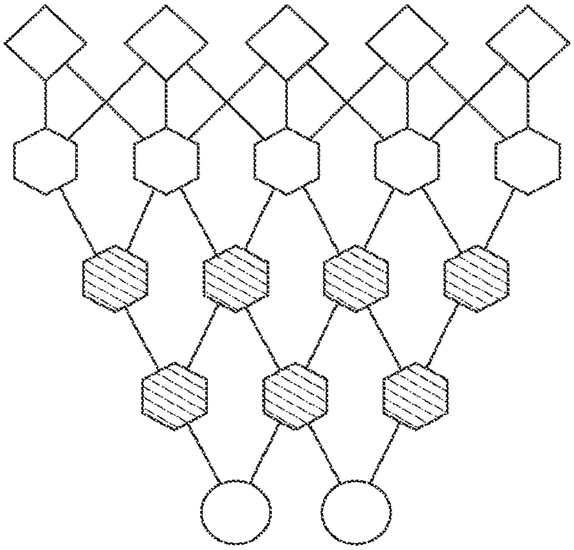
Figure 93:
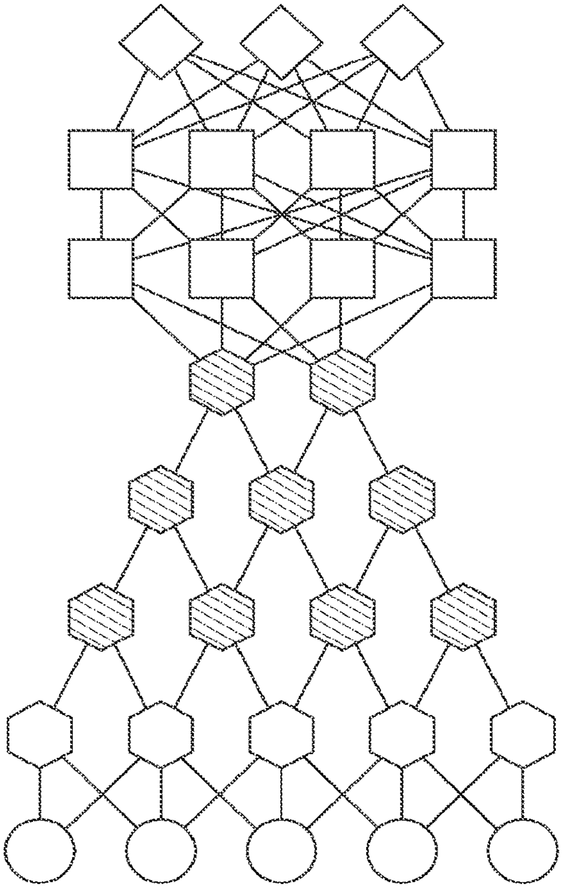
Figure 96:
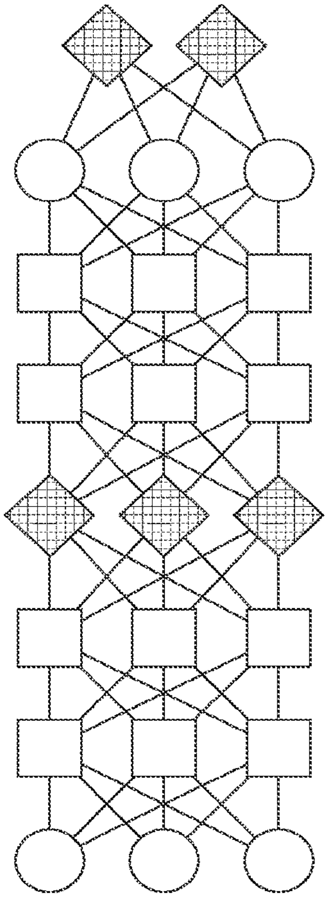
Figure 95:
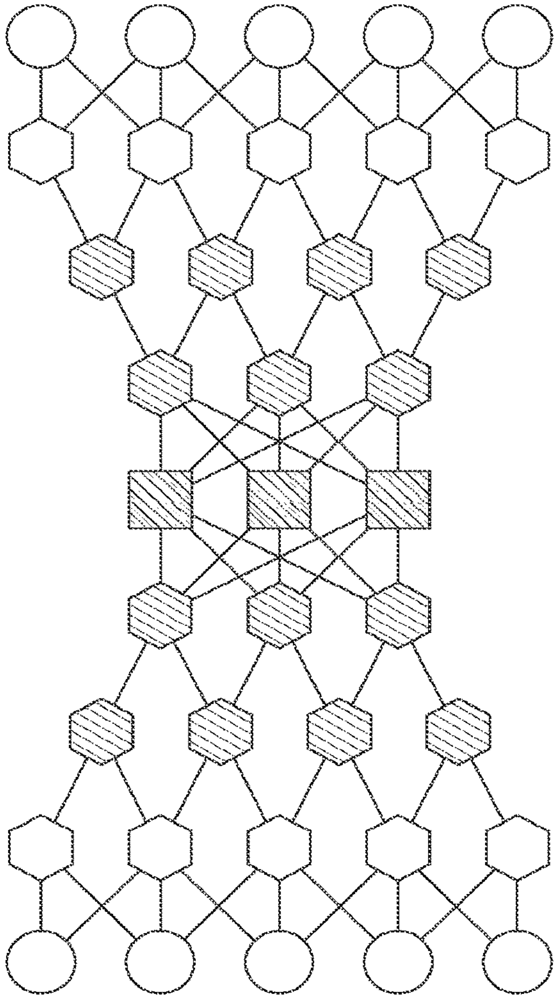
Figure 98:
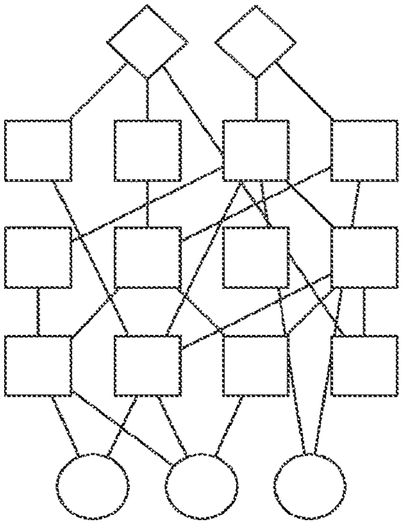
Figure 100:
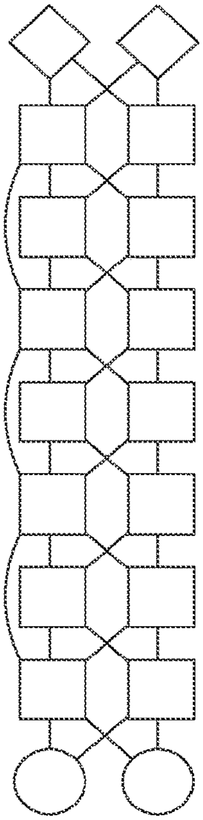
Figure 97:
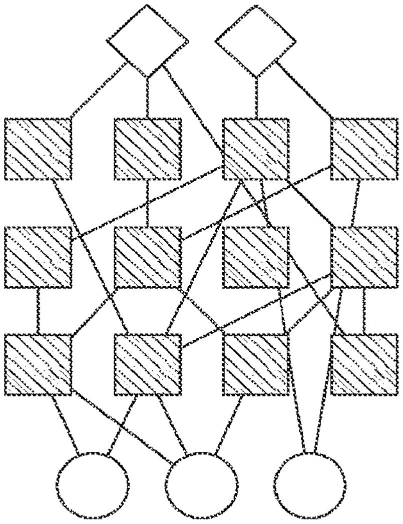
Figure 99:
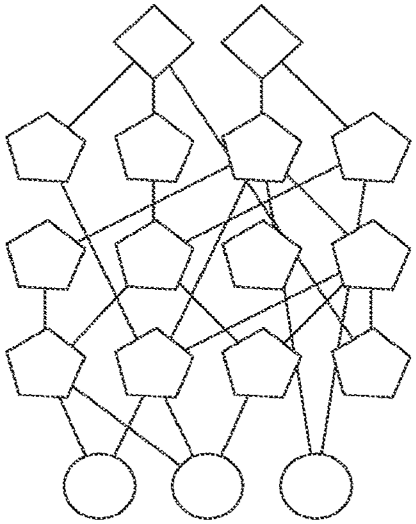
Figure 101:
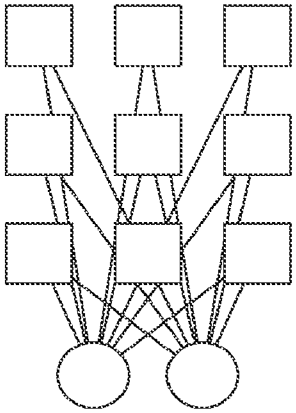
Figure 102:
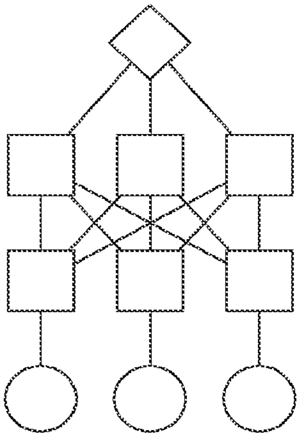
Figure 103:
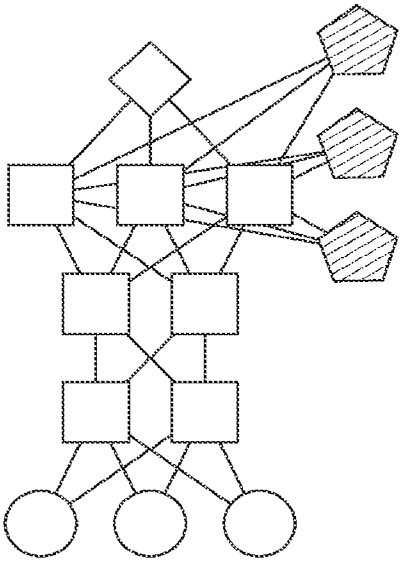

FIG. 84 illustrates an example implementation of the EMP 8000. In this example, the EMP 8000 is in communication with a plurality of client applications 8052 and a set of enterprise assets 8400. In the example, the EMP 8000 receives enterprise data from a set of enterprise entities 8400, such as a sensor system 8022, physical entities 8402, digital entities 8404, computational entities 8406, and/or network entities 8408 belonging to and/or associated with the enterprise. In embodiments, the enterprise data may relate to environments, processes, and/or a condition of the enterprise. For example, a sensor system 8022 may be deployed within an enterprise facility (e.g., manufacturing facility, warehouse, distribution center, logistics facility, transportation facility, office building, customer location, retail location, agricultural facility, natural resource extraction facility, or the like) of the enterprise, whereby the sensor system 8022 provides sensor readings (e.g., vibration data, location data, motion data, temperature data, pressure data, or the like) relating to the facility in general or a piece of machinery, equipment, or other physical or workforce asset within the facility. Within the facility, a number of physical assets (e.g., robots, autonomous vehicles, smart equipment, personnel and the like) or other entities may output data streams relating to the operation of the assets or other entities. Additionally or alternatively, the enterprise may include a number of digital assets (e.g., CRM, ERP, databases, or the like) that provide data streams relating to sales, costs, human resources or the like. The network entities may provide networking-related data, including bandwidth, API requests, throughput, detected cyber-attacks, or the like. The computational entities may provide data relating to a computing infrastructure of an enterprise. In some embodiments, the enterprise management system 8000 may receive data from other sources as well, including third-party data 8038 from third-party data providers. Taken in combination, the data from the enterprise assets 8400 and/or other data sources may provide information relating to the status of the industrial facility and the machinery contained therein, the state of various processes (e.g., industrial processes, sales workflows, hiring processes, logistics workflows, and the like), the efficiencies of the processes, the financial health of the enterprise, and the like.

In embodiments, the enterprise entities may communicate directly with the EMP 8000 via a communication network. Additionally or alternatively, one or more of the enterprise assets may stream data to a local data collection system 8420 that collects and stores enterprise data locally. In some embodiments, the local data collection system 8420 may provide the collected data to an edge intelligence system 8422 of the enterprise.

In embodiments, the edge intelligence system 8422 may be executed by an edge device 8042 configured to receive data, such as from the local data collection systems 8420, a local sensor system 8022, or other enterprise entities 8400 that are located in or near a physical location of the entities (e.g., at an industrial facility) and may perform one or more edge-related processes relating to the received data. The edge device may be a pre-configured and/or substantially self- or automatically configuring computing device, such as an "edge intelligence in a box" device. An edge-related process may refer to a process that is performed at an edge device in order to store sensor data, reduce bandwidth on a communication network, and/or reduce the computational resources required at a backend system. Examples of edge processes can include data filtering, signal filtering, data processing, compression, encoding, quick-predictions, quick-notifications, emergency alarming, and the like, and may include creation of automated smart data bands. For example, the edge intelligence system 8422 may determine whether to transmit a subset of the data to the EMP 8000 or to store the subset of the data locally until it is explicitly requested from the EMP 8000. In another example, the edge intelligence system 8422 may be configured to compress data streams (e.g., sensor data streams) to improve data throughput of high-volume data streams (e.g., vibration data). In some embodiments, the edge intelligence system 8422 may be configured to analyze the high-volume data to determine whether to compress or stream a raw data stream.

In some embodiments, the local data collection system 8420 and the edge intelligence system 8422 may be embodied in edge devices 8042 of the enterprise. In some embodiments, the edge intelligence system 8422 may communicate data to the EMP 8000. In some of these embodiments, the edge intelligence system 8422 communicates data to the EMP 8000 via a network enhancement system 8424.

In embodiments, the network enhancement system 8424 may be configured to optimize flow of data transmitted from one or both of the edge intelligence system 8422 and the local data collection system 8420 and received by the EMP 8000. For example, a local data collection system 8420 may be configured to collect data from one or more real world environments, entities, ecosystems, and/or processes, which may be analyzed by a connected edge intelligence system 8422. In this example, the edge intelligence system 8422 may transmit the collected data to the network enhancement system 8424, which may optimize transmission of the data to the EMP 8000 for processing and implementation by the EMP 8000. The EMP 8000 may store, analyze, or otherwise process the transmitted data to the client applications 8052, such that the client applications 8052 may update enterprise digital twins (e.g., role-based digital twins, environment digital twins, cohort digital twins, and the like) that are hosted by the client applications 8052.

In embodiments, the network enhancement system 8424 may include one or more signal amplifiers, signal repeaters, digital filters, analog filters, digital-to-analog converters, analog-to-digital converter and/or antennae configured to optimize the flow of data. In some embodiments, the network enhancement system may include a wireless repeater system such as is disclosed by U.S. Pat. No. 7,623,826 to Pergal, the entirety of which is hereby incorporated by reference. The network enhancement system 8424 may optimize the flow of data by, for example, filtering data, repeating data transmission, amplifying data transmission, adjusting one or more sampling rates and/or transmission rates, and implementing one or more data communication protocols.

In embodiments, the network enhancement system 8424 may include one or more processors configured to perform digital signal processing to optimize the flow of data. The one or more processors may implement optimization algorithms to optimize the flow of data. The one or more processors may determine one or more optimal paths in a network, the network enhancement system 8424 transmitting the data along the one or more optimal paths. The network enhancement system 8424 may be configured to implement a software filter via the one or more processors. The software filter may filter data before transmission to the EMP 8000, for example to lower network bandwidth consumed by data transmission. The one or more processors may determine that portions of data are relevant only to one or more intended recipients, such as digital twins, executive agents, collaboration suites, or other components of the EMP 8000 and determine optimal paths based upon intended recipients of the portions of data.

In embodiments, the network enhancement system 8424 may be configured to optimize data flow between a plurality of nodes over a plurality of data paths. In some embodiments, the network enhancement system 8424 may transmit a first portion of data over a first path of the plurality of data paths and a second portion of data over a second path of the plurality of data paths. The network enhancement system 8424 may determine that one or more data paths, such as the first data path, the second data path, other data paths, are advantageous for transmission of one or more portions of data. The network enhancement system 8424 may make determinations of advantageous data paths based upon one or more networking variables, such as one or more types of data being transmitted, one or more protocols being suitable for transmission, present and/or anticipated network congestion, timing of data transmission, present and/or anticipated volumes of data being or to be transmitted, and the like. Protocols suitable for transmission may include transmission control protocol (TCP), user datagram protocol (UDP), and the like. In some embodiments, the network enhancement system may be configured to implement a method for data communication such as is disclosed by U.S. Pat. No. 9,979,664 to Ho et al., the entirety of which is hereby incorporated by reference.

The EMP 8000 receives enterprise data (e.g., directly or via the network enhancement system 8424, an edge intelligence system 8422, a local data collection system 8420 or from any other data source). In embodiments, the digital twin system 8004 may structure and/or store the enterprise data in one or more digital twin databases (e.g., graph databases, relational databases, SQL databases, distributed databases, blockchains, caches, servers, and/or the like). In embodiments, the client application 8052 requests an enterprise digital twin 8410 from the EMP 8000. In response, the digital twin system 8004 may generate and serve the requested enterprise digital twin 8410 (e.g., a role-based digital twin, executive digital twin, environment digital twin, process digital twin, cohort digital twins, or the like) to the client application 8052, whereby the enterprise digital twin 8410 may include the enterprise data and/or data that was derived from the enterprise data (e.g., by the intelligence services system). The client application 8052 may provide an interface for the user of the client application 8052 to interact with the requested digital twin 8410. For example, the user may delegate tasks relating to a depicted state to subordinates and/or may notify a superior of a depicted state via the digital twin interface. In another example, the user may drill down into a particular state and may initiate a corrective action via the digital twin interface. In some embodiments, the client application 8052 may allow the user to share the digital twin 8410 (or a portion thereof) within a collaboration tool 8414 or access collaboration features of a collaboration tool 8414 within the twin 8410. For example, the client application 8052 may allow the user to share a depicted state of the digital twin 8410 into a board meeting collaboration tool Additionally or alternatively, an expert agent 8364 may monitor the interactions of the user with the digital twin and may report the interactions to the expert agent system 8008 of the EMP. In embodiments, the expert agent system 8008 may receive the interactions and may train the expert agent 8364 based on the interactions with the digital twin, as well as outcomes stemming from the expert agent. For example, the expert agent may be trained to identify situations where the user delegates tasks or notifies a superior.

The executive digital twins discussed with respect to FIG. 71 are provided for example and not intended to limit the scope of the disclosure. Additional and/or alternative data types may be included in a respective type of executive digital twin.

Figure 73:
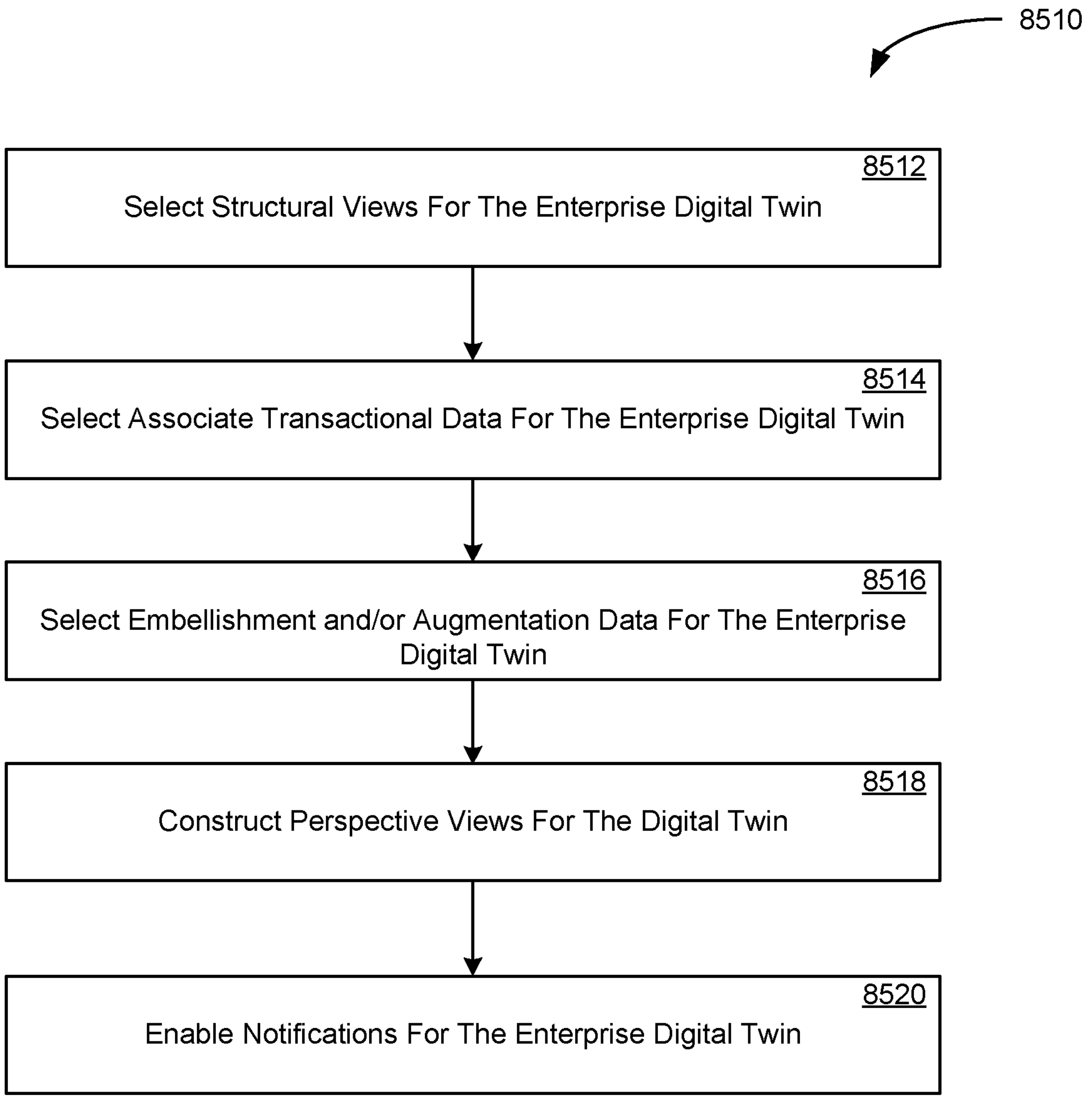
FIG. 73 is a flow chart illustrating an example set of operations for configuring and serving an enterprise digital twin.

FIG. 73 illustrates an example method 8510 for configuring and serving an enterprise digital twin. In embodiments, the method may be executed by the digital twin system 8004. The method may be performed with respect to different types of enterprise digital twins, including role-based digital twins (e.g., executive digital twins), cohort digital twins, environment digital twins, process digital twins, and/or the like.

At 8512, the structural views for a particular type of digital twin are selected. In embodiments, the structural views can be stored in a graph database (representing interconnected data) or in a geospatial database (representing coordinates of actual facilities).

At 8514, associated transactional data for the digital twin is selected. In embodiments, a combination of interaction data and transaction data is selected at grain that is suitable for the dynamic interaction within the digital twin is selected. This selection process may involve dynamic configuration of the structure, functions and features of a data mart or other summarization system and/or may work dynamically using typically high-performance database storage mechanisms (such as columnar databases or in memory databases).

At 8516, embellishment and/or augmentation data for the digital twin is selected. In embodiments, embellishment data are the associated attributes that can be tied to elements within the executive digital twin. For example, in generating an environment digital twin of a facility, embellishment or augmentation data may include the ages of machinery or other assets in the facility, the names of key third-party suppliers that could replace items with supply chain deliveries, the inputs or outputs of process flows that occur within the facility, identities of managers, indicators of states and flows, and many others. In an abstract executive digital twin the embellishment data may include social media data, for example sentiment analytics that can be associated with the customer hierarchical views.

At 8518, a representation medium for the digital twin is selected. In embodiments, the final representation can be multi-faceted, this can include a range of devices from simple mobile phone-based devices and touchscreen tablets to special-purpose devices and/or immersive AR/VR headsets, among many others. The representation medium impacts the volume and nature of data that is preferably selected in the earlier steps. In embodiments, selection of a representation medium is provided as a feedback indicator to the data and networking pipeline, such that filtering and data path selection can be undertaken with awareness of end device and other capabilities and requirements of the representation medium. This may occur automatically, such as by an agent that is trained to provide context-sensitive feedback based on a training set of outcomes.

At 8520, the perspective views are constructed. In embodiments, the perspective builder 8110 generates a level and nature of data that allows for different types of user to interact with the digital twin while gaining the appropriate level of perspective. For example, with a CEO-level view the CEO may require the context of third-party alternatives, market forces, and current strategic initiatives. In this example, the perspective builder 8110 takes these considerations into account in producing the level of digital twin appropriate for the CEO, furthermore this will impact the data selection process as different grains of data are appropriate for the different views. These different perspectives can be simultaneously interacted with various roles allowing the executive to provide their guidance on the same topic while seeing and interaction with information relevant to their specific needs.

At 8522, user notifications are enabled. In embodiments, notifications within the digital twin are controlled by the grain of the data selected and the required perspective. For example, a CTO level view requires notifications of various technology changes and technology market forces, the CTO digital twin is constantly being overlaid with these notifications that are structurally associated with the relevant part of the digital environment abstract or concrete. For example, in an organizational chart the CTO could be seeing the implementation options for new technology to provide more efficient communication between organizational units in strategic planning exercise to acquire a new company. Simultaneously the CFO is seeing the financial impacts of these various options, and the CEO is being notified of decisions that might impact the future market opportunities regarding the upcoming company acquisition.

The method is provided for example only. Additional and/or alternative methods may be performed to generate and serve digital twins without departing from the scope of the disclosure.

The method of FIG. 73 is provided for example and not intended to limit the scope of the disclosure. The method may include additional or alternative operations.

Figure 74:
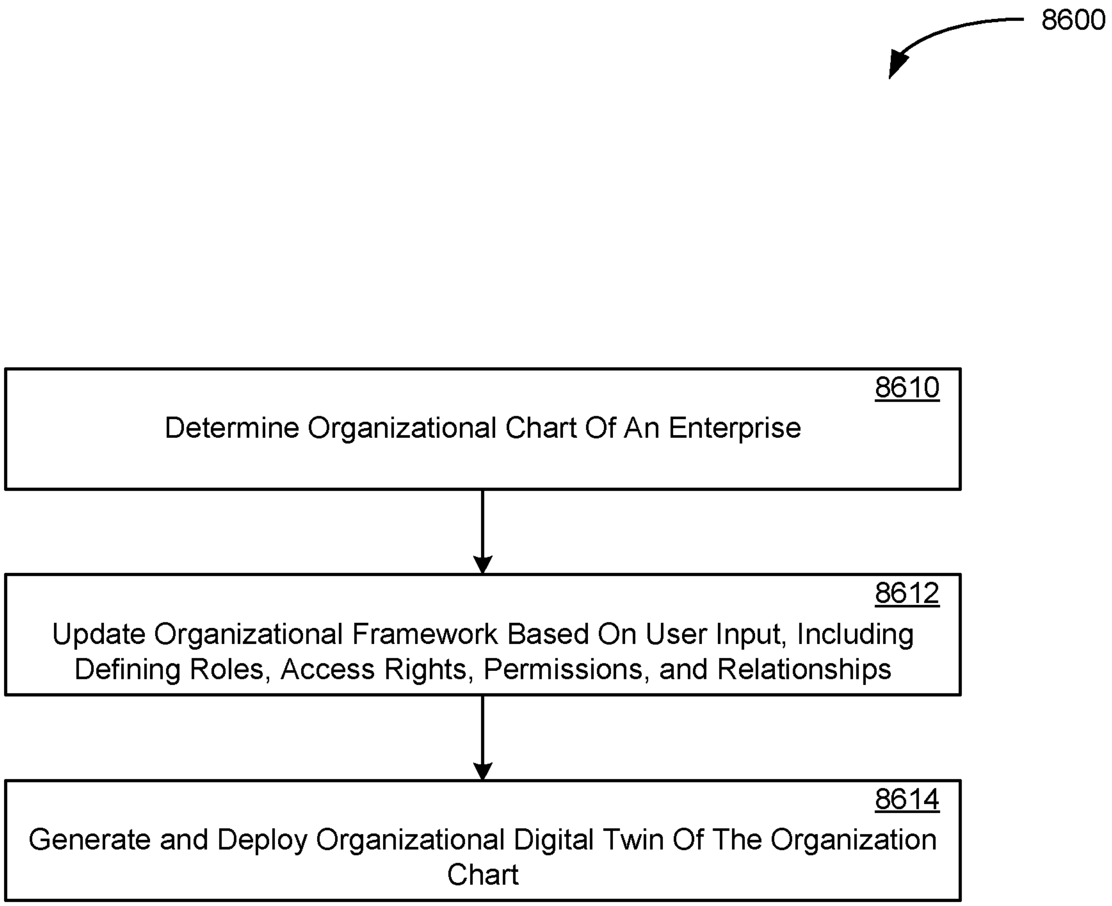
FIG. 74 illustrates an example set of operations of a method for configuring an organizational digital twin.

FIG. 74 illustrates an example set of operations of a method 8600 for configuring an organizational digital twin. In embodiments, the method may be executed at least in part by the digital twin system 8004. It is appreciated that the method may be executed by other suitable computing systems without departing from the scope of the disclosure.

At 8610 an organizational chart of an enterprise is determined. In embodiments, a user may upload the organizational chart via a GUI displayed to the user. In some embodiments, the digital twin system 8004 or a connected component may crawl one or more websites (e.g., the enterprise website, a social networking website, or the like) and may parse the crawled website(s) to determine the organizational chart.

At 8612, the organizational framework of the enterprise is updated based on user input. In embodiments, a user may define roles within the enterprise to individuals listed in the organizational chart, grant access rights to different roles and/or individuals, grant permissions to individuals and/or roles, and may define relationships between roles and/or individuals. In embodiments, the relationships may represent reporting structures, teams, business units, and the like.

At 8614, an organizational digital twin of the enterprise is generated and deployed. In embodiments, the digital twin system 8004 may generate the organizational digital twin by connecting data from the enterprise to the organizational chart. This may include information relating to the individuals, such as birthdate, social security or tax id, role, relationships, citizenship, employment status, salary, stock holdings, title, current status, goals or targets, and the like. Once deployed, the organizational chart may be continuously updated from one or more enterprise data sources. In embodiments, the organizational digital twin may be leveraged to determine the roles of individuals within an organization and/or the reporting structure of the digital twin.

The method of FIG. 74 is provided for example and not intended to limit the scope of the disclosure. The method may include additional or alternative operations.

Figure 75:
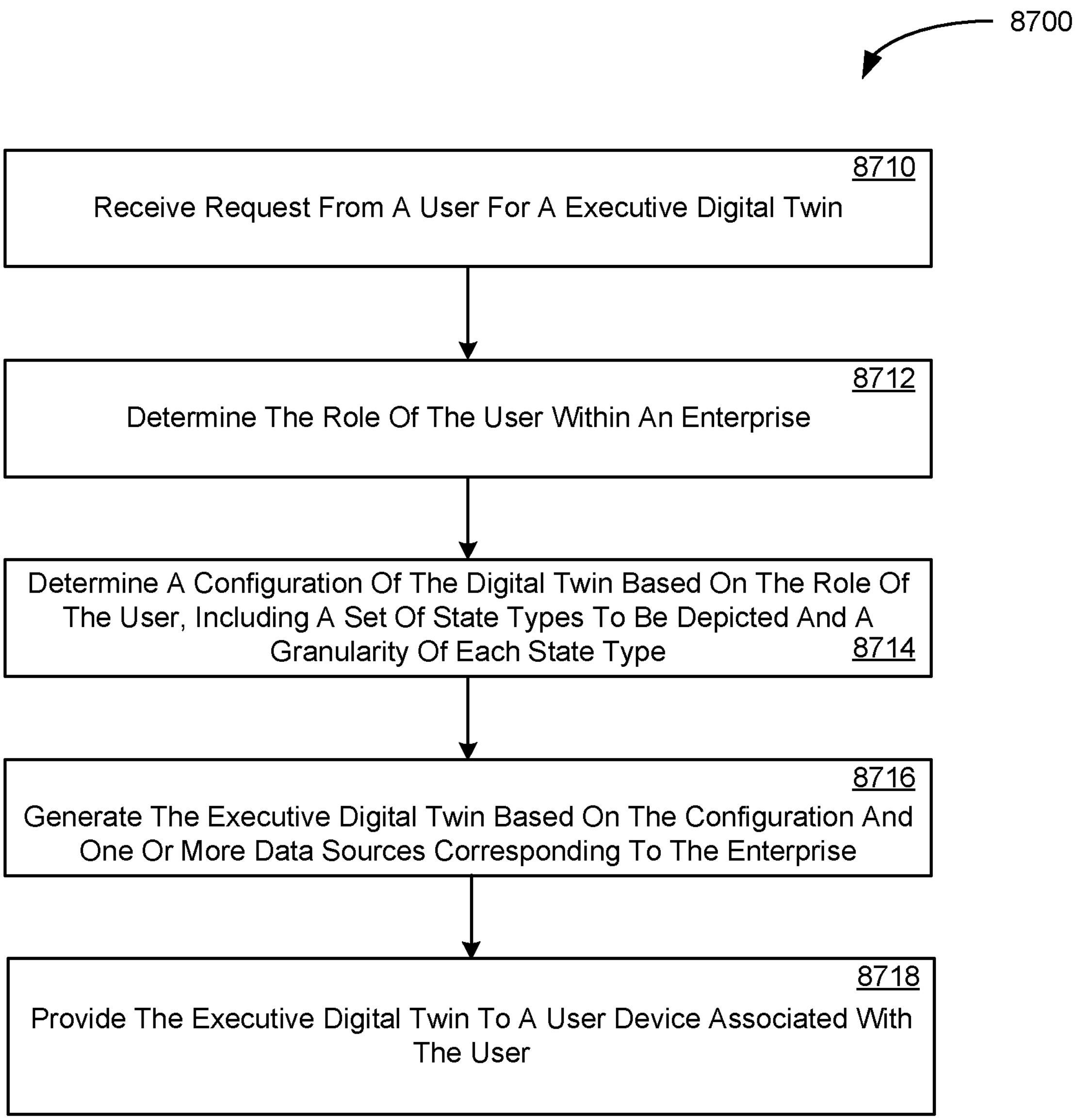
FIG. 75 illustrates an example set of operations of a method for generating an executive digital twin.
Figure 76:
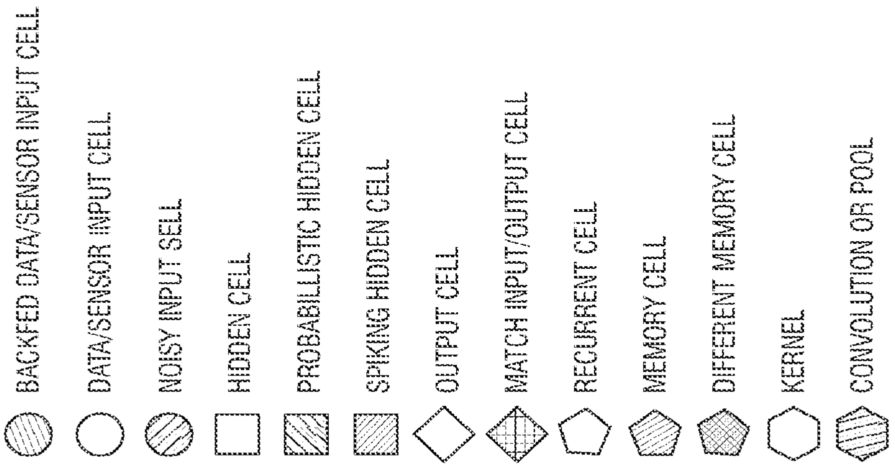
FIG. 76 through FIG. 103 are schematic diagrams of embodiments of neural net systems that may connect to, be integrated in, and be accessible by the platform for enabling intelligent transactions including ones involving expert systems, self-organization, machine learning, artificial intelligence and including neural net systems trained for pattern recognition, for classification of one or more parameters, characteristics, or phenomena, for support of autonomous control, and other purposes in accordance with embodiments of the present disclosure.
Figure 77:
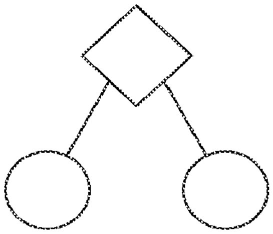
Figure 78:
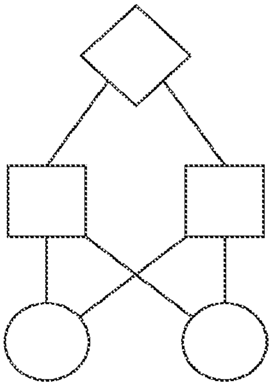
Figure 79:
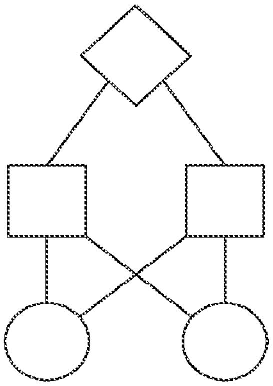
Figure 80:
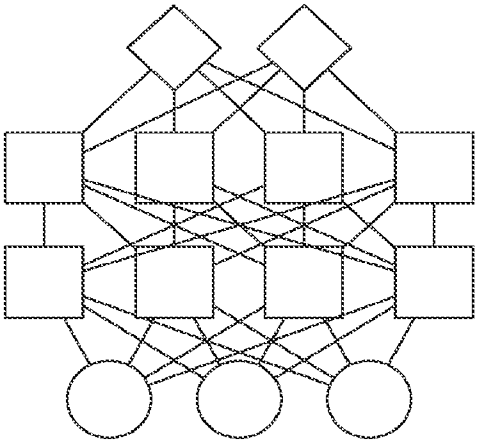
Figure 83:
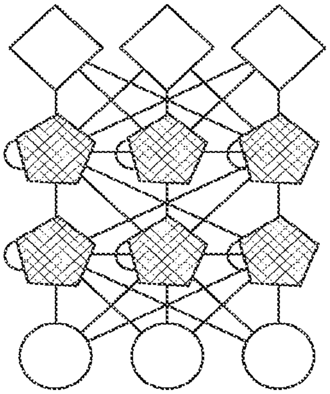
Figure 82:
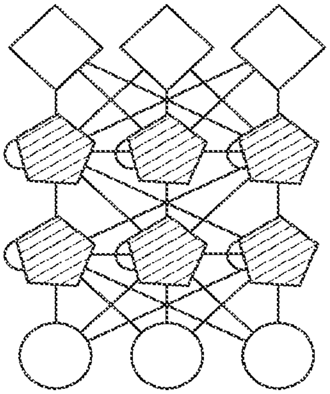
Figure 81:
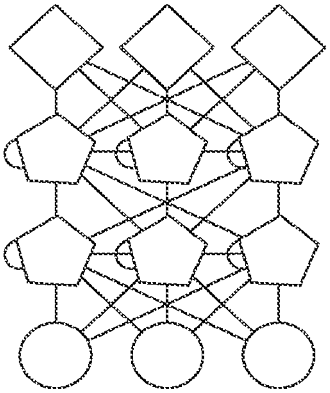
Figure 87:
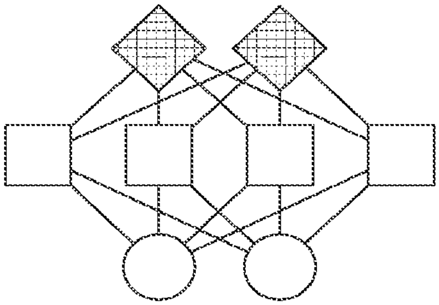
Figure 86:
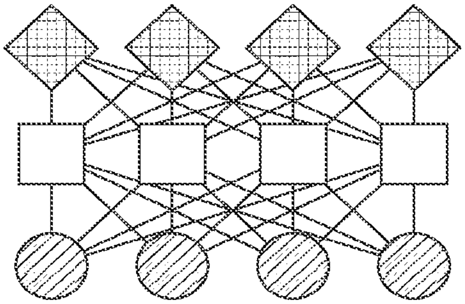
Figure 85:
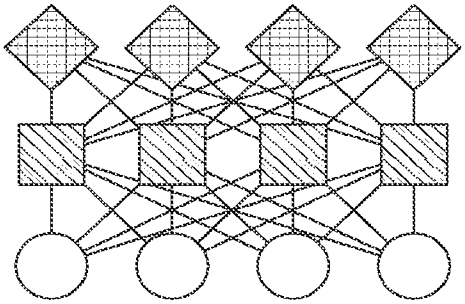

FIG. 75 illustrates an example set of operations of a method 8700 for generating an executive digital twin. In embodiments, the method may be executed at least in part by the digital twin system 8004. It is appreciated that the method may be executed by other suitable computing systems without departing from the scope of the disclosure.

At 8710, a request for an executive digital twin is received from a user. In embodiments, the digital twin system 8004 may receive a request for an executive digital twin from a user device associated with a user, such as a mobile device, a personal computer, a VR device, or the like. The request may indicate an identity of the user and/or a role of the user.

At 8712, a role of the user is determined. In embodiments, the digital twin system 8004 may determine a role of the user from the request and/or from an organizational digital twin of an enterprise associated with the user. In embodiments, the organizational digital twin may indicate the role of the user, the permissions of the user, the access rights of the user, restrictions of the user, and a reporting structure of the user.

At 8714, a configuration of the executive digital twin is determined based on the role of the user. In embodiments, the configuration of the executive digital twin indicates a set of states that re to be depicted in the executive digital twin and a granularity of the digital twin. In embodiments, the configuration of the executive digital twin is stored in a configuration file in the digital twin data store associated with the enterprise. The configuration file may define the initial states of the digital twin and the granularities of the states.

At 8716, a digital twin is generated based on one or more data sources corresponding to the enterprise. In embodiments, the digital twin system 8004 may determine the appropriate perspective for the requested digital twin based on the configuration of the digital twin and any access rights or restrictions of the user. In embodiments, the restrictions may include data restrictions, interaction restrictions, depth of data restrictions, usage restrictions, length of visibility restrictions, that the user may have. In some embodiments, generating the requested digital twin may include identifying the appropriate data sources for the digital twin given the perspective and obtaining any data that initially parameterizes the executive digital twin from the data sources.

At 8718, the executive digital twin is served to a user device of the user. In embodiments, the digital twin system 8004 may provide a file (e.g., a JSON file) containing the executive digital twin data and any data structures or visual elements that are needed to depict the executive digital twin by the user device. In embodiments, the digital twin system 8004 may also stream one or more real-time data or near-real time data streams to the user device (e.g., via a data bus), such that the executive digital twin may be updated with fresh data as the user interacts with the executive digital twin. The user may then interact with the digital twin. For example, the user may delegate tasks via the executive digital twin, request simulations via the executive digital twin, drill down into or zoom out of states depicted in the executive digital twin, report states to a supervisor via the executive digital twin, and/or the like.

The method of FIG. 75 is provided for example and not intended to limit the scope of the disclosure. The method may include additional or alternative operations.

Artificial Intelligence and Neural Network Embodiments

Referring to FIGS. 76 through 103, in embodiments of the present disclosure, including ones involving artificial intelligence 1160, expert systems, self-organization, machine learning, automation (including robotic process automation, remote control, autonomous operation, automated configuration, and the like), adaptive intelligence and adaptive intelligent systems, prediction, classification, optimization, and the like, may benefit from the use of a neural network or other artificial intelligence system, such as a neural net trained for pattern recognition, for classification of one or more parameters, characteristics, or phenomena, for support of autonomous control, and other purposes. References to artificial intelligence, neural network or neural net throughout this disclosure should be understood to encompass a wide range of different types of neural networks, machine learning systems, artificial intelligence systems, and the like, such as feed forward neural networks, radial basis function neural networks, self-organizing neural networks (e.g., Kohonen self-organizing neural networks), recurrent neural networks, modular neural networks, artificial neural networks, physical neural networks, multi-layered neural networks, convolutional neural networks, hybrids of neural networks with other expert systems (e.g., hybrid fuzzy logic—neural network systems), Autoencoder neural networks, probabilistic neural networks, time delay neural networks, convolutional neural networks, regulatory feedback neural networks, radial basis function neural networks, recurrent neural networks, Hopfield neural networks, Boltzmann machine neural networks, self-organizing map (SOM) neural networks, learning vector quantization (LVQ) neural networks, fully recurrent neural networks, simple recurrent neural networks, echo state neural networks, long short-term memory neural networks, bi-directional neural networks, hierarchical neural networks, stochastic neural networks, genetic scale RNN neural networks, committee of machines neural networks, associative neural networks, physical neural networks, instantaneously trained neural networks, spiking neural networks, neocognition neural networks, dynamic neural networks, cascading neural networks, neuro-fuzzy neural networks, compositional pattern-producing neural networks, memory neural networks, hierarchical temporal memory neural networks, deep feed forward neural networks, gated recurrent unit (GCU) neural networks, auto encoder neural networks, variational auto encoder neural networks, de-noising auto encoder neural networks, sparse auto-encoder neural networks, Markov chain neural networks, restricted Boltzmann machine neural networks, deep belief neural networks, deep convolutional neural networks, de-convolutional neural networks, deep convolutional inverse graphics neural networks, generative adversarial neural networks, liquid state machine neural networks, extreme learning machine neural networks, echo state neural networks, deep residual neural networks, support vector machine neural networks, neural Turing machine neural networks, and/or holographic associative memory neural networks, or hybrids or combinations of the foregoing, or combinations with other expert systems, such as rule-based systems, model-based systems (including ones based on physical models, statistical models, flow-based models, biological models, biomimetic models, and the like).

The foregoing neural networks may have a variety of nodes or neurons, which may perform a variety of functions on inputs, such as inputs received from sensors or other data sources, including other nodes. Functions may involve weights, features, feature vectors, and the like. Neurons may include perceptron, neurons that mimic biological functions (such as of the human senses of touch, vision, taste, hearing, and smell), and the like. Continuous neurons, such as with sigmoidal activation, may be used in the context of various forms of neural net, such as where back propagation is involved.

In many embodiments, an expert system or neural network may be trained, such as by a human operator or supervisor, or based on a data set, model, or the like. Training may include presenting the neural network with one or more training data sets that represent values (including the many types described throughout this disclosure), as well as one or more indicators of an outcome, such as an outcome of a process, an outcome of a calculation, an outcome of an event, an outcome of an activity, or the like. Training may include training in optimization, such as training a neural network to optimize one or more systems based on one or more optimization approaches, such as Bayesian approaches, parametric Bayes classifier approaches, k-nearest-neighbor classifier approaches, iterative approaches, interpolation approaches, Pareto optimization approaches, algorithmic approaches, and the like. Feedback may be provided in a process of variation and selection, such as with a genetic algorithm that evolves one or more solutions based on feedback through a series of rounds.

In embodiments, a plurality of neural networks may be deployed in a cloud platform that receives data streams and other inputs collected (such as by mobile data collectors) in one or more environments and transmitted to the cloud platform over one or more networks, including using network coding to provide efficient transmission. In the cloud platform, optionally using massively parallel computational capability, a plurality of different neural networks of various types (including modular forms, structure-adaptive forms, hybrids, and the like) may be used to undertake prediction, classification, control functions, and provide other outputs as described in connection with expert systems disclosed throughout this disclosure. The different neural networks may be structured to compete with each other (optionally including use evolutionary algorithms, genetic algorithms, or the like), such that an appropriate type of neural network, with appropriate input sets, weights, node types and functions, and the like, may be selected, such as by an expert system, for a specific task involved in a given context, workflow, environment process, system, or the like.

In embodiments, methods and systems described herein that involve an expert system or self-organization capability may use a feed forward neural network, which moves information in one direction, such as from a data input, like a source of data about an individual, through a series of neurons or nodes, to an output. Data may move from the input nodes to the output nodes, optionally passing through one or more hidden nodes, without loops. In embodiments, feed forward neural networks may be constructed with various types of units, such as binary McCulloch-Pitts neurons, the simplest of which is a perceptron.

In embodiments, methods and systems described herein that involve an expert system or self-organization capability may use a radial basis function (RBF) neural network, which may be preferred in some situations involving interpolation in a multi-dimensional space (such as where interpolation is helpful in optimizing a multi-dimensional function, such as for optimizing a data marketplace as described here, optimizing the efficiency or output of a power generation system, a factory system, or the like, or other situation involving multiple dimensions. In embodiments, each neuron in the RBF neural network stores an example from a training set as a "prototype." Linearity involved in the functioning of this neural network offers RBF the advantage of not typically suffering from problems with local minima or maxima.

In embodiments, methods and systems described herein that involve an expert system or self-organization capability may use a radial basis function (RBF) neural network, such as one that employs a distance criterion with respect to a center (e.g., a Gaussian function). A radial basis function may be applied as a replacement for a hidden layer, such as a sigmoidal hidden layer transfer, in a multi-layer perceptron. An RBF network may have two layers, such as where an input is mapped onto each RBF in a hidden layer. In embodiments, an output layer may comprise a linear combination of hidden layer values representing, for example, a mean predicted output. The output layer value may provide an output that may be the same as or similar to that of a regression model in statistics. In classification problems, the output layer may be a sigmoid function of a linear combination of hidden layer values, representing a posterior probability. Performance in both cases may be often improved by shrinkage techniques, such as ridge regression in classical statistics. This corresponds to a prior belief in small parameter values (and therefore smooth output functions) in a Bayesian framework. RBF networks may avoid local minima, because the only parameters that are adjusted in the learning process are the linear mapping from hidden layer to output layer. Linearity ensures that the error surface may be quadratic and therefore has a single minimum. In regression problems, this can be found in one matrix operation. In classification problems, the fixed non-linearity introduced by the sigmoid output function may be handled using an iteratively. Re-weighted least squares function or the like.

In embodiments, RBF networks may use kernel methods such as support vector machines (SVM) and Gaussian processes (where the RBF may be the kernel function). A non-linear kernel function may be used to project the input data into a space where the learning problem can be solved using a linear model.

In embodiments, an RBF neural network may include an input layer, a hidden layer and a summation layer. In the input layer, one neuron appears in the input layer for each predictor variable. In the case of categorical variables, N−1 neurons are used, where N is the number of categories. The input neurons may, in embodiments, standardize the value ranges by subtracting the median and dividing by the interquartile range. The input neurons may then feed the values to each of the neurons in the hidden layer. In the hidden layer, a variable number of neurons may be used (determined by the training process). Each neuron may consist of a radial basis function that may be centered on a point with as many dimensions as a number of predictor variables. The spread (e.g., radius) of the RBF function may be different for each dimension. The centers and spreads may be determined by training. When presented with a vector of input values from the input layer, a hidden neuron may compute a Euclidean distance of the test case from the neuron's center point and then apply the RBF kernel function to this distance, such as using the spread values. The resulting value may then be passed to the summation layer. In the summation layer, the value coming out of a neuron in the hidden layer may be multiplied by a weight associated with the neuron and may add to the weighted values of other neurons. This sum becomes the output. For classification problems, one output may be produced (with a separate set of weights and summation units) for each target category. The value output for a category is the probability that the case being evaluated has that category. In training of an RBF, various parameters may be determined, such as the number of neurons in a hidden layer, the coordinates of the center of each hidden-layer function, the spread of each function in each dimension, and the weights applied to outputs as they pass to the summation layer. Training may be used by clustering algorithms (such as k-means clustering), by evolutionary approaches, and the like.

In embodiments, a recurrent neural network may have a time-varying, real-valued (more than just zero or one) activation (output). Each connection may have a modifiable real-valued weight. Some of the nodes are called labeled nodes, some output nodes, and other hidden nodes. For supervised learning in discrete time settings, training sequences of real-valued input vectors may become sequences of activations of the input nodes, one input vector at a time. At each time step, each non-input unit may compute its current activation as a nonlinear function of the weighted sum of the activations of all units from which it receives connections. The system can explicitly activate (independent of incoming signals) some output units at certain time steps.

In embodiments, methods and systems described herein that involve an expert system or self-organization capability may use a self-organizing neural network, such as a Kohonen self-organizing neural network, such as for visualization of views of data, such as low-dimensional views of high-dimensional data. The self-organizing neural network may apply competitive learning to a set of input data, such as from one or more sensors or other data inputs from or associated with an individual. In embodiments, the self-organizing neural network may be used to identify structures in data, such as unlabeled data, such as in data from various unstructured sources, such as social media sources about an individual, where sources of the data are unknown (such as where data comes from various unknown or uncertain sources). The self-organizing neural network may organize structures or patterns in the data, such that they can be recognized, analyzed, and labeled, such as identifying structures as corresponding to individuals, disease conditions, health states, activity states, and the like.

In embodiments, methods and systems described herein that involve an expert system or self-organization capability may use a recurrent neural network, which may allow for a bi-directional flow of data, such as where connected units (e.g., neurons or nodes) form a directed cycle. Such a network may be used to model or exhibit dynamic temporal behavior, such as involved in dynamic systems, such as a wide variety of the disease conditions, health states, and biological systems described throughout this disclosure, such as a body experiencing multiple different diseases or health conditions, or the like, where dynamic system behavior involves complex interactions that an observer may desire to understand, diagnose, predict, control, treat and/or optimize. For example, the recurrent neural network may be used to anticipate the state (such as a maintenance state, a health state, a disease state, or the like), of an individual, such as one interacting with a system, performing an action, or the like. In embodiments, the recurrent neural network may use internal memory to process a sequence of inputs, such as from other nodes and/or from sensors and other data inputs from an environment, of the various types described herein, such as a social network, a home or work environment, a health care environment, a recreational or sports environment, or the like. In embodiments, the recurrent neural network may also be used for pattern recognition, such as for recognizing a person based on a biomarker, a face, a voice or sound signature, a heat signature, a set of feature vectors in an image, a chemical signature, or the like. In a non-limiting example, a recurrent neural network may recognize a change or shift in a state of a human by learning to classify the shift or change from a training data set consisting of a stream of data from unstructured data sources, such as social media sources.

In embodiments, methods and systems described herein that involve an expert system or self-organization capability may use a modular neural network, which may comprise a series of independent neural networks (such as ones of various types described herein) that are moderated by an intermediary. Each of the independent neural networks in the modular neural network may work with separate inputs, accomplishing subtasks that make up the task the modular network as a whole is intended to perform. For example, a modular neural network may comprise a recurrent neural network for pattern recognition, such as to recognize what type of person, condition, state, or the like is being sensed by one or more sensors that are provided as input channels to the modular network and an RBF neural network for optimizing a system, protocol, or the like, once understood. The intermediary may accept inputs of each of the individual neural networks, process them, and create output for the modular neural network, such an appropriate control parameter, a prediction of state, or the like.

Combinations among any of the pairs, triplets, or larger combinations, of the various neural network types described herein, are encompassed by the present disclosure. This may include combinations where an expert system uses one neural network for recognizing a pattern (e.g., a pattern indicating a problem or fault condition) and a different neural network for self-organizing an activity or work flow based on the recognized pattern (such as providing an output governing autonomous control of a system in response to the recognized condition or pattern). This may also include combinations where an expert system uses one neural network for classifying an item (e.g., identifying a machine, a component, or an operational mode) and a different neural network for predicting a state of the item (e.g., a fault state, an operational state, an anticipated state, a maintenance state, a. predicted state, or the like). Modular neural networks may also include situations where an expert system uses one neural network for determining a state or context (such as a state of a machine, a process, a work flow, a storage system, a network, a data collector, or the like) and a different neural network for self-organizing a process involving the state or context (e.g., a data storage process, a network coding process, a network selection process, a data processing process, or other process described herein).

In embodiments, methods and systems described herein that involve an expert system or self-organization capability may use a physical neural network where one or more hardware elements may be used to perform or simulate neural behavior. One or more hardware nodes may be configured to stream output data resulting from the activity of the neural net. Hardware nodes, which may comprise one or more chips, microprocessors, integrated circuits, programmable logic controllers, application-specific integrated circuits, field-programmable gate arrays, or the like, may be provided to optimize the speed, input/output efficiency, energy efficiency, signal to noise ratio, or other parameter of some part of a neural net of any of the types described herein. Hardware nodes may include hardware for acceleration of calculations (such as dedicated processors for performing basic or more sophisticated calculations on input data to provide outputs, dedicated processors for filtering or compressing data, dedicated processors for de-compressing data, dedicated processors for compression of specific file or data types (e.g., for handling image data, video streams, acoustic signals, vibration data, thermal images, heat maps, or the like), and the like. A physical neural network may be embodied in a data collector, edge intelligence system, adaptive intelligent system, mobile data collector, IoT monitoring system, or other system described herein, including one that may be reconfigured by switching or routing inputs in varying configurations, such as to provide different neural net configurations within the system for handling different types of inputs (with the switching and configuration optionally under control of an expert system, which may include a software-based neural net located on the data collector or remotely). A physical, or at least partially physical, neural network may include physical hardware nodes located in a storage system, such as for storing data within machine, a product, or the like, such as for accelerating input/output functions to one or more storage elements that supply data to or take data from the neural net. A physical, or at least partially physical, neural network may include physical hardware nodes located in a network, such as for transmitting data within, to or from an environment, such as for accelerating input/output functions to one or more network nodes in the net, accelerating relay functions, or the like. In embodiments, of a physical neural network, an electrically adjustable resistance material may be used for emulating the function of a neural synapse. In embodiments, the physical hardware emulates the neurons, and software emulates the neural network between the neurons. In embodiments, neural networks complement conventional algorithmic computers. They may be trained to perform appropriate functions without the need for any instructions, such as classification functions, optimization functions, pattern recognition functions, control functions, selection functions, evolution functions, and others.

In embodiments, methods and systems described herein that involve an expert system or self-organization capability may use a multilayered feed forward neural network, such as for complex pattern classification of one or more items, phenomena, modes, states, or the like. In embodiments, a multilayered feed forward neural network may be trained by an optimization technical, such as a genetic algorithm, such as to explore a large and complex space of options to find an optimum, or near-optimum, global solution. For example, one or more genetic algorithms may be used to train a multilayered feed forward neural network to classify complex phenomena, such as to recognize complex operational modes or states of individuals, such as modes involving complex interactions among entities (including interference effects, amplifying effects, and the like), modes involving non-linear phenomena, such as impacts of interaction of protocols, which may make analysis of symptoms or diagnosis of conditions of entities difficult, modes involving critical risks, such as where multiple, simultaneous conditions occur, making root cause analysis difficult, and others. In embodiments, a multilayered feed forward neural network may be used to classify results from monitoring unstructured data, such as form social media.

In embodiments, methods and systems described herein that involve an expert system or self-organization capability may use a feed-forward, back-propagation multi-layer perceptron (MLP) neural network, such as for handling one or more remote sensing applications, such as for taking inputs from sensors distributed throughout various human-inhabited environments, including home and work environments, business environments, and the like. In embodiments, the MLP neural network may be used for classification of physical environments. This may include fuzzy classification.

In embodiments, methods and systems described herein that involve an expert system or self-organization capability may use a structure-adaptive neural network, where the structure of a neural network may be adapted, such as based on a rule, a sensed condition, a contextual parameter, or the like. For example, if a neural network does not converge on a solution, such as classifying an item or arriving at a prediction, when acting on a set of inputs after some amount of training, the neural network may be modified, such as from a feed forward neural network to a recurrent neural network, such as by switching data paths between some subset of nodes from unidirectional to bi-directional data paths. The structure adaptation may occur under control of an expert system, such as to trigger adaptation upon occurrence of a trigger, rule or event, such as recognizing occurrence of a threshold (such as an absence of a convergence to a solution within a given amount of time) or recognizing a phenomenon as requiring different or additional structure (such as recognizing that a system may be varying dynamically or in a non-linear fashion).

In embodiments, methods and systems described herein that involve an expert system or self-organization capability may use an autoencoder, autoassociator or Diabolo neural network, which may be similar to a multilayer perceptron (MLP) neural network, such as where there may be an input layer, an output layer and one or more hidden layers connecting them. However, the output layer in the auto-encoder may have the same number of units as the input layer, where the purpose of the MLP neural network may be to reconstruct its own inputs (rather than just emitting a target value). Therefore, the auto encoders are may operate as an unsupervised learning model. An auto encoder may be used, for example, for unsupervised learning of efficient codings, such as for dimensionality reduction, for learning generative models of data, and the like. In embodiments, an auto-encoding neural network may be used to self-learn an efficient network coding for transmission of data from or about an individual over one or more networks, which may include social networks. In embodiments, an auto-encoding neural network may be used to self-learn an efficient storage approach for the storage of streams of analog sensor data from an environment.

In embodiments, methods and systems described herein that involve an expert system or self-organization capability may use a probabilistic neural network (PNN), which, in embodiments, may comprise a multi-layer (e.g., four-layer) feed forward neural network, where layers may include input layers, hidden layers, pattern/summation layers and an output layer. In an embodiment of a PNN algorithm, a parent probability distribution function (PDF) of each class may be approximated, such as by a Parzen window and/or a non-parametric function. Then, using the PDF of each class, the class probability of a new input may be estimated, and Bayes' rule may be employed, such as to allocate it to the class with the highest posterior probability. A PNN may embody a Bayesian network and may use a statistical algorithm or analytic technique, such as Kernel Fisher discriminant analysis technique. The PNN may be used for classification and pattern recognition in any of a wide range of embodiments disclosed herein. In one non-limiting example, a probabilistic neural network may be used to predict a fault condition of a product or system based on a collection of data inputs from sensors and instruments for the engine.

In embodiments, methods and systems described herein that involve an expert system or self-organization capability may use a time delay neural network (TDNN), which may comprise a feed forward architecture for sequential data that recognizes features independent of sequence position. In embodiments, to account for time shifts in data, delays are added to one or more inputs, or between one or more nodes, so that multiple data points (from distinct points in time) are analyzed together. A time delay neural network may form part of a larger pattern recognition system, such as using a perceptron network. In embodiments, a TDNN may be trained with supervised learning, such as where connection weights are trained with back propagation or under feedback. In embodiments, a TDNN may be used to process sensor data from distinct streams, where time delays are used to align the data streams in time, such as to help understand patterns that involve the understanding of the various streams.

In embodiments, methods and systems described herein that involve an expert system or self-organization capability may use a convolutional neural network (referred to in some cases as a CNN, a ConvNet, a shift invariant neural network, or a space invariant neural network), wherein the units are connected in a pattern similar to the visual cortex of the human brain. Neurons may respond to stimuli in a restricted region of space, referred to as a receptive field. Receptive fields may partially overlap, such that they collectively cover the entire (e.g., visual) field. Node responses can be calculated mathematically, such as by a convolution operation, such as using. Multilayer perceptrons that use minimal preprocessing. A convolutional neural network may be used for recognition within images and video streams, such as for recognizing an individual, recognizing a marker of a disease condition, or the like. This may include recognizing an individual in a crowd, such as using a camera system disposed on a mobile data collector, such as on a drone or mobile robot. In embodiments, a convolutional neural network may be used to provide a recommendation based on data inputs, including sensor inputs and other contextual information. In embodiments, a convolutional neural network may be used for processing inputs, such as for natural language processing of instructions provided by one or more parties involved in a workflow in an environment. In embodiments, a convolutional neural network may be deployed with a large number of neurons (e.g., 100,000, 500,000 or more), with multiple (e.g., 4, 5, 6 or more) layers, and with many (e.g., millions) of parameters. A convolutional neural net may use one or more convolutional nets.

In embodiments, methods and systems described herein that involve an expert system or self-organization capability may use a regulatory feedback network, such as for recognizing emergent phenomena (such as new types of conditions not previously understood in an individual or population of individuals).

In embodiments, methods and systems described herein that involve an expert system or self-organization capability may use a self-organizing map (SOM), involving unsupervised learning. A set of neurons may learn to map points in an input space to coordinates in an output space. The input space can have different dimensions and topology from the output space, and the SOM may preserve these while mapping phenomena into groups.

In embodiments, methods and systems described herein that involve an expert system or self-organization capability may use a learning vector quantization neural net (LVQ). Prototypical representatives of the classes may parameterize, together with an appropriate distance measure, in a distance-based classification scheme.

In embodiments, methods and systems described herein that involve an expert system or self-organization capability may use an echo state network (ESN), which may comprise a recurrent neural network with a sparsely connected, random hidden layer. The weights of output neurons may be changed (e.g., the weights may be trained based on feedback). In embodiments, an ESN may be used to handle time series patterns, such as, in an example, recognizing a pattern of progression of a process.

In embodiments, methods and systems described herein that involve an expert system or self-organization capability may use a Bi-directional, recurrent neural network (BRNN), such as using a finite sequence of values (e.g., voltage values from a sensor) to predict or label each element of the sequence based on both the past and the future context of the element. This may be done by adding the outputs of two RNNs, such as one processing the sequence from left to right, the other one from right to left. The combined outputs are the predictions of target signals, such as ones provided by a teacher or supervisor. A bi-directional RNN may be combined with a long short-term memory RNN.

In embodiments, methods and systems described herein that involve an expert system or self-organization capability may use a hierarchical RNN that connects elements in various ways to decompose hierarchical behavior, such as into useful subprograms. In embodiments, a hierarchical RNN may be used to manage one or more hierarchical templates for data collection in a social network, a value chain environment, or the like.

In embodiments, methods and systems described herein that involve an expert system or self-organization capability may use a stochastic neural network, which may introduce random variations into the network. Such random variations can be viewed as a form of statistical sampling, such as Monte Carlo sampling or other statistical sampling techniques.

In embodiments, methods and systems described herein that involve an expert system or self-organization capability may use a genetic scale recurrent neural network. In such embodiments, an RNN (often a LS™) may be used where a series may be decomposed into a number of scales where every scale informs the primary length between two consecutive points. A first order scale consists of a normal RNN, a second order consists of all points separated by two indices and so on. The Nth order RNN connects the first and last node. The outputs from all the various scales may be treated as a committee of members, and the associated scores may be used genetically for the next iteration.

In embodiments, methods and systems described herein that involve an expert system or self-organization capability may use a committee of machines (CoM), comprising a collection of different neural networks that together “vote” on a given example. Because neural networks may suffer from local minima, starting with the same architecture and training, but using randomly different initial weights often gives different results. A CoM tends to stabilize the result.

In embodiments, methods and systems described herein that involve an expert system or self-organization capability may use an associative neural network (ASNN), such as involving an extension of a committee of machines that combines multiple feed forward neural networks and a k-nearest neighbor technique. It may use the correlation between ensemble responses as a measure of distance amid the analyzed cases for the kNN. This corrects the bias of the neural network ensemble. An associative neural network may have a memory that can coincide with a training set. If new data become available, the network instantly improves its predictive ability and provides data approximation (self-learns) without retraining. Another important feature of ASNN may be the possibility to interpret neural network results by analysis of correlations between data cases in the space of models.

In embodiments, methods and systems described herein that involve an expert system or self-organization capability may use an instantaneously trained neural network (ITNN), where the weights of the hidden and the output layers are mapped directly from training vector data.

In embodiments, methods and systems described herein that involve an expert system or self-organization capability may use a spiking neural network, which may explicitly consider the timing of inputs. The network input and output may be represented as a series of spikes (such as a delta function or more complex shapes). SNNs can process information in the time domain (e.g., signals that vary over time, such as signals involving dynamic behavior of an individual, a disease condition, a health condition, or the like). They may be implemented as recurrent networks.

In embodiments, methods and systems described herein that involve an expert system or self-organization capability may use a dynamic neural network that addresses nonlinear multivariate behavior and includes learning of time-dependent behavior, such as transient phenomena and delay effects. Transients may include behavior of progressing states.

In embodiments, cascade correlation may be used as an architecture and supervised learning algorithm, supplementing adjustment of the weights in a network of fixed topology. Cascade-correlation may begin with a minimal network, then automatically trains and add new hidden units one by one, creating a multi-layer structure. Once anew hidden unit has been added to the network, its input-side weights may be frozen. This unit then becomes a permanent feature-detector in the network, available for producing outputs or for creating other, more complex feature detectors. The cascade-correlation architecture may learn quickly, determine its own size and topology, and retain the structures it has built even if the training set changes and requires no back-propagation.

In embodiments, methods and systems described herein that involve an expert system or self-organization capability may use a neuro-fuzzy network, such as involving a fuzzy interference system in the body of an artificial neural network. Depending on the type, several layers may simulate the processes involved in a fuzzy inference, such as fuzzification, inference, aggregation and defuzzification. Embedding a fuzzy system in a general structure of a neural net as the benefit of using available training methods to find the parameters of a fuzzy system.

In embodiments, methods and systems described herein that involve an expert system or self-organization capability may use a compositional pattern-producing network (CPPN), such as a variation of an associative neural network (ANN) that differs the set of activation functions and how they are applied. While typical ANNs often contain only sigmoid functions (and sometimes Gaussian functions. PPNs can include both types of functions and many others. Furthermore, CPPNs may be applied across the entire space of possible inputs, so that they can represent a complete image. Since they are compositions of functions, CPPNs in effect encode images at infinite resolution and can be sampled for a particular display at whatever resolution may be optimal. This type of network can add new patterns without re-training. In embodiments, methods and systems described herein that involve an expert system or self-organization capability may use a one-shot associative memory network, such as by creating a specific memory structure, which assigns each new pattern to an orthogonal plane using adjacently connected hierarchical arrays.

In embodiments, methods and systems described herein that involve an expert system or self-organization capability may use a hierarchical temporal memory (HTM) neural network, such as involving the structural and algorithmic properties of the neocortex. HTM may use a biomimetic model, such as based on memory-prediction. HTM may be used to discover and infer the high-level causes of observed input patterns and sequences.

In embodiments, methods and systems described herein that involve an expert system or self-organization capability may use a holographic associative memory (HAM) neural network, which may comprise an analog, correlation-based, associative, stimulus-response system. Information may be mapped onto the phase orientation of complex numbers. The memory may be effective for associative memory tasks, generalization and pattern recognition with changeable attention.

The foregoing neural networks may have a variety of nodes or neurons, which may perform a variety of functions on inputs, such as inputs received from sensors or other data sources, including other nodes. Functions may involve weights, features, feature vectors, and the like. Neurons may include perceptrons, neurons that mimic biological functions (such as of the human senses of touch, vision, taste, hearing, and smell), and the like. Continuous neurons, such as with sigmoidal activation, may be used in the context of various forms of neural net, such as where back propagation is involved.

In many embodiments, an expert system or neural network may be trained, such as by a human operator or supervisor, or based on a data set, model, or the like. Training may include presenting the neural network with one or more training data sets that represent values, such as sensor data, event data, parameter data, and other types of data (including the many types described throughout this disclosure), as well as one or more indicators of an outcome, such as an outcome of a process, an outcome of a calculation, an outcome of an event, an outcome of an activity, or the like. Training may include training in optimization, such as training a neural network to optimize one or more systems based on one or more optimization approaches, such as Bayesian approaches, parametric Bayes classifier approaches, k-nearest-neighbor classifier approaches, iterative approaches, interpolation approaches, Pareto optimization approaches, algorithmic approaches, and the like. Feedback may be provided in a process of variation and selection, such as with a genetic algorithm that evolves one or more solutions based on feedback through a series of rounds.

In embodiments, a plurality of neural networks may be deployed in a cloud platform that receives data streams and other inputs collected (such as by mobile data collectors) in one or more industrial environments and transmitted to the cloud platform over one or more networks, including using network coding to provide efficient transmission. In the cloud platform, optionally using massively parallel computational capability, a plurality of different neural networks of several types (including modular forms, structure-adaptive forms, hybrids, and the like) may be used to undertake prediction, classification, control functions, and provide other outputs as described in connection with expert systems disclosed throughout this disclosure. The different neural networks may be structured to compete with each other (optionally including the use of evolutionary algorithms, genetic algorithms, or the like), such that an appropriate type of neural network, with appropriate input sets, weights, node types and functions, and the like, may be selected, such as by an expert system, for a specific task involved in a given context, workflow, environment process, system, or the like.

In embodiments, methods and systems described herein that involve an expert system or self-organization capability may use a feed forward neural network, which moves information in one direction, such as from a data input, like an analog sensor located on or proximal to an industrial machine, through a series of neurons or nodes, to an output. Data may move from the input nodes to the output nodes, optionally passing through one or more hidden nodes, without loops. In embodiments, feedforward neural networks may be constructed with various types of units, such as binary McCulloch-Pitts neurons, the simplest of which is a perceptron.

In embodiments, methods and systems described herein that involve an expert system or self-organization capability may use a radial basis function (RBF) neural network, which may be preferred in some situations involving interpolation in a multi-dimensional space (such as where interpolation is helpful in optimizing a multi-dimensional function, such as for optimizing a data marketplace as described here, optimizing the efficiency or output of a power generation system, a factory system, or the like, or other situation involving multiple dimensions). In embodiments, each neuron in the RBF neural network stores an example from a training set as a "prototype." Linearity involved in the functioning of this neural network offers RBF the advantage of not typically suffering from problems with local minima or maxima.

In embodiments, methods and systems described herein that involve an expert system or self-organization capability may use a radial basis function (RBF) neural network, such as one that employs a distance criterion with respect to a center (e.g., a Gaussian function). A radial basis function may be applied as a replacement for a hidden layer (such as a sigmoidal hidden layer transfer) in a multi-layer perceptron. An RBF network may have two layers, such as the case where an input is mapped onto each RBF in a hidden layer. In embodiments, an output layer may comprise a linear combination of hidden layer values representing, for example, a mean predicted output. The output layer value may provide an output that is the same as or similar to that of a regression model in statistics. In classification problems, the output layer may be a sigmoid function of a linear combination of hidden layer values, representing a posterior probability. Performance in both cases is often improved by shrinkage techniques, such as ridge regression in classical statistics. This corresponds to a prior belief in small parameter values (and therefore smooth output functions) in a Bayesian framework. RBF networks may avoid local minima, because the only parameters that are adjusted in the learning process are the linear mapping from hidden layer to output layer. Linearity ensures that the error surface is quadratic and therefore has a single minimum. In regression problems, this can be found in one matrix operation. In classification problems, the fixed non-linearity introduced by the sigmoid output function may be handled using an iteratively re-weighted least squares function or the like.

RBF networks may use kernel methods such as support vector machines (SVM) and Gaussian processes (where the RBF is the kernel function). A non-linear kernel function may be used to project the input data into a space where the learning problem can be solved using a linear model.

In embodiments, an RBF neural network may include an input layer, a hidden layer, and a summation layer. In the input layer, one neuron appears in the input layer for each predictor variable. In the case of categorical variables, N−1 neurons are used, where N is the number of categories. The input neurons may, in embodiments, standardize the value ranges by subtracting the median and dividing by the interquartile range. The input neurons may then feed the values to each of the neurons in the hidden layer. In the hidden layer, a variable number of neurons may be used (determined by the training process). Each neuron may consist of a radial basis function that is centered on a point with as many dimensions as a number of predictor variables. The spread (e.g., radius) of the RBF function may be different for each dimension. The centers and spreads may be determined by training. When presented with a vector of input values from the input layer, a hidden neuron may compute a Euclidean distance of the test case from the neuron's center point and then apply the RBF kernel function to this distance, such as using the spread values. The resulting value may then be passed to the summation layer. In the summation layer, the value coming out of a neuron in the hidden layer may be multiplied by a weight associated with the neuron and may add to the weighted values of other neurons. This sum becomes the output. For classification problems, one output is produced (with a separate set of weights and summation units) for each target category. The value output for a category is the probability that the case being evaluated has that category. In training of an RBF, various parameters may be determined, such as the number of neurons in a hidden layer, the coordinates of the center of each hidden-layer function, the spread of each function in each dimension, and the weights applied to outputs as they pass to the summation layer. Training may be used by clustering algorithms (such as k-means clustering), by evolutionary approaches, and the like.

In embodiments, a recurrent neural network may have a time-varying, real-valued (more than just zero or one) activation (output). Each connection may have a modifiable real-valued weight. Some of the nodes are called labeled nodes, some output nodes, and other hidden nodes. For supervised learning in discrete time settings, training sequences of real-valued input vectors may become sequences of activations of the input nodes, one input vector at a time. At each time step, each non-input unit may compute its current activation as a nonlinear function of the weighted sum of the activations of all units from which it receives connections. The system can explicitly activate (independent of incoming signals) some output units at certain time steps.

In embodiments, methods and systems described herein that involve an expert system or self-organization capability may use a self-organizing neural network, such as a Kohonen self-organizing neural network, such as for visualization of views of data, such as low-dimensional views of high-dimensional data. The self-organizing neural network may apply competitive learning to a set of input data, such as from one or more sensors or other data inputs from or associated with an industrial machine. In embodiments, the self-organizing neural network may be used to identify structures in data, such as unlabeled data, such as in data sensed from a range of vibration, acoustic, or other analog sensors in an industrial environment, where sources of the data are unknown (such as where vibrations may be coming from any of a range of unknown sources). The self-organizing neural network may organize structures or patterns in the data, such that they can be recognized, analyzed, and labeled, such as identifying structures as corresponding to vibrations induced by the movement of a floor, or acoustic signals created by high frequency rotation of a shaft of a somewhat distant machine.

In embodiments, methods and systems described herein that involve an expert system or self-organization capability may use a recurrent neural network, which may allow for a bi-directional flow of data, such as where connected units (e.g., neurons or nodes) form a directed cycle. Such a network may be used to model or exhibit dynamic temporal behavior, such as those involved in dynamic systems including a wide variety of the industrial machines and devices described throughout this disclosure, such as a power generation machine operating at variable speeds or frequencies in variable conditions with variable inputs, a robotic manufacturing system, a refining system, or the like, where dynamic system behavior involves complex interactions that an operator may desire to understand, predict, control and/or optimize. For example, the recurrent neural network may be used to anticipate the state (such as a maintenance state, a fault state, an operational state, or the like), of an industrial machine, such as one performing a dynamic process or action. In embodiments, the recurrent neural network may use internal memory to process a sequence of inputs, such as from other nodes and/or from sensors and other data inputs from the industrial environment, of the various types described herein. In embodiments, the recurrent neural network may also be used for pattern recognition, such as for recognizing an industrial machine based on a sound signature, a heat signature, a set of feature vectors in an image, a chemical signature, or the like. In a non-limiting example, a recurrent neural network may recognize a shift in an operational mode of a turbine, a generator, a motor, a compressor, or the like (such as a gear shift) by learning to classify the shift from a training data set consisting of a stream of data from tri-axial vibration sensors and/or acoustic sensors applied to one or more of such machines.

In embodiments, methods and systems described herein that involve an expert system or self-organization capability may use a modular neural network, which may comprise a series of independent neural networks (such as ones of various types described herein) that are moderated by an intermediary. Each of the independent neural networks in the modular neural network may work with separate inputs, accomplishing subtasks that make up the task the modular network as a whole is intended to perform. For example, a modular neural network may comprise a recurrent neural network for pattern recognition, such as to recognize what type of industrial machine is being sensed by one or more sensors that are provided as input channels to the modular network and an RBF neural network for optimizing the behavior of the machine once understood. The intermediary may accept inputs of each of the individual neural networks, process them, and create output for the modular neural network, such an appropriate control parameter, a prediction of state, or the like.

Combinations among any of the pairs, triplets, or larger combinations, of the various neural network types described herein, are encompassed by the present disclosure. This may include combinations where an expert system uses one neural network for recognizing a pattern (e.g., a pattern indicating a problem or fault condition) and a different neural network for self-organizing an activity or work flow based on the recognized pattern (such as providing an output governing autonomous control of a system in response to the recognized condition or pattern). This may also include combinations where an expert system uses one neural network for classifying an item (e.g., identifying a machine, a component, or an operational mode) and a different neural network for predicting a state of the item (e.g., a fault state, an operational state, an anticipated state, a maintenance state, or the like). Modular neural networks may also include situations where an expert system uses one neural network for determining a state or context (such as a state of a machine, a process, a work flow, a marketplace, a storage system, a network, a data collector, or the like) and a different neural network for self-organizing a process involving the state or context (e.g., a data storage process, a network coding process, a network selection process, a data marketplace process, a power generation process, a manufacturing process, a refining process, a digging process, a boring process, or other process described herein).

In embodiments, methods and systems described herein that involve an expert system or self-organization capability may use a physical neural network where one or more hardware elements are used to perform or simulate neural behavior. In embodiments, one or more hardware neurons may be configured to stream voltage values that represent analog vibration sensor data voltage values, to calculate velocity information from analog sensor inputs representing acoustic, vibration or other data, to calculation acceleration information from sensor inputs representing acoustic, vibration, or other data, or the like. One or more hardware nodes may be configured to stream output data resulting from the activity of the neural net. Hardware nodes, which may comprise one or more chips, microprocessors, integrated circuits, programmable logic controllers, application-specific integrated circuits, field-programmable gate arrays, or the like, may be provided to optimize the speed, input/output efficiency, energy efficiency, signal to noise ratio, or other parameter of some part of a neural net of any of the types described herein. Hardware nodes may include hardware for acceleration of calculations (such as dedicated processors for performing basic or more sophisticated calculations on input data to provide outputs, dedicated processors for filtering or compressing data, dedicated processors for decompressing data, dedicated processors for compression of specific file or data types (e.g., for handling image data, video streams, acoustic signals, vibration data, thermal images, heat maps, or the like), and the like. A physical neural network may be embodied in a data collector, such as a mobile data collector described herein, including one that may be reconfigured by switching or routing inputs in varying configurations, such as to provide different neural net configurations within the data collector for handling different types of inputs (with the switching and configuration optionally under control of an expert system, which may include a software-based neural net located on the data collector or remotely). A physical, or at least partially physical, neural network may include physical hardware nodes located in a storage system, such as for storing data within an industrial machine or in an industrial environment, such as for accelerating input/output functions to one or more storage elements that supply data to or take data from the neural net. A physical, or at least partially physical, neural network may include physical hardware nodes located in a network, such as for transmitting data within, to or from an industrial environment, such as for accelerating input/output functions to one or more network nodes in the net, accelerating relay functions, or the like. In embodiments, of a physical neural network, an electrically adjustable resistance material may be used for emulating the function of a neural synapse. In embodiments, the physical hardware emulates the neurons, and software emulates the neural network between the neurons. In embodiments, neural networks complement conventional algorithmic computers. They are versatile and can be trained to perform appropriate functions without the need for any instructions, such as classification functions, optimization functions, pattern recognition functions, control functions, selection functions, evolution functions, and others.

In embodiments, methods and systems described herein that involve an expert system or self-organization capability may use a multilayered feed forward neural network, such as for complex pattern classification of one or more items, phenomena, modes, states, or the like. In embodiments, a multilayered feedforward neural network may be trained by an optimization technique, such as a genetic algorithm, such as to explore a large and complex space of options to find an optimum, or near-optimum, global solution. For example, one or more genetic algorithms may be used to train a multilayered feedforward neural network to classify complex phenomena, such as to recognize complex operational modes of industrial machines, such as modes involving complex interactions among machines (including interference effects, resonance effects, and the like), modes involving non-linear phenomena, such as impacts of variable speed shafts, which may make analysis of vibration and other signals difficult, modes involving critical faults, such as where multiple, simultaneous faults occur, making root cause analysis difficult, and others. In embodiments, a multilayered feed forward neural network may be used to classify results from ultrasonic monitoring or acoustic monitoring of an industrial machine, such as monitoring an interior set of components within a housing, such as motor components, pumps, valves, fluid handling components, and many others, such as in refrigeration systems, refining systems, reactor systems, catalytic systems, and others.

In embodiments, methods and systems described herein that involve an expert system or self-organization capability may use a feedforward, back-propagation multi-layer perceptron (MLP) neural network, such as for handling one or more remote sensing applications, such as for taking inputs from sensors distributed throughout various industrial environments. In embodiments, the MLP neural network may be used for classification of physical environments, such as mining environments, exploration environments, drilling environments, and the like, including classification of geological structures (including underground features and above ground features), classification of materials (including fluids, minerals, metals, and the like), and other problems. This may include fuzzy classification.

In embodiments, methods and systems described herein that involve an expert system or self-organization capability may use a structure-adaptive neural network, where the structure of a neural network is adapted, such as based on a rule, a sensed condition, a contextual parameter, or the like. For example, if a neural network does not converge on a solution, such as classifying an item or arriving at a prediction, when acting on a set of inputs after some amount of training, the neural network may be modified, such as from a feedforward neural network to a recurrent neural network, such as by switching data paths between some subset of nodes from unidirectional to bi-directional data paths. The structure adaptation may occur under control of an expert system, such as to trigger adaptation upon occurrence of a trigger, rule or event, such as recognizing occurrence of a threshold (such as an absence of a convergence to a solution within a given amount of time) or recognizing a phenomenon as requiring different or additional structure (such as recognizing that a system is varying dynamically or in a non-linear fashion). In one non-limiting example, an expert system may switch from a simple neural network structure like a feedforward neural network to a more complex neural network structure like a recurrent neural network, a convolutional neural network, or the like upon receiving an indication that a continuously variable transmission is being used to drive a generator, turbine, or the like in a system being analyzed.

In embodiments, methods and systems described herein that involve an expert system or self-organization capability may use an autoencoder, autoassociator or Diabolo neural network, which may be similar to a multilayer perceptron ("MLP") neural network, such as where there may be an input layer, an output layer and one or more hidden layers connecting them. However, the output layer in the auto-encoder may have the same number of units as the input layer, where the purpose of the MLP neural network is to reconstruct its own inputs (rather than just emitting a target value). Therefore, the auto encoders may operate as an unsupervised learning model. An auto encoder may be used, for example, for unsupervised learning of efficient codings, such as for dimensionality reduction, for learning generative models of data, and the like. In embodiments, an auto-encoding neural network may be used to self-learn an efficient network coding for transmission of analog sensor data from an industrial machine over one or more networks. In embodiments, an auto-encoding neural network may be used to self-learn an efficient storage approach for storage of streams of analog sensor data from an industrial environment.

In embodiments, methods and systems described herein that involve an expert system or self-organization capability may use a probabilistic neural network ("PNN"), which, in embodiments, may comprise a multi-layer (e.g., four-layer) feedforward neural network, where layers may include input layers, hidden layers, pattern/summation layers and an output layer. In an embodiment of a PNN algorithm, a parent probability distribution function (PDF) of each class may be approximated, such as by a Parzen window and/or a non-parametric function. Then, using the PDF of each class, the class probability of a new input is estimated, and Bayes' rule may be employed, such as to allocate it to the class with the highest posterior probability. A PNN may embody a Bayesian network and may use a statistical algorithm or analytic technique, such as Kernel Fisher discriminant analysis technique. The PNN may be used for classification and pattern recognition in any of a wide range of embodiments disclosed herein. In one non-limiting example, a probabilistic neural network may be used to predict a fault condition of an engine based on a collection of data inputs from sensors and instruments for the engine.

In embodiments, methods and systems described herein that involve an expert system or self-organization capability may use a time delay neural network (TDNN), which may comprise a feedforward architecture for sequential data that recognizes features independent of sequence position. In embodiments, to account for time shifts in data, delays are added to one or more inputs, or between one or more nodes, so that multiple data points (from distinct points in time) are analyzed together. A time delay neural network may form part of a larger pattern recognition system, such as using a perceptron network. In embodiments, a TDNN may be trained with supervised learning, such as where connection weights are trained with back propagation or under feedback. In embodiments, a TDNN may be used to process sensor data from distinct streams, such as a stream of velocity data, a stream of acceleration data, a stream of temperature data, a stream of pressure data, and the like, where time delays are used to align the data streams in time, such as to help understand patterns that involve understanding of the various streams (e.g., where increases in pressure and acceleration occur as an industrial machine overheats).

In embodiments, methods and systems described herein that involve an expert system or self-organization capability may use a convolutional neural network (referred to in some cases as a CNN, a ConvNet, a shift invariant neural network, or a space invariant neural network), wherein the units are connected in a pattern similar to the visual cortex of the human brain. Neurons may respond to stimuli in a restricted region of space, referred to as a receptive field. Receptive fields may partially overlap, such that they collectively cover the entire (e.g., visual) field. Node responses can be calculated mathematically, such as by a convolution operation, such as using multilayer perceptrons that use minimal preprocessing. A convolutional neural network may be used for recognition within images and video streams, such as for recognizing a type of machine in a large environment using a camera system disposed on a mobile data collector, such as on a drone or mobile robot. In embodiments, a convolutional neural network may be used to provide a recommendation based on data inputs, including sensor inputs and other contextual information, such as recommending a route for a mobile data collector. In embodiments, a convolutional neural network may be used for processing inputs, such as for natural language processing of instructions provided by one or more parties involved in a workflow in an environment. In embodiments, a convolutional neural network may be deployed with a large number of neurons (e.g., 100,000, 500,000 or more), with multiple (e.g., 4, 5, 6 or more) layers, and with many (e.g., millions) parameters. A convolutional neural net may use one or more convolutional nets.

In embodiments, methods and systems described herein that involve an expert system or self-organization capability may use a regulatory feedback network, such as for recognizing emergent phenomena (such as new types of faults not previously understood in an industrial environment).

In embodiments, methods and systems described herein that involve an expert system or self-organization capability may use a self-organizing map ("SOM"), involving unsupervised learning. A set of neurons may learn to map points in an input space to coordinates in an output space. The input space can have different dimensions and topology from the output space, and the SOM may preserve these while mapping phenomena into groups.

In embodiments, methods and systems described herein that involve an expert system or self-organization capability may use a learning vector quantization neural net ("LVQ"). Prototypical representatives of the classes may parameterize, together with an appropriate distance measure, in a distance-based classification scheme.

In embodiments, methods and systems described herein that involve an expert system or self-organization capability may use an echo state network ("ESN"), which may comprise a recurrent neural network with a sparsely connected, random hidden layer. The weights of output neurons may be changed (e.g., the weights may be trained based on feedback). In embodiments, an ESN may be used to handle time series patterns, such as, in an example, recognizing a pattern of events associated with a gear shift in an industrial turbine, generator, or the like.

In embodiments, methods and systems described herein that involve an expert system or self-organization capability may use a bi-directional, recurrent neural network ("BRNN"), such as using a finite sequence of values (e.g., voltage values from a sensor) to predict or label each element of the sequence based on both the past and the future context of the element. This may be done by adding the outputs of two RNNs, such as one processing the sequence from left to right, the other one from right to left. The combined outputs are the predictions of target signals, such as those provided by a teacher or supervisor. A bi-directional RNN may be combined with a long short-term memory RNN.

In embodiments, methods and systems described herein that involve an expert system or self-organization capability may use a hierarchical RNN that connects elements in various ways to decompose hierarchical behavior, such as into useful subprograms. In embodiments, a hierarchical RNN may be used to manage one or more hierarchical templates for data collection in an industrial environment.

In embodiments, methods and systems described herein that involve an expert system or self-organization capability may use a stochastic neural network, which may introduce random variations into the network. Such random variations can be viewed as a form of statistical sampling, such as Monte Carlo sampling.

In embodiments, methods and systems described herein that involve an expert system or self-organization capability may use a genetic scale recurrent neural network. In such embodiments, a RNN (often a LS™) is used where a series is decomposed into a number of scales where every scale informs the primary length between two consecutive points. A first order scale consists of a normal RNN, a second order consists of all points separated by two indices and so on. The Nth order RNN connects the first and last node. The outputs from all the various scales may be treated as a committee of members, and the associated scores may be used genetically for the next iteration.

In embodiments, methods and systems described herein that involve an expert system or self-organization capability may use a committee of machines ("CoM"), comprising a collection of different neural networks that together "vote" on a given example. Because neural networks may suffer from local minima, starting with the same architecture and training, but using randomly different initial weights often gives different results. A CoM tends to stabilize the result.

In embodiments, methods and systems described herein that involve an expert system or self-organization capability may use an associative neural network ("ASNN"), such as involving an extension of committee of machines that combines multiple feed forward neural networks and a k-nearest neighbor technique. It may use the correlation between ensemble responses as a measure of distance amid the analyzed cases for the kNN. This corrects the bias of the neural network ensemble. An associative neural network may have a memory that can coincide with a training set. If new data become available, the network instantly improves its predictive ability and provides data approximation (self-learns) without retraining. Another important feature of ASNN is the possibility to interpret neural network results by analysis of correlations between data cases in the space of models.

In embodiments, methods and systems described herein that involve an expert system or self-organization capability may use an instantaneously trained neural network ("ITNN"), where the weights of the hidden and the output layers are mapped directly from training vector data.

In embodiments, methods and systems described herein that involve an expert system or self-organization capability may use a spiking neural network, which may explicitly consider the timing of inputs. The network input and output may be represented as a series of spikes (such as a delta function or more complex shapes). SNNs can process information in the time domain (e.g., signals that vary over time, such as signals involving dynamic behavior of industrial machines). They are often implemented as recurrent networks.

In embodiments, methods and systems described herein that involve an expert system or self-organization capability may use a dynamic neural network that addresses nonlinear multivariate behavior and includes learning of time-dependent behavior, such as transient phenomena and delay effects. Transients may include behavior of shifting industrial components, such as variable speeds of rotating shafts or other rotating components.

In embodiments, cascade correlation may be used as an architecture and supervised learning algorithm, supplementing adjustment of the weights in a network of fixed topology. Cascade-correlation may begin with a minimal network, then automatically trains and adds new hidden units one by one, creating a multi-layer structure. Once anew hidden unit has been added to the network, its input-side weights may be frozen. This unit then becomes a permanent feature-detector in the network, available for producing outputs or for creating other, more complex feature detectors. The cascade-correlation architecture may learn quickly, determine its own size and topology, and retain the structures it has built even if the training set changes and requires no back-propagation.

In embodiments, methods and systems described herein that involve an expert system or self-organization capability may use a neuro-fuzzy network, such as involving a fuzzy inference system in the body of an artificial neural network. Depending on the type, several layers may simulate the processes involved in a fuzzy inference, such as fuzzification, inference, aggregation and defuzzification. Embedding a fuzzy system in a general structure of a neural net as the benefit of using available training methods to find the parameters of a fuzzy system.

In embodiments, methods and systems described herein that involve an expert system or self-organization capability may use a compositional pattern-producing network ("CPPN"), such as a variation of an associative neural network ("ANN") that differs the set of activation functions and how they are applied. While typical ANNs often contain only sigmoid functions (and sometimes Gaussian functions), CPPNs can include both types of functions and many others. Furthermore, CPPNs may be applied across the entire space of possible inputs, so that they can represent a complete image. Since they are compositions of functions, CPPNs in effect encode images at infinite resolution and can be sampled for a particular display at whatever resolution is optimal.

This type of network can add new patterns without re-training. In embodiments, methods and systems described herein that involve an expert system or self-organization capability may use a one-shot associative memory network, such as by creating a specific memory structure, which assigns each new pattern to an orthogonal plane using adjacently connected hierarchical arrays.

In embodiments, methods and systems described herein that involve an expert system or self-organization capability may use a hierarchical temporal memory ("HTM") neural network, such as involving the structural and algorithmic properties of the neocortex. HTM may use a biomimetic model based on memory-prediction theory. HTM may be used to discover and infer the high-level causes of observed input patterns and sequences.

In embodiments, methods and systems described herein that involve an expert system or self-organization capability may use a holographic associative memory ("HAM") neural network, which may comprise an analog, correlation-based, associative, stimulus-response system. Information may be mapped onto the phase orientation of complex numbers. The memory is effective for associative memory tasks, generalization and pattern recognition with changeable attention.

In embodiments, various embodiments involving network coding may be used to code transmission data among network nodes in neural net, such as where nodes are located in one or more data collectors or machines in an industrial environment.

In embodiments of the present disclosure, a method is provided for configuring role-based digital twins, comprising: receiving, by a processing system having one or more processors, an organizational definition of an enterprise, wherein the organizational definition defines a set of roles within the enterprise; generating, by the processing system, an organizational digital twin of the enterprise based on the organizational definition, wherein the organizational digital twin is a digital representation of an organizational structure of the enterprise; determining, by the processing system, a set of relationships between different roles within the set of roles based on the organizational definition; determining, by the processing system, a set of settings for a role from the set of roles based on the determined set of relationships; linking an identity of a respective individual to the role; determining, by the processing system, a configuration of a presentation layer of a role-based digital twin corresponding to the role based on the settings of the role that is linked to the identity, wherein the configuration of the presentation layer defines a set of states that is depicted in the role-based digital twin associated with the role; determining, by the processing system, a set of data sources that provide data corresponding to the set of states, wherein each data source provides one or more respective types of data; and configuring one or more data structures that is received from the one or more data sources, wherein the one or more data structures are configured to provide data used to populate one or more of the set of states in the role-based digital twin.

In embodiments, an organizational definition may further identify a set of physical assets of the enterprise.

In embodiments, determining a set of relationships may include parsing the organizational definition to identify a reporting structure and one or more business units of the enterprise.

In embodiments, a set of relationships may be inferred from a reporting structure and a business unit.

In embodiments, a set of identities may be linked to a set of roles, wherein each identity corresponds to a respective role from the set of roles.

In embodiments, a role-based digital twin may integrate with an enterprise resource planning system that operates on the organizational digital twin that represents a set of roles in the enterprise, such that changes in an enterprise resource planning system are automatically reflected in the organizational digital twin.

In embodiments, an organizational structure may include hierarchical components, which may be embodied in a graph data structure.

In embodiments, a set of settings for the set of roles may include role-based permission settings.

In embodiments, a role-based permission setting may be based on hierarchical components defined in the organizational definition.

In embodiments, a set of settings for a set of roles may include role-based preference settings.

In embodiments, a role-based preference setting may be configured based on a set of role-specific templates.

In embodiments, a set of templates may include at least one of a CEO template, a COO template, a CFO template, a counsel template, a board member template, a CTO template, a chief marketing officer template, an information technology manager template, a chief information officer template, a chief data officer template, an investor template, a customer template, a vendor template, a supplier template, an engineering manager template, a project manager template, an operations manager template, a sales manager template, a salesperson template, a service manager template, a maintenance operator template, and a business development template.

In embodiments, a set of settings for the set of roles may include role-based taxonomy settings.

In embodiments, a taxonomy setting may identify a taxonomy that is used to characterize data that is presented in a role-based digital twin, such that the data is presented in a taxonomy that is linked to the role corresponding to the role-based digital twin.

In embodiments, a set of taxonomies includes at least one of a CEO taxonomy, a COO taxonomy, a CFO taxonomy, a counsel taxonomy, a board member taxonomy, a CTO taxonomy, a chief marketing officer taxonomy, an information technology manager taxonomy, a chief information officer taxonomy, a chief data officer taxonomy, an investor taxonomy, a customer taxonomy, a vendor taxonomy, a supplier taxonomy, an engineering manager taxonomy, a project manager taxonomy, an operations manager taxonomy, a sales manager taxonomy, a salesperson taxonomy, a service manager taxonomy, a maintenance operator taxonomy, and a business development taxonomy.

In embodiments, at least one role of the set of roles may be selected from among a CEO role, a COO role, a CFO role, a counsel role, a board member role, a CTO role, an information technology manager role, a chief information officer role, a chief data officer role, a human resources manager role, an investor role, an engineering manager role, an accountant role, an auditor role, a resource planning role, a public relations manager role, a project manager role, an operations manager role, a research and development role, an engineer role, including but not limited to mechanical engineer, electrical engineer, semiconductor engineer, chemical engineer, computer science engineer, data science engineer, network engineer, or some other type of engineer, and a business development role.

In embodiments, at least one role may be selected from among a factory manager role, a factory operations role, a factory worker role, a power plant manager role, a power plant operations role, a power plant worker role, an equipment service role, and an equipment maintenance operator role.

In embodiments, at least one role may be selected from among a market maker role, a market analyst role, an exchange manager role, a broker-dealer role, a trading role, a reconciliation role, a contract counterparty role, an exchange rate setting role, a market orchestration role, a market configuration role, and a contract configuration role.

In embodiments, at least one role may be selected from among a chief marketing officer role, a product development role, a supply chain manager role, a product design role, a marketing analyst role, a product manager role, a competitive analyst role, a customer service representative role, a procurement operator, an inbound logistics operator, an outbound logistics operator, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments of the present disclosure, a method is provided for training an expert agent, comprising; receiving digital twin data from a set of data sources, the digital twin data including: sensor data that is received from a set of sensors that monitor a set of monitored physical entities associated with the enterprise, the sensor data transported by a set of network entities; enterprise data streams generated by a set of enterprise assets, wherein the enterprise assets include at least one of physical entities associated with the enterprise and digital entities associated with the enterprise; structuring the digital twin data into a set of digital twin data structures that are configured to serve a plurality of different role-based digital twins; receiving a request for a role-based digital twin from a client application, wherein the role-based digital twin is configured with respect to a defined role within the enterprise; determining a subset of the structured digital twin data to corresponds to a set of states that are depicted in the role-based digital twin; providing the subset of the structured digital twin data to the client application; receiving expert agent training data sets from the client application, each expert agent training data set indicating a respective action taken by a user using the client application and one or more features that correspond to the respective action; and training an expert agent on behalf of the user based on the expert agent training data sets, wherein the expert agent is configured to determine actions to be performed on behalf of the user, wherein the determined actions are either recommended to the user or automatically performed on behalf of the user.

In embodiments, a defined role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, a defined role may be selected from among a factory manager role, a factory operations role, a factory worker role, a power plant manager role, a power plant operations role, a power plant worker role, an equipment service role, and an equipment maintenance operator role.

In embodiments, a defined role may be selected from among a market maker role, an exchange manager role, a broker-dealer role, a trading role, a reconciliation role, a contract counterparty role, an exchange rate setting role, a market orchestration role, a market configuration role, and a contract configuration role.

In embodiments, a defined role may be selected from among a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments, an expert agent training data may include interactions training data that indicates a set of interactions with a set of experts by the user during performance of the role.

In embodiments, a set of interactions used to train the expert agent may include interactions of the user with the physical entities, interactions of the user with the role-based digital twin, interactions of the user with the sensor data as depicted in the role-based digital twin, interactions of the experts with the data streams generated by the physical entities, interactions of the experts with one or more computational entities, interactions of the user with one or more network entities, or some other type of interaction.

In embodiments, an expert agent may be trained to determine an action selected from the group comprising: selection of a tool, selection of a task, selection of a dimension, setting of a parameter, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource.

In embodiments, an executive may be trained on a training set of outcomes resulting from the actions taken by the executive.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an expert agent may be trained to perform an action selected from among determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware.

In embodiments, an expert agent is at least one of trained and configured via feedback from at least one expert in the defined role regarding a set of outputs of expert agent.

In embodiments, a set of outputs of the expert agent upon which the expert provides feedback may include at least one of a recommendation, a classification, a prediction, a control instruction, an input selection, a protocol selection, a communication, an alert, a target selection for a communication, a data storage selection, a computational selection, a configuration, an event detection, and a forecast.

In embodiments, feedback of the at least one expert may be solicited to train the expert agent to replicate the expertise of the expert in the role.

In embodiments, a feedback of the at least one expert may be used to modify the set of inputs to the expert agent and/or used to identify and characterize at least one error by the expert agent.

In embodiments, a report on a set of errors may be provided to a user of the expert agent to enable reconfiguring of the expert agent based on the feedback from the expert.

In embodiments, reconfiguring the artificial intelligence system may include at least one of removing an input that is the source of the error, reconfiguring a set of nodes of the artificial intelligence system, reconfiguring a set of weights of the artificial intelligence system, reconfiguring a set of outputs of the artificial intelligence system, reconfiguring a processing flow within the artificial intelligence system, and augmenting the set of inputs to the artificial intelligence system.

In embodiments, an expert agent may be trained learn upon a training set of outcomes and to provide at least one of training and guidance to an individual who is responsible for performing the defined role.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments of the present disclosure, a method is provided taking an information technology architecture that supports a digital twin of a set of physical and digital entities, the architecture including: a set of sensors that provide sensor data about the set of physical entities; a set of data streams generated by at least a subset of the set of physical and digital entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; and integrating an artificial intelligence system with the information technology architecture, wherein the artificial intelligence system is configured to operate as a double of an expert worker for a defined role of the enterprise.

In embodiments, an artificial intelligence system may be trained upon a training set of data that includes a set of interactions by a specific expert worker during performance of the defined role.

In embodiments, a set of interactions may be used to train the artificial intelligence system may include interactions of the expert with the physical entities, wherein the set of interactions used to train the artificial intelligence system includes interactions of the expert with the digital twin.

In embodiments, a set of interactions used to train the artificial intelligence system may include interactions of the expert with the sensor data, wherein the set of interactions used to train the artificial intelligence system includes interactions of the expert with the data streams generated by the physical entities.

In embodiments, a set of interactions used to train the artificial intelligence system may include interactions of the expert with the computational entities, wherein the set of interactions used to train the artificial intelligence system may include interactions of the expert with the network entities.

In embodiments, a set of interactions may be parsed to identify a chain of reasoning of the expert worker upon a set of information and the chain of reasoning is embodied in the configuration of the artificial intelligence system.

In embodiments, an artificial intelligence system may be trained based on the set interactions to determine an action selected from: selection of a tool, selection of a task, selection of a dimension, setting of a parameter, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource.

In embodiments, a chain of reasoning may be parsed to identify a type of reasoning of the expert worker and the type of reasoning is used as a basis for configuration of the artificial intelligence system.

In embodiments, a chain of reasoning may be a deductive chain of reasoning from a set of data.

In embodiments, a chain of reasoning may be an inductive chain of reasoning, a classification chain of reasoning, a predictive chain of reasoning, an iterative chain of reasoning, a trial-and-error chain of reasoning, a Bayesian chain of reasoning, a scientific method chain of reasoning, or some other reasoning method or system.

In embodiments, an artificial intelligence system may be trained on a training set to perform an action selected from among determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware.

In embodiments, a training set of interactions may be parsed to identify a type of processing of the expert worker upon a set of information and the type of processing is embodied in the configuration of the artificial intelligence system.

In embodiments, a type of processing may use visual processing of the expert worker and the artificial intelligence system is configured to operate on image or video information.

In embodiments, a type of processing may use audio processing of the expert worker and the artificial intelligence system may be configured to operate on audio information.

In embodiments, a type of processing may use touch processing of the expert worker and the artificial intelligence system may be configured to operate on physical sensor information.

In embodiments, a type of processing may use olfactory processing of the expert worker and the artificial intelligence system may be configured to operate on chemical sensing information.

In embodiments, a type of processing may use textual information processing of the expert worker and the artificial intelligence system may be configured to operate on text information.

In embodiments, a type of processing may use motion processing of the expert worker and the artificial intelligence system may be configured to operate on motion information.

In embodiments, a type of processing may use taste processing of the expert worker and the artificial intelligence system may be configured to operate on chemical information.

In embodiments, a type of processing may use mathematical processing of the expert worker and the artificial intelligence system may be configured to operate mathematically on available data.

In embodiments, a type of processing may use executive manager processing of the expert worker and the artificial intelligence system may be configured to provide executive decision support.

In embodiments, a type of processing may use creative processing of the expert worker and the artificial intelligence system may be configured to provide a set of alternative options.

In embodiments, a type of processing may use analytic processing of the expert worker to select among a set of available choices and the artificial intelligence system may be configured to provide a recommendation among a set of choices.

In embodiments, an artificial intelligence system may be trained on a training set of outcomes.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be at least one of trained and configured via feedback from the specific expert worker regarding a set of outputs of the artificial intelligence system.

In embodiments, a set of outputs of the artificial intelligence system upon which the expert provides feedback may include at least one of a recommendation, a classification, a prediction, a control instruction, an input selection, a protocol selection, a communication, an alert, a target selection for a communication, a data storage selection, a computational selection, a configuration, an event detection, and a forecast.

In embodiments, a feedback of the expert may be solicited to train the artificial intelligence system to replicate the expertise of the expert in the role, used to modify the set of inputs to the artificial intelligence system, and or used to identify and characterize at least one error by the artificial intelligence system.

In embodiments, a report on a set of errors may be provided to a manager associated with the artificial intelligence system to enable reconfiguring of the artificial intelligence system based on the feedback from the expert.

In embodiments, reconfiguring the artificial intelligence system may include at least one of removing an input that is the source of the error, reconfiguring a set of nodes of the artificial intelligence system, reconfiguring a set of weights of the artificial intelligence system, reconfiguring a set of outputs of the artificial intelligence system, reconfiguring a processing flow within the artificial intelligence system, and augmenting the set of inputs to the artificial intelligence system.

In embodiments, an artificial intelligence system may be configured to provide at least one of training and guidance to another worker to enable the other worker to perform the defined role.

In embodiments, an artificial intelligence system may learn on a training set of outcomes to enhance the training and guidance.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be configured to provide at least one of training and guidance to another worker to enable the other worker to perform the defined role.

In embodiments, an artificial intelligence system may learn on a training set of outcomes to enhance the training and guidance.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be configured to provide at least one of training and guidance to the expert worker to enable the expert worker to perform the defined role.

In embodiments, an artificial intelligence system may learn on a training set of outcomes to enhance the training and guidance.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, outcomes may be compared between a set of actions of the expert worker and a set of outputs of the artificial intelligence system.

In embodiments, a comparison may be used to train the expert worker.

In embodiments, a comparison may be used to improve the artificial intelligence system.

In embodiments, a defined role of the expert worker may be selected from among a CEO role, a COO role, a CFO role, a counsel role, a board member role, a CTO role, a chief marketing officer role, an information technology manager role, a chief information officer role, a chief data officer role, an investor role, a customer role, a vendor role, a supplier role, an engineering manager role, a project manager role, an operations manager role, a sales manager role, a salesperson role, a service manager role, a maintenance operator role, and a business development role.

In embodiments, computational entities and the network entities may be integrated as a converged computational and network entity.

In embodiments of the present disclosure, a method is provided for maintaining an information technology architecture that supports a digital twin of a set of physical entities, the architecture including: a set of sensors that provide sensor data about the set of physical entities; a set of data streams generated by at least a subset of the set of physical entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; and integrating an artificial intelligence system with the information technology architecture, wherein the artificial intelligence system is configured to operate as a double of an expert worker for a defined role of the enterprise and wherein an electronic account associated with the expert worker is awarded with a benefit for training the artificial intelligence system.

In embodiments, a benefit may be a reward based on the outcomes of the use of the artificial intelligence system, a reward based on the productivity of the artificial intelligence system and/or a reward based on a measure of the expertise of the artificial intelligence system.

In embodiments, a benefit may be a share of revenue or profit generated by the work of the artificial intelligence system and/or a reward that is tracked via a distributed ledger on a blockchain that captures information associated with a set of actions and events involving the artificial intelligence system.

In embodiments, a reward may be administered via a smart contract operating on the blockchain.

In embodiments, an artificial intelligence system may be trained upon a training set of data that includes a set of interactions by a specific expert worker during performance of the defined role.

In embodiments, a set of interactions may be used to train the artificial intelligence system includes interactions of the expert with the physical entities, used to train the artificial intelligence system includes interactions of the expert with the digital twin and/or used to train the artificial intelligence system includes interactions of the expert with the sensor data.

In embodiments, a set of interactions used to train the artificial intelligence system may include interactions of the expert with the data streams generated by the physical entities, interactions of the expert with the computational entities, and/or interactions of the expert with the network entities.

In embodiments, an artificial intelligence system may be trained based on the interactions to determine an action selected from: selection of a tool, selection of a task, selection of a dimension, setting of a parameter, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource.

In embodiments, a training set of interactions may be parsed to identify a chain of reasoning of the expert worker upon a set of information and the chain of reasoning is embodied in the configuration of the artificial intelligence system.

In embodiments, a chain of reasoning may be parsed to identify a type of reasoning of the expert worker and the type of reasoning is used as a basis for configuration of the artificial intelligence system.

In embodiments, a chain of reasoning may be a deductive chain of reasoning from a set of data.

In embodiments, an artificial intelligence system may be trained to perform an action selected from: determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware.

In embodiments of the present disclosure, a method is provided for taking an information technology architecture that supports a digital twin of a set of physical entities, the architecture including: a set of sensors that provide sensor data about the set of physical entities; a set of data streams generated by at least a subset of the set of physical entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; and integrating an artificial intelligence system with the information technology architecture, wherein the artificial intelligence system is configured to operate as a double of a defined workforce involving a defined set of roles of the enterprise.

In embodiments, an artificial intelligence system may be trained upon a training set of data that includes a set of interactions by members of the defined workforce during performance of the defined set of roles.

In embodiments, a set of interactions used to train the artificial intelligence system may include interactions of the workforce with the physical entities, interactions of the workforce with the digital twin, interactions of the workforce with the sensor data, interactions of the workforce with the data streams generated by the physical entities, interactions of the workforce with the computational entities, and/or interactions of the workforce with the network entities.

In embodiments, a training set of interactions may be parsed to identify a chain of operations of the workforce upon a set of information and the chain of reasoning may be embodied in the configuration of the artificial intelligence system.

In embodiments, a training set of interactions may be parsed to identify a type of processing of the workforce upon a set of information and the type of processing may be embodied in the configuration of the artificial intelligence system.

In embodiments, an artificial intelligence system may be trained based on the interactions to determine an action selected from: selection of a tool, selection of a task, selection of a dimension, setting of a parameter, selection of an object, selection of a workflow, triggering of a workflow, ordering of a process, ordering of a workflow, cessation of a workflow, selection of a data set, selection of a design choice, creation of a set of design choices, identification of a failure mode, identification of a fault, identification of an operating mode, identification of a problem, selection of a human resource, selection of a workforce resource, providing an instruction to a human resource, and providing an instruction to a workforce resource.

In embodiments, an artificial intelligence system may be trained on a training set of outcomes.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be at least one of trained and configured via feedback from members of the workforce regarding a set of outputs of the artificial intelligence system.

In embodiments, a set of outputs of the artificial intelligence system upon which the workforce members provide feedback may include at least one of a recommendation, a classification, a prediction, a control instruction, an input selection, a protocol selection, a communication, an alert, a target selection for a communication, a data storage selection, a computational selection, a configuration, an event detection, and a forecast.

In embodiments, a feedback of the workforce members may be solicited to train the artificial intelligence system to replicate the operation of the workforce in the defined set of roles.

In embodiments, a feedback of the workforce members may be used to modify the set of inputs to the artificial intelligence system.

In embodiments, a feedback of the workforce members may be used to identify and characterize at least one error by the artificial intelligence system.

In embodiments, a report on a set of errors may be provided to a manager of the artificial intelligence system to enable reconfiguring of the artificial intelligence system based on the feedback.

In embodiments, reconfiguring the artificial intelligence system may include at least one of removing an input that is the source of the error, reconfiguring a set of nodes of the artificial intelligence system, reconfiguring a set of weights of the artificial intelligence system, reconfiguring a set of outputs of the artificial intelligence system, reconfiguring a processing flow within the artificial intelligence system, and augmenting the set of inputs to the artificial intelligence system.

In embodiments, an artificial intelligence system may be configured to provide at least one of training and guidance to enable the other worker to perform a role within the defined set of roles of the workforce.

In embodiments, an artificial intelligence system may learn on a training set of outcomes to enhance the training and guidance.

In embodiments, a training set of outcomes may include data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome.

In embodiments, an artificial intelligence system may be trained to perform an action selected from among determining an architecture for a system, reporting on a status, reporting on an event, reporting on a context, reporting on a condition, determining a model, configuring a model, populating a model, designing a system, designing a process, designing an apparatus, engineering a system, engineering a device, engineering a process, engineering a product, maintaining a system, maintaining a device, maintaining a process, maintaining a network, maintaining a computational resource, maintaining equipment, maintaining hardware, repairing a system, repairing a device, repairing a process, repairing a network, repairing a computational resource, repairing equipment, repairing hardware, assembling a system, assembling a device, assembling a process, assembling a network, assembling a computational resource, assembling equipment, assembling hardware, setting a price, physically securing a system, physically securing a device, physically securing a process, physically securing a network, physically securing a computational resource, physically securing equipment, physically securing hardware, cyber-securing a system, cyber-securing a device, cyber-securing a process, cyber-securing a network, cyber-securing a computational resource, cyber-securing equipment, cyber-securing hardware, detecting a threat, detecting a fault, tuning a system, tuning a device, tuning a process, tuning a network, tuning a computational resource, tuning equipment, tuning hardware, optimizing a system, optimizing a device, optimizing a process, optimizing a network, optimizing a computational resource, optimizing equipment, optimizing hardware, monitoring a system, monitoring a device, monitoring a process, monitoring a network, monitoring a computational resource, monitoring equipment, monitoring hardware, configuring a system, configuring a device, configuring a process, configuring a network, configuring a computational resource, configuring equipment, and configuring hardware.

In embodiments, an artificial intelligence system may be configured to provide at least one of training and guidance to the workforce to enable the workforce to perform the defined role.

In embodiments, an artificial intelligence system may learn on a training set of outcomes to enhance the training and guidance.

In embodiments, a training set of outcomes may include. data relating to at least one of a financial outcome, an operational outcome, a fault outcome, a success outcome, a performance indicator outcome, an output outcome, a consumption outcome, an energy utilization outcome, a resource utilization outcome, a cost outcome, a profit outcome, a revenue outcome, a sales outcome, and a production outcome In embodiments, outcomes may be compared between a set of actions of the workforce and a set of outputs of the artificial intelligence system, wherein the comparison is used to train the workforce and/or is used to improve the artificial intelligence system.

In embodiments, at least one role within the set of roles of the workforce may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, a workforce may be a factory operations workforce, a plant operations workforce, a resource extraction operations workforce, a network operations workforce responsible for operating a network for an industrial production environment, a supply chain management workforce, a demand planning workforce, a logistics planning workforce, a vendor management workforce, or some other kind of workforce.

In embodiments, a workforce may be a brokering workforce for a marketplace, a trading workforce for a marketplace, a trade reconciliation workforce for a marketplace, a transactional execution workforce for a marketplace, or some other kind of workforce.

In embodiments, computational entities and the network entities may be integrated as a converged computational and network entity.

In embodiments of the present disclosure, a method is provided for configuring a digital twin of a workforce, comprising: representing an enterprise organizational structure in a digital twin of an enterprise; parsing the structure to infer relationships among a set of roles within the organizational structure, the relationships and the roles defining a workforce of the enterprise; and configuring the presentation layer of a digital twin to represent the enterprise as a set of workforces having a set of attributes and relationships.

In embodiments, a digital twin may integrate with an enterprise resource planning system that operates on a data structure representing a set of roles in the enterprise, such that changes in the enterprise resource planning system are automatically reflected in the digital twin.

In embodiments, an organizational structure may include hierarchical components.

In embodiments, hierarchical components may be embodied in a graph data structure.

In embodiments, a workforce may be a factory operations workforce, a plant operations workforce, a resource extraction operations workforce, or some other type of workforce.

In embodiments, a workforce may be a network operations workforce responsible for operating a network for an industrial production environment, wherein the workforce is a supply chain management workforce, a demand planning workforce, a logistics planning workforce, a vendor management workforce, a brokering workforce for a marketplace, a trading workforce for a marketplace, a trade reconciliation workforce for a marketplace, a transactional execution workforce for a marketplace, or some other type of workforce.

In embodiments, at least one workforce role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, at least one workforce role may be selected from among a factory manager role, a factory operations role, a factory worker role, a power plant manager role, a power plant operations role, a power plant worker role, an equipment service role, and an equipment maintenance operator role.

In embodiments, at least one workforce role may be selected from among a market maker role, an exchange manager role, a broker-dealer role, a trading role, a reconciliation role, a contract counterparty role, an exchange rate setting role, a market orchestration role, a market configuration role, and a contract configuration role.

In embodiments, at least one workforce role may be selected from among a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments, a digital twin may represent a recommendation for training for the workforce, a recommendation for augmentation of the workforce, a recommendation for configuration of a set of operations involving the workforce, a recommendation for configuration of the workforce, or some other kind of recommendation.

In embodiments of the present disclosure, a method is provided for providing a digital twin of a workforce, comprising: maintaining an information technology architecture that supports a digital twin of a set of physical and digital entities, the architecture including: a set of sensors that provide sensor data about the set of physical entities; a set of data streams generated by at least a subset of the set of physical and digital entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; representing an enterprise organizational structure in a digital twin of an enterprise; parsing the structure to infer relationships among a set of roles within the organizational structure, the relationships and the roles defining a workforce of the enterprise; integrating an artificial intelligence system with the information technology architecture, wherein the artificial intelligence system is configured to operate as a double of a set of workers for a set of defined roles of the enterprise and configuring the presentation layer of a digital twin to represent the enterprise as a set of workforces having a set of attributes and relationships, wherein the attributes and relationships include human worker attributes and relationships and artificial intelligence double attributes and relationships.

In embodiments, a digital twin may integrate with an enterprise resource planning system that operates on a data structure representing a set of roles in the enterprise, such that changes in the enterprise resource planning system are automatically reflected in the digital twin.

In embodiments, an organizational structure may include hierarchical components.

In embodiments, hierarchical components may be embodied in a graph data structure.

In embodiments, a workforce may be a factory operations workforce, a plant operations workforce, a resource extraction operations workforce, a network operations workforce responsible for operating a network for an industrial production environment, a supply chain management workforce, a demand planning workforce, a logistics planning workforce, a vendor management workforce, a brokering workforce, a trading workforce, a trade reconciliation workforce, a transactional execution workforce, or some other type of workforce.

In embodiments, at least one workforce role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, at least one workforce role may be selected from among a factory manager role, a factory operations role, a factory worker role, a power plant manager role, a power plant operations role, a power plant worker role, an equipment service role, and an equipment maintenance operator role.

In embodiments, at least one workforce role may be selected from among a market maker role, an exchange manager role, a broker-dealer role, a trading role, a reconciliation role, a contract counterparty role, an exchange rate setting role, a market orchestration role, a market configuration role, and a contract configuration role.

In embodiments, at least one workforce role may be selected from among a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments, a digital twin may represent a recommendation for training for the workforce, a recommendation for augmentation of the workforce, a recommendation for configuration of a set of operations involving the workforce, a recommendation for configuration of the workforce, a set of capacities and competencies of a set of workers and a set of doubles, and/or a set of mixed workgroups of human workers and artificial intelligence doubles.

In embodiments of the present disclosure, a method is provided for serving digital twins comprising: receiving, by a processing system of a digital twin system, a request for a digital twin from a user device of a user associated with an enterprise, the enterprise deploying a sensor system to monitor one or more facilities of the enterprise; determining, by the processing system, a workforce role of the user with respect to the enterprise; generating, by the processing system, a role-based digital twin corresponding to the workforce role of the user based on a perspective view corresponding to the workforce role of the user, wherein the role-based digital twin depicts one or more states and/or entities that are related to the enterprise; providing, by the processing system, the role-based digital twin to the user device, wherein providing the role-based digital twin: identifying, by the processing system, a set of data types that are used to populate the at least one of the states and/or entities of the role-based digital twin, wherein the set of data types include one or more sensor data feeds that are received from the sensor system deployed by the enterprise; and connecting, by the processing system, the one or more sensor data streams to the role-based digital twin.

In embodiments, generating a role-based digital twin may include determining the perspective view corresponding to the workforce role of the user based on the workforce role of the user and a set of data types that are relevant to the workforce role of the user.

In embodiments, determining the perspective view corresponding to the workforce role of the user may include determining an appropriate granularity level for each of the data types.

In embodiments, an appropriate granularity level for at least one of the data types may be defined in a default configuration corresponding to the workforce role.

In embodiments, an appropriate granularity level for at least one of the data types may be determined based on previous interactions of the user with the role-based digital twin.

In embodiments, a sensor system may include an edge device that receives sensor data from a set of sensors within the sensor system and generates the sensor data stream that is provided to the digital twin system via a network.

In embodiments, an edge device may receive sensor data from the set of sensors and selectively compresses the sensor data based on values indicated in the sensor data to obtain the sensor data stream.

In embodiments, connecting the one or more sensor streams may include: receiving the sensor data stream from the edge device; and routing the sensor data stream to the user device that is presenting the role-based digital twin to the user.

In embodiments, connecting the one or more sensor streams may include: receiving the sensor data stream from the edge device; analyzing the sensor data stream to identify one or more fault conditions corresponding to an object being monitored by the sensor system; and routing an indicator of the fault condition to the user device that is presenting the role-based digital twin to the user.

In embodiments, connecting the one or more sensor streams may include: receiving the sensor data stream from the edge device; analyzing the sensor data stream to identify a recommendation corresponding to the workforce role of the user; and routing an indicator of the recommendation to the user device that is presenting the role-based digital twin to the user.

In embodiments, connecting the one or more sensor streams may include: receiving the sensor data stream from the edge device; analyzing the sensor data stream to identify a recommendation corresponding to the workforce role of the user; and routing an indicator of the recommendation to the user device that is presenting the role-based digital twin to the user.

In embodiments, a workforce may be a factory operations workforce, a plant operations workforce, a resource extraction operations workforce, a network operations workforce responsible for operating a network for an industrial production environment, a supply chain management workforce, a demand planning workforce, a logistics planning workforce, a vendor management workforce, or some other type of workforce.

In embodiments, at least one workforce role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, at least one workforce role may be selected from among a factory manager role, a factory operations role, a factory worker role, a power plant manager role, a power plant operations role, a power plant worker role, an equipment service role, and an equipment maintenance operator role.

In embodiments, at least one workforce role may be selected from among a market maker role, an exchange manager role, a broker-dealer role, a trading role, a reconciliation role, a contract counterparty role, an exchange rate setting role, a market orchestration role, a market configuration role, and a contract configuration role.

In embodiments, at least one workforce role may be selected from among a chief marketing officer role, a product development role, a supply chain manager role, a customer role, a supplier role, a vendor role, a demand management role, a marketing manager role, a sales manager role, a service manager role, a demand forecasting role, a retail manager role, a warehouse manager role, a salesperson role, and a distribution center manager role.

In embodiments of the present disclosure, a method is provided for providing a digital twin of a workforce, comprising: maintaining an information technology architecture that supports a digital twin of a set of physical and digital entities, the architecture including: a set of sensors that provide sensor data about the set of physical entities; a set of data streams generated by at least a subset of the set of physical and digital entities; a set of computational entities for processing data and a set of network entities for transporting data that is derived from the set of sensors and the set of data streams; a set of data processing systems for extracting, transforming and loading the data that is transported by the network entities into a set of resources that are sources for the digital twin; representing an enterprise organizational structure in a digital twin of an enterprise; parsing the structure to infer relationships among a set of roles within the organizational structure, the relationships and the roles defining a workforce of the enterprise; determining a set of parameters with which the digital twin is configured based on the inferred set of relationships; and configuring the presentation layer of a digital twin based on the set of parameters.

Software and Networking Capabilities

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platforms. A processor may be any kind of computational or processing device capable of executing program instructions, codes, binary instructions and the like, including a central processing unit (CPU), a general processing unit (GPU), a logic board, a chip (e.g., a graphics chip, a video processing chip, a data compression chip, or the like), a chipset, a controller, a system-on-chip (e.g., an RF system on chip, an AI system on chip, a video processing system on chip, an organ-on-chip, a quantum algorithm system on chip, or others), an integrated circuit, an application specific integrated circuit (ASIC), a field programmable gate array (FPGA), a complex programmable logic device (CPLD), an approximate computing processor, a quantum computing processor, a parallel computing processor, a neural network processor, or other type of processor. The processor may be or may include a signal processor, digital processor, data processor, embedded processor, microprocessor or any variant such as a co-processor (math co-processor, graphic co-processor, communication co-processor, video co-processor, AI co-processor, and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more threads. The thread may spawn other threads that may have assigned priorities associated with them; the processor may execute these threads based on priority or any other order based on instructions provided in the program code. The processor, or any machine utilizing one, may include non-transitory memory that stores methods, codes, instructions and programs as described herein and elsewhere. The processor may access a non-transitory storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache, network-attached storage, server-based storage, and the like.

A processor may include one or more cores that may enhance speed and performance of a multiprocessor. In embodiments, the process may be a dual core processor, quad core processors, other chip-level multiprocessor and the like that combine two or more independent cores (sometimes called a die).

The methods and systems described herein may be deployed in part or in whole through a machine that executes computer software on a server, client, firewall, gateway, hub, router, switch, infrastructure-as-a-service, platform-as-a-service, or other such computer and/or networking hardware or system. The software may be associated with a server that may include a file server, print server, domain server, internet server, intranet server, cloud server, infrastructure-as-a-service server, platform-as-a-service server, web server, and other variants such as secondary server, host server, distributed server, failover server, backup server, server farm, and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of programs across the network. The networking of some or all of these devices may facilitate parallel processing of a program or method at one or more locations without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for the execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of programs across the network. The networking of some or all of these devices may facilitate parallel processing of a program or method at one or more locations without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service (SaaS), platform as a service (PaaS), and/or infrastructure as a service (IaaS).

The methods, program codes, and instructions described herein and elsewhere may be implemented on a cellular network with multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, 4G, 5G, LTE, EVDO, mesh, or other network types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic book readers, music players and the like. These devices may include, apart from other components, a storage medium such as flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g., USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, network-attached storage, network storage, NVME-accessible storage, PCIE connected storage, distributed storage, and the like.

The methods and systems described herein may transform physical and/or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable code using a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices, artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable devices, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions. Computer software may employ virtualization, virtual machines, containers, dock facilities, portainers, and other capabilities.

In embodiments, a value chain system that controls one or more processes to mitigate waste comprising: a machine learning system that trains machine-learned models that output waste mitigation decisions based on training data sets that each respectively defines one or more features of a respective process and an outcome relating to an amount of a type of waste generated by the respective process; an artificial intelligence system that receives a request for a waste mitigation decision and determines the waste mitigation decision based on one or more of the machine-learned models and the request; and a digital twin system that generates a digital twin of a process that incorporates the waste mitigation decision and executes a simulation based on the digital twin. In embodiments, the digital twin system outputs a graphical representation of the digital twin to a display, whereby a user views the simulation via the display.

In embodiments, the digital twin system outputs a graphical representation of the digital twin in a graphical user interface, whereby a user edits the process via the graphical user interface.

In embodiments, the digital twin system outputs a simulation outcome of the simulation to the machine learning system and the machine learning system reinforces the one or more machine learned models based on the simulation outcome. In embodiments, the request received by the artificial intelligence system includes one or more process features of the process. In embodiments, the process features include one or more of: a type of object being the physical objects, dimensions of the physical objects, masses of the physical objects, and shipping methods of the physical objects. In embodiments, a waste mitigation system adjusts the process in accordance with the waste mitigation decision and provides outcome data relating to the waste mitigation decision to the machine learning system, and the machine learning system reinforces the one or more models that provided the waste mitigation decision based on the outcome data. In embodiments, a value chain system that controls one or more processes to mitigate wastewater resulting from the one or more processes comprising: a machine learning system that trains machine-learned models that output wastewater mitigation decisions based on training data sets that each respectively defines one or more features of a respective process that generates wastewater and an outcome relating to an amount of wastewater generated by the respective process; an artificial intelligence system that receives a request for a wastewater mitigation decision and determines the wastewater mitigation decision based on one or more of the machine-learned models and the request; and a digital twin system that generates a digital twin of a process that incorporates the wastewater mitigation decision and executes a simulation based on the digital twin.

In embodiments, an information technology system having a management platform with a user interface that provides a set of adaptive intelligence systems that provide coordinated intelligence for a set of demand management applications and a set of supply chain applications for a category of goods.

In embodiments, coordinated intelligence comprises artificial intelligence capabilities.

In embodiments, the artificial intelligence system facilitates coordinated intelligence for the set of demand management applications or the set of supply chain applications, or both for a category of goods by processing data that is available in any of a plurality of data sources including processes, bill of materials, weather, traffic, design specification, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System.

In embodiments the set of adaptive intelligence systems provide user access to artificial intelligence applications for coordinating intelligence for the sets of applications. In embodiments, the user interface presents a set of artificial intelligence systems responsive to the category of goods. In embodiments, the user interface facilitates configuring the set of adaptive intelligence systems with at least one artificial intelligence system.

In embodiments, the at least one artificial intelligence system is a hybrid artificial intelligence system. In embodiments, the at least one artificial intelligence system comprises a hybrid neural network.

In embodiments, the set of adaptive intelligence systems provides a set of capabilities that facilitate development and deployment of intelligence for at least one function selected from a list of functions consisting of supply chain application automation, demand management application automation, machine learning, artificial intelligence, intelligent transactions, intelligent operations, remote control, analytics, monitoring, reporting, state management, event management, and process management. In embodiments, coordinated intelligence comprises artificial intelligence capabilities that operate on or responsive to data collected by or produced by other systems of an adaptive intelligence systems layer. In embodiments, the coordinated intelligence comprises artificial intelligence capabilities that provide coordinated intelligence for a specific operator and/or enterprise that participates in the supply chain for the category of goods. In embodiments, the coordinated intelligence includes a portion of a set of artificial intelligence systems that employs a neural network that processes at least one of demand management application outputs and supply chain application outputs to provide the coordinated intelligence.

In embodiments, the coordinated intelligence is configured through the user interface for at least two demand management applications selected from the list consisting of a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service. In embodiments, coordinated intelligence is configured through the user interface for at least two supply chain applications selected from the list consisting of a goods timing management application, a goods quantity management application, a logistics management application, a shipping application, a delivery application, an order for goods management application, and an order for components management application.

In embodiments, an information technology system having a management platform with a user interface that provides a set of adaptive intelligence systems that provide coordinated intelligence comprising artificial intelligence capabilities for a set of demand management applications and a set of supply chain applications for a category of goods. In embodiments, the artificial intelligence system facilitates coordinated intelligence for the set of demand management applications or the set of supply chain applications, or both for a category of goods by processing data that is available in any of a plurality of data sources including processes, bill of materials, weather, traffic, design specification, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System.

In embodiments, the set of adaptive intelligence systems provide user access to the artificial intelligence capabilities for coordinating intelligence for the sets of applications.

In embodiments, the user interface presents a set of artificial intelligence systems responsive to the category of goods. In embodiments, the user interface facilitates configuring the set of adaptive intelligence systems with at least one artificial intelligence system. In embodiments, the at least one artificial intelligence system is a hybrid artificial intelligence system. In embodiments, the at least one artificial intelligence system comprises a hybrid neural network. In embodiments, coordinated intelligence-based artificial intelligence capabilities operate on or responsive to data collected by or produced by other systems of an adaptive intelligence systems layer.

In embodiments, coordinated intelligence-based artificial intelligence capabilities provide coordinated intelligence for a specific operator and/or enterprise that participates in the supply chain for the category of goods.

In embodiments, the coordinated intelligence-based artificial intelligence capabilities employ a neural network that processes at least one of demand management application outputs and supply chain application outputs to provide the coordinated intelligence. In embodiments, coordinated intelligence-based artificial intelligence is configured through the user interface for at least two demand management applications selected from the list consisting of a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service. In embodiments, coordinated intelligence-based artificial intelligence is configured through the user interface for at least two supply chain applications selected from the list consisting of a goods timing management application, a goods quantity management application, a logistics management application, a shipping application, a delivery application, an order for goods management application, and an order for components management application.

In embodiments, an information technology system having a management platform with a set of artificial intelligence systems as part of a set of adaptive intelligence systems that provide coordinated intelligence for a set of demand management applications and a set of supply chain applications for a category of goods so that the at least one supply chain application produces results that address at least one aspect of supply for at least one of the goods in the category of goods determined by at least one of the demand management applications.

In embodiments, the artificial intelligence systems provide coordinated intelligence for the set of demand management applications or the set of supply chain applications, or both for a category of goods by processing data that is available in any of a plurality of data sources including processes, bill of materials, weather, traffic, design specification, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System.

In embodiments, the set of adaptive intelligence systems provide user access to the set of artificial intelligence systems for use with the sets of applications. In embodiments, the user interface presents a set of artificial intelligence systems responsive to the category of goods. In embodiments, the user interface facilitates configuring the set of adaptive intelligence systems with at least one artificial intelligence system. In embodiments, the at least one artificial intelligence system is a hybrid artificial intelligence system. In embodiments, the at least one artificial intelligence system comprises a hybrid neural network. In embodiments, the set of artificial intelligence systems provides coordinated intelligence operates on or responsive to data collected by or produced by other systems of an adaptive intelligence systems layer. In embodiments, the set of artificial intelligence systems provides coordinated intelligence for a specific operator and/or enterprise that participates in the supply chain for the category of goods.

In embodiments, the set of artificial intelligence systems provides coordinated intelligence employs a neural network that processes at least one of demand management application outputs and supply chain application outputs to provide the coordinated intelligence. In embodiments, the set of artificial intelligence systems is configured through the user interface for at least two demand management applications selected from the list consisting of a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service. In embodiments, the set of artificial intelligence systems is configured through the user interface for at least two supply chain applications selected from the list consisting of a goods timing management application, a goods quantity management application, a logistics management application, a shipping application, a delivery application, an order for goods management application, and an order for components management application.

In embodiments, an information technology system having a management platform with a user interface that provides a hybrid set of adaptive intelligence systems that provide coordinated intelligence for a set of demand management applications and a set of supply chain applications for a category of goods, wherein at least one type of artificial intelligence system is used with respect to a set of demand management applications and at least one other type of artificial intelligence system is used with respect to a set of supply chain applications.

In embodiments, the hybrid set of adaptive intelligence systems includes a plurality of distinct artificial intelligence systems. In embodiments, the hybrid set of adaptive intelligence systems includes a plurality of neural network-based systems. In embodiments, the hybrid set of adaptive intelligence systems provides coordinated intelligence for the set of demand management applications or the set of supply chain applications, or both for a category of goods by processing data that is available in any of a plurality of data sources including processes, bill of materials, weather, traffic, design specification, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System. In embodiments, the hybrid set of adaptive intelligence systems provides user access to the set of artificial intelligence systems for use with the sets of applications.

In embodiments, the user interface presents a hybrid set of adaptive intelligence systems responsive to the category of goods. In embodiments, the user interface facilitates configuring the hybrid set of adaptive intelligence systems with at least one artificial intelligence system.

In embodiments, the at least one artificial intelligence system is a hybrid artificial intelligence system. In embodiments, the at least one artificial intelligence system comprises a hybrid neural network. In embodiments, the hybrid set of adaptive intelligence systems that provides coordinated intelligence operates on or responsive to data collected by or produced by other systems of an adaptive intelligence systems layer. In embodiments, the hybrid set of adaptive intelligence systems provides coordinated intelligence for a specific operator and/or enterprise that participates in the supply chain for the category of goods. In embodiments, the hybrid set of adaptive intelligence systems provides coordinated intelligence employs a neural network that processes at least one of demand management application outputs and supply chain application outputs to provide the coordinated intelligence. In embodiments, the hybrid set of adaptive intelligence systems is configured through the user interface for at least two demand management applications selected from the list consisting of a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service. In embodiments, the hybrid set of adaptive intelligence systems is configured through the user interface for at least two supply chain applications selected from the list consisting of a goods timing management application, a goods quantity management application, a logistics management application, a shipping application, a delivery application, an order for goods management application, and an order for components management application. In embodiments, the at least one type of artificial intelligence system used with respect to a set of demand management applications is a machine learning-based system and wherein the at least one other type of artificial intelligence system is a neural network-based system.

In embodiments, the at least one type of artificial intelligence system used with respect to a set of demand management application is a first type of neural network-based system and wherein the at least one other type of artificial intelligence system is a second type of neural network-based system.

In embodiments, the at least one type of artificial intelligence system configured/selected/accessed through the user interface for use with respect to a set of demand management applications is a hybrid neural-network that applies a first type of neural network with respect to a first application of the set of demand management applications and a second type of neural network with respect to a second application of the set of demand management applications. In embodiments, the at least one other type of artificial intelligence system used with respect to a set of supply chain applications is a hybrid neural-network that applies a first type of neural network with respect to a first application of the set of supply chain applications and a second type of neural network with respect to a second application of the set of supply chain applications.

In embodiments, an information technology system having a management platform with a user interface that provides a set of adaptive intelligence systems that provide hybrid artificial intelligence capabilities for coordinated intelligence for a set of demand management applications and a set of supply chain applications for a category of goods, wherein at least one type of artificial intelligence system is used with respect to a set of demand management applications and at least one other type of artificial intelligence system is used with respect to a set of supply chain applications.

In embodiments, the hybrid artificial intelligence capabilities include a plurality of distinct artificial intelligence systems.

In embodiments, the hybrid artificial intelligence capabilities include a plurality of neural network-based systems.

In embodiments, the hybrid artificial intelligence capabilities provide coordinated intelligence for the set of demand management applications or the set of supply chain applications, or both for a category of goods by processing data that is available in any of a plurality of data sources including processes, bill of materials, weather, traffic, design specification, customer complaint logs, customer reviews, Enterprise Resource Planning (ERP) System, Customer Relationship Management (CRM) System, Customer Experience Management (CEM) System, Service Lifecycle Management (SLM) System, Product Lifecycle Management (PLM) System.

In embodiments, the hybrid artificial intelligence capabilities provide user access to the set of artificial intelligence systems for use with the sets of applications. In embodiments, the user interface presents hybrid artificial intelligence capabilities responsive to the category of goods. In embodiments, the user interface facilitates configuring the hybrid artificial intelligence capabilities with at least one artificial intelligence system. In embodiments, the at least one artificial intelligence system is a hybrid artificial intelligence system. In embodiments, the at least one artificial intelligence system comprises a hybrid neural network. In embodiments, the hybrid artificial intelligence capabilities that provide coordinated intelligence operates on or responsive to data collected by or produced by other systems of an adaptive intelligence systems layer. In embodiments, the hybrid artificial intelligence capabilities provide coordinated intelligence for a specific operator and/or enterprise that participates in the supply chain for the category of goods.

In embodiments, the hybrid artificial intelligence capabilities provide coordinated intelligence employs a neural network that processes at least one of demand management application outputs and supply chain application outputs to provide the coordinated intelligence. In embodiments, the hybrid artificial intelligence capabilities are configured through the user interface for at least two demand management applications selected from the list consisting of a demand planning application, a demand prediction application, a sales application, a future demand aggregation application, a marketing application, an advertising application, an e-commerce application, a marketing analytics application, a customer relationship management application, a search engine optimization application, a sales management application, an advertising network application, a behavioral tracking application, a marketing analytics application, a location-based product or service-targeting application, a collaborative filtering application, a recommendation engine for a product or service. In embodiments, the hybrid artificial intelligence capabilities are configured through the user interface for at least two supply chain applications selected from the list consisting of a goods timing management application, a goods quantity management application, a logistics management application, a shipping application, a delivery application, an order for goods management application, and an order for components management application. In embodiments, the at least one type of artificial intelligence system used with respect to a set of demand management applications is a machine learning-based system and wherein the at least one other type of artificial intelligence system is a neural network-based system. In embodiments, the at least one type of artificial intelligence system used with respect to a set of demand management application is a first type of neural network-based system and wherein the at least one other type of artificial intelligence system is a second type of neural network-based system. In embodiments, the at least one type of artificial intelligence system configured/selected/accessed through the user interface for use with respect to a set of demand management applications is a hybrid neural-network that applies a first type of neural network with respect to a first application of the set of demand management applications and a second type of neural network with respect to a second application of the set of demand management applications. In embodiments, the at least one other type of artificial intelligence system used with respect to a set of supply chain applications is a hybrid neural-network that applies a first type of neural network with respect to a first application of the set of supply chain applications and a second type of neural network with respect to a second application of the set of supply chain applications.

In embodiments, an information technology system having a management platform with a user interface that provides a set of adaptive intelligence systems that provide a set of predictions for a coordinated set of demand management applications and supply chain applications for a category of goods.

In embodiments, the set of predictions includes a least one prediction of an impact on a supply chain application based on a current state of a coordinated demand management application. In embodiments, the set of predictions is a set of predictions of adjustments in supply required to meet demand. In embodiments, the set of predictions includes at least one prediction of change in demand that impacts supply. In embodiments, the set of predictions includes at least one prediction of change in supply that impacts at least one of the sets of demand management applications. In embodiments, the at least one of the sets of demand management applications is a promotion application for at least one good in the category of goods. In embodiments, the set of predictions includes a likelihood that a supply of a good in the category of goods will not meet demand.

In embodiments, an information technology system having a management platform with a user interface that provides a set of adaptive intelligence systems to provide a set of artificial intelligence capabilities that facilitate providing a set of predictions for a coordinated set of demand management applications and supply chain applications for a category of goods. In embodiments, the set of predictions includes a least one prediction of an impact on a supply chain application based on a current state of a coordinated demand management application.

In embodiments, the set of predictions is a set of predictions of adjustments in supply required to meet demand. In embodiments, the set of predictions includes at least one prediction of change in demand that impacts supply. In embodiments, the set of predictions includes at least one prediction of change in supply that impacts at least one of the sets of demand management applications. In embodiments, the at least one of the set of demand management applications is a promotion application for at least one good in the category of goods. In embodiments, the set of predictions includes a likelihood that a supply of a good in the category of goods will not meet demand.

In embodiments, an information technology system having a management platform with a set of adaptive intelligence systems that apply artificial intelligence to provide a set of predictions for a coordinated set of demand management applications and supply chain applications for a category of goods. In embodiments, the set of predictions includes a least one prediction of an impact on a supply chain application based on a current state of a coordinated demand management application. In embodiments, the set of predictions is a set of predictions of adjustments in supply required to meet demand. In embodiments, the set of predictions includes at least one prediction of change in demand that impacts supply. In embodiments, the set of predictions includes at least one prediction of change in supply that impacts at least one of the set of demand management applications.

In embodiments, the at least one of the set of demand management applications is a promotion application for at least one good in the category of goods. In embodiments, the set of predictions includes a likelihood that a supply of a good in the category of goods will not meet demand.

In embodiments, an information technology system having a management platform with a set of adaptive artificial intelligence systems that provide a set of predictions for a coordinated set of demand management applications and supply chain applications for a category of goods. In embodiments, the set of predictions includes a least one prediction of an impact on a supply chain application based on a current state of a coordinated demand management application. In embodiments, the set of predictions is a set of predictions of adjustments in supply required to meet demand. In embodiments, the set of predictions includes at least one prediction of change in demand that impacts supply. In embodiments, the set of predictions includes at least one prediction of change in supply that impacts at least one of the set of demand management applications. In embodiments, the at least one of the set of demand management applications is a promotion application for at least one good in the category of goods. In embodiments, the set of predictions includes a likelihood that a supply of a good in the category of goods will not meet demand.

In embodiments, an information technology system having a management platform with a user interface that provides a set of adaptive intelligence systems that provide a set of predictions for a coordinated set of demand management applications and supply chain applications for a category of goods by applying artificial intelligence for coordinating the set of demand management applications and supply chain applications.

In embodiments, the set of predictions includes a least one prediction of an impact on a supply chain application based on a current state of a coordinated demand management application. In embodiments, the set of predictions is a set of predictions of adjustments in supply required to meet demand. In embodiments, the set of predictions includes at least one prediction of change in demand that impacts supply. In embodiments, the set of predictions includes at least one prediction of change in supply that impacts at least one of the set of demand management applications. In embodiments, the at least one of the set of demand management applications is a promotion application for at least one good in the category of goods. In embodiments, the set of predictions includes a likelihood that a supply of a good in the category of goods will not meet demand.

In embodiments, an information technology system having a management platform with a user interface that provides a set of adaptive intelligence systems that provide a set of predictions of outcomes from operating a supply chain with a coordinated set of demand management applications and supply chain applications for a category of goods. In embodiments, the set of predictions includes a least one prediction of an impact on a supply chain application based on a current state of a coordinated demand management application.

In embodiments, the set of predictions is a set of predictions of adjustments in supply required to meet demand. In embodiments, the set of predictions includes at least one prediction of change in demand that impacts supply. In embodiments, the set of predictions includes at least one prediction of change in supply that impacts at least one of the set of demand management applications. In embodiments, the at least one of the set of demand management applications is a promotion application for at least one good in the category of goods. In embodiments, the set of predictions includes a likelihood that a supply of a good in the category of goods will not meet demand. In embodiments, an information technology system having a management platform with a user interface that provides a set of adaptive intelligence systems that provide a set of classifications for a coordinated set of demand management applications and supply chain applications for a category of goods. In embodiments, the set of classifications comprises at least one neural network adapted to classify information associated with the category of goods. In embodiments, the at least one neural network is a multilayered feed forward neural network. In embodiments, the user interface facilitates access to artificial intelligence classification capabilities adapted for use with the coordinated set of demand management applications and supply chain applications.

In embodiments, the set of classifications comprises a set of classifications of artificial intelligence capabilities to facilitate user application of the artificial intelligence capabilities for the category of goods. In embodiments, an information technology system having a management platform with a set of adaptive intelligence systems that provide a set of artificial intelligence capabilities for performing classifications for a coordinated set of demand management applications and supply chain applications for a category of goods.

In embodiments, the set of artificial intelligence capabilities comprises at least one neural network adapted to classify information associated with the category of goods. In embodiments the at least one neural network is a multilayered feed forward neural network. In embodiments, the user interface facilitates access to artificial intelligence classification capabilities in the set of artificial intelligence capabilities adapted for use with the coordinated set of demand management applications and supply chain applications. In embodiments, performing classifications comprises classifying available adaptive intelligence systems as one of suitable for use with a demand management application and suitable for use with a supply chain application. In embodiments, performing classifications comprises classifying discovered value chain entities as one of demand centric and supply centric.

In embodiments, an information technology system having a management platform with a user interface that provides a set of adaptive intelligence systems that provide a set of classifications for a coordinated set of demand management applications and supply chain applications for a category of goods by applying artificial intelligence capabilities for coordinating the set of demand management applications and supply chain applications.

In embodiments, applying artificial intelligence capabilities comprises applying at least one neural network adapted to classify information associated with the category of goods.

In embodiments, the at least one neural network is a multilayered feed forward neural network.

In embodiments, the user interface facilitates determining the coordinated set of demand management applications and supply chain applications to which the artificial intelligence capabilities apply. In embodiments, applying artificial intelligence capabilities comprises classifying available adaptive intelligence systems as one of suitable for use with a demand management application and suitable for use with a supply chain application.

In embodiments, applying artificial intelligence capabilities comprises classifying discovered value chain entities as one of demand centric and supply centric.

An information technology system having a management platform with a user interface that provides a set of adaptive intelligence systems that provide a set of classifications of outcomes from operating a supply chain with a coordinated set of demand management applications and supply chain applications for a category of goods.

In embodiments, an information technology system having a management platform with a user interface that provides a set of adaptive intelligence systems that provide a set of automated control signals for a coordinated set of demand management applications and supply chain applications for a category of goods. In embodiments, the set of automated control signals comprises at least one control signal for execution of a supply chain application in the coordinated set of demand management applications and supply chain applications.

In embodiments, the set of automated control signals comprises at least one control signal for execution of a demand management application in the coordinated set of demand management applications and supply chain applications. In embodiments, the automated control signals control timing of demand management applications based on goods supply status. In embodiments, in the adaptive intelligence systems apply machine learning to outcomes of supply to automatically adapt a set of demand management application control signals.

In embodiments, the adaptive intelligence systems apply machine learning to outcomes of demand management to automatically adapt a set of supply chain application control signals. In embodiments, the set of adaptive intelligence systems determine aspects of a value chain that impact automated control of the coordinated set of demand management applications and supply chain applications for a category of goods.

In embodiments, the set of adaptive intelligence systems determines at least one range of application control values within which control can be automated. In embodiments, the at least one range is a supply rate. In embodiments, the at least one range is a supply timing rate. In embodiments, the at least one range is a mix of goods in the category of goods.

In embodiments, an information technology system having a management platform with a set of adaptive intelligence systems that apply artificial intelligence to provide a set of automated control signals for a coordinated set of demand management applications and supply chain applications for a category of goods.

In embodiments, the set of automated control signals comprises at least one control signal for execution of a supply chain application in the coordinated set of demand management applications and supply chain applications. In embodiments, the set of automated control signals comprises at least one control signal for execution of a demand management application in the coordinated set of demand management applications and supply chain applications. In embodiments, the automated control signals control timing of demand management applications based on goods supply status. In embodiments, the adaptive intelligence systems apply machine learning to outcomes of supply to automatically adapt a set of demand management application control signals.

In embodiments, the adaptive intelligence systems apply machine learning to outcomes of demand management to automatically adapt a set of supply chain application control signals. In embodiments, the set of adaptive intelligence systems determine aspects of a value chain that impact automated control of the coordinated set of demand management applications and supply chain applications for a category of goods. In embodiments, the set of adaptive intelligence systems determines at least one range of application control values within which control can be automated. In embodiments, the at least one range is a supply rate. In embodiments, the at least one range is a supply timing rate. In embodiments, the at least one range is a mix of goods in the category of goods.

In embodiments, an information technology system having a management platform with a user interface that provides a set of adaptive intelligence systems that provide a set of automated control signals for a coordinated set of demand management applications and supply chain applications for a category of goods by applying artificial intelligence for coordinating the set of demand management applications and supply chain applications.

In embodiments, the set of automated control signals comprises at least one control signal for execution of a supply chain application in the coordinated set of demand management applications and supply chain applications. In embodiments, the set of automated control signals comprises at least one control signal for execution of a demand management application in the coordinated set of demand management applications and supply chain applications. In embodiments, the automated control signals control timing of demand management applications based on goods supply status. In embodiments, the adaptive intelligence systems apply machine learning to outcomes of supply to automatically adapt a set of demand management application control signals.

In embodiments, the adaptive intelligence systems apply machine learning to outcomes of demand management to automatically adapt a set of supply chain application control signals. In embodiments, the set of adaptive intelligence systems determine aspects of a value chain that impact automated control of the coordinated set of demand management applications and supply chain applications for a category of goods.

In embodiments, the set of adaptive intelligence systems determines at least one range of application control values within which control can be automated. In embodiments, the at least one range is a supply rate. In embodiments, the at least one range is a supply timing rate. In embodiments, the at least one range is a mix of goods in the category of goods.

In embodiments, an information technology system having a management platform with a user interface that provides a set of adaptive intelligence systems that provide a set of automated control signals that are responsive to outcomes from operating a supply chain with a coordinated set of demand management applications and supply chain applications for a category of goods. In embodiments, the set of automated control signals comprises at least one control signal for execution of a supply chain application in the coordinated set of demand management applications and supply chain applications. In embodiments, the set of automated control signals comprises at least one control signal for execution of a demand management application in the coordinated set of demand management applications and supply chain applications. In embodiments, the automated control signals control timing of demand management applications based on goods supply status. In embodiments, the adaptive intelligence systems apply machine learning to outcomes of supply to automatically adapt a set of demand management application control signals. In embodiments, the adaptive intelligence systems apply machine learning to outcomes of demand management to automatically adapt a set of supply chain application control signals.

In embodiments, the set of adaptive intelligence systems determine aspects of a value chain that impact automated control of the coordinated set of demand management applications and supply chain applications for a category of goods. In embodiments, the set of adaptive intelligence systems determines at least one range of application control values within which control can be automated. In embodiments, the at least one range is a supply rate.

In embodiments, the at least one range is a supply timing rate. In embodiments, the at least one range is a mix of goods in the category of goods.

In embodiments, an information technology system having an artificial intelligence/machine learning system for learning on a training set of outcomes, parameters, and data collected from a set of information routing activities in a set of value chain networks and for providing an information routing recommendation based on current status information for a selected value chain network. In embodiments, the artificial intelligence/machine learning system trains on transaction types within the value chain network. In embodiments, the information routing recommendation is based on a transaction type within the value chain network for which information is being routed. In embodiments the information routing recommendation is based on a type of information being routed within the value chain network. In embodiments, the information routing recommendation is based on network types within the value chain network. In embodiments, the information routing recommendation is based on compatibility of information being routed with a network routing protocol for at least one candidate route within the value chain network. In embodiments, the information routing recommendation is based on detected network conditions. In embodiments, the information routing recommendation is based on an existence of edge intelligence. In embodiments, the information routing recommendation is based on an availability of networking resources. In embodiments, the information routing recommendation is based on network storage resources.

In embodiments, the information routing recommendation is based on detection of network resources/entities.

In embodiments, the information routing recommendation is based on goals of routing. In embodiments, the goals of routing comprise a measure of quality of service (QoS). In embodiments, the goals of routing comprise a measure reliability. In embodiments, the measure of reliability is a transmission failure rate. In embodiments, the goals of routing comprise a measure of latency associated with a candidate route. In embodiments, the goals of routing are based on information availability within the selected value chain network. In embodiments, the goals of routing are based on information persistence within the selected value chain network. In embodiments, the artificial intelligence/machine learning system develops an understanding of parameters of routing that impact information value. In embodiments, the artificial intelligence/machine learning system facilitates recommending routes that maintain information value. In embodiments, the artificial intelligence/machine learning system is configured to develop an understanding of timing of information supply versus information demand.

In embodiments, the artificial intelligence/machine learning system develops an understanding of needs for coordination of information delivery. In embodiments, coordination of information delivery includes ensuring delivery of an item of information to a first node before delivering the item of information to a second node in the selected value chain network. In embodiments, the artificial intelligence/machine learning system is selected from a list of systems consisting of decision trees, k-nearest neighbor, linear regression, k-means clustering, deep learning neural network, random forest, logistic regression, naïve Bayes, learning vector quantization, support vector machines, linear discriminant analysis, boosting, principal component analysis, hybrid of k-means and linear regression. In embodiments, the routing recommendations are based on a topology of the selected value chain network. In embodiments, the routing recommendations are adapted based on availability of edge intelligence in the selected value chain network. In embodiments, the routing recommendations are adapted based on location and availability of network storage resources in the selected value chain network.

In embodiments, an information technology system having an artificial intelligence/machine learning system for learning on a training set of outcomes, parameters, and data collected from a set of data sources relating to a set of value chain entities and activities to recognize a problem state in a portion of a value chain network using computing resources that are local to a set of value chain network entities that are experiencing the problem. In embodiments, to recognize a problem state is based on variances in outcomes over time from a portion of the value chain network. In embodiments, variances in outcomes over time indicate a problem state. In embodiments, the artificial intelligence/machine learning system determines an acceptable range of outcome variance. In embodiments, the acceptable range is a standard deviation of the outcomes.

In embodiments, the artificial intelligence/machine learning system determines a problem state threshold for at least one measure of the value chain network. In embodiments, to recognize a problem state comprises detecting at least one measure of the value chain that is greater than the problem state threshold.

In embodiments, to recognize a problem state is based on variances in start/end times of scheduled value chain network entity activities. In embodiments, to recognize a problem state is based on variances in at least one of production time, production quality, production rate, production start time, production resource availability or trends thereof. In embodiments, to recognize a problem state is based on variances in a measure of shipping supply. In embodiments, a problem state is a duration of time for transfer from one mode of transport to another greater than a problem state threshold variance in quality testing. In embodiments, the machine learning/artificial intelligence systems predict a correlated pain point further along the supply chain due to a detected pain point.

In embodiments, the predicted correlated pain point is a least one of a risk and/or need for overtime.

In embodiments, the predicted correlated pain point is a least one of risk and/or need for expedited shipping.

In embodiments, the predicted correlated pain point is a least one of risk and/or need for discounted goods prices.

In embodiments, the machine learning/artificial intelligence systems determines a problem state based on a detected stress level of humans along the supply chain. In embodiments, the detected stress level of humans is based on data received from at least one physiological wearable detector. In embodiments, the machine learning/artificial intelligence system uses natural language processing to identify phrases in digital communications within and/or among value chain entities that indicate candidate problem states. In embodiments, the machine learning/artificial intelligence system processes outcomes, parameters, and data collected from a set of data sources relating to a set of value chain entities and activities to detect at least one pain point selected from the list of pain points consisting of late shipment, damaged container, damaged goods, wrong goods, customs delay, unpaid duties, weather event, damaged infrastructure, blocked waterway, incompatible infrastructure, congested port, congested handling infrastructure, congested roadway, congested distribution center, rejected goods, returned goods, waste material, wasted energy, wasted labor force, untrained workforce, poor customer service, empty transport vehicle on return route, excessive fuel prices, excessive tariffs.

In embodiments, an information technology system having a set of artificial intelligence systems operating on information from a monitoring set of network-connected value chain network entities to enable automated coordination of a set of value chain network activities involving a set of products of an enterprise.

In embodiments, the monitoring set of network connected value chain entities is generated by a value chain monitoring system. In embodiments, activity data for the monitoring set is captured by a collection and management systems. In embodiments, the automate coordination is performed at least in part through an application programming connectivity facility. In embodiments, the application programming connectivity facility automates access to the monitored activity information. In embodiments, compromising a plurality of interconnected entities that each perform several activities for completing the value chain. In embodiments, the artificial intelligence-type systems comprise at least one of a machine learning system, an expert system, a self-organizing system. In embodiments, the automated coordination comprises configuring activity workflows with an artificial intelligence system. In embodiments, the automated coordination involves automating value chain network activities that produce the product. In embodiments, the automated coordination involves configuring resources required for a workflow of an activity. In embodiments, the set of artificial intelligence systems further determine relationships among value change network entities and activities. In embodiments, the automated coordination is based on inputs used by the activities. In embodiments, the automated coordination is based on results produced by the activities. In embodiments, the set of artificial intelligence systems comprises at least one hybrid artificial intelligence system. In embodiments, the automated coordination comprises generation of automated control signals. In embodiments, the automated coordination comprises semi-sentient problem recognition. In embodiments, the semi-sentient problem recognition is based on structured content. In embodiments, the semi-sentient problem recognition is based on unstructured content. In embodiments, the semi-sentient problem recognition is based on measures of human emotion.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data; wherein the machine learning model is configured to prioritize collection and receipt of sensor data related to simulations of the digital replica of the value chain entity. In embodiments, the machine learning model is configured to learn which types of sensor data are relevant to dynamics of the value chain entity and simulation thereof.

In embodiments, the machine learning model is configured to make suggestions to a user of the information technology system regarding potential changes to the plurality of sensors that would improve simulation of the value chain entity via the digital twin system. In embodiments, the machine learning model is configured to prioritize collection and transmission of sensor data that are relevant to dynamics of the value chain entity and simulation thereof.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data; wherein the machine learning model is configured to determine which types of the sensor data are to be included in the simulation data used to create the digital replica of the value chain entity by the digital twin system, the machine learning model determining which types of the sensor data are to be included based on one or both of a modeling goal and a quality of the type of sensor data.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data; wherein the artificial intelligence system includes a model interpretability system, the model interpretability system being configured to facilitate human understanding of training and outputs of the machine learning model.

In embodiments, the model interpretability system includes one or more of linear regression, logistic regression, a generalized linear model (GLM), a generalized additive model (GAM), a decision tree, a decision rule, RuleFit, Naive Bayes Classifier, a K-nearest neighbors algorithm, a partial dependence plot, individual conditional expectation (ICE), an accumulated local effects (ALE) plot, feature interaction, permutation feature importance, a global surrogate model, a local surrogate (LIME) model, scoped rules, i.e. anchors, Shapley values, Shapley additive explanations (SHAP), feature visualization, and network dissection.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data; wherein the artificial intelligence system includes a model interpretability system, the model interpretability system being configured to facilitate human understanding of training and outputs of the machine learning model; and wherein the model dataset visualization system provides human-readable analysis related to distribution of values across features of the simulation data.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data; wherein the artificial intelligence system includes an embedded model interpretability system, the embedded model interpretability system being configured to facilitate human understanding of training and outputs of the machine learning model, and the embedded model interpretability system including a model dataset visualization system. In embodiments, the embedded model interpretability system implements a Bayesian case model that facilitates human understanding of the cognition of the machine learning model. In embodiments, the embedded model interpretability system implements a glass box model that facilitates human understanding of the cognition of the machine learning model. In embodiments, the glass box model is a Gaussian process model.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data;

wherein the artificial intelligence system includes a model interpretability system, the model interpretability system being configured to facilitate human understanding of training and outputs of the machine learning model; and wherein the model interpretability system is configured to implement Testing with Concept Activation Vectors (TCAV) functionality, whereby the model interpretability facilitates learning of human-interpretable concepts by the machine learning model.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data; wherein the digital replica of the value chain entity is configured to accept a modeling command from a user of the information technology system to facilitate simulation of the value chain entity, the digital twin system being configured to adjust the digital replica in response to the modeling command; and wherein the machine learning model is configured to predict the modeling command and suggest the predicted modeling command to the user based on the sensor data, prior modeling commands, and simulation of the value chain entity.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data; wherein the machine learning model is configured to determine which instances of the sensor data to include in transformation into the simulation data based on training of the machine learning model.

In embodiments, an information technology system leveraging digital twins in a value chain having a plurality of value chain entities, the information technology system comprising: a plurality of sensors positioned in, on, and/or near a value chain entity of the value chain entities and configured to collect sensor data related to the value chain entity, the sensor data being substantially real-time sensor data; and an adaptive intelligence system connected to the plurality of sensors and configured to receive the sensor data from the plurality of sensors, the adaptive intelligence system including: an artificial intelligence system configured to input the sensor data into a machine learning model, the sensor data being used as training data for the machine learning model, the machine learning model being configured to transform the sensor data into simulation data; and a digital twin system configured to create a digital replica of the value chain entity based on the simulation data, the digital replica of the value chain entity providing for substantially real-time representation of the value chain entity and providing for simulation of a possible future state of the value chain entity via the simulation data; wherein the machine learning model is configured to provide a plurality of sets of hypothetical simulation data to the digital twin system based on training of the machine learning model, the digital twin system being configured to create a set of hypothetical digital replicas of the value chain entity, each of the hypothetical digital replicas being based on a set of hypothetical simulation data and the simulation data; and wherein the machine learning model is configured to evaluate performance of each hypothetical digital replica of the set of hypothetical digital replicas, determine which hypothetical digital replicas perform better than others of the set of hypothetical digital replicas, and determine why the hypothetical digital replicas that perform better than the others of the set of hypothetical digital replicas perform better than the others of the set of hypothetical digital replicas.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a user interface that provides a set of unified views for a set of demand management information and supply chain information for a category of goods.

In embodiments, the user interface includes a voice operated assistant. In the embodiments, the user interface includes a digital twin for presenting a visual representation of a set of attributes of a set of value chain network entities.

In embodiments, the user interface includes an interface for configuring the adaptive intelligence facilities.

In embodiments, the set of interfaces includes a demand management interface and a supply chain management interface. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise.

In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger.

In embodiments, the set of data storage facilities for storing data collected and handled by the platform uses graph database representing a set of hierarchical relationships of value chain network entities. In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise. In embodiments, the set of applications includes a set of applications of at least two types from among a set of supply chain management application, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified database that supports a set of applications of at least two types from among a set of demand management applications, a set of supply chain applications, a set of intelligent product applications and a set of enterprise resource management applications for a category of goods.

In embodiments, the unified database that supports a set of demand management applications, a set of supply chain applications, a set of intelligent product applications and a set of enterprise resource management applications for a category of goods is a distributed database.

In embodiments, the unified database that supports a set of demand management applications, a set of supply chain applications, a set of intelligent product applications and a set of enterprise resource management applications for a category of goods uses a graph database architecture.

In embodiments, the set of demand management applications includes a demand prediction application. In embodiments, the set of demand management applications includes a demand aggregation application. In embodiments, the set of demand management applications includes a demand activation application. In embodiments, the set of supply chain management applications includes a vendor search application. In embodiments, the set of supply chain management applications includes a route configuration application. In embodiments, the set of supply chain management applications includes a logistics scheduling application.

In embodiments, the set of interfaces includes a demand management interface and a supply chain management interface. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise.

In embodiments, the set of adaptive intelligence facilities for automating a set of capabilities of the platform includes an edge intelligence system deployed in a supply chain infrastructure facility operated by the enterprise.

In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain.

In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities.

In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise.

In embodiments, the set of applications includes a set of applications of at least two types from among a set of supply chain management applications, demand management applications, intelligent product applications and enterprise resource management applications. In embodiments, the set of applications includes an asset management application. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors. In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified set of data collection systems that support a set of applications of at least two types from among a set of demand management applications, a set of supply chain applications, a set of intelligent product applications and a set of enterprise resource management applications for a category of goods. In embodiments, the unified set of data collection systems includes a set of crowdsourcing data collection systems. In embodiments, the unified set of data collection systems includes a set of Internet of Things data collection systems. In embodiments, the unified set of data collection systems includes a set of self-configuring sensor systems. In embodiments, the unified set of data collection systems includes a set of data collection systems that interact with a network-connected product. In embodiments, the unified set of data collection systems includes a set of mobile data collectors deployed in a set of value chain network environments operated by an enterprise.

In embodiments, the unified set of data collection systems includes a set of edge intelligence systems deployed in a set of value chain network environments operated by an enterprise. In embodiments, the set of interfaces includes a demand management interface and a supply chain management interface. In embodiments, the set of network connectivity facilities for enabling a set of value chain network entities to connect to the platform includes a 5G network system deployed in a supply chain infrastructure facility operated by the enterprise.

In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise. In embodiments the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities. In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise. In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications integrated with the platform for enabling an enterprise user of the platform to manage a set of value chain network entities from a point of origin to a point of customer use; and a unified set of Internet of Things systems that provide coordinated monitoring of a set of applications of at least two types from among a set of demand management applications, a set of supply chain applications, a set of intelligent product applications and a set of enterprise resource management applications for a category of goods.

In embodiments, the unified set of Internet of Things systems includes a set of smart home Internet of Things devices to enable monitoring of a set of demand factors and a set of Internet of Things devices deployed in proximity to a set of supply chain infrastructure facilities to enable monitoring of a set of supply factors.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the unified set of Internet of Things systems includes a set of workplace Internet of Things devices to enable monitoring of a set of demand factors for a set of business customers and a set of Internet of Things devices deployed in proximity to a set of supply chain infrastructure facilities to enable monitoring of a set of supply factors. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the unified set of Internet of Things systems includes a set of Internet of Things devices to monitor a set of consumer goods stores to enable monitoring of a set of demand factors for a set of consumers and a set of Internet of Things devices deployed in proximity to a set of supply chain infrastructure facilities to enable monitoring of a set of supply factors. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors. In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of interfaces includes a demand management interface and a supply chain management interface. In embodiments, the set of network connectivity facilities for enabling a set of value chain network entities to connect to the platform includes a 5G network system deployed in a supply chain infrastructure facility operated by the enterprise.

In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise.

In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger.

In embodiments, the set of data storage facilities for storing data collected and handled by the platform uses graph database representing a set of hierarchical relationships of value chain network entities. In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise. In embodiments, the set of applications includes a set of applications of at least two types from among a set of supply chain management applications, demand management applications, intelligent product applications and enterprise resource management applications. In embodiments the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and for a set of applications of at least two types from among a set of supply chain applications, a set of demand management applications, a set of intelligent product applications and a set of enterprise resource management applications and having a machine vision system and a digital twin system, wherein the machine vision system feeds data to the digital twin system. In embodiments, the set of supply chain applications and demand management applications is selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of supply chain applications and demand management applications is selected from the group consisting of inventory management, demand prediction, demand aggregation, pricing, blockchain, smart contract, positioning, placement, promotion, analytics, finance, trading, arbitrage, customer identity management, store planning, shelf-planning, customer route planning, customer route analytics, commerce, ecommerce, payments, customer relationship management, sales, marketing, advertising, bidding, customer monitoring, customer process monitoring, customer relationship monitoring, collaborative filtering, customer profiling, customer feedback, similarity analytics, customer clustering, product clustering, seasonality factor analytics, customer behavior tracking, customer behavior analytics, product design, product configuration, A/B testing, product variation analytics, augmented reality, virtual reality, mixed reality, customer demand profiling, customer mood, emotion or affect detection, customer mood, emotion of affect analytics, business entity profiling, customer enterprise profiling, demand matching, location-based targeting, location-based offering, point of sale interface, point of use interface, search, advertisement, entity discovery, entity search, enterprise resource planning, workforce management, customer digital twin, product pricing, product bundling, product and service bundling, product assortment, upsell offer configuration, customer feedback engagement, and customer survey applications. In embodiments, the set of supply chain applications and demand management applications is selected from the group consisting of supply chain, asset management, risk management, inventory management, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, supply chain digital twin, vendor profiling, supplier profiling, manufacturer profiling, logistics entity profiling, enterprise profiling, worker profiling, workforce profiling, component supply policy management, warehousing, distribution, fulfillment, shipping fleet management, vehicle fleet management, workforce management, maritime fleet management, navigation, routing, shipping management, opportunity matching, search, entity discovery, entity search, distribution, delivery, and enterprise resource planning applications. In embodiments, the set of supply chain applications and demand management applications is selected from the group consisting of asset management, risk management, inventory management, blockchain, smart contract, analytics, finance, trading, tax, regulatory, identity management, commerce, ecommerce, payments, security, safety, compatibility testing, compatibility management, incident management, predictive maintenance, monitoring, remote control, automation, self-configuration, self-healing, self-organization, waste reduction, augmented reality, virtual reality, mixed reality, product design, product configuration, product updating, product maintenance, product support, product testing, kit configuration, kit deployment, kit support, kit updating, kit maintenance, kit modification, kit management, product digital twin, opportunity matching, search, advertisement, entity discovery, entity search, variation, simulation, user interface, application programming interface, connectivity management, natural language interface, voice/speech interface, robotic interface, touch interface, haptic interface, vision system interface, and enterprise resource planning applications.

The system of claim 1, wherein the set of supply chain applications and demand management applications is selected from the group consisting of operations, finance, asset management, supply chain management, demand management, human resource management, product management, risk management, regulatory and compliance management, inventory management, infrastructure management, facilities management, analytics, trading, tax, identity management, vendor management, process management, project management, operations management, customer relationship management, workforce management, incident management, research and development, sales management, marketing management, fleet management, opportunity analytics, decision support, strategic planning, forecasting, resource management, and property management applications.

In embodiments, the machine vision system includes an artificial intelligence system that is trained to recognize a type of value chain asset based on a labeled data set of images of such type of value chain assets.

In embodiments, the digital twin presents an indicator of the type of asset based on the output of the artificial intelligence system. In embodiments, the machine vision system includes an artificial intelligence system that is trained to recognize a type of activity involving a set of value chain entities based on a labeled data set of images of such type of activity. In embodiments, the digital twin presents an indicator of the type of activity based on the output of the artificial intelligence system. In embodiments, the machine vision system includes an artificial intelligence system that is trained to recognize a safety hazard involving a value chain entity based on a training data set that includes a set of images of value chain network activities and a set of value chain network safety outcomes. In embodiments, the digital twin presents an indicator of the hazard based on the output of the artificial intelligence system. In embodiments, the machine vision system includes an artificial intelligence system that is trained to predict a delay based on a training data set that includes a set of images of value chain network activities and a set of value chain network timing outcomes. In embodiments, the digital twin presents an indicator of a likelihood of delay based on the output of the artificial intelligence system. In embodiments, the set of interfaces includes a demand management interface and a supply chain management interface.

In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise.

In embodiments, the set of adaptive intelligence facilities for automating a set of capabilities of the platform includes an edge intelligence system deployed in a supply chain infrastructure facility operated by the enterprise.

In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise.

In embodiments, the set of adaptive intelligence facilities for automating a set of capabilities of the platform includes a smart contract system for automating a set of interactions among a set of value chain network entities.

In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger.

In embodiments, the set of data storage facilities for storing data collected and handled by the platform uses graph database representing a set of hierarchical relationships of value chain network entities.

In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise.

In embodiments, the set of applications includes a set of applications of at least two types from among a set of supply chain management applications, demand management applications, intelligent product applications and enterprise resource management applications. In embodiments, the set of applications includes an asset management application. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors. In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified set of adaptive edge computing systems that provide coordinated edge computation for a set of applications of at least two types from among a set of demand management applications, a set of supply chain applications, a set of intelligent product applications and a set of enterprise resource management applications for a category of goods. In embodiments, the unified set of adaptive edge computing systems that provide coordinated edge computation includes systems selected from the group consisting of image classification systems, video compression systems, analog-to-digital transformation systems, digital-to-analog transformation systems, RF filtering systems, motion prediction systems, object type recognition systems, point cloud processing systems, analog signal processing systems, multiplexing systems, data filtering systems, statistical signal processing systems, signal filtering systems, signal processing systems, protocol selection systems, storage configuration systems, power management systems, clustering systems, variation systems, machine learning systems, event prediction systems, autonomous control systems, robotic control systems, robotic process automation systems, data visualization systems, data normalization systems, data cleansing system, data deduplication systems, graph-based data storage systems, object-oriented data storage systems, self-configuration systems, self-healing systems, handshake negotiation systems, entity discovery systems, cybersecurity systems, biometric systems, natural language processing systems, sound processing systems, ultrasound processing systems, artificial intelligence systems, rules engine systems, workflow automation systems, opportunity discovery systems, physical modeling systems, testing systems, diagnostic systems, software image propagation systems, peer-to-peer network configuration systems, RF spectrum management systems, network resource management systems, storage management systems, data management systems, intrusion detection systems, firewall systems, virtualization systems, digital twin systems, Internet of Things monitoring systems, routing systems, switching systems, indoor location systems, and geolocation systems. In embodiments, the interface is a user interface for a command center dashboard by which an enterprise orchestrates a set of value chain entities related to a type of product. In embodiments, the interface is a user interface of a local management system located in an environment that hosts a set of value chain entities. In embodiments, the local management system user interface facilitates configuration of a set of network connections for the adaptive edge computing systems. In embodiments, the local management system user interface facilitates configuration of a set of data storage resources for the adaptive edge computing systems.

In embodiments, the local management system user interface facilitates configuration of a set of data integration capabilities for the adaptive edge computing systems.

In embodiments, the local management system user interface facilitates configuration of a set of machine learning input resources for the adaptive edge computing systems. In embodiments, the local management system user interface facilitates configuration of a set of power resources that support the adaptive edge computing systems.

In embodiments, the local management system user interface facilitates configuration of a set of workflows that are managed by the adaptive edge computing systems. In embodiments, the interface is a user interface of a mobile computing device that has a network connection to the adaptive edge computing systems. In embodiments, the interface is an application programming interface. In embodiments, the application programming interface facilitates exchange of data between the adaptive edge computing systems and a cloud-based artificial intelligence system. In embodiments, the application programming interface facilitates exchange of data between the adaptive edge computing systems and a real-time operating system of a cloud data management platform. In embodiments, the application programming interface facilitates exchange of data between the adaptive edge computing systems and a computational facility of a cloud data management platform. In embodiments, the application programming interface facilitates exchange of data between the adaptive edge computing systems and a set of environmental sensors that collect data about an environment that hosts a set of value chain network entities.

In embodiments, the application programming interface facilitates exchange of data between the adaptive edge computing systems and a set of sensors that collect data about a product. In embodiments, the application programming interface facilitates exchange of data between the adaptive edge computing systems and a set of sensors that collect data published by an intelligent product. In embodiments, the application programming interface facilitates exchange of data between the adaptive edge computing systems and a set of sensors that collect data published by a set of Internet of Things systems that are disposed in an environment that hosts a set of value chain network entities. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of interfaces includes a demand management interface and a supply chain management interface. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise. In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities.

In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise.

In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors.

In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a unified set of adaptive intelligence systems that provide coordinated intelligence for a set of demand management applications, a set of supply chain applications, a set of intelligent product applications and a set of enterprise resource management applications for a category of goods.

In embodiments, the unified set of adaptive intelligence systems includes systems selected from the group consisting of artificial intelligence systems, neural networks, deep learning systems, model-based systems, expert systems, machine learning systems, rule-based systems, opportunity miners, robotic process automation systems, data transformation systems, data extraction systems, data loading systems, genetic programming systems, image classification systems, video compression systems, analog-to-digital transformation systems, digital-to-analog transformation systems, signal analysis systems, RF filtering systems, motion prediction systems, object type recognition systems, point cloud processing systems, analog signal processing systems, signal multiplexing systems, data fusion systems, sensor fusion systems, data filtering systems, statistical signal processing systems, signal filtering systems, signal processing systems, protocol selection systems, storage configuration systems, power management systems, clustering systems, variation systems, machine learning systems, event prediction systems, autonomous control systems, robotic control systems, robotic process automation systems, data visualization systems, data normalization systems, data cleansing systems, data deduplication systems, graph-based data storage systems, intelligent agent systems, object-oriented data storage systems, self-configuration systems, self-healing systems, self-organizing systems, self-organizing map systems, cost-based routing systems, handshake negotiation systems, entity discovery systems, cybersecurity systems, biometric systems, natural language processing systems, speech processing systems, voice recognition systems, sound processing systems, ultrasound processing systems, artificial intelligence systems, rules engine systems, workflow automation systems, opportunity discovery systems, physical modeling systems, testing systems, diagnostic systems, software image propagation systems, peer-to-peer network configuration systems, RF spectrum management systems, network resource management systems, storage management systems, data management systems, intrusion detection systems, firewall systems, virtualization systems, digital twin systems, Internet of Things monitoring systems, routing systems, switching systems, indoor location systems, geolocation systems, parsing systems, semantic filtering systems, machine vision systems, fuzzy logic systems, recommendation systems, and dialog management systems. In embodiments, the unified set of adaptive intelligent systems includes a set of artificial intelligence systems. In embodiments, the unified set of adaptive intelligent system includes a set of neural networks. In embodiments, the unified set of adaptive intelligent system includes a set of deep learning systems. In embodiments, the unified set of adaptive intelligent system includes a set of model-based systems. In embodiments, the unified set of adaptive intelligent system includes a set of expert systems. In embodiments, the unified set of adaptive intelligent system includes a set of machine learning systems. In embodiments, the unified set of adaptive intelligent system includes a set of rule-based systems. In embodiments, the unified set of adaptive intelligent system includes a set of opportunity miners. In embodiments, the unified set of adaptive intelligent system includes a set of robotic process automation systems. In embodiments, the unified set of adaptive intelligent system includes a set of data transformation systems. In embodiments, the unified set of adaptive intelligent system includes a set of data extraction systems. In embodiments, the unified set of adaptive intelligent system includes a set of data loading systems. In embodiments, the unified set of adaptive intelligent system includes a set of genetic programming systems. In embodiments, the unified set of adaptive intelligent system includes a set of image classification systems. In embodiments, the unified set of adaptive intelligent system includes a set of video compression systems.

In embodiments, the unified set of adaptive intelligent system includes a set of analog-to-digital transformation systems. In embodiments, the unified set of adaptive intelligent system includes a set of digital-to-analog transformation systems. In embodiments, the unified set of adaptive intelligent system includes a set of signal analysis systems. In embodiments, the unified set of adaptive intelligent system includes a set of RF filtering systems. In embodiments, the unified set of adaptive intelligent system includes a set of motion prediction systems. In embodiments, the unified set of adaptive intelligent system includes a set of object type recognition systems. In embodiments, the unified set of adaptive intelligent system includes a set of point cloud processing systems. In embodiments, the unified set of adaptive intelligent system includes a set of analog signal processing systems. In embodiments, the unified set of adaptive intelligent system includes a set of signal multiplexing systems. In embodiments, the unified set of adaptive intelligent system includes a set of data fusion systems.

In embodiments, the unified set of adaptive intelligent system includes a set of sensor fusion systems.

In embodiments, the unified set of adaptive intelligent system includes a set of data filtering systems.

In embodiments, the unified set of adaptive intelligent system includes a set of statistical signal processing systems. In embodiments, the unified set of adaptive intelligent system includes a set of signal filtering systems.

In embodiments, the unified set of adaptive intelligent system includes a set of signal processing systems. In embodiments, the unified set of adaptive intelligent system includes a set of protocol selection systems. In embodiments, the unified set of adaptive intelligent system includes a set of storage configuration systems. In embodiments, the unified set of adaptive intelligent system includes a set of power management systems. In embodiments, the unified set of adaptive intelligent system includes a set of clustering systems. In embodiments, the unified set of adaptive intelligent system includes a set of variation systems. In embodiments, the unified set of adaptive intelligent system includes a set of machine learning systems.

In embodiments, the unified set of adaptive intelligent system includes a set of event prediction systems. In embodiments, the unified set of adaptive intelligent system includes a set of autonomous control systems. In embodiments, the unified set of adaptive intelligent system includes a set of robotic control systems. In embodiments, the unified set of adaptive intelligent system includes a set of robotic process automation systems. In embodiments, the unified set of adaptive intelligent system includes a set of data visualization systems. In embodiments, the unified set of adaptive intelligent system includes a set of data normalization systems. In embodiments, the unified set of adaptive intelligent system includes a set of data cleansing systems.

In embodiments, the unified set of adaptive intelligent system includes a set of data deduplication systems. In embodiments, the unified set of adaptive intelligent system includes a set of graph-based data storage systems. In embodiments, the unified set of adaptive intelligent system includes a set of intelligent agent systems. In embodiments, the unified set of adaptive intelligent system includes a set of object-oriented data storage systems. In embodiments, the unified set of adaptive intelligent system includes a set of self-configuration systems. In embodiments, the unified set of adaptive intelligent system includes a set of self-healing systems. In embodiments, the unified set of adaptive intelligent system includes a set of self-organizing systems.

In embodiments, the unified set of adaptive intelligent system includes a set of self-organizing map systems. In embodiments, the unified set of adaptive intelligent system includes a set of cost-based routing systems. In embodiments, the unified set of adaptive intelligent system includes a set of handshake negotiation systems. In embodiments, the unified set of adaptive intelligent system includes a set of entity discovery systems. In embodiments, the unified set of adaptive intelligent system includes a set of cybersecurity systems. In embodiments, the unified set of adaptive intelligent system includes a set of biometric systems. In embodiments, the unified set of adaptive intelligent system includes a set of natural language processing systems. In embodiments, the unified set of adaptive intelligent system includes a set of speech processing systems. In embodiments, the unified set of adaptive intelligent system includes a set of voice recognition systems.

In embodiments, the unified set of adaptive intelligent system includes a set of sound processing systems.

In embodiments, the unified set of adaptive intelligent system includes a set of ultrasound processing systems. In embodiments, the unified set of adaptive intelligent system includes a set of artificial intelligence systems.

In embodiments, the unified set of adaptive intelligent system includes a set of rules engine systems.

In the embodiments, the unified set of adaptive intelligent system includes a set of workflow automation systems.

In embodiments, the unified set of adaptive intelligent system includes a set of opportunity discovery systems.

In embodiments, the unified set of adaptive intelligent system includes a set of physical modeling systems.

In embodiments, the unified set of adaptive intelligent system includes a set of testing systems.

In embodiments, the unified set of adaptive intelligent system includes a set of diagnostic systems.

In embodiments, the unified set of adaptive intelligent system includes a set of software image propagation systems. In embodiments, the unified set of adaptive intelligent system includes a set of peer-to-peer network configuration systems. In embodiments, the unified set of adaptive intelligent system includes a set of RF spectrum management systems. In embodiments, the unified set of adaptive intelligent system includes a set of network resource management systems. In embodiments, the unified set of adaptive intelligent system includes a set of storage management systems. In embodiments, the unified set of adaptive intelligent system includes a set of data management systems. In embodiments, the unified set of adaptive intelligent system includes a set of intrusion detection systems. In embodiments, the unified set of adaptive intelligent system includes a set of firewall systems. In embodiments, the unified set of adaptive intelligent system includes a set of virtualization systems. In embodiments, the unified set of adaptive intelligent system includes a set of digital twin systems.

In embodiments, the unified set of adaptive intelligent system includes a set of Internet of Things monitoring systems. In embodiments, the unified set of adaptive intelligent system includes a set of routing systems.

In embodiments, the unified set of adaptive intelligent system includes a set of switching systems.

In embodiments, the unified set of adaptive intelligent system includes a set of indoor location systems.

In embodiments, the unified set of adaptive intelligent system includes a set of geolocation systems.

In embodiments, the unified set of adaptive intelligent system includes a set of parsing systems.

In embodiments, the unified set of adaptive intelligent system includes a set of semantic filtering systems.

In embodiments, the unified set of adaptive intelligent system includes a set of machine vision systems.

In embodiments, the unified set of adaptive intelligent system includes a set of fuzzy logic systems.

In embodiments, the unified set of adaptive intelligent system includes a set of recommendation systems.

In embodiments, the unified set of adaptive intelligent system includes a set of dialog management systems.

In embodiments, the set of interfaces includes a demand management interface and a supply chain management interface. In embodiments, the interface is a user interface for a command center dashboard by which an enterprise orchestrates a set of value chain entities related to a type of product. In embodiments, the interface is a user interface of a local management system located in an environment that hosts a set of value chain entities.

In embodiments, the local management system user interface facilitates configuration of a set of network connections for the adaptive intelligence systems. In embodiments, the local management system user interface facilitates configuration of a set of data storage resources for the adaptive intelligence systems.

In embodiments, the local management system user interface facilitates configuration of a set of data integration capabilities for the adaptive intelligence systems. In embodiments, the local management system user interface facilitates configuration of a set of machine learning input resources for the adaptive intelligence systems.

In embodiments, the local management system user interface facilitates configuration of a set of power resources that support the adaptive intelligence systems. In embodiments, the local management system user interface facilitates configuration of a set of workflows that are managed by the adaptive intelligence systems.

In embodiments, the interface is a user interface of a mobile computing device that has a network connection to the adaptive intelligence systems. In embodiments, the interface is an application programming interface.

In embodiments, the application programming interface facilitates exchange of data between the adaptive intelligence systems and a cloud-based artificial intelligence system. In embodiments, the application programming interface facilitates exchange of data between the adaptive intelligence systems and a real-time operating system of a cloud data management platform. In embodiments, the application programming interface facilitates exchange of data between the adaptive intelligence systems and a computational facility of a cloud data management platform. In embodiments, the application programming interface facilitates exchange of data between the adaptive intelligence systems and a set of environmental sensors that collect data about an environment that hosts a set of value chain network entities. In embodiments, the application programming interface facilitates exchange of data between the adaptive intelligence systems and a set of sensors that collect data about a product. In embodiments, the application programming interface facilitates exchange of data between the adaptive intelligence systems and a set of sensors that collect data published by an intelligent product. In embodiments, the application programming interface facilitates exchange of data between the adaptive intelligence systems and a set of sensors that collect data published by a set of Internet of Things systems that are disposed in an environment that hosts a set of value chain network entities. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise.

In embodiments, the set of adaptive intelligence facilities for automating a set of capabilities of the platform includes an edge intelligence system deployed in a supply chain infrastructure facility operated by the enterprise.

In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise.

In embodiments, the set of adaptive intelligence facilities for automating a set of capabilities of the platform includes a smart contract system for automating a set of interactions among a set of value chain network entities.

In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities. In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise. In embodiments, the set of applications includes a set of applications of at least two types from among a set of supply chain management applications, demand management applications, intelligent product applications and enterprise resource management applications.

In embodiments, the set of applications includes an asset management application. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods. In embodiments, the set of project management facilities are configured to manage a set of projects selected from the set of procurement projects, logistics projects, reverse logistics projects, fulfillment projects, distribution projects, warehousing projects, inventory management projects, product design projects, product management projects, shipping projects, maritime projects, loading or unloading projects, packing projects, purchasing projects, marketing projects, sales projects, analytics projects, demand management projects, demand planning projects, and resource planning projects.

In embodiments, the project management facilities are configured to manage a set of procurement projects. In embodiments, the project management facilities are configured to manage a set of logistics projects. In embodiments, the project management facilities are configured to manage a set of reverse logistics projects. In embodiments, the project management facilities are configured to manage a set of fulfillment projects. In embodiments, the project management facilities are configured to manage a set of distribution projects. In embodiments, the project management facilities are configured to manage a set of warehousing projects.

In embodiments, the project management facilities are configured to manage a set of inventory management projects. In embodiments, the project management facilities are configured to manage a set of product design projects. In embodiments, the project management facilities are configured to manage a set of product management projects. In embodiments, the project management facilities are configured to manage a set of shipping projects. In embodiments, the project management facilities are configured to manage a set of maritime projects. In embodiments, the project management facilities are configured to manage a set of loading or unloading projects. In embodiments, the project management facilities are configured to manage a set of packing projects. In embodiments, the project management facilities are configured to manage a set of purchasing projects.

In embodiments, the project management facilities are configured to manage a set of marketing projects.

In embodiments, the project management facilities are configured to manage a set of sales projects.

In embodiments, the project management facilities are configured to manage a set of analytics projects.

In embodiments, the project management facilities are configured to manage a set of demand management projects. In embodiments, the project management facilities are configured to manage a set of demand planning projects. In embodiments, the project management facilities are configured to manage a set of resource planning projects. In embodiments, the set of interfaces includes a demand management interface and a supply chain management interface. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise. In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities.

In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities. In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise. In embodiments, the set of applications includes a set of applications of at least two types from among a set of supply chain management applications, demand management applications, intelligent product applications and enterprise resource management applications. In embodiments, the set of applications includes an asset management application. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors. In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, the set of facilities that provide automated recommendations for a set of value chain process tasks provide recommendations involving activities selected from the group consisting of product configuration activities, product selection activities for a customer, supplier selection activities, shipper selection activities, route selection activities, factory selection activities, product assortment activities, product management activities, logistics activities, reverse logistics activities, artificial intelligence configuration activities, maintenance activities, product support activities, product recommendation activities. In embodiments, the automated recommendations relate to a set of product configuration activities. In embodiments, the automated recommendations relate to a set of product selection activities for a customer. In embodiments, the automated recommendations relate to a set of supplier selection activities. In embodiments, the automated recommendations relate to a set of shipper selection activities. In embodiments, the automated recommendations relate to a set of route selection activities. In embodiments, the automated recommendations relate to a set of factory selection activities. In embodiments, the automated recommendations relate to a set of product assortment activities. In embodiments, the automated recommendations relate to a set of product management activities. In embodiments, the automated recommendations relate to a set of logistics activities. In embodiments, the automated recommendations relate to a set of reverse logistics activities. In embodiments, the automated recommendations relate to a set of artificial intelligence configuration activities. In embodiments, the automated recommendations relate to a set of maintenance activities. In embodiments, the automated recommendations relate to a set of product support activities. In embodiments, the automated recommendations relate to a set of product recommendation activities. In embodiments, the set of interfaces includes a demand management interface and a supply chain management interface. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise. In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities.

In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise.

In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors.

In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform for a value chain network with a micro-services architecture, a set of interfaces, network connectivity facilities, adaptive intelligence facilities, data storage facilities, and monitoring facilities that are coordinated for monitoring and management of a set of value chain network entities; and a set of applications for enabling an enterprise to manage a set of value chain network entities from a point of origin to a point of customer use; wherein a set of routing facilities generate a set of routing instructions for routing information among a set of nodes in the value chain network based on current status information for the value chain network.

In embodiments, the set of routing facilities that generate a set of routing instructions for routing information among a set of nodes in the value chain network use a routing system selected from the group consisting of priority-based routing, master controller routing, least cost routing, rule-based routing, genetically programmed routing, random linear network coding routing, traffic-based routing, spectrum-based routing, RF condition-based routing, energy-based routing, latency-sensitive routing, protocol compatibility based routing, dynamic spectrum access routing, peer-to-peer negotiated routing, and queue-based routing. In embodiments, the routing includes priority-based routing. In embodiments, the routing includes master controller routing. In embodiments, the routing includes least cost routing. In embodiments, the routing includes rule-based routing. In embodiments, the routing includes genetically programmed routing. In embodiments, the routing includes random linear network coding routing. In embodiments, the routing includes traffic-based routing. In embodiments, the routing includes spectrum-based routing. In embodiments, the routing includes RF condition-based routing. In embodiments, the routing includes energy-based routing. In embodiments, the routing includes latency-sensitive routing. In embodiments, the routing includes protocol compatibility-based routing. In embodiments, the routing includes dynamic spectrum access routing. In embodiments, the routing includes peer-to-peer negotiated routing.

In embodiments, the routing includes queue-based routing. In embodiments, the status information for the value chain network is selected from the group consisting of traffic status, congestion status, bandwidth status, operating status, workflow progress status, incident status, damage status, safety status, power availability status, worker status, data availability status, predicted system status, shipment location status, shipment timing status, delivery status, anticipated delivery status, environmental condition status, system diagnostic status, system fault status, cybersecurity status, compliance status, demand status, supply status, price status, volatility status, need status, interest status, aggregate status for a group or population, and individual status. In embodiments, the status information involves traffic status. In embodiments, the status information involves congestion status. In embodiments, the status information involves bandwidth status. In embodiments, the status information involves operating status. In embodiments, the status information involves workflow progress status. In embodiments, the status information involves incident status. In embodiments, the status information involves damage status. In embodiments, the status information involves safety status. In embodiments, the status information involves power availability status. In embodiments, the status information involves worker status. In embodiments, the status information involves data availability status. In embodiments, the status information involves predicted system status. In embodiments, the status information involves shipment location status. In embodiments, the status information involves shipment timing status. In embodiments, the status information involves delivery status. In embodiments, the status information involves anticipated delivery status. In embodiments, the status information involves environmental condition status. In embodiments, the status information involves system diagnostic status. In embodiments, the status information involves system fault status. In embodiments, the status information involves cybersecurity status. In embodiments, the status information involves compliance status.

In embodiments, the set of interfaces includes a demand management interface and a supply chain management interface. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise In embodiments, the set of network connectivity facilities for enabling a set of value chain network entities to connect to the platform includes a cognitive networking system deployed in a supply chain infrastructure facility operated by the enterprise.

In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise. In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger.

In embodiments, the set of data storage facilities for storing data collected and handled by the platform uses graph database representing a set of hierarchical relationships of value chain network entities.

In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise.

In embodiments, the set of applications includes a set of applications of at least two types from among a set of supply chain management applications, demand management applications, intelligent product applications and enterprise resource management applications. In embodiments, the set of applications includes an asset management application. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors. In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a dashboard for managing a set of digital twins, wherein at least one digital twin represents a set of supply chain entities, workflows and assets and at least one other digital twin represents a set of demand management entities and workflows. In embodiments, the dashboard for managing a set of digital twins, wherein at least one digital twin represents a set of supply chain entities and workflows and at least one other digital twin represents a set of demand management entities and workflows.

In embodiments, the entities and workflows relate to a set of products of an enterprise. In embodiments, the entities and workflows relate to a set of suppliers of an enterprise. In embodiments, the entities and workflows relate to a set of producers of a set of products. In embodiments, the entities and workflows relate to a set of manufacturers of a set of products. In embodiments, the entities and workflows relate to a set of retailers of a line of products. In embodiments, the entities and workflows relate to a set of businesses involved in an ecosystem for a category of products. In embodiments, the entities and workflows relate to a set of owners of a set of assets involved in a value chain for a set of products. In embodiments, the entities and workflows relate to a set of operators of a set of assets involved in a value chain for a set of products. In embodiments, the entities and workflows relate to a set of operating facilities. In embodiments, the entities and workflows relate to a set of customers. In embodiments, the entities and workflows relate to a set of consumers. In embodiments, the entities and workflows relate to a set of workers. In embodiments, the entities and workflows relate to a set of mobile devices. In embodiments, the entities and workflows relate to a set of wearable devices. In embodiments, the entities and workflows relate to a set of distributors. In embodiments, the entities and workflows relate to a set of resellers. In embodiments, the entities and workflows relate to a set of supply chain infrastructure facilities.

In embodiments, the entities and workflows relate to a set of supply chain processes. In embodiments, the entities and workflows relate to a set of logistics processes. In embodiments, the entities and workflows relate to a set of reverse logistics processes. In embodiments, the entities and workflows relate to a set of demand prediction processes. In embodiments, the entities and workflows relate to a set of demand management processes.

In embodiments, the entities and workflows relate to a set of demand aggregation processes. In embodiments, the entities and workflows relate to a set of machines. In embodiments, the entities and workflows relate to a set of ships. In embodiments, the entities and workflows relate to a set of barges. In embodiments, the entities and workflows relate to a set of warehouses. In embodiments, the entities and workflows relate to a set of maritime ports. In embodiments, the entities and workflows relate to a set of airports. In embodiments, the entities and workflows relate to a set of airways. In embodiments the entities and workflows relate to a set of waterways. In embodiments, the entities and workflows relate to a set of roadways. In embodiments, the entities and workflows relate to a set of railways. In embodiments, the entities and workflows relate to a set of bridges. In embodiments, the entities and workflows relate to a set of tunnels. In embodiments, the entities and workflows relate to a set of online retailers. In embodiments, the entities and workflows relate to a set of ecommerce sites. In embodiments, the entities and workflows relate to a set of demand factors. In embodiments, the entities and workflows relate to a set of supply factors. In embodiments, the entities and workflows relate to a set of delivery systems. In embodiments, the entities and workflows relate to a set of floating assets. In embodiments, the entities and workflows relate to a set of points of origin. In embodiments, the entities and workflows relate to a set of points of destination. In embodiments, the entities and workflows relate to a set of points of storage. In embodiments the entities and workflows relate to a set of points of product usage. In embodiments the entities and workflows relate to a set of networks. In embodiments, the entities and workflows relate to a set of information technology systems. In embodiments, the entities and workflows relate to a set of software platforms. In embodiments, the entities and workflows relate to a set of distribution centers. In embodiments, the entities and workflows relate to a set of fulfillment centers. In embodiments, the entities and workflows relate to a set of containers.

In embodiments, the entities and workflows relate to a set of container handling facilities. In embodiments, the entities and workflows relate to a set of customs. In embodiments, the entities and workflows relate to a set of export control. In embodiments, the entities and workflows relate to a set of border control. In embodiments, the entities and workflows relate to a set of drones. In embodiments, the entities and workflows relate to a set of robots. In embodiments, the entities and workflows relate to a set of autonomous vehicles. In embodiments, the entities and workflows relate to a set of hauling facilities. In embodiments, the entities and workflows relate to a set of drones, robots and autonomous vehicles. In embodiments, the entities and workflows relate to a set of waterways. In embodiments, the entities and workflows relate to a set of port infrastructure facilities.

In embodiments, the set of digital twins is selected from the set of distribution twins, warehousing twins, port infrastructure twins, shipping facility twins, operating facility twins, customer twins, worker twins, wearable device twins, portable device twins, mobile device twins, process twins, machine twins, asset twins, product twins, point of origin twins, point of destination twins, supply factor twins, maritime facility twins, floating asset twins, shipyard twins, fulfillment twins, delivery system twins, demand factors twins, retailer twins, ecommerce twins, online twins, waterway twins, roadway twins, roadway twins, railway twins, air facility twins, aircraft twins, ship twins, vehicle twins, train twins, autonomous vehicle twins, robotic system twins, drone twins, and logistics factor twins.

In embodiments, the set of interfaces includes a demand management interface and a supply chain management interface. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise.

In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise. In embodiments the set of adaptive intelligence facilities for automating a set of capabilities of the platform includes a robotic process automation system. In embodiments the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise.

In embodiments, the set of adaptive intelligence facilities for automating a set of capabilities of the platform includes a smart contract system for automating a set of interactions among a set of value chain network entities.

In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities. In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise. In embodiments, the set of applications includes a set of applications of at least two types from among a set of supply chain management applications, demand management applications, intelligent product applications and enterprise resource management applications.

In embodiments, the set of applications includes an asset management application. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the platform manages a set of demand factors, a set of supply factors and a set of supply chain infrastructure facilities.

In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors.

In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of microservices layers including an application layer supporting at least one supply chain application and at least one demand management application, wherein the applications of the application layer use a common set of services among a set of data processing services, data collection services, and data storage services. In embodiments, the set of interfaces includes a demand management interface and a supply chain management interface. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise.

In embodiments, the set of adaptive intelligence facilities for automating a set of capabilities of the platform includes an edge intelligence system deployed in a supply chain infrastructure facility operated by the enterprise.

In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities. In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise. In embodiments, the set of applications includes a set of applications of at least two types from among a set of supply chain management applications, demand management applications, intelligent product applications and enterprise resource management applications. In embodiments, the set of applications includes an asset management application. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the platform manages a set of demand factors, a set of supply factors and a set of supply chain infrastructure facilities.

In embodiment, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors. In embodiment, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities. In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a microservices architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, the set of interfaces includes a demand management interface and a supply chain management interface. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise. In embodiments, the set of network connectivity facilities for enabling a set of value chain network entities to connect to the platform includes a peer-to-peer network system deployed in a supply chain infrastructure facility operated by the enterprise.

In embodiments, the set of adaptive intelligence facilities for automating a set of capabilities of the platform includes an edge intelligence system deployed in a supply chain infrastructure facility operated by the enterprise.

In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture. In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities. In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise. In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, the set of interfaces includes a demand management interface and a supply chain management interface. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise.

In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise. In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture.

In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities.

In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise.

In embodiments, the set of applications includes a set of applications of at least two types from among a set of supply chain management applications, demand management applications, intelligent product applications and enterprise resource management applications. In embodiments, the set of applications includes an asset management application. In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities. In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors. In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, an information technology system including a cloud-based management platform with a micro-services architecture; and a set of interfaces, network connectivity facilities, adaptive intelligence facilities, data storage facilities, and monitoring facilities; and a set of applications for enabling an enterprise to manage a set of value chain network entities from a point of origin to a point of customer use.

In embodiments, the set of interfaces includes a demand management interface and a supply chain management interface. In embodiments, the set of demand management applications, supply chain applications, intelligent product applications and enterprise resource management applications are selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications. In embodiments, the set of network connectivity facilities for enabling a set of value chain network entities to connect to the platform includes a 5G network system deployed in a supply chain infrastructure facility operated by the enterprise. In embodiments, the set of network connectivity facilities for enabling a set of value chain network entities to connect to the platform includes an Internet of Things system deployed in a supply chain infrastructure facility operated by the enterprise. In embodiments, the set of network connectivity facilities for enabling a set of value chain network entities to connect to the platform includes a cognitive networking system deployed in a supply chain infrastructure facility operated by the enterprise.

In embodiments, the set of network connectivity facilities for enabling a set of value chain network entities to connect to the platform includes a peer-to-peer network system deployed in a supply chain infrastructure facility operated by the enterprise. In embodiments, the set of adaptive intelligence facilities for automating a set of capabilities of the platform includes an edge intelligence system deployed in a supply chain infrastructure facility operated by the enterprise. In embodiments, the set of adaptive intelligence facilities for automating a set of capabilities of the platform includes a robotic process automation system. In embodiments, the set of adaptive intelligence facilities for automating a set of capabilities of the platform includes a self-configuring data collection system deployed in a supply chain infrastructure facility operated by the enterprise. In embodiments, the set of adaptive intelligence facilities for automating a set of capabilities of the platform includes a digital twin system representing attributes of value chain network entity controlled by the enterprise. In embodiments, the set of adaptive intelligence facilities for automating a set of capabilities of the platform includes a smart contract system for automating a set of interactions among a set of value chain network entities. In embodiments, the set of data storage facilities for storing data collected and handled by the platform uses a distributed data architecture.

In embodiments, the set of data storage facilities for storing data collected and handled by the platform uses a blockchain. In embodiments, the set of data storage facilities for storing data collected and handled by the platform uses a distributed ledger. In embodiments, the set of data storage facilities for storing data collected and handled by the platform uses graph database representing a set of hierarchical relationships of value chain network entities.

In embodiments, the set of monitoring facilities for monitoring the value chain network entities includes an Internet of Things monitoring system. In embodiments, the set of monitoring facilities for monitoring the value chain network entities includes a sensor system deployed in an infrastructure facility operated by an enterprise.

In embodiments, the set of applications includes a set of applications of at least two types from among a set of supply chain management applications, demand management applications, intelligent product applications and enterprise resource management applications. In embodiments, the set of applications includes an asset management application.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the platform manages a set of demand factors, a set of supply factors and a set of supply chain infrastructure facilities. In embodiments, the supply factors are factors selected from the group consisting of Component availability, material availability, component location, material location, component pricing, material pricing, taxation, tariff, impost, duty, import regulation, export regulation, border control, trade regulation, customs, navigation, traffic, congestion, vehicle capacity, ship capacity, container capacity, package capacity, vehicle availability, ship availability, container availability, package availability, vehicle location, ship location, container location, port location, port availability, port capacity, storage availability, storage capacity, warehouse availability, warehouse capacity, fulfillment center location, fulfillment center availability, fulfillment center capacity, asset owner identity, system compatibility, worker availability, worker competency, worker location, goods pricing, fuel pricing, energy pricing, route availability, route distance, route cost, and route safety factors.

In embodiments, the demand factors are factors selected from the group consisting of product availability, product pricing, delivery timing, need for refill, need for replacement, manufacturer recall, need for upgrade, need for maintenance, need for update, need for repair, need for consumable, taste, preference, inferred need, inferred want, group demand, individual demand, family demand, business demand, need for workflow, need for process, need for procedure, need for treatment, need for improvement, need for diagnosis, compatibility to system, compatibility to product, compatibility to style, compatibility to brand, demographic, psychographic, geolocation, indoor location, destination, route, home location, visit location, workplace location, business location, personality, mood, emotion, customer behavior, business type, business activity, personal activity, wealth, income, purchasing history, shopping history, search history, engagement history, clickstream history, website history, online navigation history, group behavior, family behavior, family membership, customer identity, group identity, business identity, customer profile, business profile, group profile, family profile, declared interest, and inferred interest factors. In embodiments, the supply chain infrastructure facilities are facilities selected from the group consisting of ship, container ship, boat, barge, maritime port, crane, container, container handling, shipyard, maritime dock, warehouse, distribution, fulfillment, fueling, refueling, nuclear refueling, waste removal, food supply, beverage supply, drone, robot, autonomous vehicle, aircraft, automotive, truck, train, lift, forklift, hauling facilities, conveyor, loading dock, waterway, bridge, tunnel, airport, depot, vehicle station, train station, weigh station, inspection, roadway, railway, highway, customs house, and border control facilities.

In embodiments, the set of applications involves a set selected from the group consisting of supply chain, asset management, risk management, inventory management, demand management, demand prediction, demand aggregation, pricing, positioning, placement, promotion, blockchain, smart contract, infrastructure management, facility management, analytics, finance, trading, tax, regulatory, identity management, commerce, ecommerce, payments, security, safety, vendor management, process management, compatibility testing, compatibility management, infrastructure testing, incident management, predictive maintenance, logistics, monitoring, remote control, automation, self-configuration, self-healing, self-organization, logistics, reverse logistics, waste reduction, augmented reality, virtual reality, mixed reality, demand customer profiling, entity profiling, enterprise profiling, worker profiling, workforce profiling, component supply policy management, product design, product configuration, product updating, product maintenance, product support, product testing, warehousing, distribution, fulfillment, kit configuration, kit deployment, kit support, kit updating, kit maintenance, kit modification, kit management, shipping fleet management, vehicle fleet management, workforce management, maritime fleet management, navigation, routing, shipping management, opportunity matching, search, advertisement, entity discovery, entity search, distribution, delivery, and enterprise resource planning applications.

In embodiments, an information technology system including a cloud-based management platform with a micro-services architecture, a set of interfaces, network connectivity facilities, adaptive intelligence facilities, data storage facilities, and monitoring facilities that are coordinated for monitoring and management of a set of value chain network entities; and a set of robotic process automation systems for automating a set of processes in a value chain network, wherein the robotic process automation systems learn on a training set of data involving a set of user interactions with a set of interfaces of a set of software systems that are used to monitor and manage the value chain network entities.

In embodiments, the value chain network entities are selected from the group consisting of products, suppliers, producers, manufacturers, retailers, businesses, owners, operators, operating facilities, customers, consumers, workers, mobile devices, wearable devices, distributors, resellers, supply chain infrastructure facilities, supply chain processes, logistics processes, reverse logistics processes, demand prediction processes, demand management processes, demand aggregation processes, machines, ships, barges, warehouses, maritime ports, airports, airways, waterways, roadways, railways, bridges, tunnels, online retailers, ecommerce sites, demand factors, supply factors, delivery systems, floating assets, points of origin, points of destination, points of storage, points of use, networks, information technology systems, software platforms, distribution centers, fulfillment centers, containers, container handling facilities, customs, export control, border control, drones, robots, autonomous vehicles, hauling facilities, drones/robots/AVs, waterways, and port infrastructure facilities.

In embodiments, the process automated by the robotic process automation system involves selection of a vendor for a component. In embodiments, the process automated by the robotic process automation system involves selection of a vendor for a finished goods order. In embodiments, the process automated by the robotic process automation system involves selection of a variation of a product for marketing. In embodiments, the process automated by the robotic process automation system involves selection of an assortment of goods for a shelf.

In embodiments, the process automated by the robotic process automation system involves determination of a price for a finished good. In embodiments, the process automated by the robotic process automation system involves configuration of a service offer related to a product. In embodiments, the process automated by the robotic process automation system involves configuration of product bundle. In embodiments, the process automated by the robotic process automation system involves configuration of a product kit. In embodiments, the process automated by the robotic process automation system involves configuration of a product package. In embodiments, the process automated by the robotic process automation system involves configuration of a product display. In embodiments, the process automated by the robotic process automation system involves configuration of a product image. In embodiments, the process automated by the robotic process automation system involves configuration of a product description. In embodiments, the process automated by the robotic process automation system involves configuration of a website navigation path related to a product. In embodiments, the process automated by the robotic process automation system involves determination of an inventory level for a product. In embodiments, the process automated by the robotic process automation system involves selection of a logistics type. In embodiments, the process automated by the robotic process automation system involves configuration of a schedule for product delivery. In embodiments, the process automated by the robotic process automation system involves configuration of a logistics schedule. In embodiments, the process automated by the robotic process automation system involves configuration of a set of inputs for machine learning. In embodiments, the process automated by the robotic process automation system involves preparation of product documentation. In embodiments, the process automated by the robotic process automation system involves preparation of required disclosures about a product. In embodiments, the process automated by the robotic process automation system involves configuration of a product for a set of local requirements. In embodiments, the process automated by the robotic process automation system involves configuration of a set of products for compatibility. In embodiments, the process automated by the robotic process automation system involves configuration of a request for proposals. In embodiments, the process automated by the robotic process automation system involves ordering of equipment for a warehouse.

In embodiments, the process automated by the robotic process automation system involves ordering of equipment for a fulfillment center. In embodiments, the process automated by the robotic process automation system involves classification of a product defect in an image. In embodiments, the process automated by the robotic process automation system involves inspection of a product in an image. In embodiments, the process automated by the robotic process automation system involves inspection of product quality data from a set of sensors. In embodiments, the process automated by the robotic process automation system involves inspection of data from a set of onboard diagnostics on a. product. In embodiments, the process automated by the robotic process automation system involves inspection of diagnostic data from an Internet of Things system. In embodiments, the process automated by the robotic process automation system involves review of sensor data from environmental sensors in a set of supply chain environments. In embodiments, the process automated by the robotic process automation system involves selection of inputs for a digital twin. In embodiments, the process automated by the robotic process automation system involves selection of outputs from a digital twin. In embodiments, the process automated by the robotic process automation system involves selection of visual elements for presentation in a digital twin. In embodiments, the process automated by the robotic process automation system involves diagnosis of sources of delay in a supply chain. In embodiments, the process automated by the robotic process automation system involves diagnosis of sources of scarcity in a supply chain. In embodiments, wherein the process automated by the robotic process automation system involves diagnosis of sources of congestion in a supply chain. In embodiments, the process automated by the robotic process automation system involves diagnosis of sources of cost overruns in a supply chain. In embodiments, the process automated by the robotic process automation system involves diagnosis of sources of product defects in a supply chain.

In embodiments, the process automated by the robotic process automation system involves prediction of maintenance requirements in supply chain infrastructure.

In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a user interface that provides a set of unified views for a set of demand management information and supply chain information for a category of goods. In embodiments, a value chain network information technology system including a cloud-based management platform with a micro-services architecture, a set of interfaces, network connectivity facilities, adaptive intelligence facilities, data storage facilities, and monitoring facilities;

a set of applications for enabling an enterprise to manage a set of value chain network entities from a point of origin to a point of customer use; and a unified database that supports a set of demand management applications, a set of supply chain applications, a set of intelligent product applications and a set of enterprise resource management applications for a category of goods. In embodiments, a value chain network information technology system including a cloud-based management platform with a micro-services architecture, a set of interfaces, network connectivity facilities, adaptive intelligence facilities, data storage facilities, and monitoring facilities;

a set of applications for enabling an enterprise to manage a set of value chain network entities from a point of origin to a point of customer use; and a unified set of data collection systems that support a set of demand management applications, a set of supply chain applications, a set of intelligent product applications and a set of enterprise resource management applications for a category of goods. In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a unified set of Internet of Things systems that provide coordinated monitoring of a set of demand management applications, a set of supply chain applications, a set of intelligent product applications and a set of enterprise resource management applications for a category of goods. In embodiments, a value chain network information technology system including a cloud-based management platform with a micro-services architecture, a set of interfaces, network connectivity facilities, adaptive intelligence facilities, data storage facilities, and monitoring facilities;

a set of applications for enabling an enterprise to manage a set of value chain network entities from a point of origin to a point of customer use; and a set of supply chain applications for management of a set of demand management applications; and a machine vision system and a digital twin system, wherein the machine vision system feeds data to the digital twin system. In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a unified set of adaptive edge computing systems that provide coordinated edge computation for a set of demand management applications, a set of supply chain applications, a set of intelligent product applications and a set of enterprise resource management applications for a category of goods.

In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a unified set of robotic process automation systems that provide coordinated automation among at least two types of applications from among a set of demand management applications, a set of supply chain applications, a set of intelligent product applications and a set of enterprise resource management applications for a category of goods.

In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a unified set of adaptive intelligence systems that provide coordinated intelligence for a set of demand management applications, a set of supply chain applications, a set of intelligent product applications and a set of enterprise resource management applications for a category of goods. In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods. In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods. In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use, wherein a set of routing facilities generate a set of routing instructions for routing information among a set of nodes in the value chain network based on current status information for the value chain network.

In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a dashboard for managing a set of digital twins, wherein at least one digital twin represents a set of supply chain entities, workflows and assets and at least one other digital twin represents a set of demand management entities and workflows.

In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a set of microservices layers including an application layer supporting at least one supply chain application and at least one demand management application, wherein the applications of the application layer use a common set of services among a set of data processing services, data collection services, and data storage services. In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of Internet of Things resources that collect information with respect to supply chain entities and demand management entities. In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of social network sources that provide information with respect to supply chain entities and demand management entities. In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments a, value chain network information technology system including a cloud-based management platform with a micro-services architecture, a set of interfaces, network connectivity facilities, adaptive intelligence facilities, data storage facilities, and monitoring facilities; a set of applications for enabling an enterprise to manage a set of value chain network entities from a point of origin to a point of customer use; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities. In embodiments, a value chain network information technology system including a user interface that provides a set of unified views for a set of demand management information and supply chain information for a category of goods; and a unified database that supports a set of demand management applications, a set of supply chain applications, a set of intelligent product applications and a set of enterprise resource management applications for a category of goods.

In embodiments, a value chain network information technology system including a user interface that provides a set of unified views for a set of demand management information and supply chain information for a category of goods; and a unified set of data collection systems that support a set of demand management applications, a set of supply chain applications, a set of intelligent product applications and a set of enterprise resource management applications for a category of goods.

In embodiments, a value chain network information technology system including a user interface that provides a set of unified views for a set of demand management information and supply chain information for a category of goods; and a unified set of Internet of Things systems that provide coordinated monitoring of a set of demand management applications, a set of supply chain applications, a set of intelligent product applications and a set of enterprise resource management applications for a category of goods.

In embodiments, a value chain network information technology system including a user interface that provides a set of unified views for a set of demand management information and supply chain information for a category of goods; a set of supply chain applications for management of a set of demand management applications; and a machine vision system and a digital twin system, wherein the machine vision system feeds data to the digital twin system. In embodiments, a value chain network information technology system including a user interface that provides a set of unified views for a set of demand management information and supply chain information for a category of goods; and a unified set of adaptive edge computing systems that provide coordinated edge computation for a set of demand management applications, a set of supply chain applications, a set of intelligent product applications and a set of enterprise resource management applications for a category of goods.

In embodiments, a value chain network information technology system including a user interface that provides a set of unified views for a set of demand management information and supply chain information for a category of goods; and a unified set of robotic process automation systems that provide coordinated automation among at least two types of applications from among a set of demand management applications, a set of supply chain applications, a set of intelligent product applications and a set of enterprise resource management applications for a category of goods.

In embodiments, a value chain network information technology system including a user interface that provides a set of unified views for a set of demand management information and supply chain information for a category of goods; and a unified set of adaptive intelligence systems that provide coordinated intelligence for a set of demand management applications, a set of supply chain applications, a set of intelligent product applications and a set of enterprise resource management applications for a category of goods.

In embodiments, a value chain network information technology system including a user interface that provides a set of unified views for a set of demand management information and supply chain information for a category of goods; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, a value chain network information technology system including a user interface that provides a set of unified views for a set of demand management information and supply chain information for a category of goods; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, value chain network information technology system including a user interface that provides a set of unified views for a set of demand management information and supply chain information for a category of goods; and a management platform for a value chain network, wherein a set of routing facilities generate a set of routing instructions for routing information among a set of nodes in the value chain network based on current status information for the value chain network.

In embodiments, a value chain network information technology system including a user interface that provides a set of unified views for a set of demand management information and supply chain information for a category of goods; and a dashboard for managing a set of digital twins, wherein at least one digital twin represents a set of supply chain entities, workflows and assets and at least one other digital twin represents a set of demand management entities and workflows.

In embodiments, a value chain network information technology system including a user interface that provides a set of unified views for a set of demand management information and supply chain information for a category of goods; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a user interface that provides a set of unified views for a set of demand management information and supply chain information for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a user interface that provides a set of unified views for a set of demand management information and supply chain information for a category of goods; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a user interface that provides a set of unified views for a set of demand management information and supply chain information for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a user interface that provides a set of unified views for a set of demand management information and supply chain information for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a user interface that provides a set of unified views for a set of demand management information and supply chain information for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a unified database that supports a set of demand management applications, a set of supply chain applications, a set of intelligent product applications and a set of enterprise resource management applications for a category of goods; and a unified set of data collection systems that support a set of demand management applications, a set of supply chain applications, a set of intelligent product applications and a set of enterprise resource management applications for a category of goods.

In embodiments, a value chain network information technology system including a unified database that supports a set of demand management applications, a set of supply chain applications, a set of intelligent product applications and a set of enterprise resource management applications for a category of goods; and a unified set of Internet of Things systems that provide coordinated monitoring of a set of demand management applications, a set of supply chain applications, a set of intelligent product applications and a set of enterprise resource management applications for a category of goods.

In embodiments, a value chain network information technology system including a unified database that supports a set of demand management applications, a set of supply chain applications, a set of intelligent product applications and a set of enterprise resource management applications for a category of goods; a set of supply chain applications for management of a set of demand management applications; and a machine vision system and a digital twin system, wherein the machine vision system feeds data to the digital twin system.

In embodiments, value chain network information technology system including a unified database that supports a set of demand management applications, a set of supply chain applications, a set of intelligent product applications and a set of enterprise resource management applications for a category of goods; and a unified set of adaptive edge computing systems that provide coordinated edge computation for a set of demand management applications, a set of supply chain applications, a set of intelligent product applications and a set of enterprise resource management applications for a category of goods.

In embodiments, a value chain network information technology system including a unified database that supports a set of demand management applications, a set of supply chain applications, a set of intelligent product applications and a set of enterprise resource management applications for a category of goods; and a unified set of robotic process automation systems that provide coordinated automation among at least two types of applications from among a set of demand management applications, a set of supply chain applications, a set of intelligent product applications and a set of enterprise resource management applications for a category of goods. In embodiments, a value chain network information technology system including a unified database that supports a set of demand management applications, a set of supply chain applications, a set of intelligent product applications and a set of enterprise resource management applications for a category of goods; and a unified set of adaptive intelligence systems that provide coordinated intelligence for a set of demand management applications, a set of supply chain applications, a set of intelligent product applications and a set of enterprise resource management applications for a category of goods.

In embodiments, a value chain network information technology system including a unified database that supports a set of demand management applications, a set of supply chain applications, a set of intelligent product applications and a set of enterprise resource management applications for a category of goods; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, a value chain network information technology system including a unified database that supports a set of demand management applications, a set of supply chain applications, a set of intelligent product applications and a set of enterprise resource management applications for a category of goods; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, a value chain network information technology system including a unified database that supports a set of demand management applications, a set of supply chain applications, a set of intelligent product applications and a set of enterprise resource management applications for a category of goods; and a management platform for a value chain network, wherein a set of routing facilities generate a set of routing instructions for routing information among a set of nodes in the value chain network based on current status information for the value chain network.

In embodiments, a value chain network information technology system including a unified database that supports a set of demand management applications, a set of supply chain applications, a set of intelligent product applications and a set of enterprise resource management applications for a category of goods; and a dashboard for managing a set of digital twins, wherein at least one digital twin represents a set of supply chain entities, workflows and assets and at least one other digital twin represents a set of demand management entities and workflows.

In embodiments, a value chain network information technology system including a unified database that supports a set of demand management applications, a set of supply chain applications, a set of intelligent product applications and a set of enterprise resource management applications for a category of goods; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a unified database that supports a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a unified database that supports a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a unified database that supports a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified database that supports a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified database that supports a set of demand management applications, a set of supply chain applications, a set of intelligent product applications and a set of enterprise resource management applications for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a unified set of data collection systems that support a set of demand management applications, a set of supply chain applications, a set of intelligent product applications and a set of enterprise resource management applications for a category of goods; and a unified set of Internet of Things systems that provide coordinated monitoring of a set of demand management applications, a set of supply chain applications, a set of intelligent product applications and a set of enterprise resource management applications for a category of goods.

In embodiments, a value chain network information technology system including a unified set of data collection systems that support a set of demand management applications, a set of supply chain applications, a set of intelligent product applications and a set of enterprise resource management applications for a category of goods; a set of supply chain applications for management of a set of demand management applications; and a machine vision system and a digital twin system, wherein the machine vision system feeds data to the digital twin system.

In embodiments, a value chain network information technology system including a unified set of data collection systems that support a set of demand management applications, a set of supply chain applications, a set of intelligent product applications and a set of enterprise resource management applications for a category of goods; and a unified set of adaptive edge computing systems that provide coordinated edge computation for a set of demand management applications, a set of supply chain applications, a set of intelligent product applications and a set of enterprise resource management applications for a category of goods.

In embodiments, a value chain network information technology system including a unified set of data collection systems that support a set of demand management applications, a set of supply chain applications, a set of intelligent product applications and a set of enterprise resource management applications for a category of goods; and a unified set of robotic process automation systems that provide coordinated automation among at least two types of applications from among a set of demand management applications, a set of supply chain applications, a set of intelligent product applications and a set of enterprise resource management applications for a category of goods.

In embodiments, a value chain network information technology system including a unified set of data collection systems that support a set of demand management applications, a set of supply chain applications, a set of intelligent product applications and a set of enterprise resource management applications for a category of goods; and a unified set of adaptive intelligence systems that provide coordinated intelligence for a set of demand management applications, a set of supply chain applications, a set of intelligent product applications and a set of enterprise resource management applications for a category of goods.

In embodiments, a value chain network information technology system including a unified set of data collection systems that support a set of demand management applications, a set of supply chain applications, a set of intelligent product applications and a set of enterprise resource management applications for a category of goods; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of data collection systems that support a set of demand management applications, a set of supply chain applications, a set of intelligent product applications and a set of enterprise resource management applications for a category of goods; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of data collection systems that support a set of demand management applications, a set of supply chain applications, a set of intelligent product applications and a set of enterprise resource management applications for a category of goods; and a management platform for a value chain network, wherein a set of routing facilities generate a set of routing instructions for routing information among a set of nodes in the value chain network based on current status information for the value chain network.

In embodiments, a value chain network information technology system including a unified set of data collection systems that support a set of demand management applications, a set of supply chain applications, a set of intelligent product applications and a set of enterprise resource management applications for a category of goods; and a dashboard for managing a set of digital twins, wherein at least one digital twin represents a set of supply chain entities, workflows and assets and at least one other digital twin represents a set of demand management entities and workflows.

In embodiments a value chain network information technology system including a unified set of data collection systems that support a set of demand management applications, a set of supply chain applications, a set of intelligent product applications and a set of enterprise resource management applications for a category of goods; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a unified set of data collection systems that support a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a unified set of data collection systems that support a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a unified set of data collection systems that support a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified set of data collection systems that support a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified set of data collection systems that support a set of demand management applications, a set of supply chain applications, a set of intelligent product applications and a set of enterprise resource management applications for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; a set of supply chain applications for management of a set of demand management applications; and a machine vision system and a digital twin system, wherein the machine vision system feeds data to the digital twin system.

In embodiments, value chain network information technology system including a unified set of Internet of Things systems that provide coordinated monitoring of a set of demand management applications, a set of supply chain applications, a set of intelligent product applications and a set of enterprise resource management applications for a category of goods; and a unified set of adaptive edge computing systems that provide coordinated edge computation for a set of demand management applications, a set of supply chain applications, a set of intelligent product applications and a set of enterprise resource management applications for a category of goods.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a unified set of robotic process automation systems that provide coordinated automation among at least two types of applications from among a set of demand management applications, a set of supply chain applications, a set of intelligent product applications and a set of enterprise resource management applications for a category of goods.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a unified set of adaptive intelligence systems that provide coordinated intelligence for a set of demand management applications, a set of supply chain applications, a set of intelligent product applications and a set of enterprise resource management applications for a category of goods.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a management platform for a value chain network, wherein a set of routing facilities generate a set of routing instructions for routing information among a set of nodes in the value chain network based on current status information for the value chain network.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a dashboard for managing a set of digital twins, wherein at least one digital twin represents a set of supply chain entities, workflows and assets and at least one other digital twin represents a set of demand management entities and workflows.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowd-sourcing resources that provide information with respect to supply chain entities and demand management entities.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowd-sourcing resources that provide information with respect to supply chain entities and demand management entities.

In embodiments, a value chain network information technology system including a unified set of Internet of Things systems that provide coordinated monitoring of a set of demand management applications, a set of supply chain applications, a set of intelligent product applications and a set of enterprise resource management applications for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a set of supply chain applications for management of a set of demand management applications, a machine vision system and a digital twin system, wherein the machine vision system feeds data to the digital twin system; and a unified set of adaptive edge computing systems that provide coordinated edge computation for a set of demand management applications, a set of supply chain applications, a set of intelligent product applications and a set of enterprise resource management applications for a category of goods.

In embodiments, a value chain network information technology system including a set of supply chain applications for management of a set of demand management applications, a machine vision system and a digital twin system, wherein the machine vision system feeds data to the digital twin system; and a unified set of robotic process automation systems that provide coordinated automation among at least two types of applications from among a set of demand management applications, a set of supply chain applications, a set of intelligent product applications and a set of enterprise resource management applications for a category of goods.

In embodiments, a value chain network information technology system including a set of supply chain applications for management of a set of demand management applications, a machine vision system and a digital twin system, wherein the machine vision system feeds data to the digital twin system; and a unified set of adaptive intelligence systems that provide coordinated intelligence for a set of demand management applications, a set of supply chain applications, a set of intelligent product applications and a set of enterprise resource management applications for a category of goods.

In embodiments, a value chain network information technology system including a set of supply chain applications for management of a set of demand management applications, a machine vision system and a digital twin system, wherein the machine vision system feeds data to the digital twin system; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, a value chain network information technology system including a set of supply chain applications for management of a set of demand management applications, a machine vision system and a digital twin system, wherein the machine vision system feeds data to the digital twin system; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, a value chain network information technology system including a set of supply chain applications for management of a set of demand management applications, a machine vision system and a digital twin system, wherein the machine vision system feeds data to the digital twin system; and a management platform for a value chain network, wherein a set of routing facilities generate a set of routing instructions for routing information among a set of nodes in the value chain network based on current status information for the value chain network.

In embodiments, a value chain network information technology system including a set of supply chain applications for management of a set of demand management applications, a machine vision system and a digital twin system, wherein the machine vision system feeds data to the digital twin system; and a dashboard for managing a set of digital twins, wherein at least one digital twin represents a set of supply chain entities, workflows and assets and at least one other digital twin represents a set of demand management entities and workflows.

In embodiments, a value chain network information technology system including a set of supply chain applications for management of a set of demand management applications, a machine vision system and a digital twin system, wherein the machine vision system feeds data to the digital twin system; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a set of supply chain applications for management of a set of demand management applications, a machine vision system and a digital twin system, wherein the machine vision system feeds data to the digital twin system; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a set of supply chain applications for management of a set of demand management applications, a machine vision system and a digital twin system, wherein the machine vision system feeds data to the digital twin system; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a set of supply chain applications for management of a set of demand management applications, a machine vision system and a digital twin system, wherein the machine vision system feeds data to the digital twin system; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a set of supply chain applications for management of a set of demand management applications, a machine vision system and a digital twin system, wherein the machine vision system feeds data to the digital twin system; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a set of supply chain applications for management of a set of demand management applications, a machine vision system and a digital twin system, wherein the machine vision system feeds data to the digital twin system; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a unified set of robotic process automation systems that provide coordinated automation among at least two types of applications from among a set of demand management applications, a set of supply chain applications, a set of intelligent product applications and a set of enterprise resource management applications for a category of goods.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a unified set of adaptive intelligence systems that provide coordinated intelligence for a set of demand management applications, a set of supply chain applications, a set of intelligent product applications and a set of enterprise resource management applications for a category of goods.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a management platform for a value chain network, wherein a set of routing facilities generate a set of routing instructions for routing information among a set of nodes in the value chain network based on current status information for the value chain network.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a dashboard for managing a set of digital twins, wherein at least one digital twin represents a set of supply chain entities, workflows and assets and at least one other digital twin represents a set of demand management entities and workflows.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified set of adaptive edge computing systems that provide coordinated edge computation for a set of demand management applications, a set of supply chain applications, a set of intelligent product applications and a set of enterprise resource management applications for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities. In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a unified set of adaptive intelligence systems that provide coordinated intelligence for a set of demand management applications, a set of supply chain applications, a set of intelligent product applications and a set of enterprise resource management applications for a category of goods.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a management platform for a value chain network, wherein a set of routing facilities generate a set of routing instructions for routing information among a set of nodes in the value chain network based on current status information for the value chain network.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a dashboard for managing a set of digital twins, wherein at least one digital twin represents a set of supply chain entities, workflows and assets and at least one other digital twin represents a set of demand management entities and workflows. In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified set of robotic process automation systems that provide coordinated automation among at least two types of applications from among a set of demand management applications, a set of supply chain applications, a set of intelligent product applications and a set of enterprise resource management applications for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a management platform for a value chain network, wherein a set of routing facilities generate a set of routing instructions for routing information among a set of nodes in the value chain network based on current status information for the value chain network.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a dashboard for managing a set of digital twins, wherein at least one digital twin represents a set of supply chain entities, workflows and assets and at least one other digital twin represents a set of demand management entities and workflows.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a unified set of adaptive intelligence systems that provide coordinated intelligence for a set of demand management applications, a set of supply chain applications, a set of intelligent product applications and a set of enterprise resource management applications for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities. In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods. In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a management platform for a value chain network, wherein a set of routing facilities generate a set of routing instructions for routing information among a set of nodes in the value chain network based on current status information for the value chain network. In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a dashboard for managing a set of digital twins, wherein at least one digital twin represents a set of supply chain entities, workflows and assets and at least one other digital twin represents a set of demand management entities and workflows. In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the applications of the application layer use a common set of services among a set of data processing services, data collection services, and data storage services. In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities. In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of social network sources that provide information with respect to supply chain entities and demand management entities. In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a set of project management facilities that provide automated recommendations for a set of value chain project management tasks based on processing current status information and a set of outcomes for a set of demand management applications, a set of supply chain applications, a set of intelligent product applications and a set of enterprise resource management applications for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities. In embodiments, a value chain network information technology system including a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods; and a management platform for a value chain network, wherein a set of routing facilities generate a set of routing instructions for routing information among a set of nodes in the value chain network based on current status information for the value chain network. In embodiments, a value chain network information technology system including a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods; and a dashboard for managing a set of digital twins, wherein at least one digital twin represents a set of supply chain entities, workflows and assets and at least one other digital twin represents a set of demand management entities and workflows.

In embodiments, a value chain network information technology system including a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a set of facilities that provide automated recommendations for a set of value chain process tasks based on processing current status information and a set of outcomes for a set of demand management applications, a set of supply chain applications, a set of intelligent product applications and a set of enterprise resource management applications for a category of goods; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a management platform for a value chain network, wherein a set of routing facilities generate a set of routing instructions for routing information among a set of nodes in the value chain network based on current status information for the value chain network; and a dashboard for managing a set of digital twins, wherein at least one digital twin represents a set of supply chain entities, workflows and assets and at least one other digital twin represents a set of demand management entities and workflows.

In embodiments, a value chain network information technology system including a management platform for a value chain network, wherein a set of routing facilities generate a set of routing instructions for routing information among a set of nodes in the value chain network based on current status information for the value chain network; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a management platform for a value chain network, wherein a set of routing facilities generate a set of routing instructions for routing information among a set of nodes in the value chain network based on current status information for the value chain network; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a management platform for a value chain network, wherein a set of routing facilities generate a set of routing instructions for routing information among a set of nodes in the value chain network based on current status information for the value chain network; and a set of microservices layers including an application layer supporting at least one supply chain application and at least one demand management application, wherein the microservice layers include a data collection layer that collects information from a set of social network sources that provide information with respect to supply chain entities and demand management entities.

In embodiments, a value chain network information technology system including a management platform for a value chain network, wherein a set of routing facilities generate a set of routing instructions for routing information among a set of nodes in the value chain network based on current status information for the value chain network; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a management platform for a value chain network, wherein a set of routing facilities generate a set of routing instructions for routing information among a set of nodes in the value chain network based on current status information for the value chain network; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a management platform for a value chain network, wherein a set of routing facilities generate a set of routing instructions for routing information among a set of nodes in the value chain network based on current status information for the value chain network; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a dashboard for managing a set of digital twins, wherein at least one digital twin represents a set of supply chain entities, workflows and assets and at least one other digital twin represents a set of demand management entities and workflows; and a set of microservices layers including an application layer supporting at least one supply chain application and at least one demand management application, wherein the applications of the application layer use a common set of services among a set of data processing services, data collection services, and data storage services.

In embodiments, a value chain network information technology system including a dashboard for managing a set of digital twins, wherein at least one digital twin represents a set of supply chain entities, workflows and assets and at least one other digital twin represents a set of demand management entities and workflows; and a set of microservices layers including an application layer supporting at least one supply chain application and at least one demand management application, wherein the microservice layers include a data collection layer that collects information from a set of Internet of Things resources that collect information with respect to supply chain entities and demand management entities.

In embodiments, a value chain network information technology system including a dashboard for managing a set of digital twins, wherein at least one digital twin represents a set of supply chain entities, workflows and assets and at least one other digital twin represents a set of demand management entities and workflows; and a set of microservices layers including an application layer supporting at least one supply chain application and at least one demand management application, wherein the microservice layers include a data collection layer that collects information from a set of social network sources that provide information with respect to supply chain entities and demand management entities. In embodiments, a value chain network information technology system including a dashboard for managing a set of digital twins, wherein at least one digital twin represents a set of supply chain entities, workflows and assets and at least one other digital twin represents a set of demand management entities and workflows; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a dashboard for managing a set of digital twins, wherein at least one digital twin represents a set of supply chain entities, workflows and assets and at least one other digital twin represents a set of demand management entities and workflows; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a dashboard for managing a set of digital twins, wherein at least one digital twin represents a set of supply chain entities, workflows and assets and at least one other digital twin represents a set of demand management entities and workflows; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities. In embodiments, a value chain network information technology system including a set of microservices layers including an application layer supporting at least one supply chain application and at least one demand management application, wherein the applications of the application layer use a common set of services among a set of data processing services, data collection services, and data storage services; and a set of microservices layers including an application layer supporting at least one supply chain application and at least one demand management application, wherein the microservice layers include a data collection layer that collects information from a set of Internet of Things resources that collect information with respect to supply chain entities and demand management entities. In embodiments, a value chain network information technology system including a set of microservices layers including an application layer supporting at least one supply chain application and at least one demand management application, wherein the applications of the application layer use a common set of services among a set of data processing services, data collection services, and data storage services; and a set of microservices layers including an application layer supporting at least one supply chain application and at least one demand management application, wherein the microservice layers include a data collection layer that collects information from a set of social network sources that provide information with respect to supply chain entities and demand management entities. In embodiments, a value chain network information technology system including a set of microservices layers including an application layer supporting at least one supply chain application and at least one demand management application, wherein the applications of the application layer use a common set of services among a set of data processing services, data collection services, and data storage services; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a set of microservices layers including an application layer supporting at least one supply chain application and at least one demand management application, wherein the applications of the application layer use a common set of services among a set of data processing services, data collection services, and data storage services; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a set of microservices layers including an application layer supporting at least one supply chain application and at least one demand management application, wherein the applications of the application layer use a common set of services among a set of data processing services, data collection services, and data storage services; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a set of microservices layers including an application layer supporting at least one supply chain application and at least one demand management application, wherein the microservice layers include a data collection layer that collects information from a set of Internet of Things resources that collect information with respect to supply chain entities and demand management entities; and a set of microservices layers including an application layer supporting at least one supply chain application and at least one demand management application, wherein the microservice layers include a data collection layer that collects information from a set of social network sources that provide information with respect to supply chain entities and demand management entities. In embodiments, a value chain network information technology system including a set of microservices layers including an application layer supporting at least one supply chain application and at least one demand management application, wherein the microservice layers include a data collection layer that collects information from a set of Internet of Things resources that collect information with respect to supply chain entities and demand management entities; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a set of microservices layers including an application layer supporting at least one supply chain application and at least one demand management application, wherein the microservice layers include a data collection layer that collects information from a set of Internet of Things resources that collect information with respect to supply chain entities and demand management entities; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a set of microservices layers including an application layer supporting at least one supply chain application and at least one demand management application, wherein the microservice layers include a data collection layer that collects information from a set of Internet of Things resources that collect information with respect to supply chain entities and demand management entities; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network information technology system including a set of microservices layers including an application layer supporting at least one supply chain application and at least one demand management application, wherein the microservice layers include a data collection layer that collects information from a set of social network sources that provide information with respect to supply chain entities and demand management entities; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a set of microservices layers including an application layer supporting at least one supply chain application and at least one demand management application, wherein the microservice layers include a data collection layer that collects information from a set of social network sources that provide information with respect to supply chain entities and demand management entities; and a set of microservices layers including an application layer supporting at least one supply chain application and at least one demand management application, wherein the microservice layers include a data collection layer that collects information from a set of crowdsourcing resources that provide information with respect to supply chain entities and demand management entities. In embodiments, a value chain network information technology system including a set of microservices layers including an application layer supporting at least one supply chain application and at least one demand management application, wherein the microservice layers include a data collection layer that collects information from a set of social network sources that provide information with respect to supply chain entities and demand management entities; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities. In embodiments, a value chain network information technology system including a set of microservices layers including an application layer supporting at least one supply chain application and at least one demand management application, wherein the microservice layers include a data collection layer that collects information from a set of crowdsourcing resources that provide information with respect to supply chain entities and demand management entities; and a set of microservices layers including an application layer supporting at least one supply chain application and at least one demand management application, wherein the microservice layers include a data collection layer that collects information from a set of crowdsourcing resources that provide information with respect to supply chain entities and demand management entities.

In embodiments, a value chain network information technology system including a set of microservices layers including an application layer supporting at least one supply chain application and at least one demand management application, wherein the microservice layers include a data collection layer that collects information from a set of crowdsourcing resources that provide information with respect to supply chain entities and demand management entities; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities. In embodiments, a value chain network information technology system including a set of microservices layers including an application layer supporting at least one supply chain application and at least one demand management application, wherein the microservice layers include a data collection layer that collects information from a set of crowdsourcing resources that provide information with respect to supply chain entities and demand management entities; and a machine learning/artificial intelligence system configured to generate recommendations for placing an additional sensor/and or camera on and/or in proximity to a value chain entity and wherein data from the additional sensor and/or camera feeds into a digital twin that represents a set of value chain entities.

In embodiments, a value chain network management platform, comprising: a machine learning system that trains one or more machine-learned models to output an e-commerce recommendation to a value chain network customer using training data comprising product features and outcomes; and an artificial intelligence system that receives a request for a recommendation from an e-commerce system, generates the recommendation based on the one or more machine-learned models and the request, and leverages one or more product digital twins and one or more customer profile digital twins to execute a simulation based on the one or more customer profile digital twins and one or more product digital twins. In embodiments, the machine learning system integrates with a model interpretability system, and wherein the model interpretability system is configured to implement Testing with Concept Activation Vectors (TCAV) functionality, whereby the model interpretability facilitates learning of human-interpretable concepts by the machine-learned model. In embodiments, the one or more machine-learned models are trained and/or retrained using simulation data from one or more simulations involving one or more customer profile digital twins.

In embodiments, a value chain network management platform comprising: a machine learning system that trains one or more machine-learned models to determine an advertising decision using training data comprising advertising features and outcomes; and an artificial intelligence system that receives a request for an advertising-related decision from an advertising system, determines a decision based on the one or more machine-learned models and the request, and leverages one or more advertisement digital twins and one or more customer digital twins to execute a simulation based on the one or more customer digital twins and the one or more advertisement digital twins. In embodiments, the machine learning system integrates with a model interpretability system, and wherein the model interpretability system is configured to implement Testing with Concept Activation Vectors (TCAV) functionality, whereby the model interpretability facilitates learning of human-interpretable concepts by the machine learning model. In embodiments, the one or more machine-learned models are trained and/or retrained using simulation data from one or more simulations involving one or more customer digital twins.

In embodiments, a value chain network management platform comprising: a machine learning system that trains one or more machine-learned models to determine an advertising decision using training data comprising advertising features and outcomes; and an artificial intelligence system that receives a request for an advertising-related decision from an advertising system, determines a decision based on the one or more machine-learned models and the request, and leverages one or more advertisement digital twins and one or more customer profile digital twins to execute a simulation based on the one or more customer profile digital twins and the one or more advertisement digital twins. In embodiments, the machine learning system integrates with a model interpretability system, and wherein the model interpretability system is configured to implement Testing with Concept Activation Vectors (TCAV) functionality, whereby the model interpretability facilitates learning of human-interpretable concepts by the machine learning model. In embodiments, the value chain network management platform of claim 1, wherein the one or more machine-learned models are trained and/or retrained using simulation data from one or more simulations involving one or more customer profile digital twins.

In embodiments, a value chain network management platform comprising: a machine learning system that trains one or more machine-learned models to determine a demand management decision using training data comprising demand features and outcomes; and an artificial intelligence system that receives a request for a demand management decision from a demand management system, determines a decision based on the one or more machine-learned models and the request, and leverages one or more customer digital twins to execute a simulation based on the one or more customer digital twins and the demand management decision.

In embodiments, the machine learning system integrates with a model interpretability system, and wherein the model interpretability system is configured to implement Testing with Concept Activation Vectors (TCAV) functionality, whereby the model interpretability facilitates learning of human-interpretable concepts by the machine learning model. In embodiments, the one or more machine-learned models are trained and/or retrained using simulation data from one or more simulations involving one or more customer digital twins.

In embodiments, a value chain network management platform comprising: a machine learning system that trains one or more machine-learned models to determine a demand management decision using training data comprising demand features and outcomes; and an artificial intelligence system that receives a request for a demand management decision from a demand management system, determines a decision based on the one or more machine-learned models and the request, and leverages one or more customer profile digital twins to execute a simulation based on the one or more customer profile digital twins and the demand management decision.

In embodiments, the machine learning system integrates with a model interpretability system, and wherein the model interpretability system is configured to implement Testing with Concept Activation Vectors (TCAV) functionality, whereby the model interpretability facilitates learning of human-interpretable concepts by the machine learning model. In embodiment the one or more machine-learned models are trained and/or retrained using simulation data from one or more simulations involving one or more customer profile digital twins.

In embodiments, a value chain network management platform comprising: a machine learning system that trains one or more machine-learned models to determine a demand management decision using training data comprising demand features and outcomes; and an artificial intelligence system that receives a request for a demand management decision from a demand management system, determines a decision based on the one or more machine-learned models and the request, and leverages one or more household demand digital twins to execute a simulation based on the one or more household demand digital twins and the demand management decision.

In embodiments, the one or more machine-learned models are trained and/or retrained using simulation data from one or more simulations involving one or more household demand digital twins.

In embodiments, a value chain network management platform comprising: a machine learning system that trains one or more machine-learned models to output and risk management decision using training data comprising component features and outcomes; and an artificial intelligence system that receives a request for a risk management decision from a risk management system, determines a decision based on the one or more machine-learned models and the request, and leverages a set of component digital twins representing product components to execute one or more simulations based on the component digital twins. In embodiments, the component digital twins are arranged and interact in a product configuration. In embodiments, the risk management decision relates to the condition of the component. In embodiments, the one or more machine-learned models are trained and/or retrained using simulation data from one or more simulations involving one or more components.

In embodiments, an information technology system comprising: a value chain network management platform having an asset management application associated with one or more ships; a data handling layer of the management platform including data sources containing information used to populate a training set based on a set of maritime activities of one or more of the ships and one of design outcomes, parameters, and data associated with the one or more of the ships; an artificial intelligence system that is configured to learn on the training set collected from the data sources, that simulates one or more design attributes of one or more of the ships, and that generates one or more sets of design recommendations based on the training set collected from the data sources;

a digital twin system included in the value chain network management platform that provides for visualization of a digital twin of one or more of the ships including detail generated by the artificial intelligence system of one or more of the design attributes in combination with the one or more sets of design recommendations.

In embodiments, one or more of the ships include one or more container ships, and wherein the digital twin system further provides for visualization of the digital twin of one or more of the container ships including one or more of the attributes in combination with one or more of the sets of recommendations associated with the container ships. In embodiments, one or more of the container ships are moored to a component of port infrastructure. In embodiments, wherein one or more of the ships are connected to a barge.

In embodiments, the digital twin is configured to provide further visualization of a navigation course relative to a planned course and one or more of the sets of recommendations from the artificial intelligence system for a change in the navigation course associated with one or more of the ships. In embodiments, the digital twin is configured to provide further visualization of an engine performance of one or more of the ships and one or more of the sets of recommendations from the artificial intelligence system for a change in the engine performance. In embodiments, the visualization of the engine performance includes an emissions profile of one or more of the ships. In embodiments, the digital twin is configured to provide further visualization of a hull integrity of one or more of the ships and one or more of the sets of recommendations from the artificial intelligence system for a change in maintenance of a hull of one or more of the ships. In embodiments, the digital twin is configured to provide further visualization of in-situ hydrodynamic changes to a portion of a hull disposed below a water line of one or more of the ships and one or more of the sets of recommendations from the artificial intelligence system for a change in a hydrodynamic surface to change performance of one or more of the ships. In embodiments, the digital twin is configured to determine a schedule for the change to the hydrodynamic surface of the hull disposed below the waterline of one or more of the ships to improve fuel efficiency based on known routes of travel and weather patterns. In embodiments, the digital twin is configured to provide further visualization of in-situ aerodynamic changes to a portion of a hull disposed above a water line of one or more of the ships and one or more of the sets of recommendations from the artificial intelligence system for a change in an aerodynamic surface to change performance of one or more of the ships. In embodiments, the digital twin is configured to determine a schedule for the change to the aerodynamic surface disposed above the waterline of one or more of the ships to improve fuel efficiency using known routes of travel and historical weather patterns. In embodiments, the digital twin is configured to provide further visualization of extendable buoyant members from a hull of one or more of the ships to improve stability during certain maneuvers and one or more of the sets of recommendations from the artificial intelligence system for a change in the extendable buoyant members to change performance of one or more of the ships. In embodiments, the digital twin is configured to provide further visualization of a plurality of inspection points on one or more of the ships and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide further visualization of the plurality of inspection points on the ship affected by travel within a geofenced area and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on one or more of the ships affected by travel within a geofenced area and maintenance histories associated with those inspection points.

In embodiments, the digital twin is configured to provide for visualization for a first user of one of a navigation course and an engine performance of one more of the ships within a first geofenced area and for visualization for a second user of one of the navigation course and the engine performance of one or more the ships within a second different geofenced area and where transit between the first and second geofenced areas motivates a handoff of one or more of the ships visualized by the digital twin of one or more of the ships between the first user and the second user. In embodiments, the digital twin is configured to at least partially represent one or more of the ships associated with an event investigation and to at least partially detail a timeline of the event investigation and associated ships. In embodiments, the digital twin is also configured to provide one or more of the sets of recommendations from the artificial intelligence system for a change of one of the attributes of the associated ships. In embodiments, the digital twin is configured to at least partially represent one or more of the ships associated with a legal proceeding and to at least partially detail at least a portion of a timeline pertinent to the legal proceeding and associated ships. In embodiments, the digital twin is also configured to provide one or more of the sets of recommendations from the artificial intelligence system for a change of one of the attributes of the associated ships. In embodiments, the digital twin is configured to at least partially represent one or more of the ships associated with a casualty forecast and to at least partially detail at least a portion of a timeline pertinent to the casualty report and associated ships. In embodiments, the digital twin is also configured to provide one or more of the sets of recommendations from the artificial intelligence system for a change of one of the attributes of the associated ships to reduce exposure relative to a set of previous casualty forecasts. In embodiments, the data collected by a value chain network management platform facilitates identifying theft at or misuse of physical items one of the ships by correlating data between a set of data collectors for one or more physical items in one of the ships and the digital twin detailing one or more of the physical items associated with one of the ships for the at least one of the port infrastructure facility and the set of operators. In embodiments, the digital twin details the one or more physical items associated with one of the ships for at least one operator that includes a view of expected states of at least a portion of the one or more physical items. In embodiments, the artificial intelligence system determines a set of geofence parameters, and wherein the digital twin provides further visualization of at least one geofence that integrates representation of one or more of the ships with a representation of a maritime environment adjacent to the geofence. In embodiments, the digital twin is also configured to provide one or more of the sets of recommendations from the artificial intelligence system for a change of one of the attributes of one or more of the ships. In embodiments, one or more of the ships are capable of carrying cargo, wherein the artificial intelligence system determines a set of geofence parameters, and wherein the digital twin provides further visualization of at least one geofence that integrates representation of one or more of the ships capable of carrying cargo with a representation of a maritime environment. In embodiments, the digital twin is also configured to provide one or more of the sets of recommendations from the artificial intelligence system for a change of one of the attributes of one or more of the ships capable of carrying cargo. In embodiments, the maritime activities include the forward speed of one or more of the ships relative to water and weather conditions based on the parameters associated with energy consumption of the propulsion units on one or more of the ships.

In embodiments, an information technology system comprising: a value chain network management platform for learning on a training set of design outcomes, parameters, and data collected from data sources relating to a set of shipping activities to train an artificial intelligence system to simulate attributes of a container ship and generate a set of recommendations of changes to the attributes using a digital twin of the container ship.

In embodiments, the container ship is moored to port infrastructure installed on or adjacent to land.

In embodiments, the shipping activities include the forward speed of the container ship relative to water and weather conditions based on the parameters associated with energy consumption of propulsion units on the container ship. In embodiments, further comprising an asset management application associated with one or more maritime facilities connected to the container ship. In embodiments, the asset management application is associated with one or more ships connected to barges. In embodiments, the digital twin of the container ship provides for visualization of a navigation course of the container ship.

In embodiments, the digital twin of the container ship provides for visualization of an engine performance of the container ship. In embodiments, the digital twin of the container ship provides for visualization of a hull integrity of the container ship. In embodiments, the digital twin of the container ship provides for visualization of in-situ hydrodynamic changes to a portion of a hull disposed below a water line of the container ship. In embodiments, the digital twin of the container ship determines a schedule of the in-situ hydrodynamic changes to the portion of the hull disposed below the waterline of the container ship to improve fuel efficiency using known routes of travel and historical weather patterns. In embodiments, the digital twin of the container ship provides for visualization of in-situ aerodynamic changes to a portion of a hull disposed above a water line of the container ship.

In embodiments, the digital twin of the container ship determines a schedule of in-situ aerodynamic changes to the portion of the hull disposed above the waterline of the container ship to improve fuel efficiency using known routes of travel and historical weather patterns. In embodiments, the digital twin of the container ship provides for visualization of extendable buoyant members from a hull of the container ship to improve stability during certain maneuvers of the container ship. In embodiments, the digital twin of the container ship provides for visualization of extendable buoyant members from a hull of the container ship to improve stability during certain maneuvers of the container ship. In embodiments, the digital twin of the container ship provides for visualization of a plurality of inspection points on the container ship and maintenance histories associated with those inspection points. In embodiments, the digital twin of the container ship provides for the visualization of the plurality of inspection points on the container ship affected by travel within a geofenced area and maintenance histories associated with those inspection points when maintenance follows travel through the geofenced area.

In embodiments, the digital twin of the container ship provides for details of a ledger of activity associated with the visualization of the plurality of inspection points on the container ship affected by travel within a geofenced area and maintenance histories associated with those inspection points when maintenance follows travel through the geofenced area. In embodiments, the digital twin of the container ship provides for visualization for a first user of one of a navigation course of the container ship and an engine performance of the container ship within a first geofenced area and for visualization for a second user of one of the navigation course of the container ship and the engine performance of the container ship within a second geofenced area and where transit between the first and second geofenced areas motivates a handoff of the digital twin of the container ship between the first user and the second user.

In embodiments, an information technology system comprising: a value chain network management platform having an asset management application associated with one or more barges; a data handling layer of the management platform including data sources containing information used to populate a training set based on a set of maritime activities of one or more of the barges and one of design outcomes, parameters, and data associated with the one or more of the barges; an artificial intelligence system that is configured to learn on the training set collected from the data sources, that simulates one or more design attributes of one or more of the barges, and that generates one or more sets of design recommendations based on the training set collected from the data sources; a digital twin system included in the value chain network management platform that provides for visualization of a digital twin of one or more of the barges including detail generated by the artificial intelligence system of one or more of the design attributes in combination with the one or more sets of design recommendations.

In embodiments, the digital twin system further provides for visualization of the digital twin of one or more of the barges including one or more of the attributes in combination with one or more of the sets of recommendations associated with the barges. In embodiments, one of the barges is connected to a ship. In embodiments, the digital twin is configured to provide for visualization of a navigation course of one of the barges relative to a planned course of one of the barges and one or more of the sets of recommendations from the artificial intelligence system for a change in the navigation course of one of the barges. In embodiments, the digital twin is configured to provide for visualization of a hull integrity of one of the barges relative to a planned course of one of the barges and one or more of the sets of recommendations from the artificial intelligence system for a change in maintenance of the hull of one of the barges. In embodiments, the digital twin is configured to provide for visualization of in-situ hydrodynamic changes to a portion of a hull disposed below a water line of one or more of the barges and one or more of the sets of recommendations from the artificial intelligence system for a change in a hydrodynamic surface to change performance of one or more of the barges. In embodiments, the digital twin is configured to determine a schedule for the change to the hydrodynamic surface of the hull disposed below the waterline of one or more of the barges to improve fuel efficiency based on known routes of travel and weather patterns.

In embodiments, the digital twin is configured to provide visualizations of extendable buoyant members from a hull of one or more of the barges to improve stability during certain maneuvers of one or more of the barges and one or more of the sets of recommendations from the artificial intelligence system for a change in the extendable buoyant members to change performance of one or more of the barges. In embodiments, the digital twin is configured to provide visualizations of a plurality of inspection points on one or more of the barges and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide for visualizations of the plurality of inspection points on one or more of the barges affected by travel within a geofenced area and maintenance histories associated with those inspection points. In embodiments, the digital twin is also configured to provide one or more of the sets of recommendations from the artificial intelligence system for a change in maintenance of the plurality of inspection points.

In embodiments, the digital twin is configured to provide details of a ledger of activity associated with the visualization of the plurality of inspection points on one or more of the barges affected by travel within a geofenced area and maintenance histories associated with those inspection points.

In embodiments, the digital twin is configured to provide for visualization for a first user of one of a navigation course of one or more of the barges within a first geofenced area and for visualization for a second user of one of the navigation course of one or more of the barges within a second different geofenced area and where transit between the first and second geofenced areas motivates a handoff of the digital twin of one or more of the barges between the first user and the second user. In embodiments, the digital twin is configured to at least partially represent one or more of the barges associated with an event investigation and to at least partially detail a timeline of the event investigation and associated maritime assets. In embodiments, the digital twin is also configured to provide one or more of the sets of recommendations from the artificial intelligence system for a change of one of the attributes of the associated barges. In embodiments, the digital twin is configured to at least partially represent one or more of the barges associated with a legal proceeding and to at least partially detail at least a portion of a timeline pertinent to the legal proceeding and associated barges. In embodiments, the digital twin is also configured to provide one or more of the sets of recommendations from the artificial intelligence system for a change of one of the attributes of the associated barges. In embodiment, the digital twin is configured to at least partially represent one or more of the barges associated with a casualty forecast and to at least partially detail at least a portion of a timeline pertinent to the casualty report and associated barges. In embodiments, the digital twin is also configured to provide one or more of the sets of recommendations from the artificial intelligence system for a change of one of the attributes of the associated barges to reduce exposure relative to a set of previous casualty forecasts. In embodiments, the data collected by a value chain network management platform facilitates identifying theft at or misuse of physical items on one of the barges by correlating data between a set of data collectors for one or more physical items on one of the barges and the digital twin detailing the one or more physical items on one of the barges for at least one of a port infrastructure facility and a set of operators.

In embodiments, the digital twin details the one or more physical items on of the barges for at least one operator that includes a view of expected states of at least a portion of the one or more physical items. In embodiments, the artificial intelligence system determines a set of geofence parameters, and wherein the digital twin provides further visualization of at least one geofence that integrates representation of one or more of the barges with a representation of a maritime environment adjacent to the geofence. In embodiments, the digital twin is also configured to provide one or more of the sets of recommendations from the artificial intelligence system for a change of one of the attributes of the set of one or more of the barges. In embodiments, the asset management application is associated with one or more ships connected to one of the barges.

In embodiments, the data handling layer of the management platform includes data sources containing information used to populate the training set based on a set of maritime activities of one or more of the barges underway and each connected to a ship and one of design outcomes, parameters, and data associated with the one or more of the barges and its associated ship. In embodiments, the artificial intelligence system is configured to learn on the training set collected from the data sources and to simulate one or more design attributes of one or more of the barges each connected to a ship. In embodiments, the digital twin system provides for visualization of a digital twin of one or more of the barges and each of the ships to which they are connected.

In embodiments, an information technology system comprising: a value chain network management platform for learning on a training set of design outcomes, parameters, and data collected from data sources relating to a set of shipping activities to train an artificial intelligence system to simulate attributes of a barge and generate a set of recommendations of changes to the attributes using a digital twin of the barge. In embodiments, the digital twin system further provides for visualization of the digital twin of one or more of the barges including one or more of the attributes in combination with one or more of the sets of recommendations of changes to the attributes associated with the barges. In embodiments, one of the barges is connected to a ship. In embodiments, the digital twin is configured to provide for visualization of a navigation course of one of the barges relative to a planned course of one of the barges and one or more of the sets of recommendations from the artificial intelligence system for a change in the navigation course of one of the barges. In embodiments, the digital twin is configured to provide for visualization of a hull integrity of one of the barges relative to a planned course of one of the barges and one or more of the sets of recommendations from the artificial intelligence system for a change in maintenance of the hull of one of the barges. In embodiments, the digital twin is configured to provide for visualization of in-situ hydrodynamic changes to a portion of a hull disposed below a water line of one or more of the barges and one or more of the sets of recommendations from the artificial intelligence system for a change in a hydrodynamic surface to change performance of one or more of the barges. In embodiments, the digital twin is configured to determine a schedule for the change to the hydrodynamic surface of the hull disposed below the waterline of one or more of the barges to improve fuel efficiency based on known routes of travel and weather patterns.

In embodiments, the digital twin is configured to provide visualizations of extendable buoyant members from a hull of one or more of the barges to improve stability during certain maneuvers of one or more of the barges and one or more of the sets of recommendations from the artificial intelligence system for a change in the extendable buoyant members to change performance of one or more of the barges. In embodiments, the digital twin is configured to provide visualizations of a plurality of inspection points on one or more of the barges and maintenance histories associated with those inspection points. In embodiments, the digital twin is also configured to provide one or more of the sets of recommendations from the artificial intelligence system for a change in maintenance of the plurality of inspection points.

In embodiments, the digital twin is configured to provide for visualizations of the plurality of inspection points on one or more of the barges affected by travel within a geofenced area and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on one or more of the barges affected by travel within a geofenced area and maintenance histories associated with those inspection points. In embodiments, the digital twin is configured to provide for visualization for a first user of one of a navigation course of one or more of the barges within a first geofenced area and for visualization for a second user of one of the navigation course of one or more of the barges within a second different geofenced area and where transit between the first and second geofenced areas motivates a handoff of the digital twin of one or more of the barges between the first user and the second user. In embodiments, the digital twin is configured to at least partially represent one or more of the barges associated with an event investigation and to at least partially detail a timeline of the event investigation and associated maritime assets. In embodiments, the digital twin is also configured to provide one or more of the sets of recommendations from the artificial intelligence system for a change of one of the attributes of the associated barges. In embodiments, the digital twin is configured to at least partially represent one or more of the barges associated with a legal proceeding and to at least partially detail at least a portion of a timeline pertinent to the legal proceeding and associated barges. In embodiments, the digital twin is also configured to provide one or more of the sets of recommendations from the artificial intelligence system for a change of one of the attributes of the associated barges. In embodiments, the digital twin is configured to at least partially represent one or more of the barges associated with a casualty forecast and to at least partially detail at least a portion of a timeline pertinent to the casualty report and associated barges. In embodiments, the digital twin is also configured to provide one or more of the sets of recommendations from the artificial intelligence system for a change of one of the attributes of the associated barges to reduce exposure relative to a set of previous casualty forecasts.

In embodiments, the data collected by a value chain network management platform facilitates identifying theft at or misuse of physical items on one of the barges by correlating data between a set of data collectors for one or more physical items on one of the barges and the digital twin detailing the one or more physical items on one of the barges for at least one of a port infrastructure facility and a set of operators. In embodiments, the digital twin details the one or more physical items on of the barges for at least one operator that includes a view of expected states of at least a portion of the one or more physical items. In embodiments, the artificial intelligence system determines a set of geofence parameters, and wherein the digital twin provides further visualization of at least one geofence that integrates representation of one or more of the barges with a representation of a maritime environment adjacent to the geofence.

In embodiments, the digital twin is also configured to provide one or more of the sets of recommendations from the artificial intelligence system for a change of one of the attributes of the set of one or more of the barges.

In embodiments, the asset management application is associated with one or more ships connected to one of the barges. In embodiments, the data handling layer of the management platform includes data sources containing information used to populate the training set based on a set of maritime activities of one or more of the barges underway and each connected to a ship and one of design outcomes, parameters, and data associated with the one or more of the barges and its associated ship. In embodiments, the artificial intelligence system is configured to learn on the training set collected from the data sources and to simulate one or more design attributes of one or more of the barges each connected to a ship. In embodiments, the digital twin system provides for visualization of a digital twin of one or more of the barges and each of the ships to which they are connected.

In embodiments, an information technology system comprising: a value chain network management platform having an asset management application associated with port infrastructure; a data handling layer of the management platform including data sources containing information used to populate a training set based on a set of maritime activities around the port infrastructure and one of design outcomes, parameters, and data associated with the port infrastructure; an artificial intelligence system that is configured to learn on the training set collected from the data sources, that simulates one or more attributes of the port infrastructure, and that generates one or more sets of recommendations for a change in the one or more attributes based on the training set collected from the data sources; a digital twin system included in the value chain network management platform that provides for visualization of a digital twin of the port infrastructure including detail generated by the artificial intelligence system of one or more of the attributes in combination with the one or more sets of recommendations. In embodiments, the digital twin system further provides for visualization of the digital twin of one or more of container ships in the port infrastructure including one or more of the attributes in combination with one or more of the sets of recommendations associated with one or more of the container ships. In embodiments, the digital twin system further provides for visualization of the digital twin of one or more of barges in the port infrastructure including one or more of the attributes in combination with one or more of the sets of recommendations associated with one or more of the barges. In embodiments, the port infrastructure includes one or more moored navigation units deployed on water. In embodiments, the port infrastructure includes one or more ships each connected to a barge. In embodiments, the port infrastructure is associated with a real-world maritime port, and wherein the digital twin system further provides for visualization of the digital twin of one or more of the components of the real-world maritime port including one or more of the attributes in combination with one or more of the sets of recommendations associated with the components of the real-world maritime port.

In embodiments, the port infrastructure is associated with a real-world shipyard, and wherein the digital twin system further provides for visualization of the digital twin of one or more of the components of the real-world shipyard including one or more of the attributes in combination with one or more of the sets of recommendations associated with the components of the real-world shipyard. In embodiments, the digital twin is configured to provide for visualization of an engine performance of the port infrastructure and one or more of the sets of recommendations from the artificial intelligence system for a change in the engine performance installed in the port infrastructure. In embodiments, the visualization of an engine performance includes an emissions profile.

In embodiments, the digital twin is configured to provide visualizations of a plurality of inspection points on the port infrastructure and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide for visualizations of the plurality of inspection points on the port infrastructure includes within a geofenced area and maintenance histories associated with those inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on the port infrastructure includes within a geofenced area and maintenance histories associated with those inspection points. In embodiments, the digital twin is configured to at least partially represent the port infrastructure associated with an event investigation and to at least partially detail a timeline of the event investigation. In embodiments, the digital twin is also configured to provide one or more of the sets of recommendations from the artificial intelligence system for a change of one of the attributes of the associated port infrastructure. In embodiments, the digital twin is configured to at least partially represent the port infrastructure associated with a legal proceeding and to at least partially detail at least a portion of a timeline pertinent to the legal proceeding. In embodiments, the digital twin is also configured to provide one or more of the sets of recommendations from the artificial intelligence system for a change of one of the attributes of the associated port infrastructure. In embodiments, the digital twin is configured to at least partially represent the port infrastructure associated with a casualty forecast and to at least partially detail at least a portion of a timeline pertinent to the casualty report and the port infrastructure. In embodiments, the digital twin is also configured to provide one or more of the sets of recommendations from the artificial intelligence system for a change of one of the attributes of the associated port infrastructure to reduce exposure relative to a set of previous casualty forecasts. In embodiments, the data collected by a value chain network management platform facilitates identifying theft at or misuse at the port infrastructure by correlating data between a set of data collectors for one or more physical items at the port infrastructure and the digital twin detailing the one or more physical items of the port infrastructure for the at least one of a facility at the port infrastructure and the set of operators.

In embodiments, the digital twin details the one or more physical items at the port infrastructure for at least one operator that includes a view of expected states of at least a portion of the one or more physical items.

In embodiments, the data collected by a value chain network management platform facilitates identifying theft at or misuse of one or more physical items at the port infrastructure by correlating data between a set of data collectors for the one or more physical items and the digital twin detailing the one or more physical items at the port infrastructure includes for the at least one of a facility at the port infrastructure and the set of operators.

In embodiments, the digital twin details the one or more physical items at the port infrastructure for at least one operator that includes a view of expected states of at least a portion of the one or more physical items.

In embodiments, the artificial intelligence system determines a set of geofence parameters, and wherein the digital twin provides further visualization of at least one geofence that integrates representation of at least a portion of the port infrastructure with a representation of a maritime environment adjacent to the geofence.

In embodiments, the digital twin is also configured to provide one or more of the sets of recommendations from the artificial intelligence system for a change of one of the attributes of the port infrastructure.

In embodiments, one or more components of the port infrastructure are installed on land. In embodiments, the one or more components of the port infrastructure include one or more moored navigation units deployed on water.

In embodiments, an information technology system comprising: a value chain network management platform for learning on a training set of design outcomes, parameters, and data collected from data sources relating to a set of shipping activities to train an artificial intelligence system to simulate design attributes of a port infrastructure facility and generate a set of design recommendations using a digital twin of the port infrastructure facility.

In embodiments, the digital twin system further provides for visualization of the digital twin of the port infrastructure facility including one or more of the attributes in combination with one or more of the sets of recommendations of changes to the attributes associated with the port infrastructure facility. In embodiments, the digital twin is configured to provide visualizations of a plurality of inspection points on the port infrastructure facility and maintenance histories associated with those inspection points. In embodiments, the digital twin is also configured to provide one or more of the sets of recommendations from the artificial intelligence system for a change in maintenance of the plurality of inspection points. In embodiments, the digital twin is also configured to provide one or more of the sets of recommendations from the artificial intelligence system for a change in maintenance of the plurality of inspection points. In embodiments, the digital twin is configured to provide details of a ledger of activity associated with the visualization of the plurality of inspection points on the port infrastructure facility within a geofenced area and maintenance histories associated with those inspection points.

In embodiments, the digital twin is configured to at least partially represent at least a portion of the port infrastructure facility associated with an event investigation and to at least partially detail a timeline of the event investigation and associated with the port infrastructure facility. In embodiments, the digital twin is also configured to provide one or more of the sets of recommendations from the artificial intelligence system for a change of one of the attributes of the port infrastructure facility. In embodiments, the digital twin is configured to at least partially represent at least a portion of the port infrastructure facility associated with a legal proceeding and to at least partially detail at least a portion of a timeline pertinent to the legal proceeding and associated with the port infrastructure facility. In embodiments, the digital twin is also configured to provide one or more of the sets of recommendations from the artificial intelligence system for a change of one of the attributes of the associated port infrastructure facility. In embodiments, the digital twin is configured to at least partially represent at least a portion of the port infrastructure facility associated with a casualty forecast and to at least partially detail at least a portion of a timeline pertinent to the casualty report and associated port infrastructure facility. In embodiments, the digital twin is also configured to provide one or more of the sets of recommendations from the artificial intelligence system for a change of one of the attributes of at least a portion of the port infrastructure facility to reduce exposure relative to a set of previous casualty forecasts. In embodiments, the data collected by a value chain network management platform facilitates identifying theft at or misuse of physical items in at least a portion of the port infrastructure facility by correlating data between a set of data collectors for one or more physical items in at least a portion of the port infrastructure facility and the digital twin detailing the one or more physical items in at least a portion of the port infrastructure facility for at least one of the port infrastructure facility and a set of operators. In embodiments, the digital twin details the one or more physical items in the port infrastructure facility for at least one operator that includes a view of expected states of at least a portion of the one or more physical items. In embodiments, the artificial intelligence system determines a set of geofence parameters, and wherein the digital twin provides further visualization of at least one geofence that integrates representation of at least a portion of the port infrastructure facility with a representation of a maritime environment adjacent to the geofence. In embodiments, the digital twin is also configured to provide one or more of the sets of recommendations from the artificial intelligence system for a change of one of the attributes of at least a portion of the port infrastructure facility.

In embodiments, an information technology system comprising: a value chain network management platform having an asset management application associated with maritime assets involved in a maritime event; a data handling layer of the management platform including data sources containing information used to populate a training set based on a set of maritime activities of the maritime assets involved in the maritime event and one of design outcomes, parameters, and data associated with the maritime assets involved in the maritime event; an artificial intelligence system that is configured to learn on the training set collected from the data sources, that simulates one or more design attributes of the maritime assets involved in a maritime event, and that generates one or more sets of design recommendations based on the training set collected from the data sources; a digital twin system included in the value chain network management platform that provides for visualization of a digital twin of the maritime assets involved in a maritime event including detail generated by the artificial intelligence system of one or more of the design attributes in combination with the one or more sets of design recommendations applicable to at least one of the maritime assets involved in the maritime event.

In embodiments, the maritime assets include one or more container ships involved in the maritime event, and wherein the digital twin system further provides for visualization of the digital twin of one or more of the container ships including one or more of the attributes in combination with one or more of the sets of recommendations associated with the container ships. In embodiments, the maritime assets include one or more barges involved in the maritime event, and wherein the digital twin system further provides for visualization of the digital twin of one or more of the barges including one or more of the attributes in combination with one or more of the sets of recommendations associated with the barges. In embodiments, the maritime assets include one or more components of port infrastructure involved in the maritime event, and wherein the digital twin system further provides for visualization of the digital twin of one or more of the components of port infrastructure including one or more of the attributes in combination with one or more of the sets of recommendations associated with the components of port infrastructure. In embodiments, the maritime assets are associated with a real-world maritime port, and wherein the digital twin system further provides for visualization of the digital twin of one or more of the components of the real-world maritime port involved in the maritime event including one or more of the attributes in combination with one or more of the sets of recommendations associated with the components of the real-world maritime port. In embodiments, the maritime assets are associated with a real-world shipyard, and wherein the digital twin system further provides for visualization of the digital twin of one or more of the components of the real-world shipyard involved in the maritime event including one or more of the attributes in combination with one or more of the sets of recommendations associated with the components of the real-world shipyard. In embodiments, the digital twin of one or more of the maritime assets is a floating asset twin associated with a ship. In embodiments, the floating asset twin is configured to provide for visualization of a navigation course of the ship involved in the maritime event relative to a planned course of the ship and one or more of the sets of recommendations from the artificial intelligence system for a change in the navigation course of the ship.

In embodiments, the floating asset twin is configured to provide for visualization of an engine performance of the ship involved in the maritime event and one or more of the sets of recommendations from the artificial intelligence system for a change in the engine performance of the ship. In embodiments, the visualization of an engine performance includes an emissions profile of the ship. In embodiments, the floating asset twin is configured to provide for visualization of a hull integrity of the ship involved in the maritime event and one or more of the sets of recommendations from the artificial intelligence system for a change in maintenance of the hull of the ship.

In embodiments, the floating asset twin is configured to provide visualizations of a plurality of inspection points on the ship involved in the maritime event and maintenance histories associated with those inspection points.

In embodiments, the floating asset twin is also configured to provide one or more of the sets of recommendations from the artificial intelligence system for a change in maintenance of the plurality of inspection points associated with the maritime event. In embodiments, the floating asset twin is configured to provide for visualizations of the plurality of inspection points on the ship affected by travel within a geofenced area and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide details of a ledger of activity associated with the visualization of the plurality of inspection points on the ship involved in the maritime event within a geofenced area and maintenance histories associated with those inspection points. In embodiments, the artificial intelligence system determines a set of geofence parameters, and wherein the digital twin provides further visualization of at least one geofence that integrates representation of a set of the maritime assets involved in the maritime event with a representation of a maritime environment adjacent to the geofence. In embodiments, the digital twin is also configured to provide one or more of the sets of recommendations from the artificial intelligence system for a change of one of the attributes of the set of maritime assets involved in the maritime event.

In embodiments, an information technology system comprising: a value chain network management platform for learning on a training set of maritime event outcomes, parameters, and data collected from data sources to train an artificial intelligence system to use a digital twin to facilitate investigation of a maritime event.

In embodiments, the maritime event outcomes are associated with a real-world shipyard, and wherein the digital twin is configured to detail at least a portion of the real-world shipyard to facilitate investigation of the maritime event. In embodiments, the maritime event outcomes are associated with a real-world maritime port, and wherein the digital twin is configured to detail at least a portion of the real-world maritime port to facilitate investigation of the maritime event. In embodiments, the maritime event outcomes are associated with one or more container ships, and wherein the digital twin is configured to detail one or more of the container ships to facilitate investigation of the maritime event. In embodiments, the maritime event outcomes are associated with one or more barges, and wherein the digital twin is configured to detail one or more of the barges to facilitate investigation of the maritime event. In embodiments, the maritime event outcomes are associated with at least a portion of port infrastructure, and wherein the digital twin is configured to detail at least a portion of the of port infrastructure to facilitate investigation of the maritime event. In embodiments, the digital twin is configured to at least partially represent activity of one or more maritime value chain network entities during a timeline associated with the maritime event.

In embodiments, the one or more maritime value chain network entities are associated with a legal proceeding and wherein the digital twin is further configured to at least partially represent activity of one or more maritime value chain network entities during a timeline associated with the legal proceeding. In embodiments, the one or more maritime value chain network entities are associated with a legal proceeding and wherein the digital twin is further configured to at least partially represent activity of one or more maritime value chain network entities during a timeline associated with the legal proceeding. In embodiments, the one or more maritime value chain network entities are associated with a casualty forecast and wherein the digital twin is further configured to at least partially represent activity of one or more maritime value chain network entities during a timeline associated with the casualty forecast. In embodiments, one or more of the maritime value chain network entities is a port infrastructure facility, wherein the data collected by the value chain network management platform facilitates identifying theft or misuse of one or more physical items of the port infrastructure facility by correlating data between a set of data collectors for one or more of the physical items in the port infrastructure facility and the digital twin detailing one or more of the physical items of the port infrastructure facility for the at least one of the port infrastructure facility and the set of operators to further facilitate investigation of the maritime event.

In embodiments, the maritime event includes a container ship that is moored to port infrastructure installed on or adjacent to land. In embodiments, the maritime event includes at least a container ship having a forward speed relative to water and weather conditions and parameters associated with energy consumption of propulsion units on the container ship. In embodiments, the maritime event includes one or more ships connected to barges.

In embodiments, the maritime event includes one or more ships, and wherein the digital twin provides for visualization of a navigation course of one or more of the ships during the maritime event. In embodiments, the maritime event includes one or more ships, and wherein the digital twin provides for visualization of an engine performance of one or more of the ships during the maritime event. In embodiments, the maritime event includes one or more ships, and wherein the digital twin provides for visualization of a hull integrity of one or more of the ships involved in the maritime event. In embodiments, the maritime event includes one or more ships, and wherein the digital twin provides for visualization of a plurality of inspection points associated with one or more of the ships and maintenance histories associated with those inspection points. In embodiments, the digital twin further provides for the visualization of the plurality of inspection points associated with one or more of the ships within a geofenced area related to the maritime event and maintenance histories associated with those inspection points. In embodiments, the digital twin further provides for details of a ledger of activity associated with the visualization of the plurality of inspection points associated with one or more of the ships within a geofenced area related to the maritime event and maintenance histories associated with those inspection points.

In embodiments, an information technology system comprising: a value chain network management platform having an asset management application associated with maritime assets involved in a maritime legal proceeding; a data handling layer of the management platform including data sources containing information used to populate a training set based on a set of maritime activities of the maritime assets involved in the maritime legal proceeding and one of parameters and data associated with the maritime assets involved in the maritime legal proceeding; an artificial intelligence system that is configured to learn on the training set collected from the data sources, that simulates one or more attributes of one or more of the maritime assets involved in the maritime legal proceeding, and that generates one or more sets of recommendations for a change in the one or more attributes based on the training set collected from the data sources; a digital twin system included in the value chain network management platform that provides for visualization of a digital twin of one or more of the maritime assets involved in the maritime legal proceeding including detail generated by the artificial intelligence system of one or more of the attributes in combination with the one or more sets of recommendations.

In embodiments, the maritime assets include one or more container ships involved in the maritime legal proceeding, and wherein the digital twin system further provides for visualization of the digital twin of one or more of the container ships including one or more of the attributes in combination with one or more of the sets of recommendations associated with the container ships. In embodiments, the maritime assets include one or more barges involved in the maritime legal proceeding, and wherein the digital twin system further provides for visualization of the digital twin of one or more of the barges including one or more of the attributes in combination with one or more of the sets of recommendations associated with the barges. In embodiments, the maritime assets include one or more components of port infrastructure involved in the maritime legal proceeding, and wherein the digital twin system further provides for visualization of the digital twin of one or more of the components of port infrastructure including one or more of the attributes in combination with one or more of the sets of recommendations associated with the components of port infrastructure. In embodiments, the maritime assets are associated with a real-world maritime port, and wherein the digital twin system further provides for visualization of the digital twin of one or more of the components of the real-world maritime port involved in the maritime legal proceeding including one or more of the attributes in combination with one or more of the sets of recommendations associated with the components of the real-world maritime port. In embodiments, the maritime assets are associated with a real-world shipyard, and wherein the digital twin system further provides for visualization of the digital twin of one or more of the components of the real-world shipyard involved in the maritime legal proceeding including one or more of the attributes in combination with one or more of the sets of recommendations associated with the components of the real-world shipyard. In embodiments, the digital twin of one or more of the maritime assets is a floating asset twin associated with a ship. In embodiments, the floating asset twin is configured to provide for visualization of a navigation course of the ship involved in the maritime legal proceeding relative to a planned course of the ship and one or more of the sets of recommendations from the artificial intelligence system for a change in the navigation course of the ship.

In embodiments, the floating asset twin is configured to provide for visualization of an engine performance of the ship involved in the maritime legal proceeding and one or more of the sets of recommendations from the artificial intelligence system for a change in the engine performance of the ship. In embodiments, the visualization of an engine performance includes an emissions profile of the ship. In embodiments, the floating asset twin is configured to provide for visualization of a hull integrity of the ship involved in the maritime legal proceeding and one or more of the sets of recommendations from the artificial intelligence system for a change in maintenance of the hull of the ship. In embodiments, the floating asset twin is configured to provide visualizations of a plurality of inspection points on the ship involved in the maritime legal proceeding and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide for visualizations of the plurality of inspection points on the ship affected by travel within a geofenced area and maintenance histories associated with those inspection points. In embodiments, the floating asset twin is also configured to provide one or more of the sets of recommendations from the artificial intelligence system for a change in maintenance of the plurality of inspection points associated with the maritime event.

In embodiments, the floating asset twin is configured to provide details of a ledger of activity associated with the visualization of the plurality of inspection points on the ship involved in the maritime legal proceeding within a geofenced area and maintenance histories associated with those inspection points. In embodiments, the artificial intelligence system determines a set of geofence parameters, and wherein the digital twin provides further visualization of at least one geofence that integrates representation of a set of the maritime assets involved in the maritime legal proceeding with a representation of a maritime environment adjacent to the geofence. In embodiments, the digital twin is also configured to provide one or more of the sets of recommendations from the artificial intelligence system for a change of one of the attributes of the set of maritime assets involved in the maritime legal proceeding.

In embodiments, an information technology system comprising: a value chain network management platform for learning on a training set of maritime legal outcomes, parameters, and data collected from data sources to train an artificial intelligence system to use a digital twin to generate a recommendation relating to a maritime legal proceeding.

In embodiments, the maritime legal outcomes are associated with a real-world shipyard, and wherein the digital twin is configured to detail at least a portion of the real-world shipyard associated with the maritime legal proceeding. In embodiments, the maritime legal outcomes are associated with a real-world maritime port, and wherein the digital twin is configured to detail at least a portion of the real-world maritime port associated with the maritime legal proceeding. In embodiments, the maritime legal outcomes are associated with one or more container ships, and wherein the digital twin is configured to detail at least a portion of the one or more container ships associated with the maritime legal proceeding. In embodiments, the maritime legal outcomes are associated with one or more barges, and wherein the digital twin is configured to detail at least a portion of the one or more barges associated with the maritime legal proceeding. In embodiments, the maritime legal outcomes are associated with at least a portion of port infrastructure, and wherein the digital twin is configured to detail at least a portion of the port infrastructure associated with the maritime legal proceeding. In embodiments, the digital twin is configured to at least partially represent activity of one or more maritime value chain network entities during a timeline associated with the maritime legal proceeding. In embodiments, one or more of the maritime value chain network entities is a port infrastructure facility, wherein the data collected by the value chain network management platform facilitates identifying theft or misuse of one or more physical items of the port infrastructure facility relating to the maritime legal proceeding by correlating data between a set of data collectors for one or more of the physical items in the port infrastructure facility, wherein the digital twin is configured to further detail one or more of the physical items of the port infrastructure facility for the at least one of the port infrastructure facility and the set of operators. In embodiments the maritime legal proceeding includes a situation involving a container ship that is moored to port infrastructure installed on or adjacent to land. In embodiments, the maritime legal proceeding includes a situation involving a container ship having a forward speed relative to water and weather conditions and parameters associated with energy consumption of propulsion units on the container ship. In embodiments, the maritime legal proceeding includes a situation involving one or more ships connected to barges. In embodiments, the maritime legal proceeding includes a situation involving one or more ships, and wherein the digital twin provides for visualization of a navigation course of one or more of the ships relevant to the maritime legal proceeding. In embodiments, the maritime legal proceeding includes a situation involving one or more ships, and wherein the digital twin provides for visualization of an engine performance of one or more of the ships relevant to the maritime legal proceeding. In embodiments, wherein the maritime legal proceeding includes a situation involving one or more ships, and wherein the digital twin provides for visualization of a hull integrity of one or more of the ships relevant to the maritime legal proceeding. In embodiments, the maritime legal proceeding includes a situation involving one or more ships, and wherein the digital twin provides for visualization of a plurality of inspection points associated with one or more of the ships and maintenance histories associated with those inspection points. In embodiments, the digital twin further provides for the visualization of the plurality of inspection points associated with one or more of the ships within a geofenced area relevant to the maritime legal proceeding and maintenance histories associated with those inspection points.

In embodiments, the digital twin further provides for details of a ledger of activity associated with the visualization of the plurality of inspection points associated with one or more of the ships within a geofenced area relevant to the maritime legal proceeding and maintenance histories associated with those inspection points.

In embodiments, an information technology system comprising; a value chain network management platform having an asset management application associated with maritime assets; a data handling layer of the management platform including data sources containing information used to populate a training set based on a set of maritime activities of one or more of the maritime assets involved in a loss event and one of outcomes, parameters, and data associated with the one or more maritime assets experiencing the loss event; an artificial intelligence system that is configured to learn on the training set collected from the data sources, that simulates one or more attributes of one or more of the maritime assets, and that generates one or more sets of casualty forecasts based on the training set collected from the data sources; a digital twin system included in the value chain network management platform that provides for visualization of one or more digital twins associated with one or more of the maritime assets involved in the loss event including detail generated by the artificial intelligence system of at least a portion of one of the sets of casualty forecasts. In embodiments, the maritime assets include one or more container ships associated with at least a portion of one of the sets of casualty forecasts, and wherein the digital twin system further provides for visualization of the digital twin of one or more of the container ships including one or more of the attributes in combination with one or more of the sets of recommendations associated with the container ships. In embodiments, the maritime assets include one or more barges with at least a portion of one of the sets of casualty forecasts, and wherein the digital twin system further provides for visualization of the digital twin of one or more of the barges including one or more of the attributes in combination with one or more of the sets of recommendations associated with the barges. In embodiments, the maritime assets include one or more components of port infrastructure with at least a portion of one of the sets of casualty forecasts, and wherein the digital twin system further provides for visualization of the digital twin of one or more of the components of port infrastructure including one or more of the attributes in combination with one or more of the sets of recommendations associated with the components of port infrastructure associated with the sets of casualty forecasts. In embodiments, the maritime assets are associated with a real-world maritime port, and wherein the digital twin system further provides for visualization of the digital twin of one or more of the components of the real-world maritime port associated at least a portion of one of the sets of casualty forecasts including one or more of the attributes in combination with one or more of the sets of recommendations associated with the components of the real-world maritime port. In embodiments, the maritime assets are associated with a real-world shipyard, and wherein the digital twin system further provides for visualization of the digital twin of one or more of the components of the real-world shipyard associated at least a portion of one of the sets of casualty forecasts including one or more of the attributes in combination with one or more of the sets of recommendations associated with the components of the real-world shipyard. In embodiments, the digital twin of one or more of the maritime assets is a floating asset twin associated with a ship associated with at least a portion of one of the sets of casualty forecasts. In embodiments, the floating asset twin is configured to provide for visualization of a navigation course of the ship associated at least a portion of one of the sets of casualty forecasts relative to a planned course of the ship and one or more of the sets of recommendations from the artificial intelligence system for a change in the navigation course of the ship. In embodiments, the floating asset twin is configured to provide for visualization of an engine performance of the ship associated at least a portion of one of the sets of casualty forecasts and one or more of the sets of recommendations from the artificial intelligence system for a change in the engine performance of the ship. In embodiments, the visualization of an engine performance includes an emissions profile of the ship. In embodiments, the floating asset twin is configured to provide for visualization of a hull integrity of the ship associated at least a portion of one of the sets of casualty forecasts and one or more of the sets of recommendations from the artificial intelligence system for a change in maintenance of the hull of the ship. In embodiments, the floating asset twin is configured to provide visualizations of a plurality of inspection points on the ship associated with at least a portion of one of the sets of casualty forecasts and maintenance histories associated with those inspection points. In embodiments, the floating asset twin is also configured to provide one or more of the sets of recommendations from the artificial intelligence system for a change in maintenance of the plurality of inspection points associated with the maritime event. In embodiments, the floating asset twin is configured to provide for visualizations of the plurality of inspection points on the ship affected by travel within a geofenced area and maintenance histories associated with those inspection points.

In embodiments, the floating asset twin is also configured to provide one or more of the sets of recommendations from the artificial intelligence system for a change in maintenance of the plurality of inspection points associated with the maritime event. In embodiments, the floating asset twin is configured to provide details of a ledger of activity associated with the visualization of the plurality of inspection points on the ship associated at least a portion of one of the sets of casualty forecasts within a geofenced area and maintenance histories associated with those inspection points. In embodiments, the artificial intelligence system determines a set of geofence parameters, and wherein the digital twin provides further visualization of at least one geofence that integrates representation of a set of the maritime assets associated at least a portion of one of the sets of casualty forecasts with a representation of a maritime environment adjacent to the geofence.

In embodiments, the digital twin is also configured to provide one or more of the sets of recommendations from the artificial intelligence system for a change of one of the attributes of the set of maritime assets associated with at least a portion of one of the sets of casualty forecasts.

In embodiments, an information technology system comprising: a value chain network management platform for learning on a training set of maritime outcomes, parameters, and data collected from data sources to train an artificial intelligence system to use a digital twin to predict and display a casualty forecast for a set of maritime assets. In embodiments, the set of maritime assets includes a real-world shipyard, and wherein the digital twin is configured to detail at least a portion of the real-world shipyard associated with the casualty forecast.

In embodiments, the set of maritime assets includes a real-world maritime port, and wherein the digital twin is configured to detail at least a portion of the real-world maritime port associated with the casualty forecast.

In embodiments, the set of maritime assets includes one or more container ships, and wherein the digital twin is configured to detail at least a portion of the one or more container ships associated with the casualty forecast.

In embodiments, the set of maritime assets includes one or more barges, and wherein the digital twin is configured to detail at least a portion of the one or more barges associated with the casualty forecast. In embodiments, the set of maritime assets includes at least a portion of port infrastructure, and wherein the digital twin is configured to detail at least a portion of the port infrastructure associated with the casualty forecast. In embodiments the digital twin is configured to at least partially represent activity of the set of maritime assets during a timeline associated with the casualty forecast. In embodiments, the set of maritime assets includes a port infrastructure facility, wherein the data collected by the value chain network management platform facilitates identifying theft or misuse of one or more physical items of the port infrastructure facility relating to the casualty forecast by correlating data between a set of data collectors for one or more of the physical items in the port infrastructure facility, wherein the digital twin is configured to further detail one or more of the physical items of the port infrastructure facility for the at least one of the port infrastructure facility and the set of operators. In embodiments, the set of maritime assets includes a container ship that is moored to port infrastructure installed on or adjacent to land. In embodiments, the set of maritime assets includes one or more ships connected to barges. In embodiments, the set of maritime assets includes one or more ships, and wherein the digital twin provides for visualization of a navigation course of one or more of the ships relevant to the casualty forecast. In embodiments, the set of maritime assets includes one or more ships, and wherein the digital twin provides for visualization of an engine performance of one or more of the ships relevant to the casualty forecast. In embodiments, the set of maritime assets includes one or more ships, and wherein the digital twin provides for visualization of a hull integrity of one or more the ships relevant to the casualty forecast. In embodiments, the set of maritime assets includes one or more ships, and wherein the digital twin provides for visualization of a plurality of inspection points associated with one or more of the ships and maintenance histories associated with those inspection points relevant to the casualty forecast. In embodiments, the digital twin further provides for the visualization of the plurality of inspection points associated with one or more of the ships within a geofenced area relevant to the casualty forecast and maintenance histories associated with those inspection points.

In embodiments, the digital twin further provides for details of a ledger of activity associated with the visualization of the plurality of inspection points associated with one or more of the ships within a geofenced area relevant to the casualty forecast and maintenance histories associated with those inspection points.

In embodiments, an information technology system comprising: a value chain network management platform for identifying theft or misuse of a port infrastructure facility by correlating data between a set of data collectors for the physical item and a set of digital twins for at least one of the port infrastructure facility and a set of operators.

In embodiments, the set of digital twins of the port infrastructure facility includes one or more of the attributes in combination with one or more of the sets of recommendations of changes to attributes associated with the port infrastructure facility. In embodiments, the set of digital twins is configured to provide visualizations of a plurality of inspection points on the port infrastructure facility and maintenance histories associated with those inspection points. In embodiments, the set of digital twins is configured to provide details of a ledger of activity associated with the visualization of the plurality of inspection points on the port infrastructure facility within a geofenced area and maintenance histories associated with those inspection points. In embodiments, the set of digital twins is configured to at least partially represent at least a portion of the port infrastructure facility associated with an event investigation and to at least partially detail a timeline of the event investigation and associated with the port infrastructure facility. In embodiments, the set of digital twins is configured to at least partially represent at least a portion of the port infrastructure facility associated with a legal proceeding and to at least partially detail at least a portion of a timeline pertinent to the legal proceeding and associated with the port infrastructure facility.

In embodiments, the set of digital twins is configured to at least partially represent at least a portion of the port infrastructure facility associated with a casualty forecast and to at least partially detail at least a portion of a timeline pertinent to the casualty report and associated port infrastructure facility. In embodiments, the digital twin details the one or more physical items in the port infrastructure facility for at least one operator that includes a view of expected states of at least a portion of the one or more physical items. In embodiments, the set of digital twins provides further visualization of at least one geofence that integrates representation of at least a portion of the port infrastructure facility with a representation of a maritime environment adjacent to the geofence.

In embodiments, an information technology system comprising: a value chain network management platform identifying theft or misuse of a shipyard facility by correlating data between a set of data collectors for the physical item and a set of digital twins for at least one of the shipyard facility and a set of operators. In embodiments, the set of digital twins for at least one of the shipyard facilities and a set of operators includes one or more of the attributes in combination with one or more of the sets of recommendations of changes to attributes associated with the shipyard facility. In embodiments, the set of digital twins is configured to provide visualizations of a plurality of inspection points on in the shipyard facility and maintenance histories associated with those inspection points. In embodiments, the set of digital twins is configured to provide details of a ledger of activity associated with the visualization of the plurality of inspection points on the shipyard facility within a geofenced area and maintenance histories associated with those inspection points. In embodiments, the set of digital twins is configured to at least partially represent at least a portion of the shipyard facility associated with an event investigation and to at least partially detail a timeline of the event investigation and associated with the port infrastructure facility.

In embodiments, the set of digital twins is configured to at least partially represent at least a portion of the shipyard facility associated with a legal proceeding and to at least partially detail at least a portion of a timeline pertinent to the legal proceeding and associated with the shipyard facility. In embodiments, the set of digital twins is configured to at least partially represent at least a portion of the shipyard facility associated with a casualty forecast and to at least partially detail at least a portion of a timeline pertinent to the casualty report and associated shipyard facility. In embodiments, the digital twin details the one or more physical items in the shipyard facility for at least one operator that includes a view of expected states of at least a portion of the one or more physical items. In embodiments, the set of digital twins provides further visualization of at least one geofence that integrates representation of at least a portion of the shipyard facility with a representation of a maritime environment adjacent to the geofence.

In embodiments, an information technology system comprising: a value chain network management platform for learning on a training set of maritime outcomes, parameters, and data collected from data sources to train an artificial intelligence system to determine a set of geofence parameters and represent at least one geofence in a digital twin that integrates representation of a set of maritime entities with a representation of a maritime environment. In embodiments, the set of maritime entities is associated with a real-world shipyard, and wherein the digital twin is configured to represent the real-world shipyard and geofence parameters include a location within the real-world shipyard. In embodiments, the set of maritime entities is associated with a real-world maritime port, and wherein the digital twin is configured to represent the real-world maritime port and geofence parameters include a location within the real-world maritime port. In embodiments, the set of maritime entities is associated with one or more container ships, and wherein the digital twin is configured to represent the one or more container ships relative to the geofence parameters. In embodiments, the set of maritime entities is associated with one or more container barges, and wherein the digital twin is configured to represent the one or more barges relative to the geofence parameters. In embodiments, the set of maritime entities is associated with an event investigation and wherein the digital twin is configured to at least partially represent the set of maritime entities as it at least one of interacted during a timeline associated with the event investigation or is predicted to act based on a suggestion associated with the event investigation.

In embodiments, the set of maritime entities is associated with a legal proceeding and wherein the digital twin is configured to at least partially represent the set of maritime entities as it at least one of interacted during a timeline associated with the legal proceeding or is predicted to act based on a suggestion associated with the legal proceeding. In embodiments, the data collected by the value chain network management platform relates to a casualty report, wherein the digital twin of the set of maritime entities is configured to simulate possibilities of a loss relevant to the casualty report based on the data collected by the value chain network management platform.

In embodiments, the data collected by a value chain network management platform facilitates identifying theft or misuse of physical items contained on the set of maritime entities by correlating data between a set of data collectors for one or more physical items on the set of maritime entities and the digital twin detailing the one or more physical items associated with the set of maritime entities for the at least one of a port infrastructure facility and a set of operators. In embodiments, the set of maritime entities is a container ship that is moored to port infrastructure installed on or adjacent to land. In embodiments, data collected by a value chain network management platform is based on at least a ship having a forward speed relative to water and weather conditions and parameters associated with energy consumption of propulsion units on the ship.

In embodiments, further comprising an asset management application associated with the value chain network management platform and one or more maritime entities connected to a ship. In embodiments, the asset management application is associated with one or more ships connected to barges. In embodiments, the set of maritime entities includes one or more ships, and wherein the digital twin provides for visualization of a navigation course of one or more of the ships. In embodiments, the set of maritime entities includes one or more ships, and wherein the digital twin provides for visualization of an engine performance of one or more of the ships. In embodiments, the set of maritime entities includes one or more ships, and wherein the digital twin provides for visualization of a hull integrity of one or more of the ships. In embodiments, the digital twin provides for visualization of a plurality of inspection points on the set of the maritime entities and maintenance histories associated with those inspection points. In embodiments, the digital twin further provides for the visualization of the plurality of inspection points on the set of the maritime entities within the geofenced parameters and maintenance histories associated with those inspection points. In embodiments, the digital twin further provides for details of a ledger of activity associated with the visualization of the plurality of inspection points on the maritime entities within the geofenced parameters and maintenance histories associated with those inspection points. In embodiments, the training set of maritime outcomes, parameters, and data collected from the data sources is related to a set of shipping activities.

In embodiments, an information technology system comprising: a value chain network management platform for learning on a training set of maritime outcomes, parameters, and data collected from data sources relating to a set of shipping activities to train an artificial intelligence system to determine a set of geofence parameters and represent at least one geofence in a digital twin that integrates representation of a set of maritime entities with a representation of a maritime environment. In embodiments, the set of maritime entities is associated with a real-world shipyard, and wherein the digital twin is configured to represent the real-world shipyard, its associated set of the shipping activities and geofence parameters include a location within the real-world shipyard.

In embodiments, the set of maritime entities is associated with a real-world maritime port, and wherein the digital twin is configured to represent the real-world maritime port, its associated set of the shipping activities and geofence parameters include a location within the real-world maritime port. In embodiments, the set of maritime entities is associated with one or more container ships, and wherein the digital twin is configured to represent the one or more container ships and its associated set of the shipping activities relative to the geofence parameters.

In embodiments, the set of maritime entities is associated with one or more container barges, and wherein the digital twin is configured to represent the one or more barges and its associated set of the shipping activities relative to the geofence parameters. In embodiments, the set of maritime entities is associated with an event investigation, and wherein the digital twin is configured to at least partially represent the set of maritime entities and its associated set of the shipping activities at least partially detailed on a timeline associated with the event investigation. In embodiments, the set of maritime entities is associated with a legal proceeding and wherein the digital twin is configured to at least partially represent the set of maritime entities as it at least one of interacted during a timeline associated with the legal proceeding or is predicted to act based on a suggestion associated with the legal proceeding. In embodiments, the data collected by the value chain network management platform relates to a casualty report, wherein the digital twin of the set of maritime entities is configured to simulate possibilities of a loss relevant to the casualty report based on the data collected by the value chain network management platform. In embodiments, the data collected by a value chain network management platform facilitates identifying theft or misuse of physical items contained on the set of maritime entities by correlating data between a set of data collectors for one or more physical items on the set of maritime entities and the digital twin detailing the one or more physical items associated with the set of maritime entities for the at least one of a port infrastructure facility and a set of operators. In embodiments, the set of maritime entities is a container ship that is moored to port infrastructure installed on or adjacent to land. In embodiments, data collected by a value chain network management platform is based on at least a ship having a forward speed relative to water and weather conditions and parameters associated with energy consumption of propulsion units on the ship.

In embodiments, further comprising an asset management application associated with the value chain network management platform and one or more maritime entities connected to a ship. In embodiments, the asset management application is associated with one or more ships connected to barges. In embodiments, the set of maritime entities includes one or more ships, and wherein the digital twin provides for visualization of a navigation course of one or more of the ships.

In embodiments, the set of maritime entities includes one or more ships, and wherein the digital twin provides for visualization of an engine performance of one or more of the ships. In embodiments, the set of maritime entities includes one or more ships, and wherein the digital twin provides for visualization of a hull integrity of one or more of the ships. In embodiments, the digital twin provides for visualization of a plurality of inspection points on the set of the maritime entities and one of maintenance histories and the set of shipping activities associated with those inspection points. In embodiments, the digital twin further provides for the visualization of the plurality of inspection points on the set of the maritime entities within the geofenced parameters and one of maintenance histories and the set of shipping activities associated with those inspection points. In embodiments, the digital twin further provides for details of a ledger of activity associated with the visualization of the plurality of inspection points on the maritime entities within the geofenced parameters and one of maintenance histories and the set of shipping activities associated with those inspection points.

In embodiments, an information technology system comprising: a value chain network management platform generating a digital twin representing a real-world maritime port. In embodiments, the digital twin representing the real-world maritime port includes one or more container ships. In embodiments, the digital twin representing the real-world maritime port includes one or more barges. In embodiments, the digital twin representing the real-world maritime port includes one or more components of the port infrastructure installed on or adjacent to land.

In embodiments, the digital twin representing the real-world maritime port also includes a container ship moored to a component of the port infrastructure. In embodiments, the digital twin representing the real-world maritime port includes include one or more moored navigation units deployed on water. In embodiments, digital twin representing the real-world maritime port includes include one or more ships connected to barges. In embodiments, the digital twin representing the real-world maritime port includes a ship. In embodiments, the digital twin is configured to provide for visualization of a navigation course of the ship in a simulated maritime port based on the real-world maritime port. In embodiments, the digital twin is configured to provide for visualization of an engine performance of the ship including an emissions profile as the ship moves around the real-world maritime port. In embodiments, the digital twin is configured to provide for visualization of a hull of the ship as it moves through the real-world maritime port on a path having a water depth, wherein the digital twin is configured to further provide for visualization of a proximity of a portion of the hull to a portion of a seafloor in the real-word shipyard. In embodiments, the digital twin displays suggestions from an artificial intelligence system that generates a portion of a maintenance schedule to maintain the water depth through the real-world maritime port based on at least a combination of a portion of actual activity in the real-world maritime port and simulations provided by the digital twin of the real-world maritime port. In embodiments, the digital twin is configured to provide visualizations of a plurality of inspection points in the real-world maritime port and maintenance histories associated with those inspection points.

In embodiments, the digital twin is configured to provide for visualizations of the plurality of inspection points in the real-world maritime port and maintenance histories associated with those inspection points when within a geofenced area. In embodiments, the digital twin is configured to provide details of a ledger of activity associated with the visualization of the plurality of inspection points and maintenance histories associated with those inspection points within a geofenced of the real-world maritime port. In embodiments, the digital twin is configured to provide for further visualization for a first user of one of a navigation course of a ship and an engine performance of the ship within a first geofenced area of the real-world maritime port and for further visualization for a second user of one of the navigation course of the ship and the engine performance of the ship within a second different geofenced area in the real-world maritime port and where transit between the first and second geofenced areas motivates a handoff of the ship between the first user and the second user as depicted by the digital twin representing the real-world maritime port including the ship.

In embodiments, an information technology system comprising: a value chain network management platform for generating a digital twin representing a real-world shipyard. In embodiments, the digital twin representing the real-world shipyard includes one or more container ships. In embodiments, the digital twin representing the real-world shipyard includes one or more barges. In embodiments, the digital twin representing the real-world shipyard includes one or more components of the port infrastructure installed on or adjacent to land.

In embodiments, the digital twin representing the real-world shipyard also includes a container ship moored to a component of the port infrastructure. In embodiments, the digital twin representing the real-world shipyard includes include one or more moored navigation units deployed on water. In embodiments, the digital twin representing the real-world shipyard includes include one or more ships connected to barges.

In embodiments, the digital twin representing the real-world shipyard includes a ship. In embodiments, the digital twin is configured to provide for visualization of a navigation course of the ship in a simulated shipyard based on the real-world shipyard. In embodiments, the digital twin is configured to provide for visualization of an engine performance of the ship including an emissions profile as the ship moves around the real-world shipyard. In embodiments, the digital twin is configured to provide for visualization of a hull of the ship as it moves through the real-world shipyard on a path having a water depth, wherein the digital twin is configured to further provide for visualization of a proximity of a portion of the hull to a portion of a seafloor in the real-word shipyard. In embodiments, the digital twin displays suggestions from an artificial intelligence system that generates a portion of a maintenance schedule to maintain the water depth through the real-world shipyard based on at least a combination of a portion of actual activity in the real-world shipyard and simulations provided by the digital twin of the real-world shipyard. In embodiments, the digital twin is configured to provide visualizations of a plurality of inspection points in the real-world shipyard and maintenance histories associated with those inspection points.

In embodiments, the digital twin is configured to provide for visualizations of the plurality of inspection points in the real-world shipyard and maintenance histories associated with those inspection points when within a geofenced area. In embodiments, the digital twin is configured to provide details of a ledger of activity associated with the visualization of the plurality of inspection points and maintenance histories associated with those inspection points within a geofenced of the real-world shipyard. In embodiments, the digital twin is configured to provide for further visualization for a first user of one of a navigation course of a ship and an engine performance of the ship within a first geofenced area of the real-world shipyard and for further visualization for a second user of one of the navigation course of the ship and the engine performance of the ship within a second different geofenced area in the real-world shipyard and where transit between the first and second geofenced areas motivates a handoff of the ship between the first user and the second user as depicted by the digital twin representing the real-world shipyard including the ship.

In embodiments, an information technology system comprising: a set of intelligent systems for automatically populating a digital twin of a maritime value chain network entity based on data collected by a value chain network management platform. In embodiments, the maritime value chain network entity is associated with a real-world shipyard, and wherein the digital twin is configured to represent the real-world shipyard. In embodiments, the maritime value chain network entity is associated with a real-world maritime port, and wherein the digital twin is configured to represent the real-world maritime port. In embodiments, the maritime value chain network entity is associated with a container ship, and wherein the digital twin is configured to represent the container ship.

In embodiments, the maritime value chain network entity is associated with a barge, and wherein the digital twin is configured to represent the barge. In embodiments, the maritime value chain network entity is associated with port infrastructure, and wherein the digital twin is configured to represent one or more components of the port infrastructure. In embodiments, the maritime value chain network entity is associated with an event investigation and wherein the digital twin is configured to at least partially represent the maritime value chain network entity as it interacted during a timeline associated with the event investigation. In embodiments, the maritime value chain network entity is associated with a legal proceeding and wherein the digital twin is configured to at least partially represent the maritime value chain network entity. In embodiments, the data collected by a value chain network management platform relates to a casualty report, wherein the digital twin of the maritime value chain network entity is configured to simulate possibilities of a loss relevant to the casualty report based on the data collected by a value chain network management platform. In embodiments, the maritime value chain network entity is a port infrastructure facility, wherein the data collected by a value chain network management platform facilitates identifying theft or misuse of the port infrastructure facility by correlating data between a set of data collectors for one or more physical items in the port infrastructure facility and the digital twin detailing the one or more physical items of the port infrastructure facility for the at least one of the port infrastructure facility and the set of operators. In embodiments, the maritime value chain network entity is a container ship that is moored to port infrastructure installed on or adjacent to land. In embodiments, data collected by a value chain network management platform is based on at least a container ship having a forward speed relative to water and weather conditions and parameters associated with energy consumption of propulsion units on the container ship.

In embodiments, further comprising an asset management application associated with the value chain network management platform and one or more maritime facilities connected to a container ship. In embodiments, the asset management application is associated with one or more ships connected to barges. In embodiments, the maritime value chain network entity is one or more ships, and wherein the digital twin provides for visualization of a navigation course of one or more of the ships. In embodiments, the maritime value chain network entity is one or more ships, and wherein the digital twin provides for visualization of an engine performance of one or more of the ships. In embodiments, the maritime value chain network entity is one or more ships, and wherein the digital twin provides for visualization of a hull integrity of one or more of the ships. In embodiments, the digital twin provides for visualization of a plurality of inspection points on the maritime value chain network entity and maintenance histories associated with those inspection points. In embodiments, the digital twin further provides for the visualization of the plurality of inspection points on the maritime value chain network entity within a geofenced area and maintenance histories associated with those inspection points. In embodiments, the digital twin further provides for details of a ledger of activity associated with the visualization of the plurality of inspection points on the maritime value chain network entity within a geofenced area and maintenance histories associated with those inspection points.

Thus, in one aspect, methods described above and combinations thereof may be embodied in computer executable code that, when executing on one or more computing devices, performs the steps thereof. In another aspect, the methods may be embodied in systems that perform the steps thereof and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms “a” and “an” and “the” and similar referents in the context of describing the disclosure (especially in the context of the following claims) is to be construed to cover both the singular and the plural, unless otherwise indicated herein or clearly contradicted by context. The terms “comprising,” “with,” “including,” and “containing” are to be construed as open-ended terms (i.e., meaning “including, but not limited to,”) unless otherwise noted. Recitations of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., “such as”) provided herein, is intended merely to better illuminate the disclosure and does not pose a limitation on the scope of the disclosure unless otherwise claimed. The term “set” may include a set with a single member. No language in the specification should be construed as indicating any non-claimed element as essential to the practice of the disclosure.

While the foregoing written description enables one skilled to make and use what is considered presently to be the best mode thereof, those skilled in the art will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

All documents referenced herein are hereby incorporated by reference as if fully set forth herein.

What is claimed is:

1. An information technology system, comprising:

a cloud-based management platform with a micro-services architecture, the platform having a set of interfaces that are configured to access and configure features of the platform, a set of network connectivity facilities that are configured to direct a set of value chain network entities to connect to the features of the platform, a set of adaptive intelligence facilities that are configured to automate a set of capabilities of the platform related to at least one of the value chain network entities and the features of the platform, or a set of monitoring facilities that are configured to monitor the value chain network entities, wherein the interfaces, the set of network connectivity facilities, the set of adaptive intelligence facilities, and the set of monitoring facilities are coordinated for monitoring and management of the value chain network entities;

a set of applications that are configured to direct an enterprise to manage the value chain network entities of the platform from a point of origin to a point of customer use; and a set of microservices layers including an application layer supporting at least one supply chain application and at least one demand management application, wherein the set of microservices layers include a robotic process automation layer executing on at least one processor of the platform and that uses a first set of information collected by a data collection layer and a second set of information of outcomes and activities involving the applications of the application layer to automate a set of actions for at least a subset of the applications with respect to the value chain network entities of the platform, wherein one of the actions automated by the robotic process automation layer involves at least one of classification of a product defect in an image or inspection of a product in an image, the robotic process automation layer trained with the first set of information by the at least one processor to use the information collected by the data collection layer for the classification of the product defect and for the inspection of the product, the robotic process automation layer retrained with a portion of the second set of information for the classification of the product defect and for the inspection of the product, the portion of the second set of information for retraining the robotic process automation layer including a portion of the set of outcomes and activities involving the subset of applications for which the robotic process automation layer automates the set of actions.

2. The system of claim 1, wherein one of the actions automated by the robotic process automation layer involves selection of a quantity of product for an order.

3. The system of claim 1, wherein one of the actions automated by the robotic process automation layer involves selection of a carrier for a shipment.

4. The system of claim 1, wherein one of the actions automated by the robotic process automation layer involves at least one of a selection of a vendor for a component or a vendor for a finished goods order.

5. The system of claim 1, wherein one of the actions automated by the robotic process automation layer involves selection of a variation of a product for marketing.

6. The system of claim 1, wherein one of the actions automated by the robotic process automation layer involves selection of an assortment of goods for a shelf.

7. The system of claim 1, wherein one of the actions automated by the robotic process automation layer involves determination of a price for a finished good.

8. The system of claim 1, wherein one of the actions automated by the robotic process automation layer involves configuration of at least one of a service offer related to a product or configuration of product bundle.

9. The system of claim 1, wherein one of the actions automated by the robotic process automation layer involves at least one of configuration of a product kit, a product package, a product display, a product image, or a product description.

10. The system of claim 1, wherein one of the actions automated by the robotic process automation layer involves configuration of a website navigation path related to a product.

11. The system of claim 1, wherein one of the actions automated by the robotic process automation layer involves determination of an inventory level for a product.

12. The system of claim 1, wherein one of the actions automated by the robotic process automation layer involves selection at least one of a logistics type or a schedule for product delivery.

13. The system of claim 1, wherein one of the actions automated by the robotic process automation layer involves configuration of a logistics schedule.

14. The system of claim 1, wherein one of the actions automated by the robotic process automation layer involves configuration of a set of inputs for machine learning.

15. The system of claim 1, wherein one of the actions automated by the robotic process automation layer involves at least one of preparation of product documentation or preparation of disclosures about a product.

16. The system of claim 1, wherein one of the actions automated by the robotic process automation layer involves ordering of equipment for a at least one of a warehouse or a fulfillment center.

17. The system of claim 1, wherein one of the actions automated by the robotic process automation layer involves inspection of data from a set of onboard diagnostics on a product.

18. The system of claim 1, wherein one of the actions automated by the robotic process automation layer involves review of sensor data from environmental sensors in a set of supply chain environments.

19. The system of claim 1, wherein one of the actions automated by the robotic process automation layer involves selection of inputs for a digital twin.

20. The system of claim 1, wherein one of the actions automated by the robotic process automation layer involves selection of outputs from a digital twin.

21. The system of claim 1, wherein one of the actions automated by the robotic process automation layer involves selection of visual elements for presentation in a digital twin.

22. The system of claim 1, wherein one of the actions automated by the robotic process automation layer involves diagnosis of sources of at least one of delay, congestion, or scarcity in a supply chain.

23. The system of claim 1, wherein one of the actions automated by the robotic process automation layer involves diagnosis of sources of cost overruns in a supply chain.

24. The system of claim 1, wherein one of the actions automated by the robotic process automation layer involves diagnosis of sources of product defects in a supply chain.

25. The system of claim 1, wherein one of the actions automated by the robotic process automation layer involves prediction of maintenance requirements in supply chain infrastructure.

26. An information technology system, comprising:

a cloud-based management platform with a micro-services architecture, the platform having a set of interfaces that are configured to access and configure features of the platform, a set of network connectivity facilities that are configured to direct a set of value chain network entities to connect to the features of the platform, a set of adaptive intelligence facilities that are configured to automate a set of capabilities of the platform related to at least one of the value chain network entities and the features of the platform, or a set of monitoring facilities that are configured to monitor the value chain network entities, wherein the interfaces, the network connectivity facilities, the adaptive intelligence facilities, and the monitoring facilities are coordinated for monitoring and management of the value chain network entities;

a set of applications that are configured to direct an enterprise to manage the value chain network entities of the platform from a point of origin to a point of customer use; and a set of microservices layers including an application layer supporting at least one supply chain application and at least one demand management application, wherein the microservices layers include a robotic process automation layer executing on at least one processor of the platform and that uses a first set of information collected by a data collection layer and a second set of information of outcomes and activities involving the applications of the application layer to automate a set of actions for at least a subset of the applications with respect to the value chain network entities of the platform, wherein one of the actions automated by the robotic process automation layer involves inspection of product quality data from a set of sensors, the robotic process automation layer trained with the first set of information by the at least one processor to use the information collected by the data collection layer for the inspection of product quality data, the robotic process automation layer retrained with a portion of the second set of information for the inspection of product quality data, the portion of the second set of information for retraining the robotic process automation layer including a portion of the set of outcomes and activities involving the subset of applications for which the robotic process automation layer automates the set of actions.

27. A method of automating value chain network entity actions, the method comprising:

directing, with a set of network connectivity facilities, a set of value chain network entities to connect to features of a value chain network;

configuring a cloud-based platform with a micro-services architecture to manage or monitor the set of value chain network entities from a point of origin to a point of customer use;

automating, with a robotic process automation layer of a set of adaptive intelligence facilities executing on at least one processor, a set of actions for at least a subset of applications with respect to the set of value chain network entities, the set of actions including at least one of classification of a product defect in an image, inspection of a product in an image, or inspection of product quality data from a set of sensors;

preparing a first set of training data based on information associated with the subset of applications collected by a data collection layer;

training, with the at least one processor, the robotic process automation layer based on the first set of training data to use the information collected by the data collection layer for automating at least one of the set of actions; and retraining the robotic process automation layer for automating the at least one of the set of actions using a second set of information including a portion of a set of outcomes and activities involving the subset of applications for which the robotic process automation layer automates the set of action.

28. The method of claim 27, wherein inspection of product quality data involves inspection of data from a set of onboard diagnostics on a product.

29. The method of claim 27, wherein one of the actions automated by the robotic process automation layer involves configuration of a product for a set of local requirements.

30. The method of claim 27, wherein one of the actions automated by the robotic process automation layer involves configuration of a set of products for compatibility.

31. The method of claim 27, wherein one of the actions automated by the robotic process automation layer involves configuration of a request for proposals.

* * * * *